US011498931B2

(12) United States Patent
Son et al.

(10) Patent No.: US 11,498,931 B2
(45) Date of Patent: Nov. 15, 2022

(54) NITROGEN-CONTAINING COMPOUND, COLOR CONVERSION FILM COMPRISING SAME, AND BACKLIGHT UNIT AND DISPLAY DEVICE EACH COMPRISING SAME

(71) Applicant: LG CHEM, LTD., Seoul (KR)

(72) Inventors: Seonkyoung Son, Daejeon (KR); Milim Lee, Daejeon (KR); Hoyong Lee, Daejeon (KR); Cheol Jun Song, Daejeon (KR); Jeeseon Kim, Daejeon (KR); Hyungwook Yu, Daejeon (KR)

(73) Assignee: LG CHEM, LTD., Seoul (KR)

( * ) Notice: Subject to any disclaimer, the term of this patent is extended or adjusted under 35 U.S.C. 154(b) by 470 days.

(21) Appl. No.: 16/603,168

(22) PCT Filed: Dec. 7, 2018

(86) PCT No.: PCT/KR2018/015522

§ 371 (c)(1),
(2) Date: Oct. 4, 2019

(87) PCT Pub. No.: WO2019/112369

PCT Pub. Date: Jun. 13, 2019

(65) Prior Publication Data

US 2021/0107925 A1 Apr. 15, 2021

(30) Foreign Application Priority Data

Dec. 7, 2017 (KR) ........................ 10-2017-0167119
Dec. 6, 2018 (KR) ........................ 10-2018-0156173

(51) Int. Cl.

| | |
|---|---|
| ***C07F 5/02*** | (2006.01) |
| ***G02F 1/13357*** | (2006.01) |
| ***H01L 51/00*** | (2006.01) |

(52) U.S. Cl.

CPC .............. *C07F 5/027* (2013.01); *C07F 5/022* (2013.01); *G02F 1/133603* (2013.01); *H01L 51/0059* (2013.01); *H01L 51/0072* (2013.01); *H01L 51/0073* (2013.01); *H01L 51/0094* (2013.01)

(58) Field of Classification Search

CPC ............. H01L 51/0059; H01L 51/0072; H01L 51/0073; H01L 51/0094; H01L 51/0067; H01L 51/0052; C07F 5/027

(Continued)

(56) References Cited

U.S. PATENT DOCUMENTS

2012/0248973 A1* 10/2012 Ito et al. ............. H01L 51/0067 313/504
2014/0065530 A1 3/2014 Nishida et al.

(Continued)

FOREIGN PATENT DOCUMENTS

CN 103865290 A 6/2014
CN 104650610 A 5/2015

(Continued)

OTHER PUBLICATIONS

International Search Report and Written Opinion issued for PCT/KR2018/015522 dated Mar. 14, 2019, 9 pages.

(Continued)

*Primary Examiner* — Thinh T Nguyen
(74) *Attorney, Agent, or Firm* — Rothwell, Figg, Ernst & Manbeck, P.C.

(57) ABSTRACT

The present specification relates to a nitrogen-containing compound, and a color conversion film, a backlight unit and a display apparatus including the same.

8 Claims, 1 Drawing Sheet

(58) Field of Classification Search
USPC ........................................ 257/40; 438/82, 99
See application file for complete search history.

(56) References Cited

U.S. PATENT DOCUMENTS

| | | | |
|---|---|---|---|
| 2019/0212335 | A1 | 7/2019 | Wijaya et al. |
| 2020/0032138 | A1 | 1/2020 | Lee et al. |

FOREIGN PATENT DOCUMENTS

| | | | |
|---|---|---|---|
| JP | 2007-221087 | A | 8/2007 |
| KR | 10-2014-0029315 | A | 3/2014 |
| WO | 2017-178882 | A1 | 10/2017 |
| WO | 2018-093121 | A1 | 5/2018 |

OTHER PUBLICATIONS

Jin, R. et al., "Rational design of organoboron heteroarene derivatives as luminescent and charge transport materials for organic light-emitting diodes". New Journal of Chemistry, 2015, vol. 39, pp. 8188-8194.
Shimizu, S. et al.,"Benzo[c,d]indole-Containing Aza-BODIPY Dyes: Asymmetrization-Induced Solid-State Emission and Aggregation-Induced Emission Enhancement as New Properties of a Well-Known Chromophore", Chem. Eur. J., 2015, vol. 21, pp. 12996-13003.

* cited by examiner

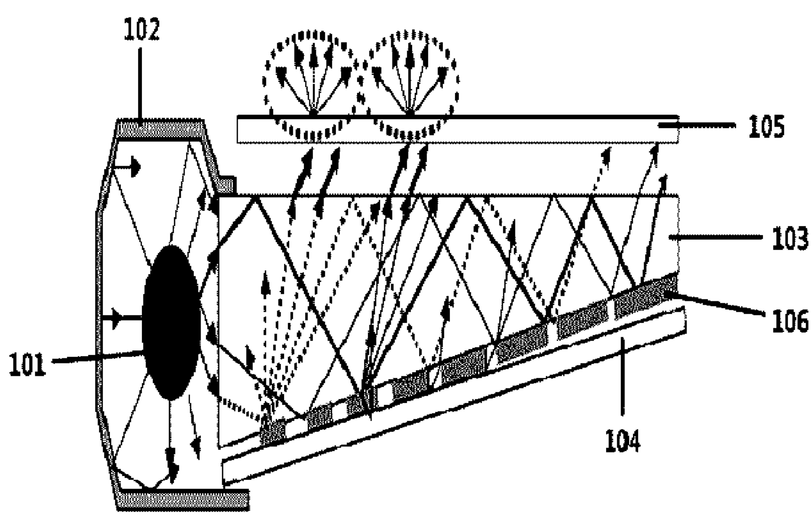
102
105
103
106
101
104

NITROGEN-CONTAINING COMPOUND, COLOR CONVERSION FILM COMPRISING SAME, AND BACKLIGHT UNIT AND DISPLAY DEVICE EACH COMPRISING SAME

TECHNICAL FIELD

The present specification relates to a nitrogen-containing compound, a color conversion film, a backlight unit and a display apparatus including the same.

The present specification is a 35 U.S.C. 371 National Phase Entry Application from PCT/KR2018/015522, filed Dec. 7, 2018, which claims priority to and the benefits of Korean Patent Application No. 10-2017-0167119, filed with the Korean Intellectual Property Office on Dec. 7, 2017, and Korean Patent Application No. 10-2018-0156173, filed with the Korean Intellectual Property Office on Dec. 6, 2018, the entire contents of which are incorporated herein by reference.

BACKGROUND ART

Existing light emitting diodes (LED) are obtained by mixing a green phosphorescent substance and a red phosphorescent substance to a blue light emitting diode, or mixing a yellow phosphorescent substance and a blue-green phosphorescent substance to a UV light emitting diode. However, with such a method, it is difficult to control colors, and therefore, color rendering is not favorable. Accordingly, color gamut declines.

In order to overcome such color gamut decline and reduce production costs, methods of obtaining green and red in a manner of filming quantum dots and binding the dots to a blue LED have been recently tried. However, cadmium series quantum dots have safety problems, and other quantum dots have significantly decreased efficiency compared to cadmium series quantum dots. In addition, quantum dots have reduced stability for oxygen and water, and have a disadvantage in that the performance is significantly degraded when aggregated. Furthermore, unit costs of production are high since, when producing quantum dots, maintaining the sizes is difficult.

DISCLOSURE

Technical Problem

The present specification is directed to providing a nitrogen-containing compound, and a color conversion film, a backlight unit and a display apparatus including the same.

Technical Solution

One embodiment of the present specification provides a compound represented by the following Chemical Formula 1.

[Chemical Formula 1]

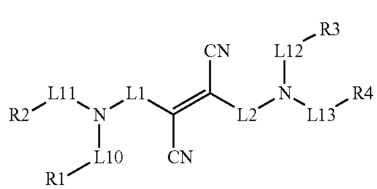

In Chemical Formula 1,

L1 and L2 are the same as or different from each other, and each independently a substituted or unsubstituted arylene group, L10 to L13 are the same as or different from each other, and each independently a direct bond; a substituted or unsubstituted arylene group; or a substituted or unsubstituted divalent heterocyclic group, R1 to R4 are the same as or different from each other, and each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted fluoroalkyl group; a substituted or unsubstituted alkylthio group; a substituted or unsubstituted alkoxy group; a substituted or unsubstituted allyloxy group; a substituted or unsubstituted alkylthioxy group; a substituted or unsubstituted arylthioxy group; a substituted or unsubstituted alkylsulfoxy group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; a substituted or unsubstituted heteroaryl group; or a substituted or unsubstituted cyclic hydrocarbon group, and at least one of R1 to R4 is represented by the following Chemical Formula 2,

[Chemical Formula 2]

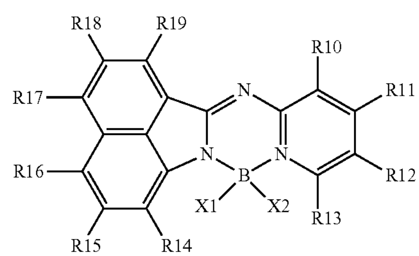

in Chemical Formula 2, one of R10 to R19 bonds to Chemical Formula 1, groups not bonding to Chemical Formula 1 among R10 to R19 are the same as or different from each other, and each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted fluoroalkyl group; a substituted or unsubstituted alkylthio group; a substituted or unsubstituted alkoxy group; a substituted or unsubstituted allyloxy group; a substituted or unsubstituted alkylthioxy group; a substituted or unsubstituted arylthioxy group; a substituted or unsubstituted alkylsulfoxy group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; a substituted or unsubstituted heteroaryl group; or a substituted or unsubstituted cyclic hydrocarbon group, or bond to each other to form a substituted or unsubstituted ring, X1 and X2 are the same as or different from each other, and each independently a halogen group; a nitrile group; —$CO_2R''''$; a substituted or unsubstituted alkyl group; a substituted or unsubstituted alkynyl group; a substituted or unsubstituted alkoxy group; a substituted or unsubstituted alkenyl group; a substituted or unsubstituted silyl group; a substituted or unsubstituted aryloxy group; a substituted or unsubstituted aryl group; a substituted or unsubstituted heterocyclic group; or a substituted or unsubstituted cyclic hydrocarbon group, or X1 and X2 bond to each other to form a substituted or unsubstituted ring, and R'''' is a substituted or unsubstituted alkyl group; a substituted or unsubstituted fluoroalkyl group; a substituted or unsubstituted alkoxy group; a substituted or unsubstituted alkenyl group; a substituted or unsubstituted alkynyl group; a substituted or unsubstituted silyl group; a substituted or unsubstituted aryl group; a substituted or unsubstituted heterocyclic group; or a substituted or unsubstituted cyclic hydrocarbon group.

Another embodiment of the present specification provides a color conversion film including a resin matrix; and the compound represented by Chemical Formula 1 dispersed into the resin matrix.

Still another embodiment of the present specification provides a backlight unit including the color conversion film.

Yet another embodiment of the present specification provides a display apparatus including the backlight unit.

Advantageous Effects

A compound having an existing aza-bodipy structure (Chemical Formula 2) is used as a fluorescent material in green and orange regions, however, a compound according to one embodiment of the present specification is, by introducing a CN═CN (fumaronitrile) structure, capable of increasing absorbance for blue light (blue backlight), and is capable of red fluorescence. Accordingly, whereas existing aza-bodipy compounds use a green dye and a red dye together for color conversion, the compound according to the present specification is capable of using a red dye alone, and has excellent processability.

DESCRIPTION OF DRAWINGS

FIG. 1 is a mimetic diagram using a color conversion film according to one embodiment of the present specification in a backlight.

REFERENCE NUMERAL

101: Side Chain-Type Light Source
102: Reflecting Plate
103: Light Guide Plate
104: Reflective Layer
105: Color Conversion Film
106: Light Dispersion Pattern

MODE FOR DISCLOSURE

Hereinafter, the present specification will be described in more detail.

One embodiment of the present specification provides a compound represented by Chemical Formula 1.

In the present specification, a certain part "including" certain constituents means capable of further including other constituents, and does not exclude other constituents unless particularly stated on the contrary.

In the present specification, one member being placed "on" another member includes not only a case of the one member adjoining the another member but a case of still another member being present between the two members.

Examples of substituents in the present specification are described below, however, the substituents are not limited thereto.

The term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

The term "substituted or unsubstituted" in the present specification means being substituted with one, two or more substituents selected from the group consisting of deuterium; a halogen group; a nitrile group; a nitro group; an amino group; a carbonyl group; a carboxyl group (—COOH); an ether group; an ester group; a hydroxyl group; a substituted or unsubstituted alkyl group; a substituted or unsubstituted fluoroalkyl group; a substituted or unsubstituted cycloalkyl group; a substituted or unsubstituted fluoroalkyl group; a substituted or unsubstituted alkoxy group; a substituted or unsubstituted aryloxy group; a substituted or unsubstituted alkenyl group; a substituted or unsubstituted silyl group; a substituted or unsubstituted amine group; a substituted or unsubstituted aryl group; and a substituted or unsubstituted heterocyclic group, or being substituted with a substituent linking two or more substituents among the substituents illustrated above, or having no substituents. For example, "a substituent linking two or more substituents" may include a biphenyl group. In other words, a biphenyl group may be an aryl group, or interpreted as a substituent linking two phenyl groups.

In the present specification,

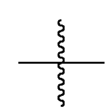

means a site bonding to other substituents or bonding sites.

In the present specification, the halogen group may be fluorine, chlorine, bromine or iodine.

In the present specification, the number of carbon atoms of the imide group is not particularly limited, but is preferably from 1 to 30. Specifically, —C(═O)N(C(═O)$R_{100}$)$R_{101}$ or compounds having structures as below may be included, and $R_{100}$ and $R_{101}$ are the same as or different from each other, and each independently hydrogen, a substituted or unsubstituted alkyl group, a substituted or unsubstituted cycloalkyl group, or a substituted or unsubstituted aryl group. However, the imide group is not limited thereto.

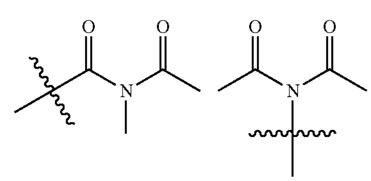

-continued

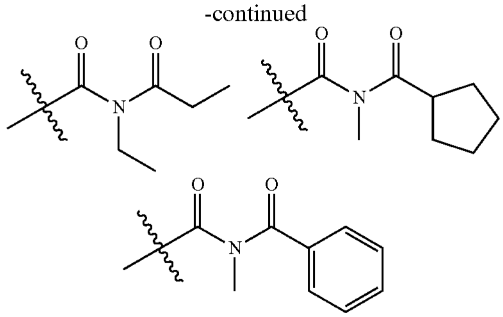

In the present specification, in the amide group, the nitrogen of the amide group may be substituted with hydrogen, a linear, branched or cyclic alkyl group having 1 to 30 carbon atoms or an aryl group having 6 to 30 carbon atoms. Specifically, —C(═O)NR$_{102}$R$_{103}$ or compounds having the following structural formulae may be included, and R$_{102}$ and R$_{103}$ are the same as or different from each other, and each independently hydrogen, a substituted or unsubstituted alkyl group, a substituted or unsubstituted cycloalkyl group, or a substituted or unsubstituted aryl group. However, the amide group is not limited thereto.

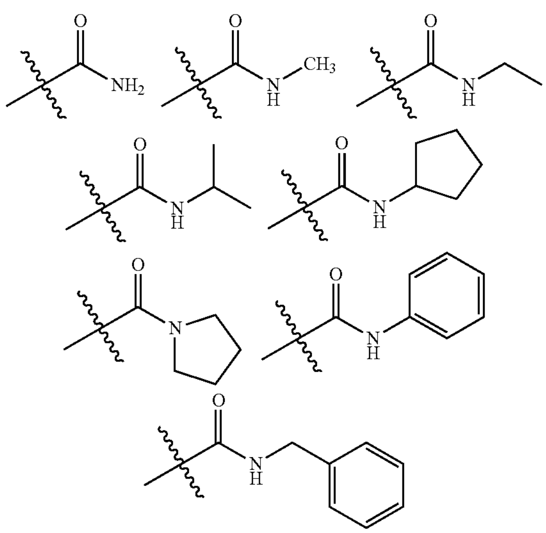

In the present specification, the number of carbon atoms of the carbonyl group is not particularly limited, but is preferably from 1 to 30. Specifically, —C(═O)R$_{104}$ or compounds having structures as below may be included, and R$_{104}$ is hydrogen, a substituted or unsubstituted alkyl group, a substituted or unsubstituted cycloalkyl group, or a substituted or unsubstituted aryl group. However, the carbonyl group is not limited thereto.

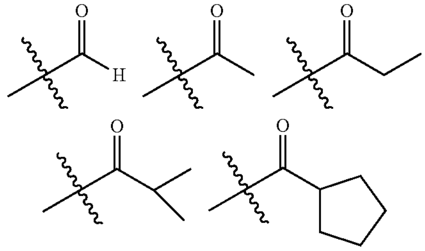

-continued

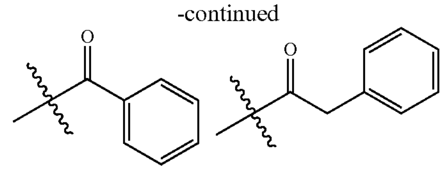

In the present specification, in the ether group, the oxygen of the ether group may be substituted with a linear, branched or cyclic alkyl group having 1 to 25 carbon atoms; or a monocyclic or polycyclic aryl group having 6 to 30 carbon atoms.

In the present specification, in the ester group, the oxygen of the ester group may be substituted with a linear, branched or cyclic alkyl group having 1 to 25 carbon atoms; an alkenyl group; a monocyclic or polycyclic aryl group having 6 to 30 carbon atoms; or a heterocyclic group having 2 to 30 carbon atoms. Specifically, —C(═O)OR$_{105}$, —OC(═O)R$_{106}$ or compounds having the following structural formulae may be included, and R$_{105}$ and R$_{106}$ are the same as or different from each other, and each independently hydrogen, a substituted or unsubstituted alkyl group, a substituted or unsubstituted cycloalkyl group, or a substituted or unsubstituted aryl group. However, the ester group is not limited thereto.

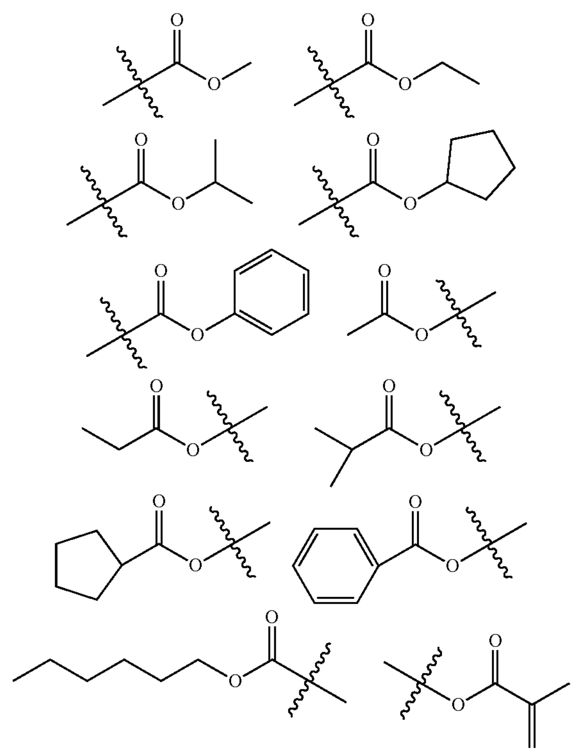

In the present specification, the alkyl group may be linear or branched, and although not particularly limited thereto, the number of carbon atoms is preferably from 1 to 30. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the cycloalkyl group is not particularly limited, but preferably has 3 to 30 carbon atoms, and specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the fluoroalkyl group is not particularly limited, but preferably has 1 to 10 carbon atoms, and specific examples thereof may include a trifluoromethyl group, a perfluoroethyl group and the like, but are not limited thereto.

In the present specification, the alkylthio group is not particularly limited, but preferably has 1 to 10 carbon atoms, and specific examples thereof may include a methylthio group, an ethylthio group and the like, but are not limited thereto.

In the present specification, the alkoxy group may be linear, branched or cyclic. The number of carbon atoms of the alkoxy group is not particularly limited, but is preferably from 1 to 30. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benxyloxy, p-methylbenxyloxy and the like, but are not limited thereto.

In the present specification, the alkenyl group may be linear or branched, and although not particularly limited thereto, the number of carbon atoms is preferably from 2 to 30. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, the alkynyl group may be linear or branched, and although not particularly limited thereto, the number of carbon atoms is preferably from 2 to 30. Specific examples thereof may include alkynyl groups such as ethynyl, propynyl, 2-methyl-2-propynyl, 2-butynyl or 2-pentynyl, but are not limited thereto.

In the present specification, specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the boron group may be —$BR_{107}R_{108}R_{109}$. $R_{107}$, $R_{108}$ and $R_{109}$ are the same as or different from each other, and may be each independently selected from the group consisting of hydrogen; deuterium; halogen; a nitrile group; a substituted or unsubstituted monocyclic or polycyclic cycloalkyl group having 3 to 30 carbon atoms; a substituted or unsubstituted linear or branched alkyl group having 1 to 30 carbon atoms; a substituted or unsubstituted monocyclic or polycyclic aryl group having 6 to 30 carbon atoms; and a substituted or unsubstituted monocyclic or polycyclic heteroaryl group having 2 to 30 carbon atoms.

In the present specification, specific examples of the phosphine oxide group may include a diphenylphosphine oxide group, a dinaphthylphosphine oxide group and the like, but are not limited thereto.

In the present specification, the amine group may be selected from the group consisting of —$NH_2$; a monoalkylamine group; a dialkylamine group; an N-alkylarylamine group; a monoarylamine group; a diarylamine group; an N-arylheteroarylamine group; an N-alkylheteroarylamine group, a monoheteroarylamine group and a diheteroarylamine group, and although not particularly limited thereto, the number of carbon atoms is preferably from 1 to 30. Specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a ditolylamine group, an N-phenyltolylamine group, a triphenylamine group, an N-phenylbiphenylamine group; an N-phenylnaphthylamine group; an N-biphenylnaphthylamine group; an N-naphthylfluorenylamine group; an N-phenylphenanthrenylamine group; an N-biphenylphenanthrenylamine group; an N-phenylfluorenylamine group; an N-phenylterphenylamine group; an N-phenanthrenylfluorenylamine group; an N-biphenylfluorenylamine group and the like, but are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including two or more aryl groups may include monocyclic aryl groups, polycyclic aryl groups, or both monocyclic aryl groups and polycyclic aryl groups. For example, the aryl group in the arylamine group may be selected from among the examples of the aryl group described above.

In the present specification, the aryl group is not particularly limited, but preferably has 6 to 30 carbon atoms, and the aryl group may be monocyclic or polycyclic.

When the aryl group is a monocyclic aryl group, the number of carbon atoms is not particularly limited, but is preferably from 6 to 30. Specific examples of the monocyclic aryl group may include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group may include a naphthyl group, an anthracenyl group, a phenanthryl group, a triphenyl group, a pyrenyl group, a perylenyl group, a chrysenyl group, a fluorenyl group and the like, but are not limited thereto.

In the present specification, the fluorenyl group may be substituted, and adjacent substituents may bond to each other to form a ring.

When the fluorenyl group is substituted,

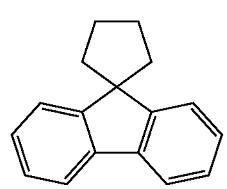
,
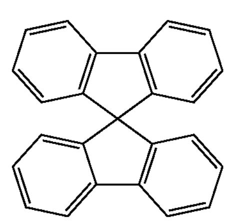
,

-continued

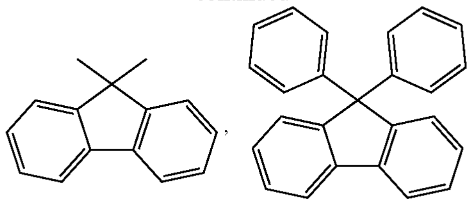

and the like may be included. However, the structure is not limited thereto.

In the present specification, the aryl group in the aryloxy group is the same as the examples of the aryl group described above. Specific examples of the aryloxy group may include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group and the like, and specific examples of the arylthioxy group may include a phenylthioxy group, a 2-methylphenylthioxy group, a 4-tert-butylphenylthioxy group and the like, and specific examples of the arylsulfoxy group may include a benzenesulfoxy group, a p-toluenesulfoxy group and the like, however, the examples are not limited thereto.

In the present specification, the heterocyclic group is a group including one or more atoms that are not carbon, that is, heteroatoms, and specifically, the heteroatom may include one or more atoms selected from the group consisting of O, N, Se, S and the like. The number of carbon atoms is not particularly limited, but is preferably from 2 to 30, and the heteroaryl group may be monocyclic or polycyclic. Examples of the heterocyclic group may include a thiophene group, a furanyl group, a pyrrole group, an imidazole group, a triazole group, an oxazole group, an oxadiazole group, a pyridine group, a bipyridine group, a pyrimidine group, a triazine group, a triazole group, an acridine group, a pyridazine group, a pyrazine group, a quinoline group, a quinazoline group, a quinoxaline group, a phthalazine group, a pyridopyrimidine group, a pyridopyrazine group, a pyrazinopyrazine group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthroline group, an isoxazole group, a thiadiazole group, a phenothiazine group, a dibenzofuran group, a dihydrophenothiazine group

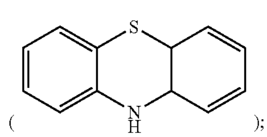 [SMILES: C1=CC2Nc3ccccc3SC2C=C1]

a dihydrobenzoisoquinoline group

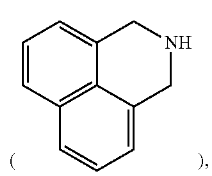

a chromene group

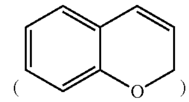

and the like, but are not limited thereto.

In the present specification, the heterocyclic group may be monocyclic or polycyclic, may be aromatic, aliphatic or a fused ring of aromatic and aliphatic, and may be selected from among the examples of the heterocyclic group.

In the present specification, the hydrocarbon ring may be aromatic, aliphatic or a fused ring of aromatic and aliphatic, and may be selected from among the examples of the cycloalkyl group or the aryl group except for those that are not monovalent, and examples of the fused ring of aromatic and aliphatic may include a 1,2,3,4-tetrahydronaphthalene group

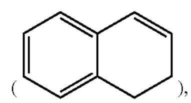

a 2,3-dihydro-1H-indene group

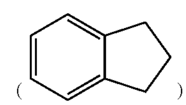

and the like, but are not limited thereto.

In the present specification, the arylene group means an aryl group having two bonding sites, that is, a divalent group. Descriptions on the aryl group provided above may be applied thereto except for each being a divalent group.

In the present specification, the heteroarylene group means a heteroaryl group having two bonding sites, that is, a divalent group. Descriptions on the heteroaryl group provided above may be applied thereto except for each being a divalent group.

In the present specification, an "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

In the present specification, the meaning of "adjacent groups bond to each other to form a ring" among substituents means adjacent groups bonding to each other to form a substituted or unsubstituted hydrocarbon ring; or a substituted or unsubstituted heteroring.

In one embodiment of the present specification, at least one of R1 and R2 and at least one of R3 and R4 are Chemical Formula 2.

In one embodiment of the present specification, R1 and R3 are Chemical Formula 2, and R2 and R4 are the same as or different from each other and each independently hydrogen; a halogen group; a nitrile group; a nitro group; an ester group; a substituted or unsubstituted alkyl group; a substituted or unsubstituted cycloalkyl group; a substituted or unsubstituted alkoxy group; a substituted or unsubstituted fluoroalkyl group; a substituted or unsubstituted alkylthio group; a substituted or unsubstituted silyl group; a substituted or unsubstituted amine group; a substituted or unsubstituted aryl group; a substituted or unsubstituted heteroaryl group; or a substituted or unsubstituted cyclic hydrocarbon group.

In one embodiment of the present specification, R2 and R4 are the same as or different from each other, and each independently hydrogen; F; a nitrile group; a nitro group; —C(═O))$R_{200}$; a substituted or unsubstituted methyl group; a substituted or unsubstituted butyl group; a substituted or unsubstituted cyclohexyl group; a substituted or unsubstituted methoxy group; a substituted or unsubstituted trifluoromethyl group; a substituted or unsubstituted methylthio group; a substituted or unsubstituted triphenylsilyl group; a substituted or unsubstituted trimethylsilyl group; a substituted or unsubstituted diethylamine group; a substituted or unsubstituted phenyl group; a substituted or unsubstituted biphenyl group; a substituted or unsubstituted terphenyl group; a substituted or unsubstituted naphthyl group; a substituted or unsubstituted fluorenyl group; a substituted or unsubstituted spirobifluorenyl group; a substituted or unsubstituted thiophene group; a substituted or unsubstituted furan group; a substituted or unsubstituted dibenzothiophene group; a substituted or unsubstituted dibenzofuran group; a substituted or unsubstituted carbazole group; a substituted or unsubstituted benzocarbazole group; a substituted or unsubstituted thiazole group; a substituted or unsubstituted phenothiazine group; a substituted or unsubstituted phenoxazine group; or a substituted or unsubstituted tetrahydronaphthalene group.

In one embodiment of the present specification, $R_{200}$ is

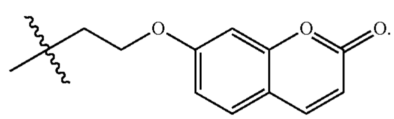

In one embodiment of the present specification, 'substituted or unsubstituted' in R2 and R4 means being unsubstituted or substituted with an aryl group; an alkyl group; an alkoxy group; a halogen group; a silyl group; or a nitrile group.

In one embodiment of the present specification, 'substituted or unsubstituted' in R2 and R4 means being unsubstituted or substituted with a phenyl group; a methoxy group; a methyl group; an ethyl group; a butyl group; F; a trimethylsilyl group; or a nitrile group.

In one embodiment of the present specification, at least two of R1 to R4 are represented by Chemical Formula 2.

In one embodiment of the present specification, R1 to R4 are Chemical Formula 2.

Chemical Formula 2 according to the present specification is a molecular structure having a high molar extinction coefficient, and as the number introduced into one molecule increases, absorbance for blue light is enhanced. Particularly, in aza-bodipy, absorbance for 450 nm is present, and therefore, when the number introduced into the molecule increases, absorbance for 450 nm also increases, and therefore, green fluorescence emitted in the molecule increases, and probability of reabsorption to a red region and color conversion to fluorescence increases. Accordingly, efficiency of the color conversion film increases.

Accordingly, compounds having a high color conversion rate may be obtained when R1 to R4 are all Chemical Formula 2, and the color conversion rate may be further increased depending on the types of substituents substituting Chemical Formula 2.

In one embodiment of the present specification, L1 and L2 are the same as or different from each other, and each independently a substituted or unsubstituted phenylene group; a substituted or unsubstituted biphenylylene group; a substituted or unsubstituted naphthylene group; a substituted or unsubstituted anthracenylene group; a substituted or unsubstituted terphenylene group; a substituted or unsubstituted quaterphenylene group; or a substituted or unsubstituted triphenylylene group.

In one embodiment of the present specification, L1 and L2 are the same as or different from each other, and each independently a substituted or unsubstituted phenylene group; or a substituted or unsubstituted biphenylylene group.

In one embodiment of the present specification, L1 and L2 are the same as or different from each other, and each independently a phenylene group unsubstituted or substituted with an alkyl group, an alkoxy group or a halogen group; or a biphenylylene group unsubstituted or substituted with an alkyl group, an alkoxy group or a halogen group.

In one embodiment of the present specification, L1 and L2 are the same as or different from each other, and each independently a substituted or unsubstituted phenylene group.

In one embodiment of the present specification, L1 and L2 are the same as or different from each other, and each independently a phenylene group unsubstituted or substituted with an alkyl group, an alkoxy group or a halogen group.

In one embodiment of the present specification, groups not bonding to Chemical Formula 1 among R10 to R19 are the same as or different from each other, and each independently hydrogen; a nitrile group; a nitro group; an ester group; a substituted or unsubstituted alkyl group; a substituted or unsubstituted alkoxy group; a substituted or unsubstituted aryloxy group; a substituted or unsubstituted fluoroalkyl group; a substituted or unsubstituted alkylthio group; a substituted or unsubstituted silyl group; a substituted or unsubstituted aryl group; a substituted or unsubstituted heterocyclic group; or a substituted or unsubstituted cyclic hydrocarbon group.

In one embodiment of the present specification, 'substituted or unsubstituted' in the groups not bonding to Chemical Formula 1 among R10 to R19 means being substituted with one or more substituents selected from the group consisting of a fluoroalkyl group; a silyl group; a halogen group; an aryl group; a heteroaryl group; an ester group; a nitrile group; an alkoxy group; a nitro group; an alkyl group; an aryloxy group; an arylamine group; a cycloalkyl group; and a substituent represented by Chemical Formula 2, or unsubstituted.

In one embodiment of the present specification, 'substituted or unsubstituted' in the groups not bonding to Chemical Formula 1 among R10 to R19 means being substituted with one or more substituents selected from the group consisting of a trifluoromethyl group; a triphenylsilyl group; a trimethylsilyl group; a triethylsilyl group; F; a phenyl group; a naphthyl group; a fluorenyl group; a furan group; a thiophene group; a dibenzofuran group; a dibenzothiophene group; a carbazole group; a phenoxathin group; a benzoxazole group; a chromene group; —COOR201; a nitrile group; an alkoxy group; a nitro group; an alkyl group; a phenoxy group; a diphenylamine group; a cyclohexyl group; and a substituent represented by Chemical Formula 2, or unsubstituted.

In one embodiment of the present specification, X1 and X2 are the same as or different from each other, and each independently a halogen group; a nitrile group; —$CO_2$R""; a substituted or unsubstituted alkyl group having 1 to 20 carbon atoms; a substituted or unsubstituted alkynyl group having 2 to 20 carbon atoms; a substituted or unsubstituted aryloxy group having 6 to 30 carbon atoms; a substituted or unsubstituted alkoxy group having 1 to 20 carbon atoms; a substituted or unsubstituted aryl group having 6 to 30 carbon atoms; or a substituted or unsubstituted heterocyclic group having 2 to 30 carbon atoms.

In one embodiment of the present specification, X1 and X2 are the same as or different from each other, and each independently F; a nitrile group; —$CO_2$R""; a methyl group; a hexyl group; a phenoxy group substituted with a nitro group or a propyl group; a methoxy group; an ethoxy group; a phenyl group unsubstituted or substituted with F, an ethoxy group or a propyl group; a dimethylfluorenyl group; a thiophene group;

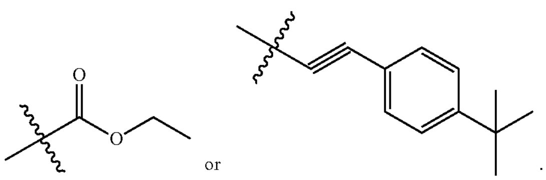

In one embodiment of the present specification, R"" is a substituted or unsubstituted methyl group; a substituted or unsubstituted ethyl group; a substituted or unsubstituted propyl group; a substituted or unsubstituted butyl group; a substituted or unsubstituted trifluoromethyl group; a substituted or unsubstituted perfluoropropyl group; a substituted or unsubstituted phenyl group; a substituted or unsubstituted naphthyl group; a substituted or unsubstituted methoxy group; a substituted or unsubstituted dihydrobenzoisoquinoline group; or a substituted or unsubstituted chromenone group.

In one embodiment of the present specification, X1 and X2 are the same as or different from each other, and each independently F; a nitrile group; —$CO_2$R""; a methyl group; a hexyl group; a phenoxy group substituted with a nitro group or a propyl group; a methoxy group; an ethoxy group; a phenyl group unsubstituted or substituted with F, an ethoxy group or a propyl group; a dimethylfluorenyl group; a thiophene group;

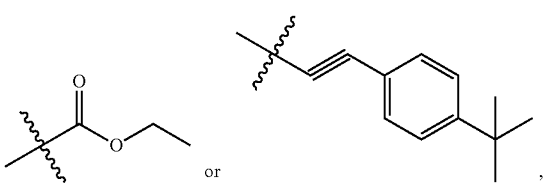

and R"" is a substituted or unsubstituted perfluoropropyl group; or a substituted or unsubstituted chromenone group.

In one embodiment of the present specification, X1 and X2 are the same as or different from each other, and each independently F; a nitrile group; —$CO_2$R""; a methyl group; a hexyl group; a phenoxy group substituted with a nitro group or a propyl group; a methoxy group; an ethoxy group; a phenyl group unsubstituted or substituted with F, an ethoxy group or a propyl group; a dimethylfluorenyl group; a thiophene group;

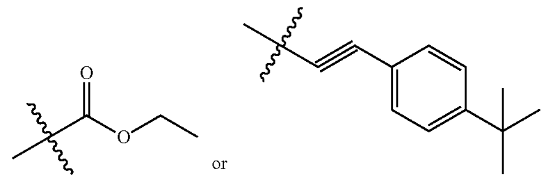

and R"" is a perfluoropropyl group; or a chromenone group unsubstituted or substituted with a ketone group.

In one embodiment of the present specification, X1 and X2 are the same as or different from each other, and are F or a nitrile group.

In one embodiment of the present specification, X1 and X2 are F.

In one embodiment of the present specification, Chemical Formula 2 is represented by any one of the following Chemical Formulae 2-1 to 2-3.

[Chemical Formula 2-1]

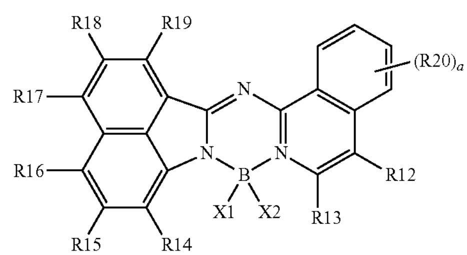

[Chemical Formula 2-2]

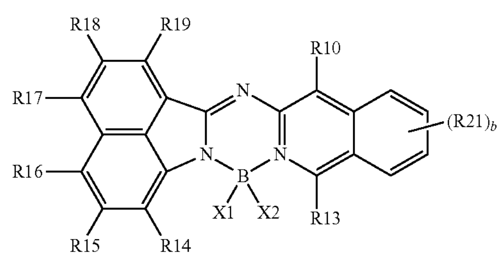

[Chemical Formula 2-3]

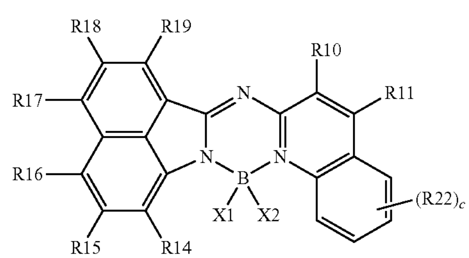

In Chemical Formulae 2-1 to 2-3,

R10 to R19, X1 and X2 have the same definitions as in Chemical Formula 2,

R20 to R22 are the same as or different from each other, and each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted fluoroalkyl group; a substituted or unsubstituted alkylthio group; a substituted or unsubstituted alkoxy group; a substituted or unsubstituted allyloxy group; a substituted or unsubstituted alkylthioxy group; a substituted or unsubstituted arylthioxy group; a substituted or unsubstituted alkylsulfoxy group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; a substituted or unsubstituted heteroaryl group; or a substituted or unsubstituted cyclic hydrocarbon group, and a to c are an integer of 0 to 4, and when a to c are 2 or greater, substituents in the parentheses are the same as or different from each other.

In one embodiment of the present specification, the compound of Chemical Formula 1 is selected from among the following structural formulae.

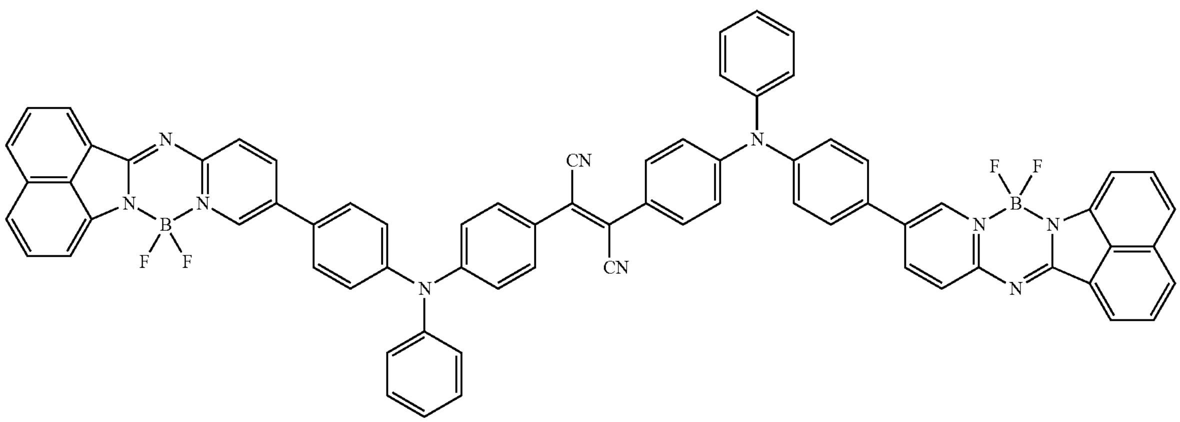

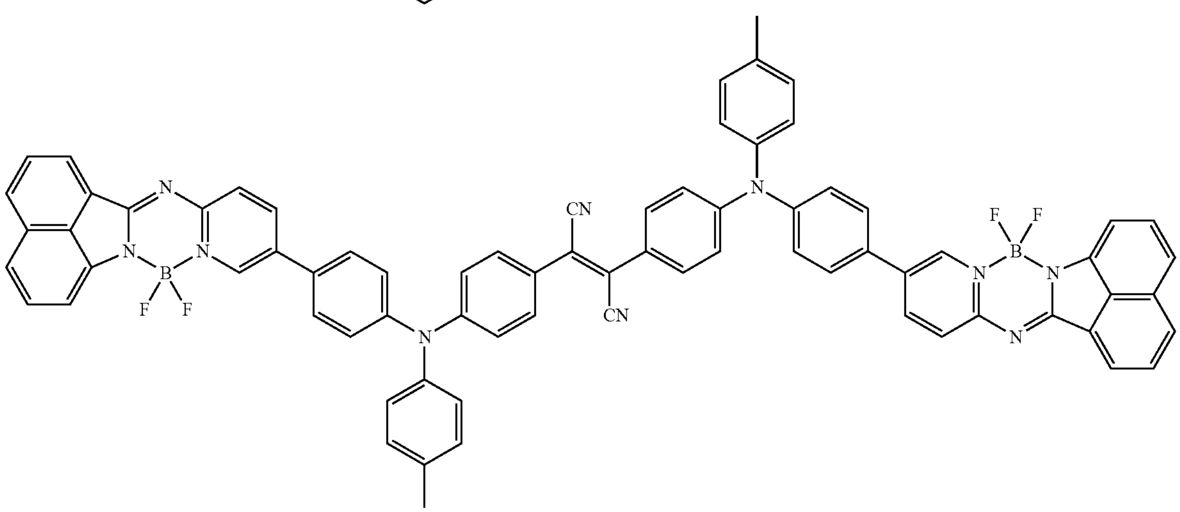

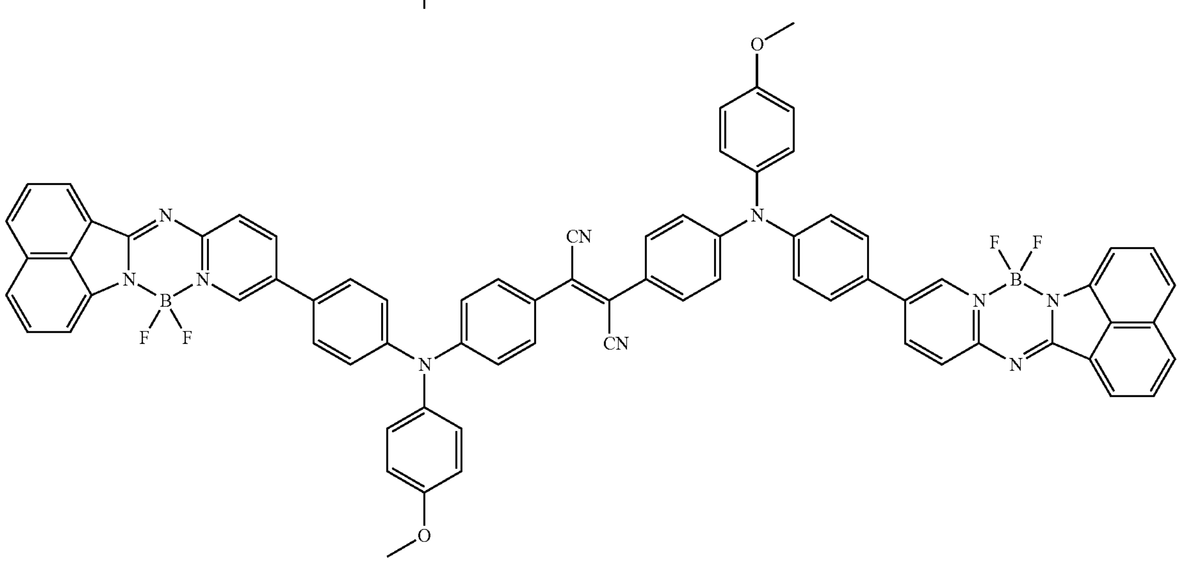

-continued
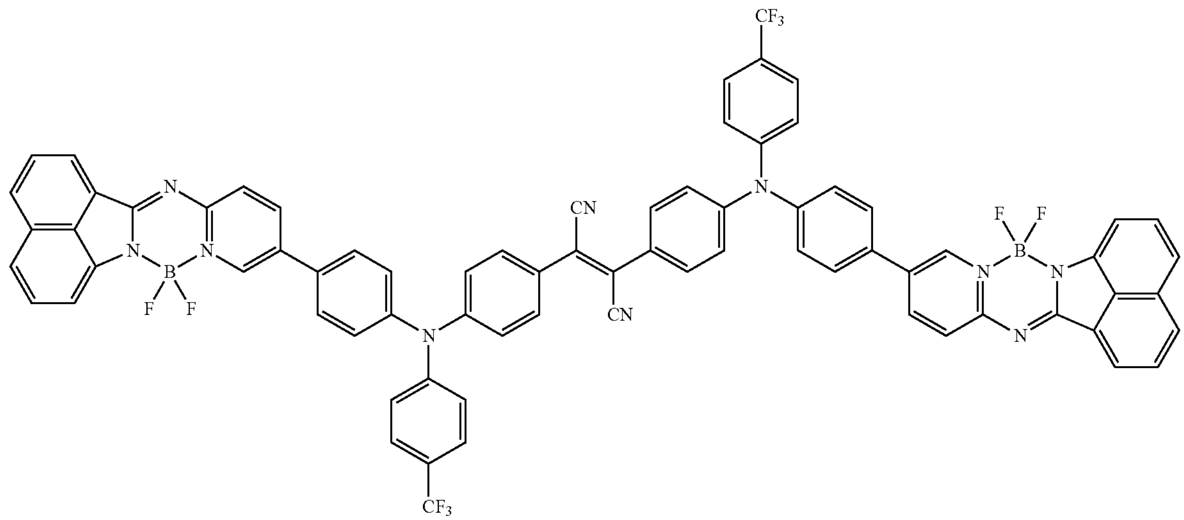
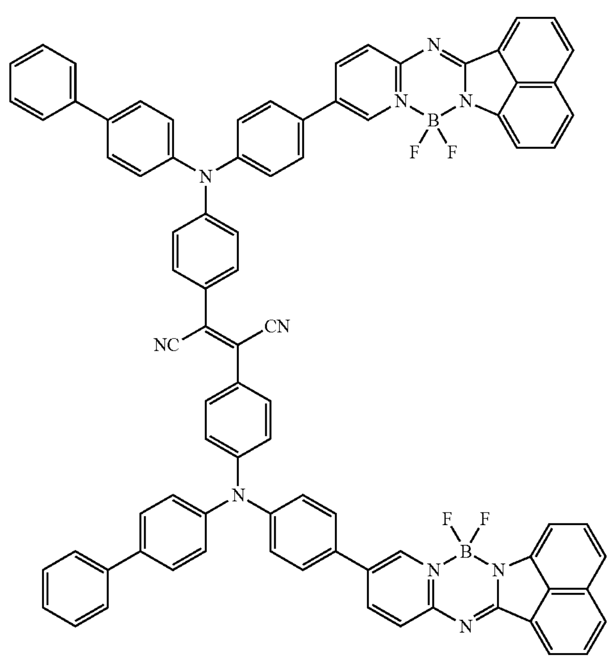

-continued
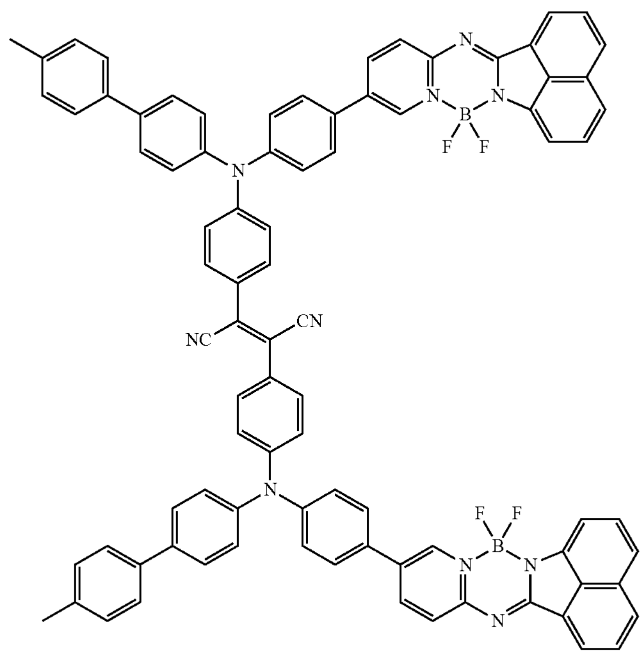
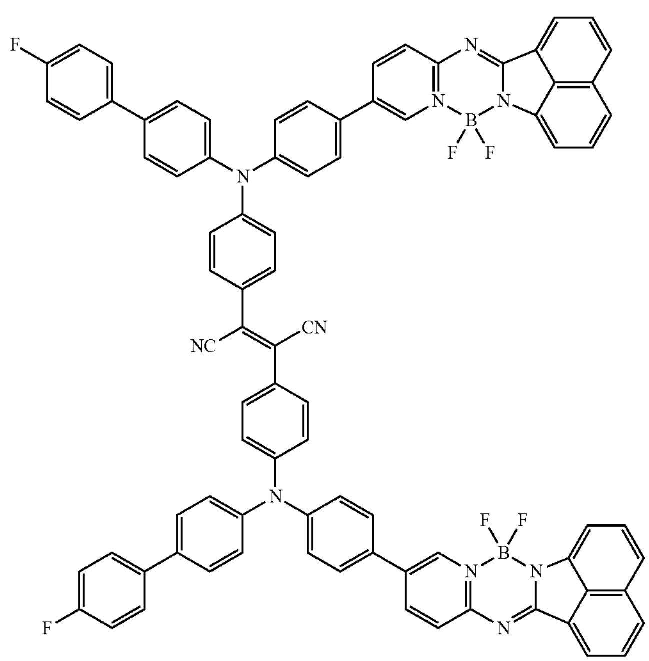

-continued
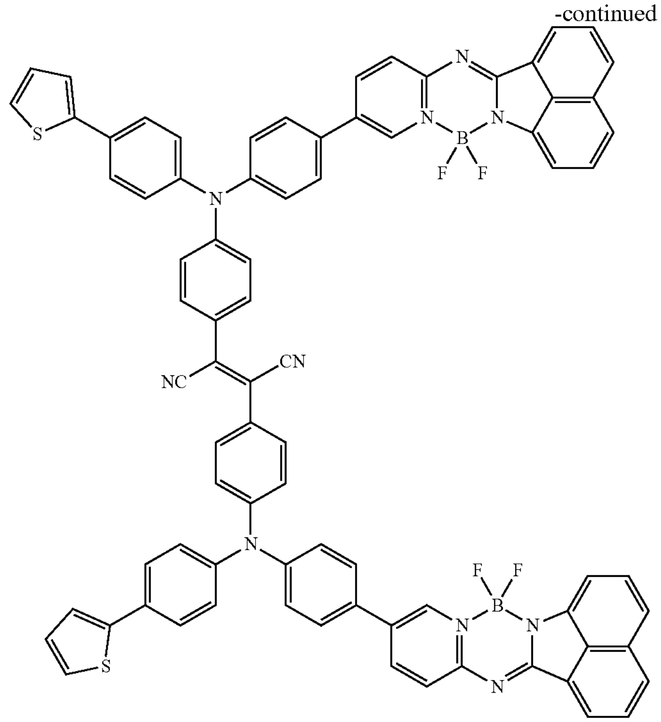
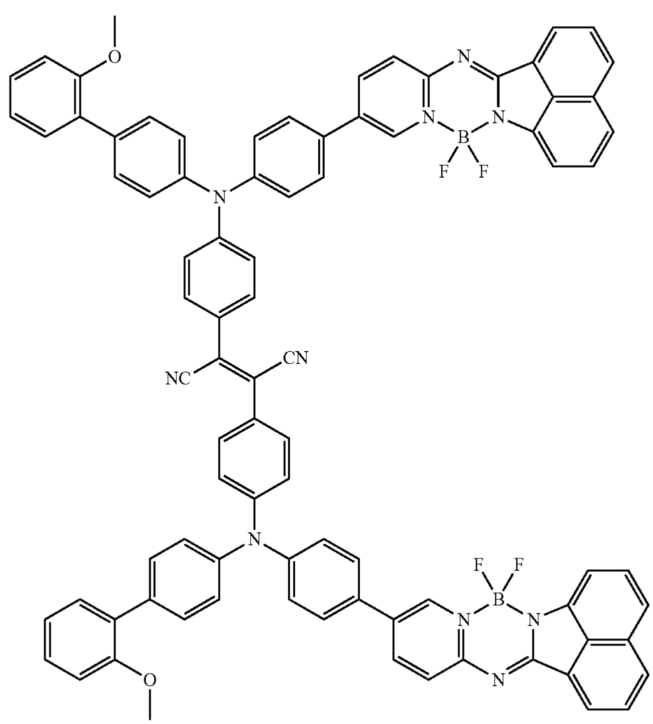

-continued
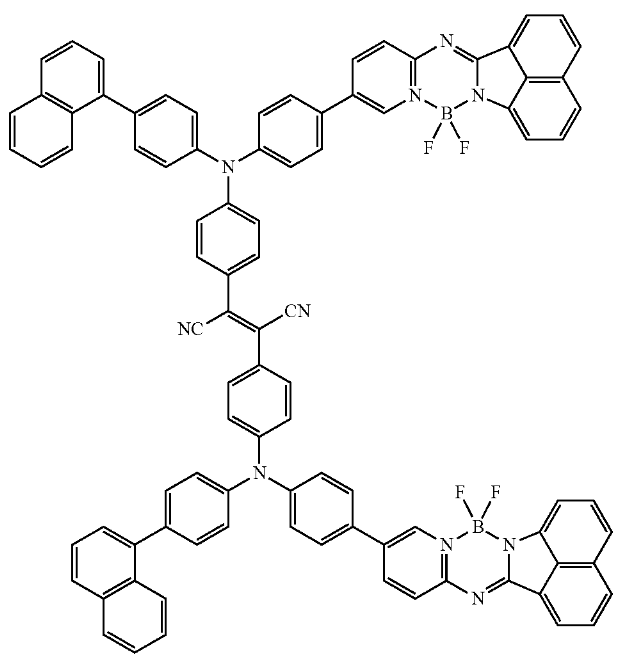
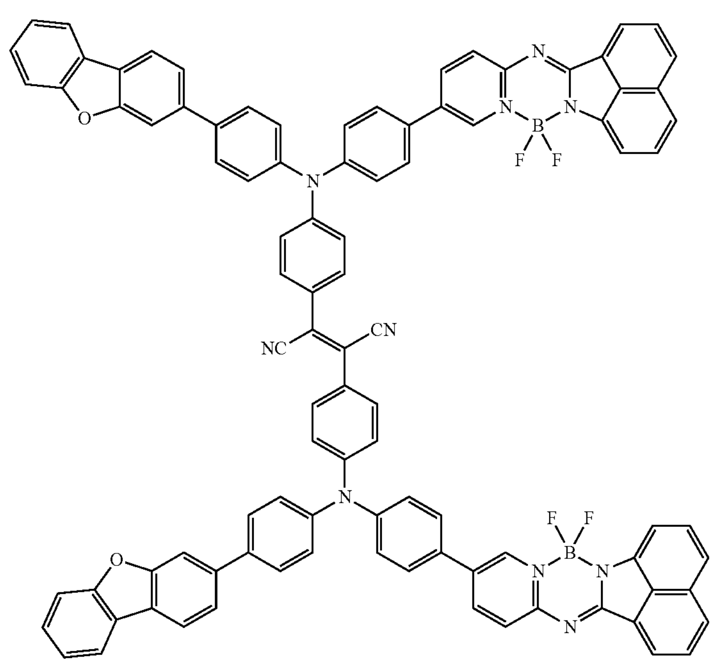

-continued
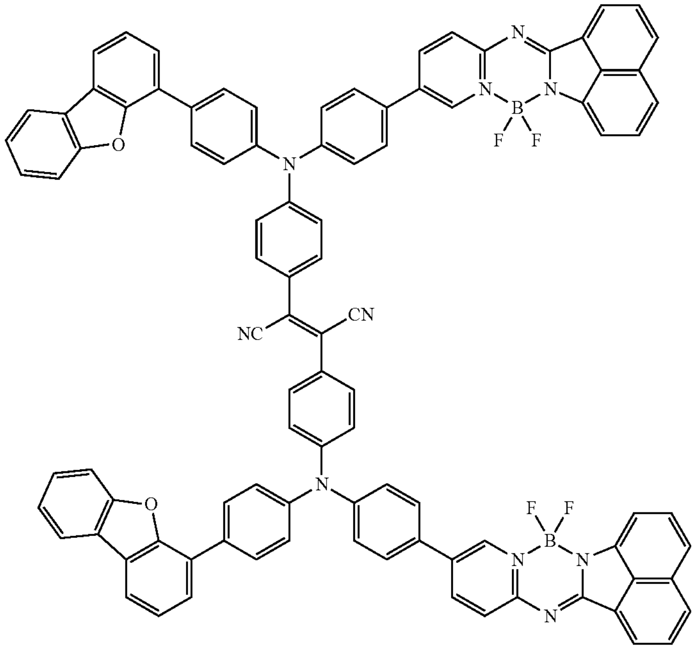
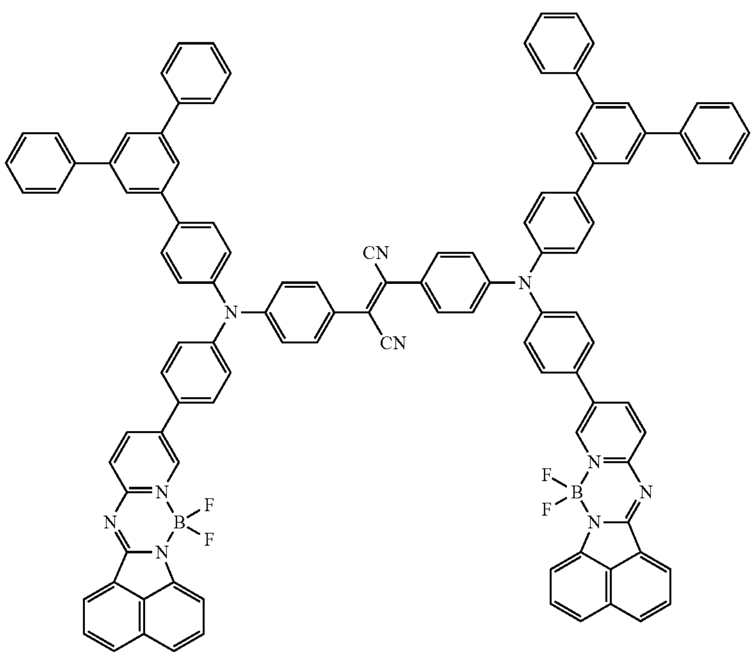

-continued
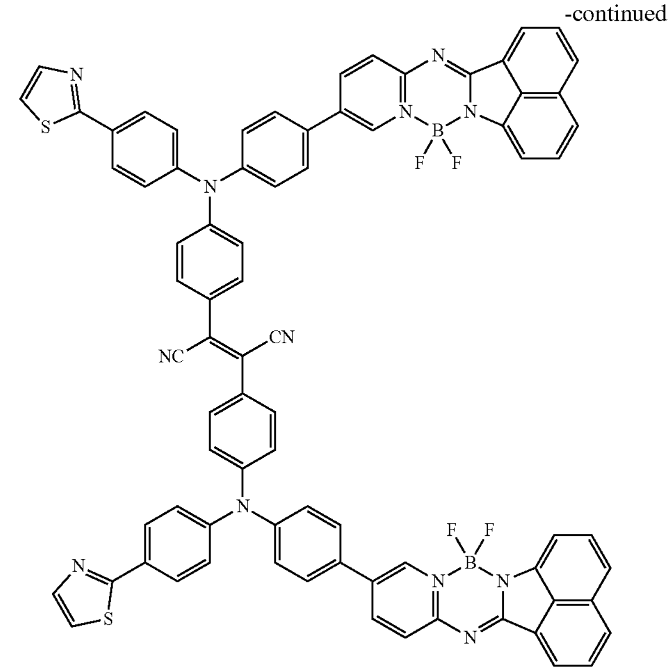
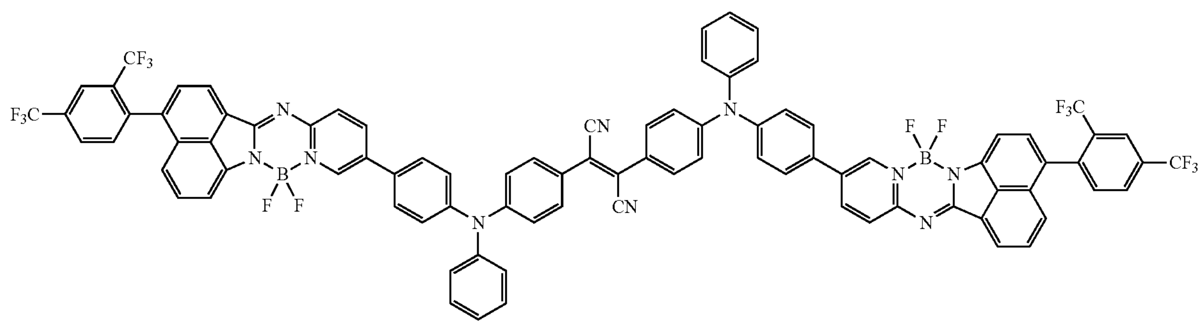
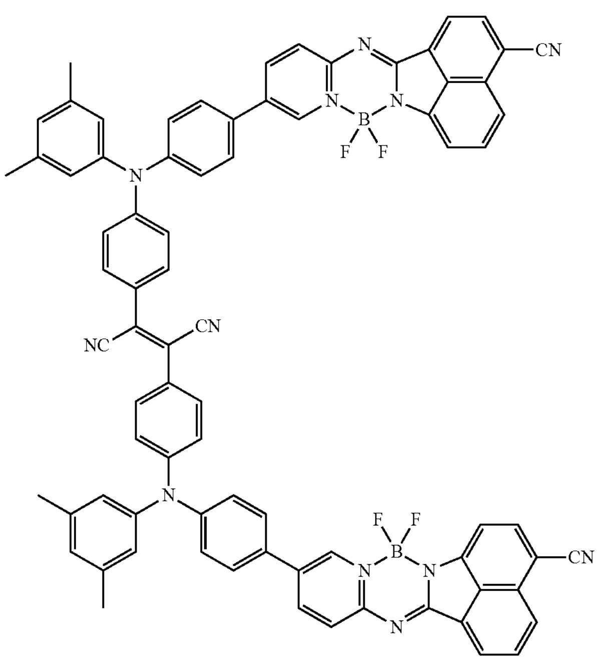

-continued
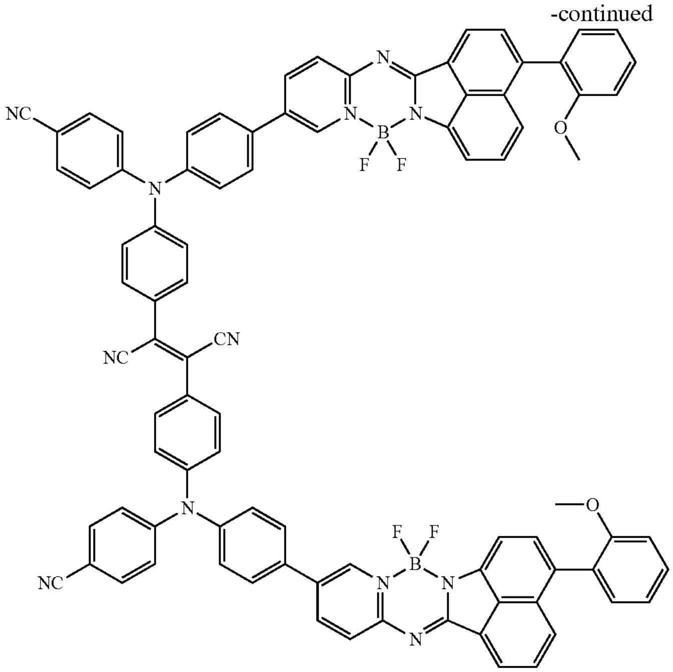
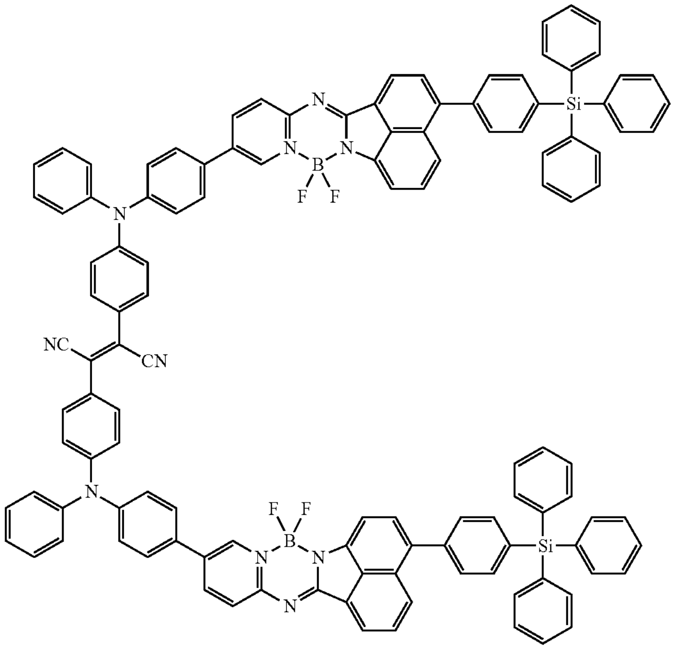
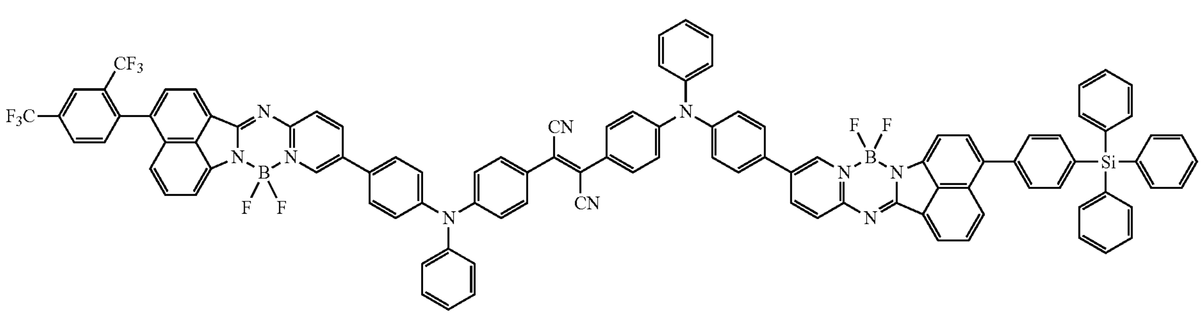

-continued
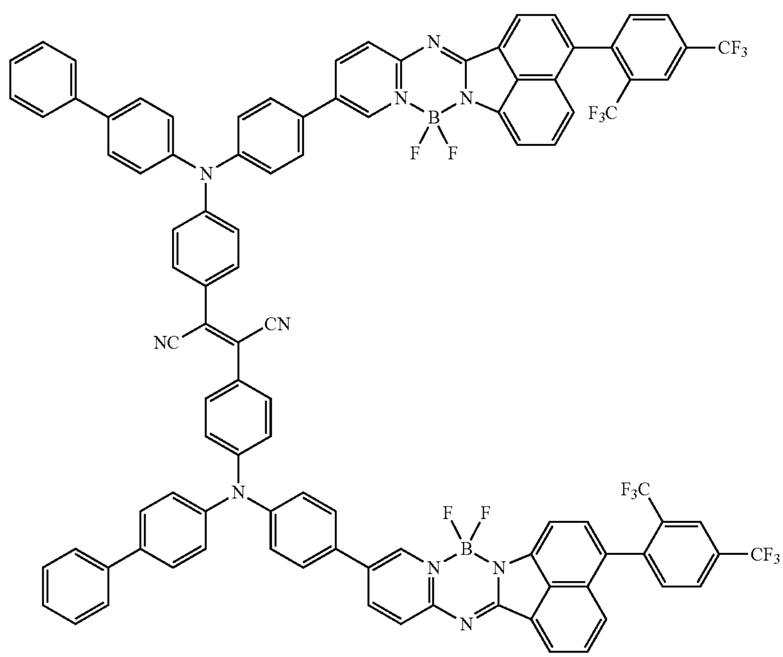
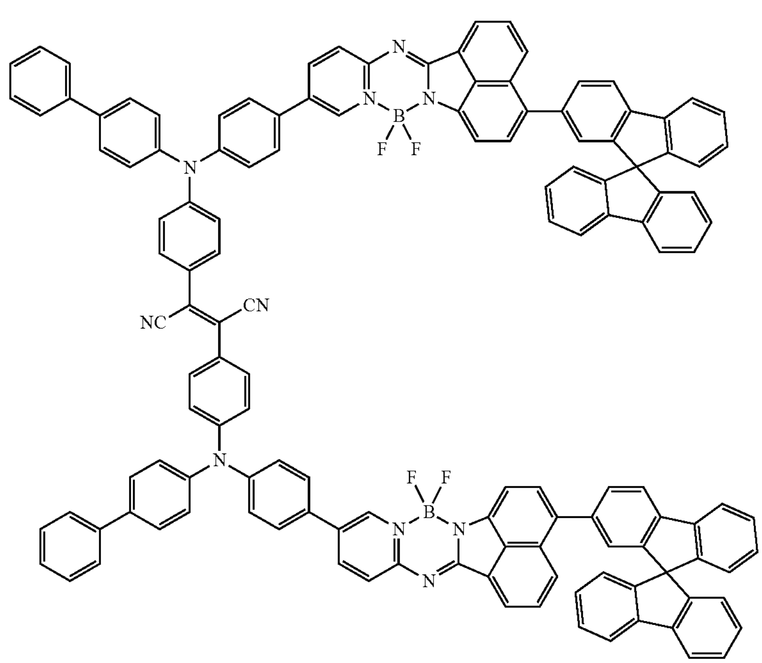

-continued
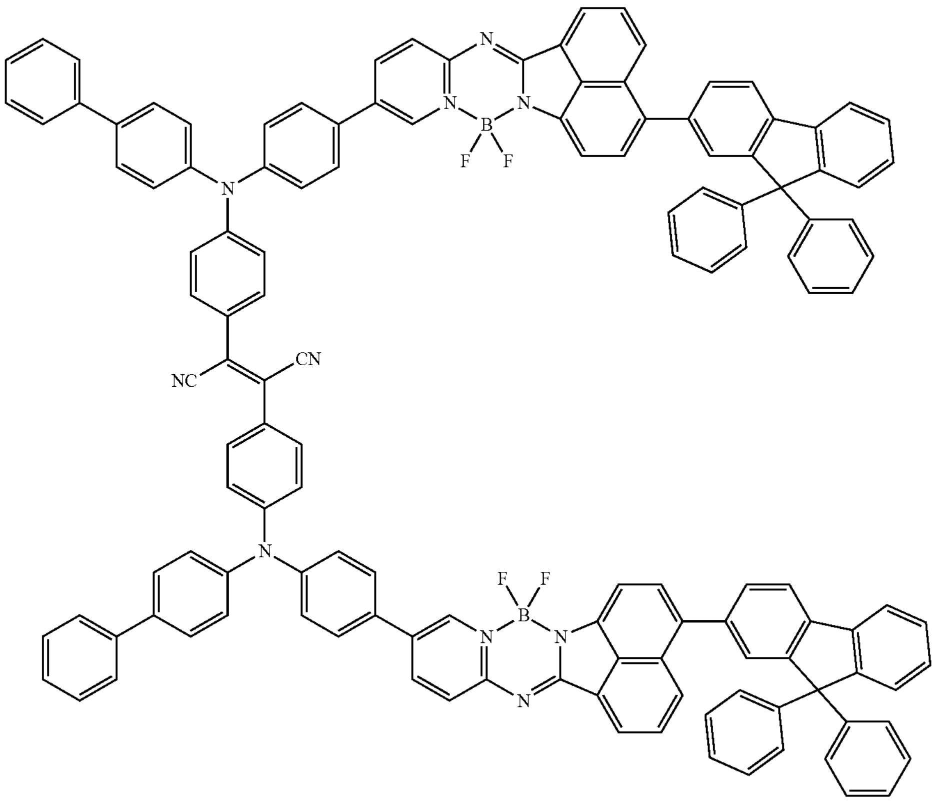
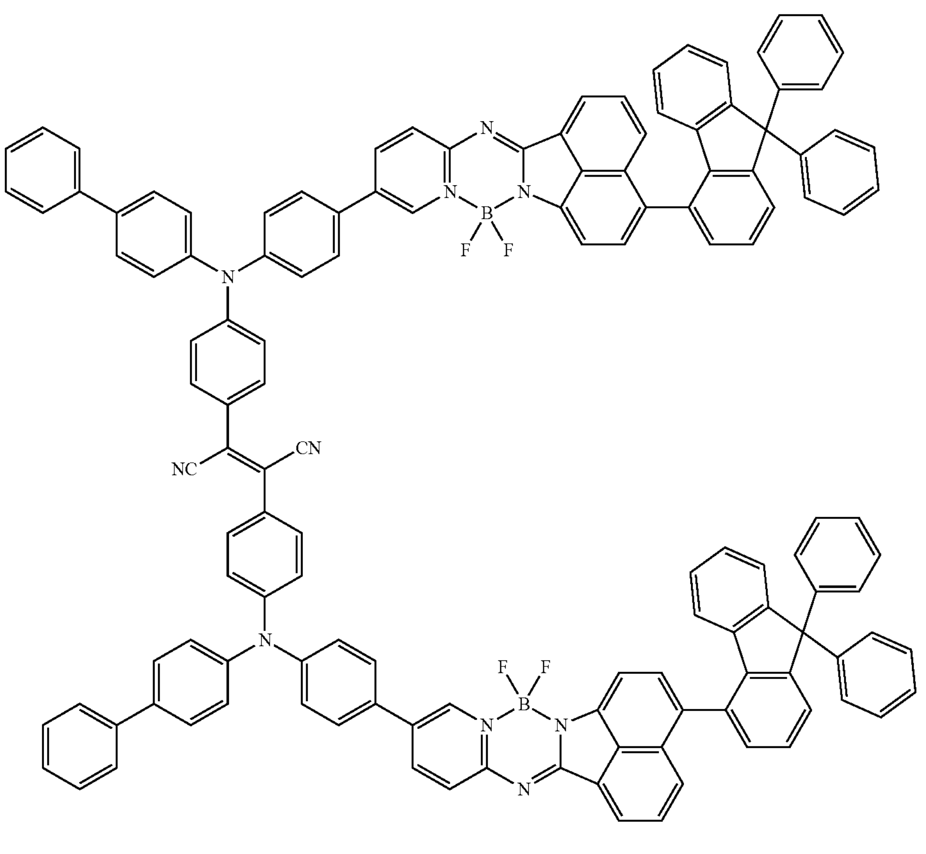

-continued
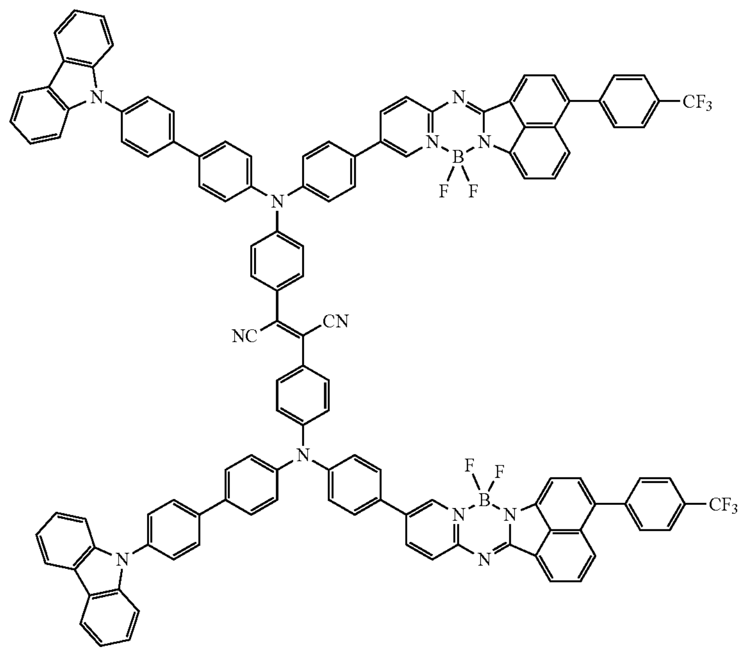
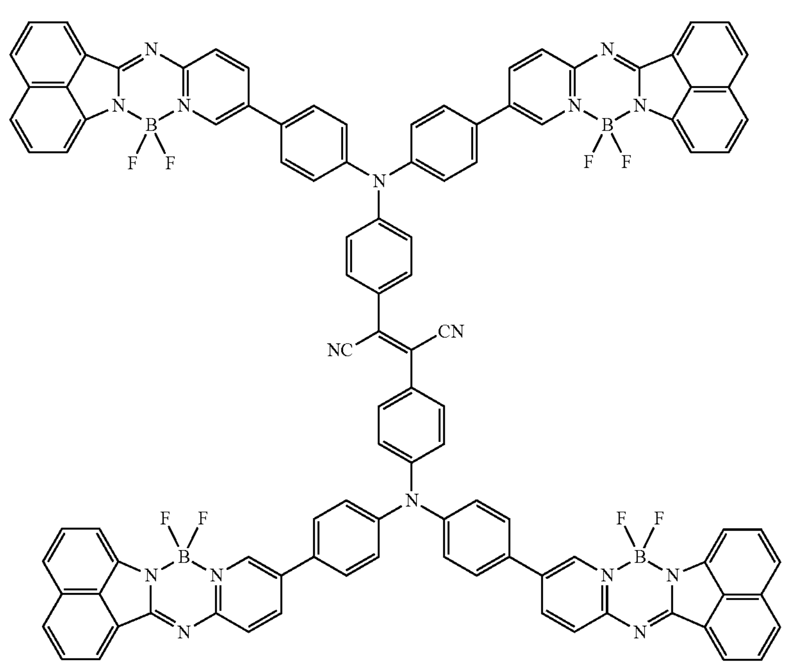

-continued
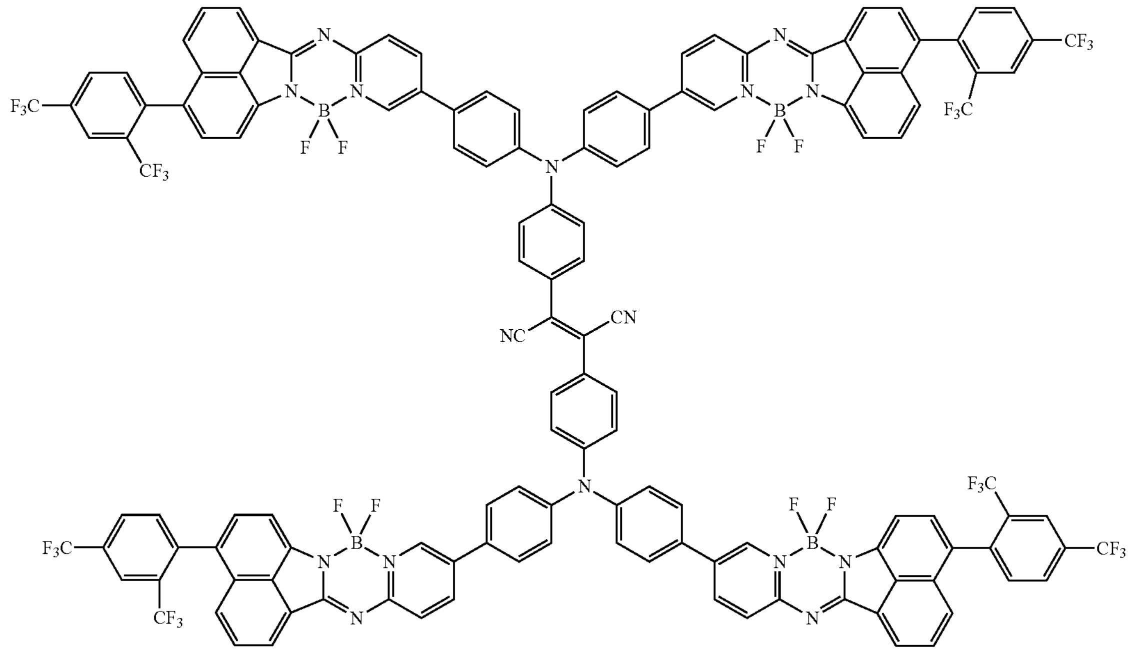
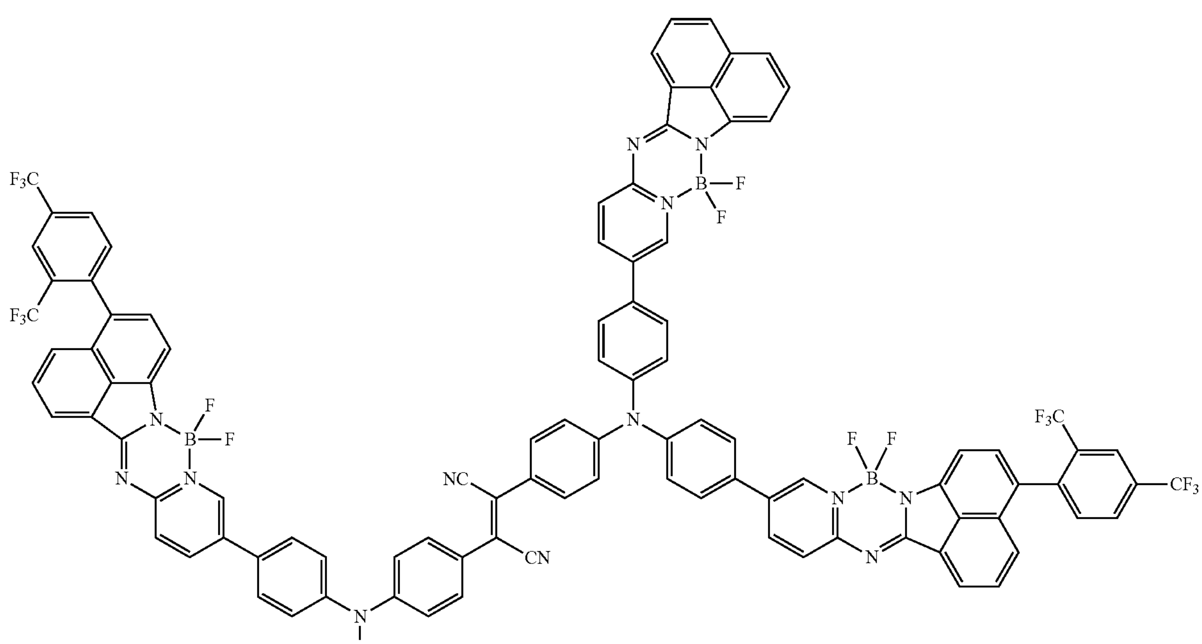

-continued
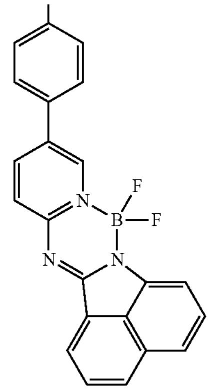
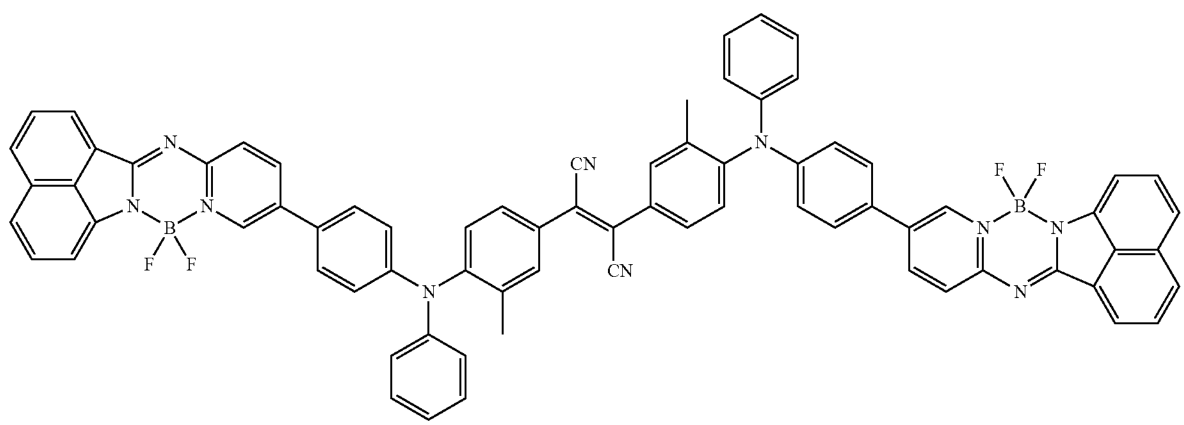
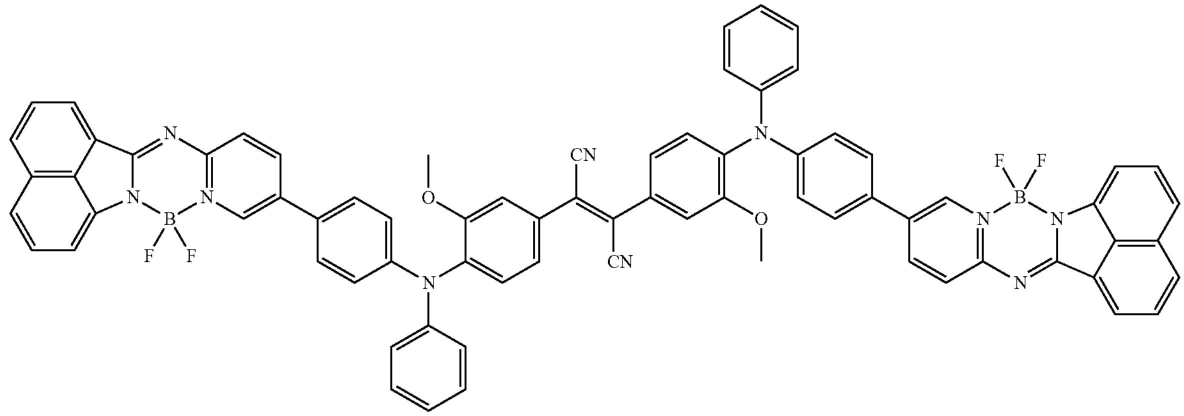

-continued
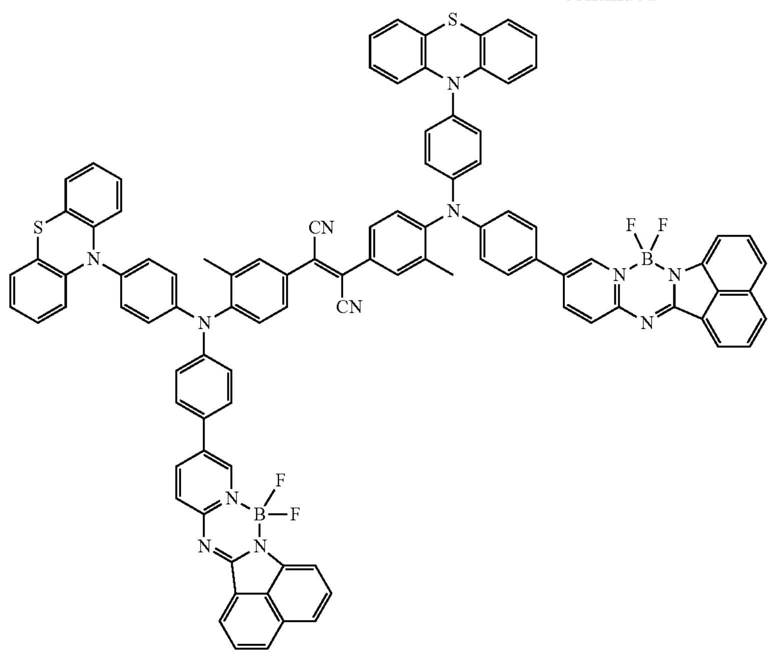
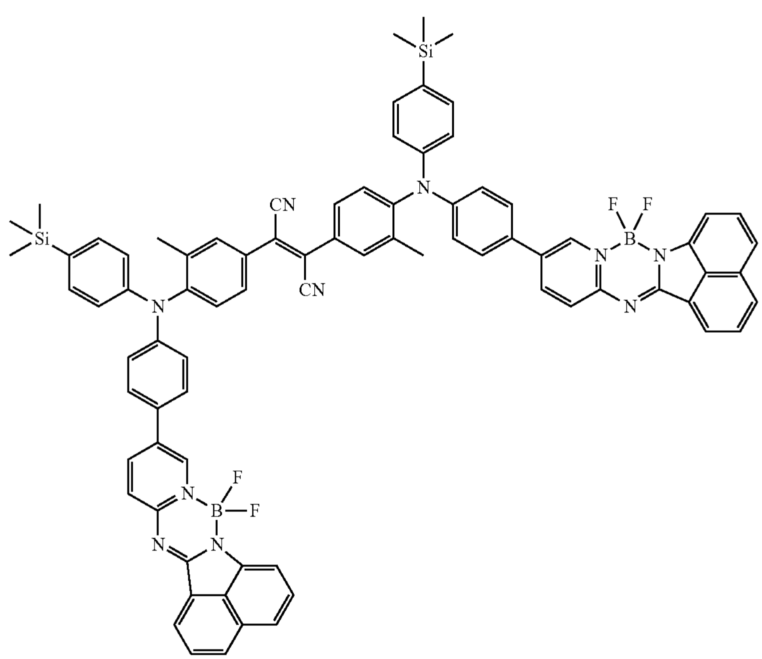

-continued
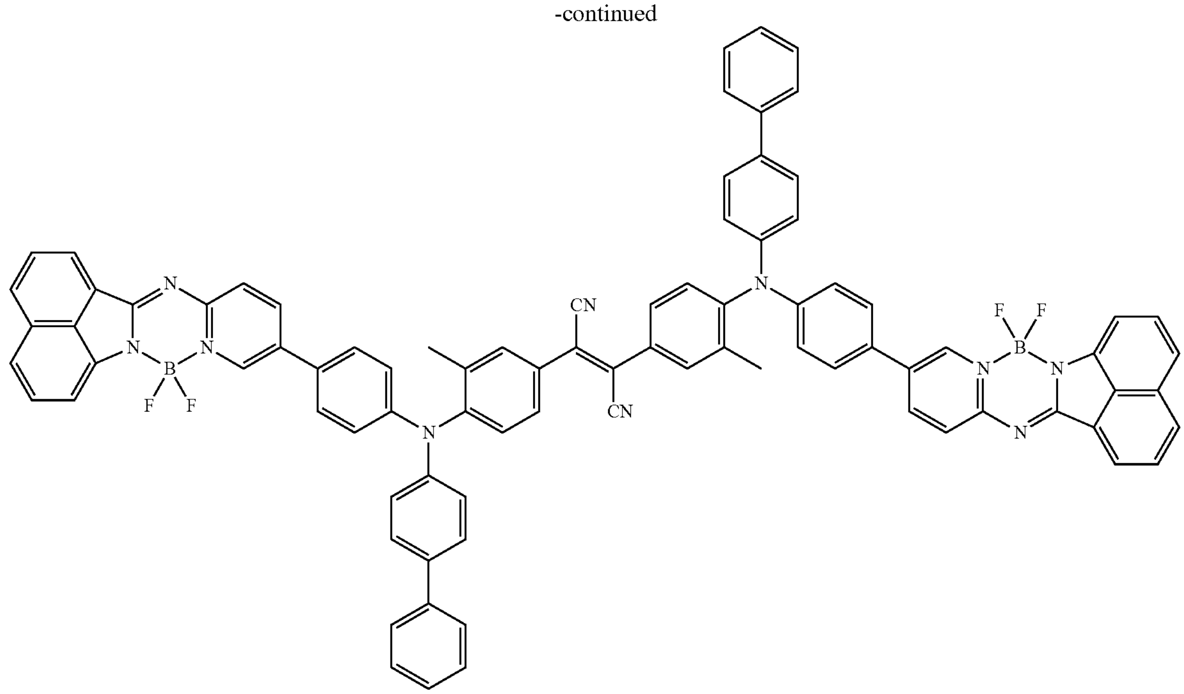
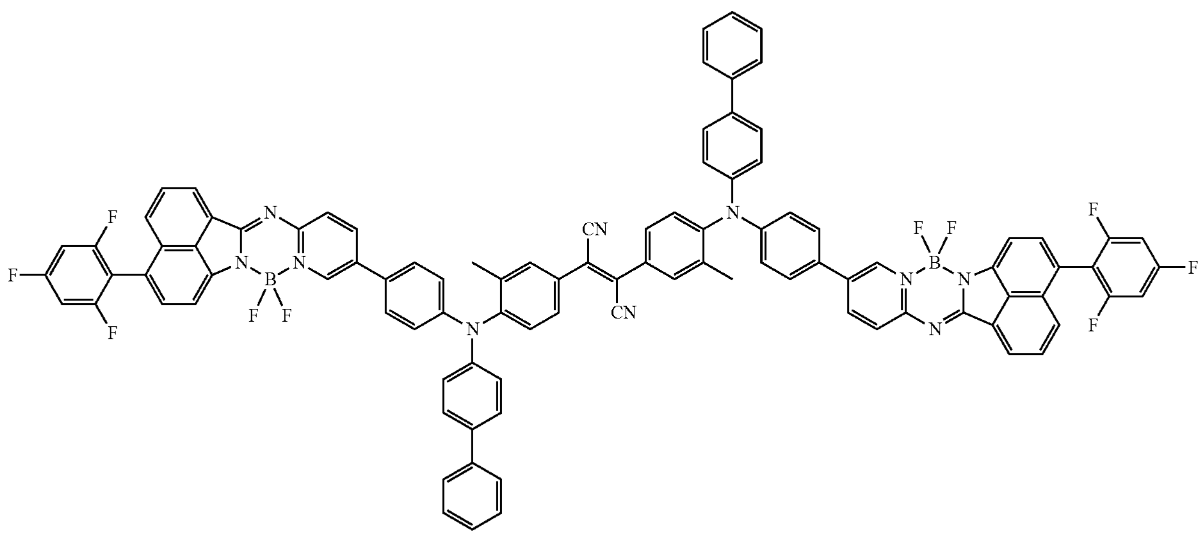
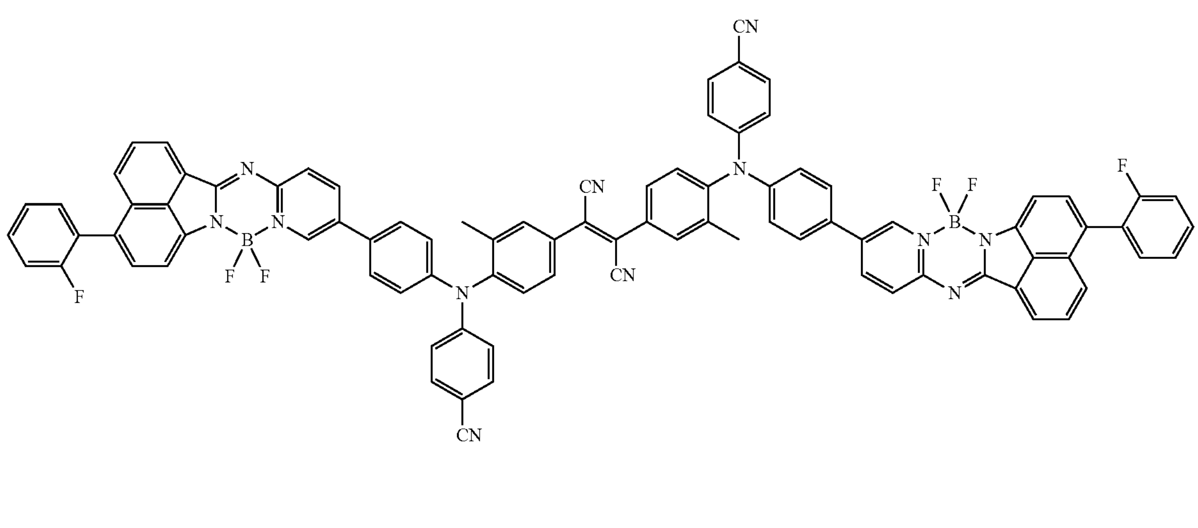

-continued
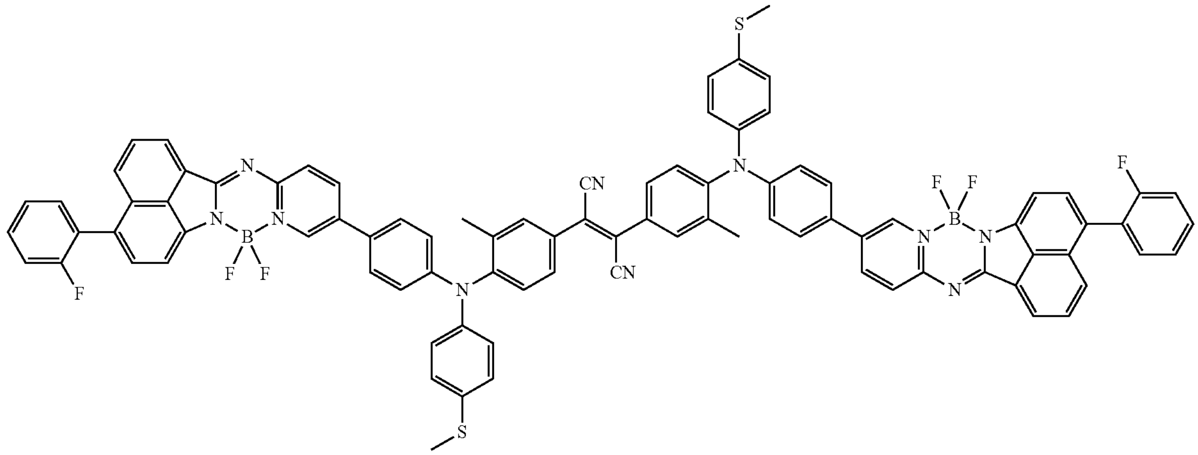
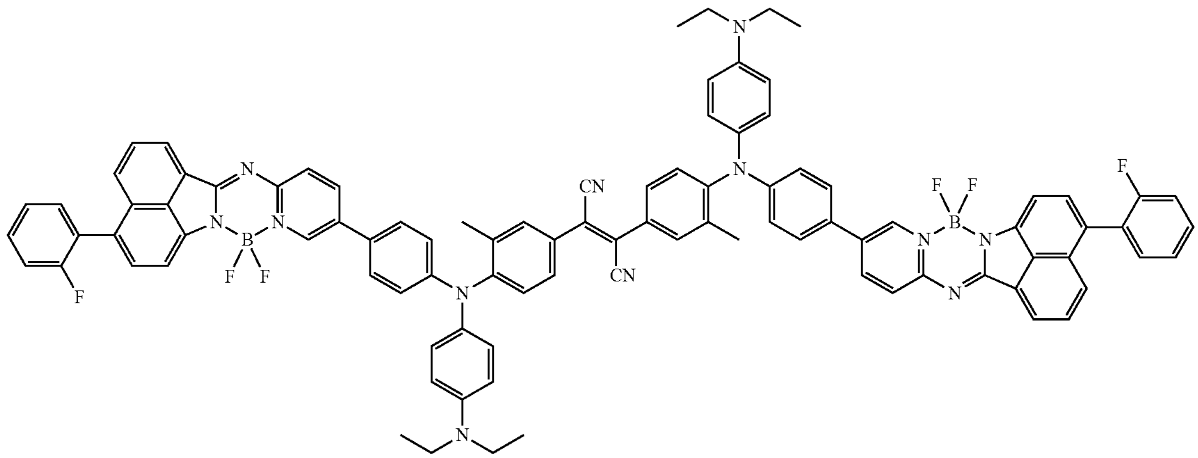
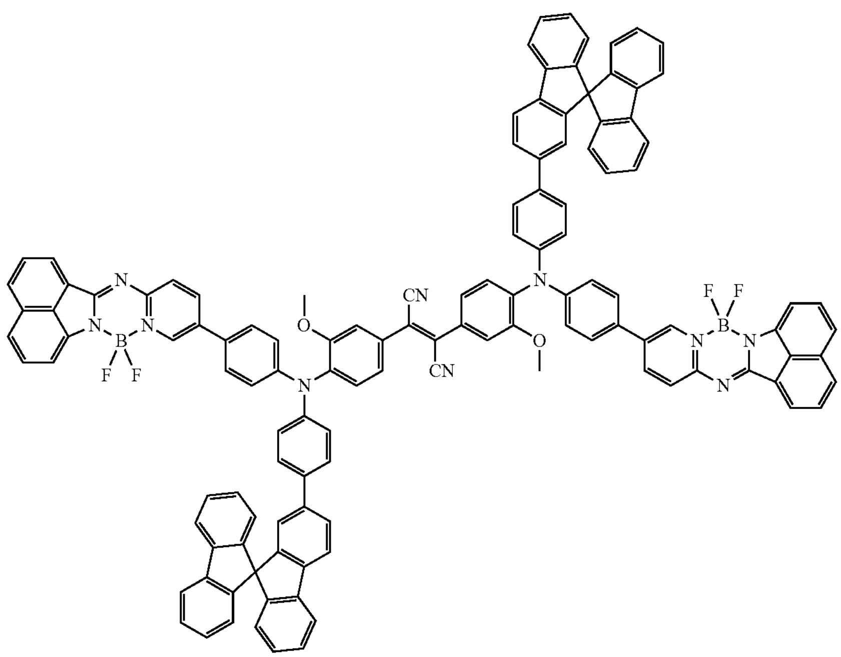

-continued
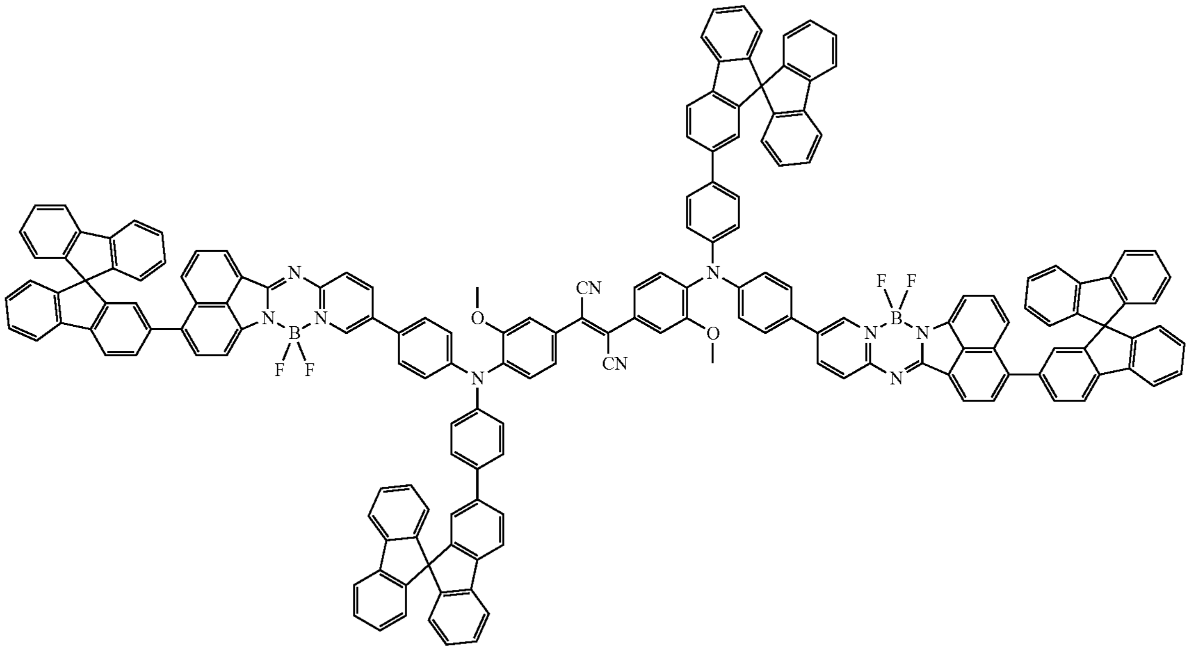
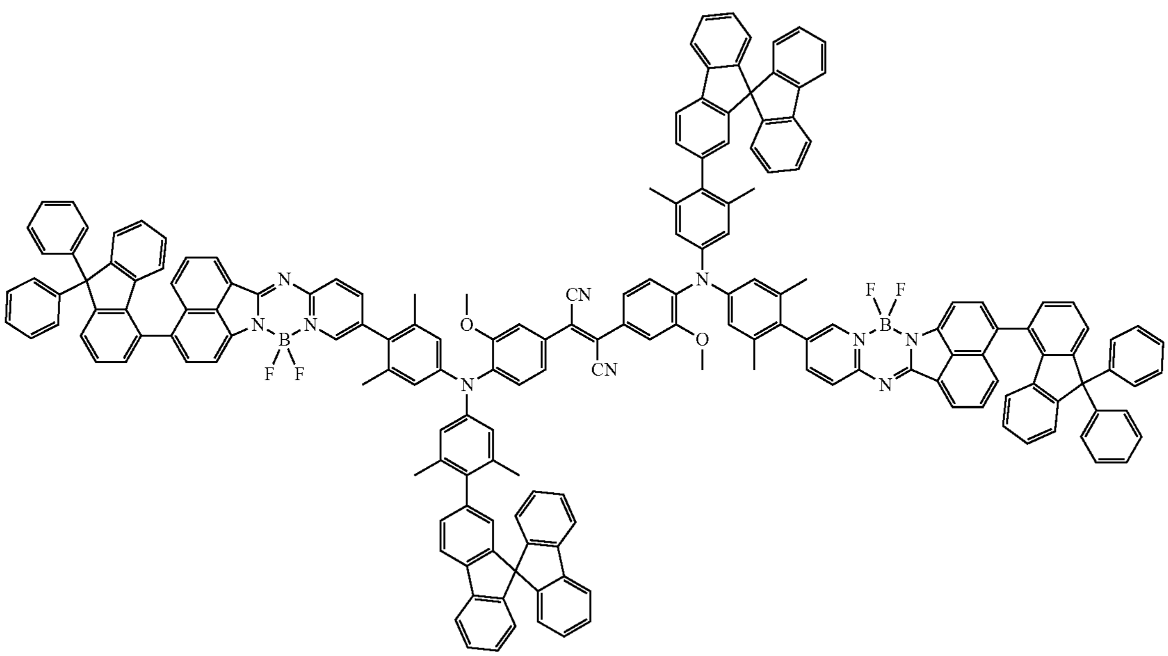

-continued
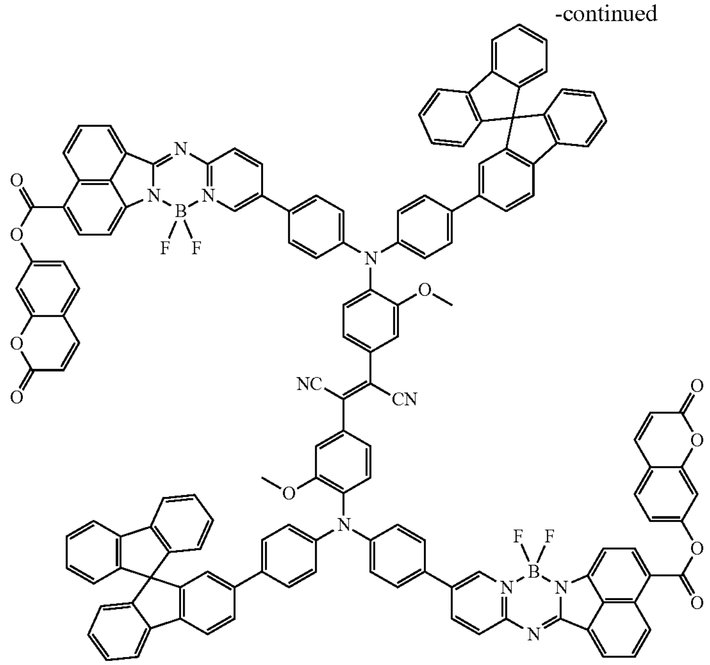
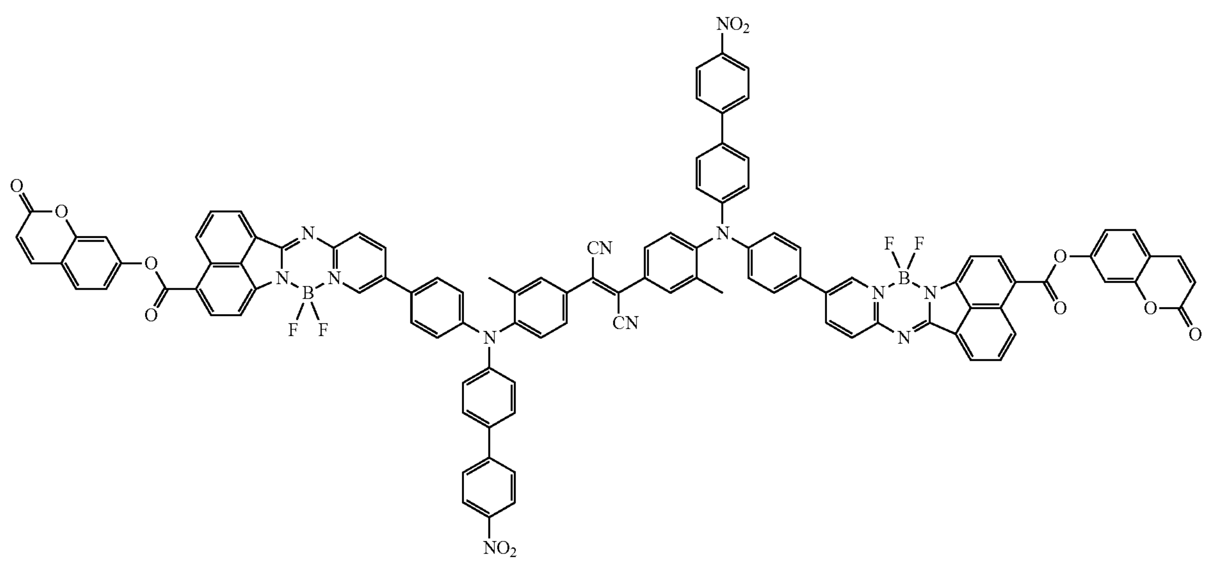

-continued
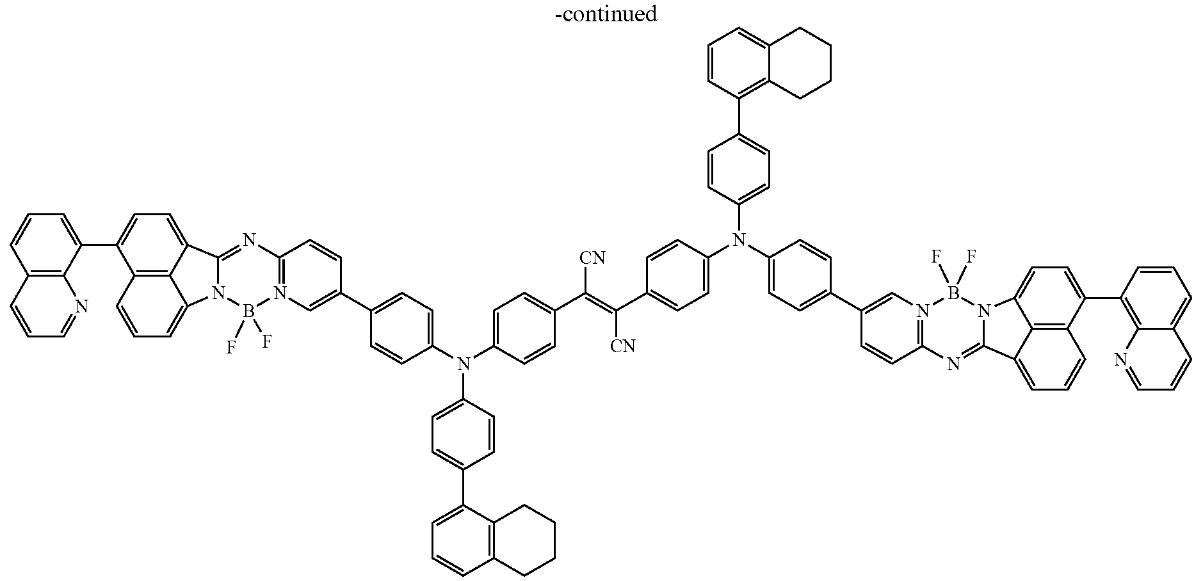
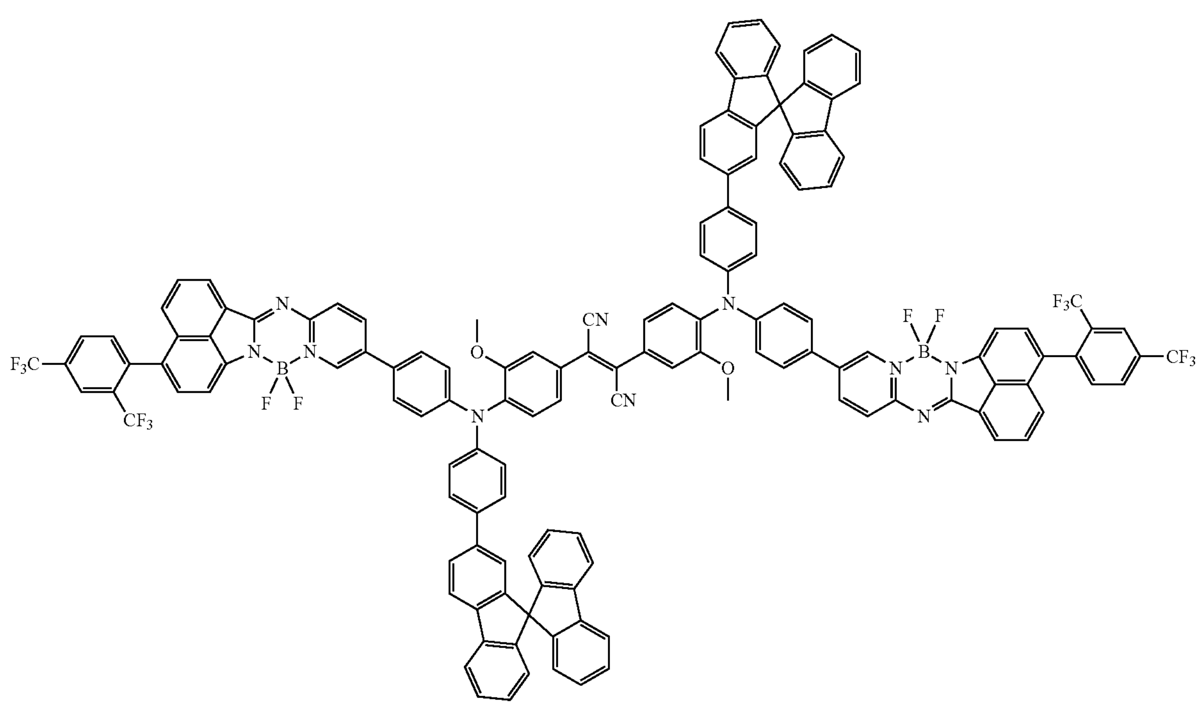

-continued
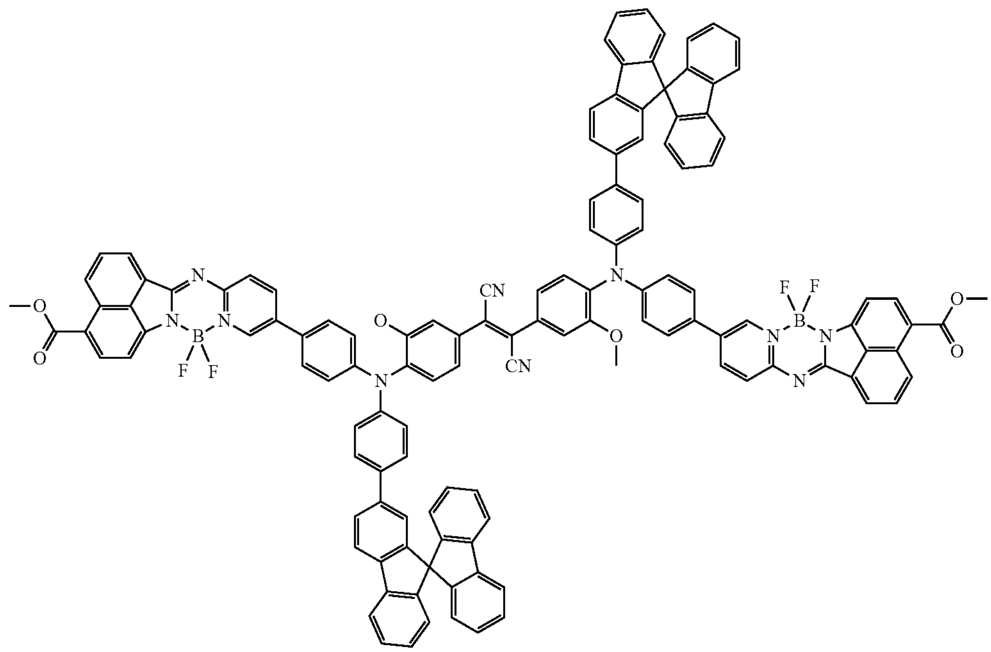
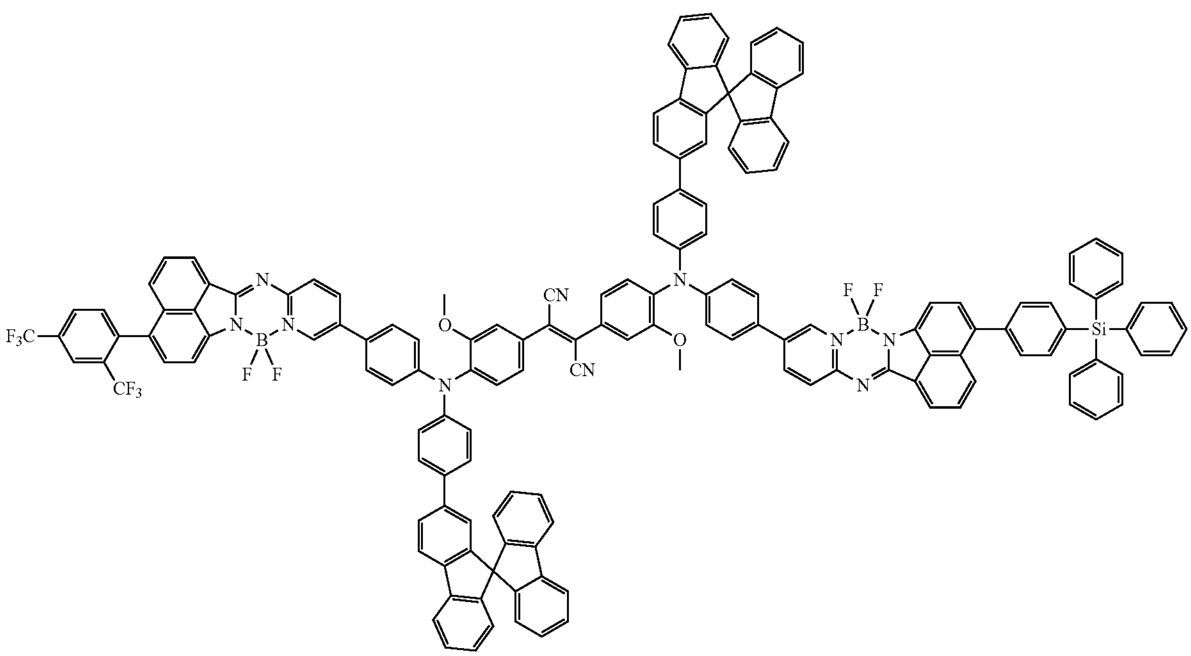

-continued
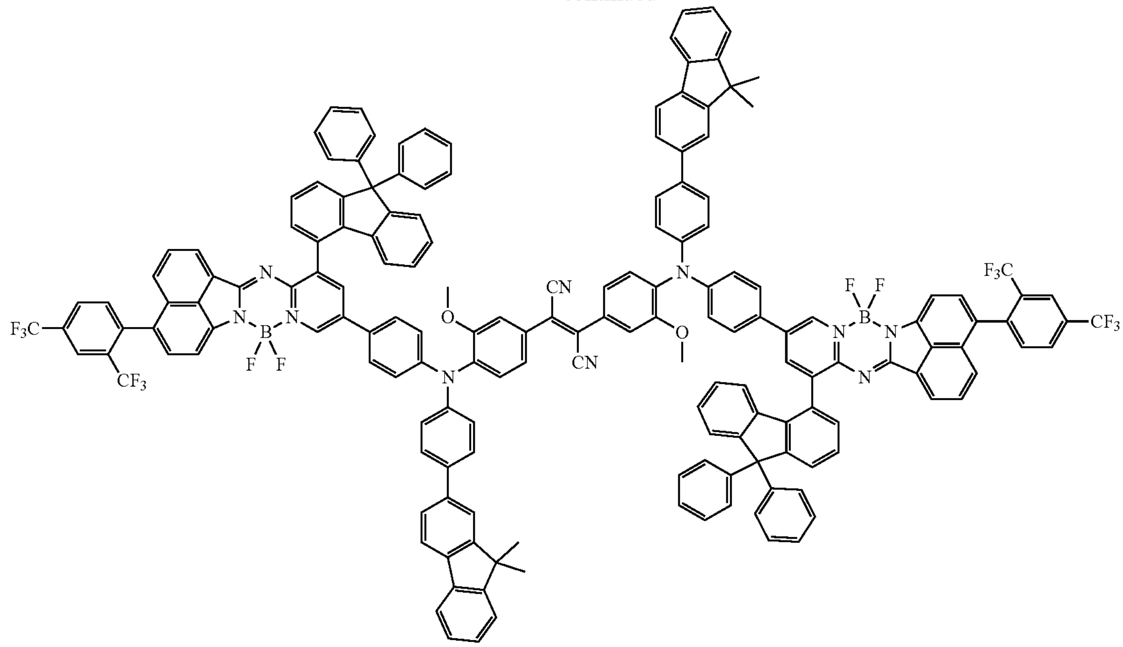
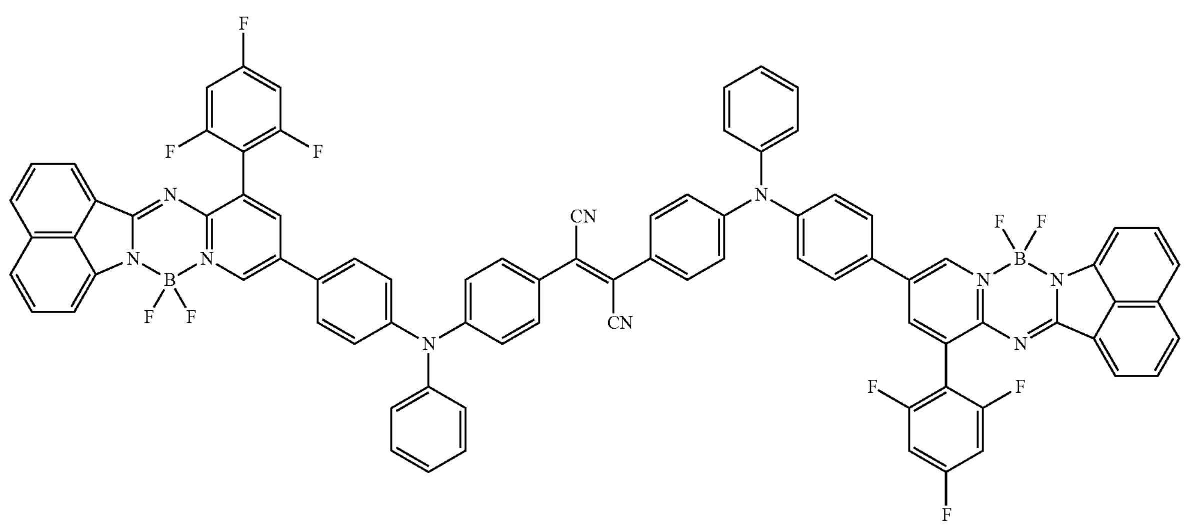

-continued
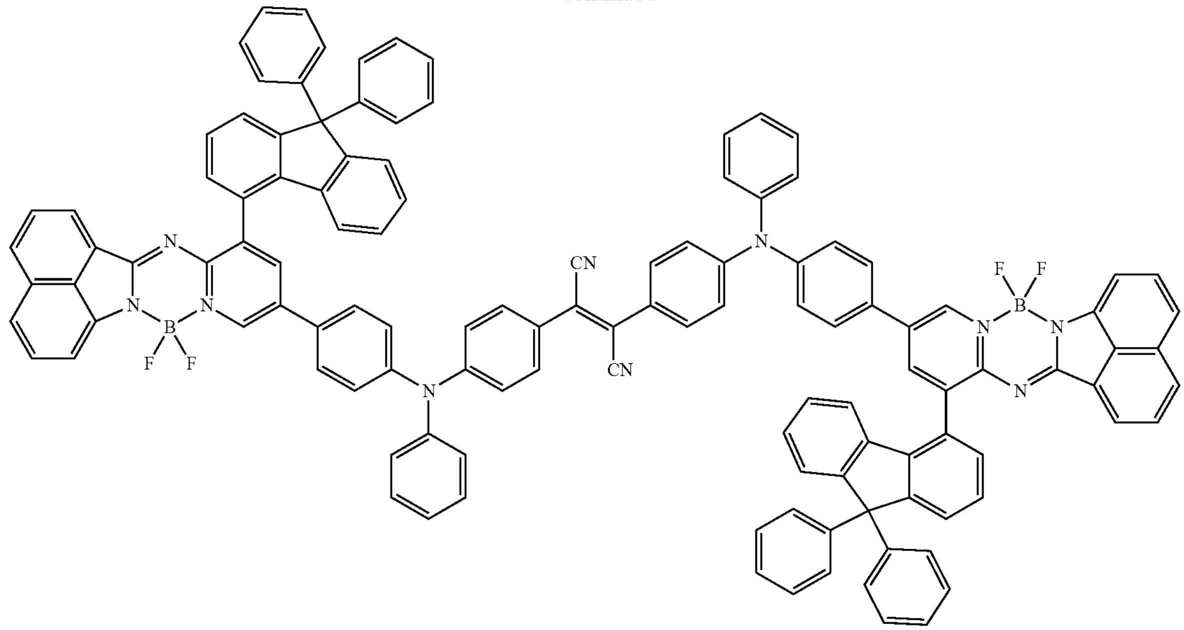
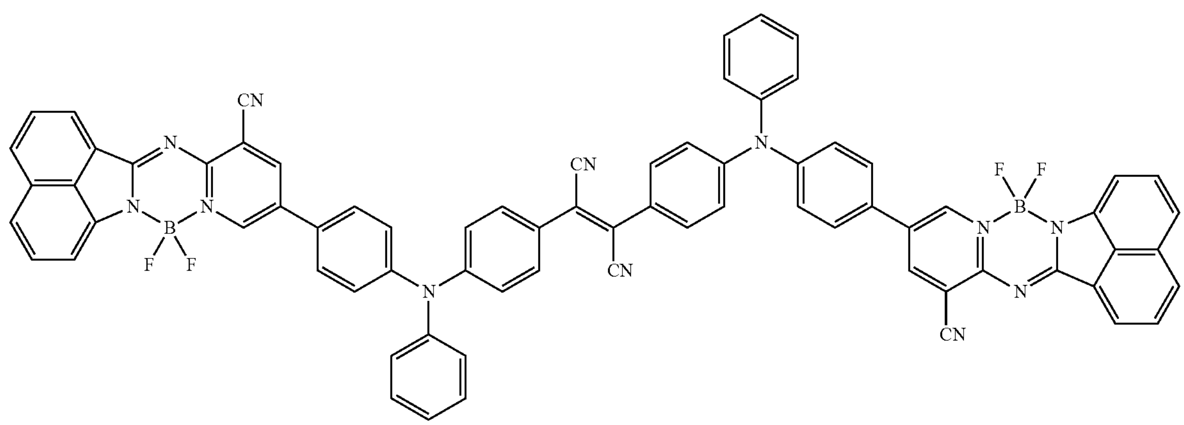
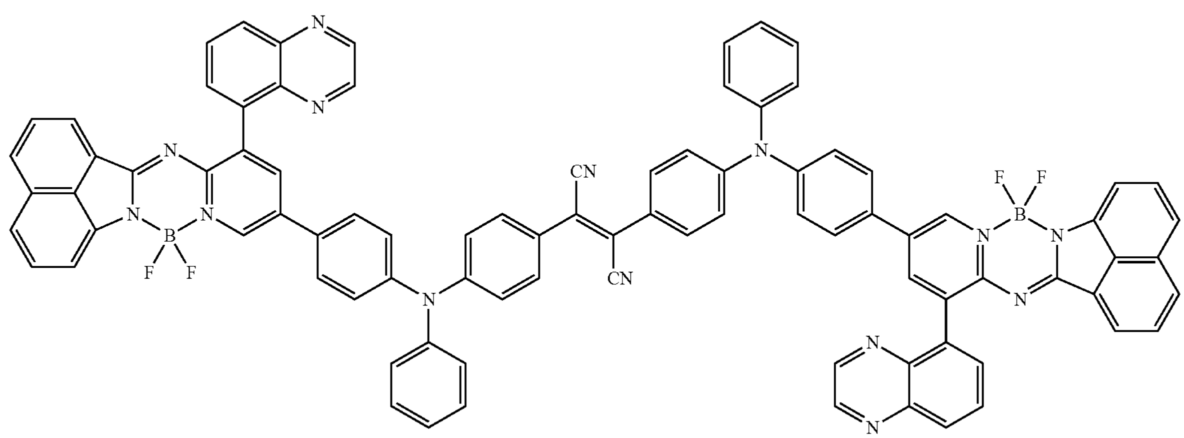

-continued
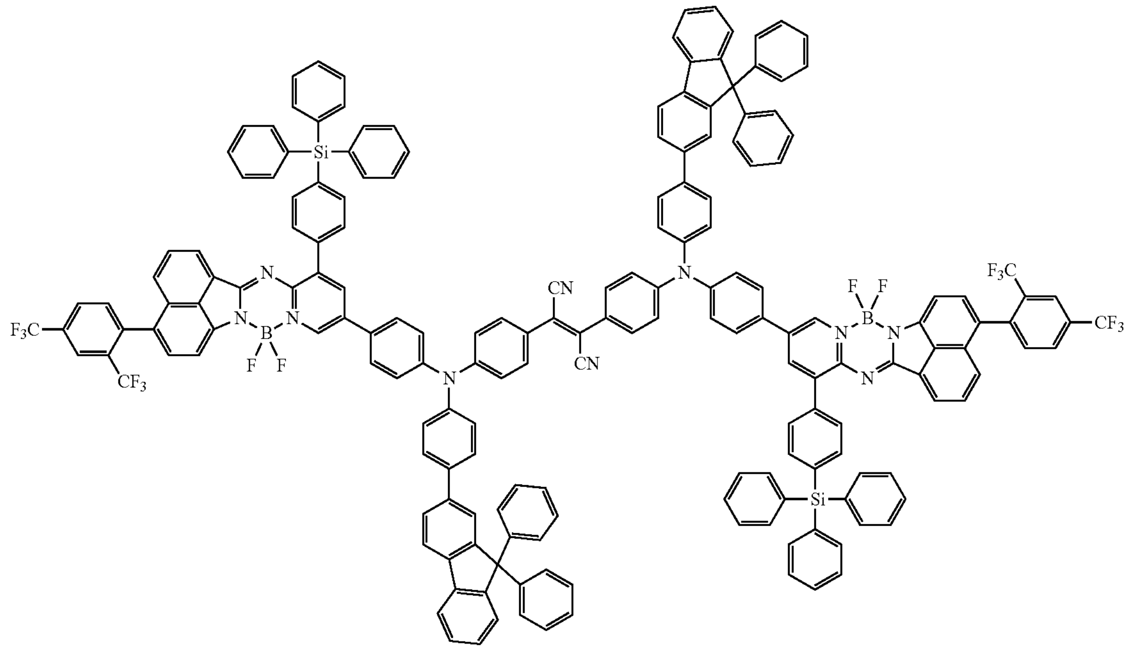
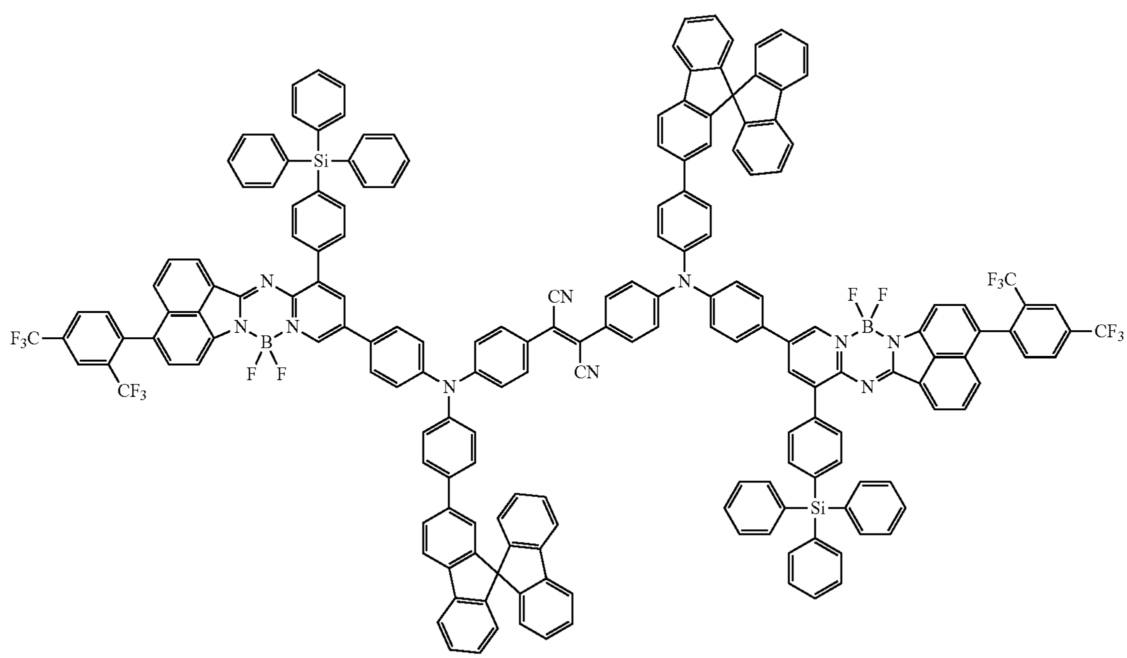

-continued
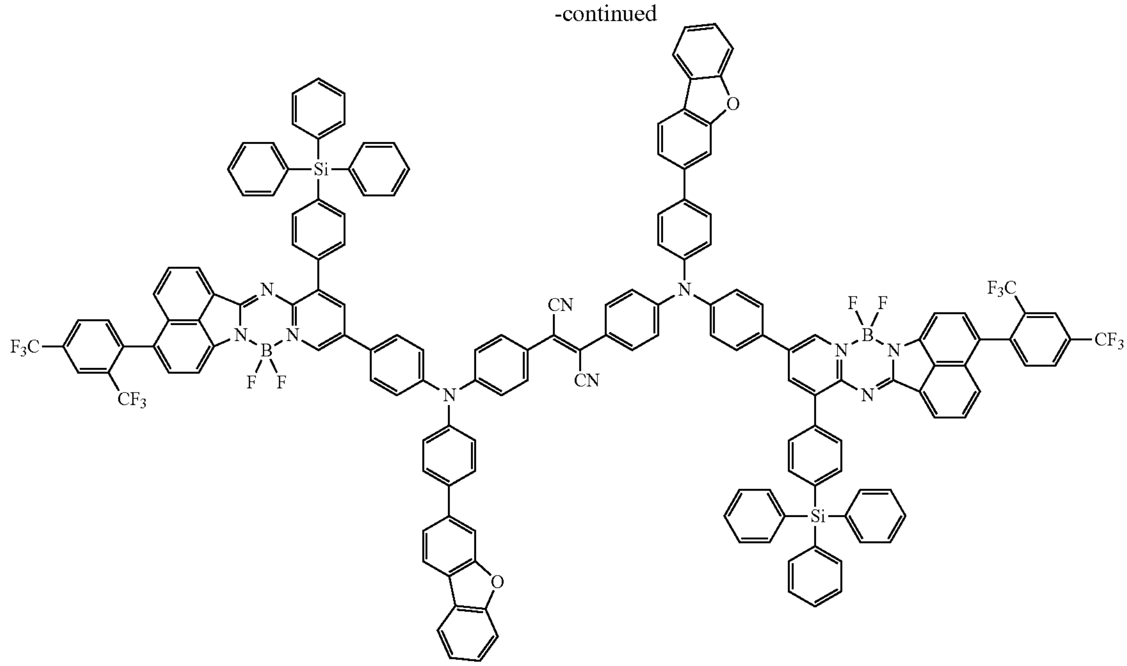
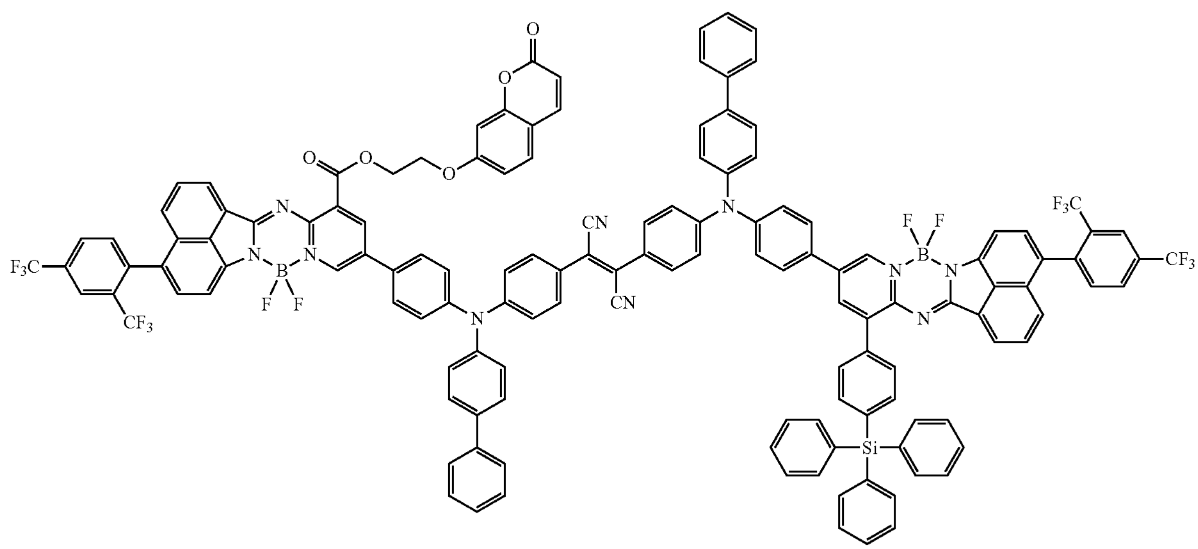

-continued
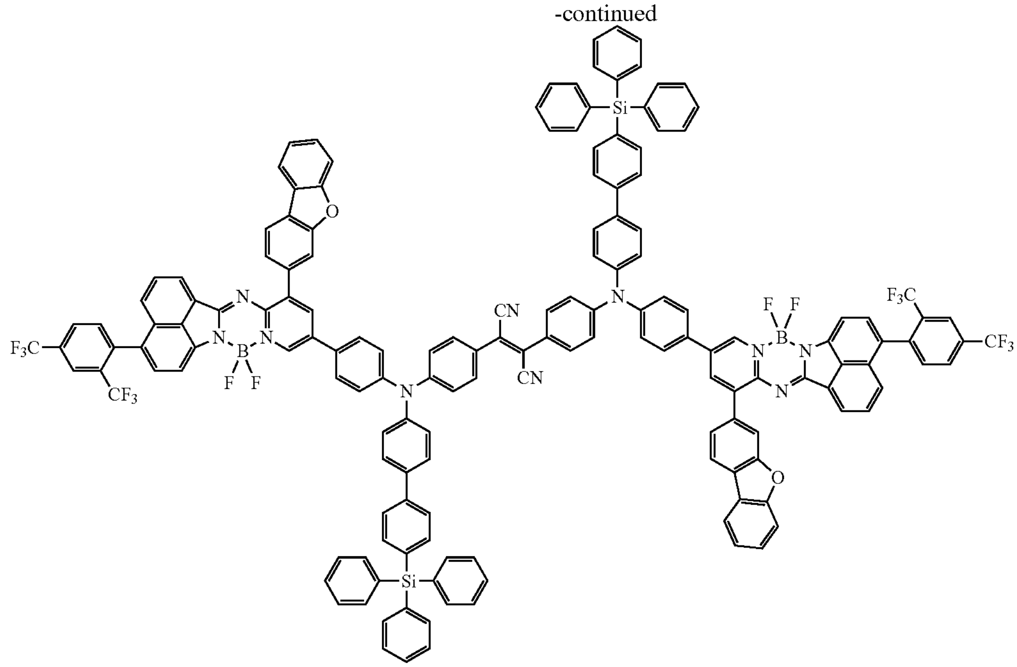
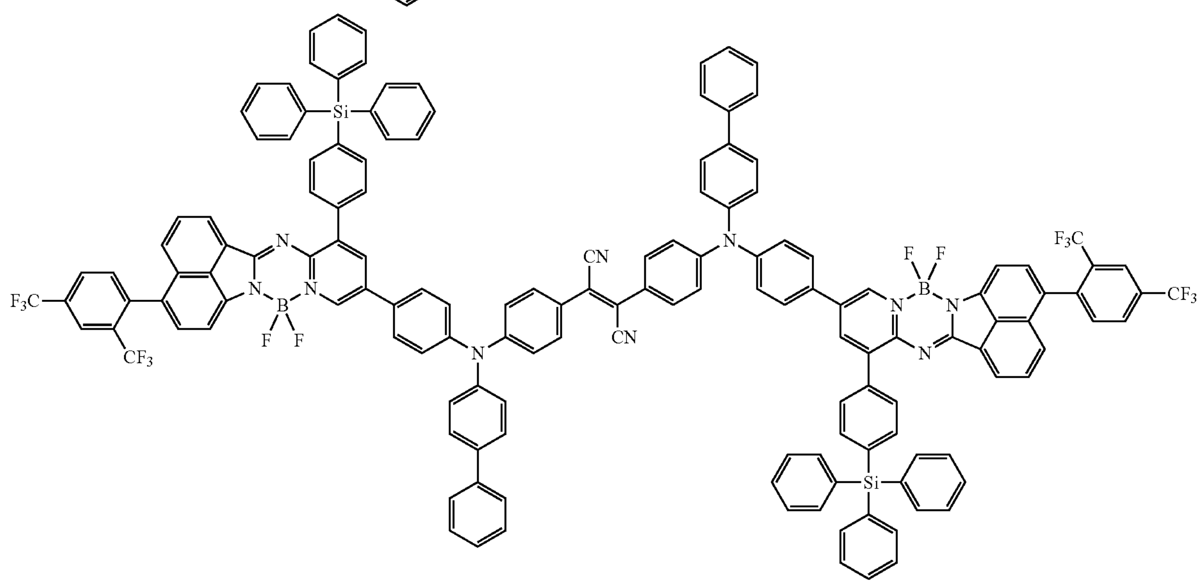
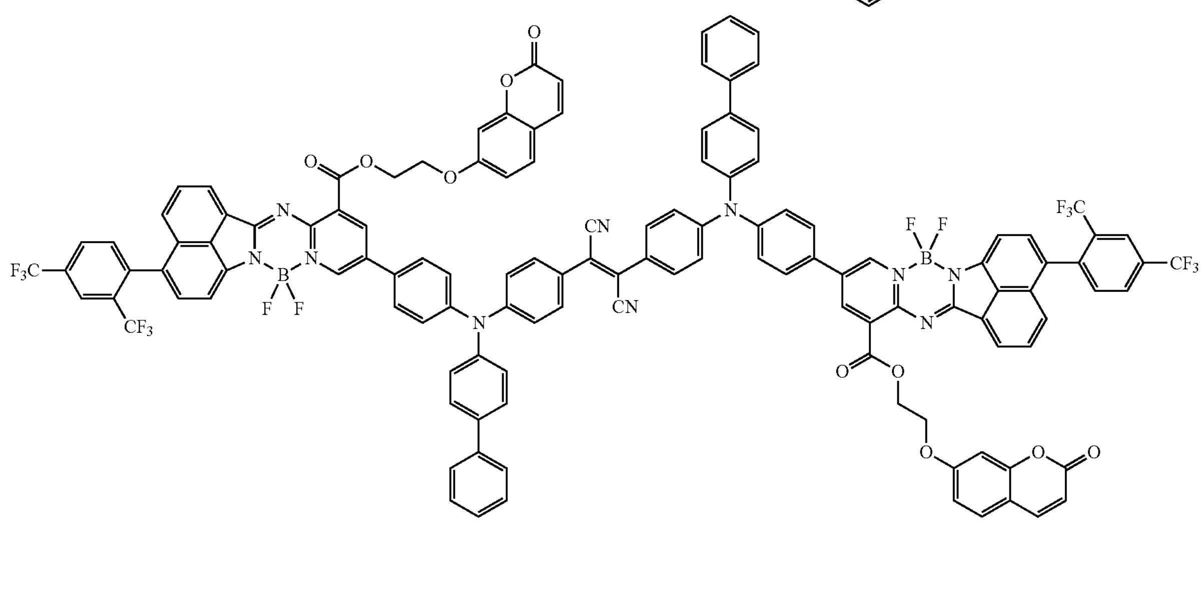

-continued
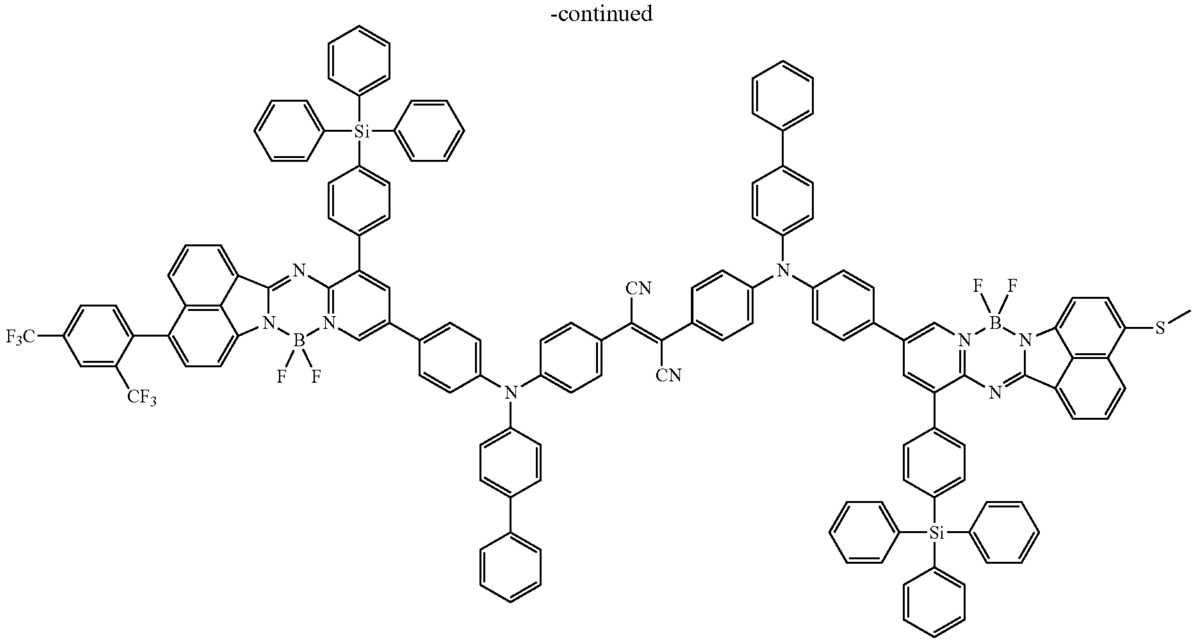
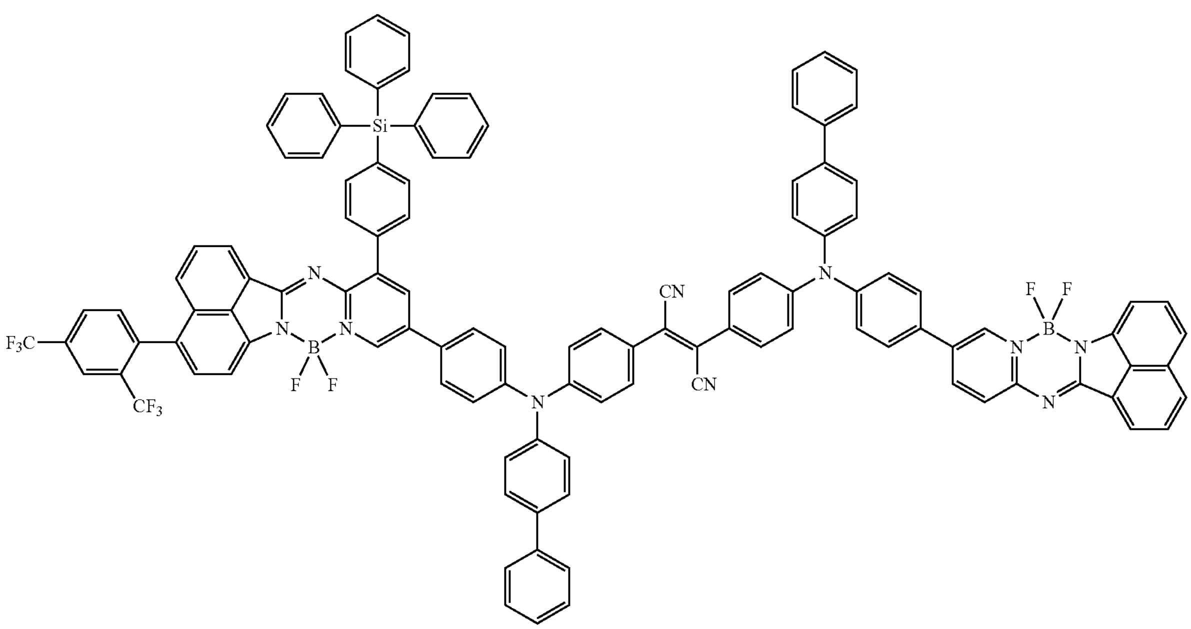

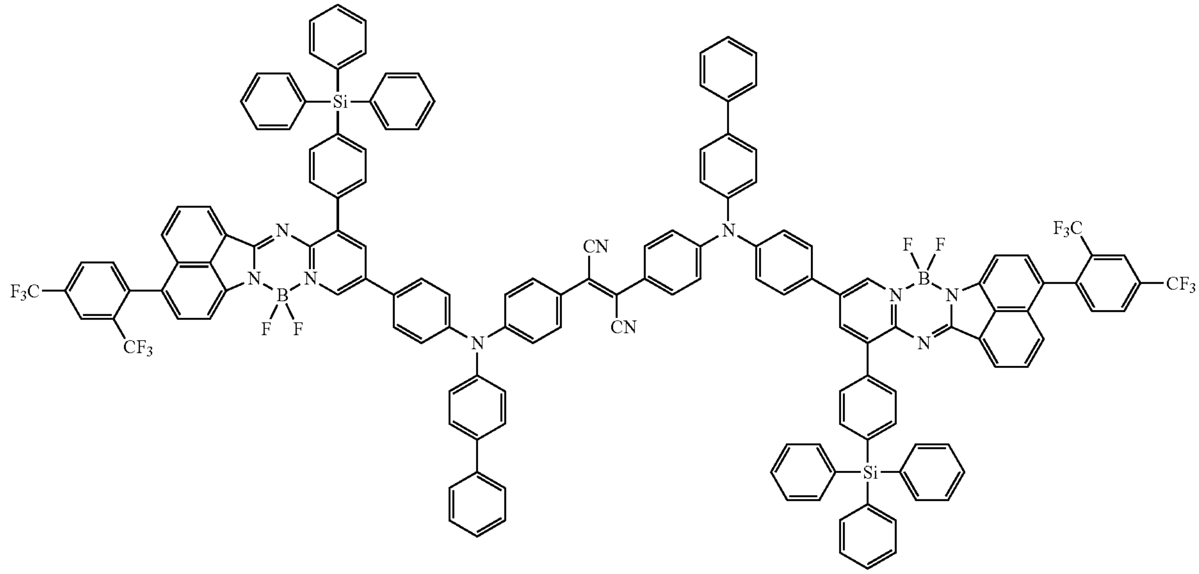
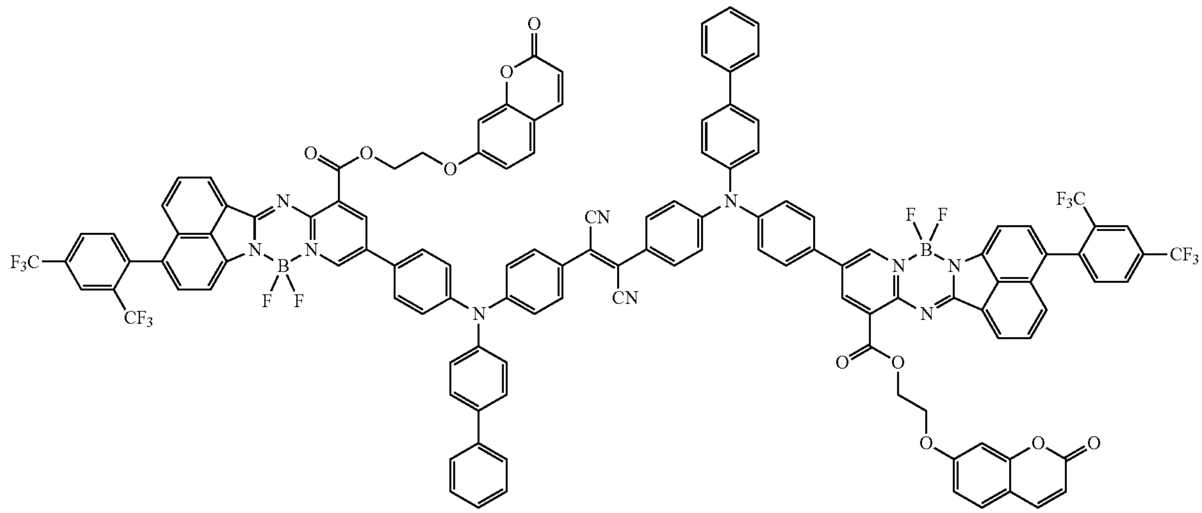
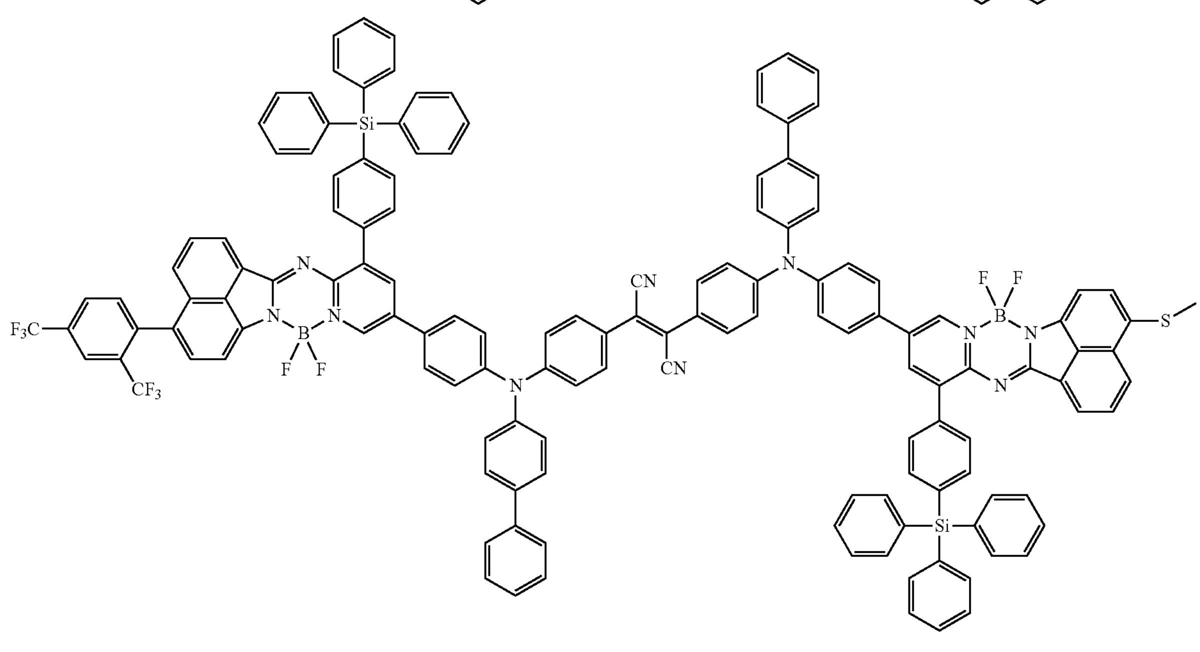

-continued
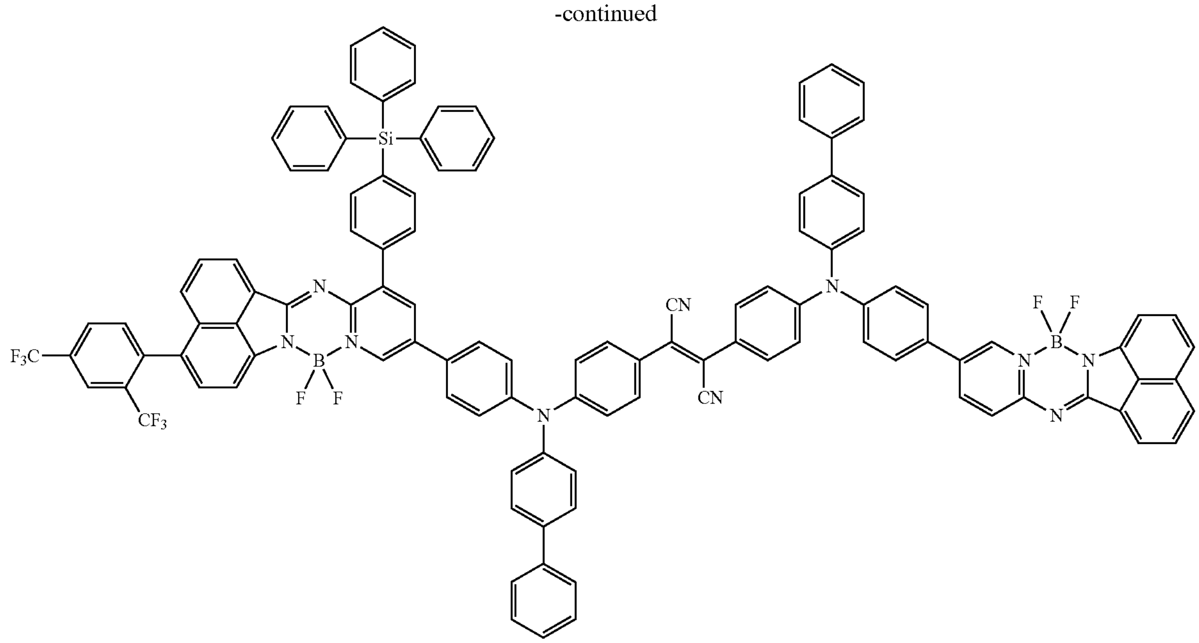
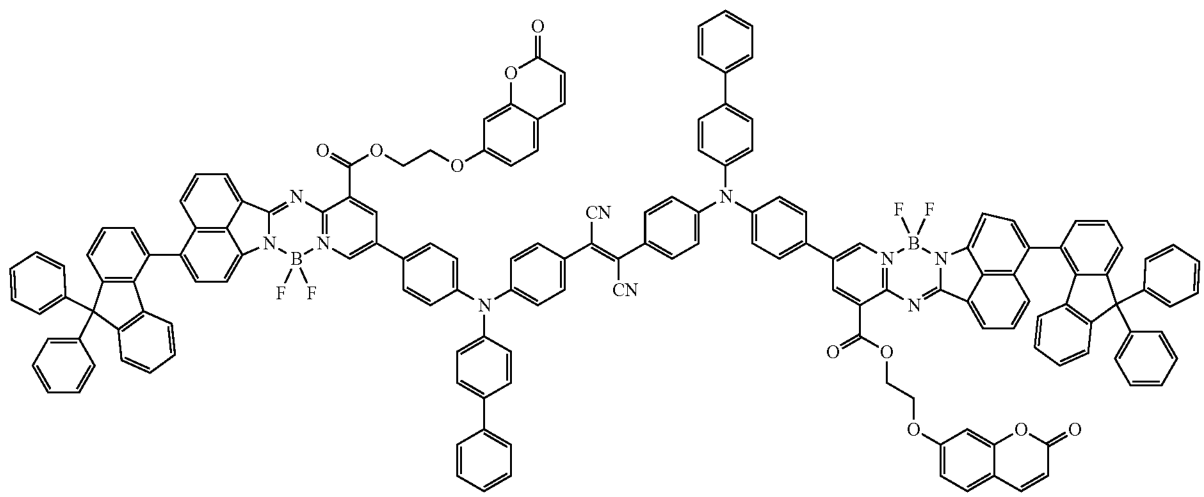
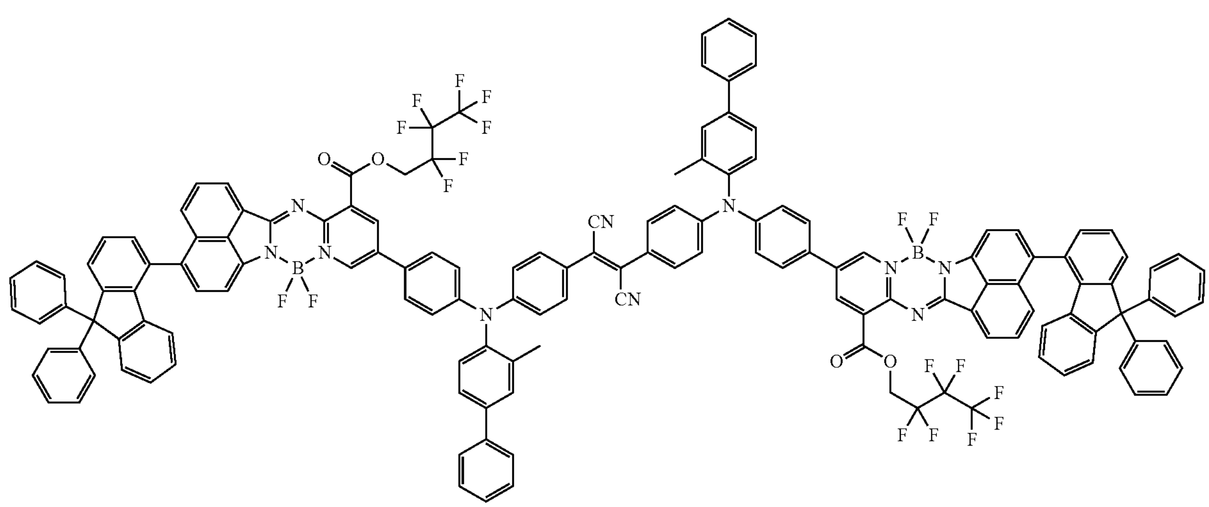

-continued
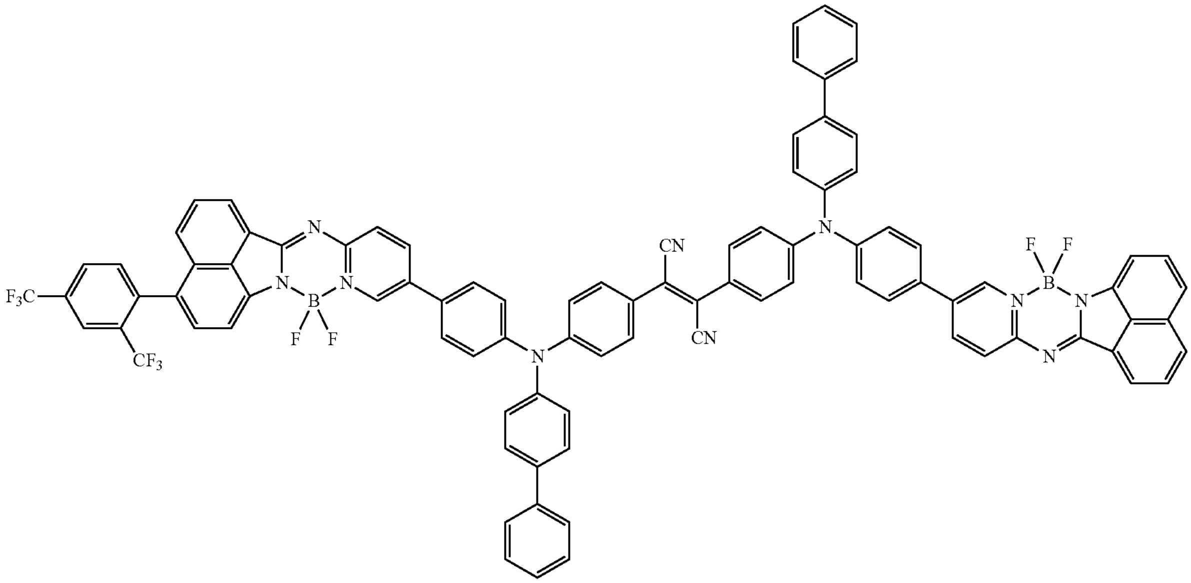
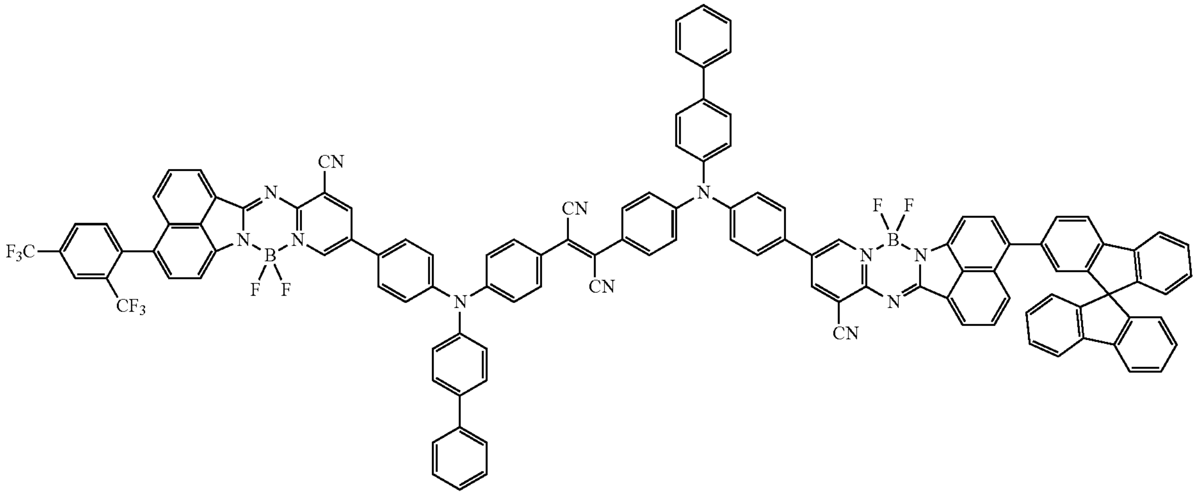
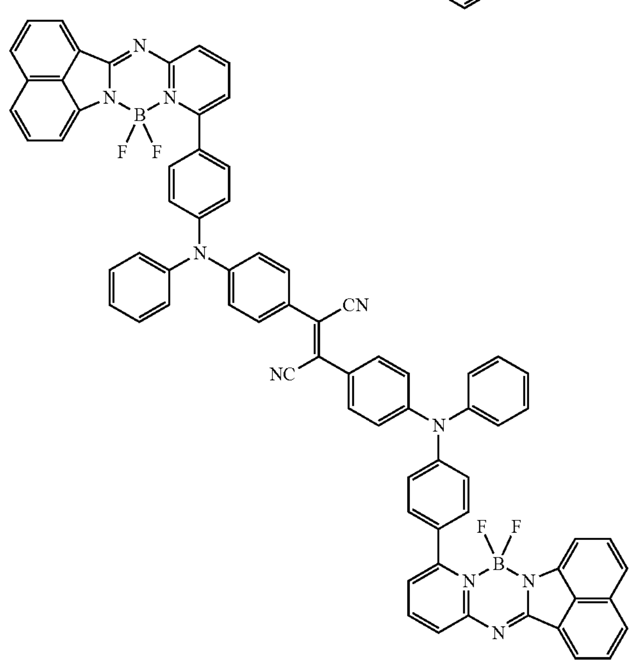

-continued
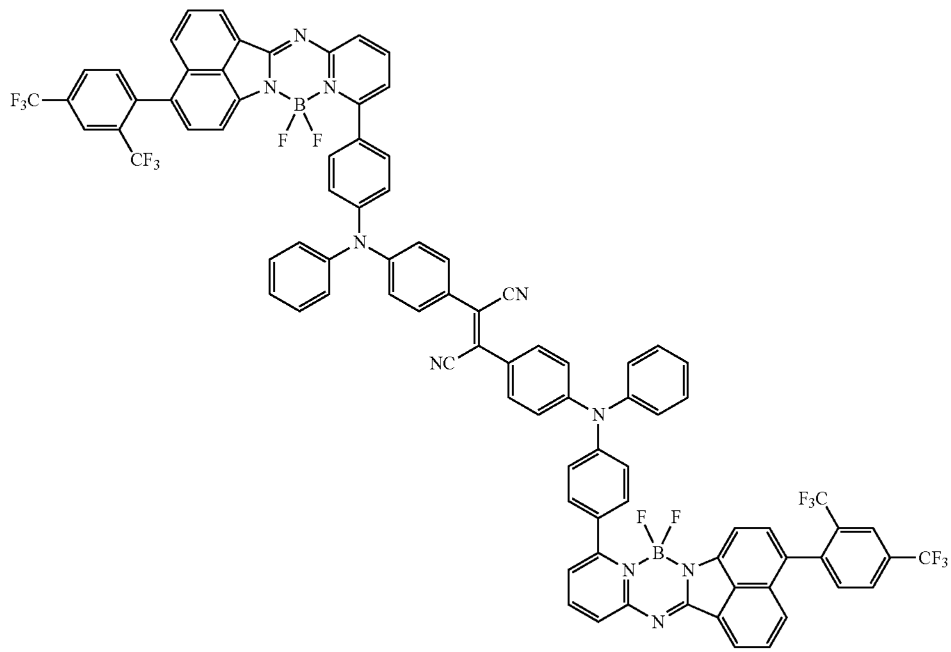
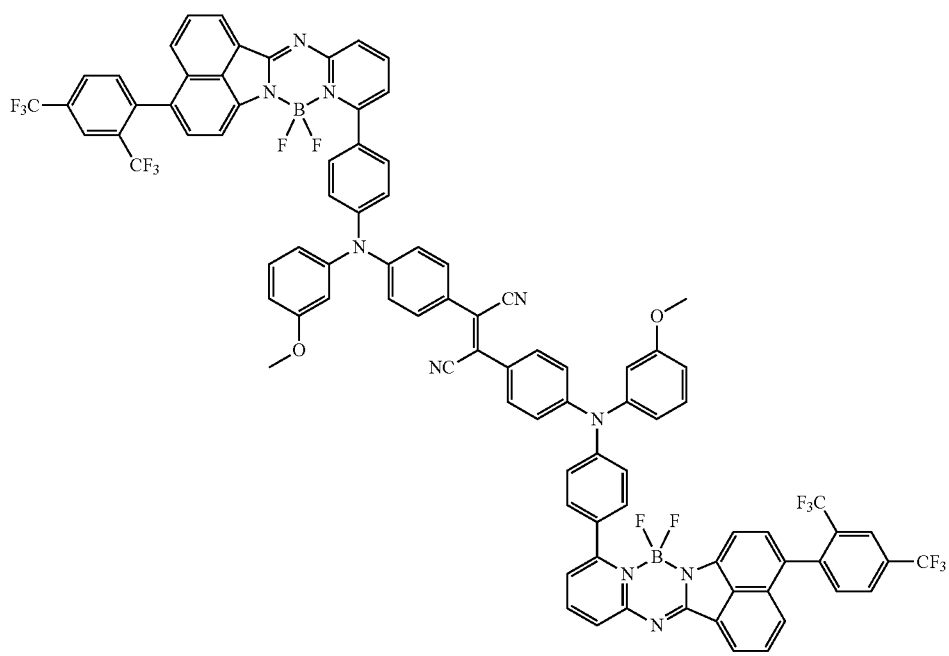

-continued
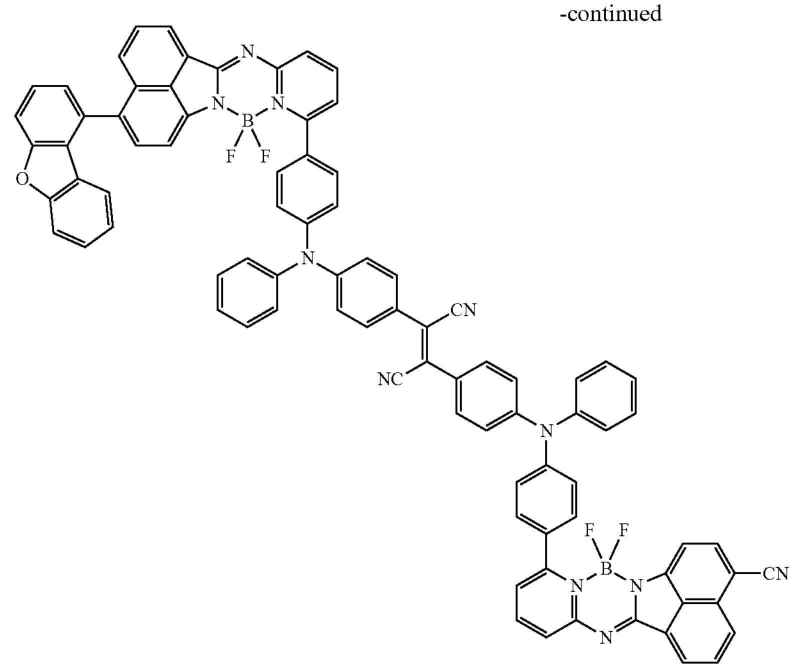
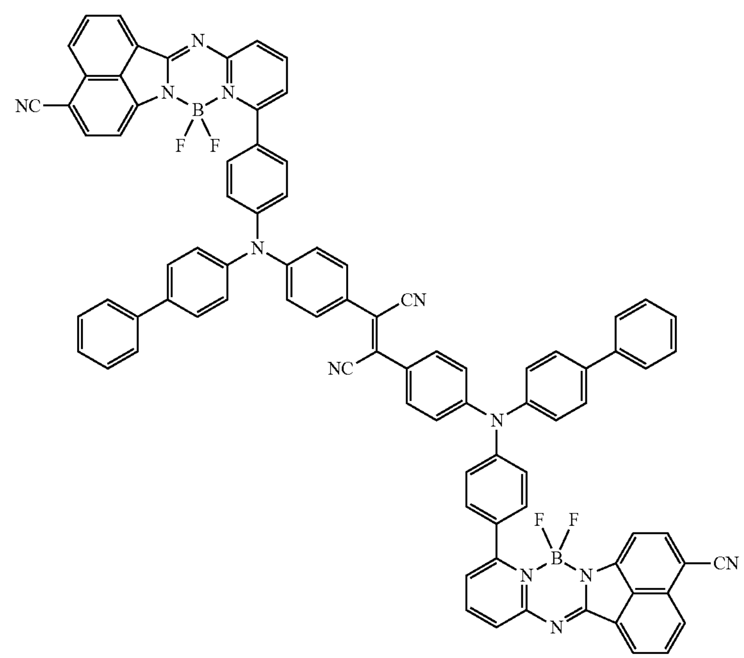
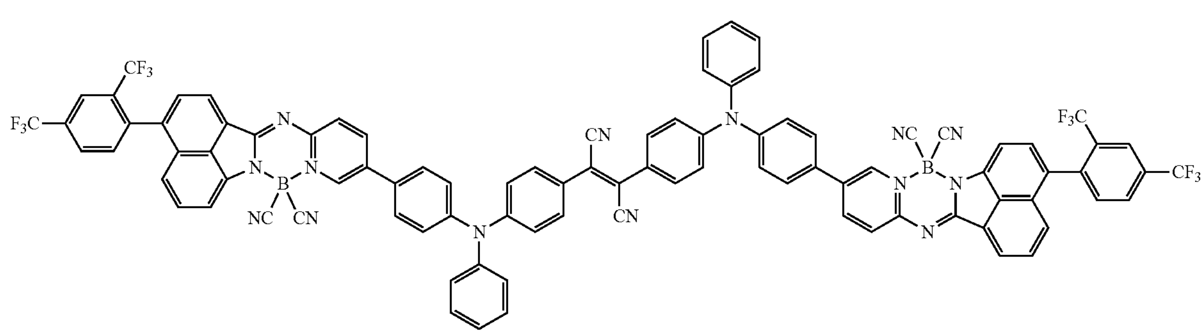

-continued
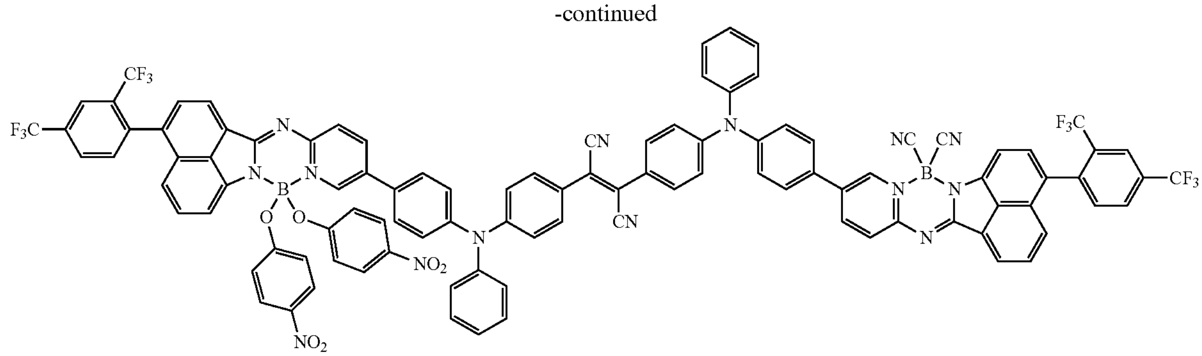
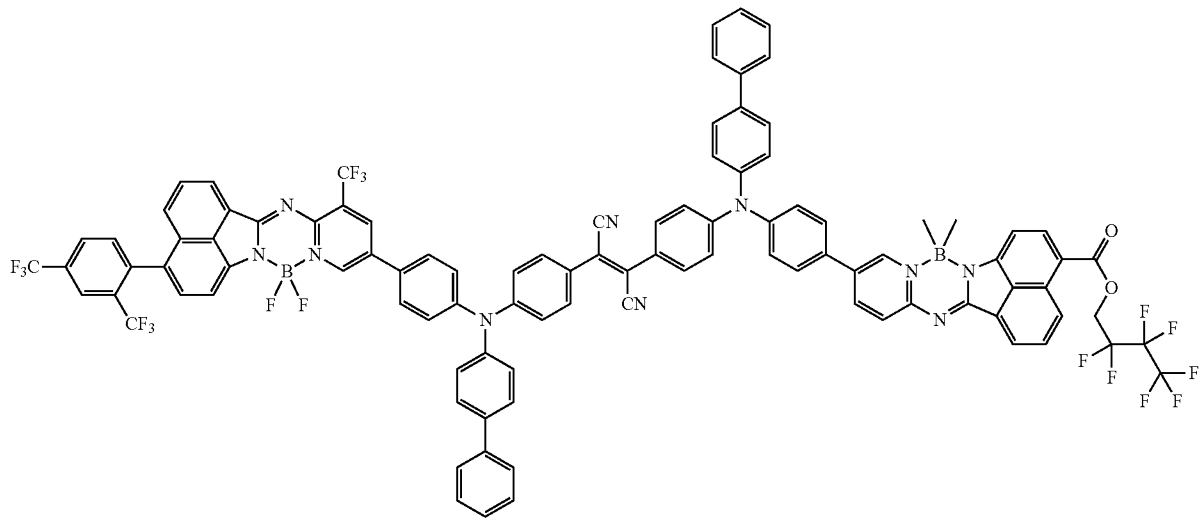
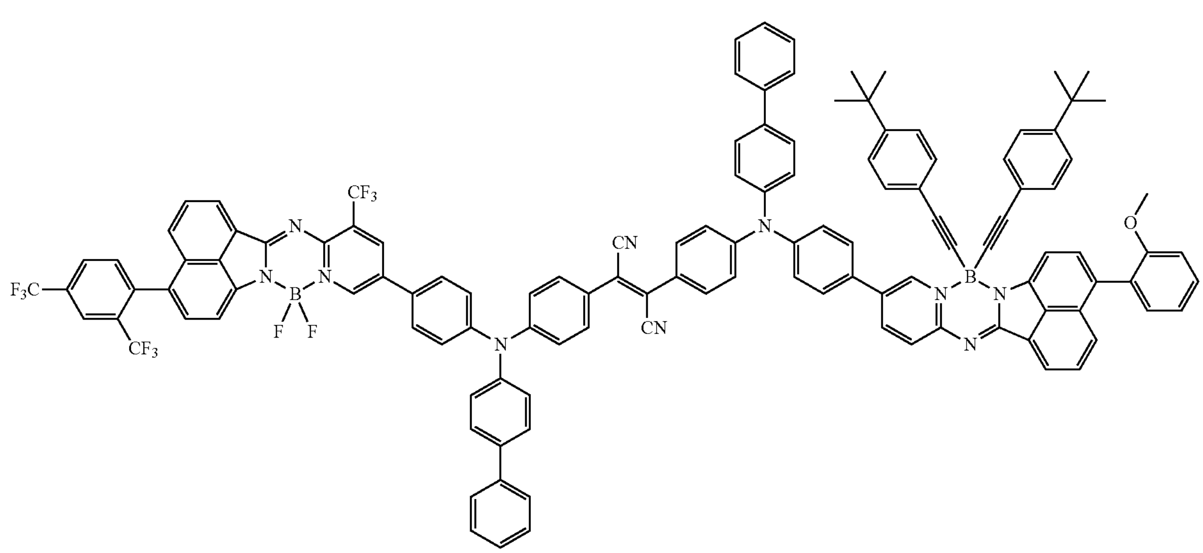

-continued
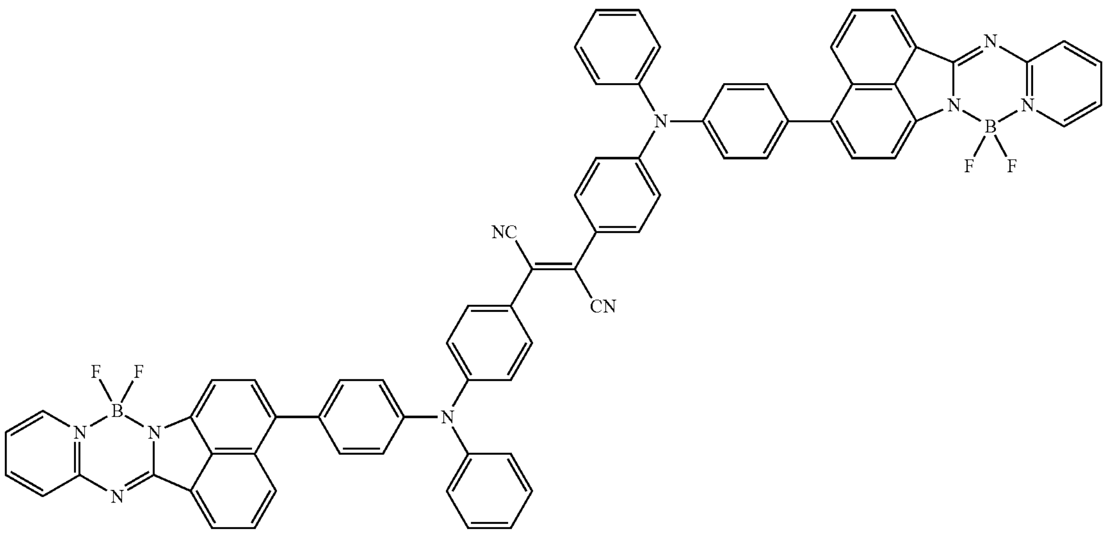
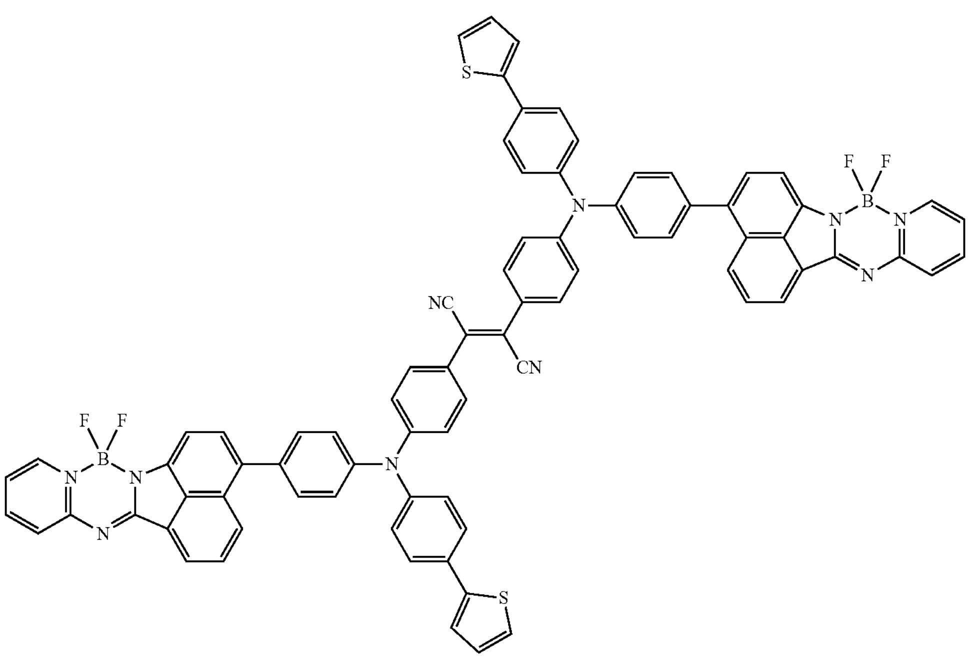

-continued
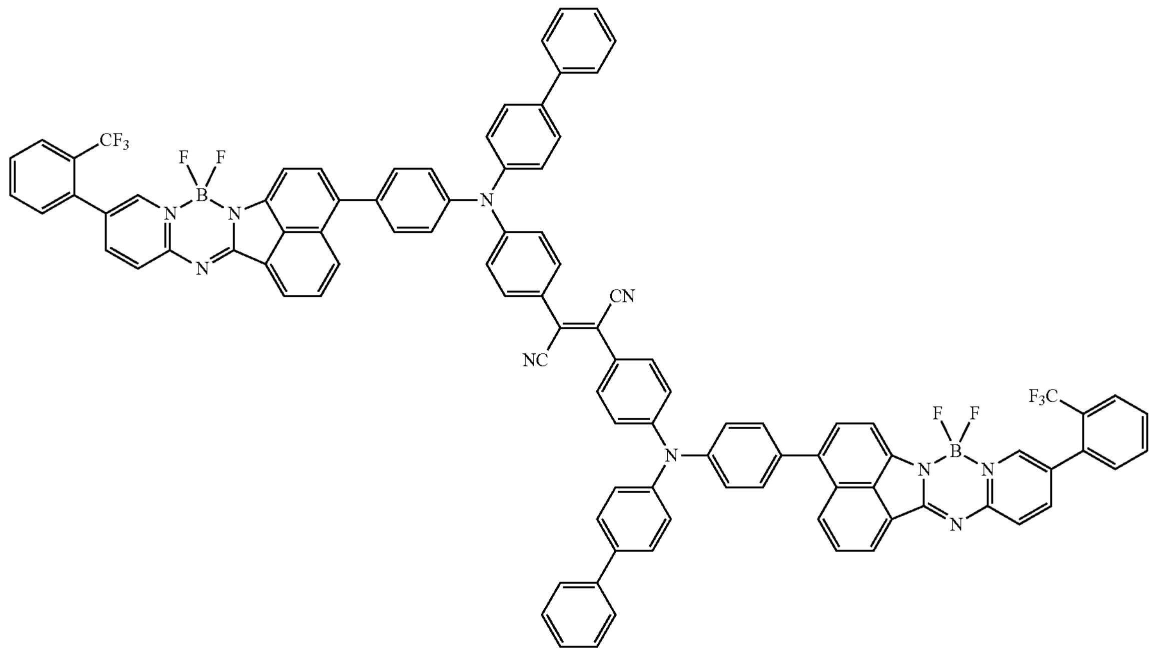
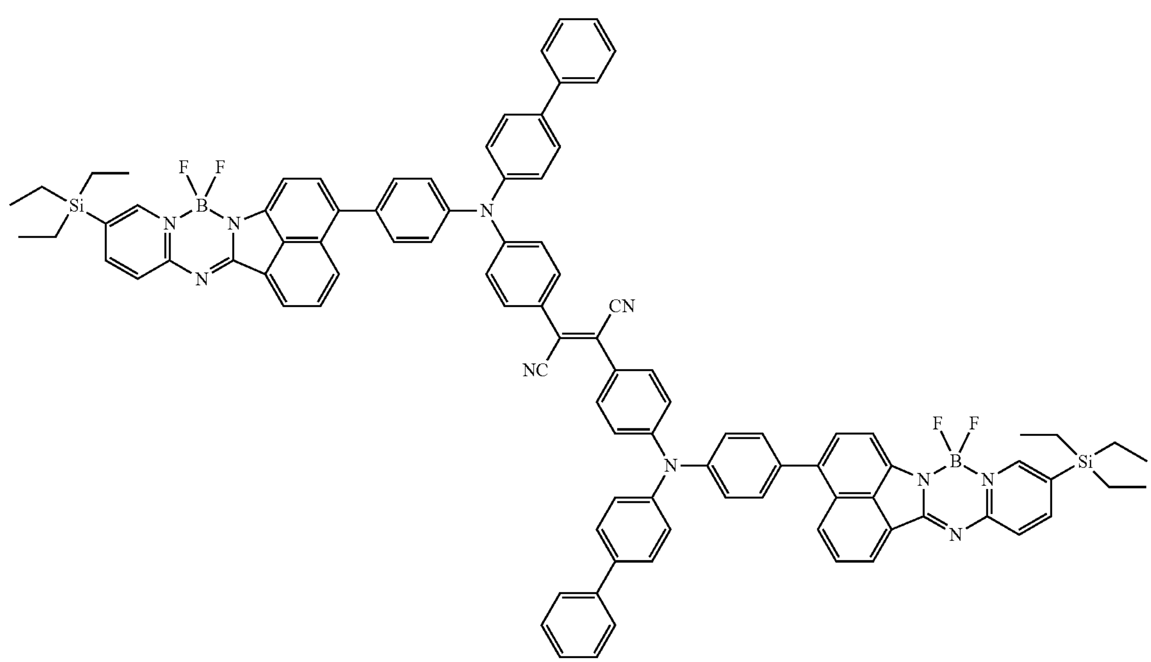

-continued
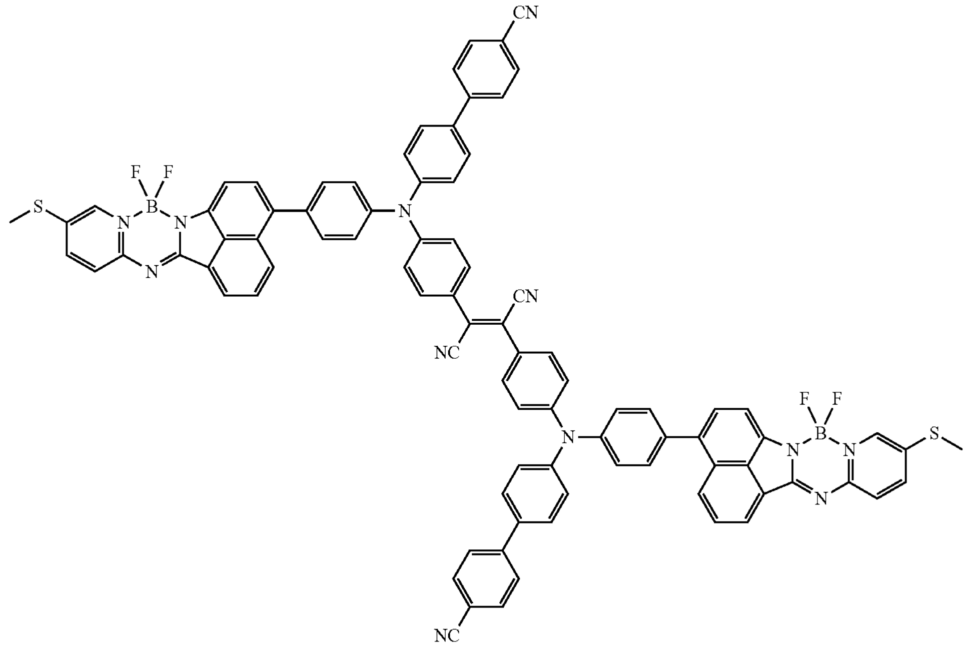
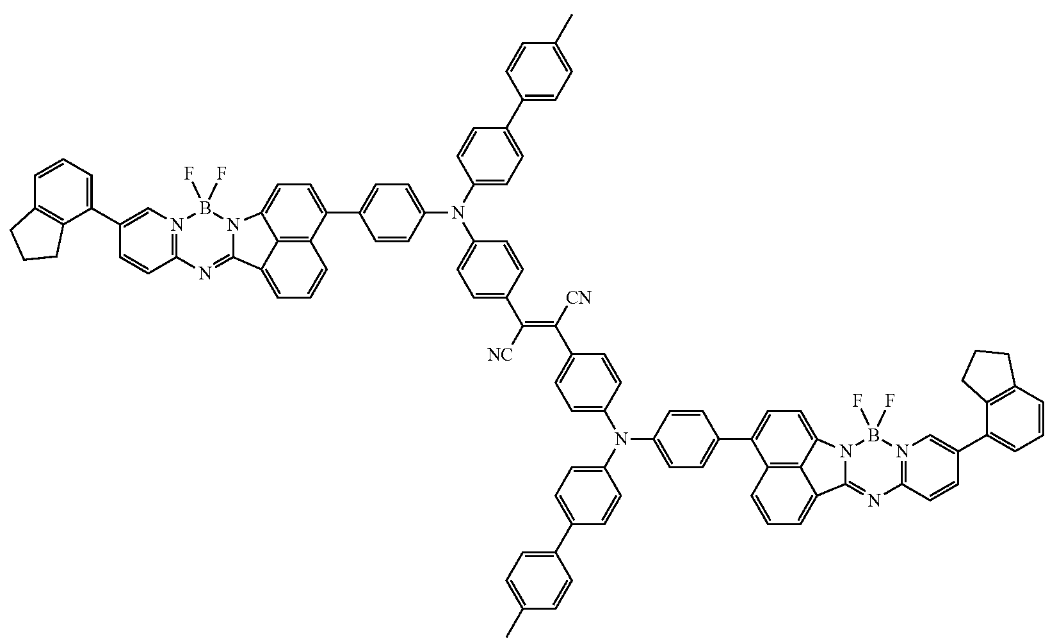

-continued
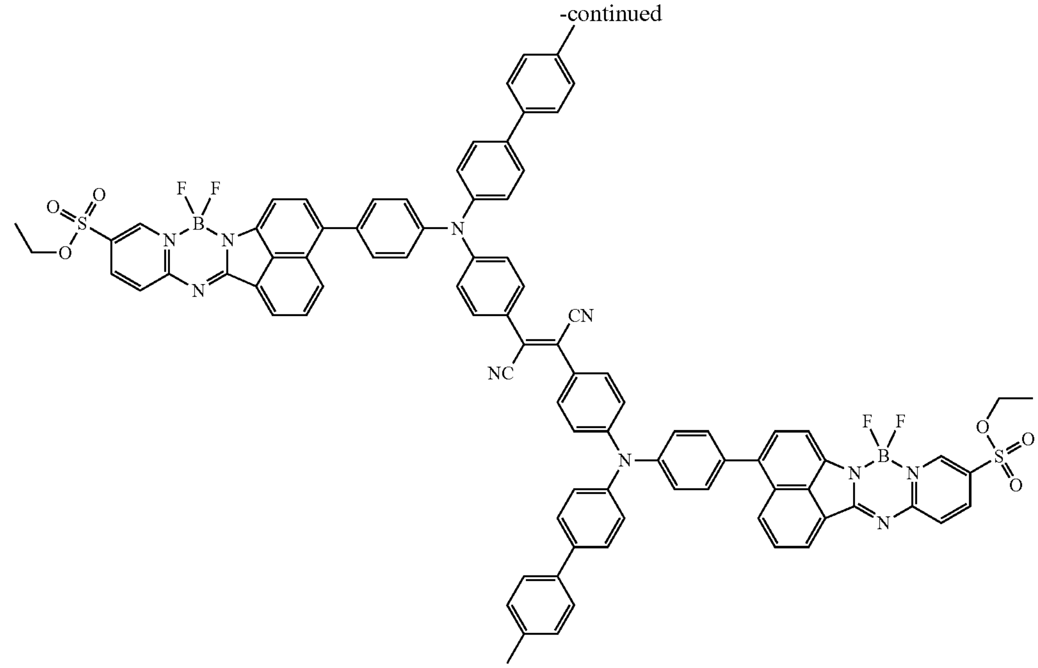
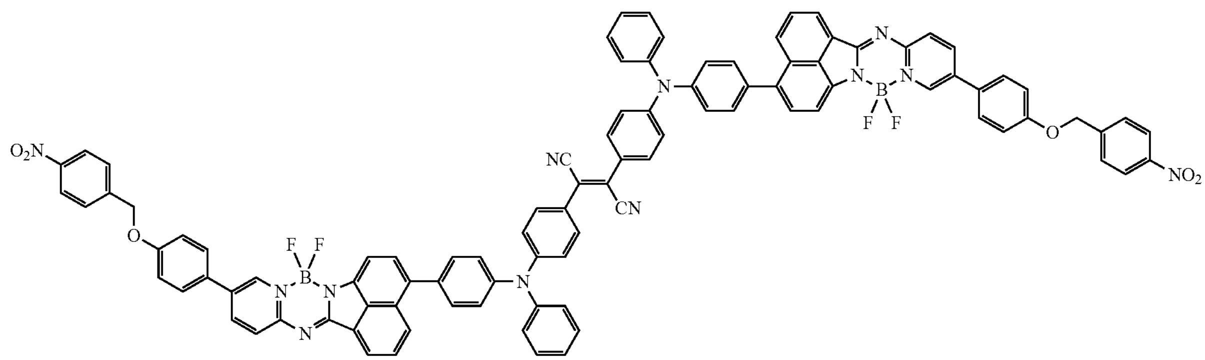
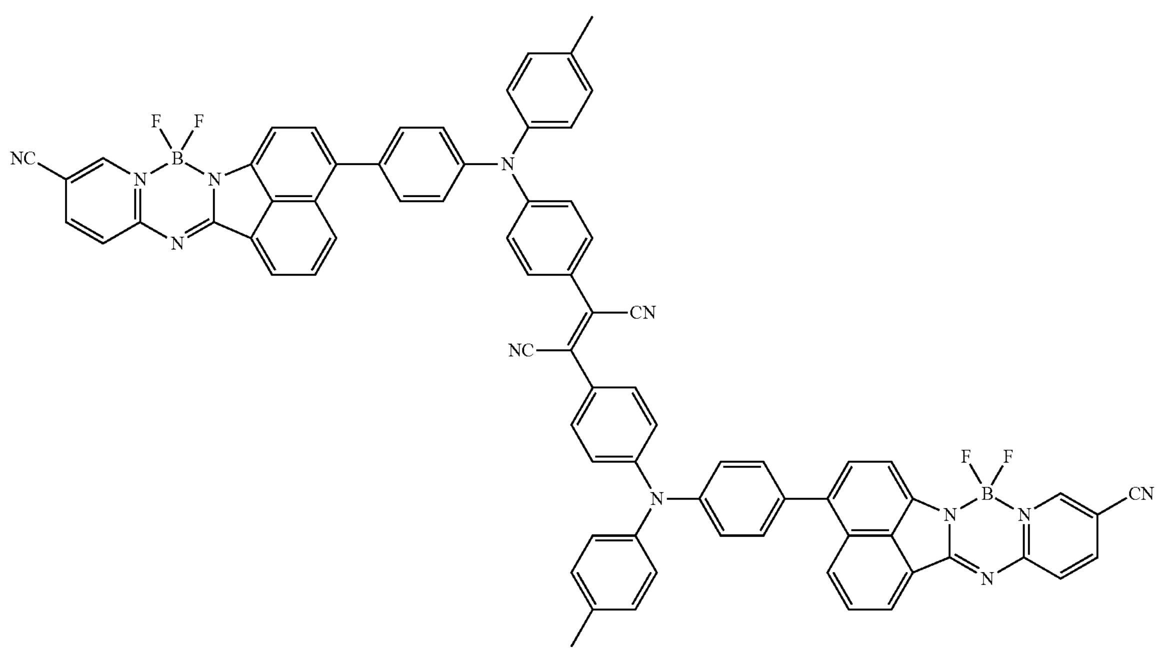

-continued
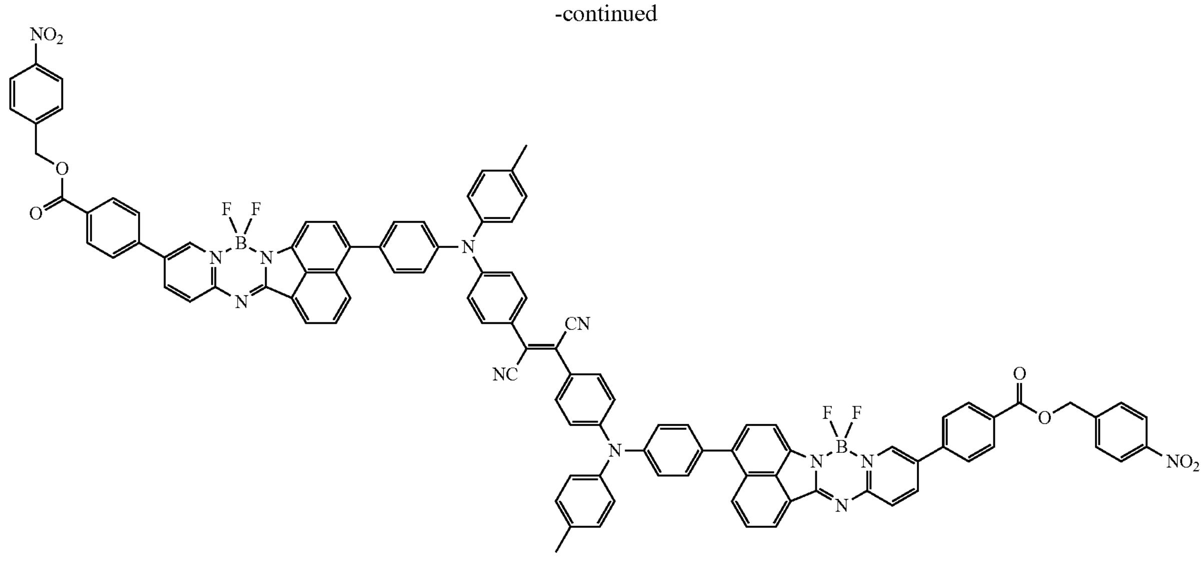
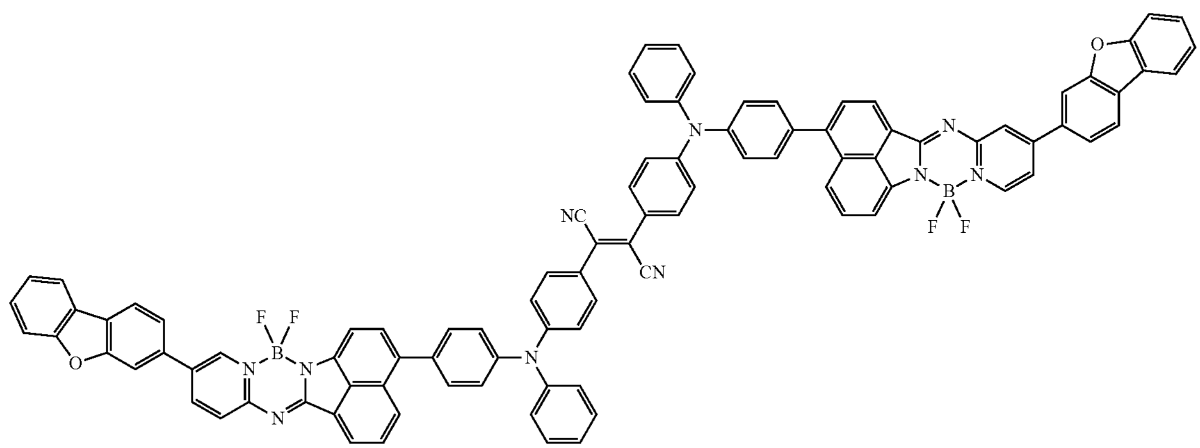
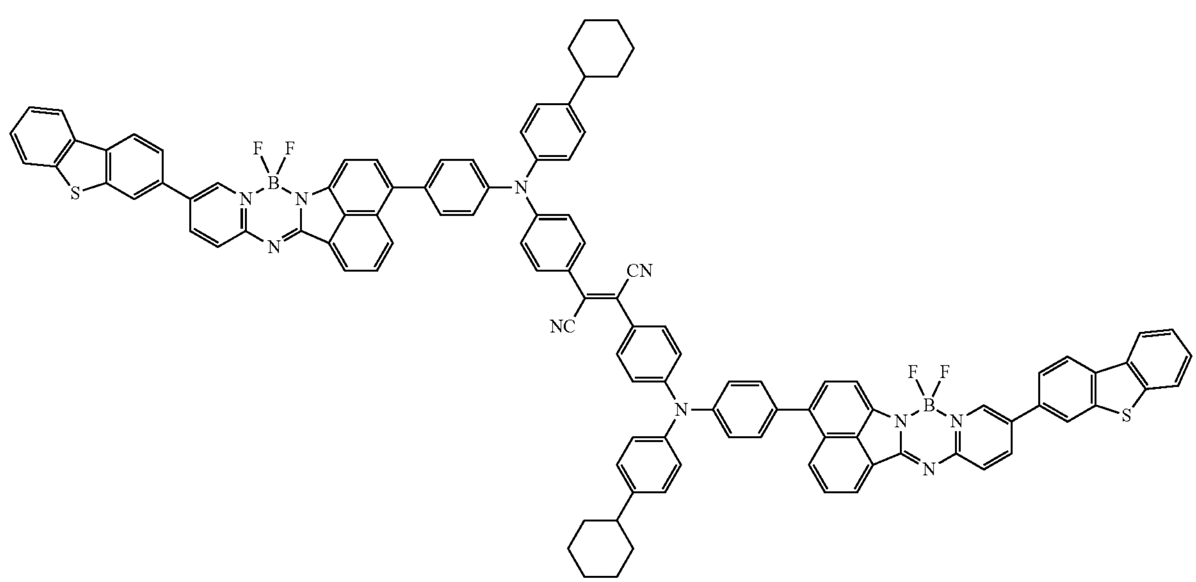

-continued
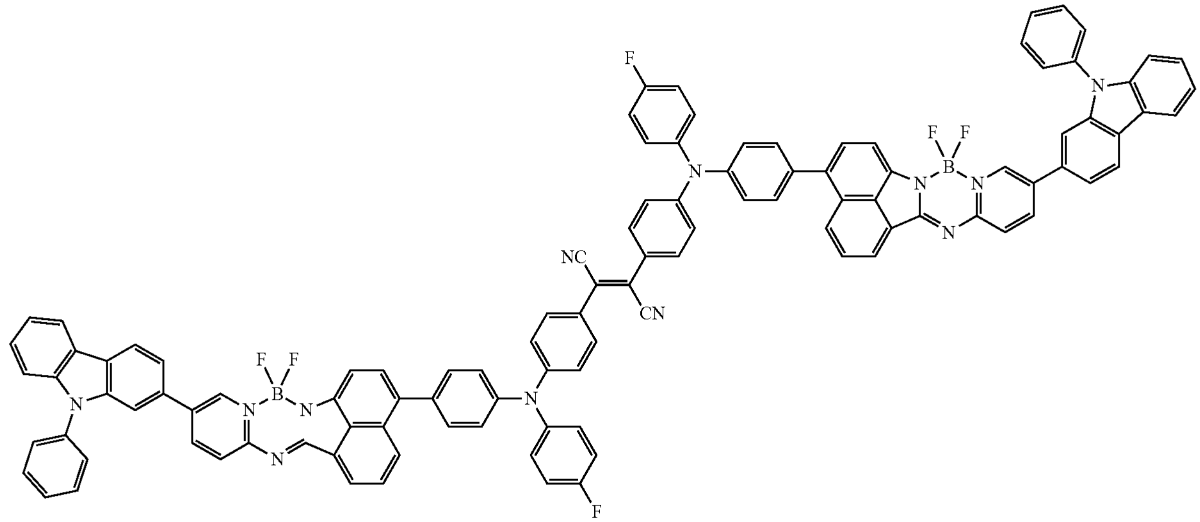
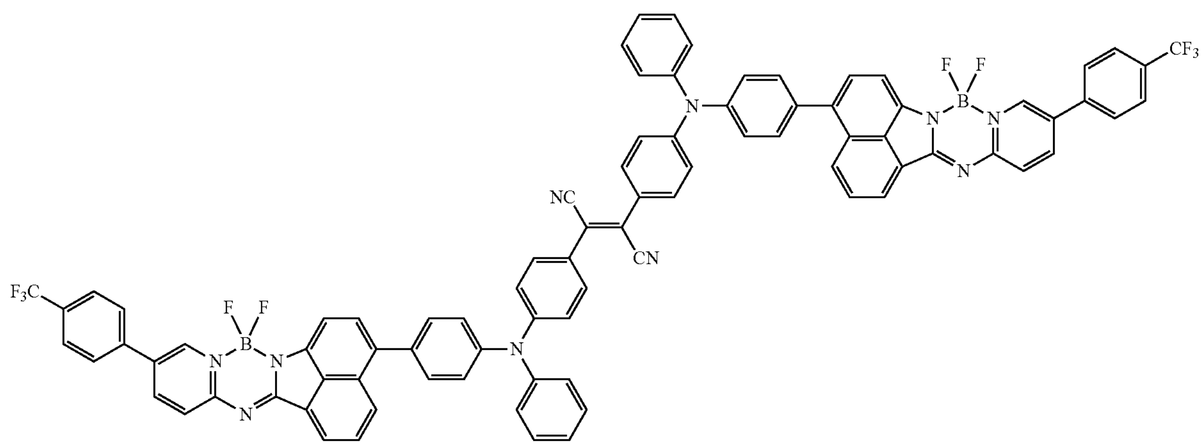
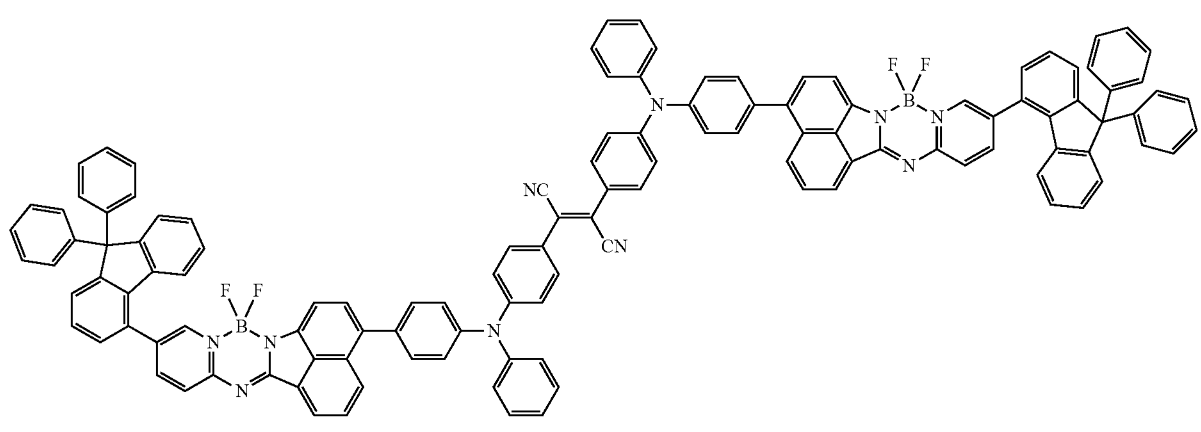

-continued
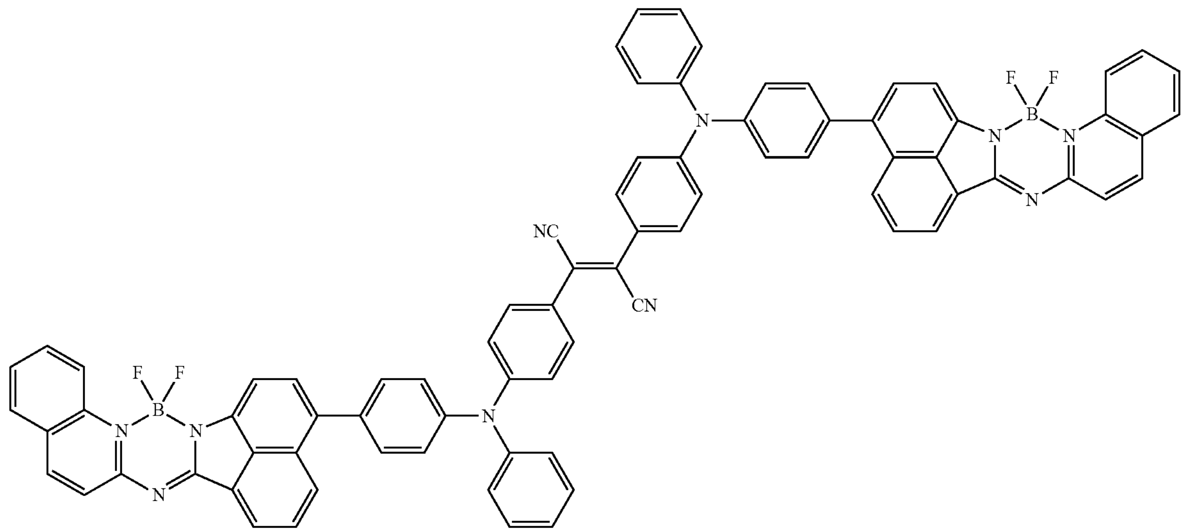
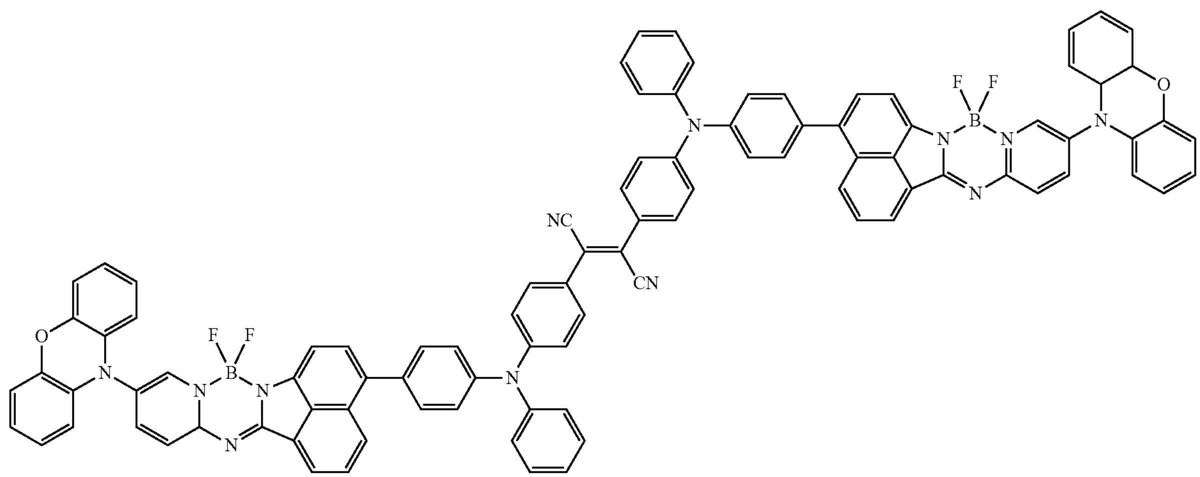
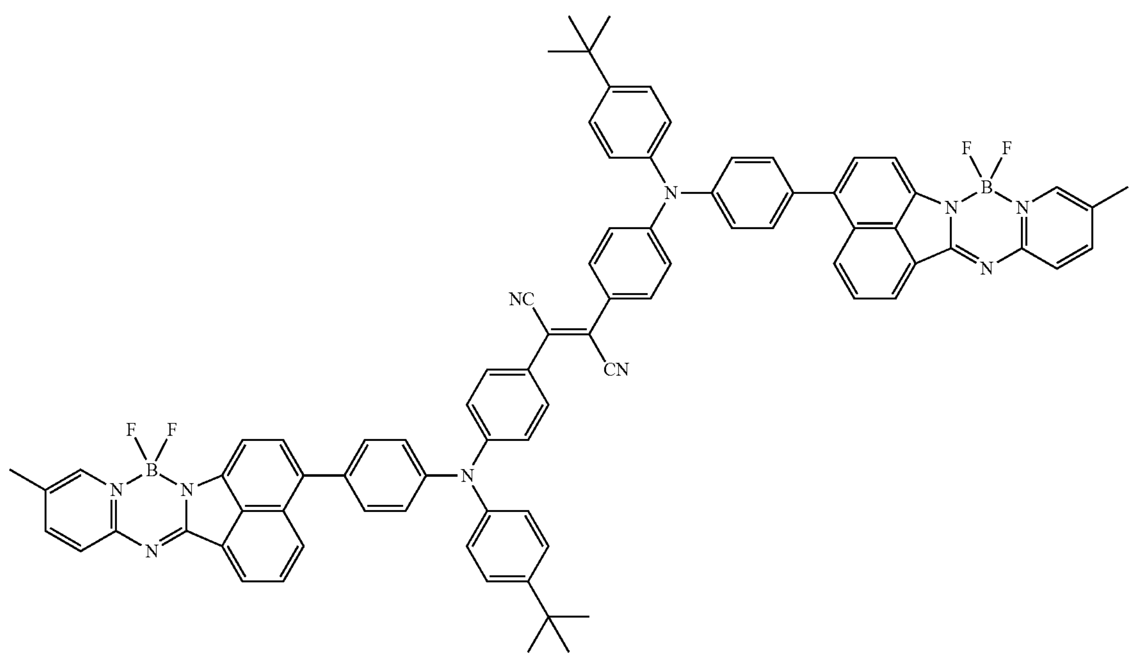

-continued
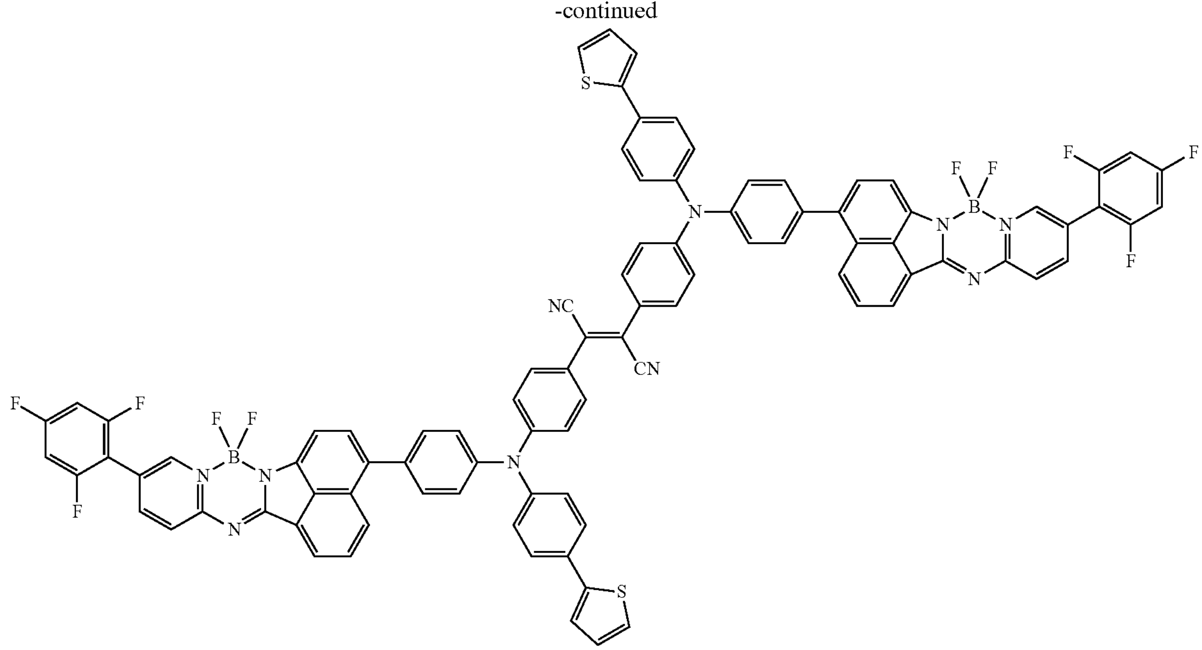
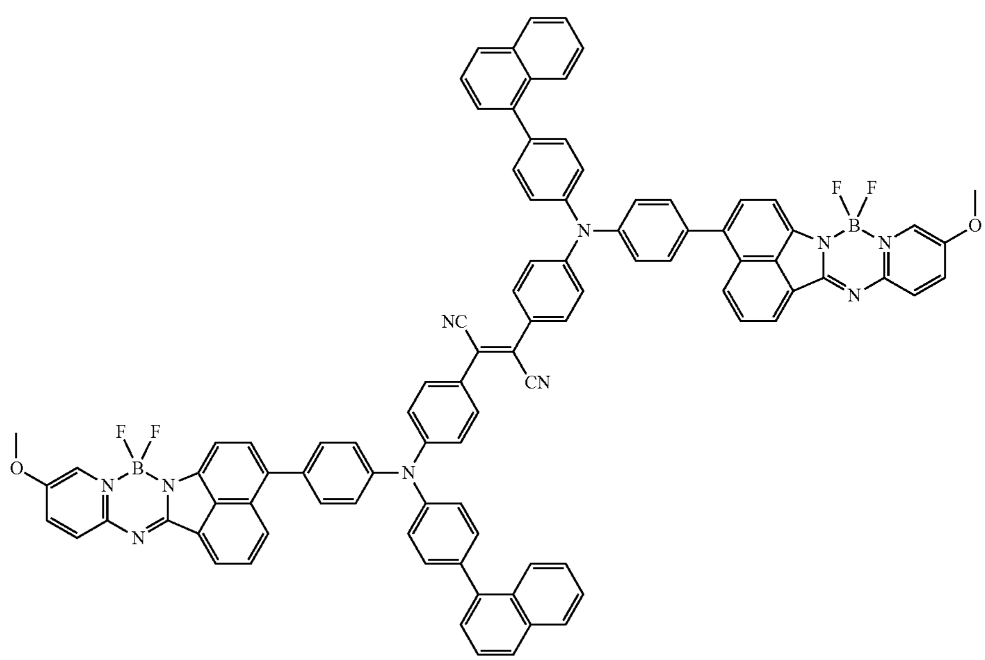

-continued
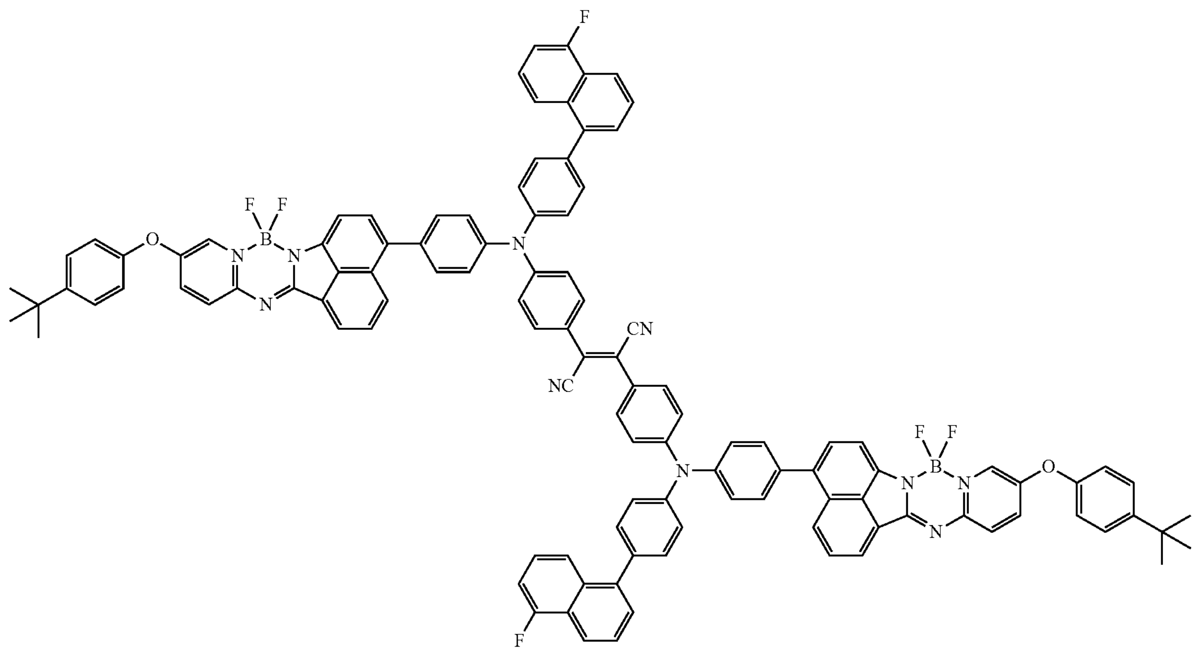
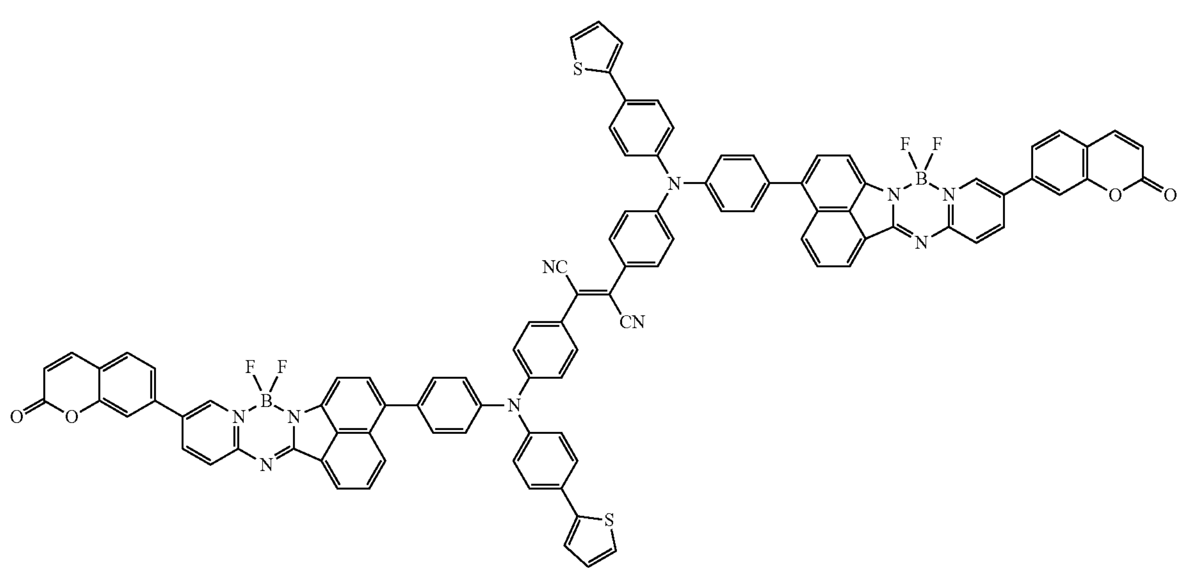

-continued
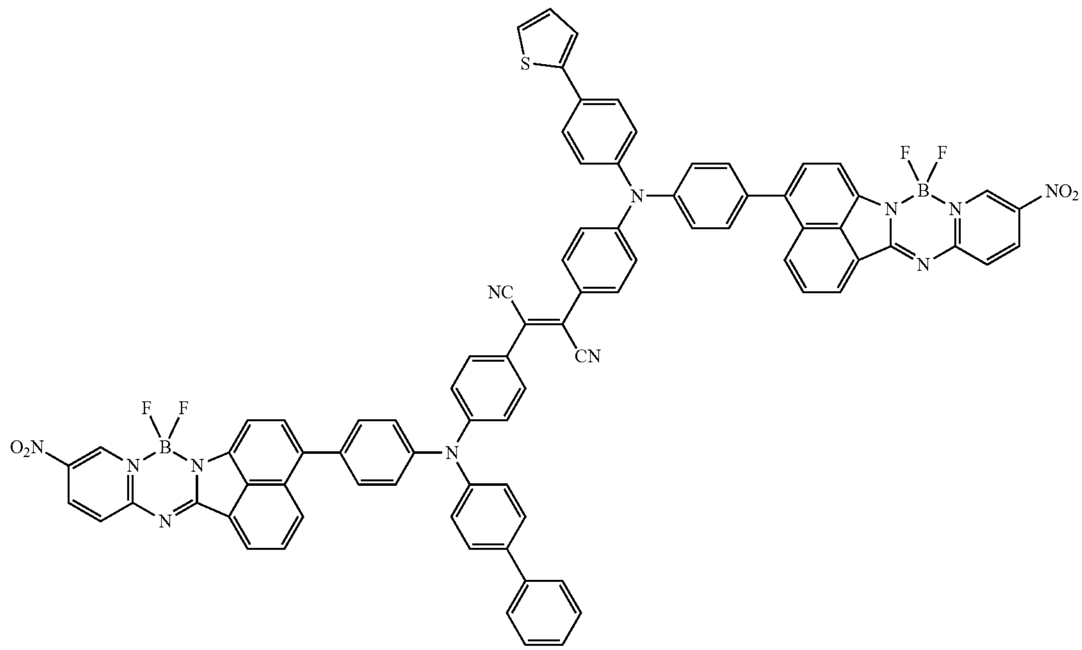
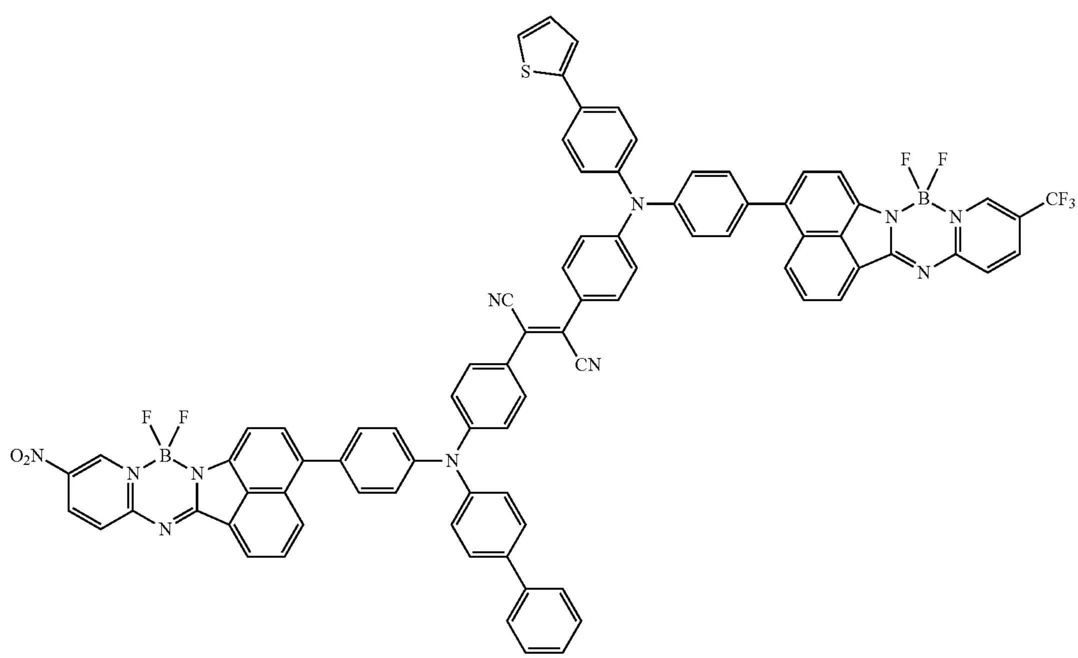

-continued
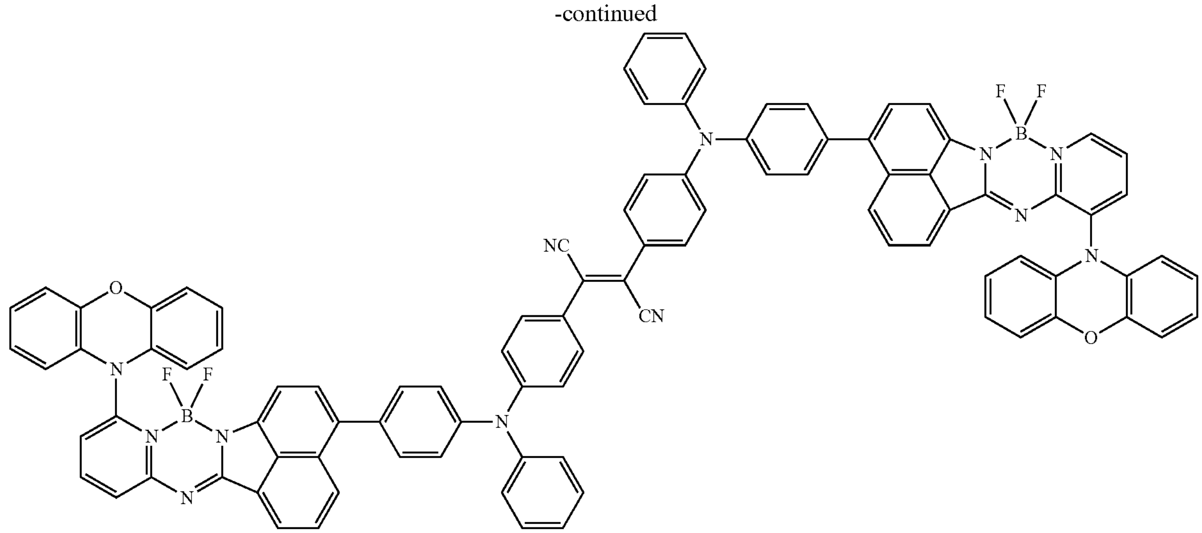
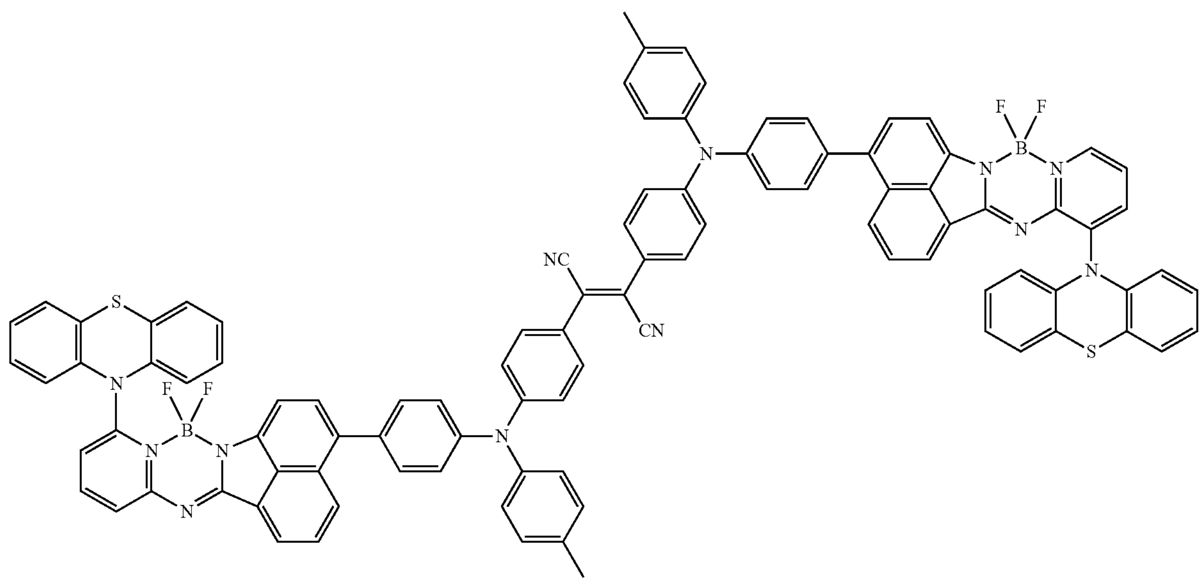
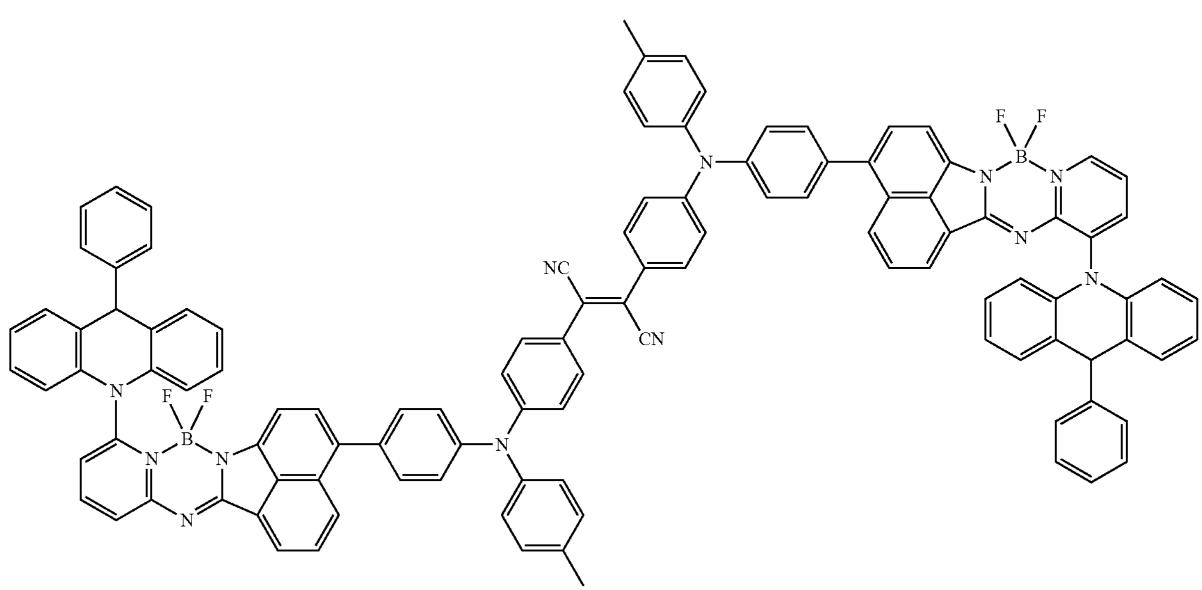

-continued
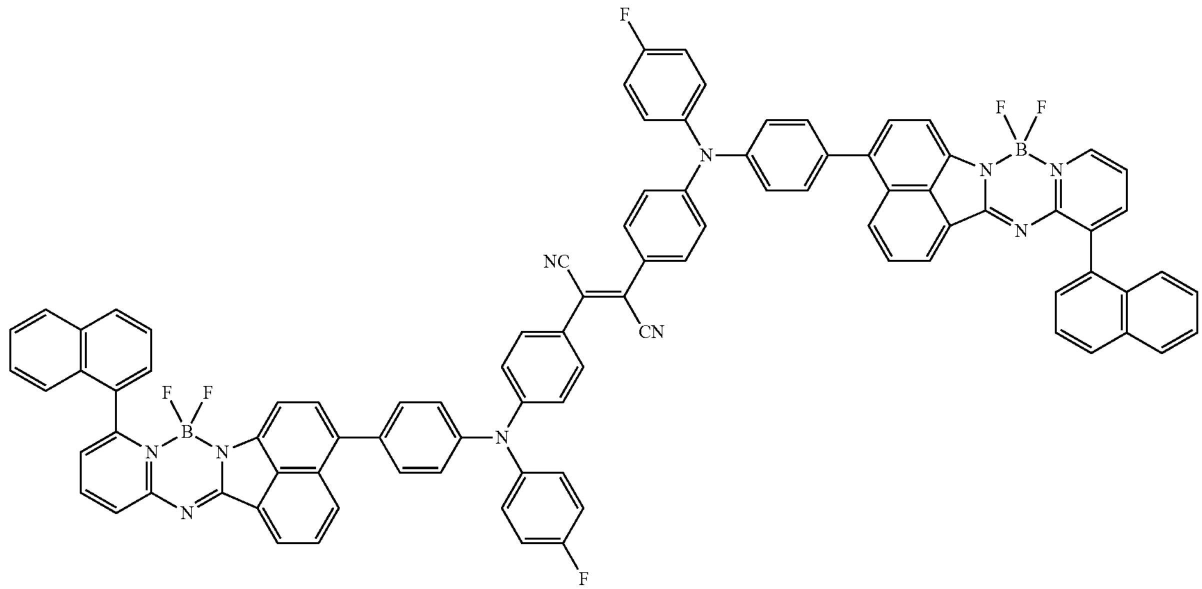
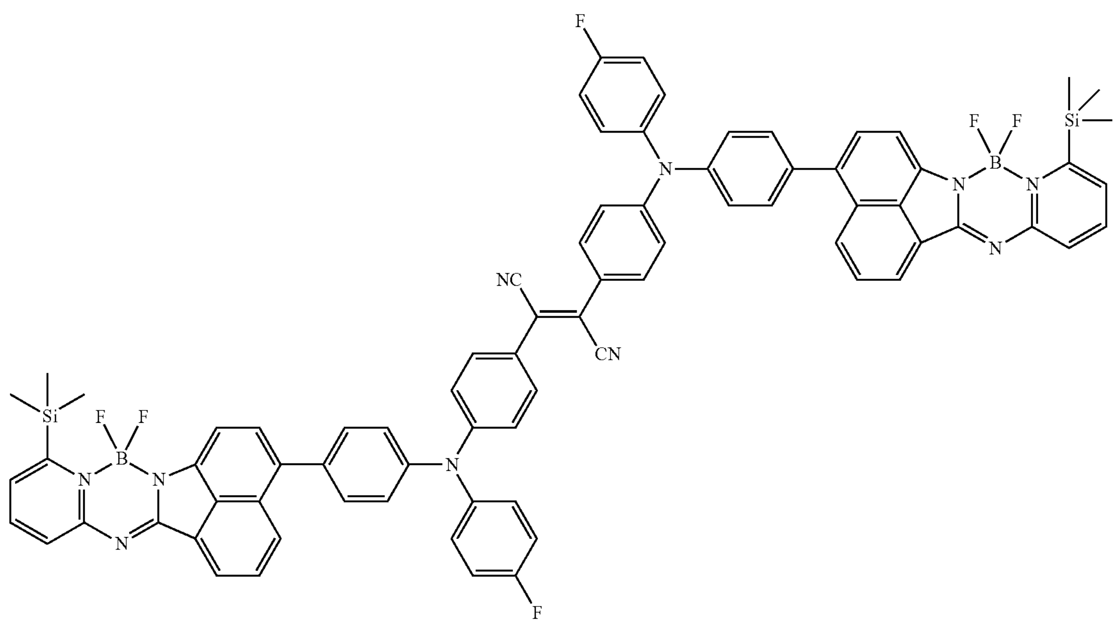

-continued
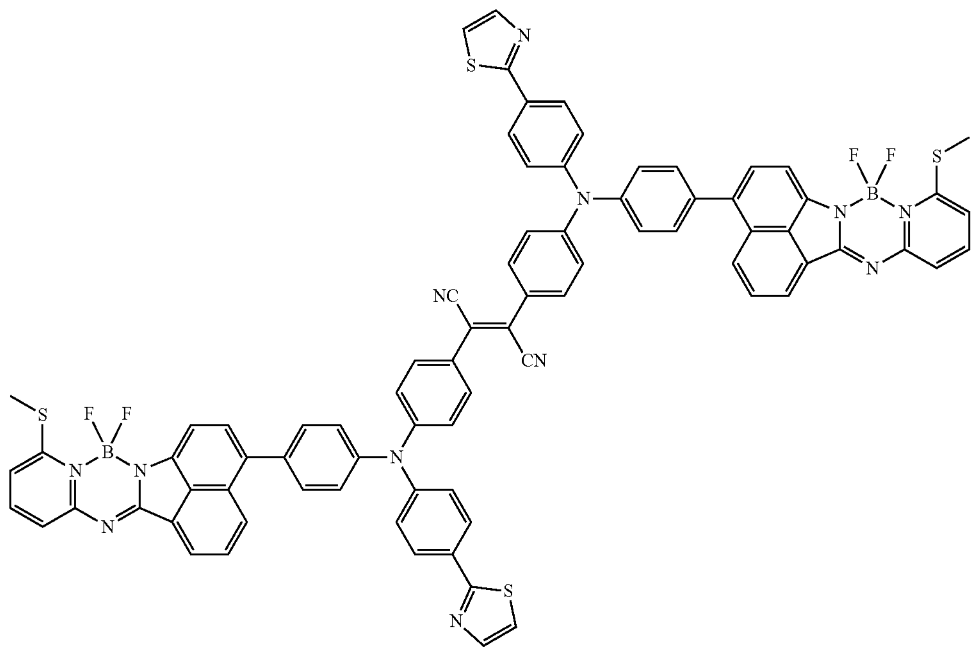
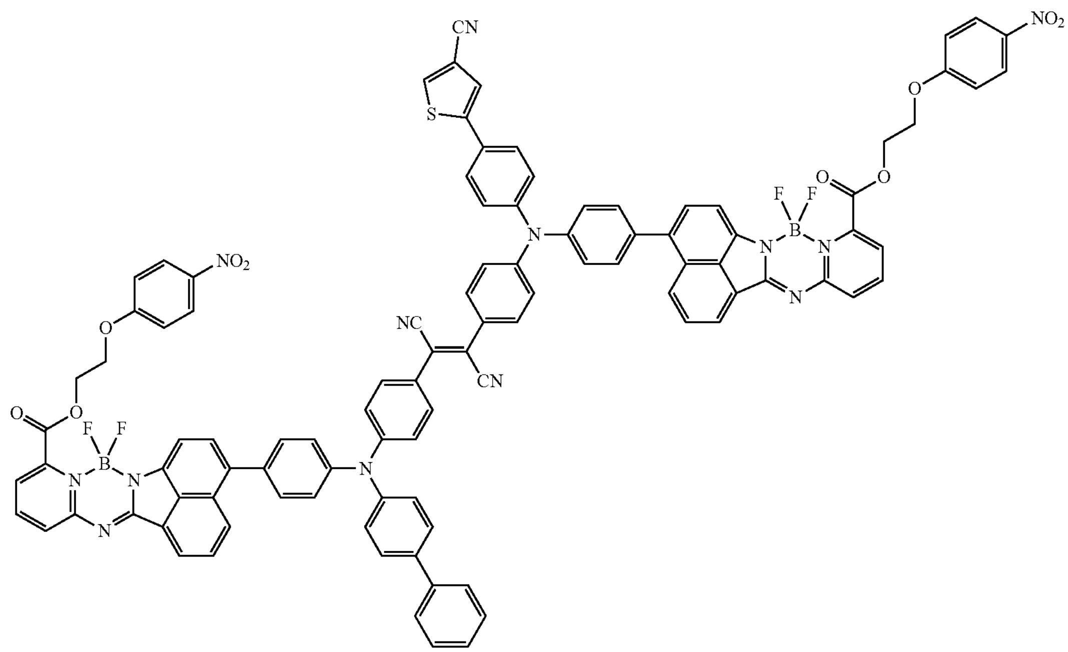

-continued
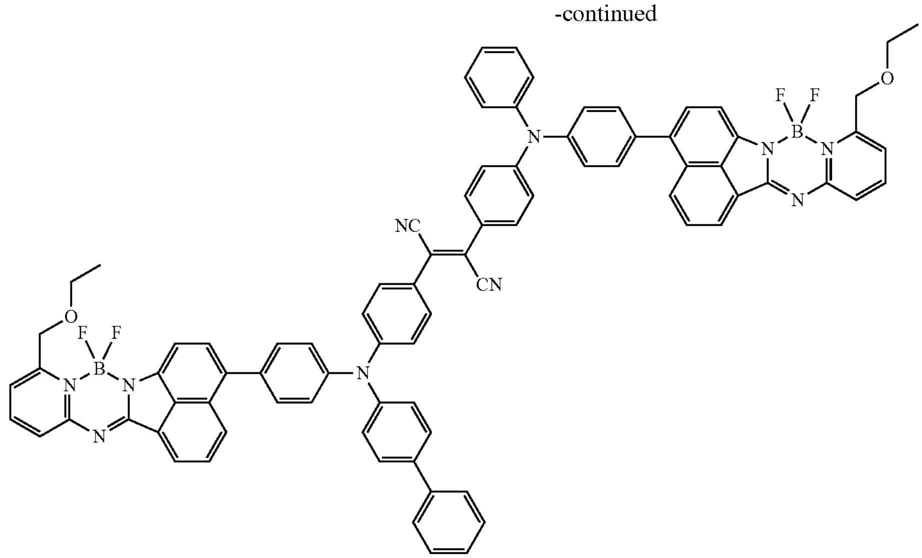
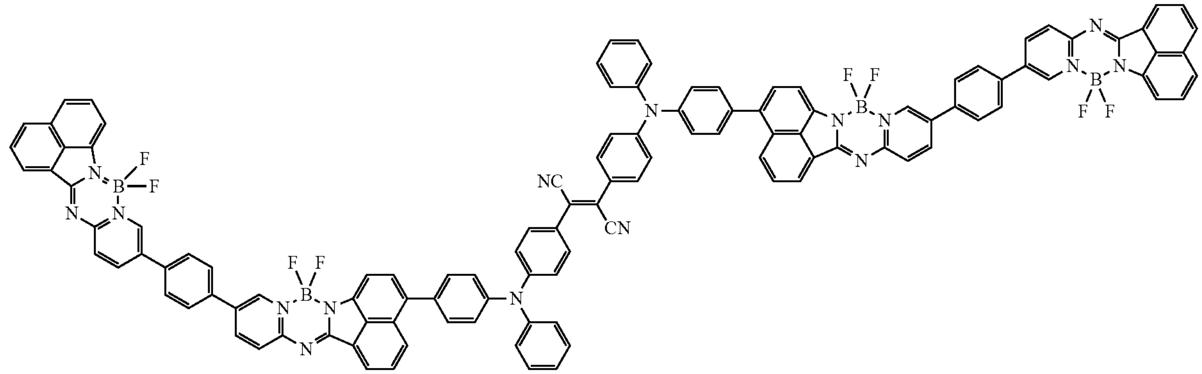
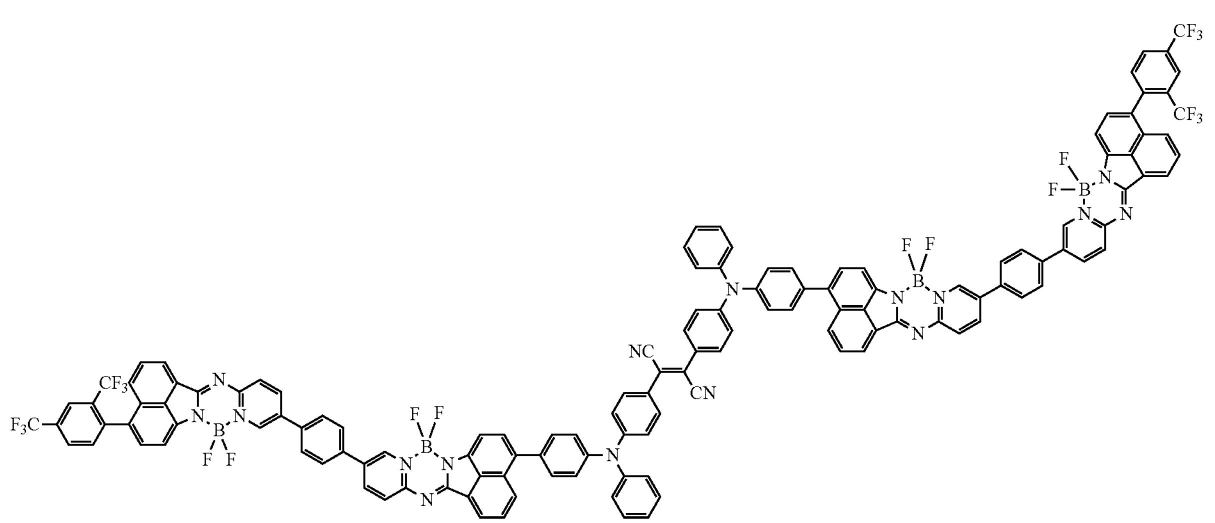

-continued
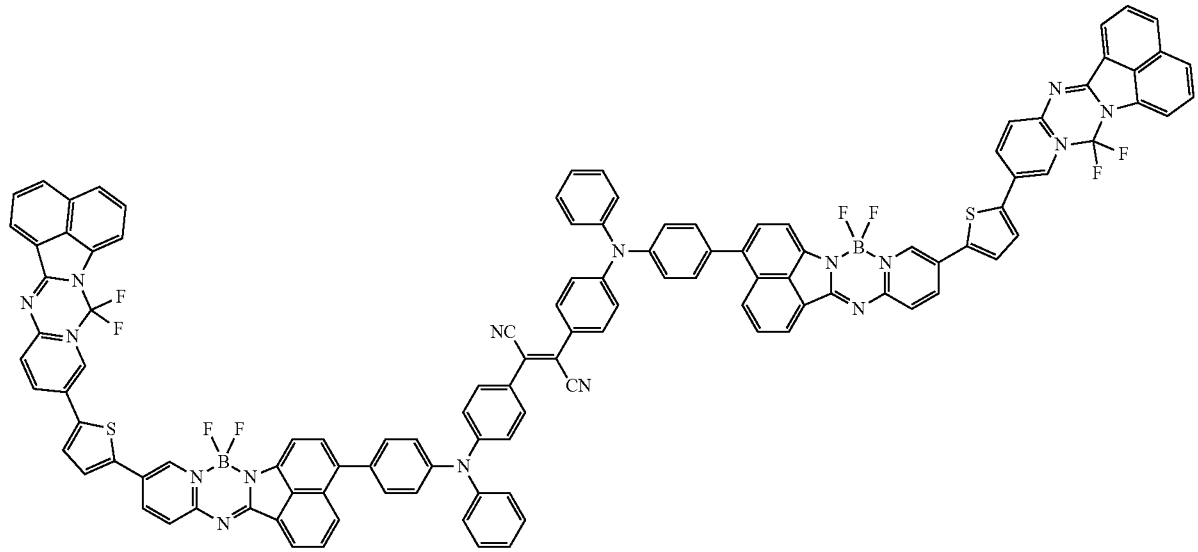
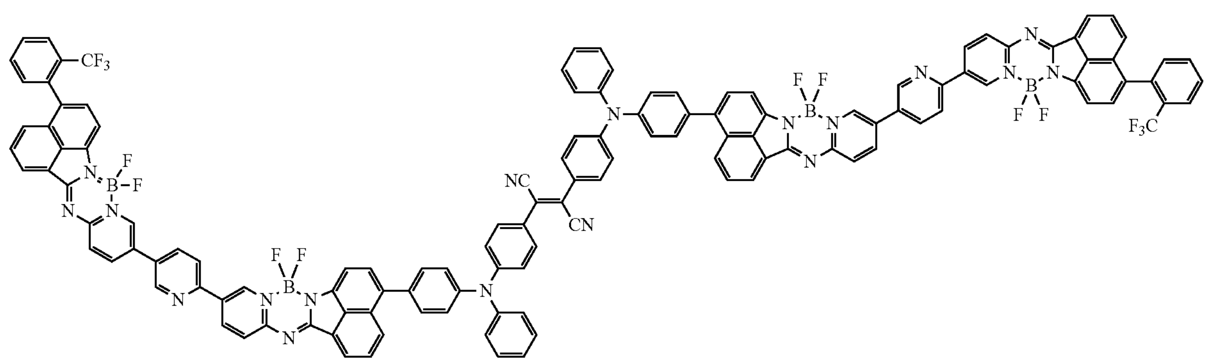
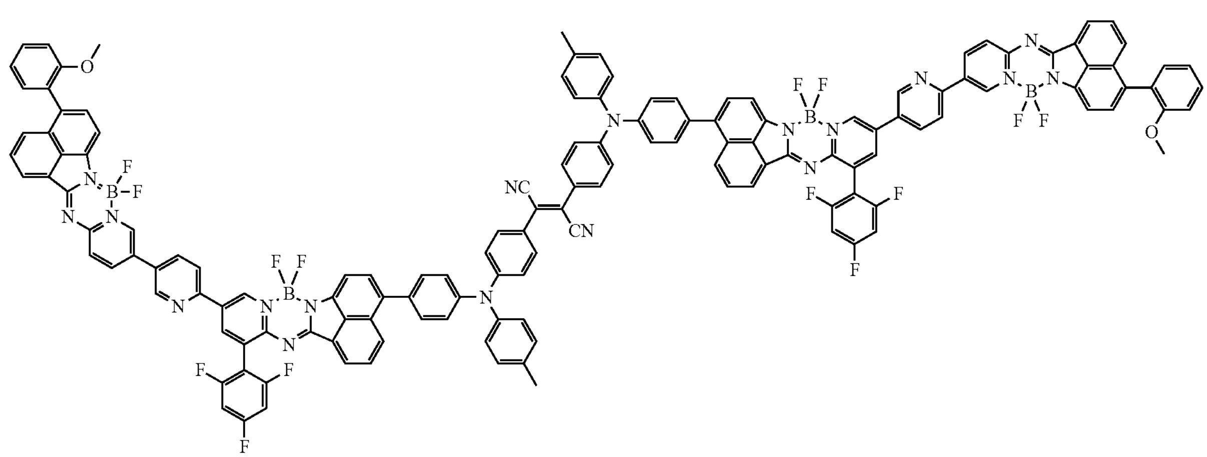

-continued
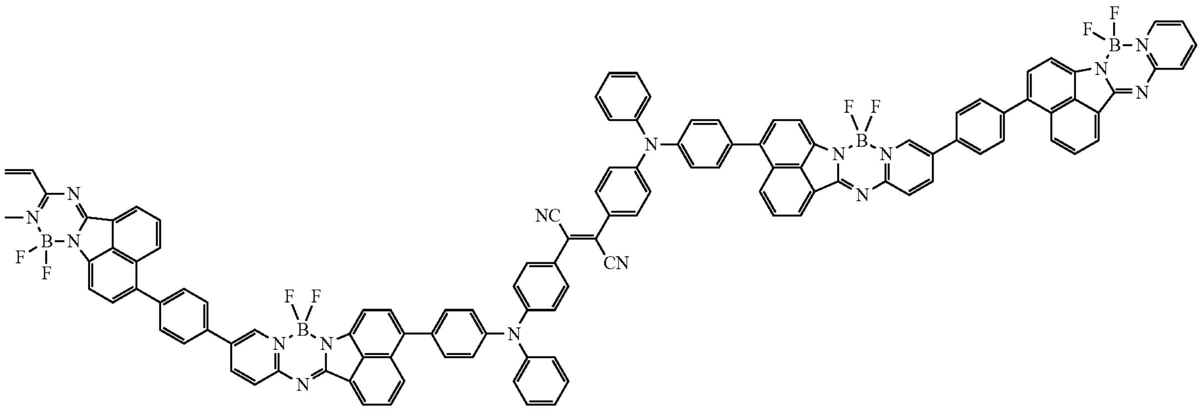
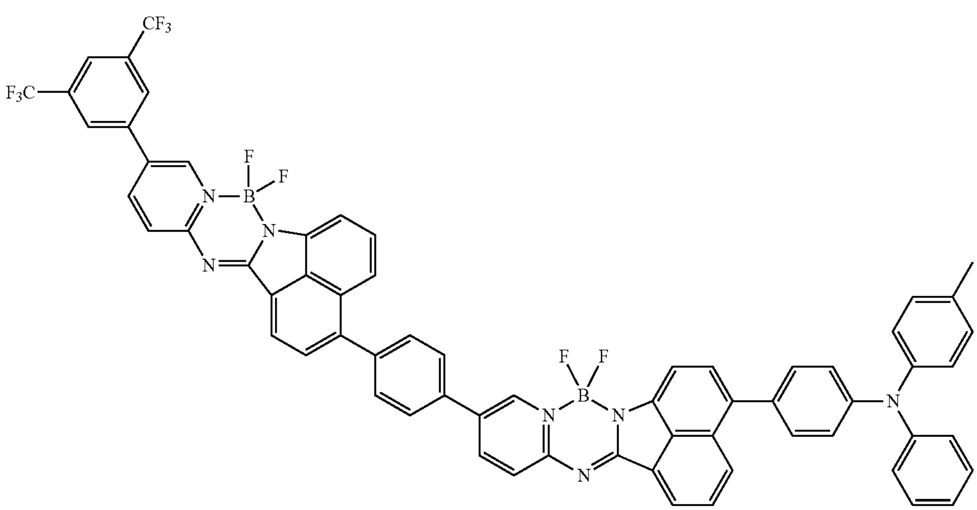
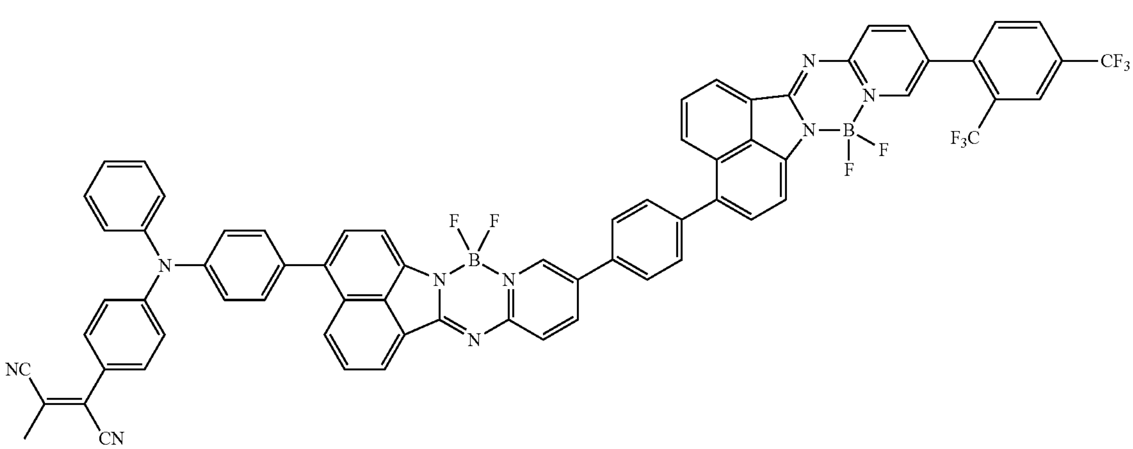

-continued
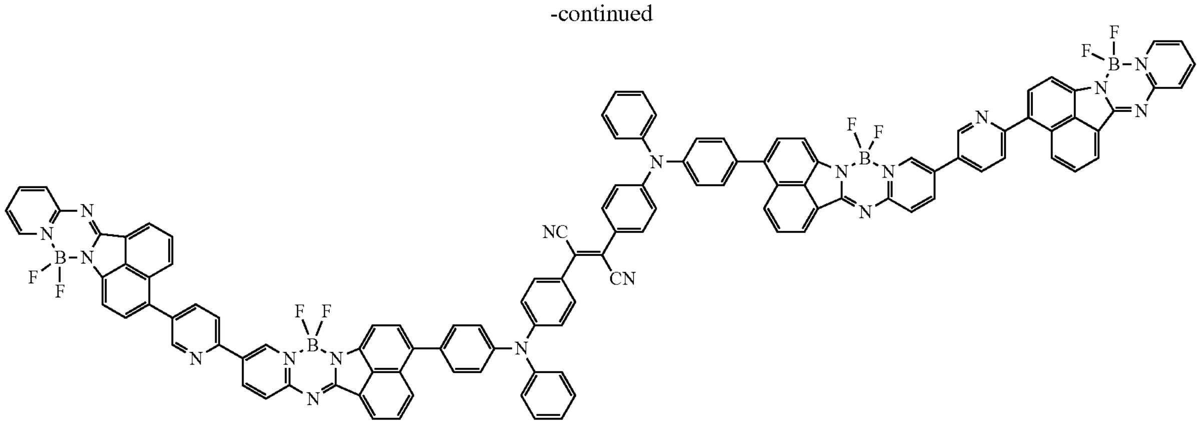
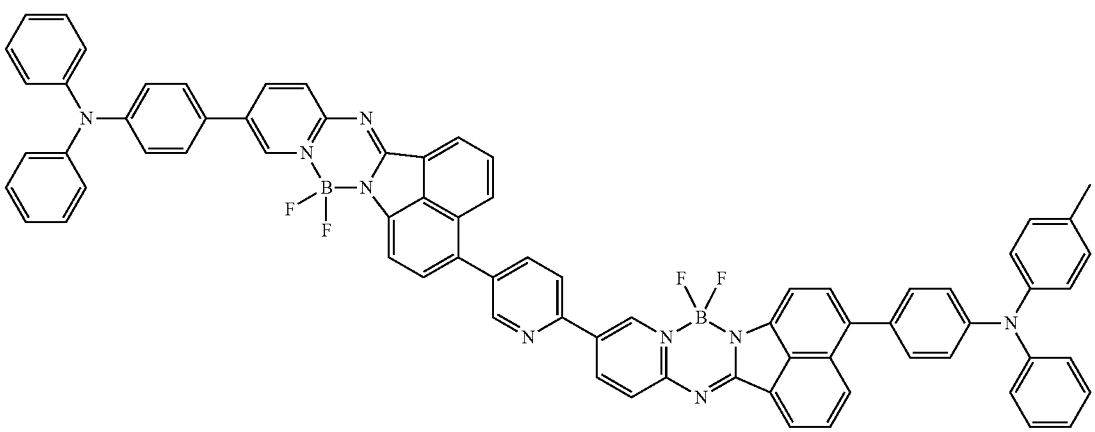
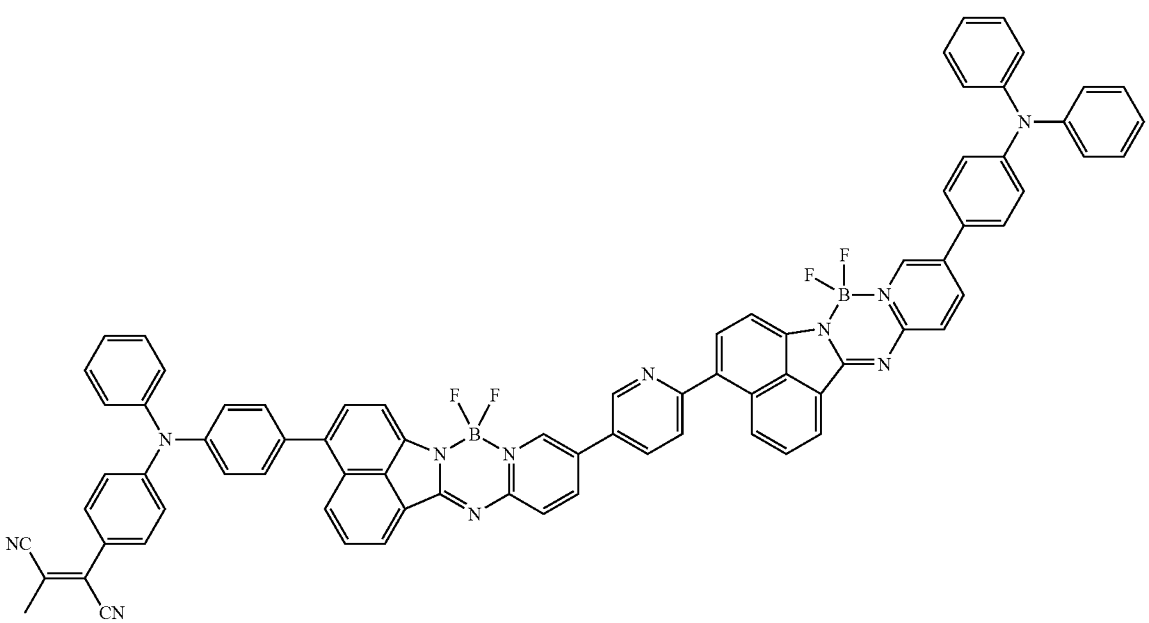

-continued
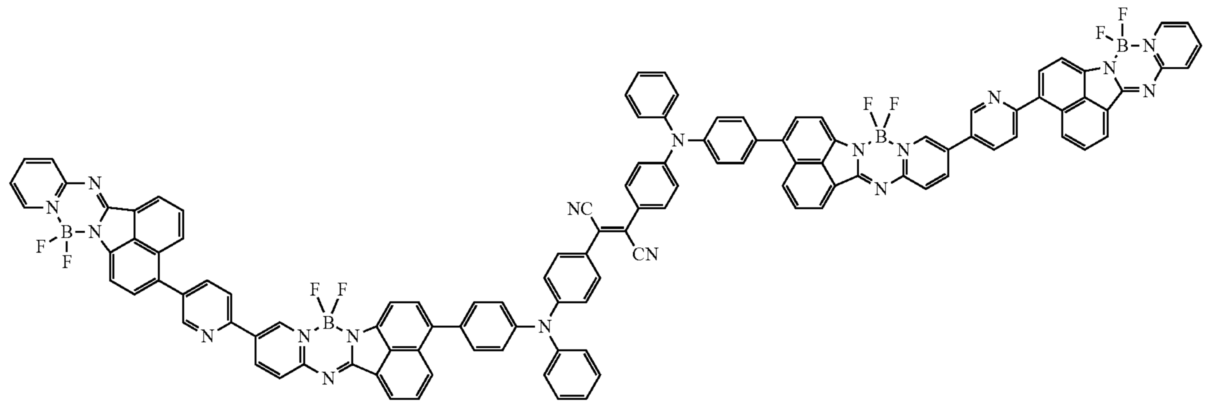
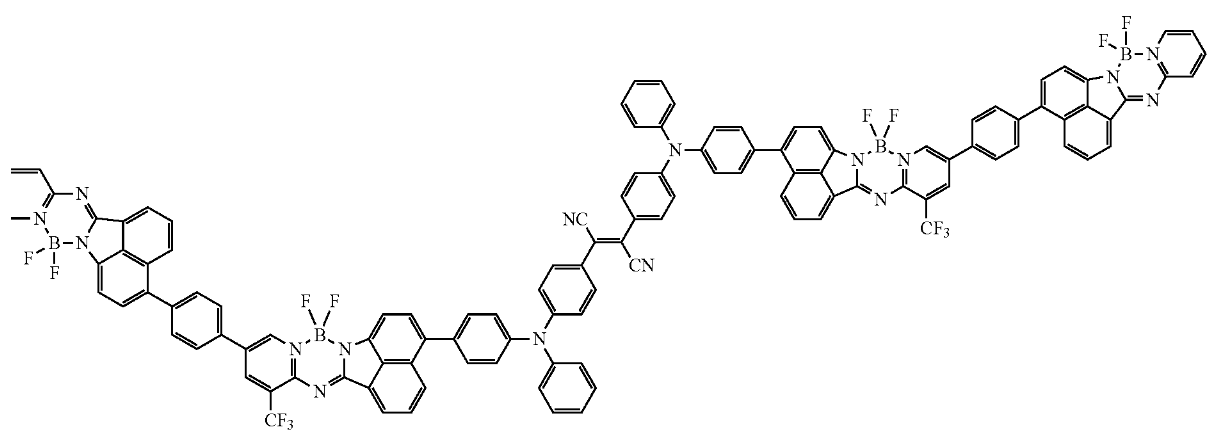
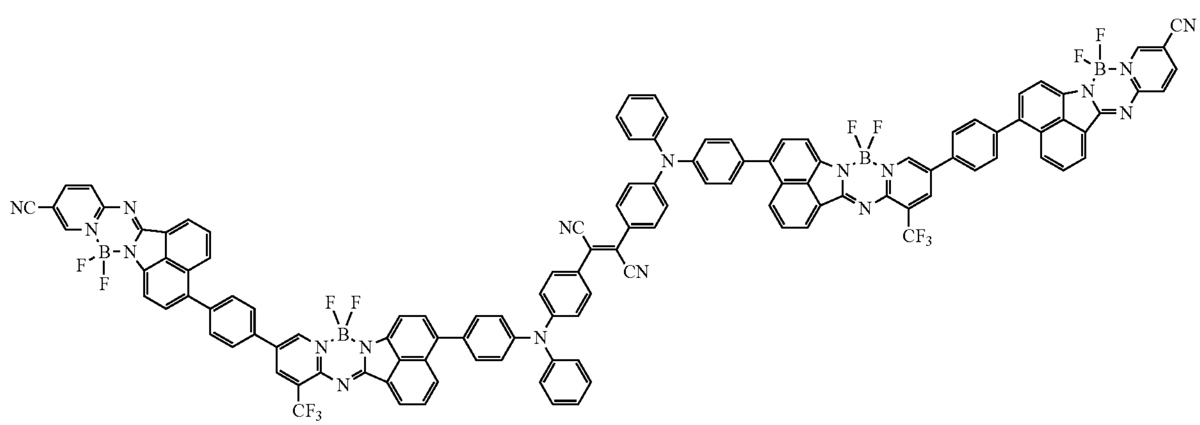

-continued
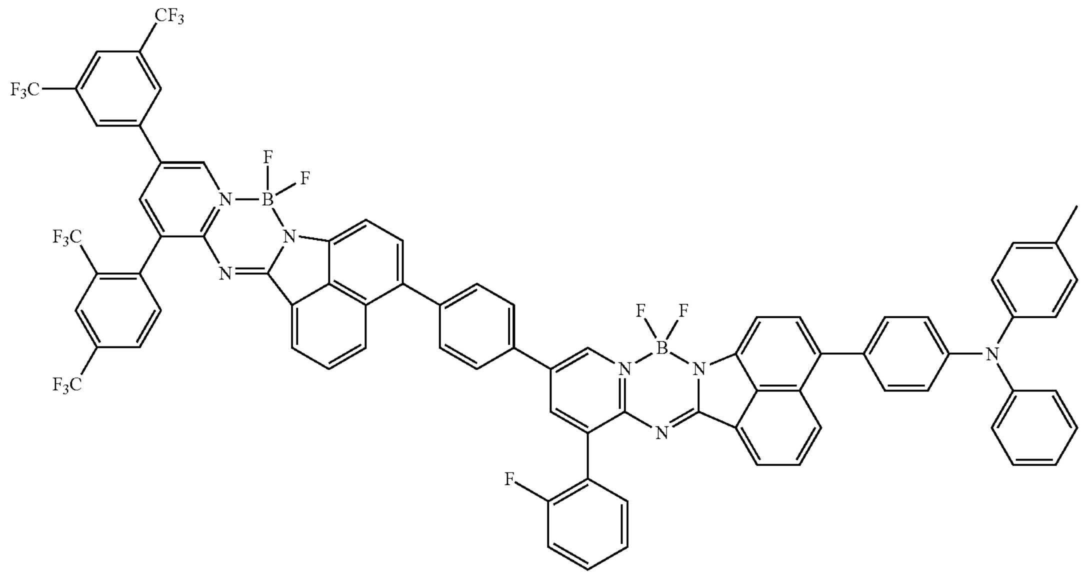
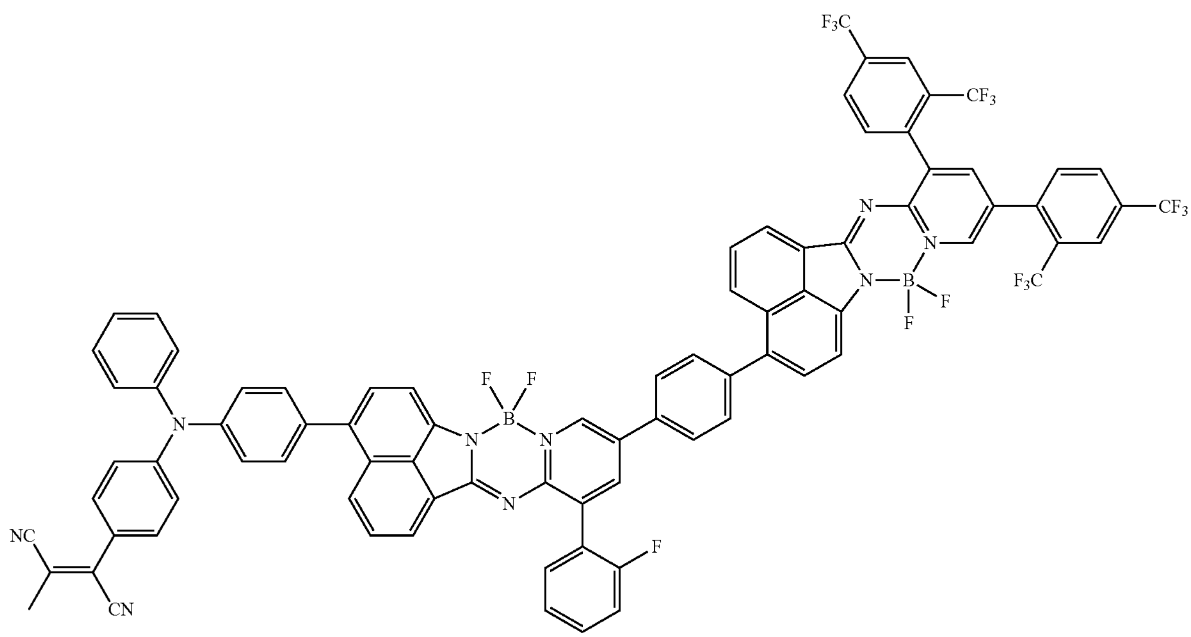
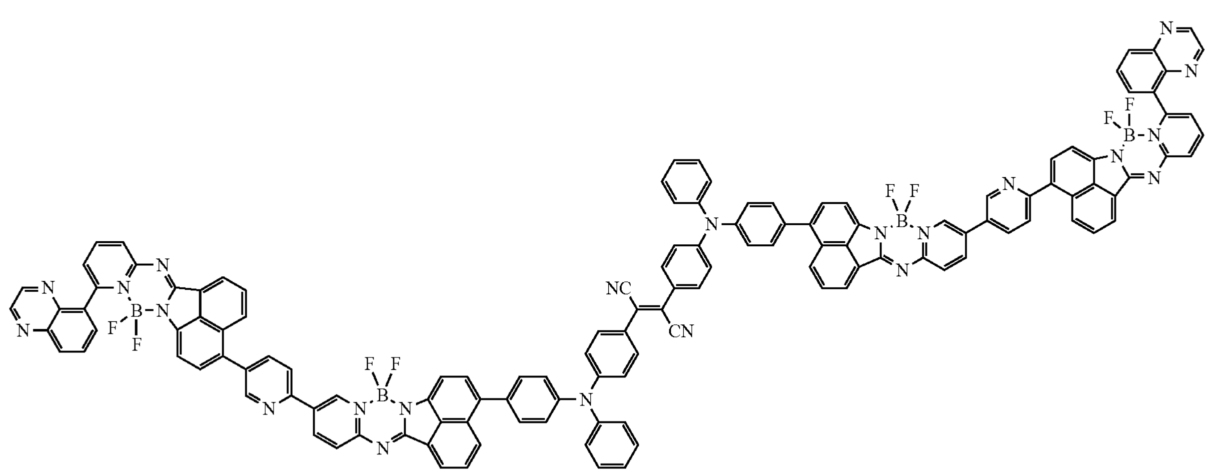

-continued
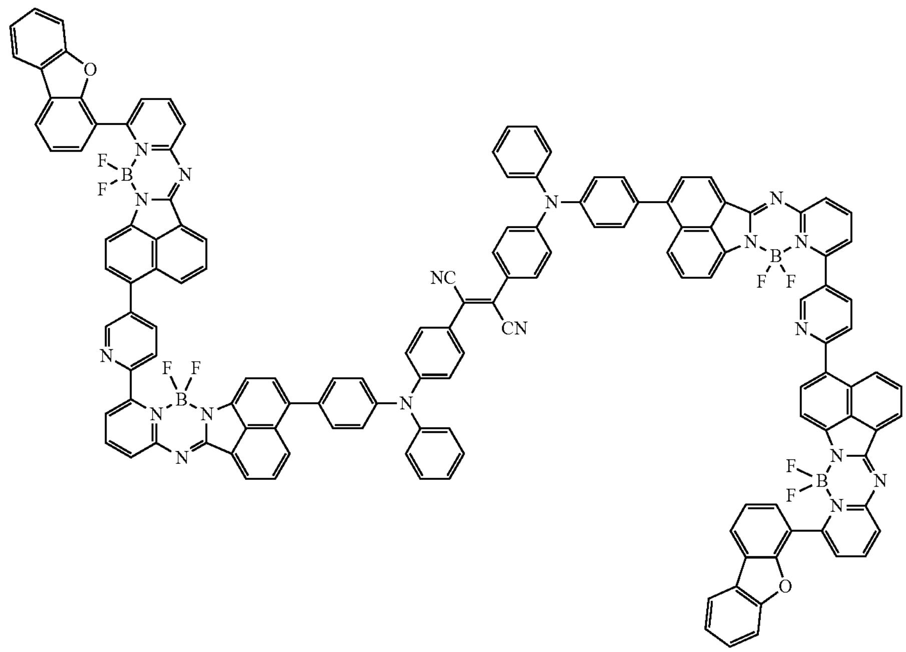
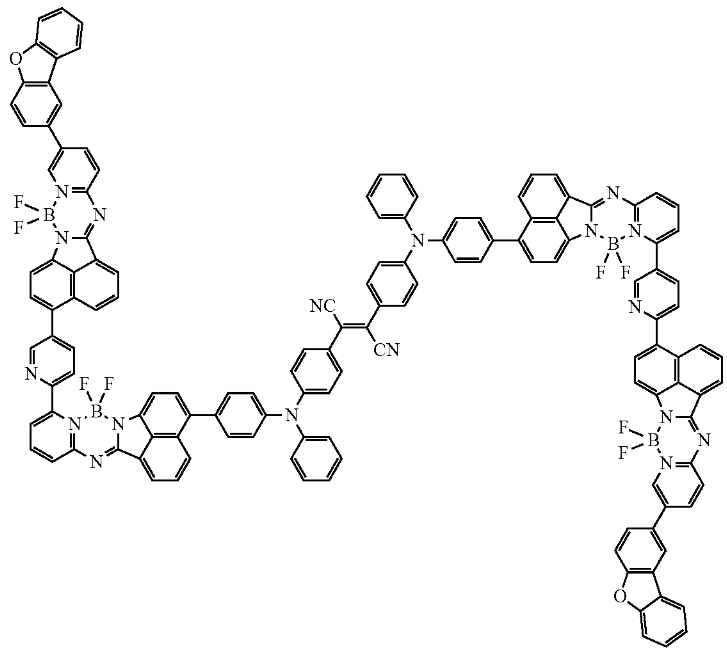

-continued
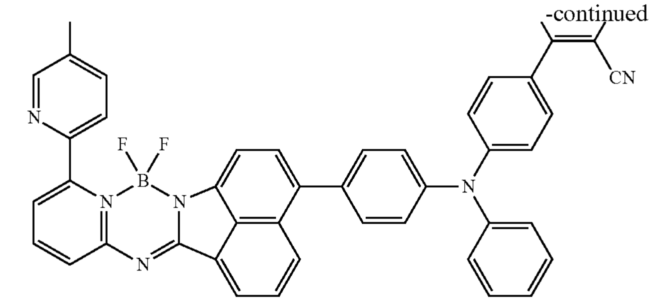
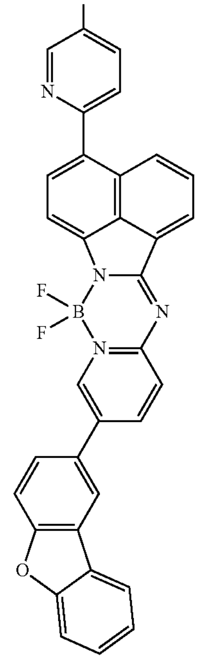
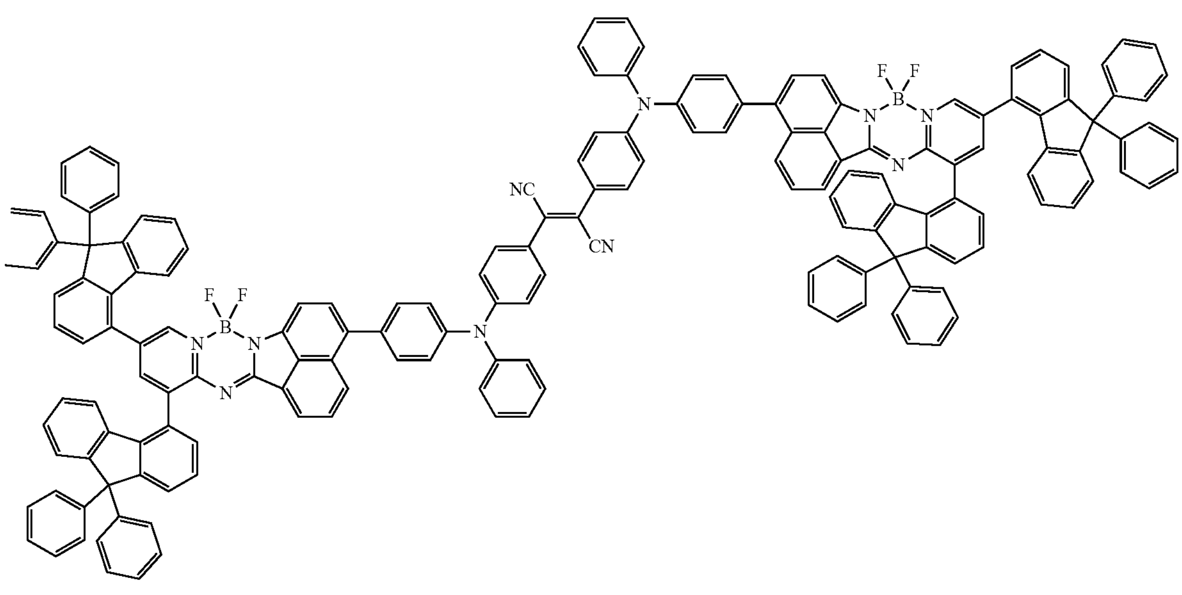

-continued
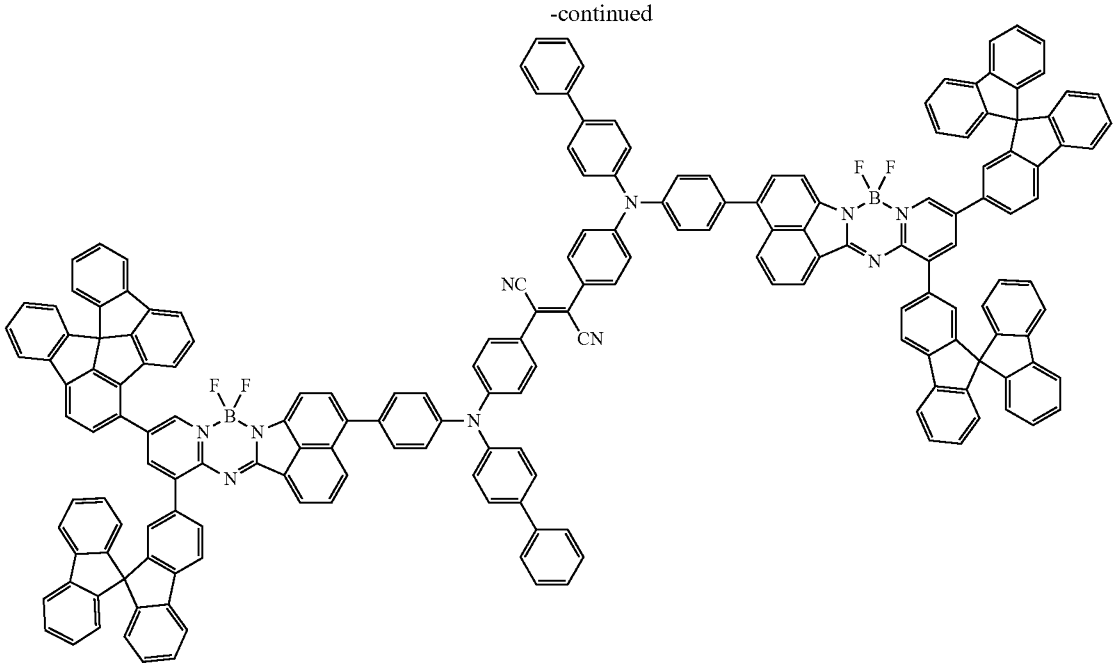
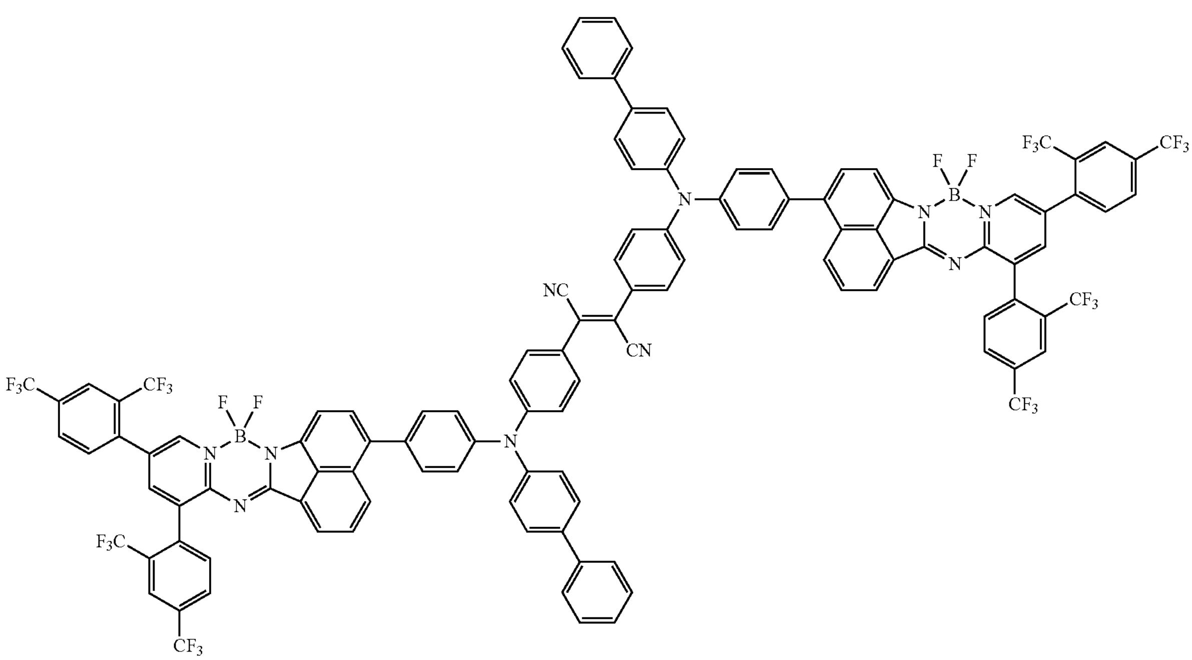

-continued
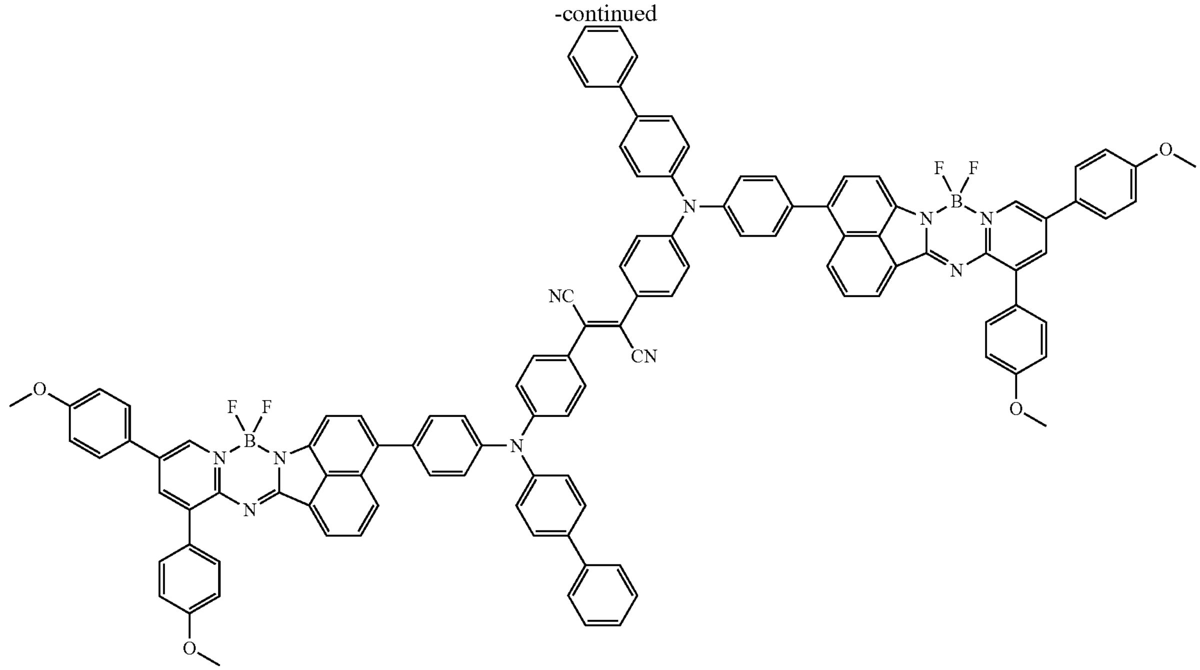
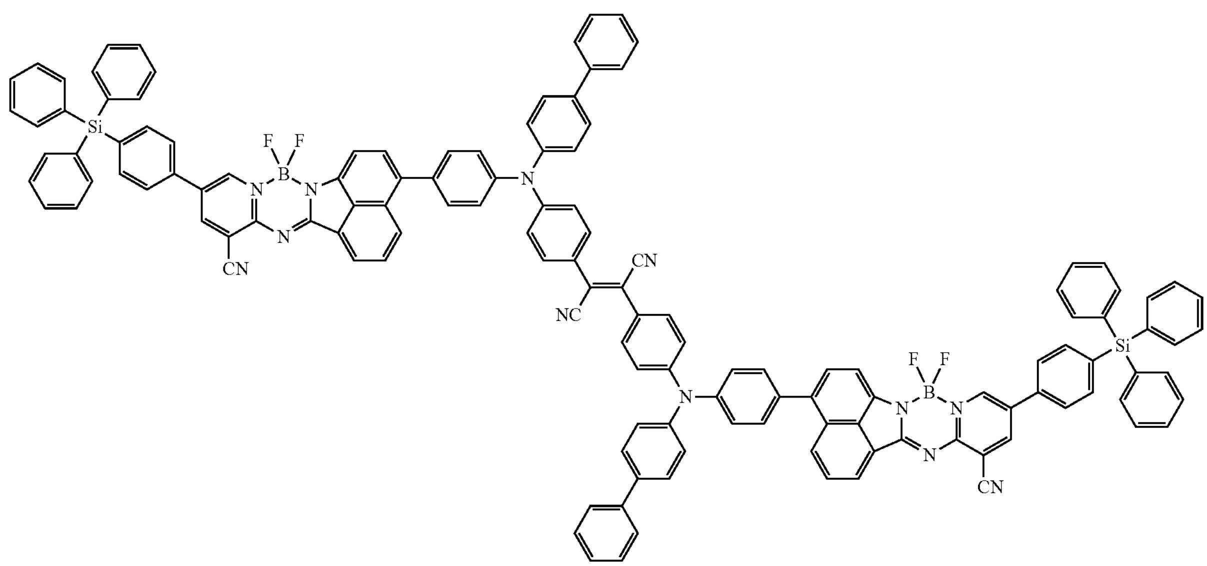
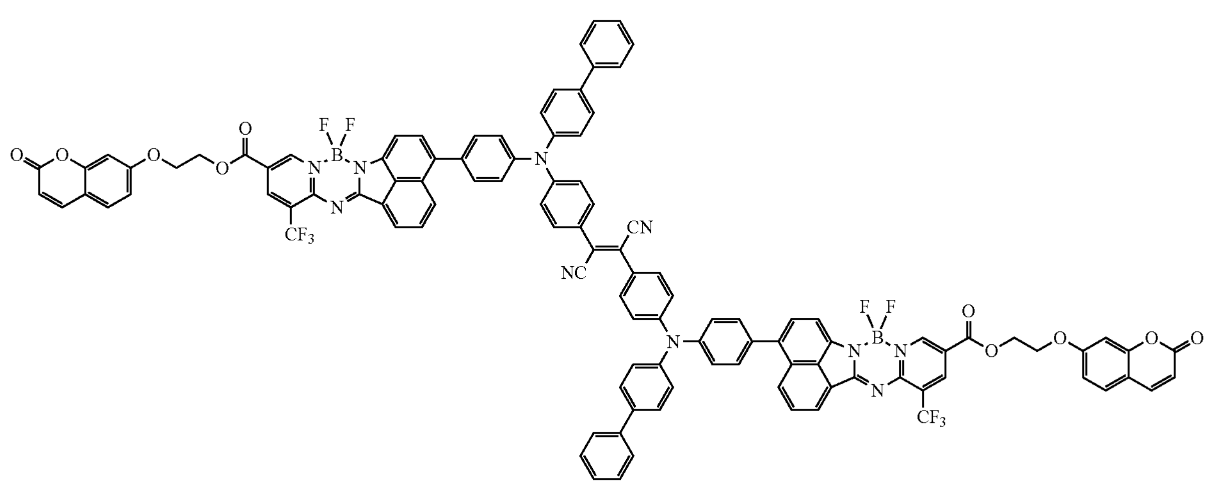

-continued
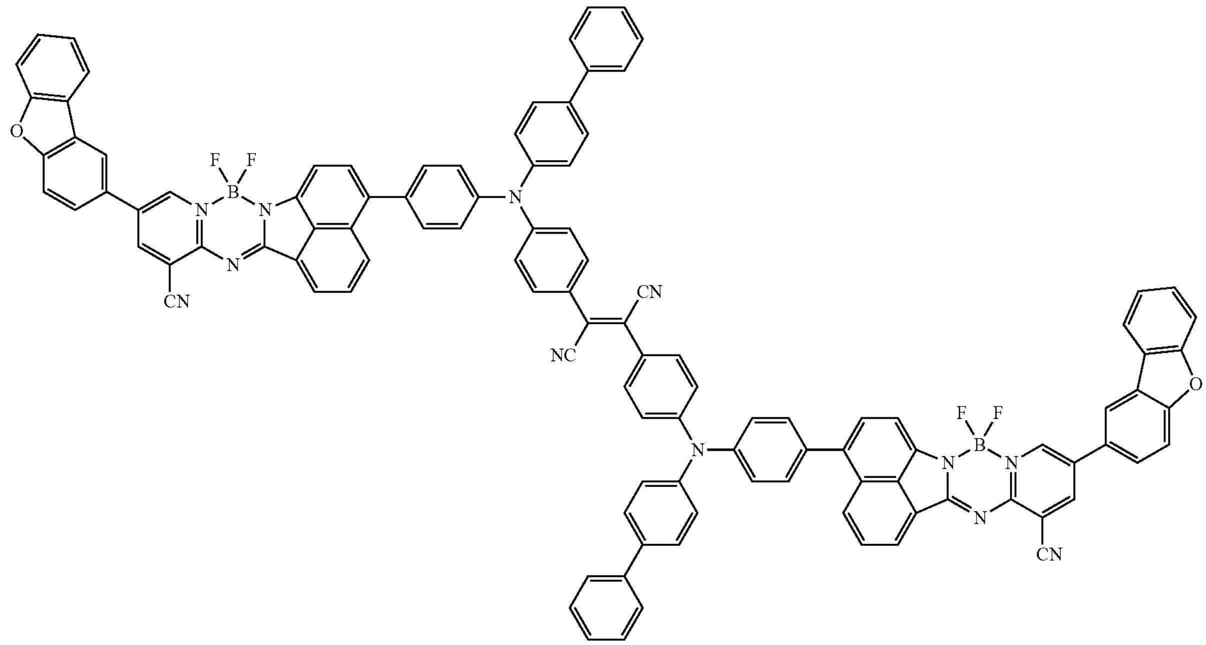
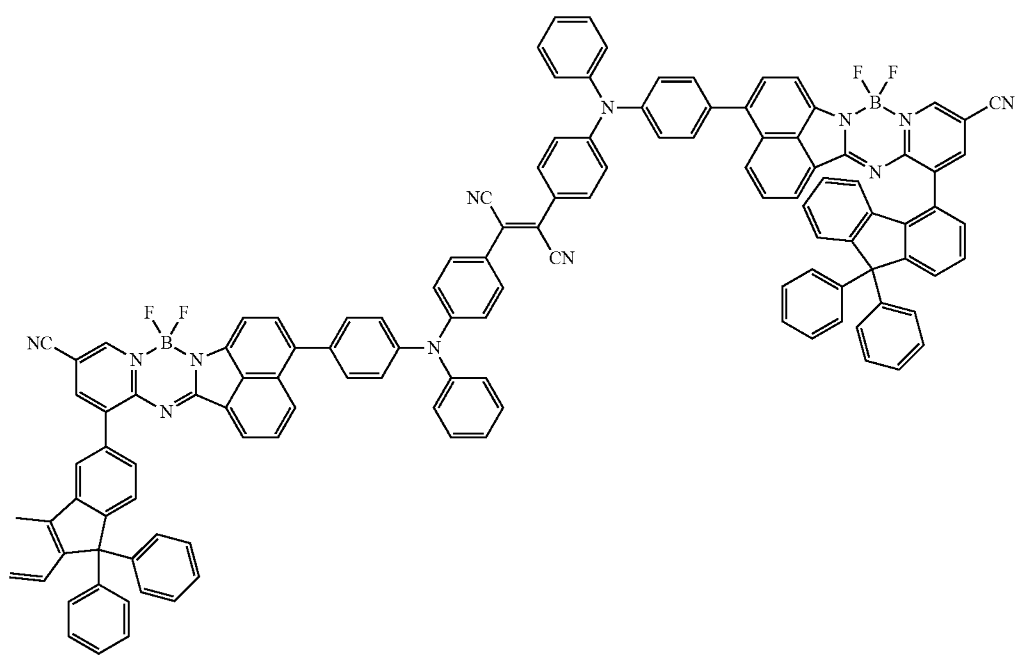

-continued
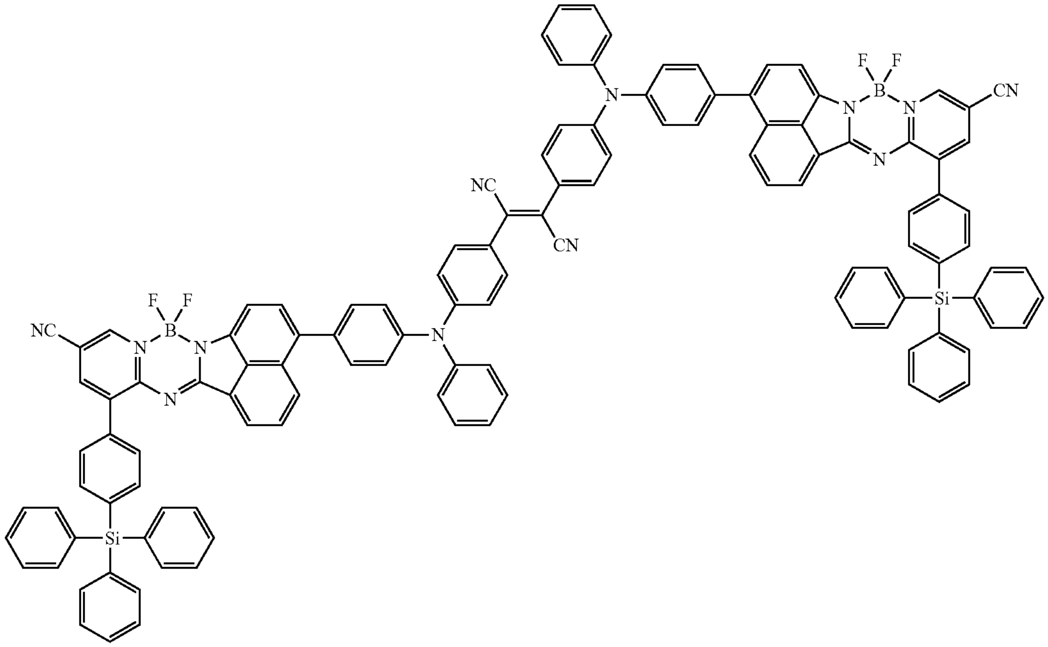
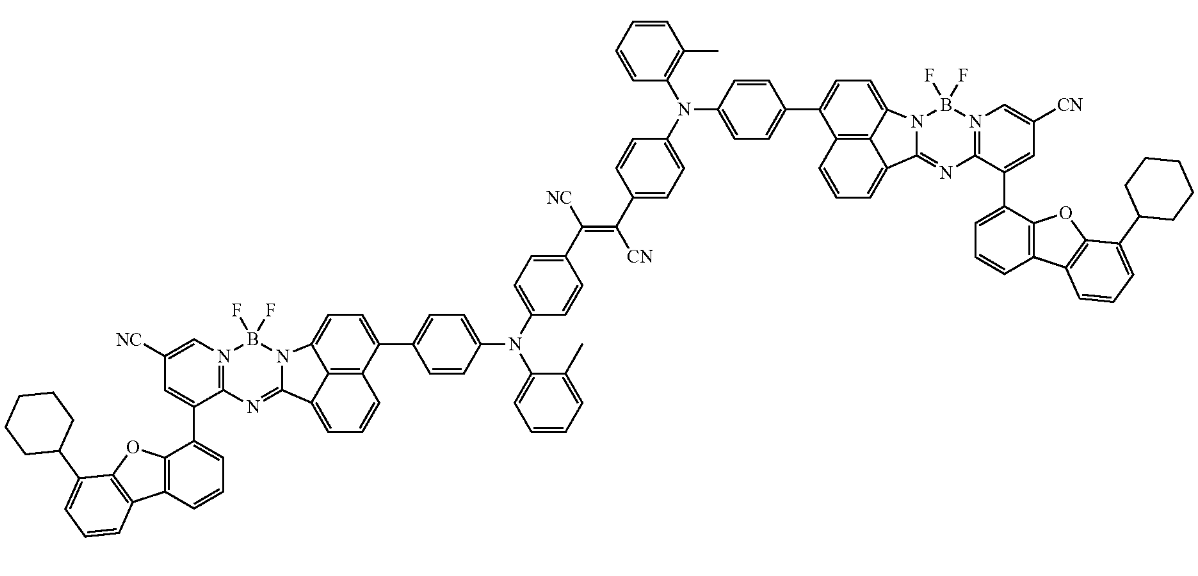

-continued
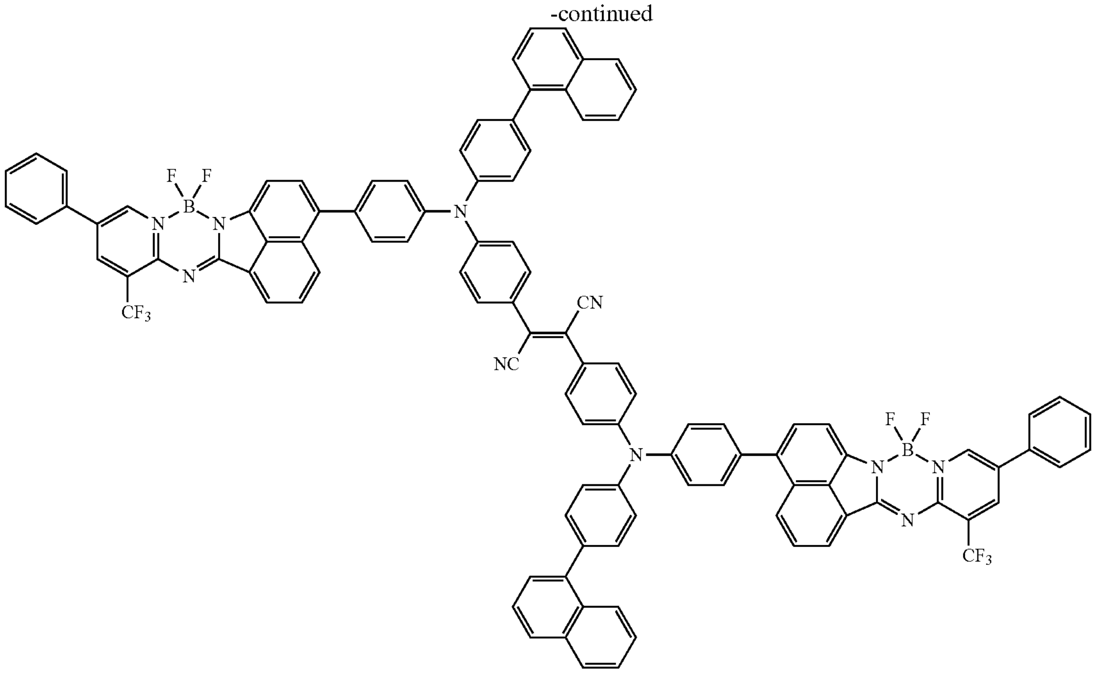
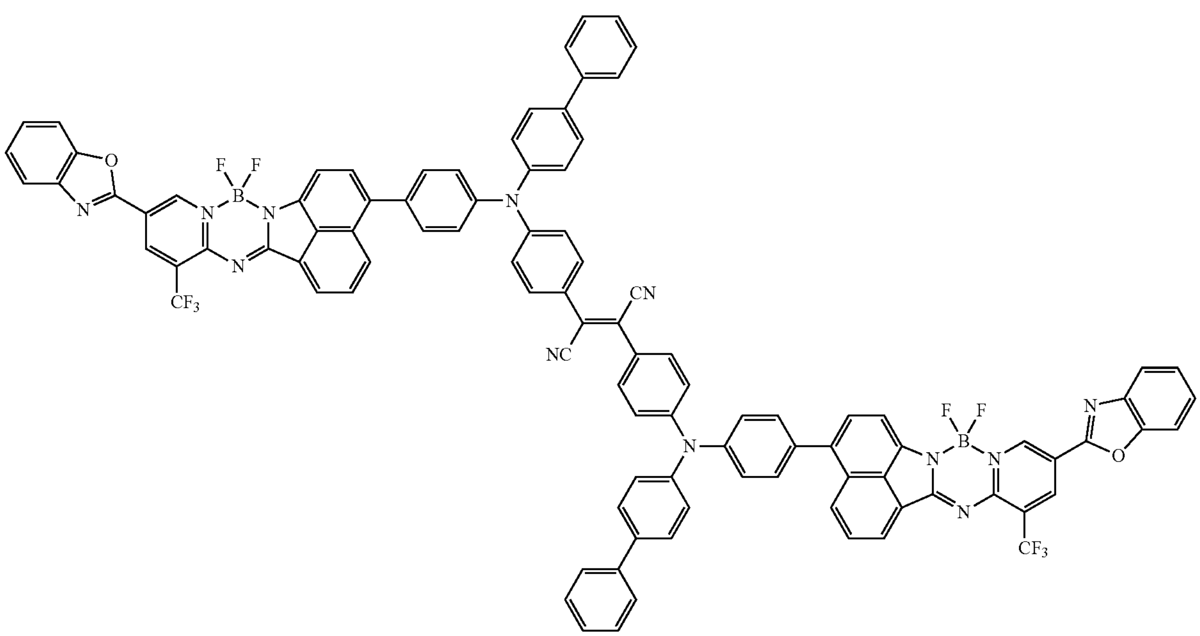

-continued
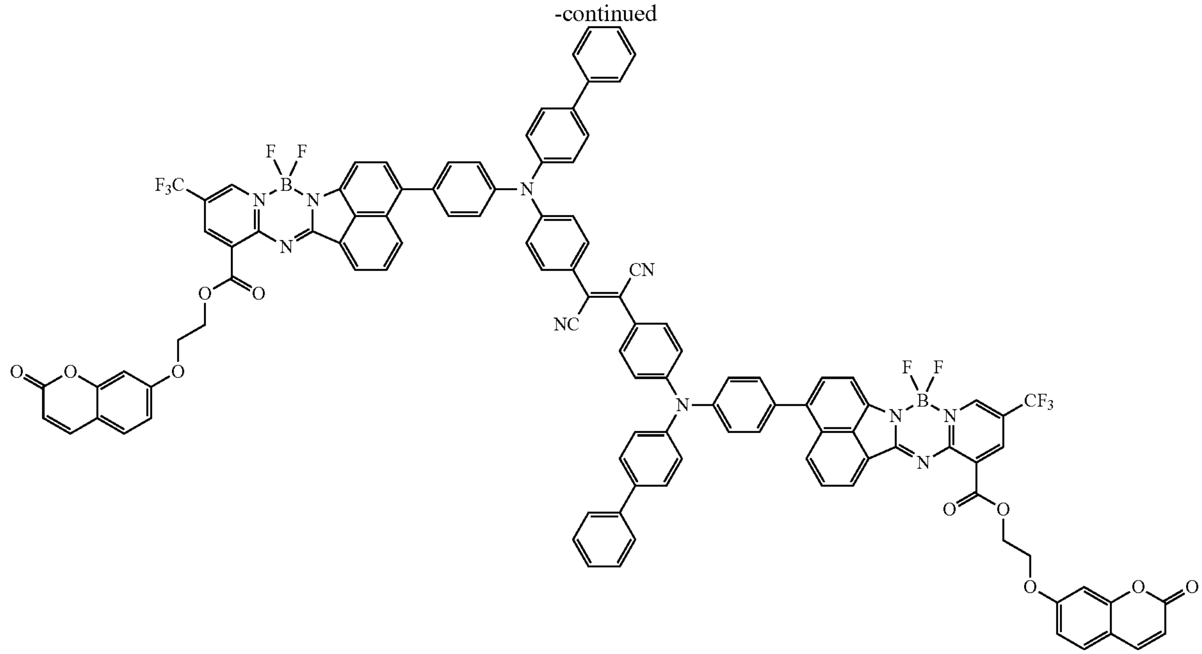
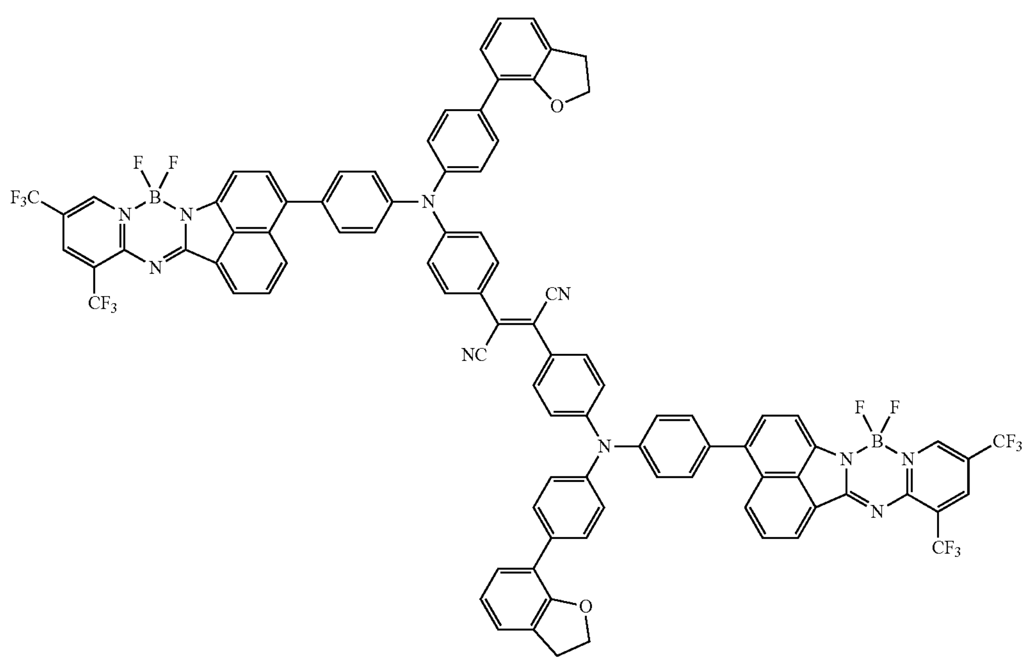

-continued
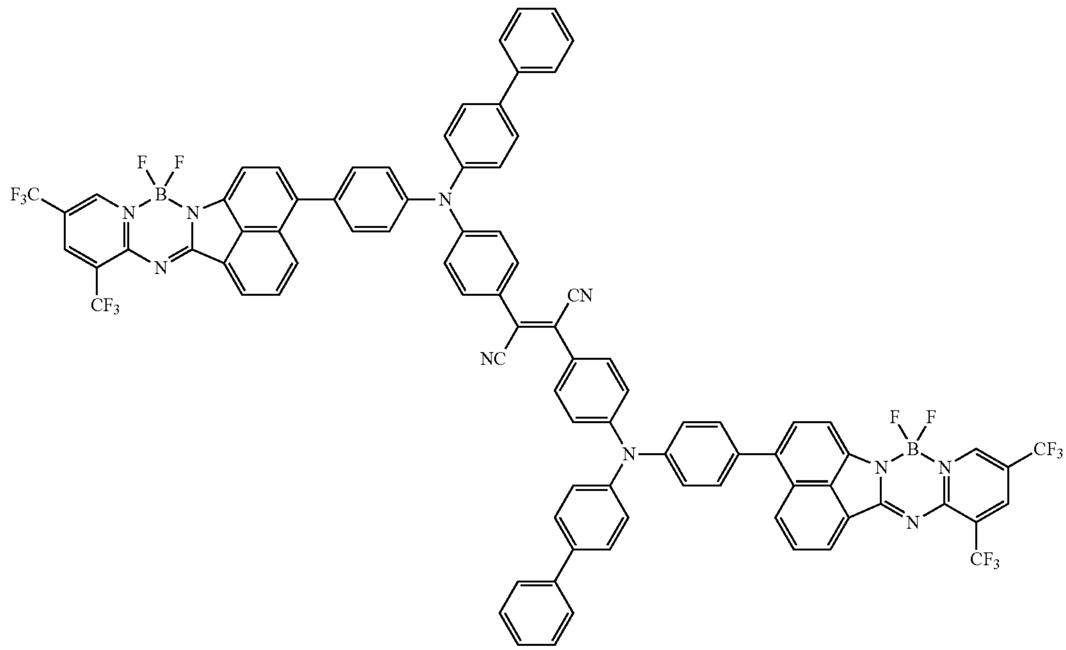
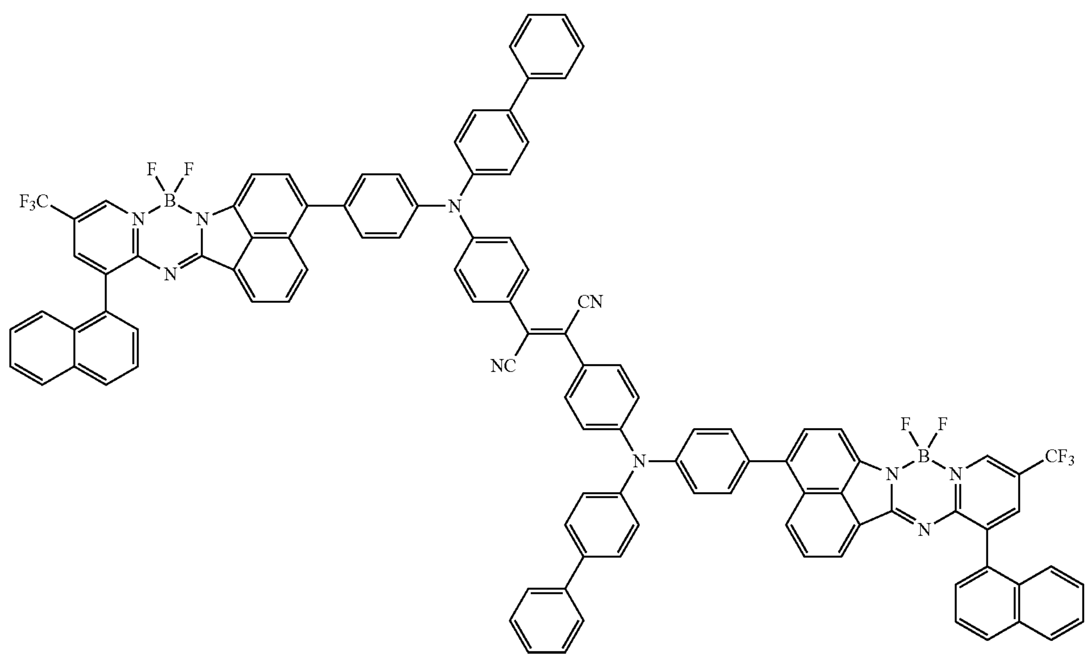

-continued
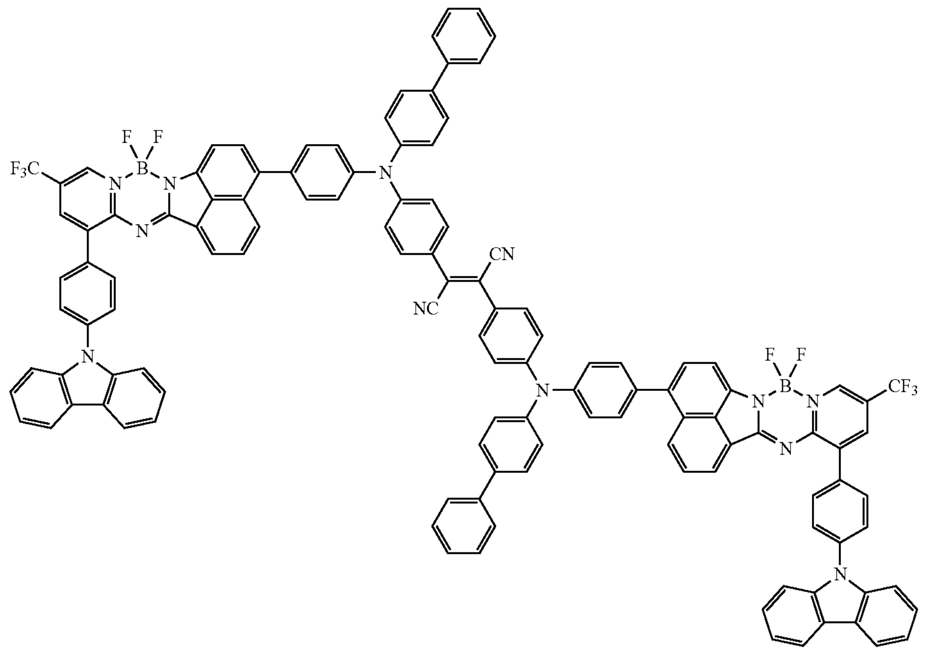
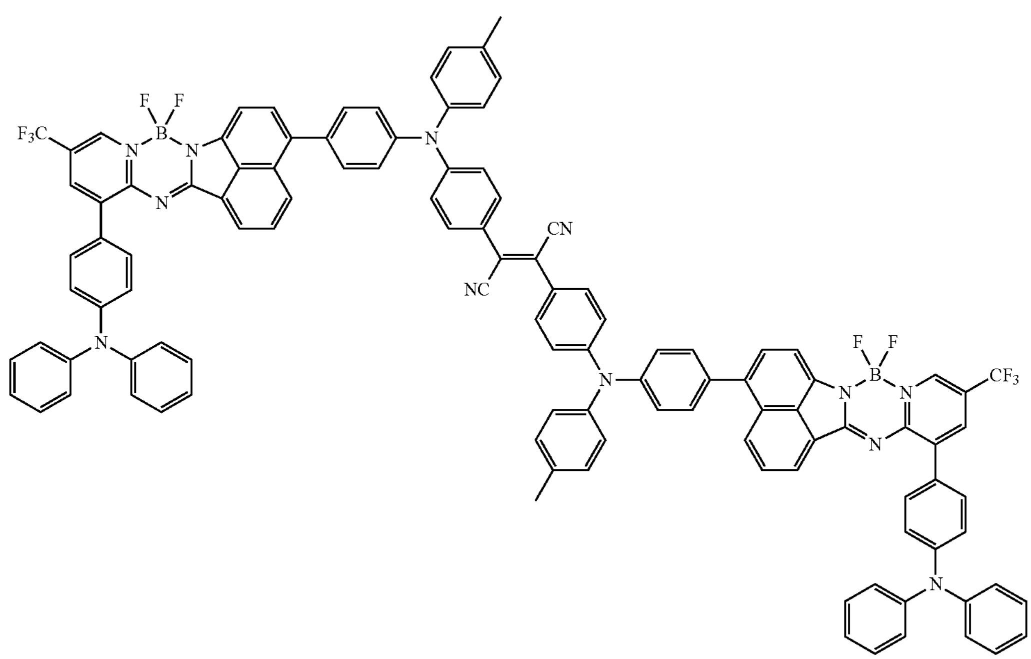

-continued
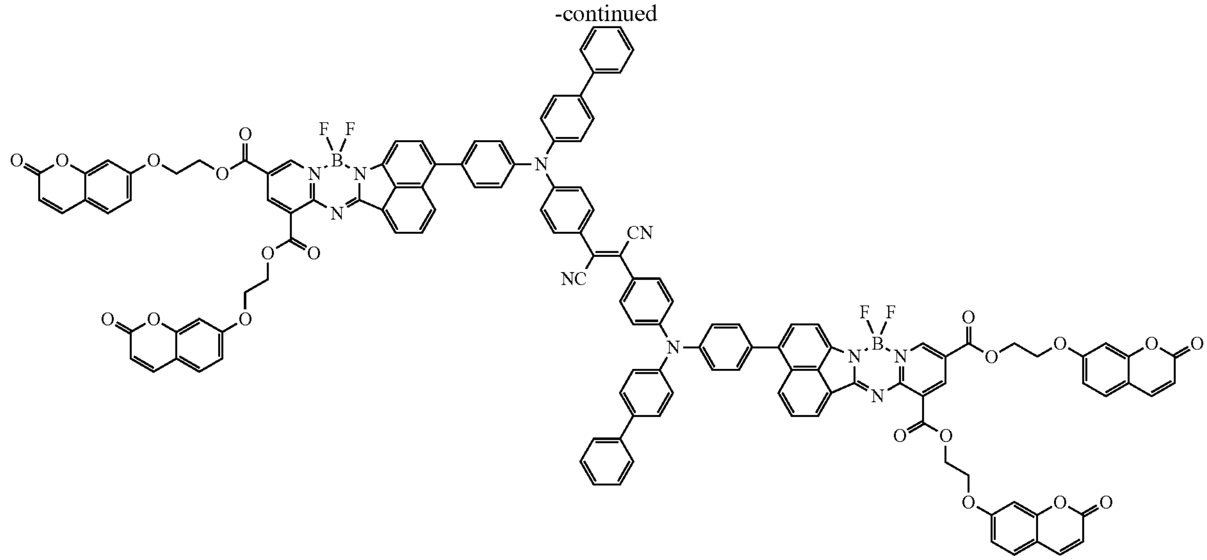
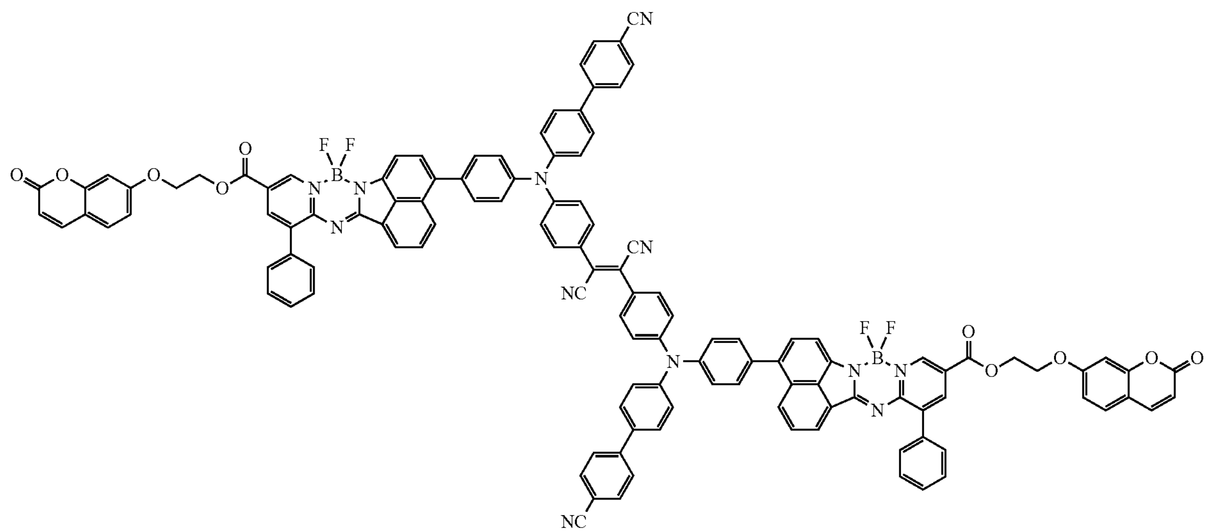
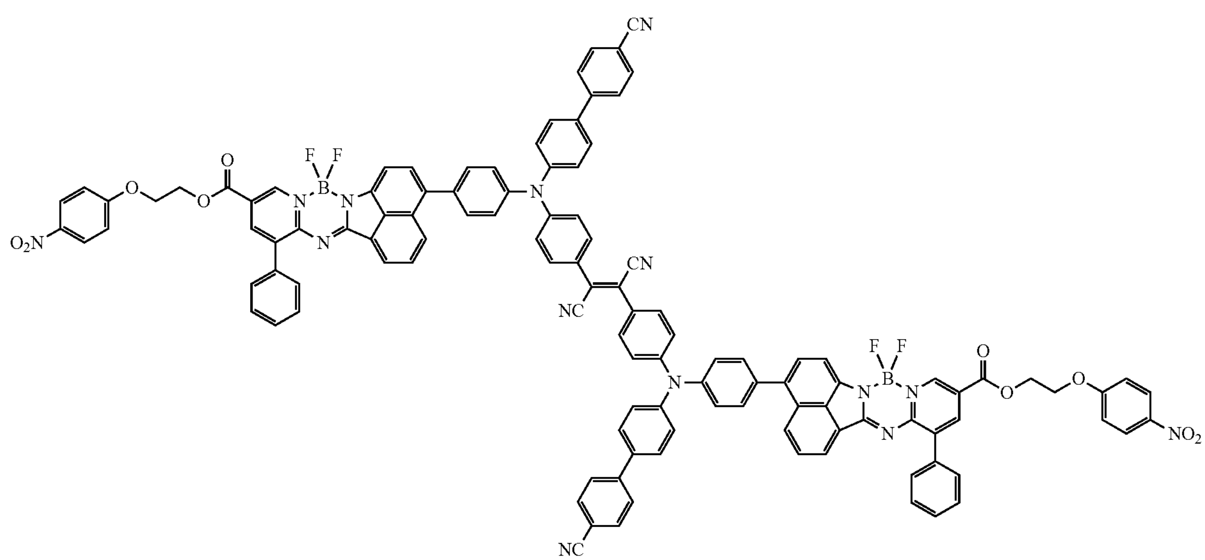

-continued
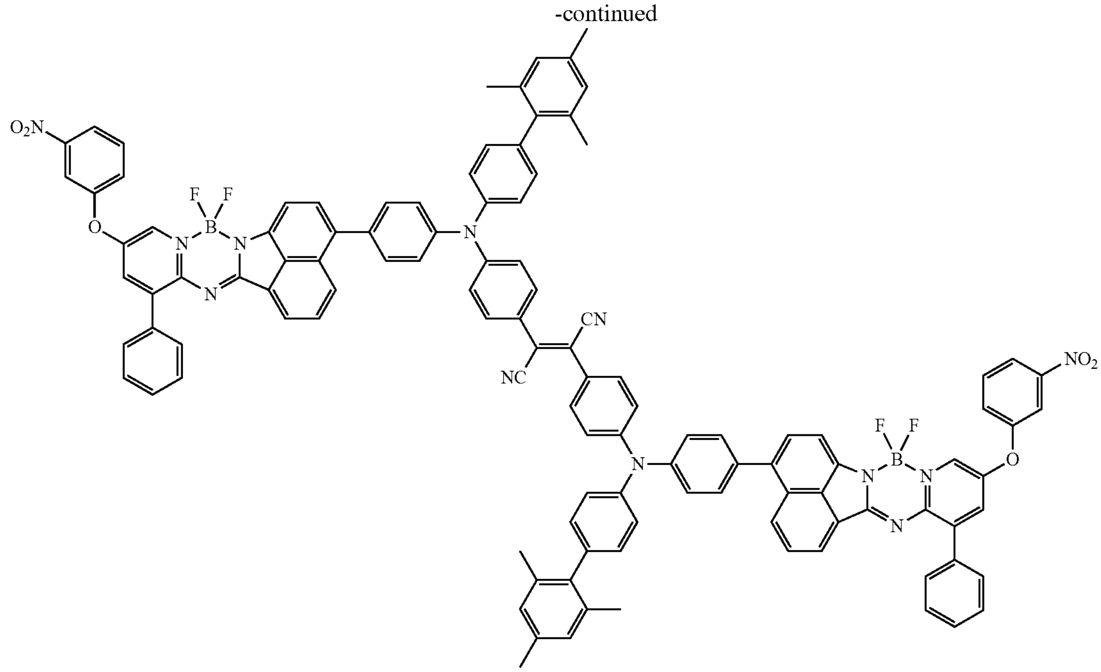
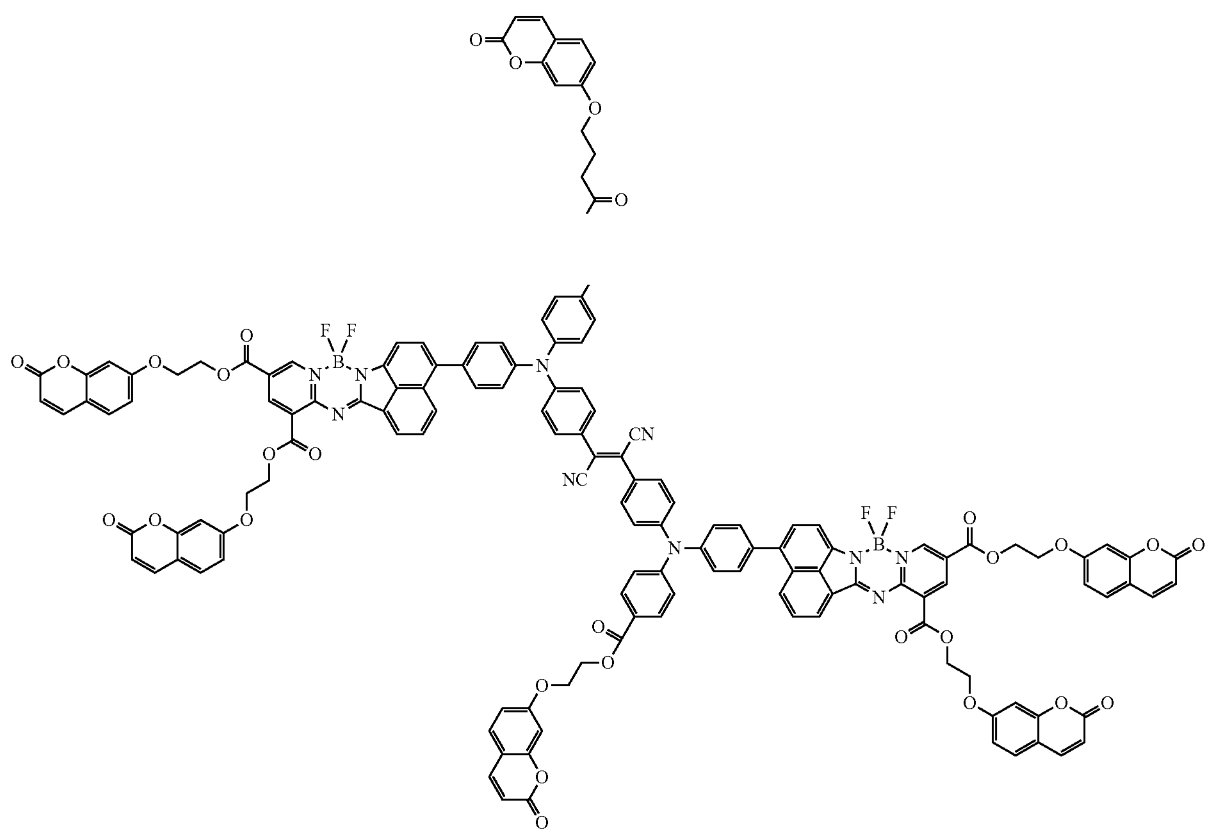

-continued
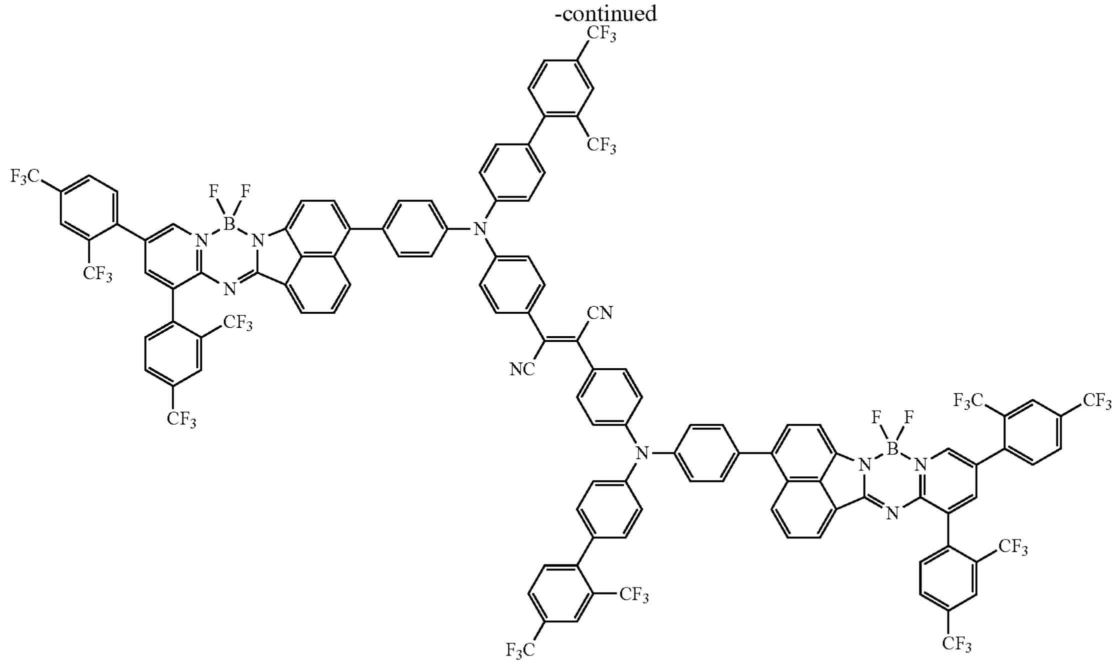
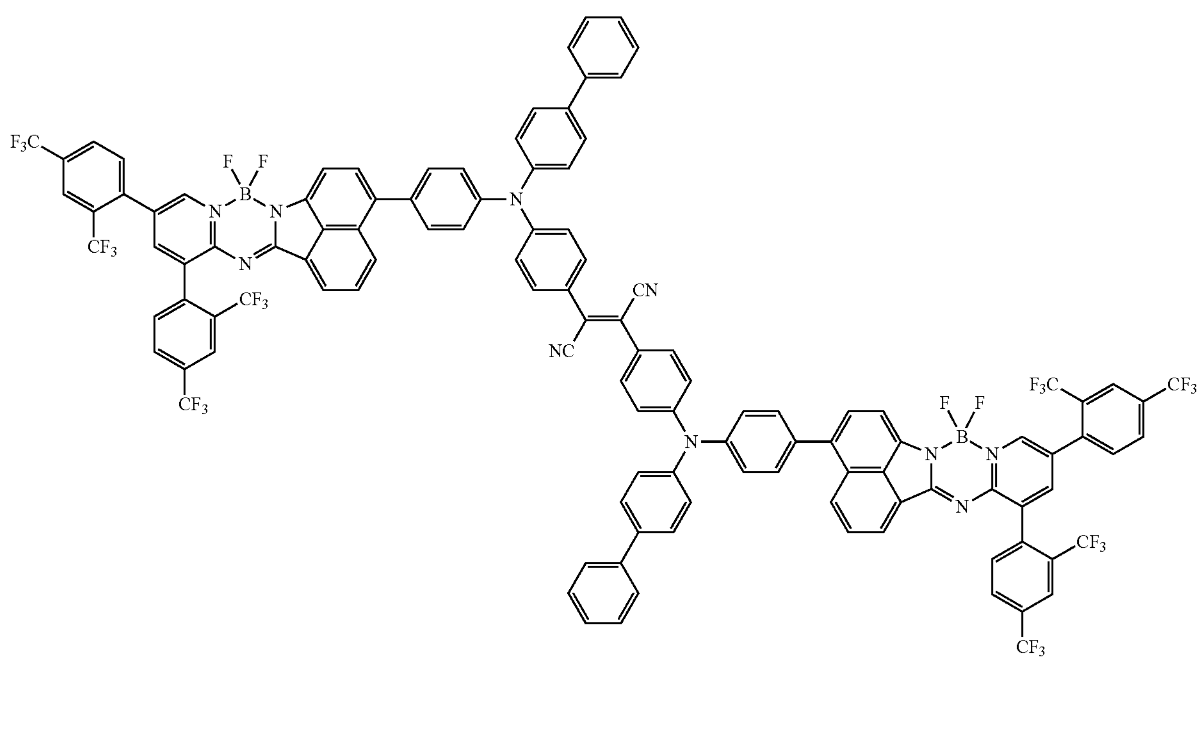

-continued
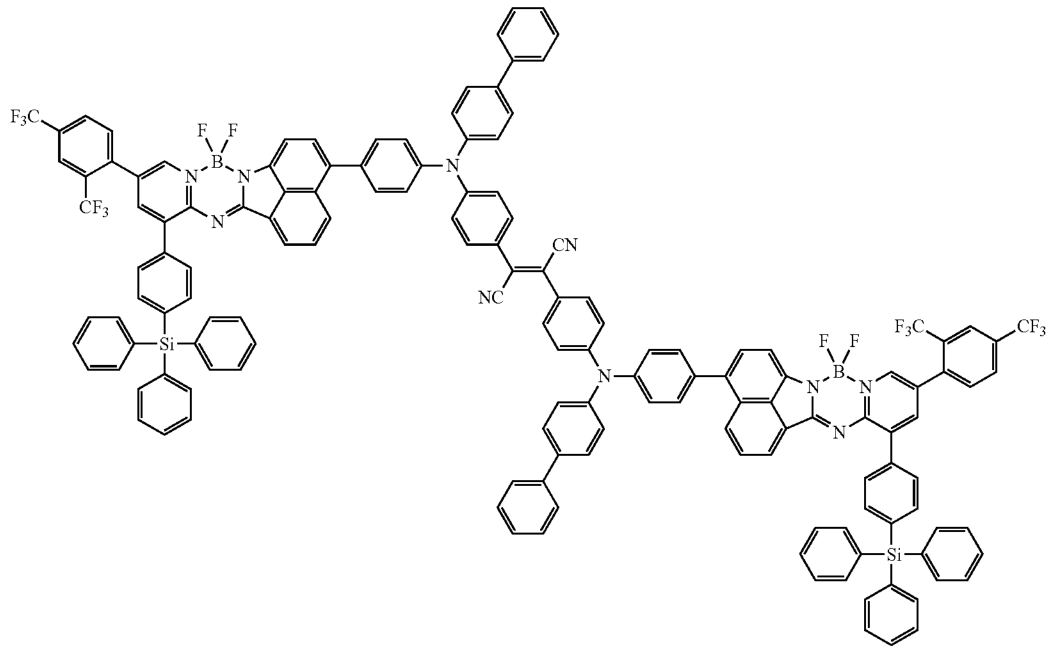
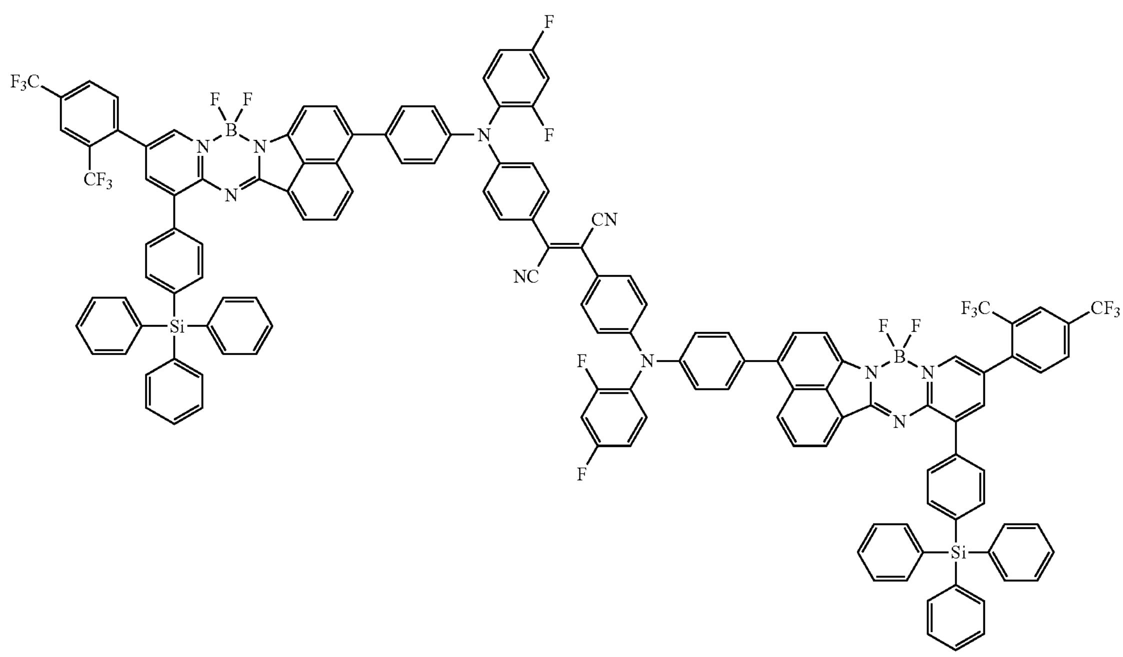

-continued
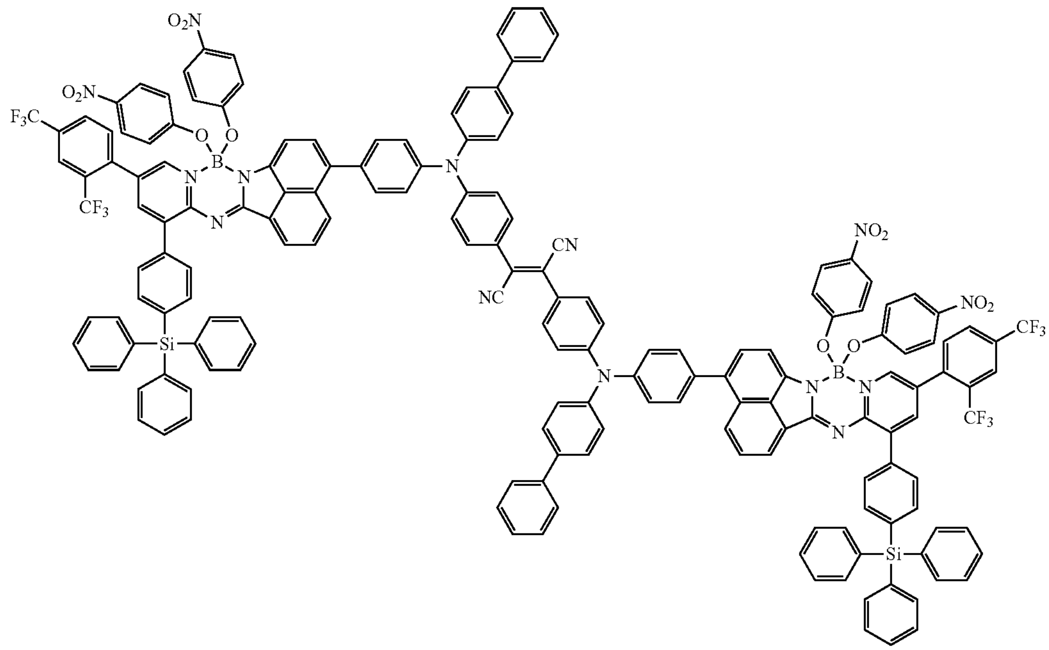
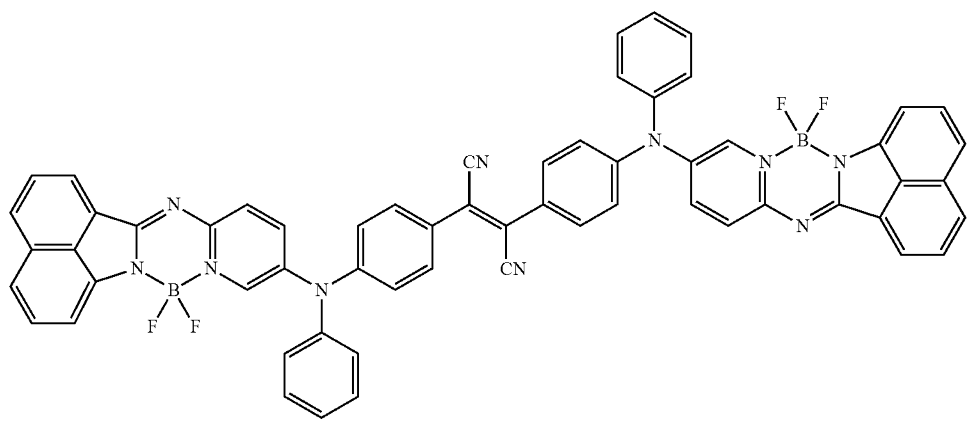
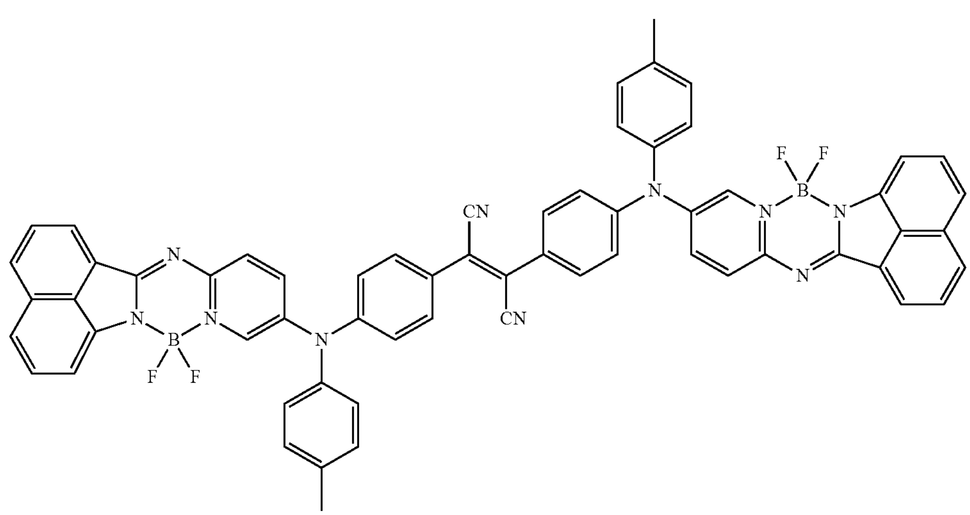

-continued
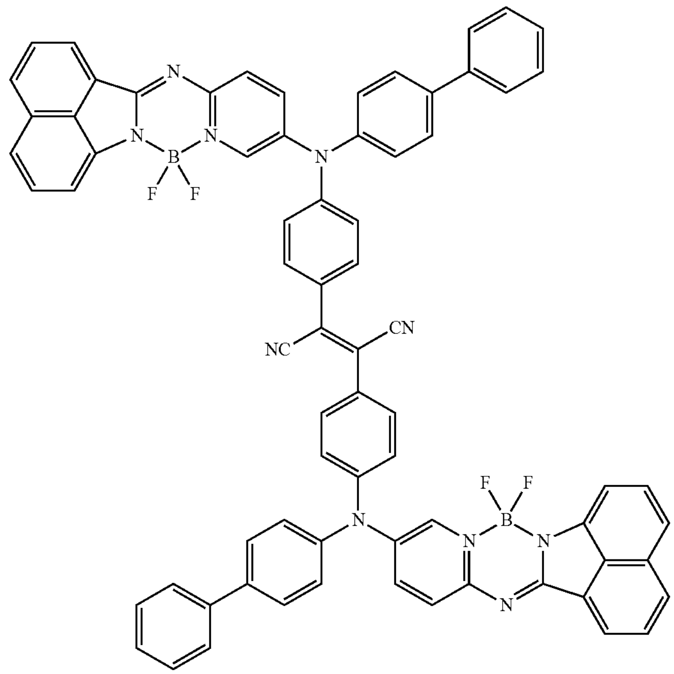
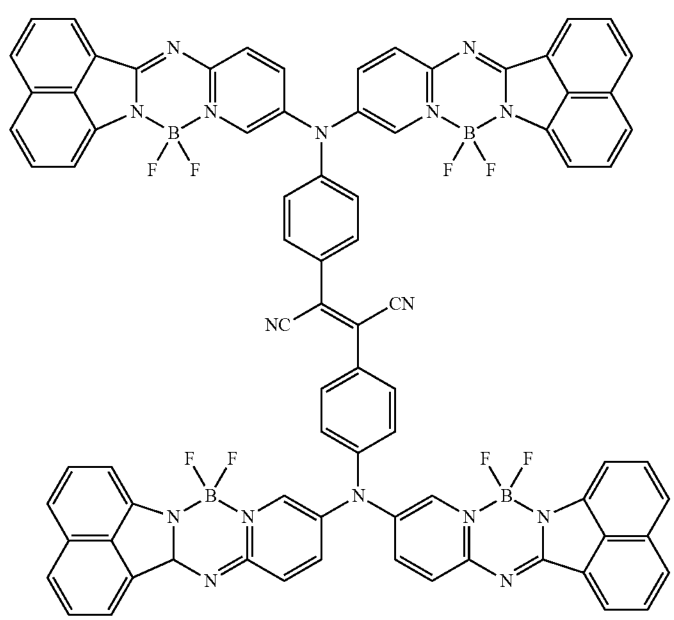

-continued
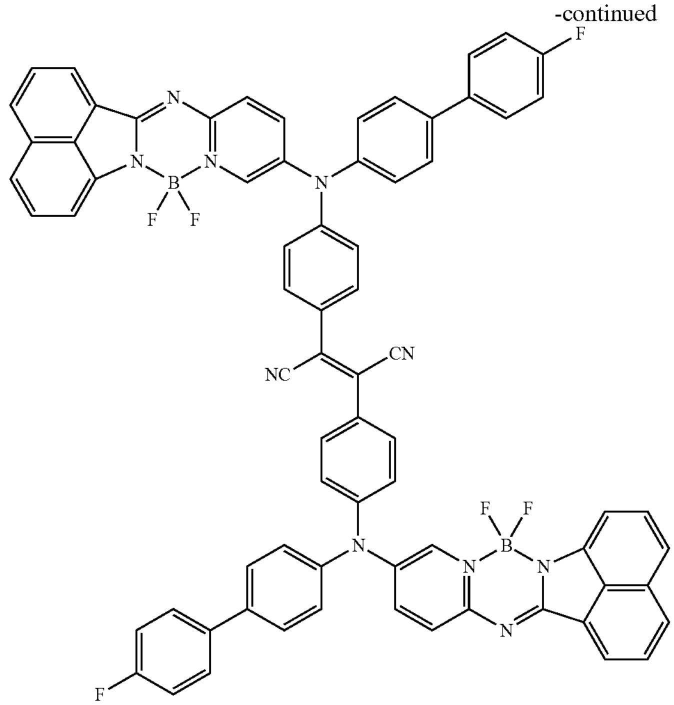
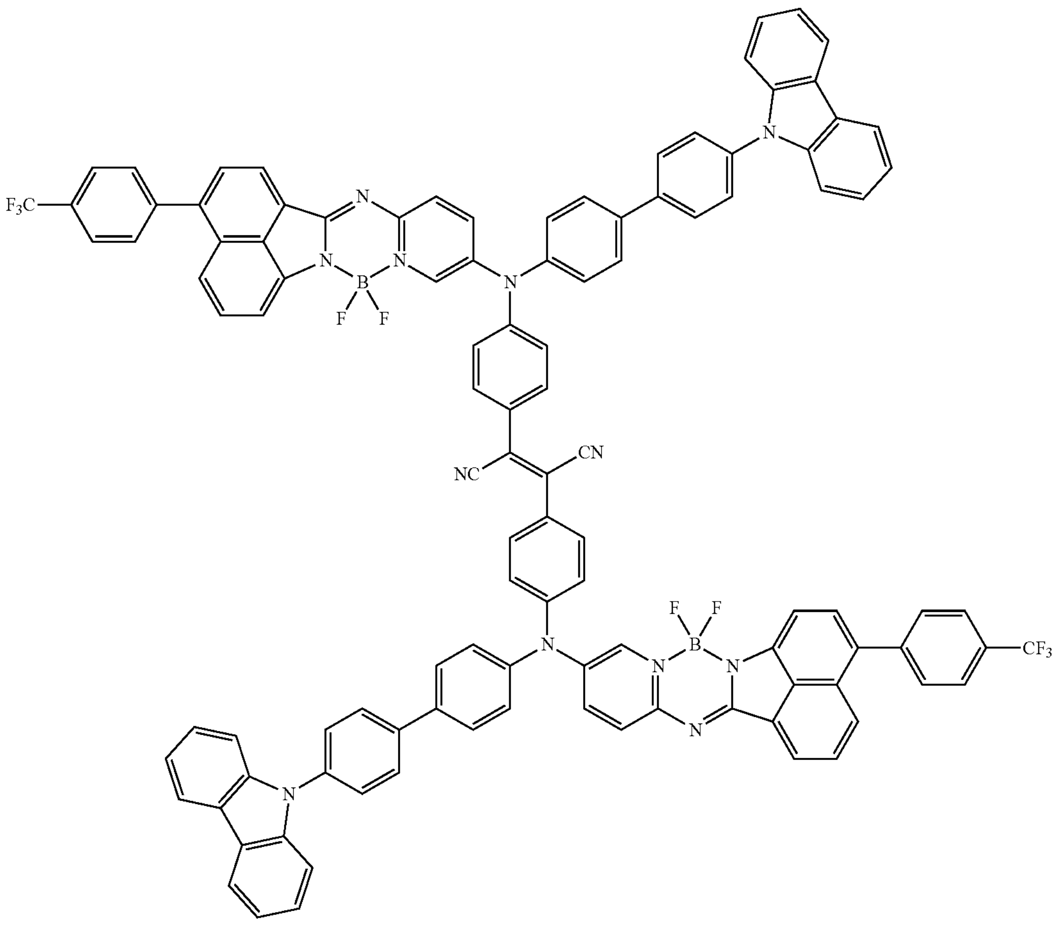

-continued
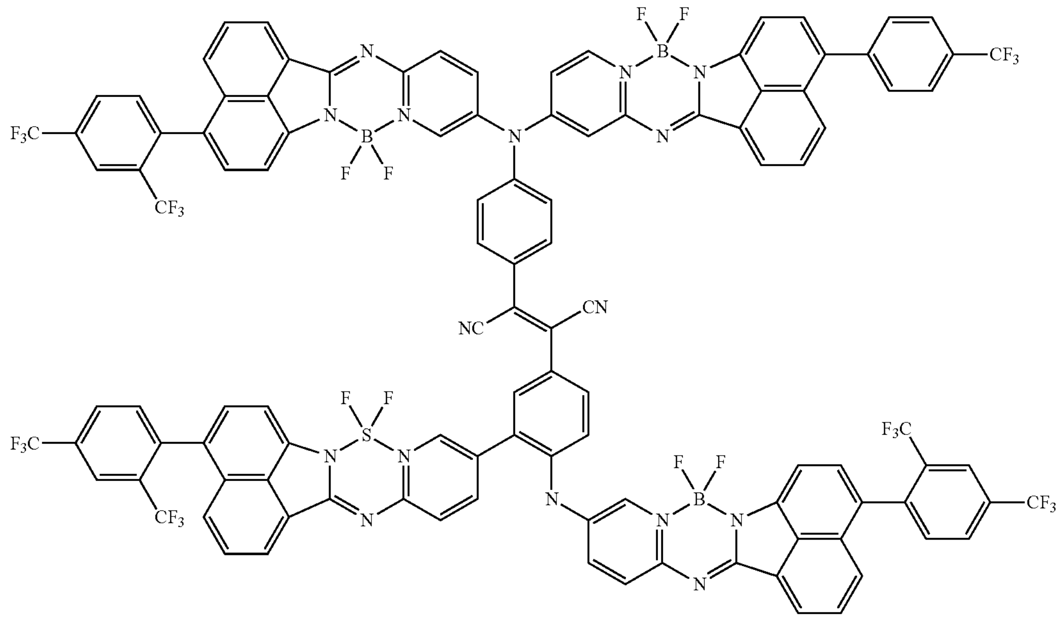
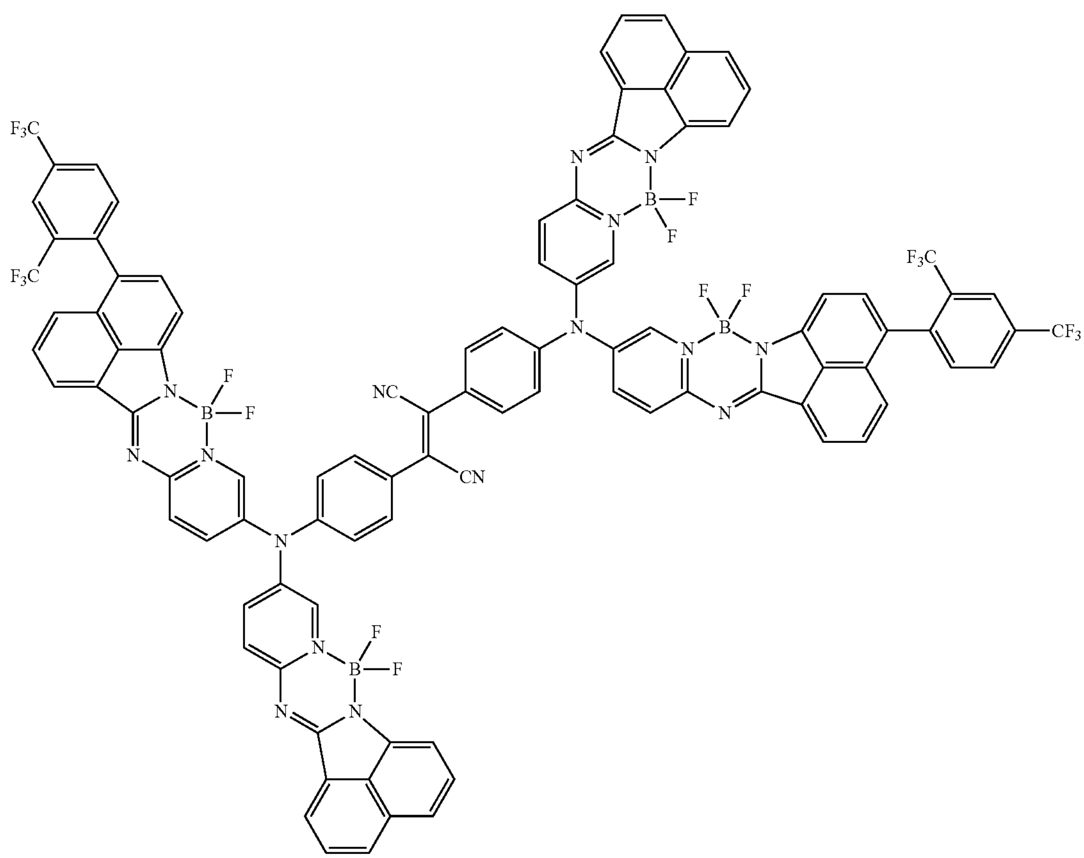

-continued
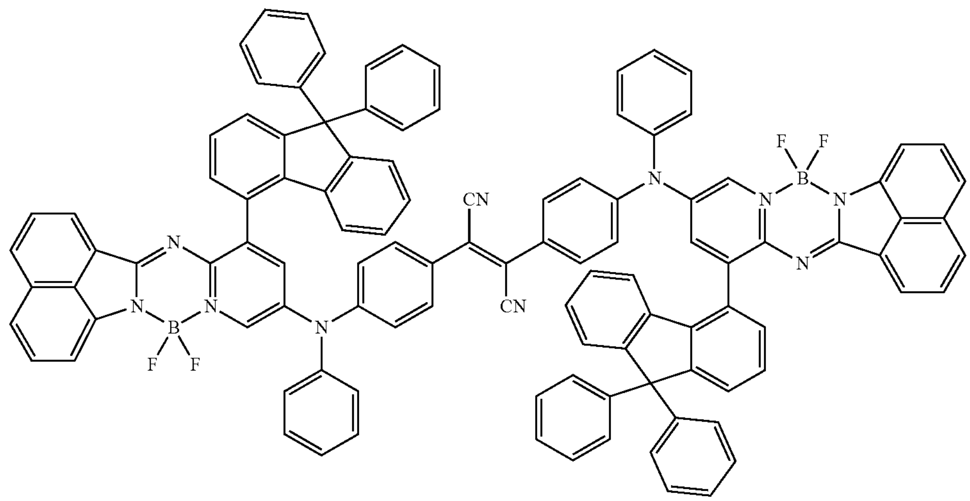
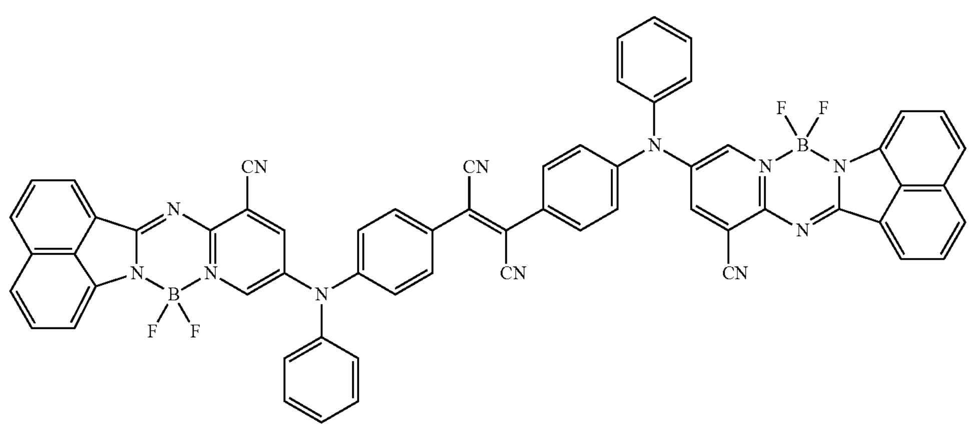

-continued
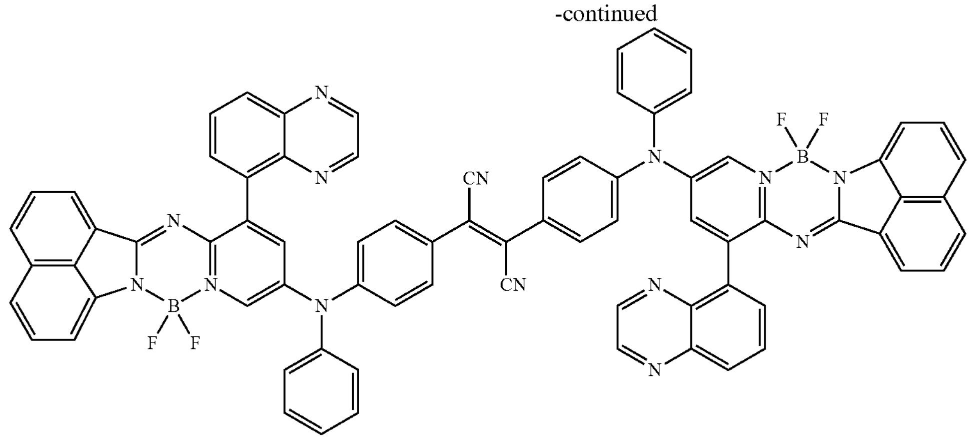
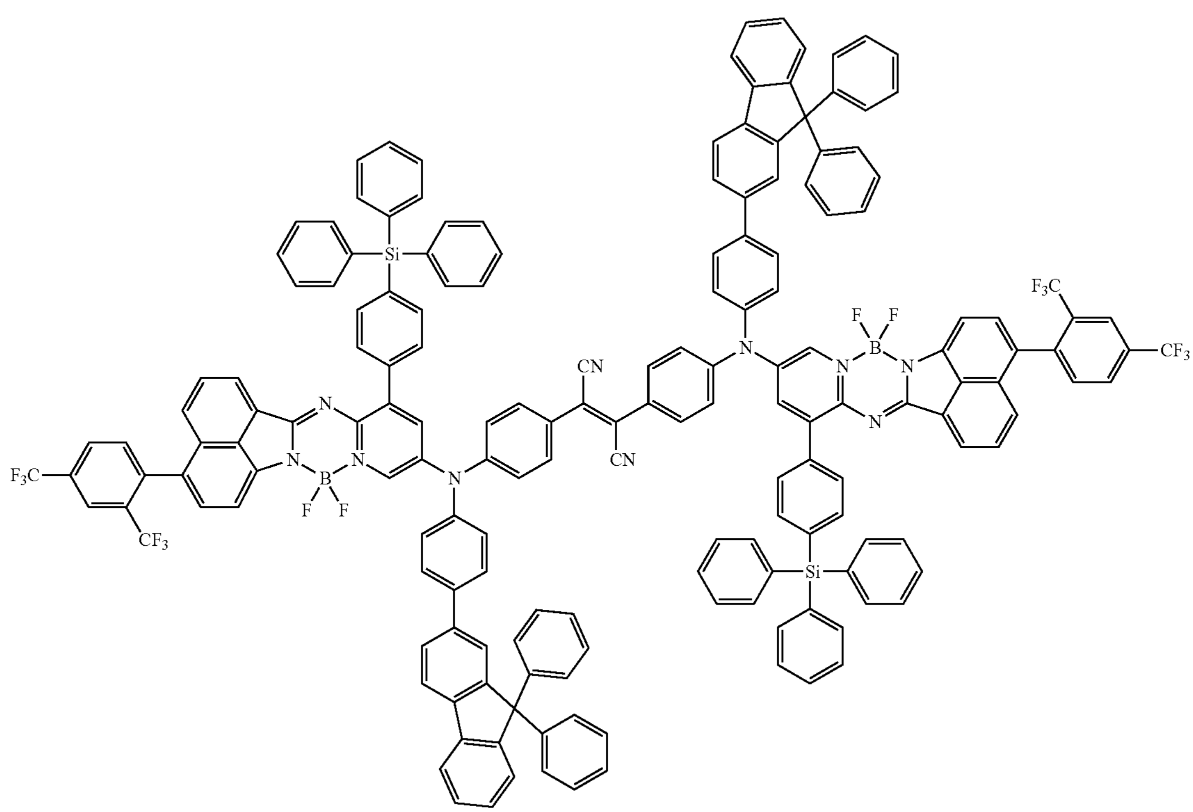

-continued
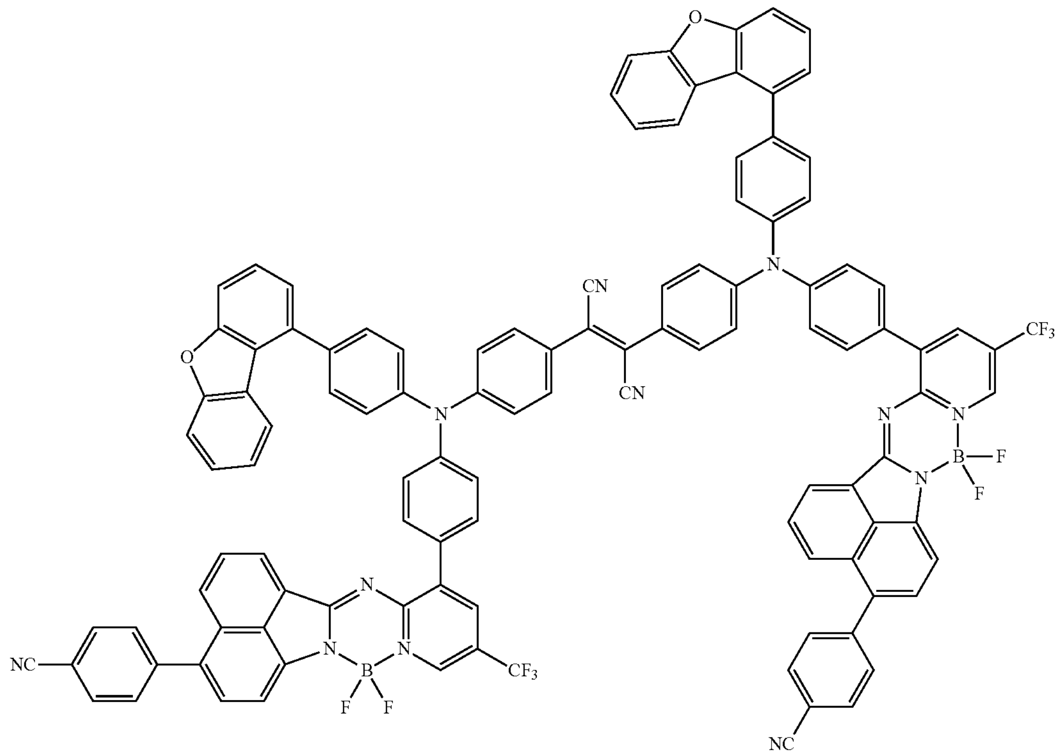
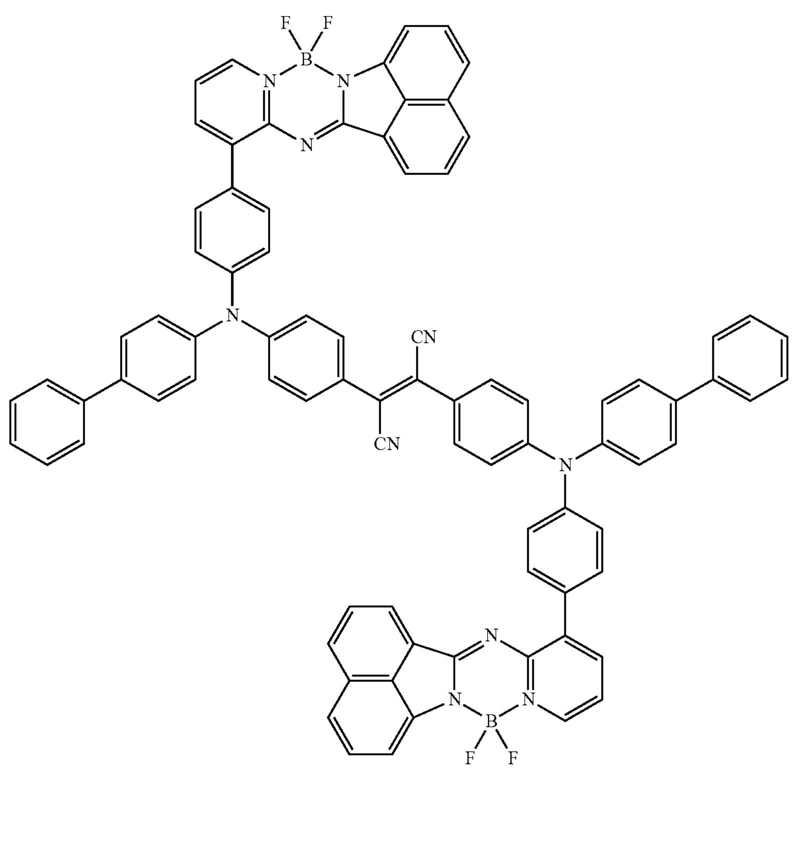

-continued
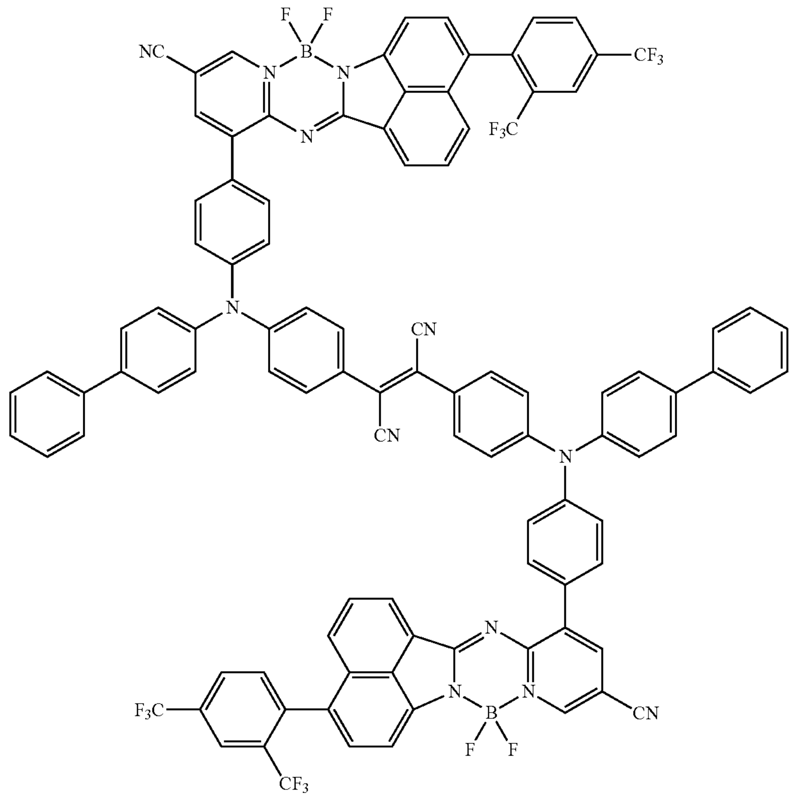
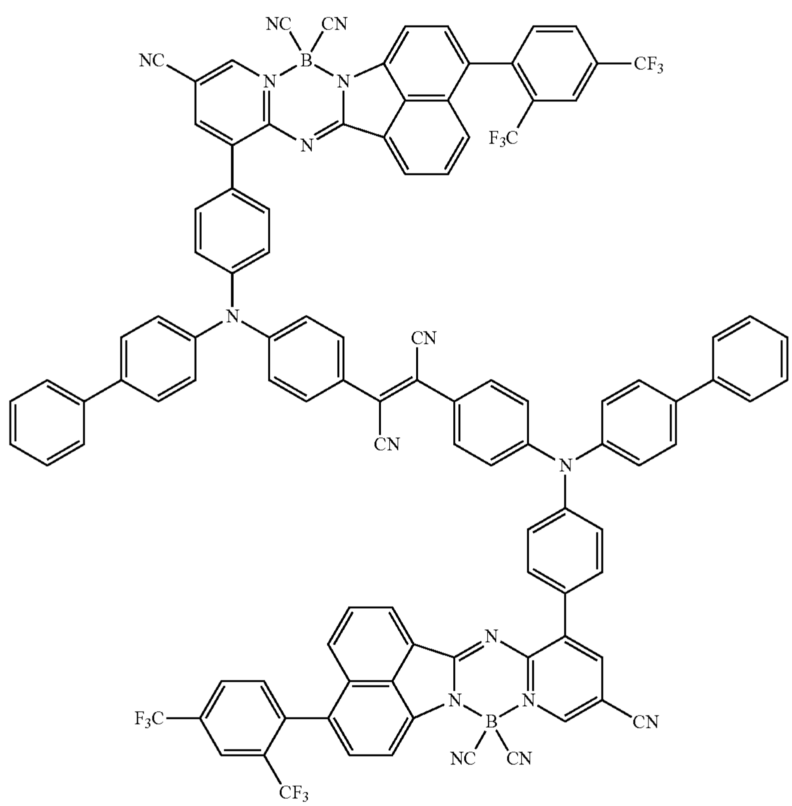

-continued
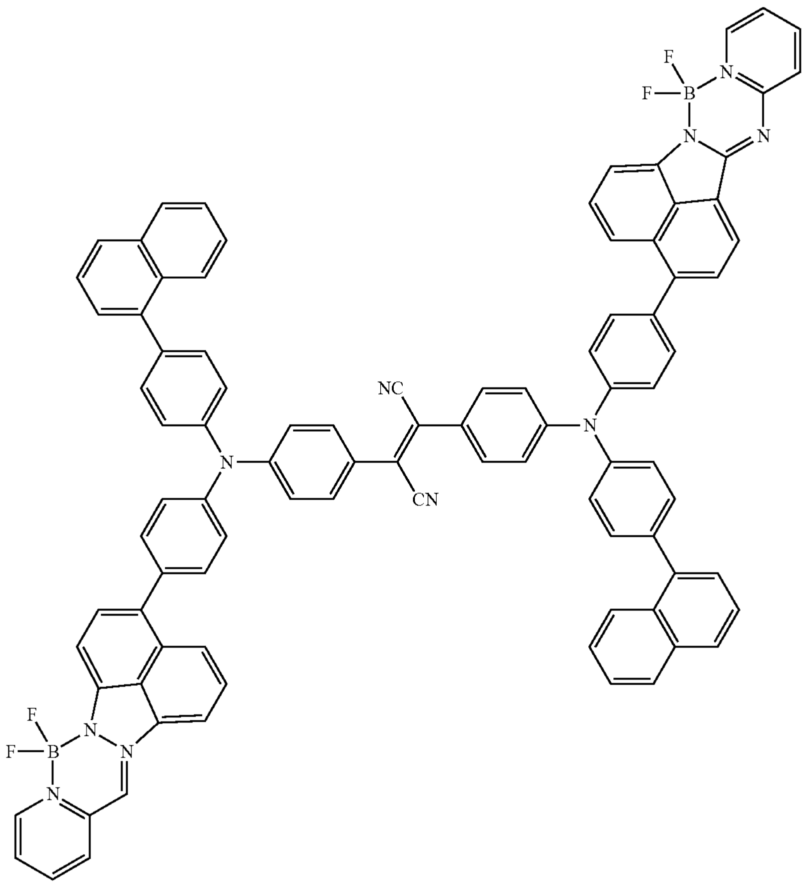

-continued
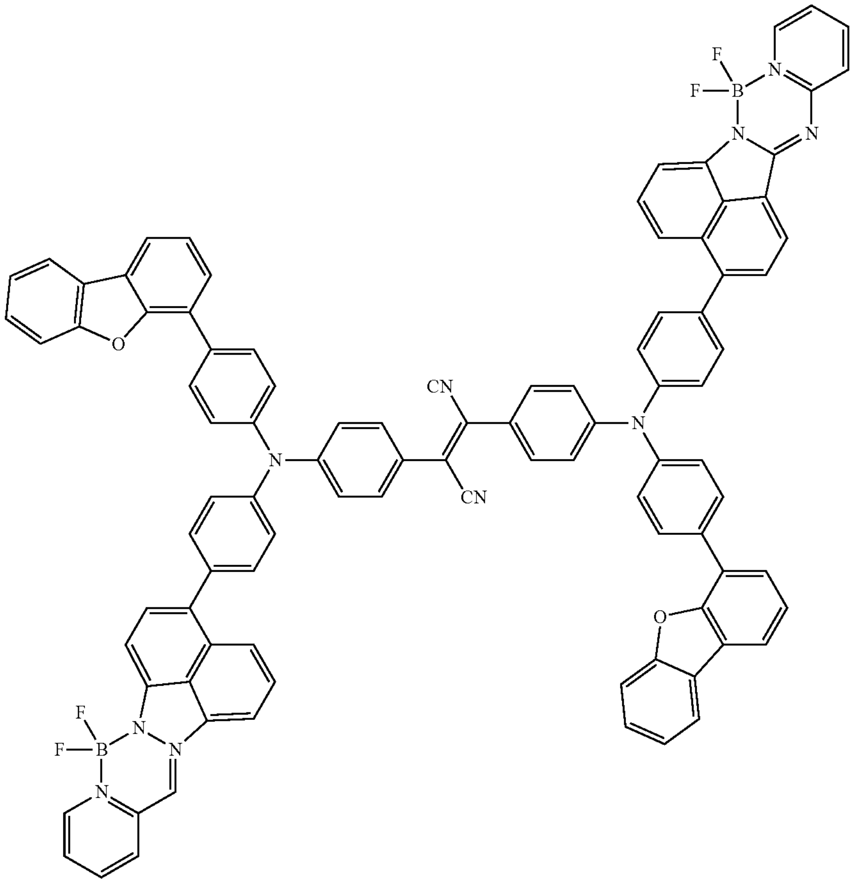

-continued
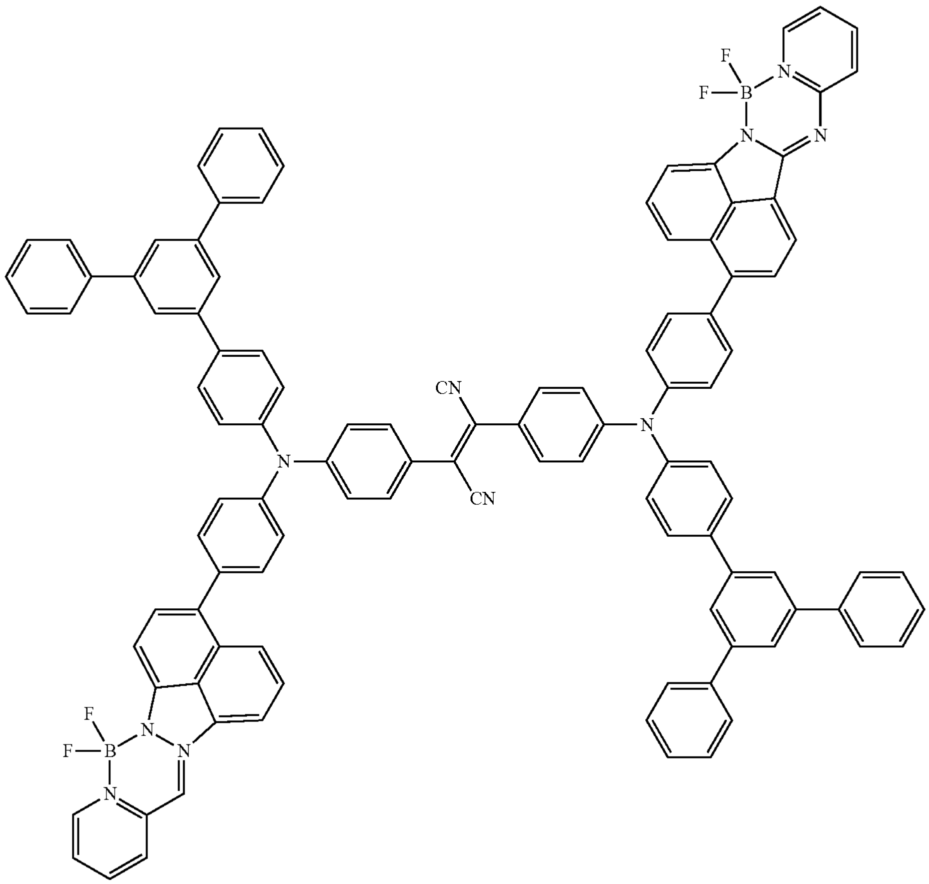
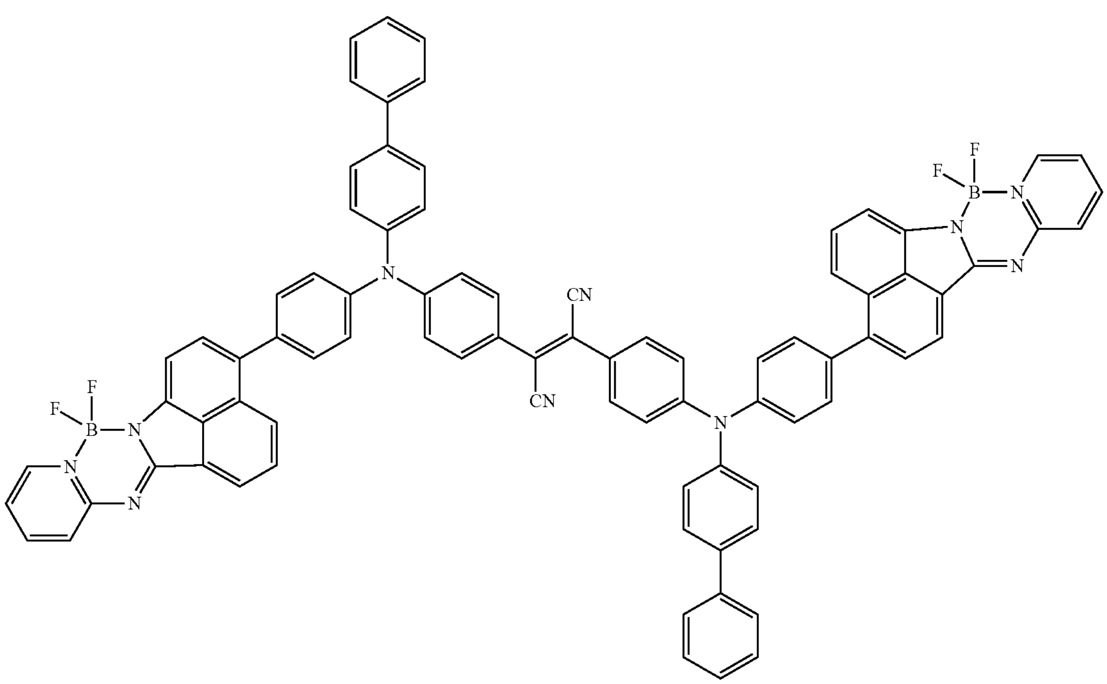

-continued
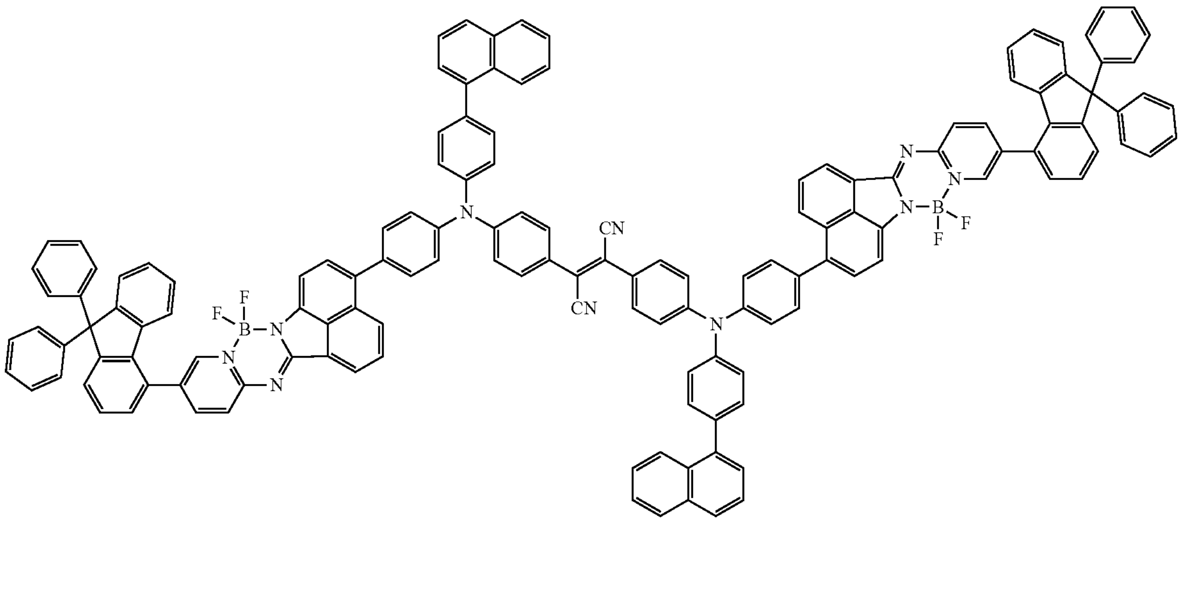
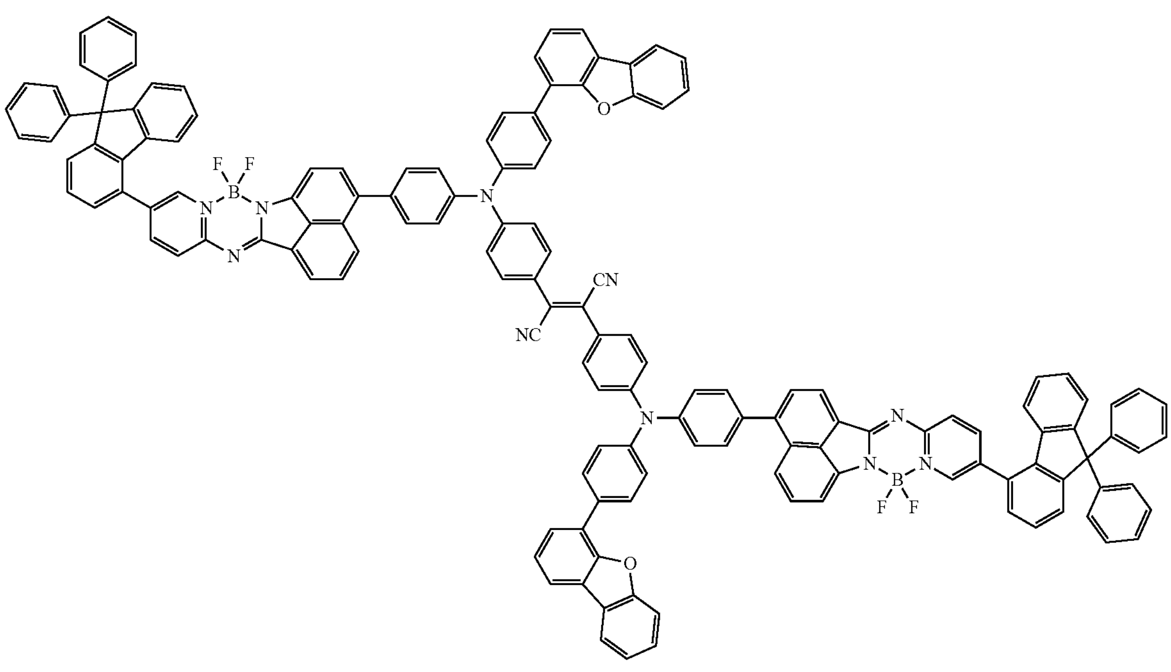

-continued
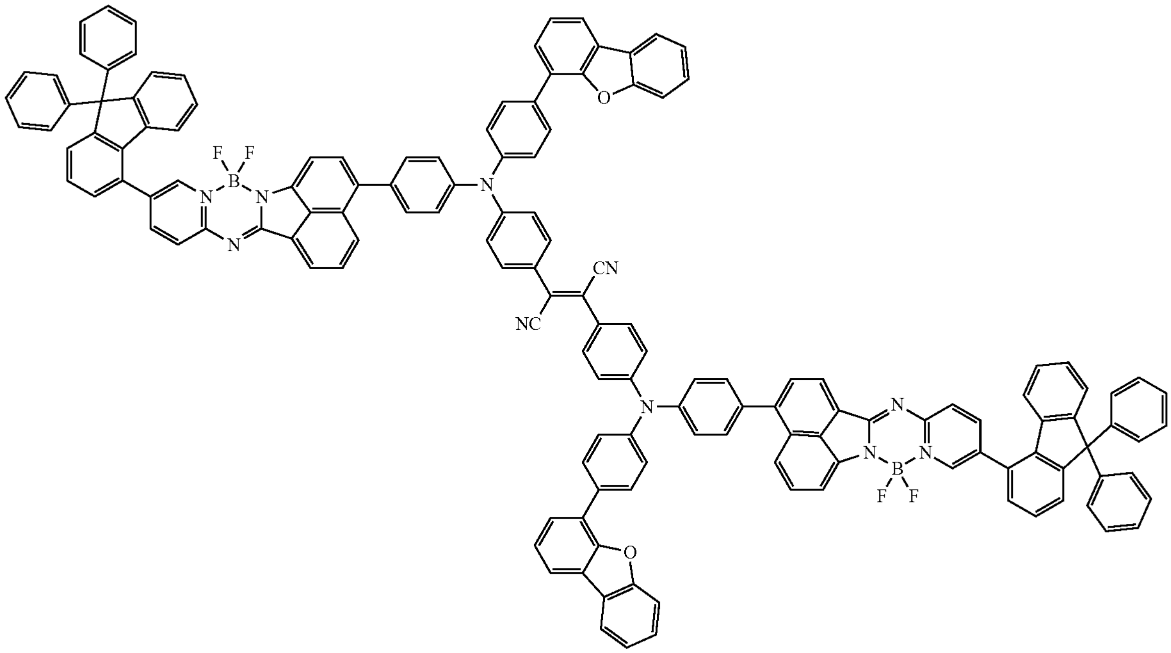
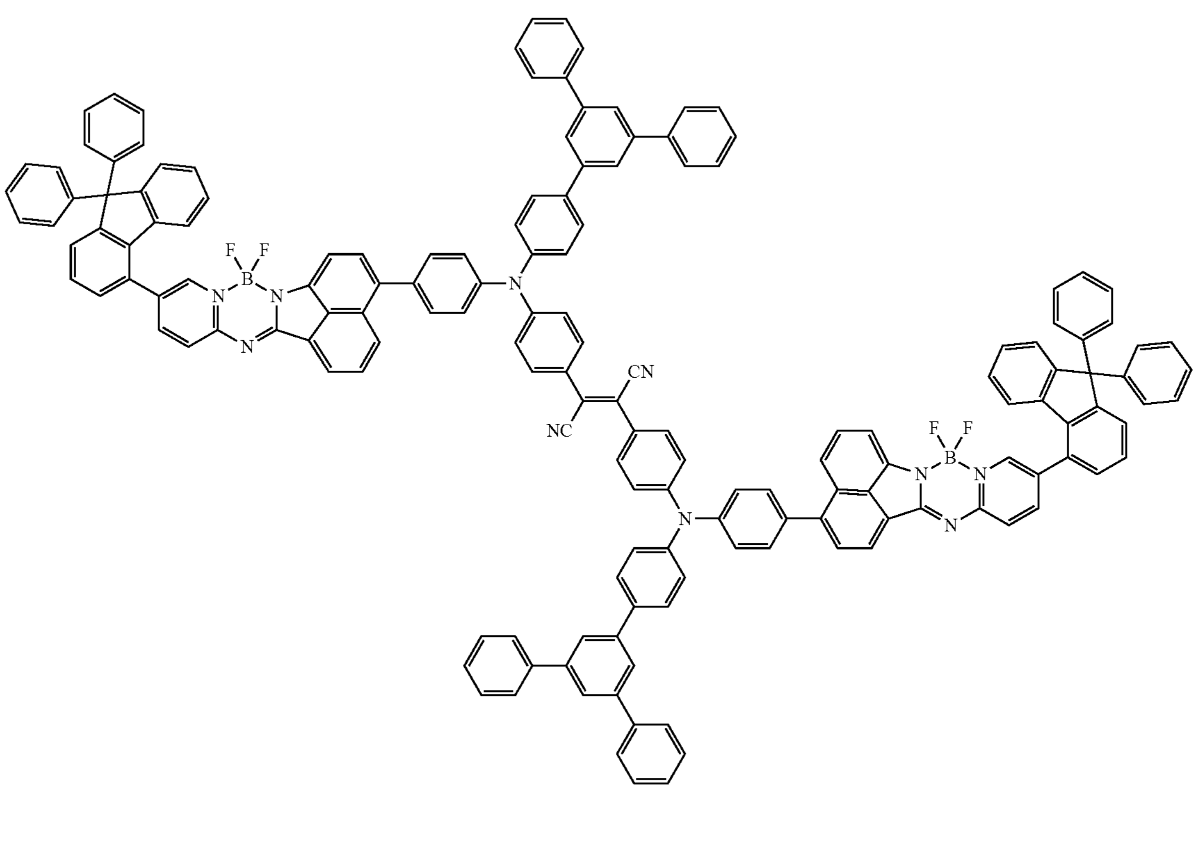

-continued
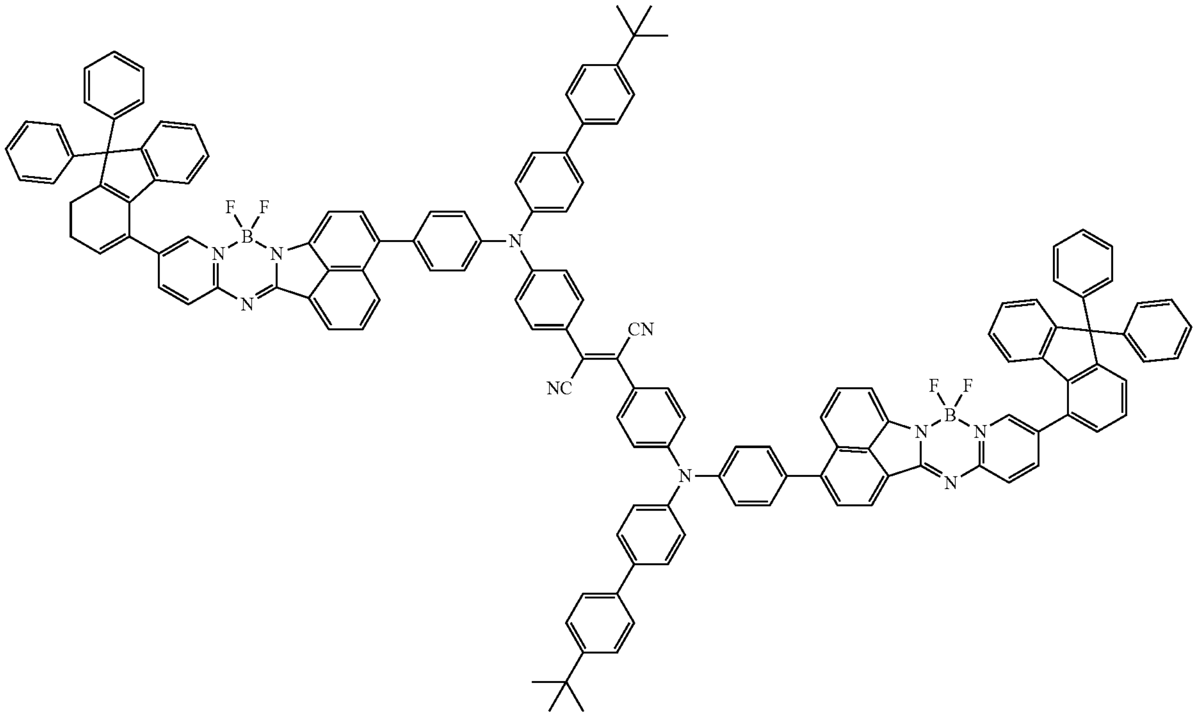
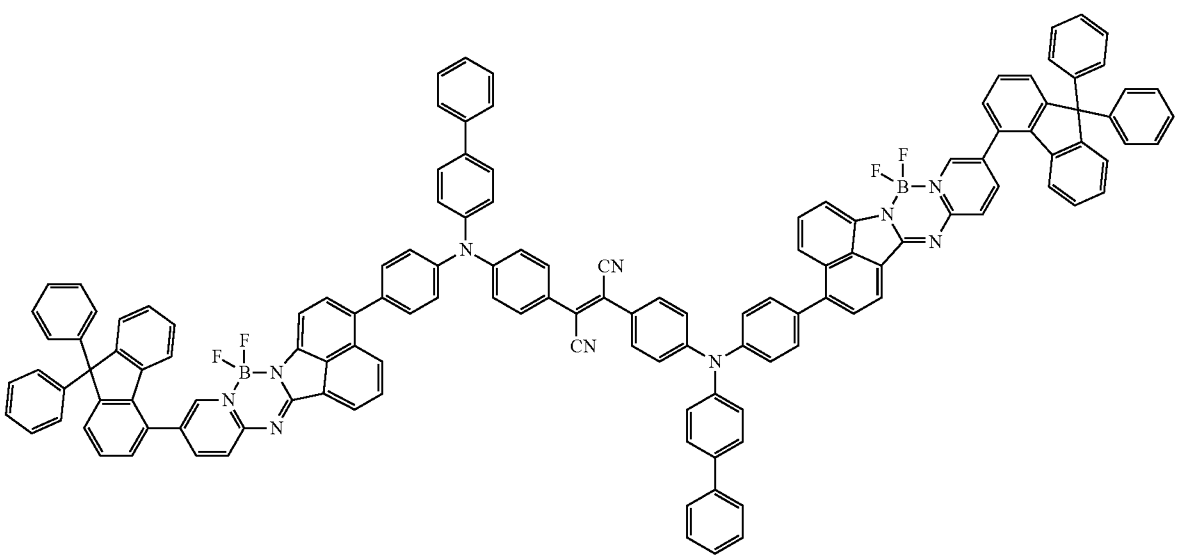

-continued
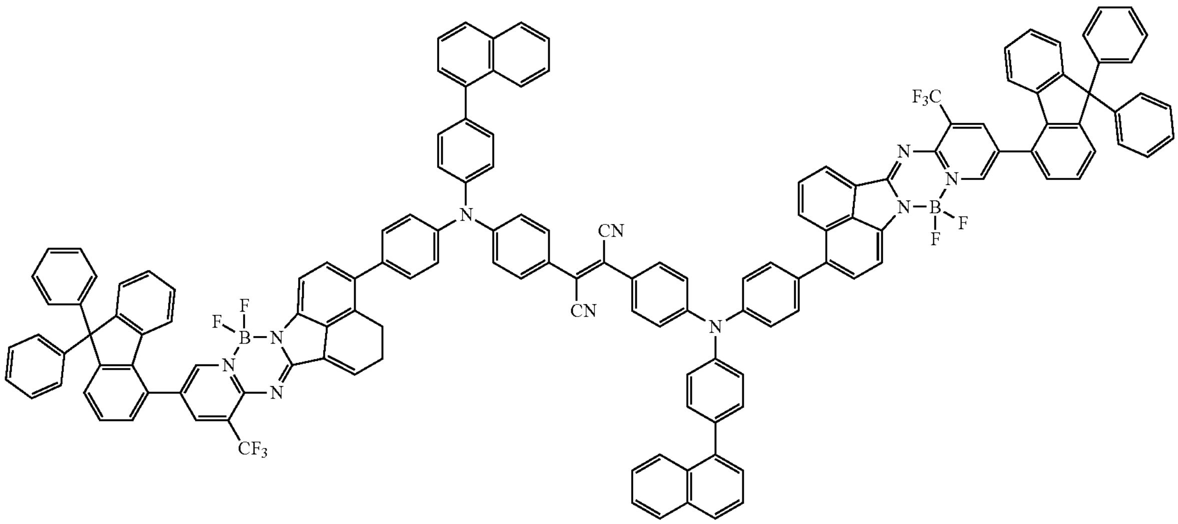
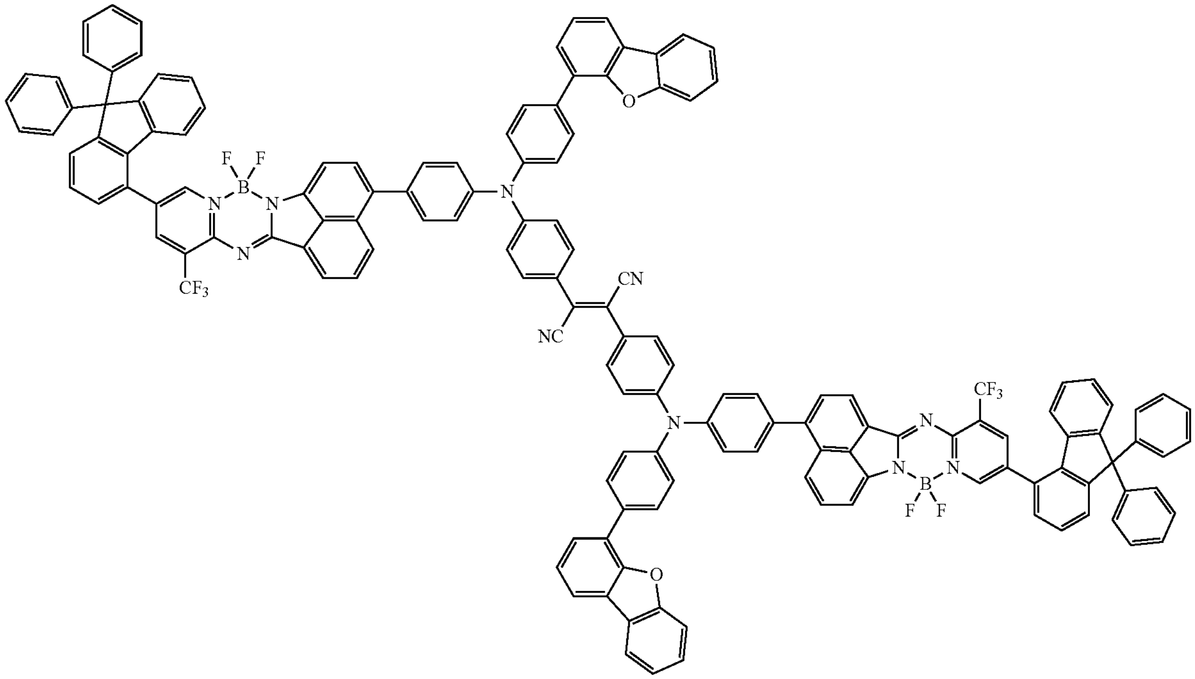

-continued
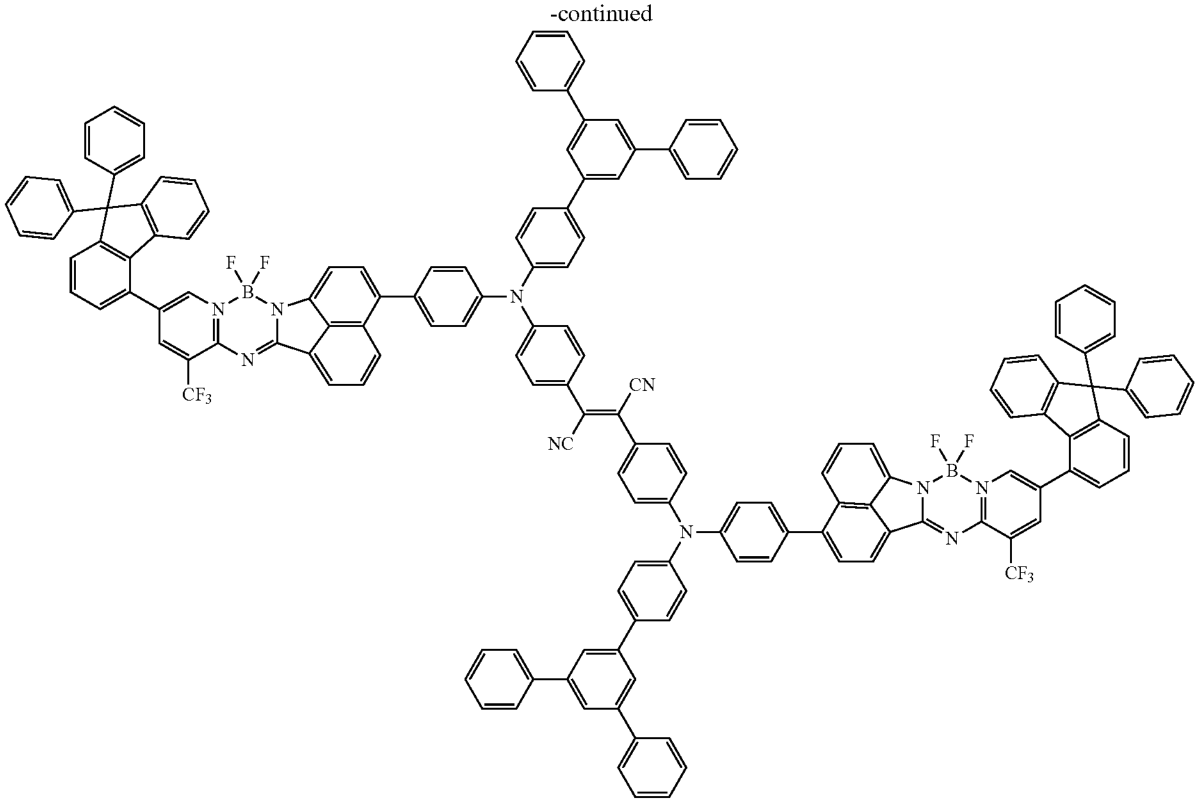
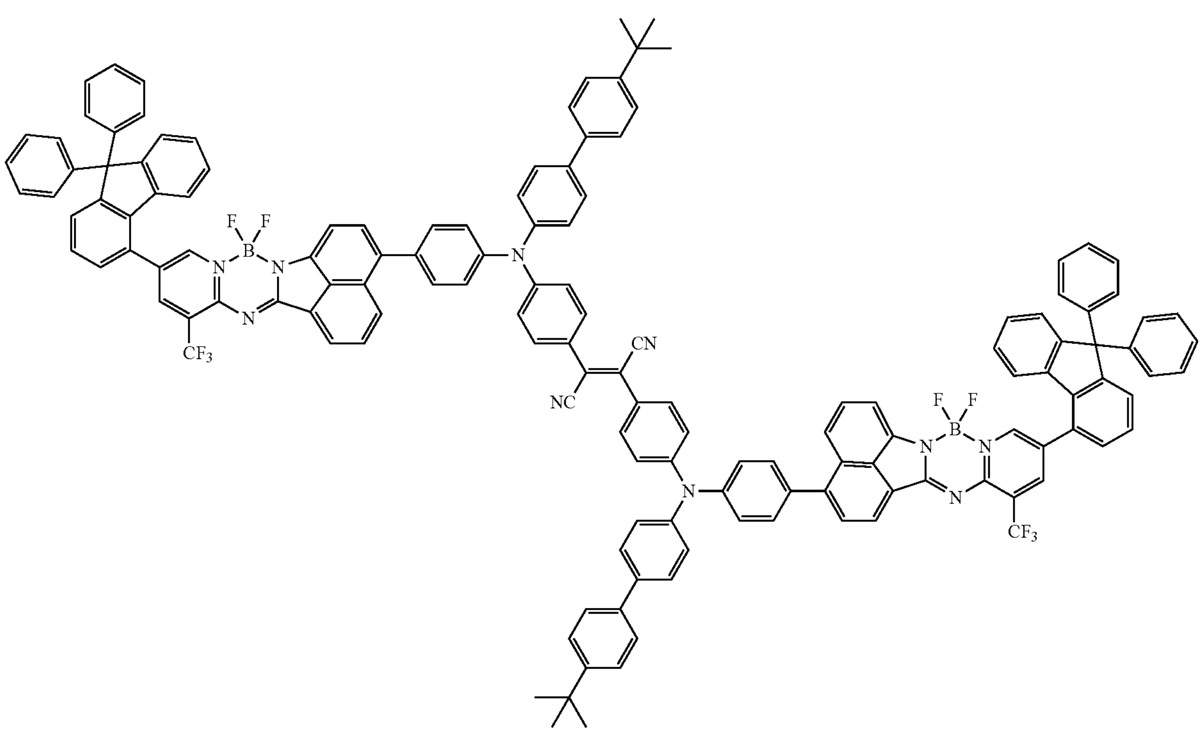

-continued
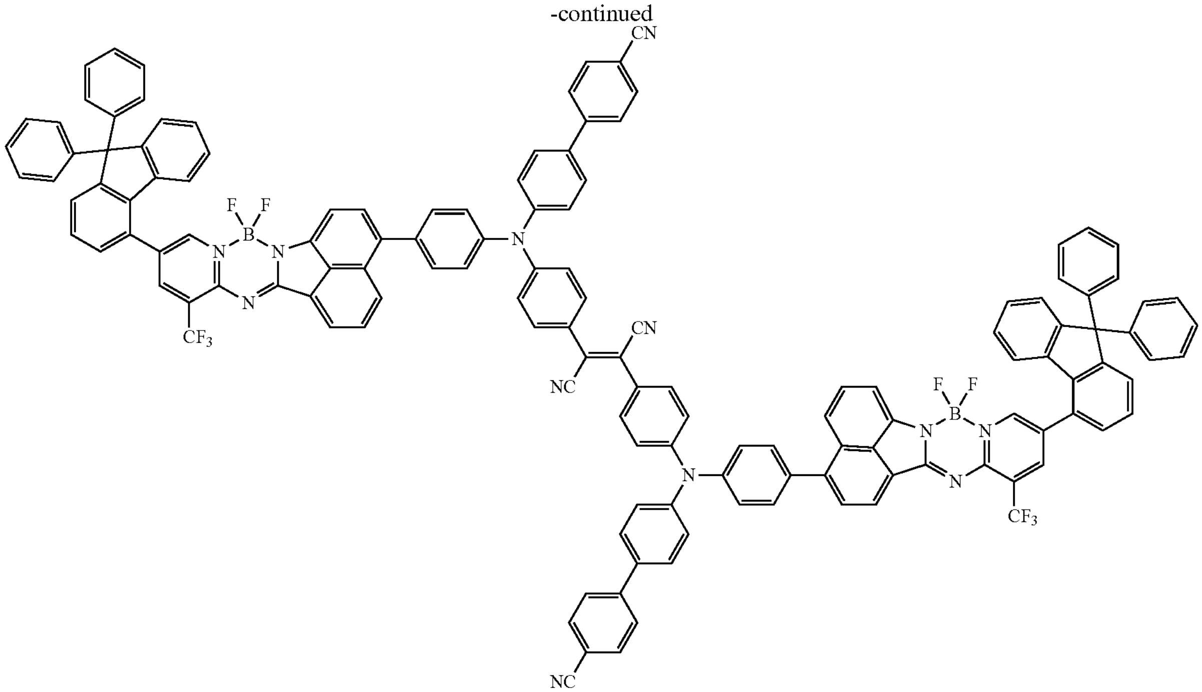
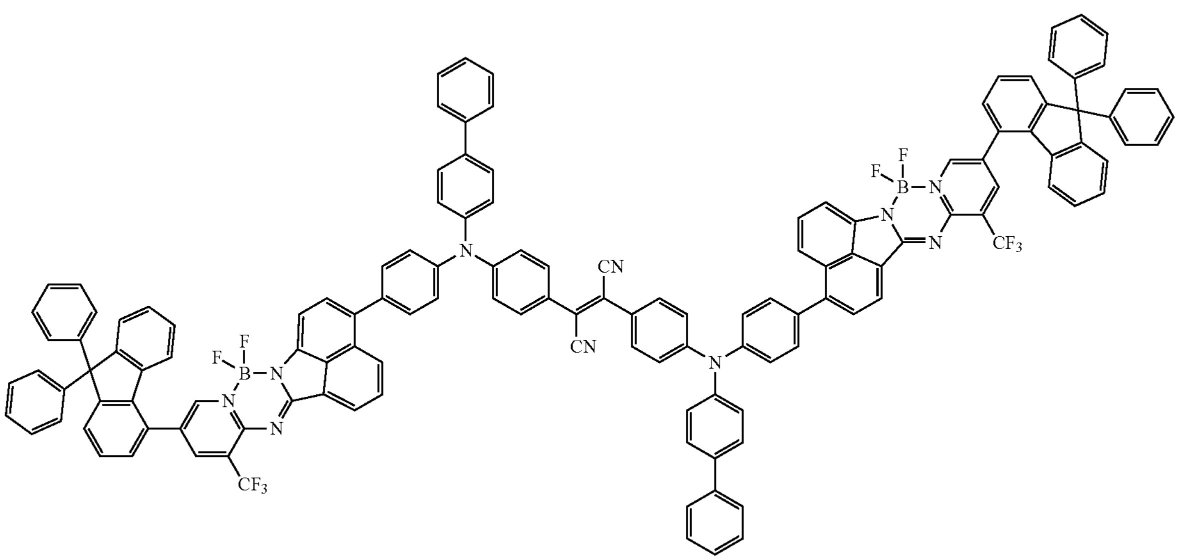

-continued
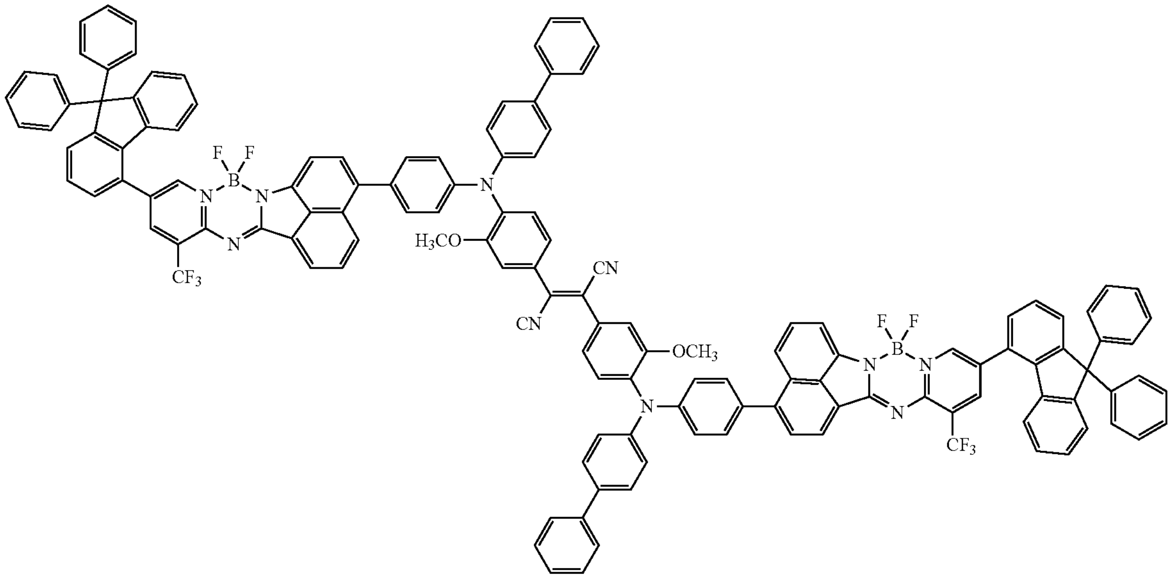
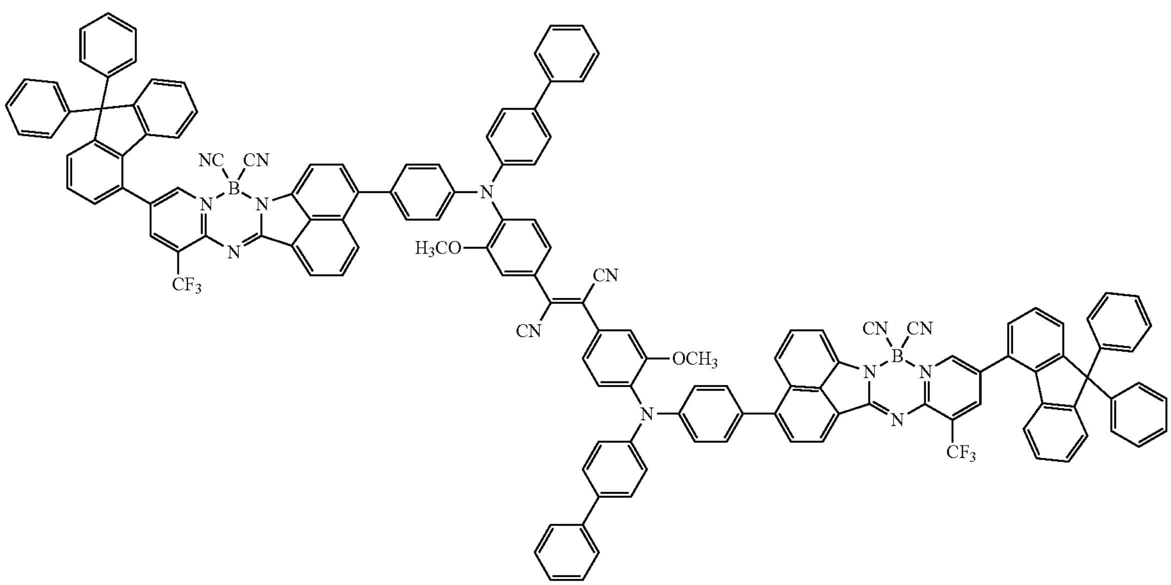

-continued
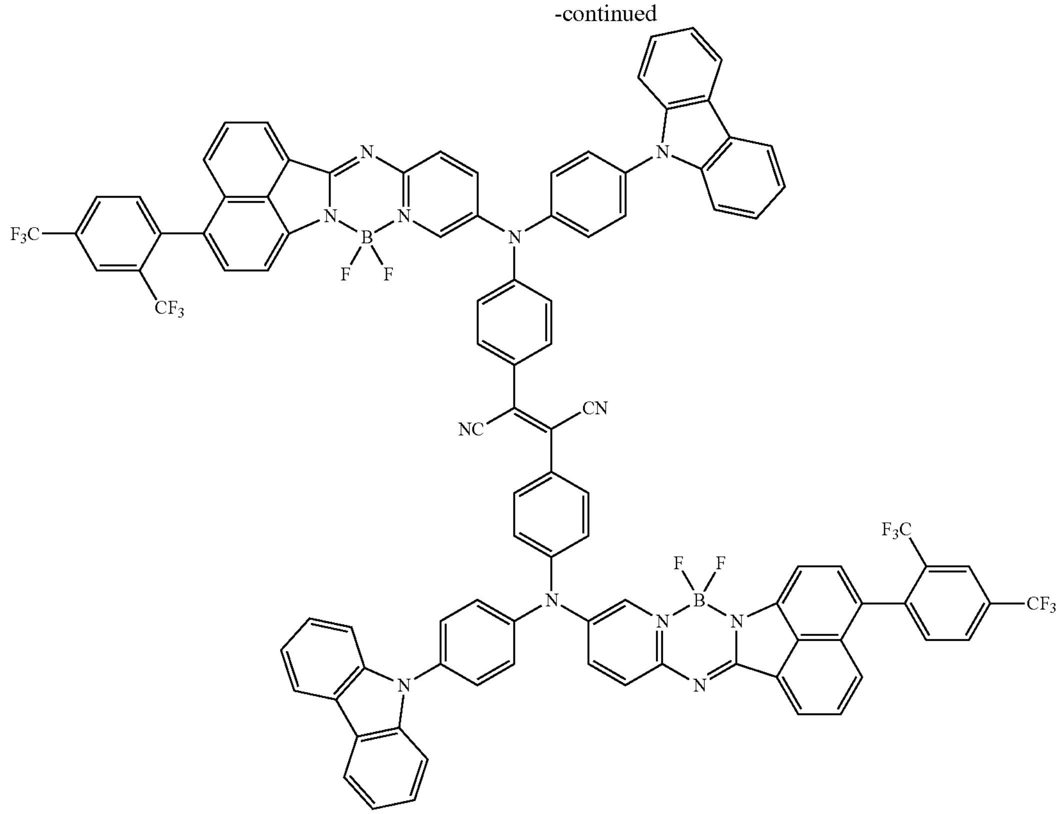
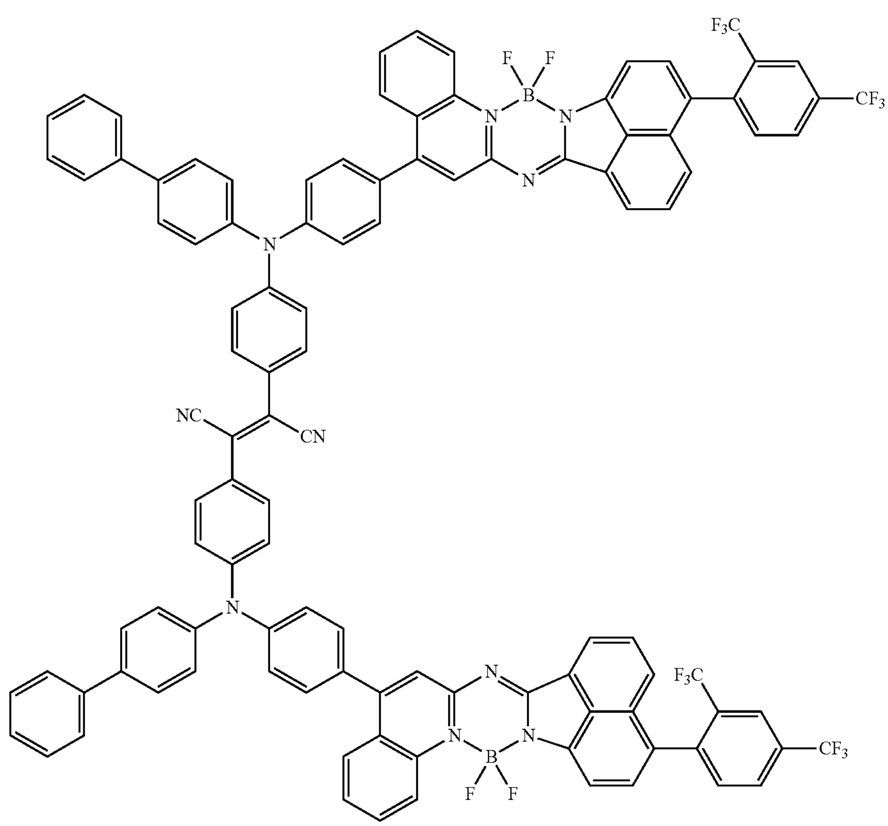

The compound according to one embodiment of the present application may be prepared using preparation methods to describe below.

For example, the compound of Chemical Formula 1 may have its core structure prepared as in the following Reaction Formula 1. Substituents may bond using methods known in the art, and types, positions or the number of the substituents may vary depending on technologies known in the art.

[Reaction Formula 1]

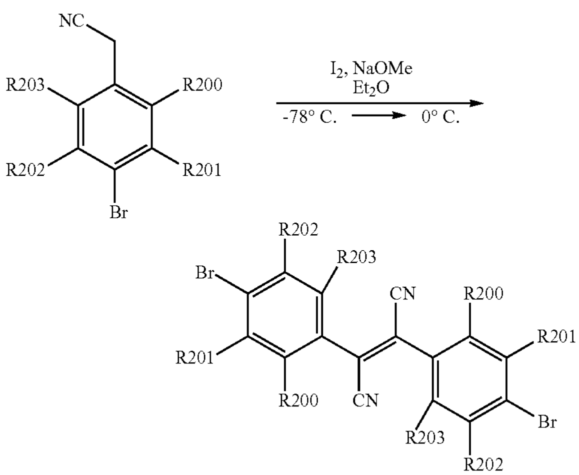

A bromophenylacetonitrile derivative (1 equivalent) and iodine (1 equivalent) are diluted in a diethyl ether solvent, and the result is stirred for 30 minutes at −78° C. under nitrogen. After the temperature is stabilized, sodium methoxide (2 equivalent) is diluted in a diethyl ether solvent, and the result was added dropwise to the solution prepared above. The reaction temperature is raised to 0° C., and the mixture is stirred for 5 hours under nitrogen. After the reaction is completed, hydrochloric acid is added thereto, the result is further stirred for 2 hours, and produced white solids are obtained through vacuum filtration. Herein, the obtained product is neutralized by washing with methanol.

The compound of Chemical Formula 1 of the present disclosure may be prepared by using a derivative such as bromonaphthalenyl acetate nitrile or bromoanthracenyl acetate nitrile instead of the bromophenylacetonitrile derivative of the above-described reaction formula, or by substituting R200 to R204, substituents of the bromophenylacetonitrile, and types, positions or the number of the substituents may vary depending on technologies known in the art.

Specifically, the compound of the present disclosure may be obtained by substituting the Br position of the compound obtained through Reaction Formula 1 with an aza-bodipy-substituted amine compound, and the compound of the present disclosure may be prepared by using a Br position in the bromophenylacetonitrile of Reaction Formula 1, or a compound having other linkers instead of phenyl.

One embodiment of the present specification provides a color conversion film including a resin matrix; and the compound represented by Chemical Formula 1 dispersed into the resin matrix.

The content of the compound represented by Chemical Formula 1 in the color conversion film may be in a range of 0.001% by weight to 10% by weight.

The color conversion film may include one type of the compound represented by Chemical Formula 1, or may include two or more types thereof.

The color conversion film may further include additional fluorescent substances in addition to the compound represented by Chemical Formula 1. When using a light source emitting blue light, the color conversion film preferably includes both a green light emitting fluorescent substance and a red light emitting fluorescent substance. In addition, when using a light source emitting blue light and green light, the color conversion film may only include a red light emitting fluorescent substance. However, the color conversion film is not limited thereto, and even when using a light source emitting blue light, the color conversion film may only include a red light emitting compound when a separate film including a green light emitting fluorescent substance is laminated. On the other hand, even when using a light source emitting blue light, the color conversion film may only include a green light emitting compound when a separate film including a red light emitting fluorescent substance is laminated.

The color conversion film may further include a resin matrix; and an additional layer including a compound dispersed into the resin matrix and emitting light in a wavelength different from the wavelength of the compound represented by Chemical Formula 1. The compound emitting light in a wavelength different from the wavelength of the compound represented by Chemical Formula 1 may also be the compound represented by Chemical Formula 1, or may be other known fluorescent materials.

The resin matrix material is preferably a thermoplastic polymer or a thermocurable polymer. Specifically, a poly (meth)acryl-based such as polymethyl methacrylate (PMMA), a polycarbonate (PC)-based, a polystyrene (PS)-based, a polyarylene (PAR)-based, a polyurethane (TPU)-based, a styrene-acrylonitrile (SAN)-based, a polyvinylidene fluoride (PVDF)-based, a modified polyvinylidene fluoride (modified-PVDF)-based and the like may be used as the resin matrix material.

According to one embodiment of the present specification, the color conversion film according to the embodiments described above additionally includes light diffusing particles. By dispersing light diffusing particles into the color conversion film instead of a light diffusing film used in the art for enhancing luminance, higher luminance may be exhibited compared to using a separate light diffusing film, and an adhering process may be skipped as well.

As the light diffusing particles, particles having a high refractive index with the resin matrix may be used, and examples thereof may include $TiO_2$, silica, borosilicate, alumina, sapphire, air or other gases, air- or gas-filled hollow beads or particles (for example, air/gas-filled glass or polymers); polystyrene, polycarbonate, polymethyl methacrylate, acryl, methyl methacrylate, styrene, melamine resin, formaldehyde resin, or polymer particles including melamine and formaldehyde resins, or any suitable combination thereof.

The light diffusing particles may have particle diameters in a range of 0.1 micrometers to 5 micrometers, for example, in a range of 0.3 micrometers to 1 micrometer. The content of the light diffusing particles may be determined as necessary, and for example, may be in a range of approximately 1 part by weight to 30 parts by weight based on 100 parts by weight of the resin matrix.

The color conversion film according to the embodiments described above may have a thickness of 2 micrometers to 200 micrometers. Particularly, the color conversion film may exhibit high luminance even with a small thickness of 2 micrometers to 20 micrometers. This is due to the fact that the content of the fluorescent substance molecules included in the unit volume is higher compared to quantum dots.

The color conversion film according to the embodiments described above may have a substrate provided on one surface. This substrate may function as a support when preparing the color conversion film. Types of the substrate are not particularly limited, and the material or thickness is not limited as long as it is transparent and is capable of functioning as the support. Herein, being transparent means having visible light transmittance of 70% or higher. For example, a PET film may be used as the substrate.

The color conversion film described above may be prepared by coating a resin solution in which the compound represented by Chemical Formula 1 described above is dissolved on a substrate and drying the result, or by extruding and filming the compound represented by Chemical Formula 1 described above together with a resin.

The compound represented by Chemical Formula 1 is dissolved in the resin solution, and therefore, the compound represented by Chemical Formula 1 is uniformly distributed in the solution. This is different from a quantum dot film preparation process that requires a separate dispersion process.

As for the resin solution in which the compound represented by Chemical Formula 1 is dissolved, the preparation method is not particularly limited as long as the compound represented by Chemical Formula 1 and the resin described above are dissolved in the solution.

According to one example, the resin solution in which the compound represented by Chemical Formula 1 is dissolved may be prepared using a method of preparing a first solution by dissolving the compound represented by Chemical Formula 1 in a solvent, preparing a second solution by dissolving a resin in a solvent, and mixing the first solution and the second solution. When mixing the first solution and the second solution, it is preferable that these be uniformly mixed. However, the method is not limited thereto, and a method of simultaneously adding and dissolving the compound represented by Chemical Formula 1 and a resin in a solvent, a method of dissolving the compound represented by Chemical Formula 1 in a solvent and subsequently adding and dissolving a resin, a method of dissolving a resin in a solvent and then subsequently adding and dissolving the compound represented by Chemical Formula 1, and the like, may be used.

As the resin included in the solution, the resin matrix material described above, a monomer curable to this resin matrix resin, or a mixture thereof, may be used. For example, the monomer curable to the resin matrix resin includes a (meth)acryl-based monomer, and this may be formed to a resin matrix material by UV curing. When using such a curable monomer, an initiator required for curing may be further added as necessary.

The solvent is not particularly limited as long as it is capable of being removed by drying afterword while having no adverse effects on the coating process. Non-limiting examples of the solvent may include toluene, xylene, acetone, chloroform, various alcohol-based solvents, methylethyl ketone (MEK), methylisobutyl ketone (MIBK), ethyl acetate (EA), butyl acetate, dimethylformamide (DMF), dimethylacetamide (DMAc), dimethyl sulfoxide (DMSO), N-methyl-pyrrolidone (NMP) and the like, and one type or a mixture of two or more types may be used. When the first solution and the second solution are used, solvents included in each of the solutions may be the same as or different from each other. Even when different types of solvents are used in the first solution and the second solution, these solvents preferably have compatibility so as to be mixed with each other.

The process of coating the resin solution in which the compound represented by Chemical Formula 1 is dissolved on a substrate may use a roll-to-roll process. For example, a process of unwinding a substrate from a substrate-wound roll, coating the resin solution in which the compound represented by Chemical Formula 1 is dissolved on one surface of the substrate, drying the result, and then winding the result again on the roll may be used. When a roll-to-roll process is used, viscosity of the resin solution is preferably determined in a range capable of carrying out the process, and for example, may be determined in a range of 200 cps to 2,000 cps.

As the coating method, various known methods may be used, and for example, a die coater may be used, or various bar coating methods such as a comma coater and a reverse comma coater may be used.

After the coating, a drying process is carried out. The drying process may be carried out under a condition required to remove a solvent. For example, a color conversion film including a fluorescent substance including the compound represented by Chemical Formula 1 having target thickness and concentration may be obtained on a substrate by carrying out the drying in an oven located close to a coater under a condition to sufficiently evaporate a solvent, in a direction of the substrate progressing during the coating process.

When a monomer curable to the resin matrix resin is used as the resin included in the solution, curing, for example, UV curing, may be carried out prior to or at the same time as the drying.

When the compound represented by Chemical Formula 1 is filmed by being extruded with a resin, extrusion methods known in the art may be used, and for example, the color conversion film may be prepared by extruding the compound represented by Chemical Formula with a resin such as a polycarbonate (PC)-based, a poly(meth)acryl-based and a styrene-acrylonitrile (SAN)-based.

According to one embodiment of the present specification, the color conversion film may have a protective film or a barrier film provided on at least one surface. As the protective film or the barrier film, those known in the art may be used.

One embodiment of the present specification provides a backlight unit including the color conversion film described above. The backlight unit may have backlight unit constitutions known in the art except for including the color conversion film. FIG. 1 is a mimetic diagram of a backlight unit structure according to one embodiment. The backlight unit according to FIG. 1 includes a side chain-type light source (101), a reflecting plate (102) surrounding the light source, a light guide plate (103) either directly emitting light from the light source or inducing light reflected from the reflecting plate, a reflective layer (104) provided on one surface of the light guide plate, and a color conversion film (105) provided on a surface of the light guide plate opposite to a surface facing the reflecting plate. A part expressed as (106) in FIG. 1 is a light dispersion pattern of the light guide plate. Light entering into the light guide plate has non-uniform light distribution due to the repetition of optical processes such as reflection, total-reflection, refraction and transmission, and in order to induce this non-uniform light distribution to uniform brightness, a two-dimensional light dispersion pattern may be used. However, the scope of the present disclosure is not limited to FIG. 1, and a direct type as well as a side chain type may be used as the light source, and the reflecting plate or the reflective layer may not be included or may be replaced with other constituents as necessary, and when necessary, additional films such as a light diffusing film, a light concentrating film and a luminance enhancing film may be further provided.

One embodiment of the present specification provides a display apparatus including the backlight unit. The display apparatus is not particularly limited as long as it includes the backlight unit, and may be included in TVs, computer monitors, laptops, mobile phones and the like.

Hereinafter, the present specification will be described in detail with reference to examples. However, the examples according to the present specification may be modified to various other forms, and the scope of the present specification is not to be construed as being limited to the examples described below. Examples of the present specification are provided in order to more fully describe the present specification to those having average knowledge in the art.

Synthesis Example 1

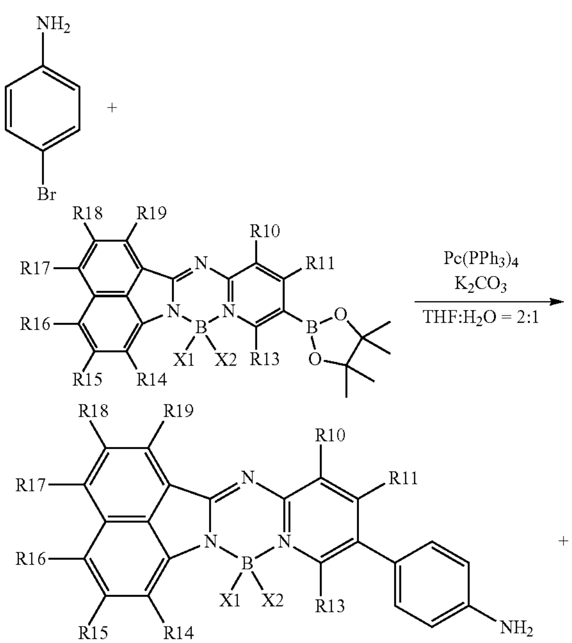

A1

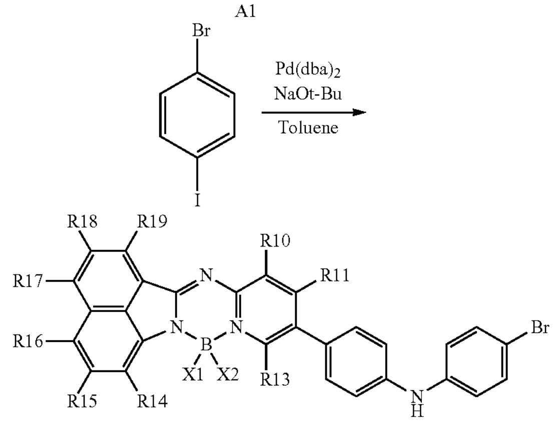

A2

1) Synthesis of Compound A1

After dissolving 4-bromoaniline (1 equivalent) and aza-bodipy (a) (1.5 equivalent) in a tetrahydrofuran solvent, potassium carbonate (3 equivalent) dissolved in water was mixed thereto, and the result was stirred while heating at 80° C. under nitrogen. After the temperature was stabilized, a $Pd(PPh_3)_4$ catalyst (0.03 equivalent) was added thereto to proceed a reaction. After the reaction was terminated, the reaction material was cooled to room temperature, extracted using water and chloroform, and water was removed using anhydrous magnesium sulfate. After concentrating the water-removed reaction material through vacuum distillation, a product was obtained using chloroform and ethanol.

2) Synthesis of Compound A2

After diluting the synthesized A1 material (1 equivalent) and 1-bromo-4-iodobenzene (1.5 equivalent) in a toluene solvent, sodium butoxide (1.2 equivalent) was added thereto, and the result was heated at 90° C. under nitrogen. After the temperature was stabilized, a $Pd(dba)_2$ catalyst (0.01 equivalent) was added thereto to proceed a reaction. After the reaction was terminated, the reaction material was cooled to room temperature, extracted using water and chloroform, and water was removed using anhydrous magnesium sulfate. After concentrating the water-removed reaction material through vacuum distillation, compound A2 was obtained using chloroform and ethanol.

Preparation Example 1. Synthesis of Compound 1

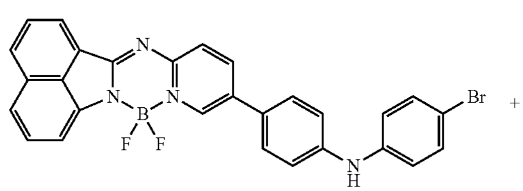

1a

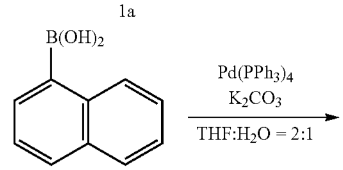

1b

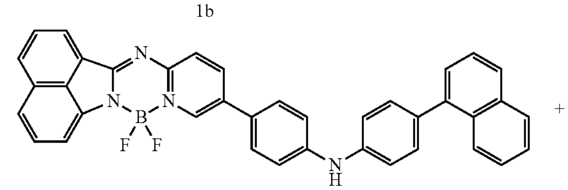

1c

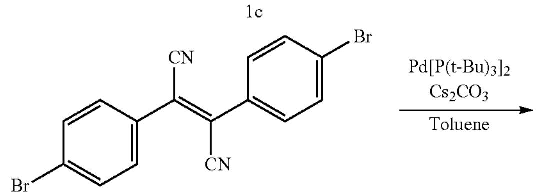

1d

-continued

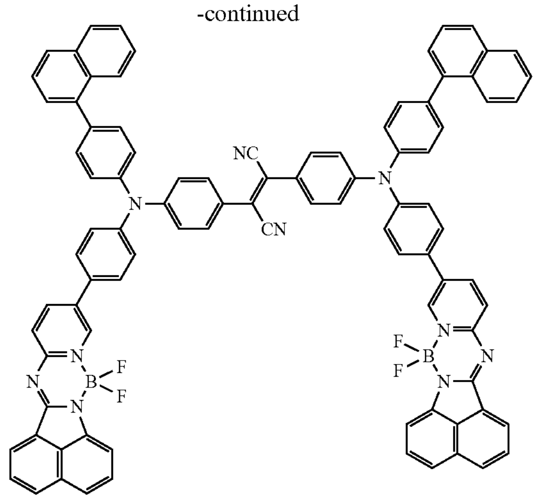

1

1) Synthesis of Compound 1c

After diluting Compound 1a (2 g) in a tetrahydrofuran (THF) solvent (100 mL) with Compound 1b (2 equivalent), potassium carbonate (3 equivalent) diluted in water (50 mL) was added thereto. The mixed solution was stirred while heating at 80° C. under nitrogen to proceed a reaction. After the reaction was completed, the result was extracted using chloroform and water, and after removing water from the extracted organic layer using anhydrous magnesium sulfate, the water-removed organic layer was concentrated through vacuum distillation, and then a product was obtained using chloroform and ethanol. Through this, Compound 1c was obtained in 1.78 g (82%). HR LC/MS/MS m/z calcd for $C_{38}H_{26}BF_2N_4$ (M+): 587.2219; found: 587.2218.

2) Synthesis of Compound 1

After diluting synthesized Compound 1c (1 g) in toluene (30 mL) with Compound 1d (0.5 equivalent) and cesium carbonate (3 equivalent), the result was stirred while heating at 90° C. under nitrogen. After the heating temperature was stabilized, a $Pd[P(t\text{-}Bu)_3]_2$ catalyst (0.01 equivalent) was added thereto to proceed a reaction. After the reaction was completed, the result was filtered to remove a base, and the obtained organic layer was extracted using water. After removing water from the extracted organic layer using anhydrous magnesium sulfate, the solvent was concentrated through vacuum distillation, and Compound 1 was obtained in 0.90 g (76%) using chloroform and ethanol. HR LC/MS/MS m/z calcd for $C_{92}H_{58}B_2F_4N_{10}$ (M+): 1400.4968; found: 1400.4966.

Preparation Example 2. Synthesis of Compound 2

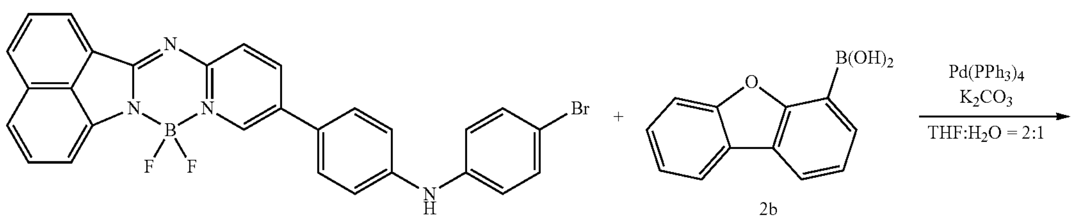

1a

2b

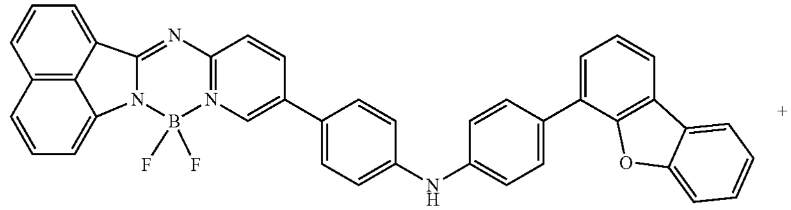

2c

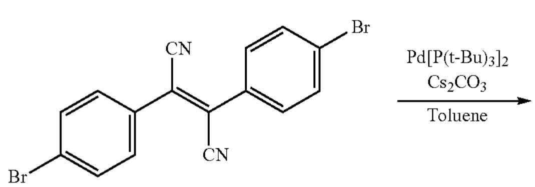

1d

-continued

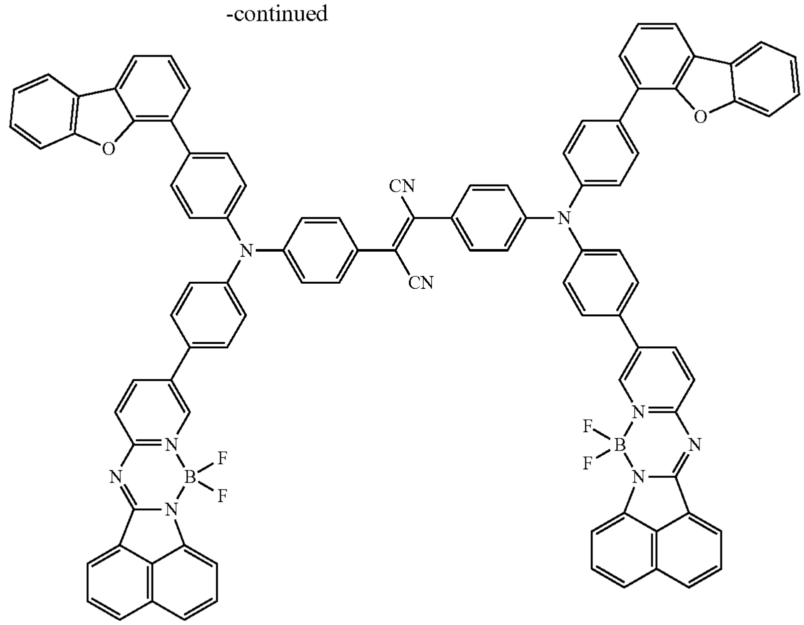

2

1) Synthesis of Compound 2c

The synthesis method was the same as the method preparing Compound 1c except that 2 equivalent of Compound 2b was used instead of Compound 1b. Herein, Compound 2c was obtained in 1.50 g (65%). HR LC/MS/MS m/z calcd for $C_{40}H_{26}BF_2N_4O$ (M+): 627.2168; found: 627.2169.

2) Synthesis of Compound 2

The synthesis was proceeded in the same manner as the synthesis of Compound 1 except that 1 g of Compound 2c was used instead of Compound 1c. Through this, Compound 2 was obtained in 0.80 g (68%). HR LC/MS/MS m/z calcd for $C_{96}H_{58}B_2F_4N_{10}O_2$(M+): 1481.4900; found: 1481.4901.

Preparation Example 3. Synthesis of Compound 3

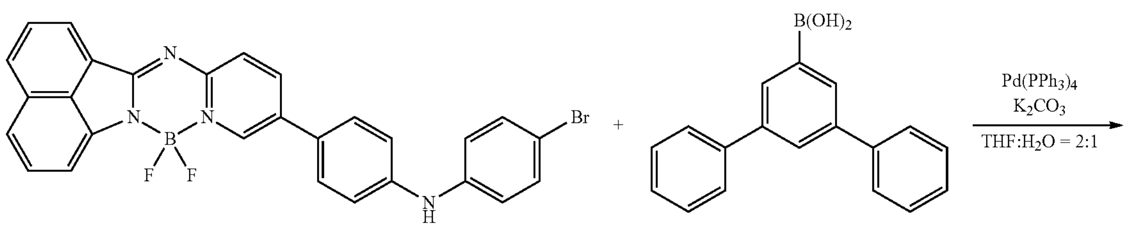

1a 3b

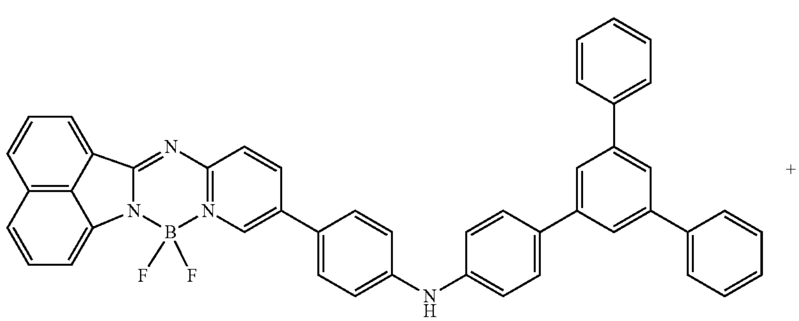

3c

-continued

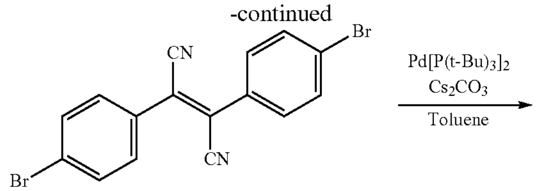

1d

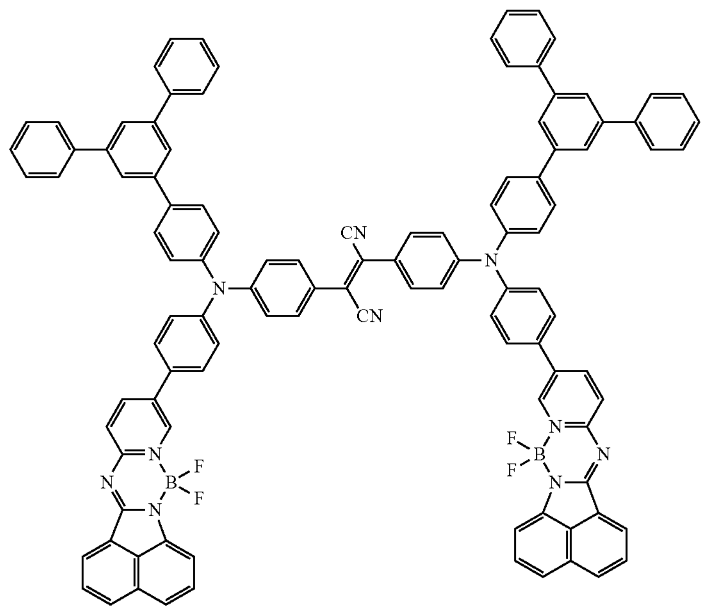

3

1) Synthesis of Compound 3c

The synthesis method was the same as the method preparing Compound 1c except that 2 equivalent of Compound 3b was used instead of Compound 1b. Herein, Compound 3c was obtained in 1.56 g (61%). HR LC/MS/MS m/z calcd for $C_{46}H_{32}BF_2N_4$ (M+): 663.2532; found: 663.2533.

2) Synthesis of Compound 3

The synthesis was proceeded in the same manner as the synthesis of Compound 1 except that 1 g of Compound 3c was used instead of Compound 1c. Through this, Compound 3 was obtained in 0.5 g (43%). HR LC/MS/MS m/z calcd for $C_{108}H_{70}B_2F_4N_{10}$ (M+): 1605.5941; found: 1605.5939.

Preparation Example 4. Synthesis of Compound 4

-continued

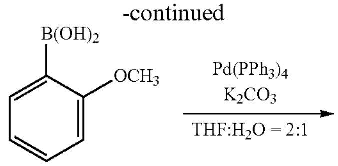

4b

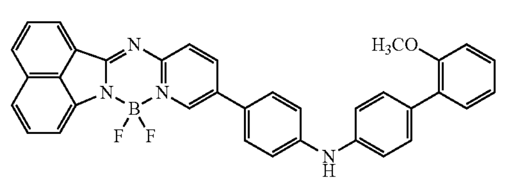

4c

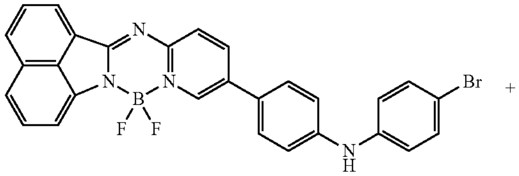

1a

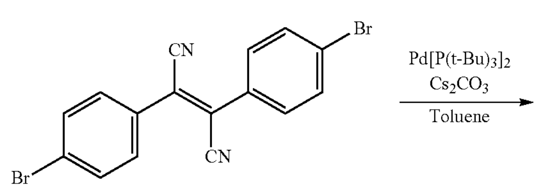

1d

-continued

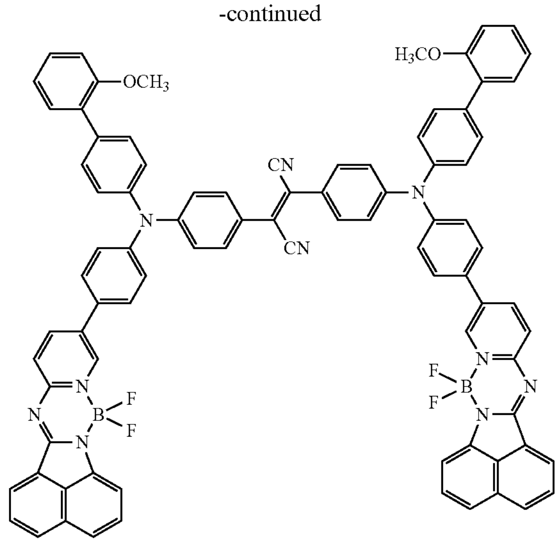

4

1) Synthesis of Compound 4c

The synthesis method was the same as the method preparing Compound 1c except that 2 equivalent of Compound 4b was used instead of Compound 1b. Herein, Compound 4c was obtained in 1.64 g (78%). HR LC/MS/MS m/z calcd for $C_{35}H_{26}BF_2N_4O$ (M+): 567.2168; found: 567.2169.

2) Synthesis of Compound 4

The synthesis was proceeded in the same manner as the synthesis of Compound 1 except that 1 g of Compound 4c was used instead of Compound 1c. Through this, Compound 4 was obtained in 0.68 g (57%). HR LC/MS/MS m/z calcd for $C_{86}H_{58}B_2F_4N_{10}O_2$ (M+): 1360.4866; found: 1360.4866.

Preparation Example 5. Synthesis of Compound 5

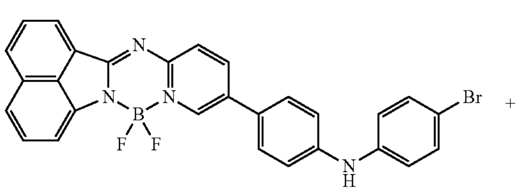

1a

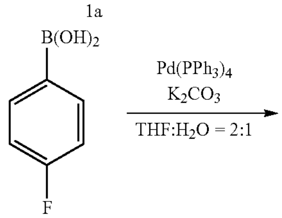

5b

-continued

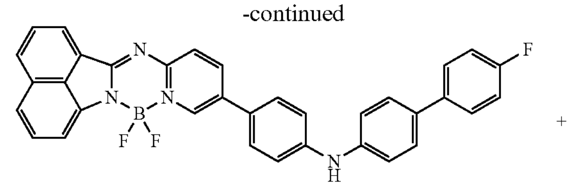

5c

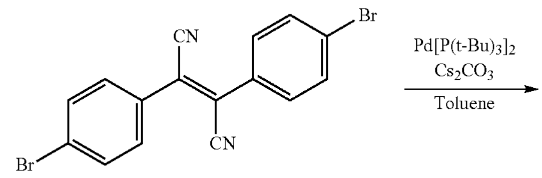

1d

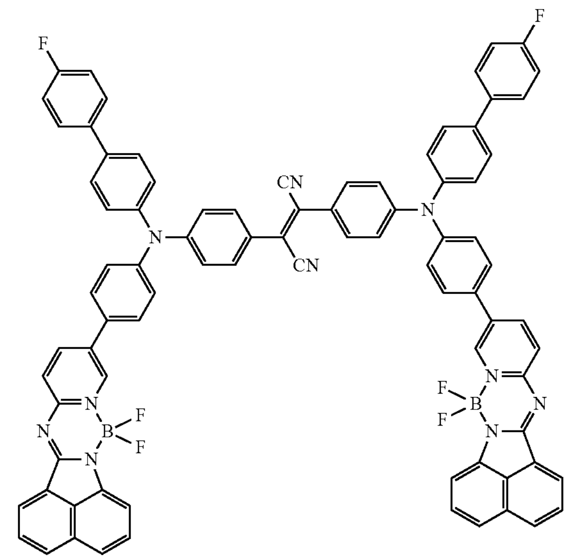

5

1) Synthesis of Compound 5c

The synthesis method was the same as the method preparing Compound 1c except that 2 equivalent of Compound 5b was used instead of Compound 1b. Herein, Compound 5c was obtained in 1.48 g (72%). HR LC/MS/MS m/z calcd for $C_{34}H_{23}BF_3N_4$ (M+): 555.1968; found: 555.1968.

2) Synthesis of Compound 5

The synthesis was proceeded in the same manner as the synthesis of Compound 1 except that 1 g of Compound 5c was used instead of Compound 1c. Through this, Compound 5 was obtained in 0.82 g (68%). HR LC/MS/MS m/z calcd for $C_{84}H_{52}B^2F_6N_{10}$ (M+): 1336.4467; found: 1336.4466.

Preparation Example 6. Synthesis of Compound 6

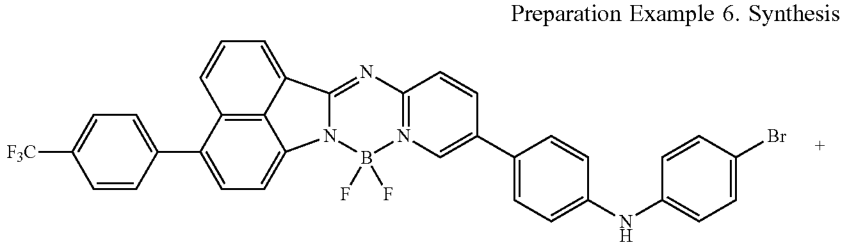

6a

-continued
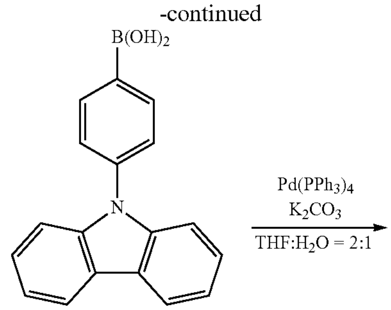
6b
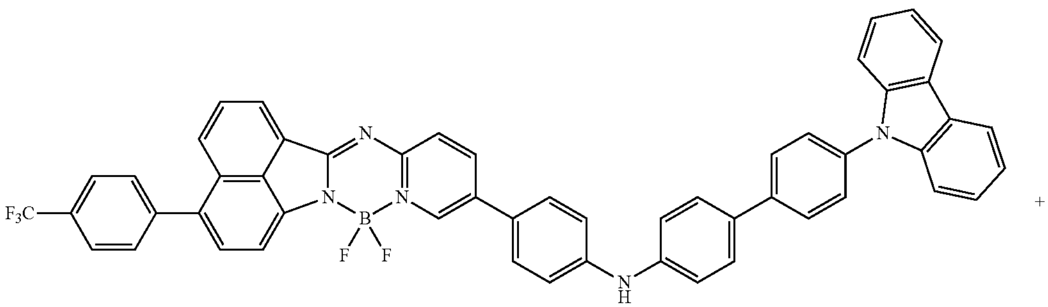
6c
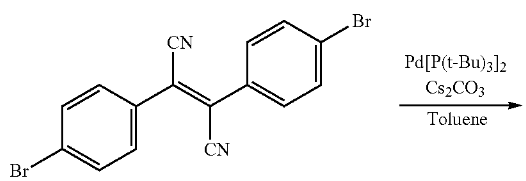
1d
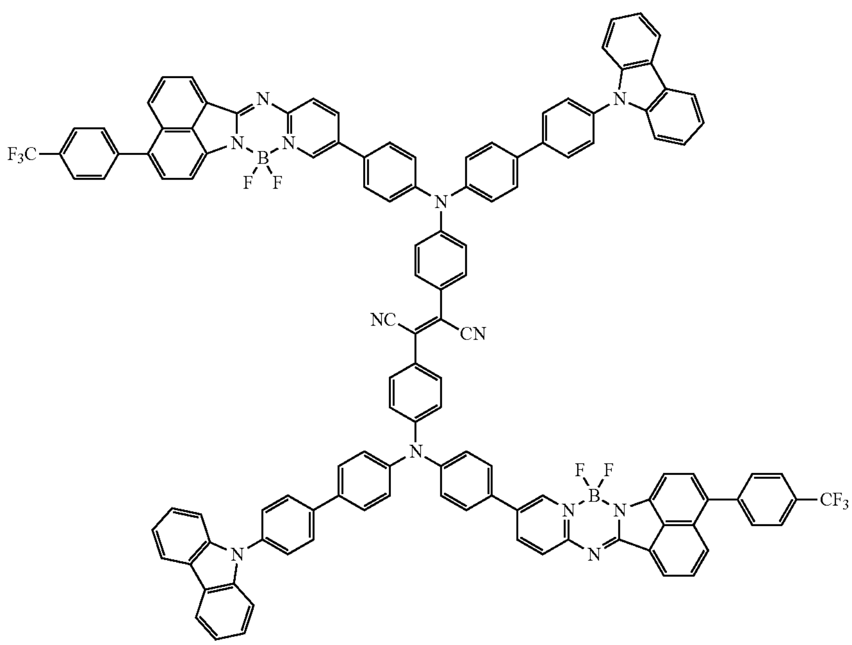
6

1) Synthesis of Compound 6c

The synthesis method was the same as the method preparing Compound 1c except that 2 g of Compound 6a was used instead of Compound 1a, and 2 equivalent of Compound 6b was used instead of Compound 1b. Herein, Compound 6c was obtained in 1.43 g (58%). HR LC/MS/MS m/z calcd for $C_{53}H_{34}BF_5N_5$ (M+): 846.2827; found: 846.2828.

2) Synthesis of Compound 6

The synthesis was proceeded in the same manner as the synthesis of Compound 1 except that 1 g of Compound 6c was used instead of Compound 1c. Through this, Compound 6 was obtained in 0.72 g (63%). HR LC/MS/MS m/z calcd for $C_{122}H_{74}B_2F_{10}N_{12}$ (M+): 1919.6219; found: 1919.6217.

Preparation Example 7. Synthesis of Compound 7

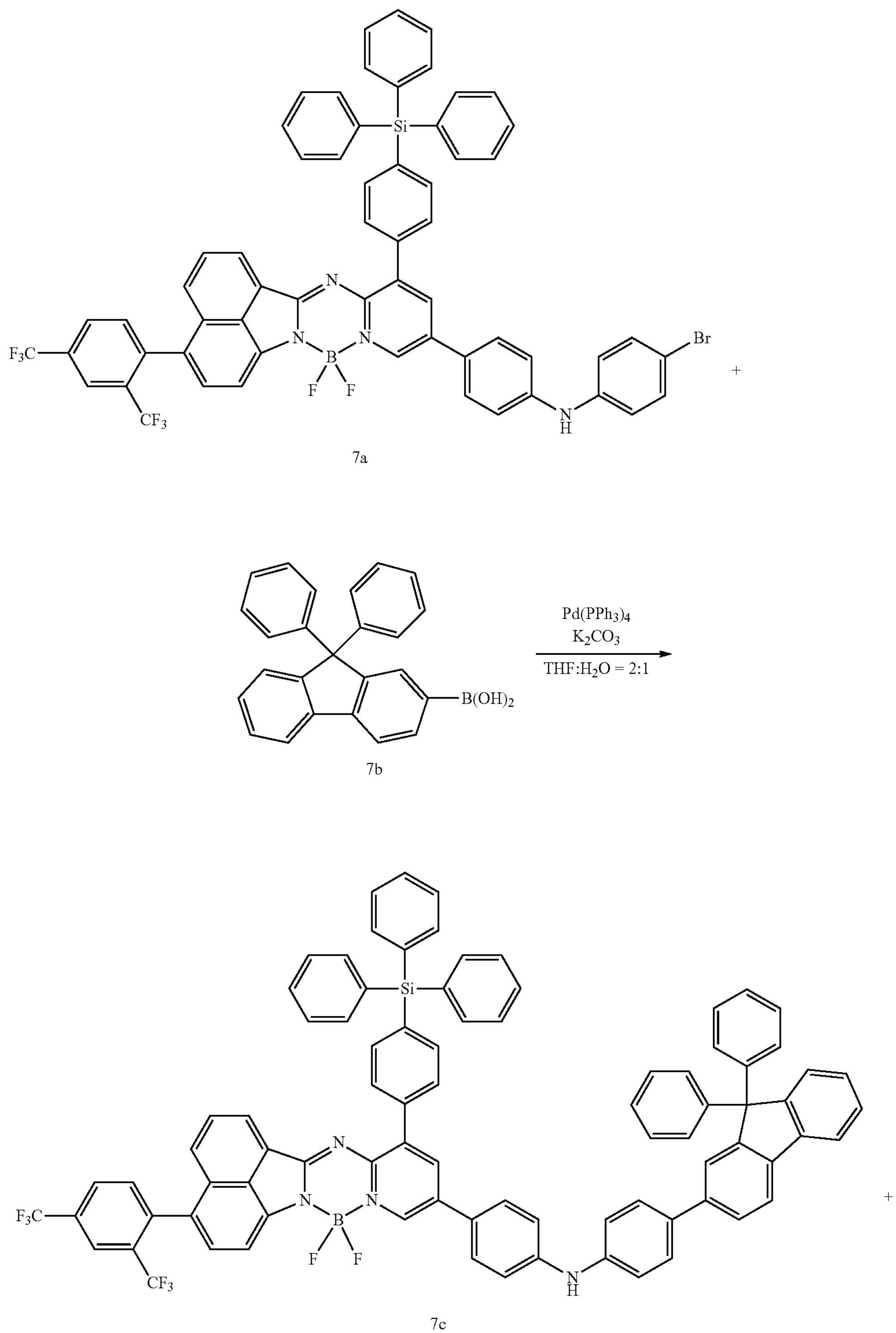

7a

7b

7c

-continued

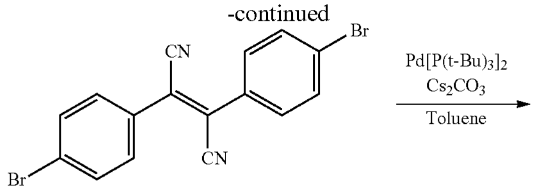

1d

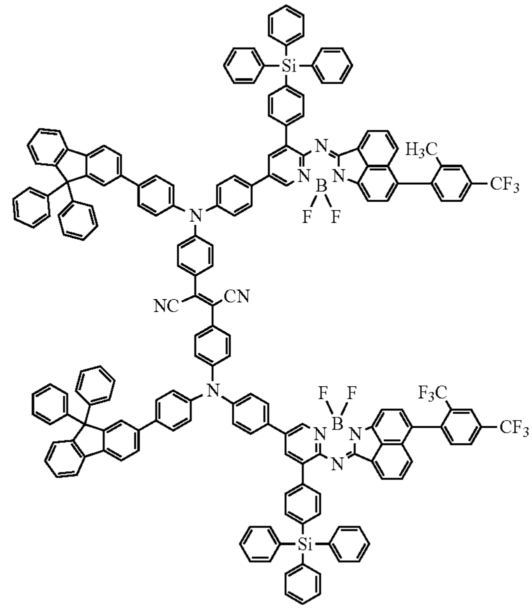

7

1) Synthesis of Compound 7c

The synthesis method was the same as the method preparing Compound 1c except that 2 g of Compound 7a was used instead of Compound 1a, and 2 equivalent of Compound 7b was used instead of Compound 1b. Herein, Compound 7c was obtained in 1.41 g (58%). HR LC/MS/MS m/z calcd for $C_{85}H_{56}BF_8N_4Si$ (M+): 1323.4240; found: 1323.4241.

2) Synthesis of Compound 7

The synthesis was proceeded in the same manner as the synthesis of Compound 1 except that 1 g of Compound 7c was used instead of Compound 1c. Through this, Compound 7 was obtained in 0.93 g (85%). HR LC/MS/MS m/z calcd for $C_{186}H_{118}B_2F_{16}N_{10}Si_2$ (M+): 2873.9044; found: 2873.9044.

Preparation Example 8. Synthesis of Compound 8

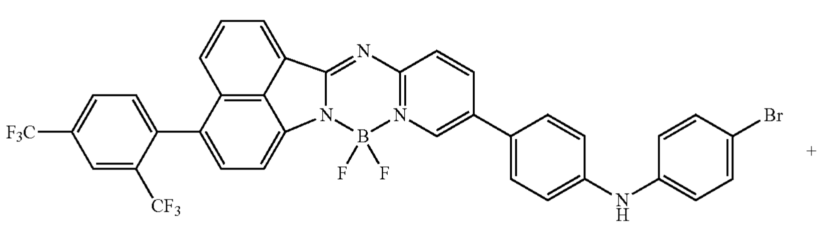

8a

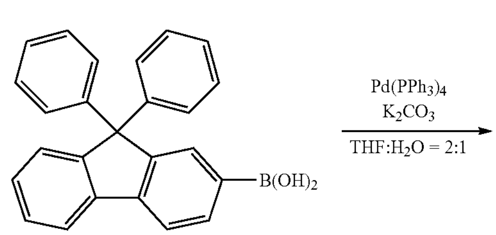

8b

-continued

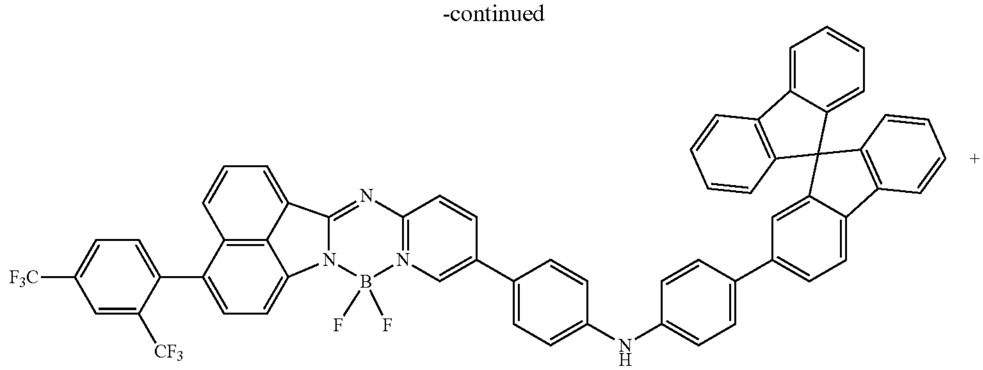

8c

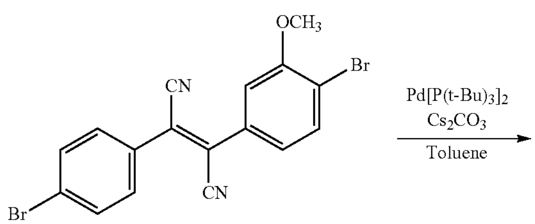

8d

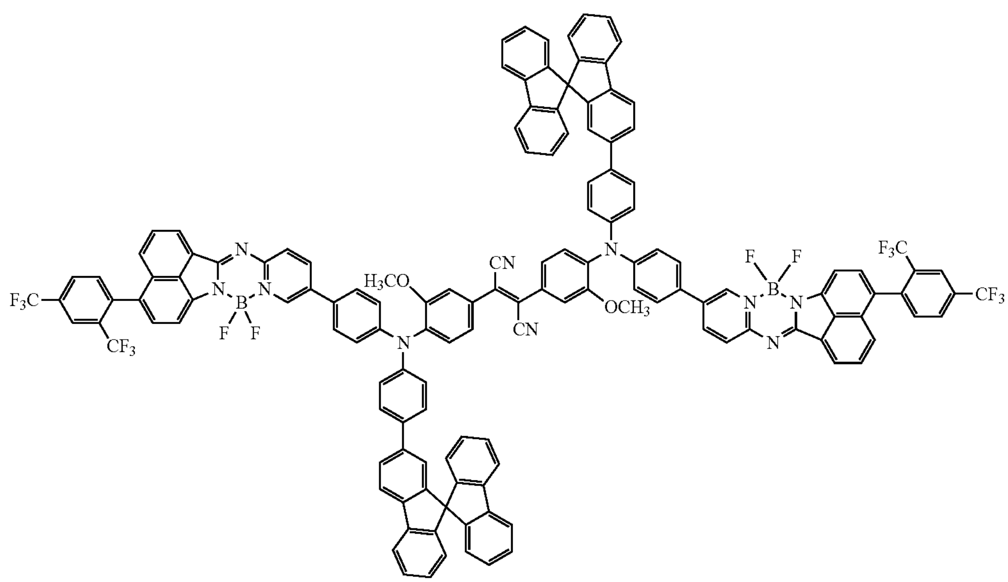

8

1) Synthesis of Compound 8c

The synthesis method was the same as the method preparing Compound 1c except that 2 g of Compound 8a was used instead of Compound 1a, and 2 equivalent of Compound 8b was used instead of Compound 1b. Herein, Compound 8c was obtained in 2.0 g (76%). HR LC/MS/MS m/z calcd $C_{61}H_{36}BF_8N_4$ (M+): 987.2905; found: 987.2905.

2) Synthesis of Compound 8

The synthesis was proceeded in the same manner as the synthesis of Compound 1 except that 1 g of Compound 8c was used instead of Compound 1c, and Compound 8d was used instead of Compound 1d. Through this, Compound 8 was obtained in 0.92 g (81%). HR LC/MS/MS m/z calcd for $C_{140}H_{82}B_2F_{16}N_{10}O_2$ (M+): 2261.6586; found: 2261.6586.

Preparation Example 9. Synthesis of Compound 9
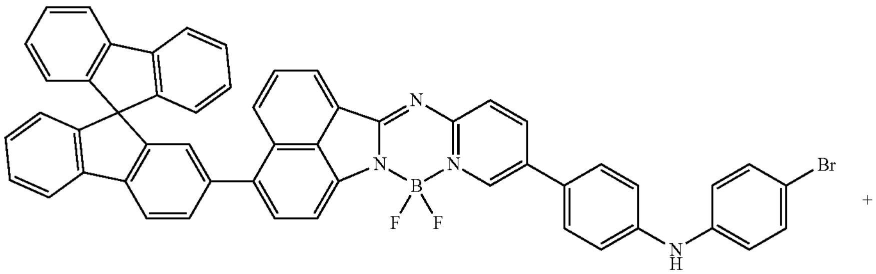
9a
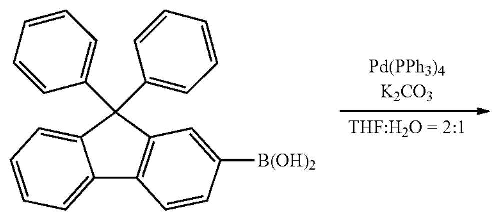
8b
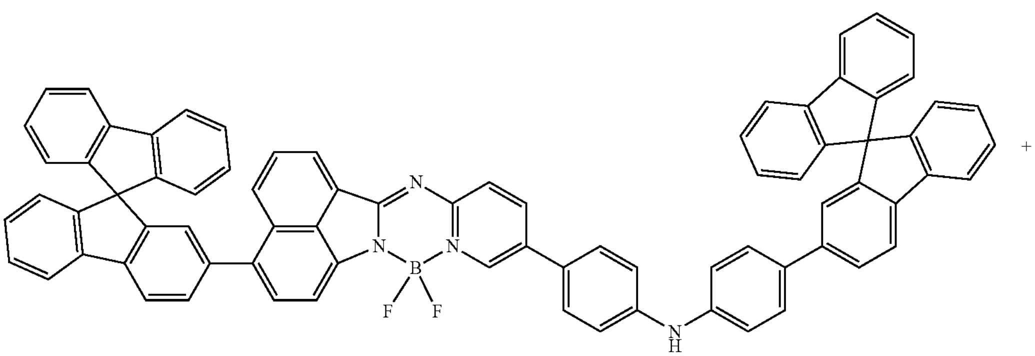
9c
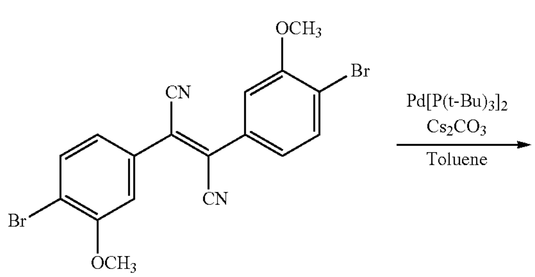
8d -continued

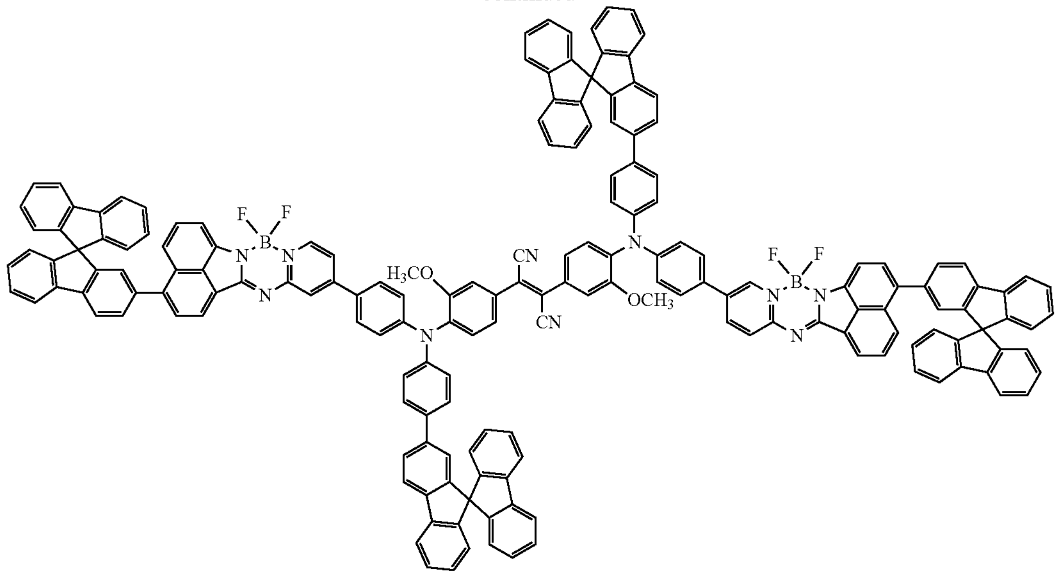

9

1) Synthesis of Compound 9c

The synthesis method was the same as the method preparing Compound 1c except that 2 g of Compound 9a was used instead of Compound 1a, and 2 equivalent of Compound 8b was used instead of Compound 1b. Herein, Compound 9c was obtained in 2.12 g (83%). HR LC/MS/MS m/z calcd $C_{78}H_{48}BF_2N_4$ (M+): 1089.3940; found: 1089.3941.

2) Synthesis of Compound 9

The synthesis was proceeded in the same manner as the synthesis of Compound 1 except that 1 g of Compound 9c was used instead of Compound 1c, and Compound 8d was used instead of Compound 1d. Through this, Compound 9 was obtained in 0.81 g (72%). HR LC/MS/MS m/z calcd for $C_{174}H_{106}B_2F_4N_{10}O_2$ (M+): 2465.8656; found: 2465.8655.

Preparation Example 10. Synthesis of Compound 10

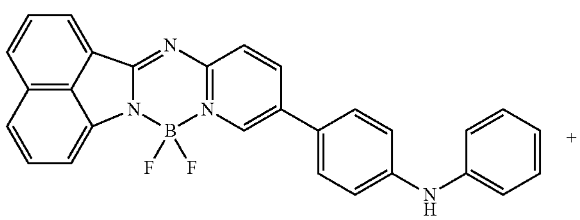

10a

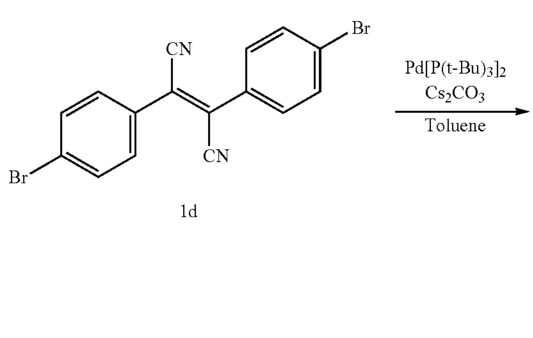

1d

-continued
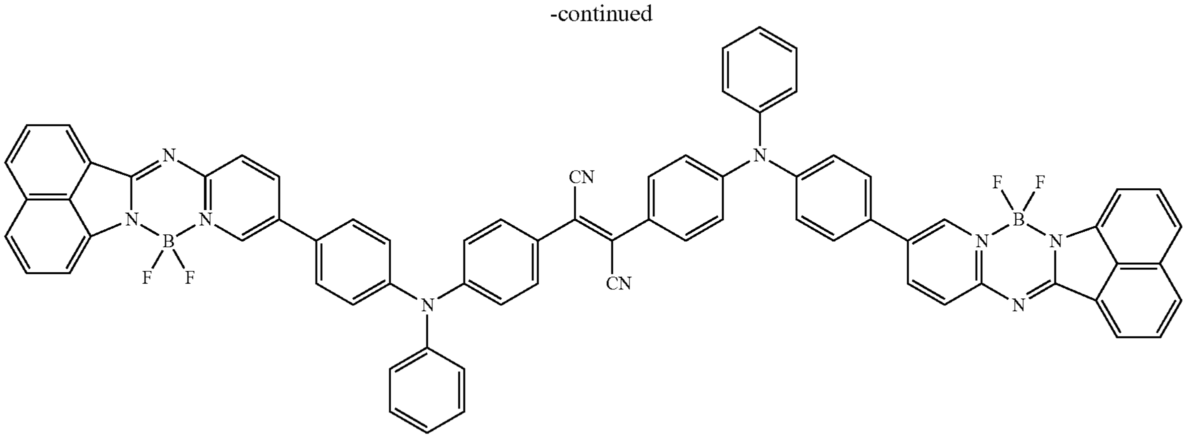
10
The synthesis was proceeded in the same manner as the synthesis of Compound 1 except that 2 g of Compound 10a was used instead of Compound 1c. Herein, Compound 10 was obtained in 2.00 g (85%). HR LC/MS/MS m/z calcd $C_{72}H_{46}B_2F_4N_{10}$ (M+): 1148.4029; found: 1148.4028.
Preparation Example 11. Synthesis of Compound 11
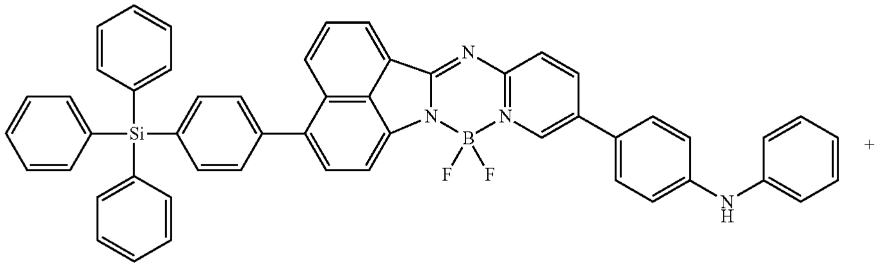
11a
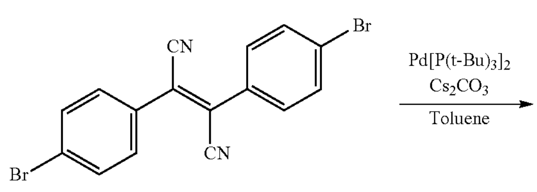
1d
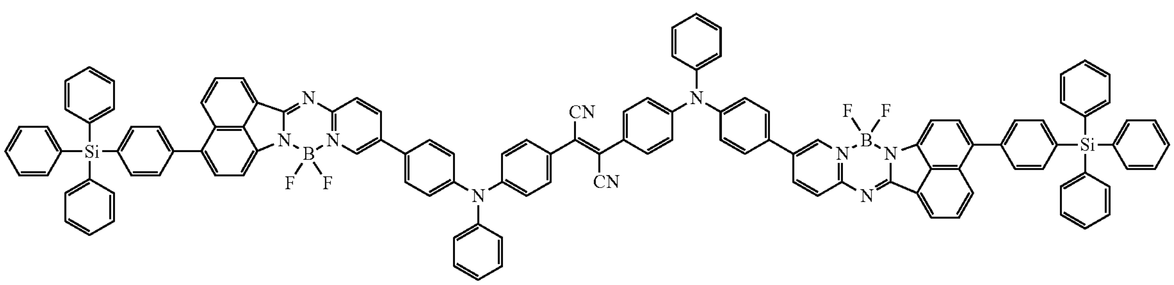
11

The synthesis was proceeded in the same manner as the synthesis of Compound 1 except that 2 g of Compound 11a was used instead of Compound 1c. Herein, Compound 11 was obtained in 1.66 g (73%). HR LC/MS/MS m/z calcd $C_{120}H_{82}B_2F_4N_{10}Si_2$ (M+): 1817.6418; found: 1817.6419.

Preparation Example 12. Synthesis of Compound 12

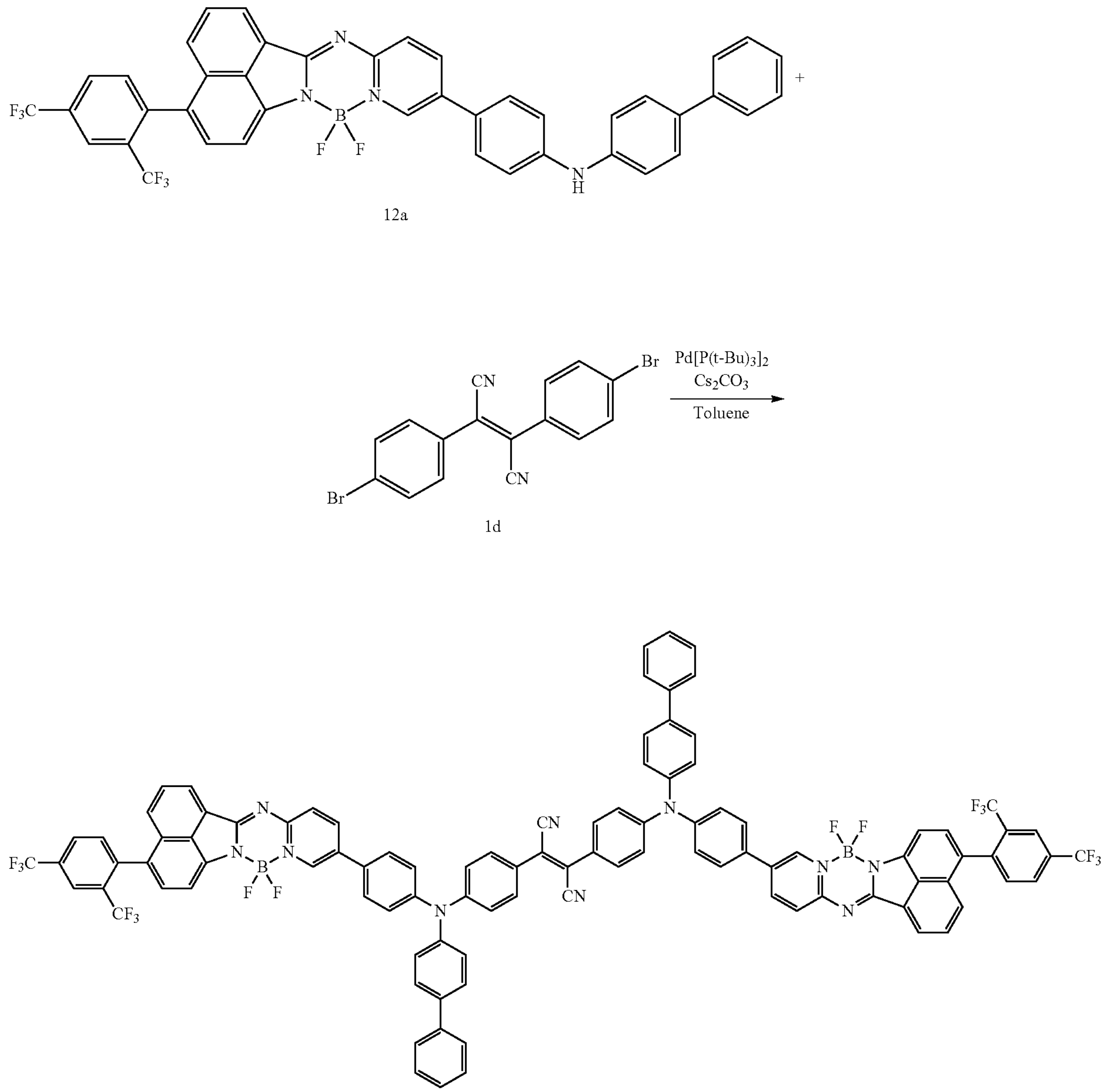

12

The synthesis was proceeded in the same manner as the synthesis of Compound 1 except that 2 g of Compound 12a was used instead of Compound 1c. Herein, Compound 12 was obtained in 1.66 g (73%). HR LC/MS/MS m/z calcd $C_{100}H_{56}B_2F_{16}N_{10}$ (M+):1723.47; found: 1723.47

Preparation Example 13. Synthesis of Compound 13
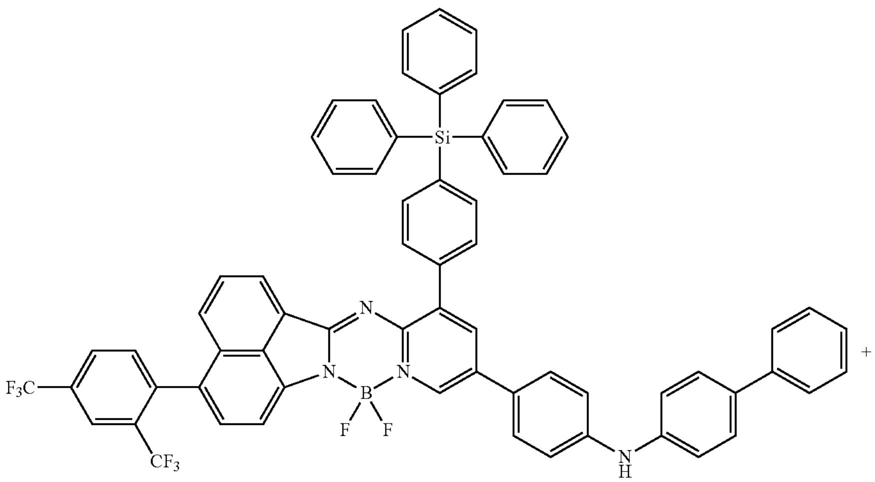
13a
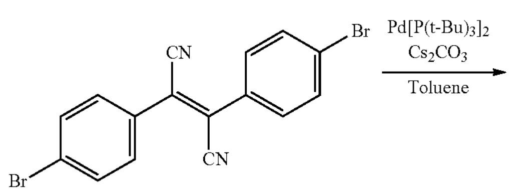
1d

-continued
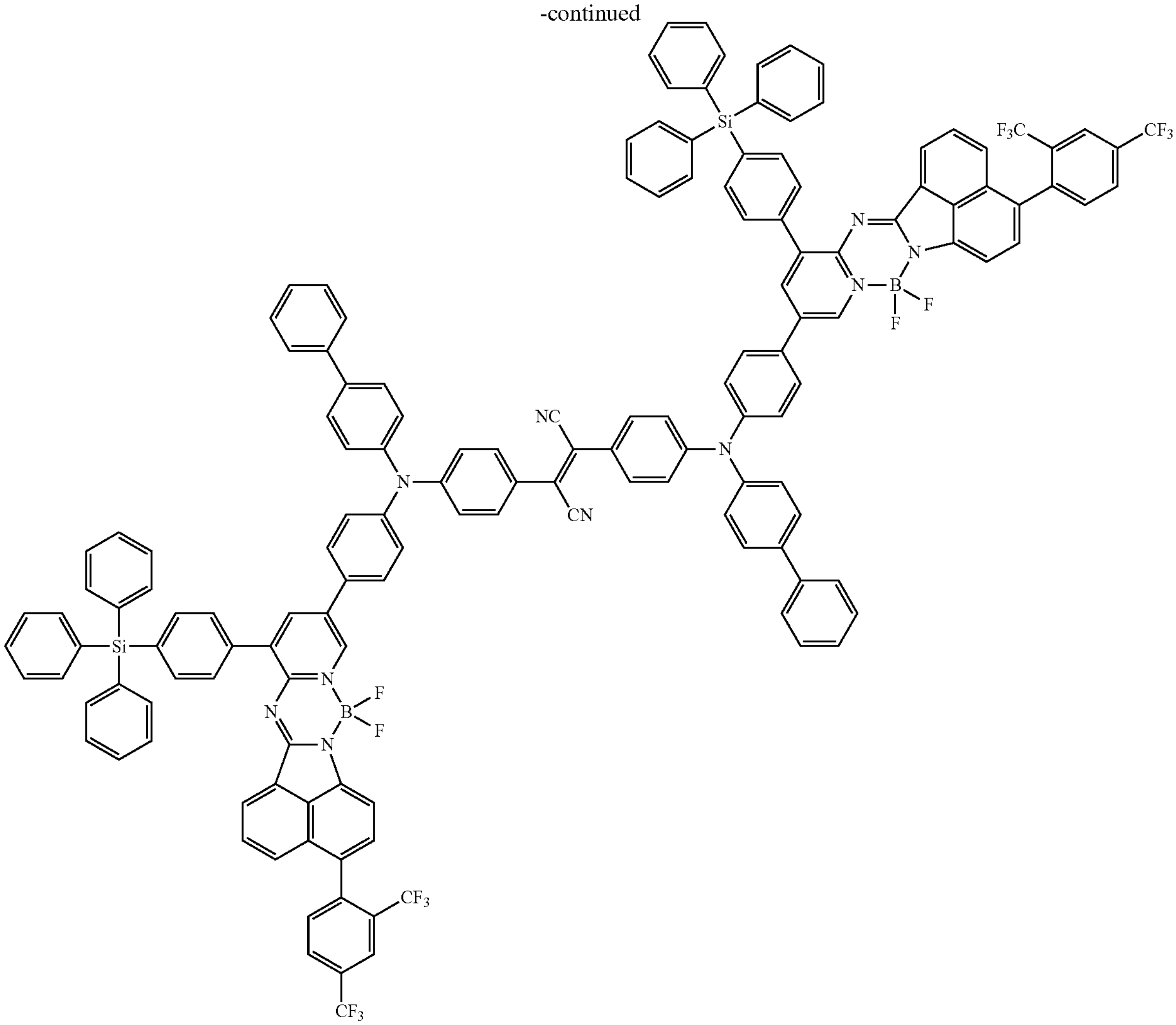
13
The synthesis was proceeded in the same manner as the synthesis of Compound 1 except that 2 g of Compound 13a was used instead of Compound 1c. Herein, Compound 13 was obtained in 1.50 g (68%). HR LC/MS/MS m/z calcd $C_{148}H_{94}B_2F_{16}N_{10}Si_2$ (M+): 2393.7166; found: 2393.7155.
Preparation Example 14. Synthesis of Compound 14
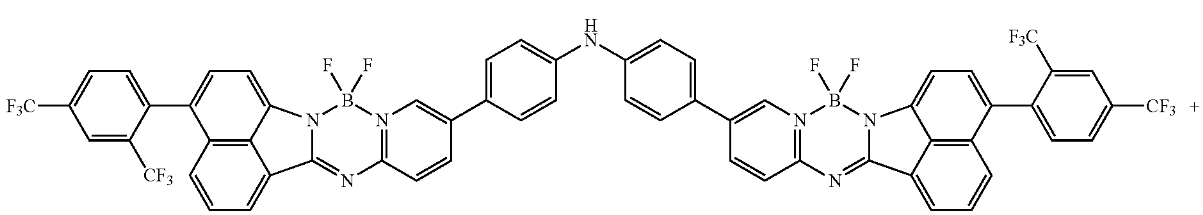
14a
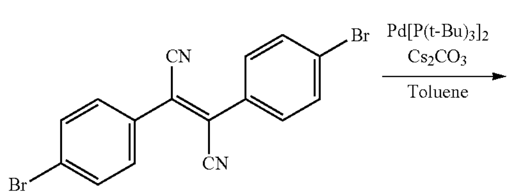
1d -continued
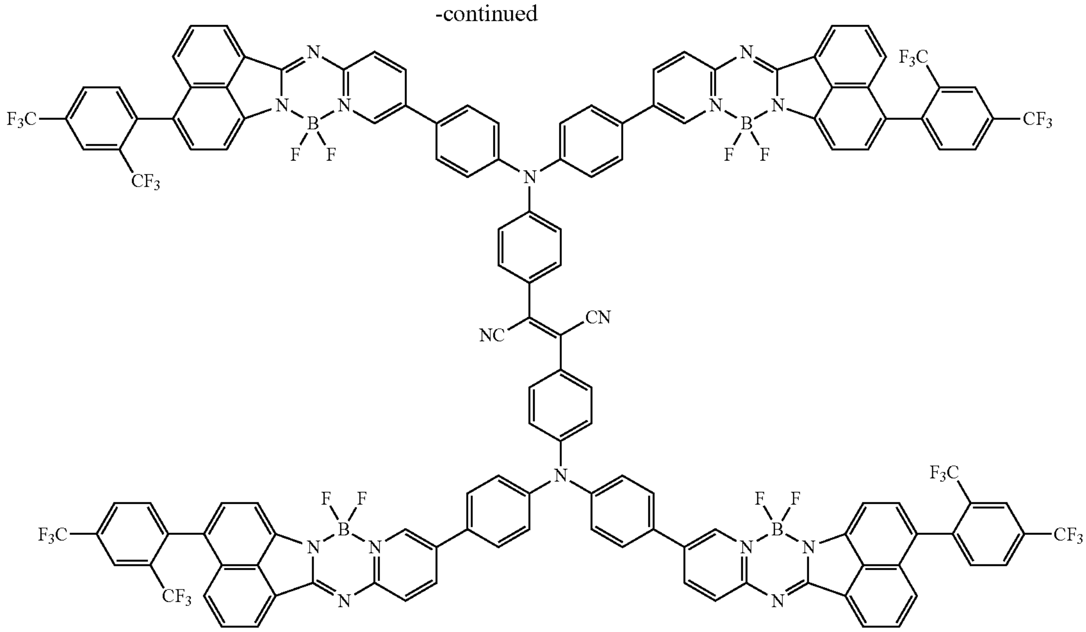
14
The synthesis was proceeded in the same manner as the synthesis of Compound 1 except that 2 g of Compound 14a was used instead of Compound 1c. Herein, Compound 14 was obtained in 1.58 g (72%). HR LC/MS/MS m/z calcd $C_{136}H_{72}B_4F_{32}N_{16}$ (M+): 2581.6021; found: 2581.6022.
Preparation Example 15. Synthesis of Compound 15
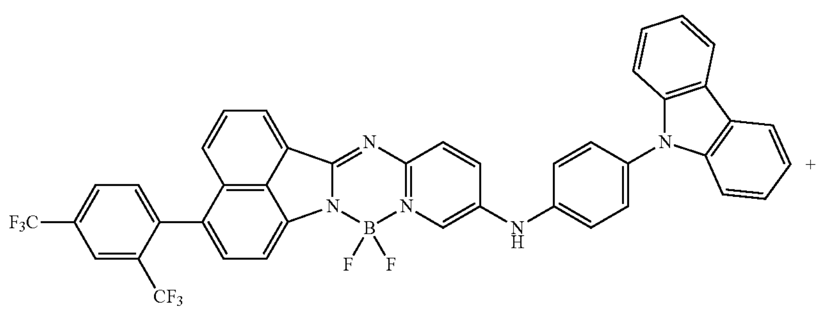
15a
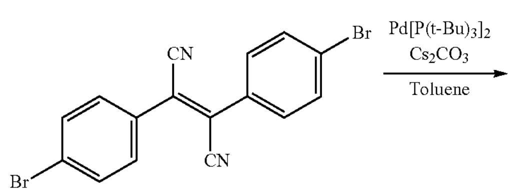
1d -continued
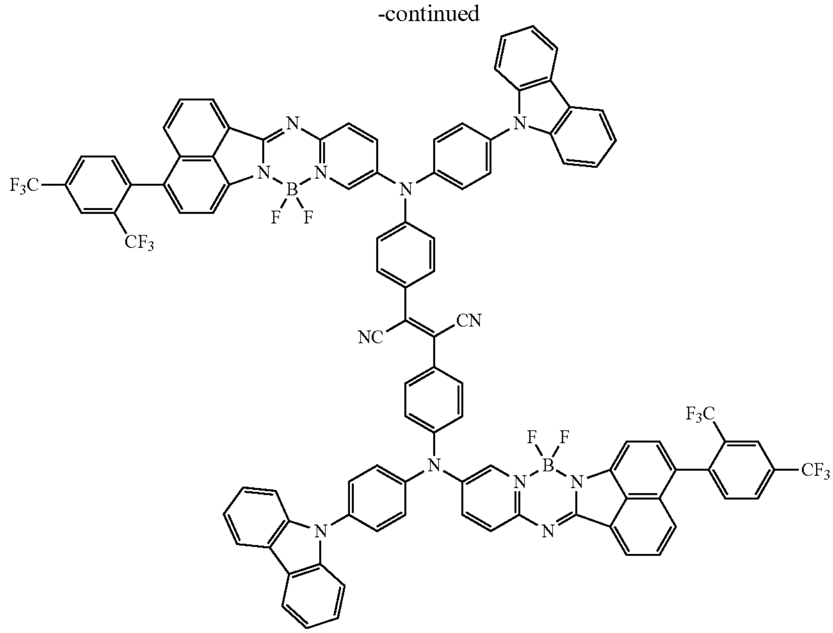
15
The synthesis was proceeded in the same manner as the synthesis of Compound 1 except that 2 g of Compound 15a was used instead of Compound 1c. Herein, Compound 15 was obtained in 1.86 g (81%). HR LC/MS/MS m/z calcd $C_{100}H_{54}B_2F_{16}N_{12}$ (M+): 1749.4559; found: 1749.4558.
Preparation Example 16. Synthesis of Compound 16
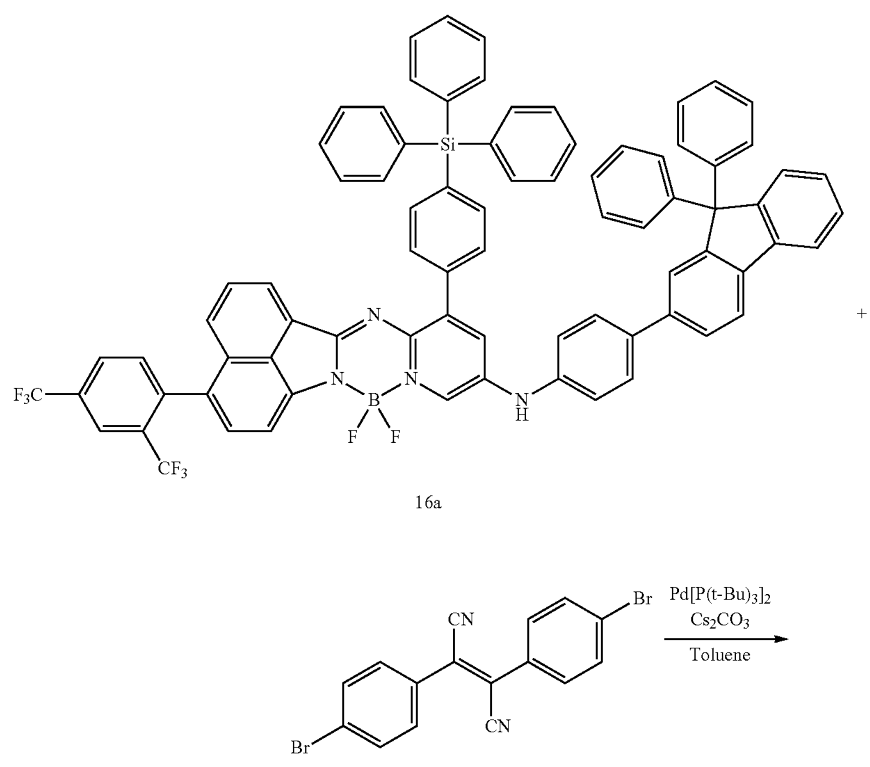

-continued
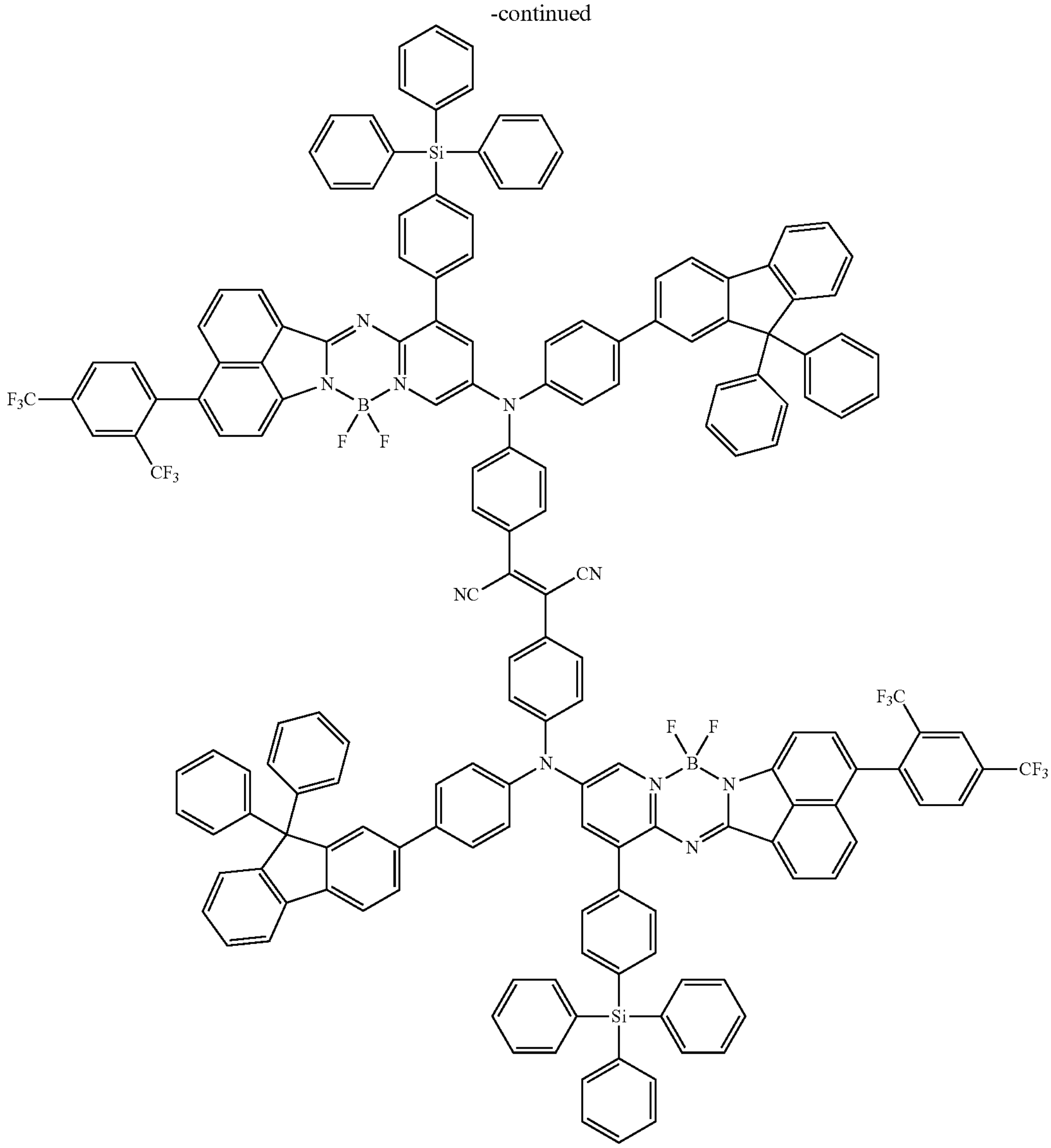
16
The synthesis was proceeded in the same manner as the synthesis of Compound 1 except that 2 g of Compound 16a was used instead of Compound 1c. Herein, Compound 16 was obtained in 1.61 g (74%). HR LC/MS/MS m/z calcd $C_{174}H_{108}B_2F_{16}N_{10}Si_2$ (M+): 2719.8216; found: 2719.8216.
Synthesis Example 2
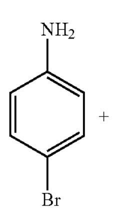
-continued
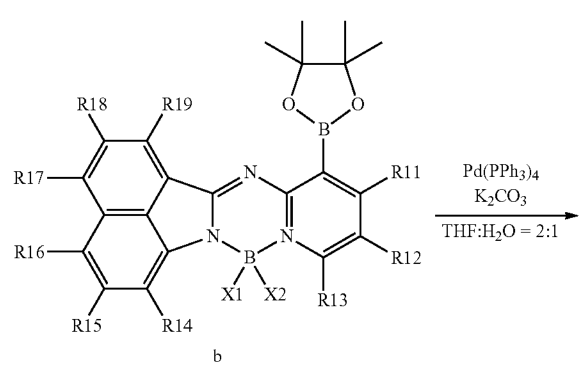

-continued

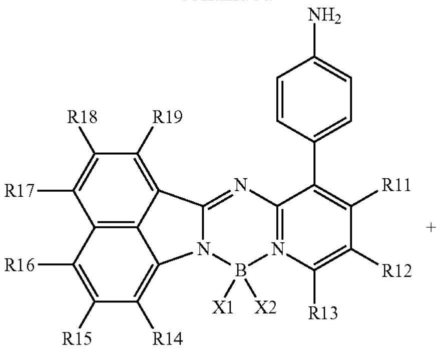

A3

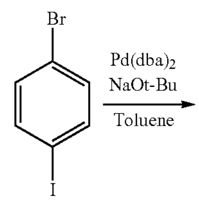

-continued

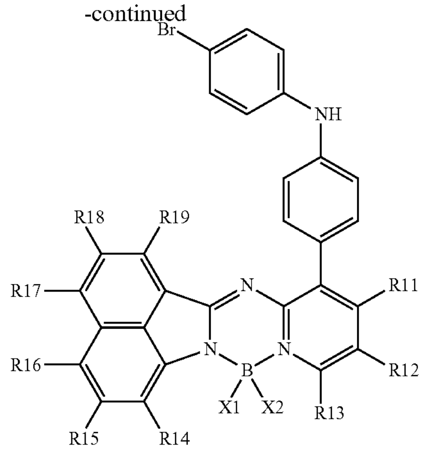

A4 a. Synthesis of Compound A3

The synthesis was proceeded in the same manner as the synthesis of Compound A1 using aza-bodipy (b) (1.5 equivalent) with 4-bromoaniline (1 equivalent).

b. Synthesis of Compound A4

The synthesis was proceeded in the same manner as the synthesis of Compound A2 using synthesized Compound A3.

Preparation Example 17. Synthesis of Compound 17

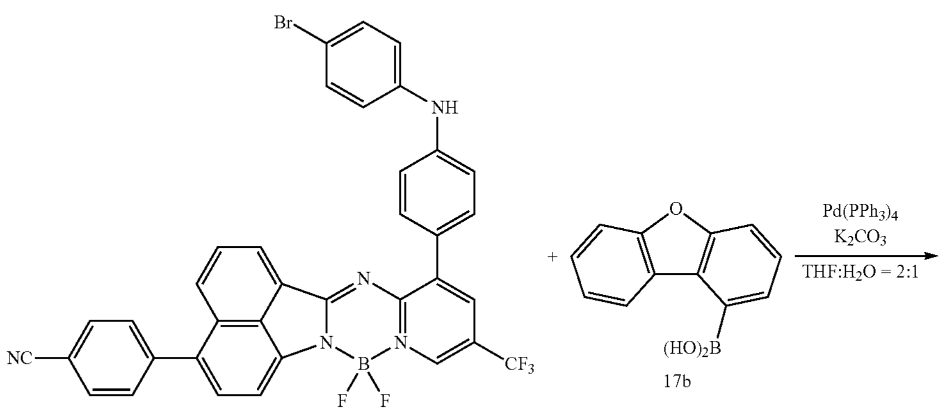

17a 17b

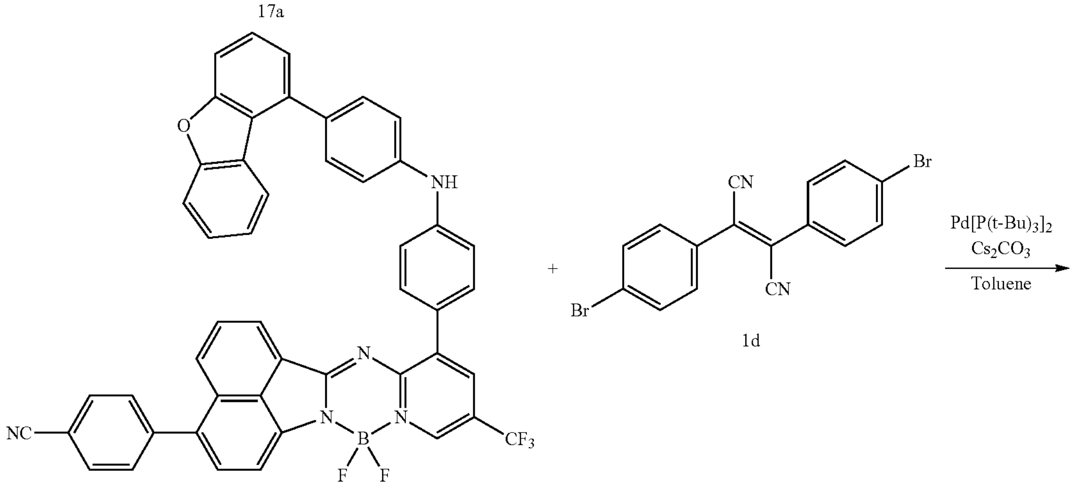

17c

-continued

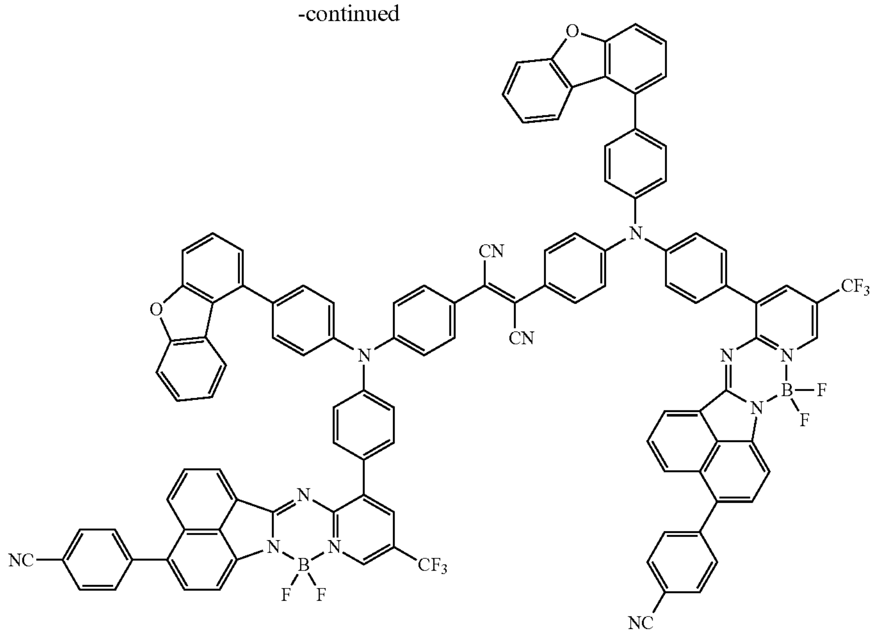

17

1) Synthesis of Compound 17c

The synthesis method was the same as the method preparing Compound 1c except that 2 g of Compound 17a was used instead of Compound 1a, and 2 equivalent of Compound 17b was used instead of Compound 1b. Herein, Compound 17c was obtained in 2.12 g (83%). HR LC/MS/MS m/z calcd $C_{48}H_{27}BF_5N_5O$ (M+): 795.2229; found: 795.2228.

2) Synthesis of Compound 17

The synthesis was proceeded in the same manner as the synthesis of Compound 1 except that 1 g of Compound 17c was used instead of Compound 1c. Through this, Compound 17 was obtained in 0.81 g (72%). HR LC/MS/MS m/z calcd for $C_{112}H_{60}B_2F_{10}N_{12}O_2$ (M+): 1817.5022; found: 1817.5022.

Preparation Example 18. Synthesis of Compound 18

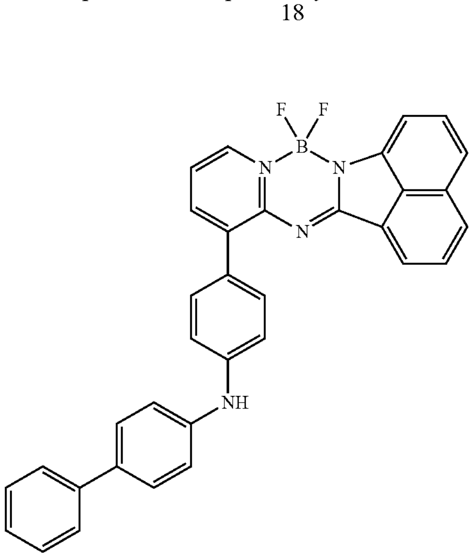

18a

+

-continued

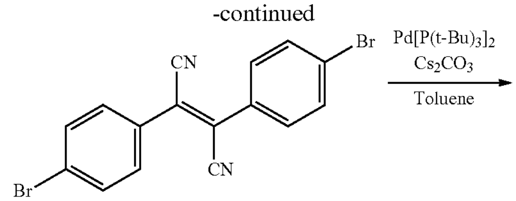

1d

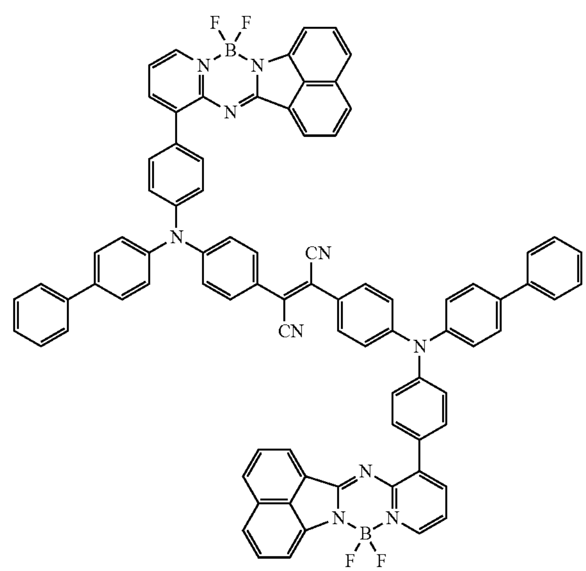

18

The synthesis was proceeded in the same manner as the synthesis of Compound 1 except that 2 g of Compound 18a was used instead of Compound 1c. Herein, Compound 18 was obtained in 2.06 g (85%). HR LC/MS/MS m/z calcd $C_{84}H_{52}B_2F_4N_{10}$ (M+): 1298.4499; found: 1298.4499.

Preparation Example 19. Synthesis of Compound 19

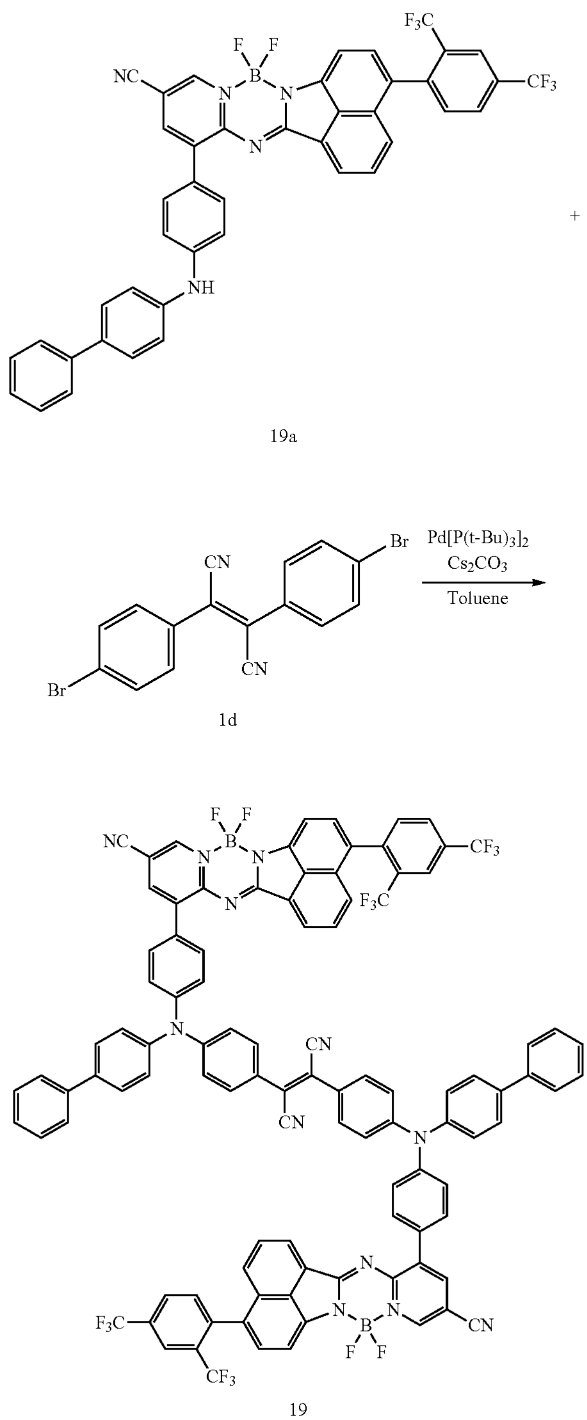

The synthesis was proceeded in the same manner as the synthesis of Compound 1 except that 2 g of Compound 19a was used instead of Compound 1c. Herein, Compound 19 was obtained in 1.63 g (71%). HR LC/MS/MS m/z calcd $C_{102}H_{54}B_2F_{16}N_{12}$ (M+): 1773.4559; found: 1773.4558.

Preparation Example 20. Synthesis of Compound 20

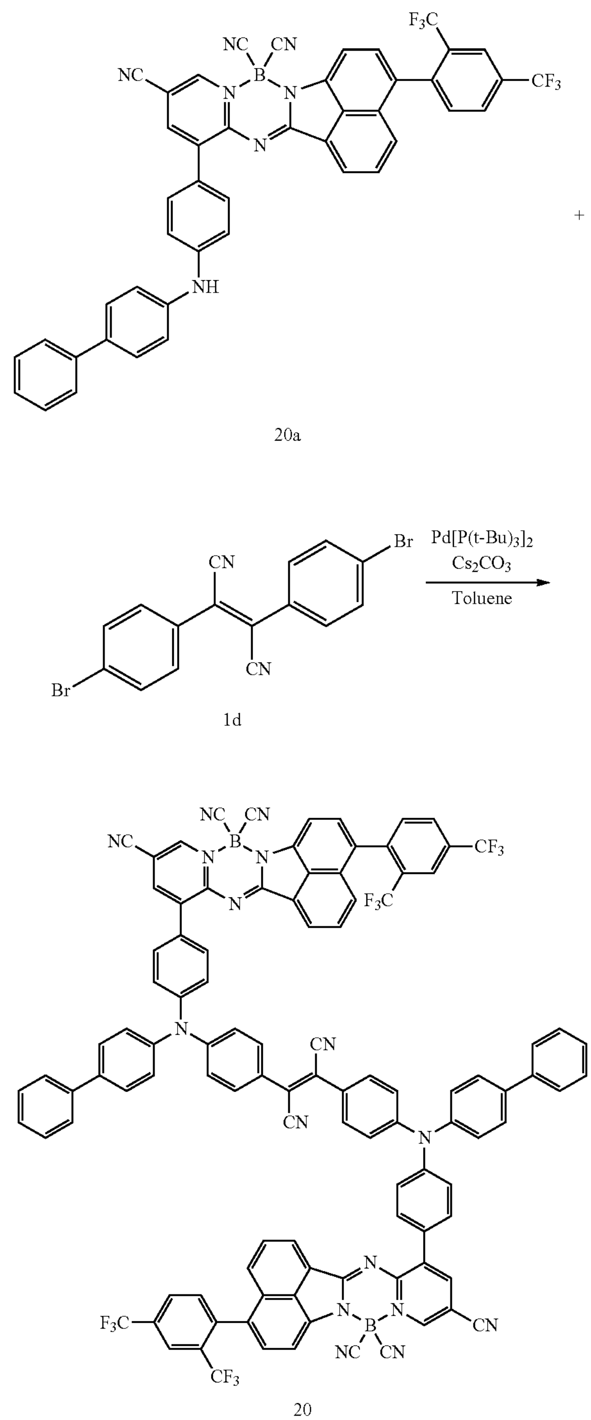

The synthesis was proceeded in the same manner as the synthesis of Compound 1 except that 2 g of Compound 20a was used instead of Compound 1c. Herein, Compound 20 was obtained in 1.53 g (67%). HR LC/MS/MS m/z calcd $C_{106}H_{54}B_2F_{12}N_{16}$ (M+): 1801.4745; found: 1801.4745.

Synthesis Example 3

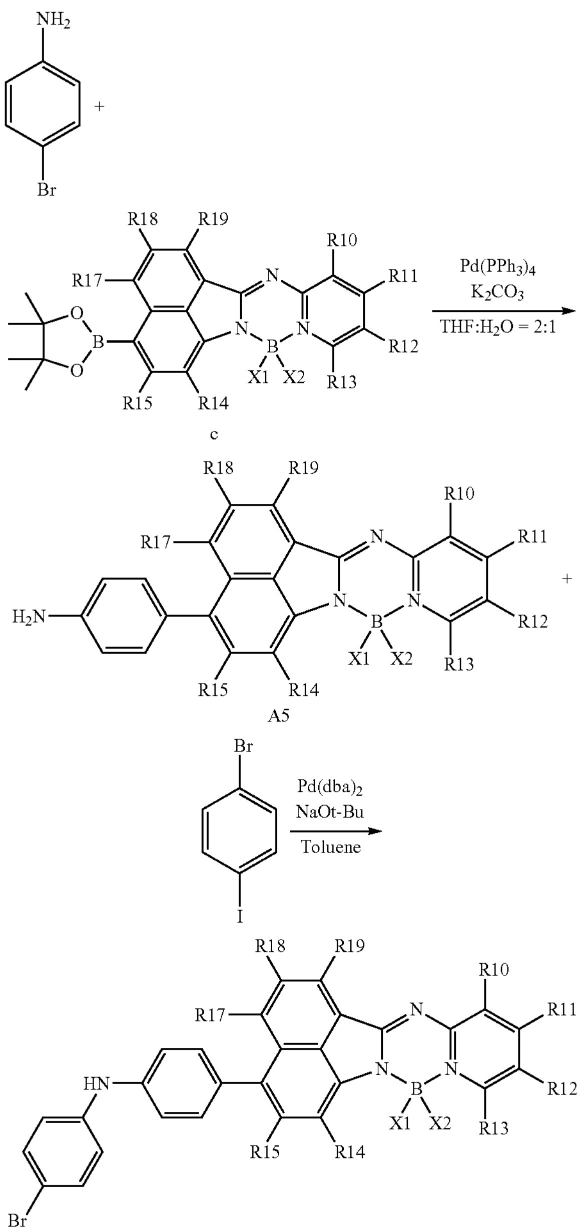

c

A5

A6 a. Synthesis of Compound A5

The synthesis was proceeded in the same manner as the synthesis of Compound A1 using aza-bodipy (c) (1.5 equivalent) with 4-bromoaniline (1 equivalent).

b. Synthesis of Compound A6

The synthesis was proceeded in the same manner as the synthesis of Compound A2 using synthesized Compound A5.

Preparation Example 21. Synthesis of Compound 21

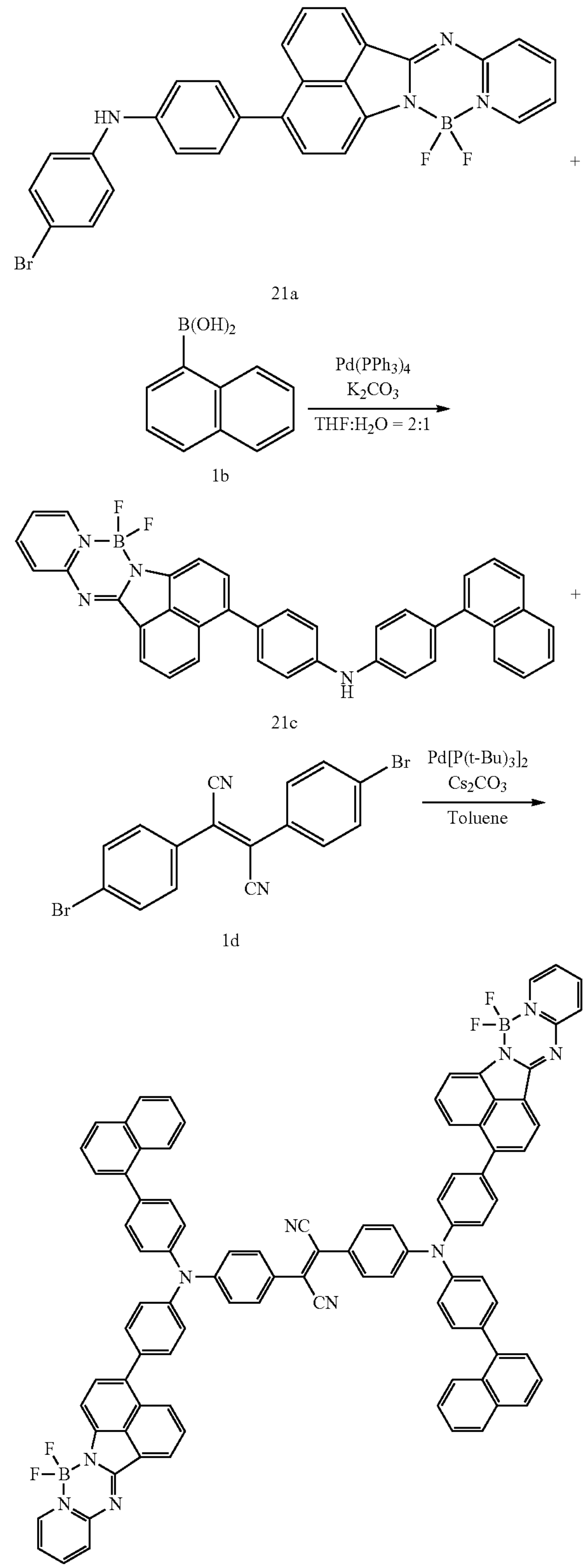

21a

1b

21c

1d

21

1) Synthesis of Compound 21c

The synthesis method was the same as the method preparing Compound 1c except that 2 g of Compound 21a was used instead of Compound 1a, and 2 equivalent of Compound 1b was used. Herein, Compound 21c was obtained in 1.57 g (72%). HR LC/MS/MS m/z calcd $C_{38}H_{25}BF_2N_4$ (M+): 586.2140; found: 586.2140.

2) Synthesis of Compound 21

The synthesis was proceeded in the same manner as the synthesis of Compound 1 except that 2 g of Compound 21c was used instead of Compound 1c. Through this, Compound 21 was obtained in 1.72 g (72%). HR LC/MS/MS m/z calcd for $C_{92}H_{56}B_2F_4N_{10}$ (M+): 1398.4812; found: 1398.4813.

Preparation Example 22. Synthesis of Compound 22

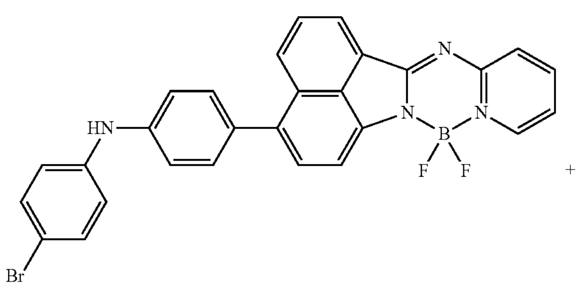

21a

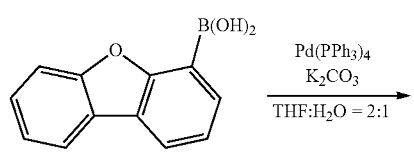

2b

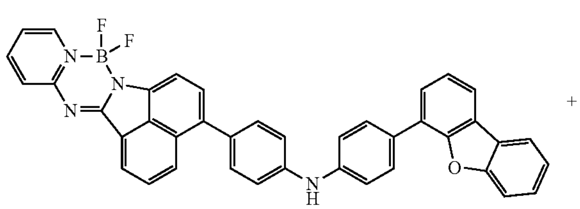

22c

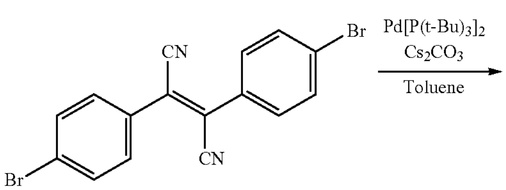

1d

-continued

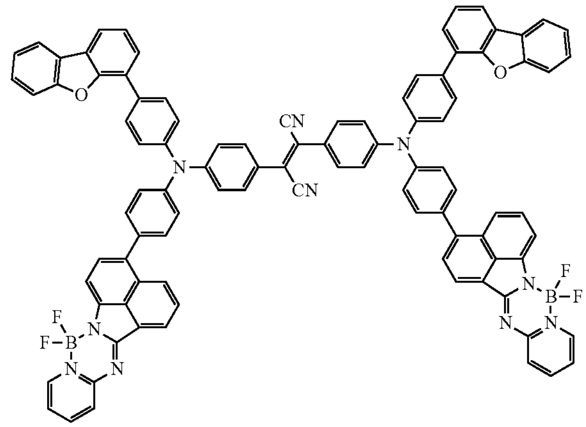

22

1) Synthesis of Compound 22c

The synthesis method was the same as the method preparing Compound 1c except that 2 g of Compound 21a was used instead of Compound 1a, and 2 equivalent of Compound 2b was used instead of Compound 1b. Herein, Compound 22c was obtained in 2.49 g (64%). HR LC/MS/MS m/z calcd $C_{40}H_{25}BF_2N_4O$ (M+): 626.2089; found: 626.2088.

2) Synthesis of Compound 22

The synthesis was proceeded in the same manner as the synthesis of Compound 1 except that 2 g of Compound 22c was used instead of Compound 1c. Through this, Compound 22 was obtained in 1.37 g (58%). HR LC/MS/MS m/z calcd for $C_{96}H_{56}B_2F_4N_{10}O_2$(M+): 1479.4743; found: 1479.4742.

Preparation Example 23. Synthesis of Compound 23

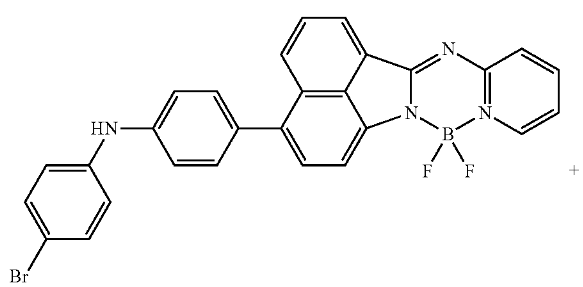

21a

-continued

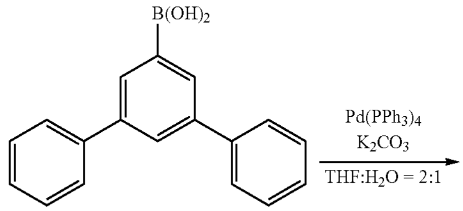

3b

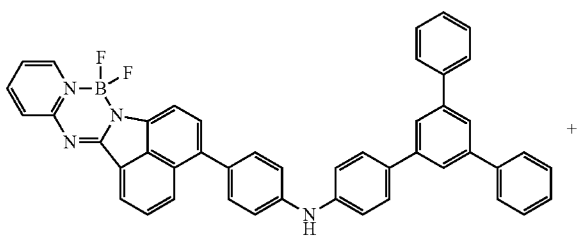

23c

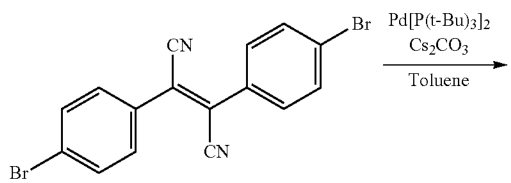

1d

-continued

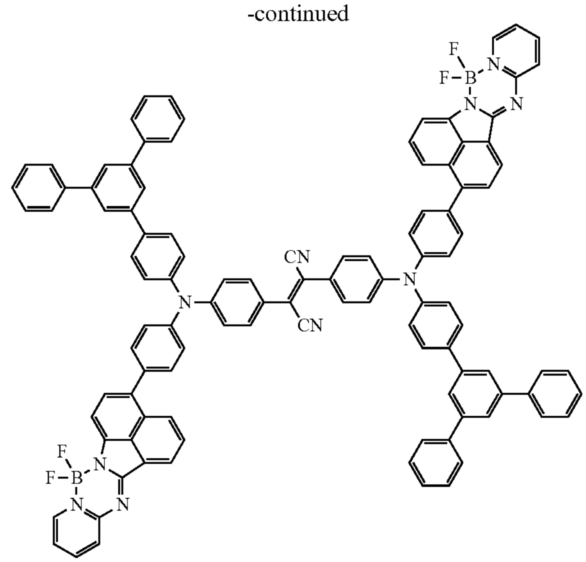

23

1) Synthesis of Compound 23c

The synthesis method was the same as the method preparing Compound 1c except that 2 g of Compound 21a was used instead of Compound 1a, and 2 equivalent of Compound 3b was used instead of Compound 1b. Herein, Compound 23c was obtained in 1.48 g (58%). HR LC/MS/MS m/z calcd $C_{46}H_{31}BF_2N_4$ (M+): 688.2610; found: 688.2612.

2) Synthesis of Compound 23

The synthesis was proceeded in the same manner as the synthesis of Compound 1 except that 2 g of Compound 23c was used instead of Compound 1c. Through this, Compound 23 was obtained in 1.77 g (76%). HR LC/MS/MS m/z calcd for $C_{108}H_{68}B_2F_4N_{10}$ (M+): 1603.5784; found: 1603.5783.

Preparation Example 24. Synthesis of Compound 24

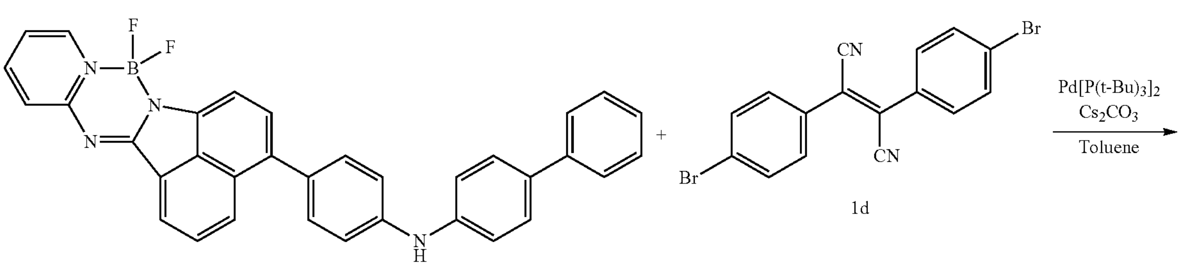

1d

24a

-continued
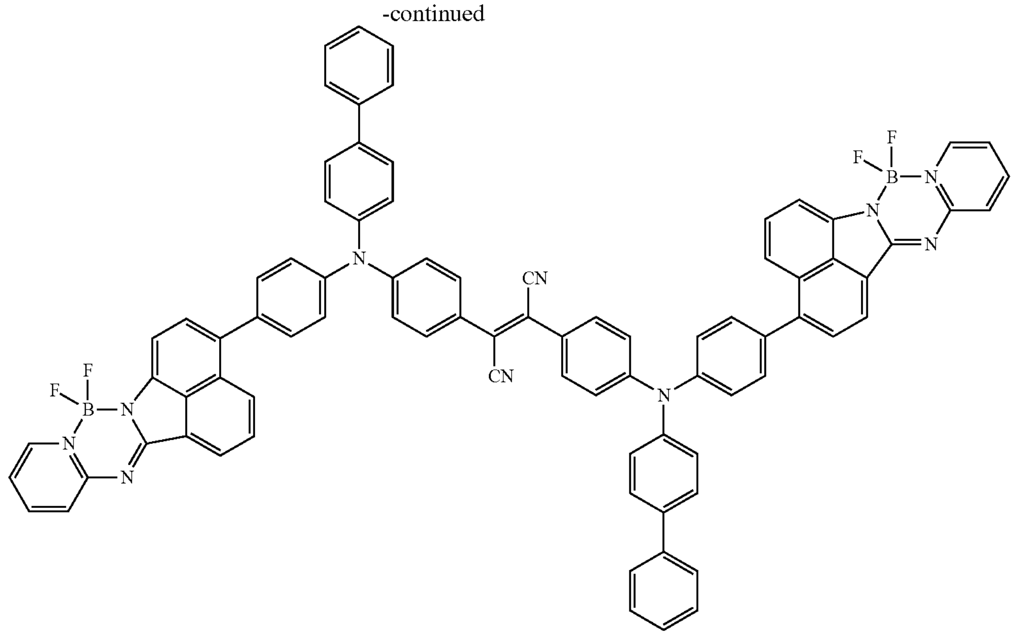
24
The synthesis was proceeded in the same manner as the synthesis of Compound 1 except that 2 g of Compound 24a was used instead of Compound 1c. Herein, Compound 24 was obtained in 1.57 g (65%). HR LC/MS/MS m/z calcd $C_{84}H_{52}B_2F_4N_{10}$ (M+): 1298.4499; found: 1298.4498.
Preparation Example 25. Synthesis of Compound 25
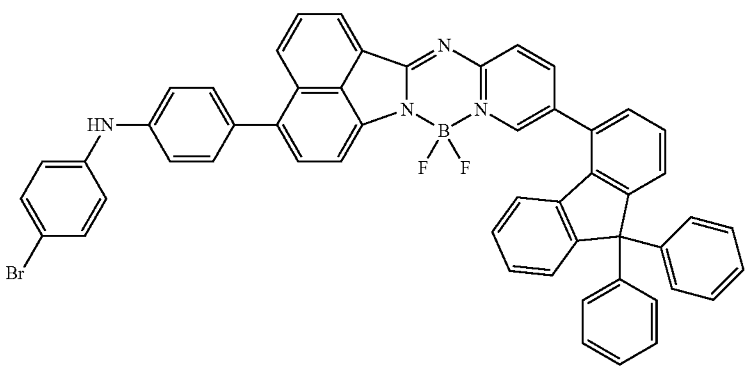
25a
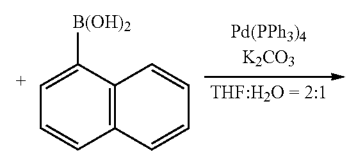
1b
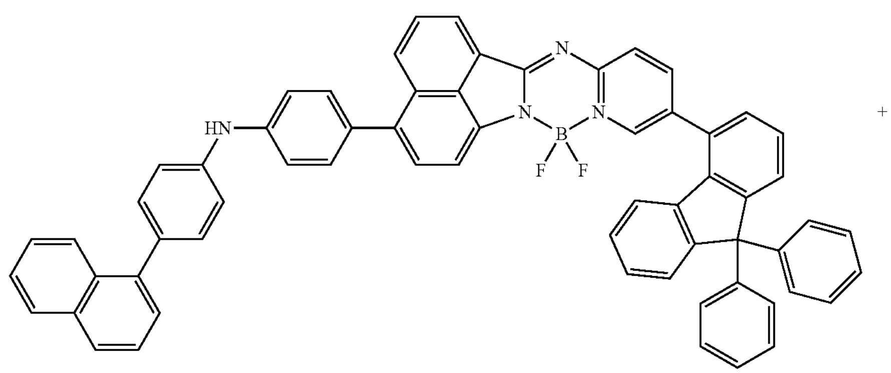
25c -continued

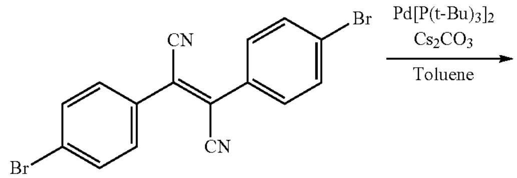

1d

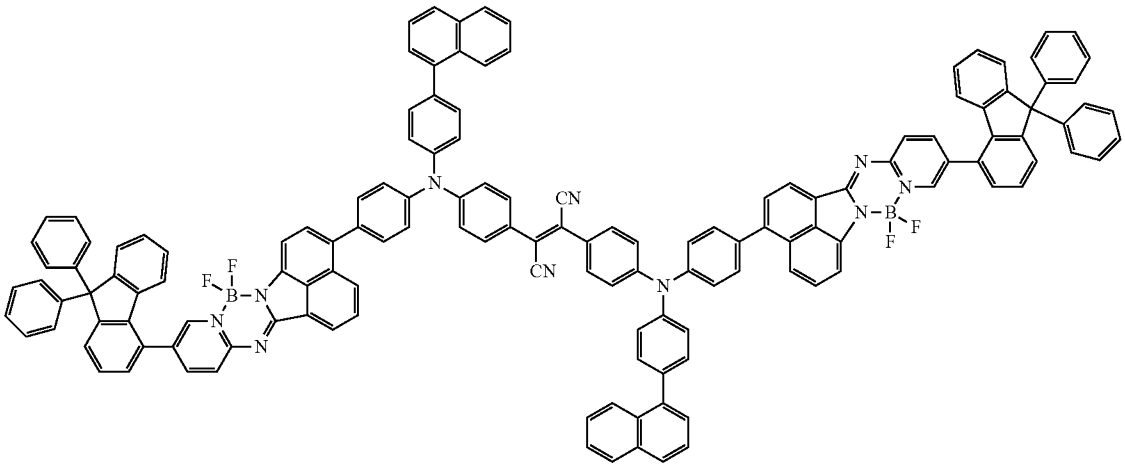

25

1) Synthesis of Compound 25c

The synthesis method was the same as the method preparing Compound 10 except that 2 g of Compound 25a was used instead of Compound 1a. Herein, Compound 25c was obtained in 1.52 g (72%). HR LC/MS/MS m/z calcd $C_{63}H_{41}BF_2N_4$ (M+): 902.3392; found: 902.3393.

2) Synthesis of Compound 25

The synthesis was proceeded in the same manner as the synthesis of Compound 1 except that 2 g of Compound 25c was used instead of Compound 10. Through this, Compound 25 was obtained in 1.51 g (67%). HR LC/MS/MS m/z calcd for $C_{142}H_{88}B_2F_4N_{10}$ (M+): 2031.7349; found: 2031.7349.

Preparation Example 26. Synthesis of Compound 26

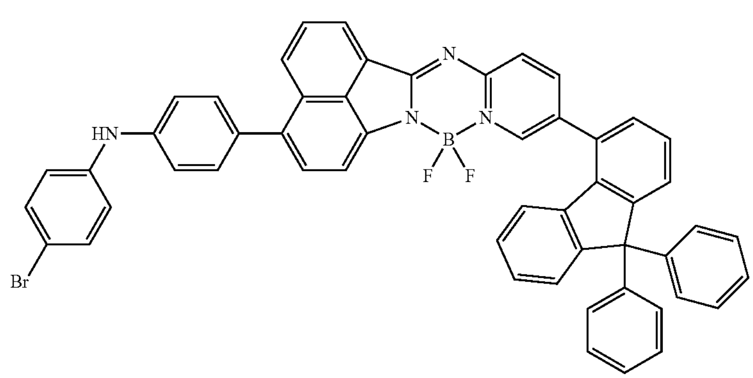

25a

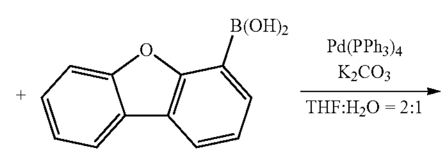

2b

-continued

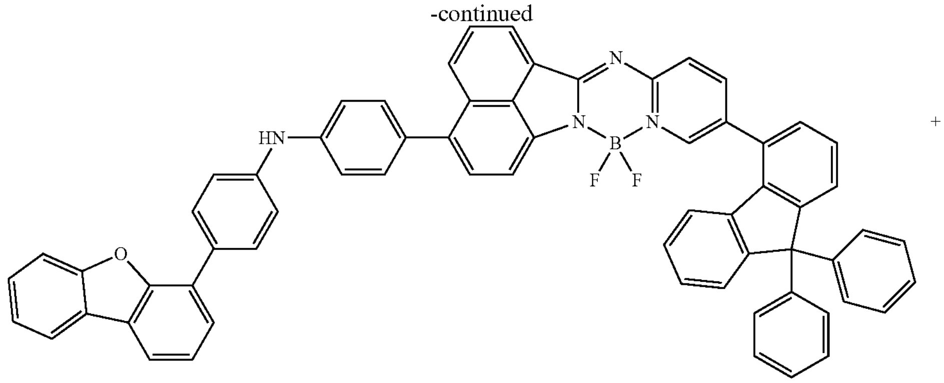

26c

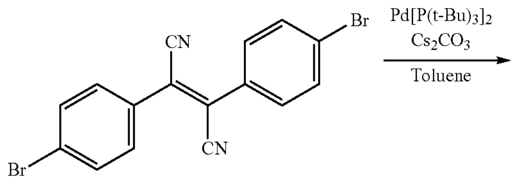

1d

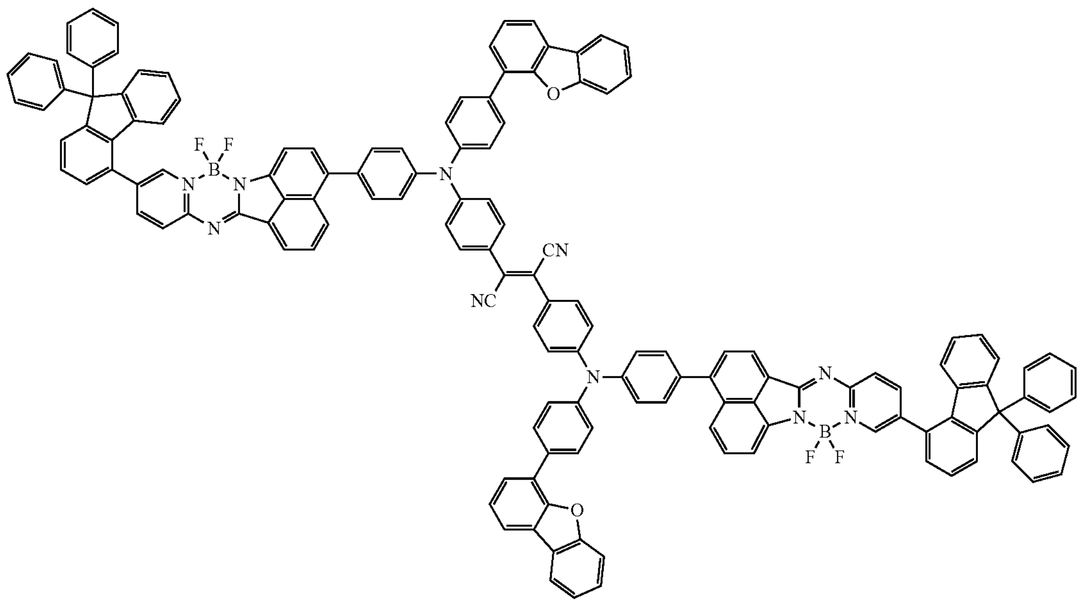

26

1) Synthesis of Compound 26c

The synthesis method was the same as the method preparing Compound 1c except that 2 g of Compound 25a was used instead of Compound 1a, and 2 equivalent of Compound 2b was used instead of Compound 1b. Herein, Compound 26c was obtained in 1.23 g (56%). HR LC/MS/MS m/z calcd $C_{65}H_{41}13\ F_2N_4O$ (M+): 942.3341; found: 942.3340.

2) Synthesis of Compound 26

The synthesis was proceeded in the same manner as the synthesis of Compound 1 except that 2 g of Compound 26c was used instead of Compound 1c. Through this, Compound 26 was obtained in 1.39 g (62%). HR LC/MS/MS m/z calcd for $C_{146}H_{88}B_2F_4N_{10}O_0$(M+): 2111.7248; found: 2111.7249.

Preparation Example 27. Synthesis of Compound 27
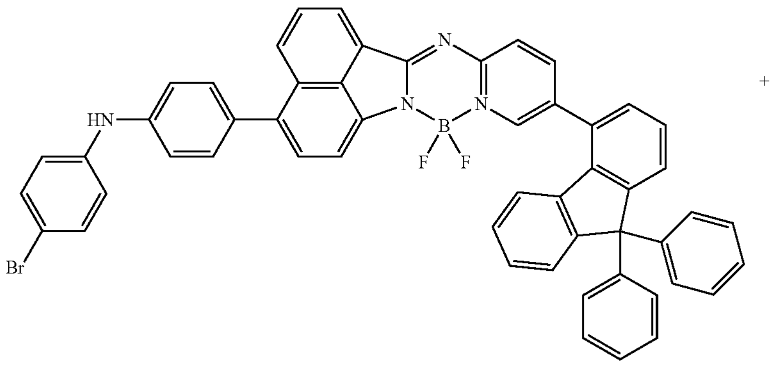
25a
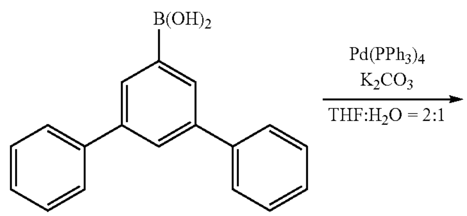
3b
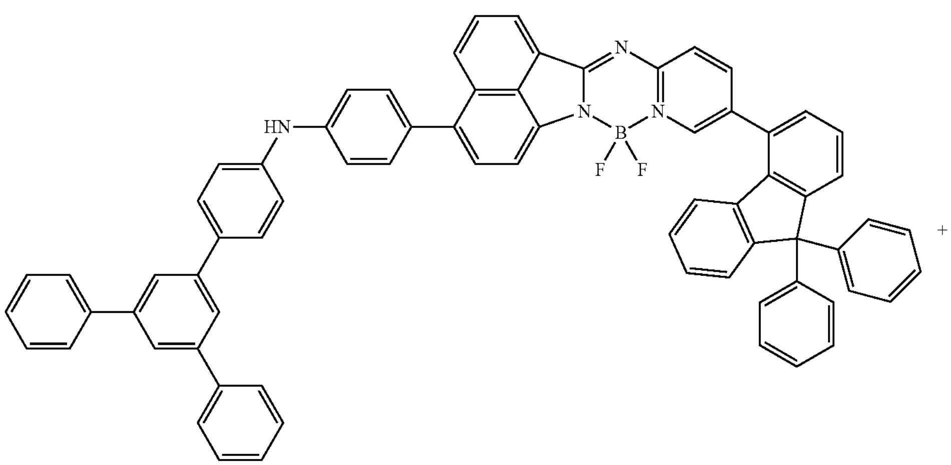
27c
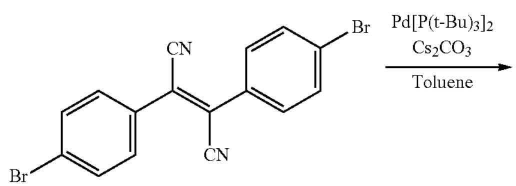
1d -continued

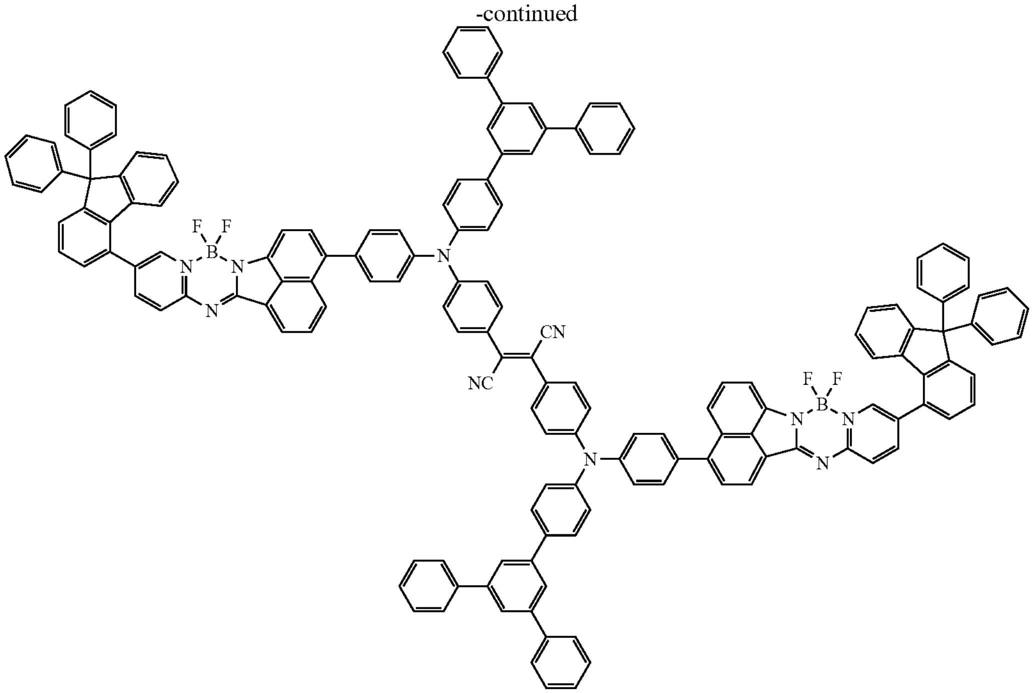

27

1) Synthesis of Compound 27c

The synthesis method was the same as the method preparing Compound 1c except that 2 g of Compound 25a was used instead of Compound 1a, and 2 equivalent of Compound 3b was used instead of Compound 1b. Herein, Compound 27c was obtained in 1.81 g (77%). HR LC/MS/MS m/z calcd $C_{71}H_{47}BF_2N_4$ (M+): 1004.3862; found: 1004.3862.

2) Synthesis of Compound 27

The synthesis was proceeded in the same manner as the synthesis of Compound 1 except that 2 g of Compound 27c was used instead of Compound 1c. Through this, Compound 27 was obtained in 1.27 g (57%). HR LC/MS/MS m/z calcd for $C_{158}H_{100}B_2F_4N_{10}$ (M+): 2235.8288; found: 2235.8287.

Preparation Example 28. Synthesis of Compound 28

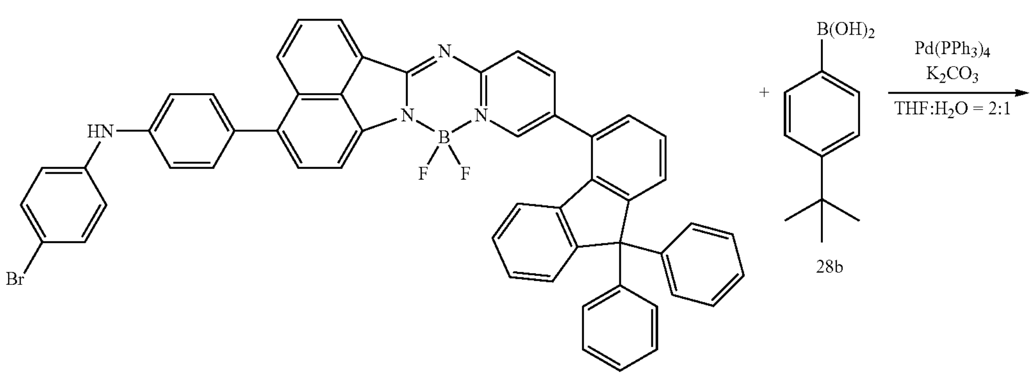

25a

-continued

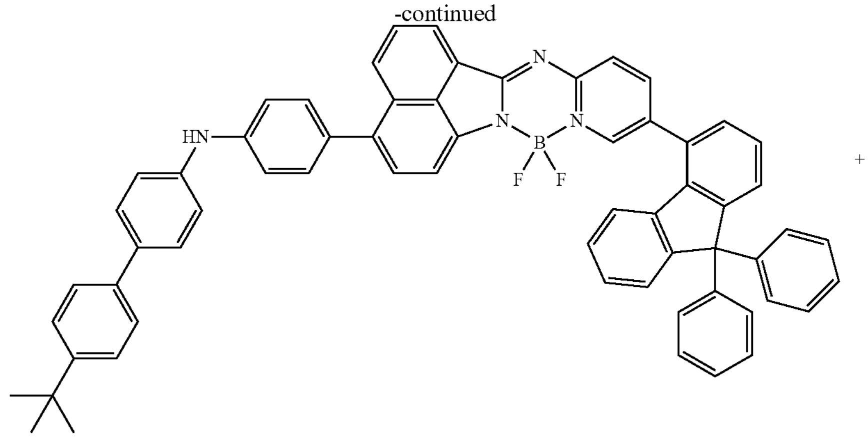

28c

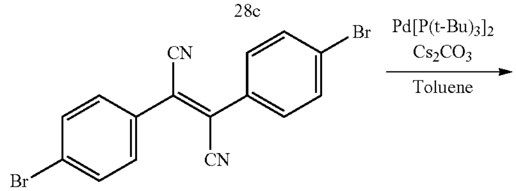

1d

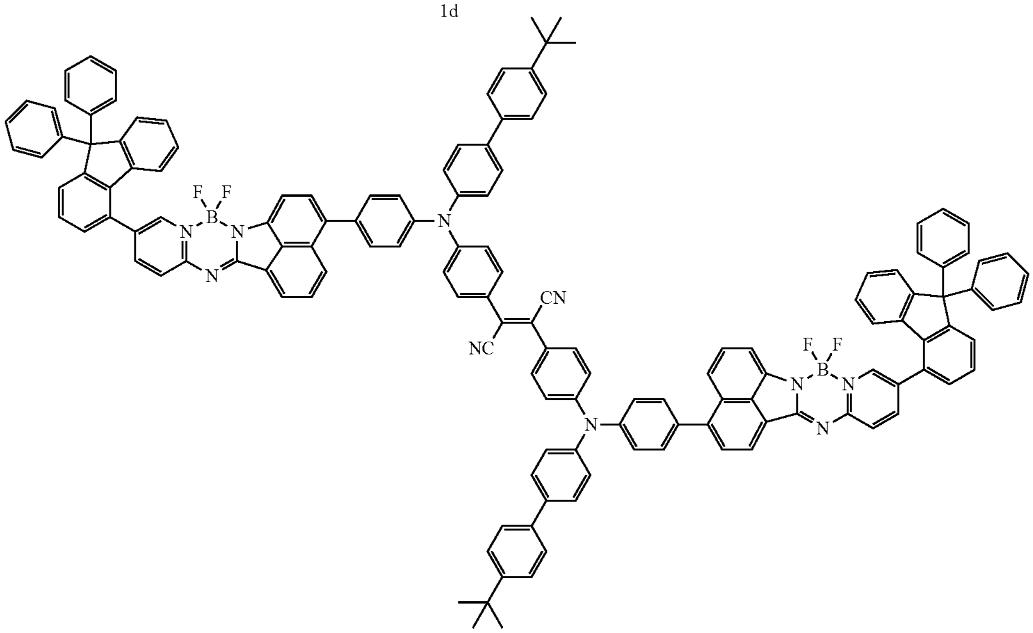

28

1) Synthesis of Compound 28c

The synthesis method was the same as the method preparing Compound 1c except that 2 g of Compound 25a was used instead of Compound 1a, and 2 equivalent of Compound 28b was used instead of Compound 1b. Herein, Compound 28c was obtained in 1.27 g (60%). HR LC/MS/MS m/z calcd $C_{63}H_{47}BF_2N_4$ (M+): 908.3862; found: 908.3864.

2) Synthesis of Compound 28

The synthesis was proceeded in the same manner as the synthesis of Compound 1 except that 2 g of Compound 28c was used instead of Compound 1c. Through this, Compound 28 was obtained in 1.30 g (58%). HR LC/MS/MS m/z calcd for $C_{142}H_{100}B_2F_4N_{10}$ (M+): 2043.8288; found: 2043.8287.

Preparation Example 29. Synthesis of Compound 29
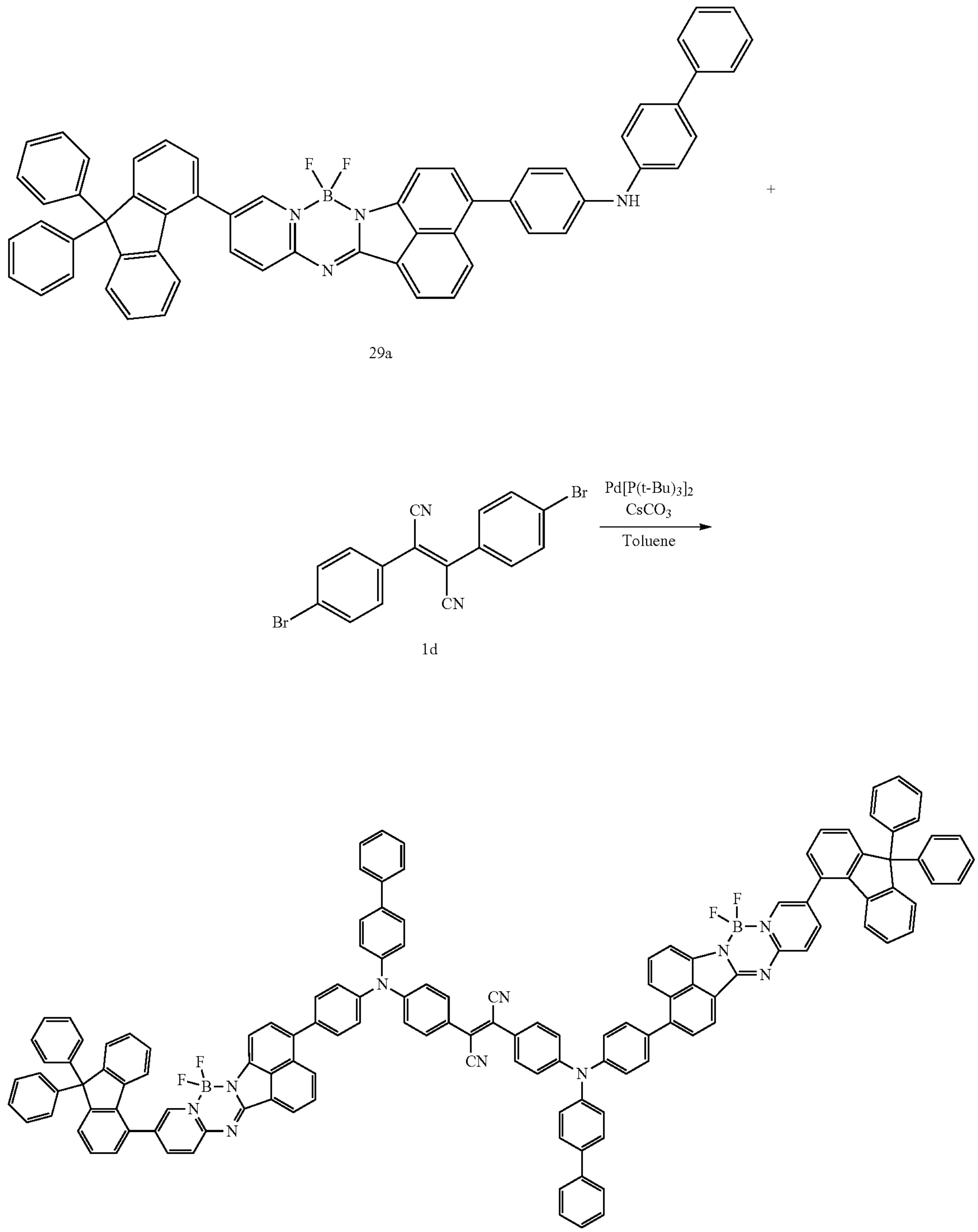
29
The synthesis was proceeded in the same manner as the synthesis of Compound 1 except that 2 g of Compound 29a was used instead of Compound 1c. Herein, Compound 29 was obtained in 1.54 g (68%). HR LC/MS/MS m/z calcd $C_{134}H_{84}B_2F_4N_{10}$ (M+): 1931.7036; found: 1931.7037.

Preparation Example 30. Synthesis of Compound 30
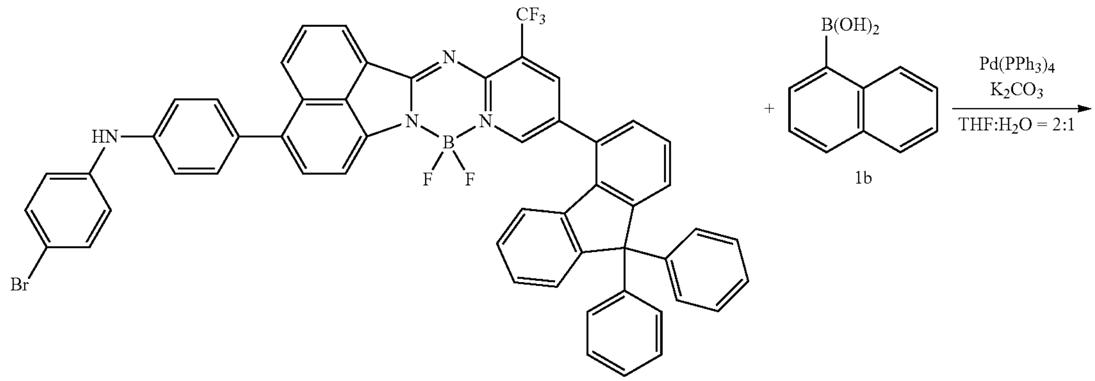
30a
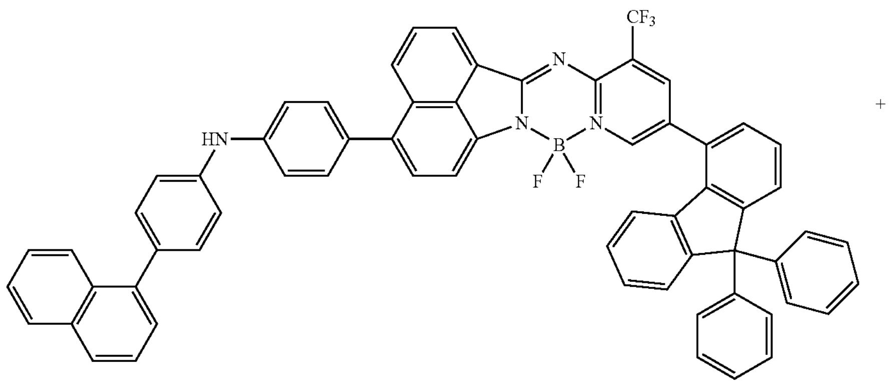
30c
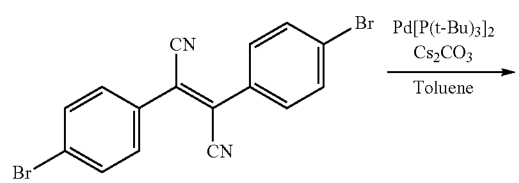
1d
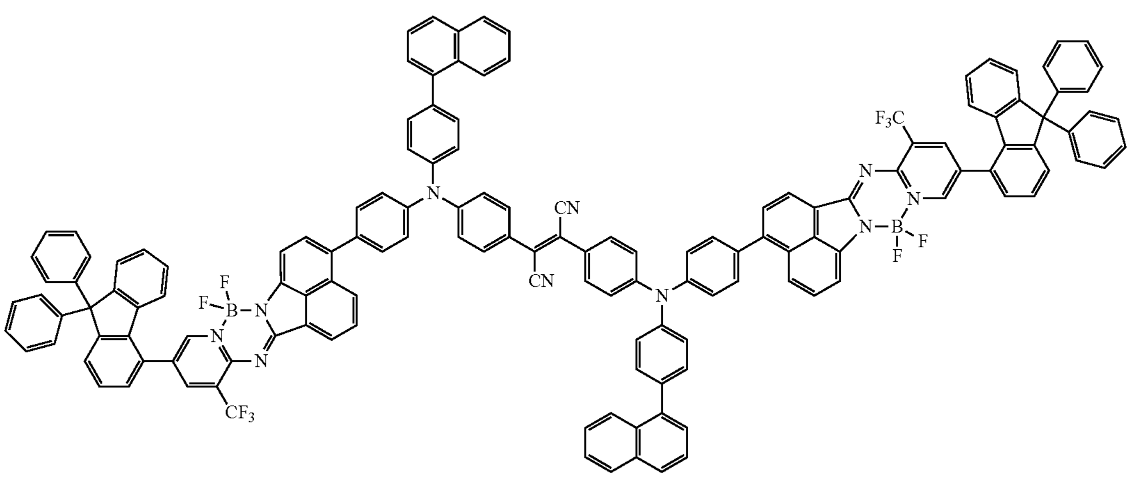
30

1) Synthesis of Compound 30c

The synthesis method was the same as the method preparing Compound 1c except that 2 g of Compound 30a was used instead of Compound 1a, and 2 equivalent of Compound 1b was used. Herein, Compound 30c was obtained in 1.41 g (67%). HR LC/MS/MS m/z calcd $C_{64}H_{40}BF_5N_4$ (M+): 970.3266; found: 970.3265.

2) Synthesis of Compound 30

The synthesis was proceeded in the same manner as the synthesis of Compound 1 except that 2 g of Compound 30c was used instead of Compound 1c. Through this, Compound 30 was obtained in 1.27 g (57%). HR LC/MS/MS m/z calcd for $C_{144}H_{86}B_2F_{10}N_{10}$ (M+): 2167.7097; found: 2167.7099.

Preparation Example 31. Synthesis of Compound 31

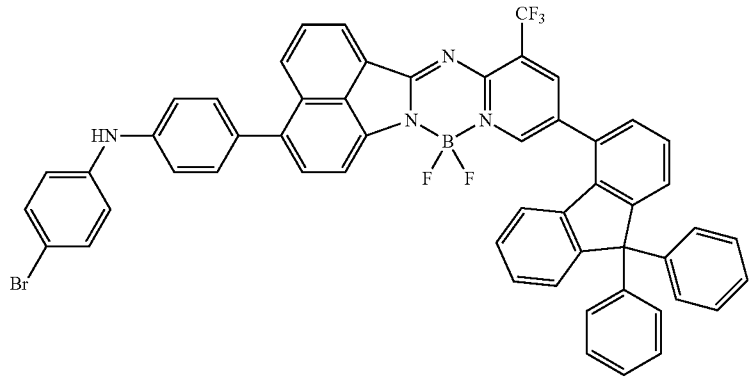

30a

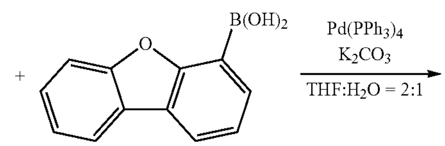

2b

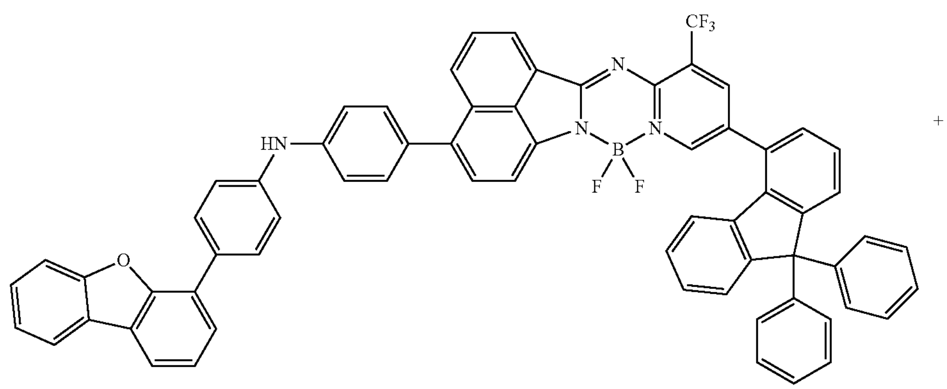

31c

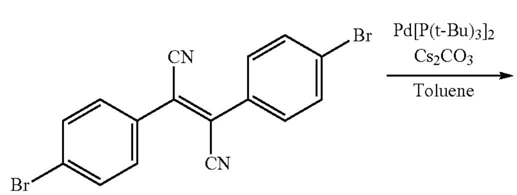

1d

-continued

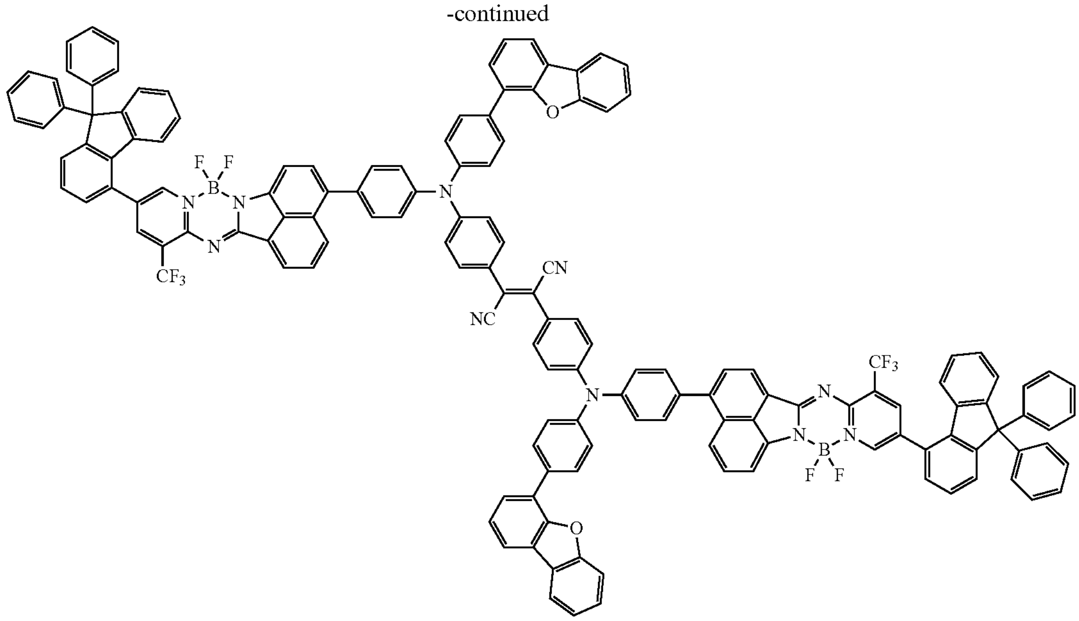

31

1) Synthesis of Compound 31c

The synthesis method was the same as the method preparing Compound 1c except that 2 g of Compound 30a was used instead of Compound 1a, and 2 equivalent of Compound 2b was used instead of Compound 1b. Herein, Compound 31c was obtained in 1.60 g (73%). HR LC/MS/MS m/z calcd $C_{66}H_{40}BF_5N_4O$ (M+): 1010.3215; found: 1010.3216.

2) Synthesis of Compound 31

The synthesis was proceeded in the same manner as the synthesis of Compound 1 except that 2 g of Compound 31c was used instead of Compound 1c. Through this, Compound 31 was obtained in 1.47 g (66%). HR LC/MS/MS m/z calcd for $C_{148}H_{86}B_2F_{10}N_{10}O_2$ (M+): 2247.6995; found: 2247.6997.

Preparation Example 32. Synthesis of Compound 32

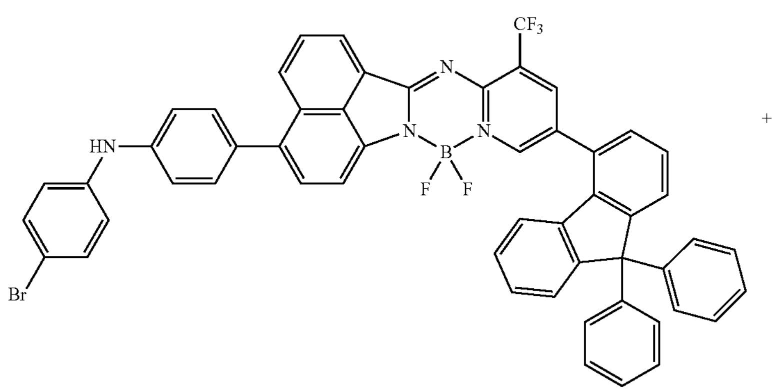

30a

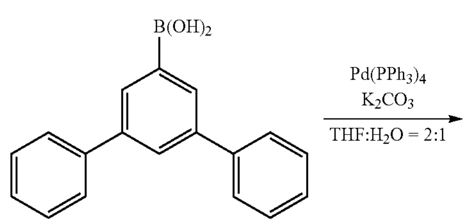

3b

-continued

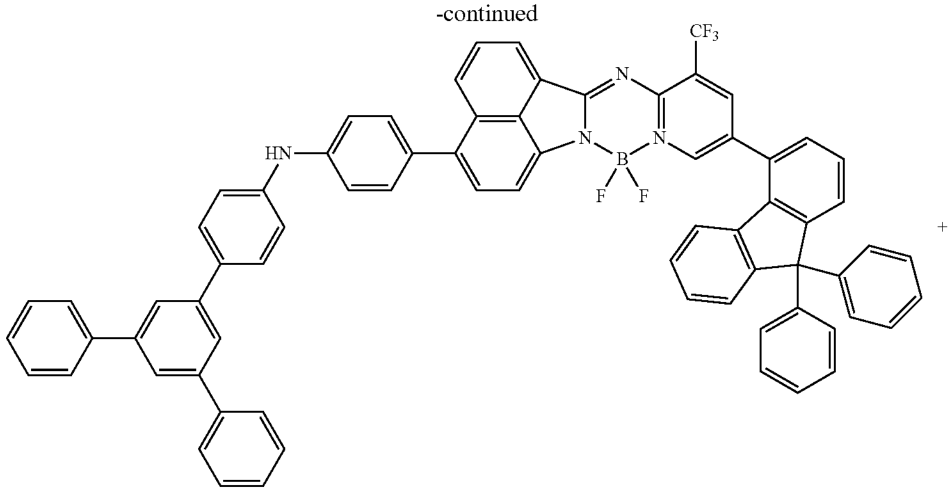

32c

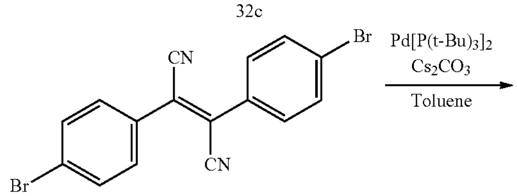

1d

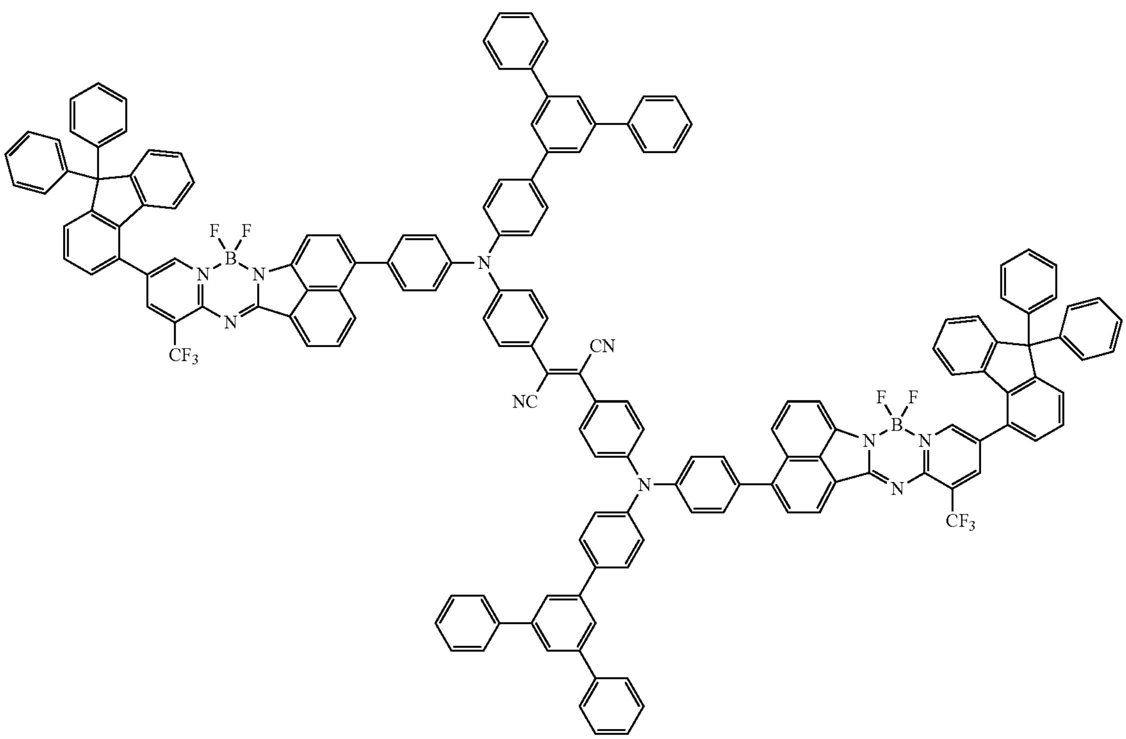

32

1) Synthesis of Compound 32c

The synthesis method was the same as the method preparing Compound 1c except that 2 g of Compound 30a was used instead of Compound 1a, and 2 equivalent of Compound 3b was used instead of Compound 1b. Herein, Compound 32c was obtained in 1.32 g (57%). HR LC/MS/MS m/z calcd $C_{72}H_{46}BF_5N_4$ (M+): 1072.3736; found: 1072.3735.

2) Synthesis of Compound 32

The synthesis was proceeded in the same manner as the synthesis of Compound 1 except that 2 g of Compound 32c was used instead of Compound 1c. Through this, Compound 32 was obtained in 1.66 g (75%). HR LC/MS/MS m/z calcd for $C_{160}H_{98}B_2F_{10}N_{10}$ (M+): 2371.8036; found: 2371.8035.

Preparation Example 33. Synthesis of Compound 33
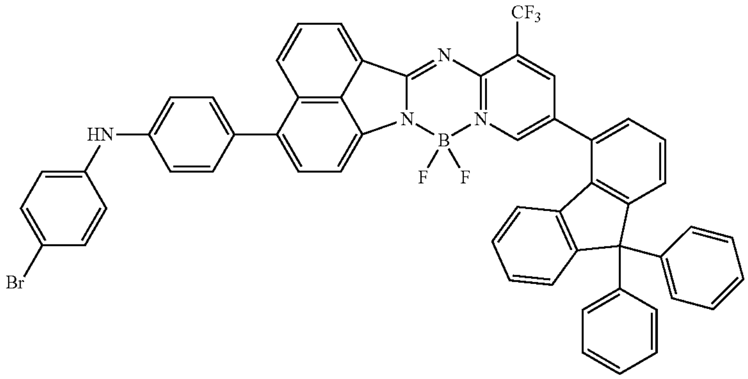
30a
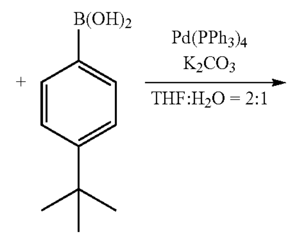
33b
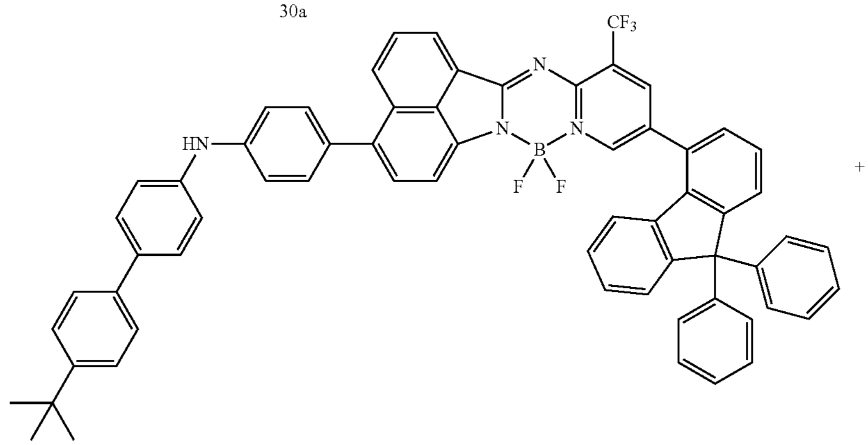
33c
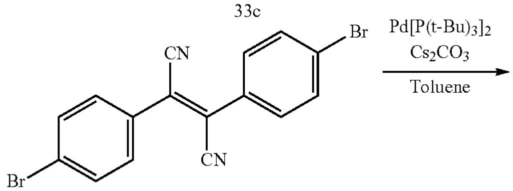
1d
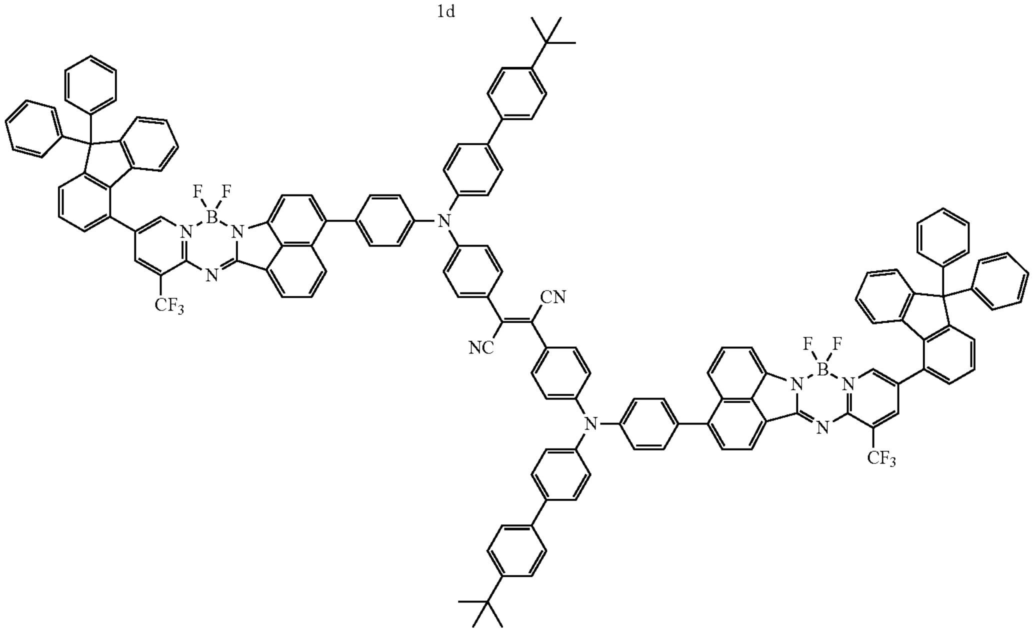
33

1) Synthesis of Compound 33c

The synthesis method was the same as the method preparing Compound 1c except that 2 g of Compound 30a was used instead of Compound 1a, and 2 equivalent of Compound 33b was used instead of Compound 1b. Herein, Compound 33c was obtained in 1.63 g (77%). HR LC/MS/MS m/z calcd $C_{64}H_{46}BF_5N_4$ (M+): 976.3736; found: 976.3736.

2) Synthesis of Compound 33

The synthesis was proceeded in the same manner as the synthesis of Compound 1 except that 2 g of Compound 33c was used instead of Compound 1c. Through this, Compound 33 was obtained in 1.81 g (81%). HR LC/MS/MS m/z calcd for $C_{144}H_{98}B_2F_{10}N_{10}$ (M+): 2179.8036; found: 2179.8035.

Preparation Example 34. Synthesis of Compound 34

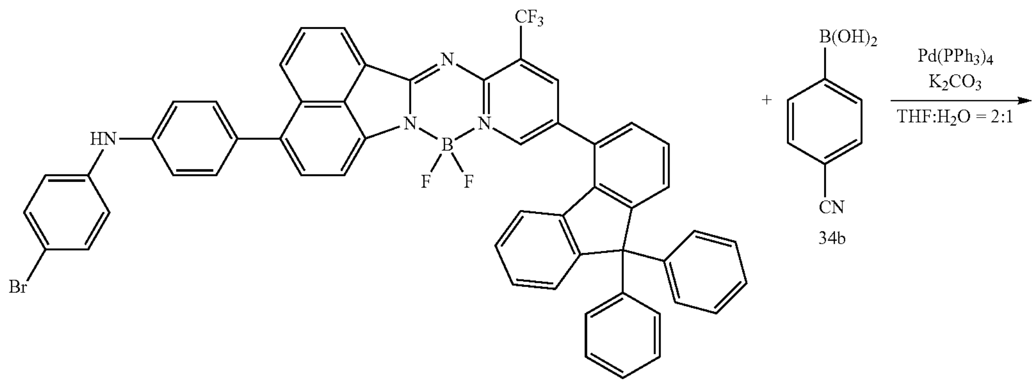

30a

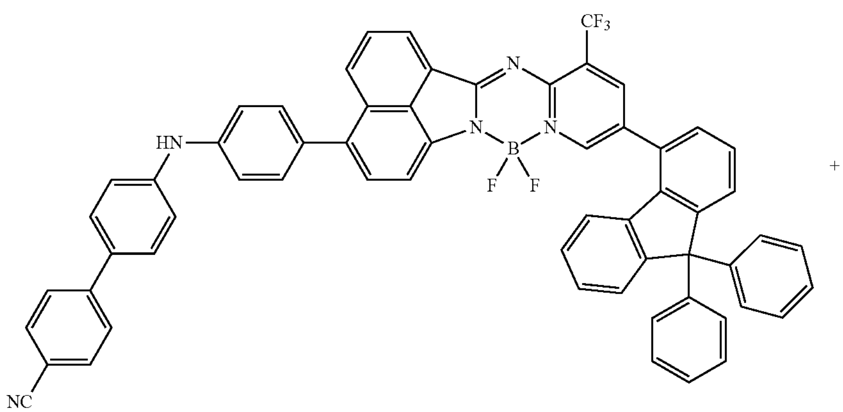

34c

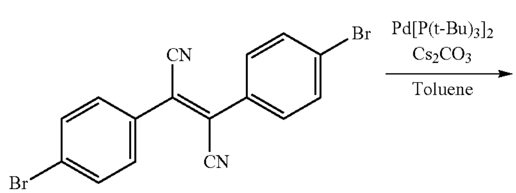

1d

-continued

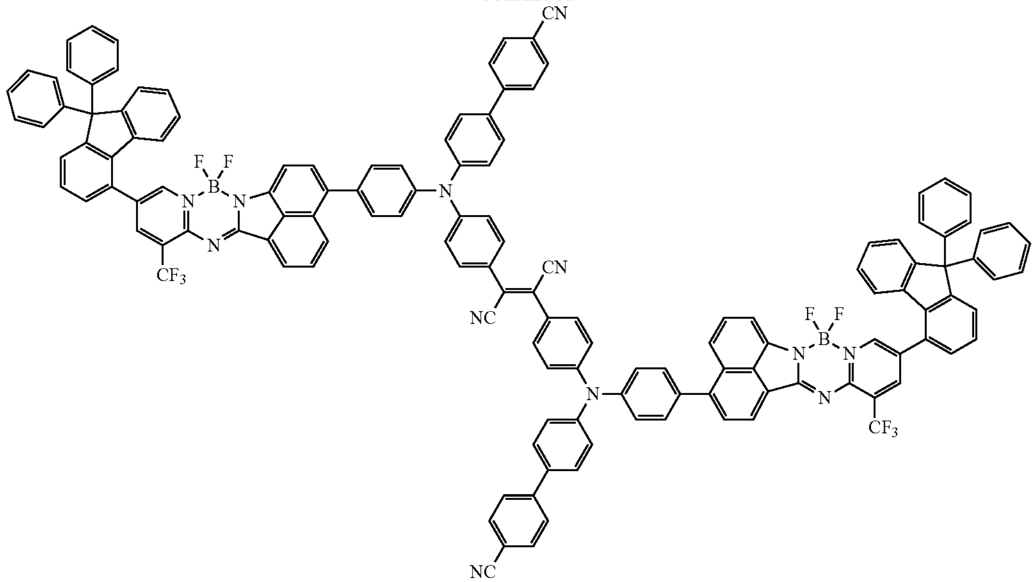

34

1) Synthesis of Compound 34c

The synthesis method was the same as the method preparing Compound 1c except that 2 g of Compound 30a was used instead of Compound 1a, and 2 equivalent of Compound 34b was used instead of Compound 1b. Herein, Compound 34c was obtained in 1.37 g (67%). HR LC/MS/MS m/z calcd $C_{61}H_{37}BF_5N_5$ (M+): 945.3062; found: 945.3061.

2) Synthesis of Compound 34

The synthesis was proceeded in the same manner as the synthesis of Compound 1 except that 2 g of Compound 34c was used instead of Compound 1c. Through this, Compound 34 was obtained in 1.21 g (54%). HR LC/MS/MS m/z calcd for $C_{138}H_{80}B_2F_{10}N_{12}$ (M+): 2117.6689; found: 2117.6689.

Preparation Example 35. Synthesis of Compound 35

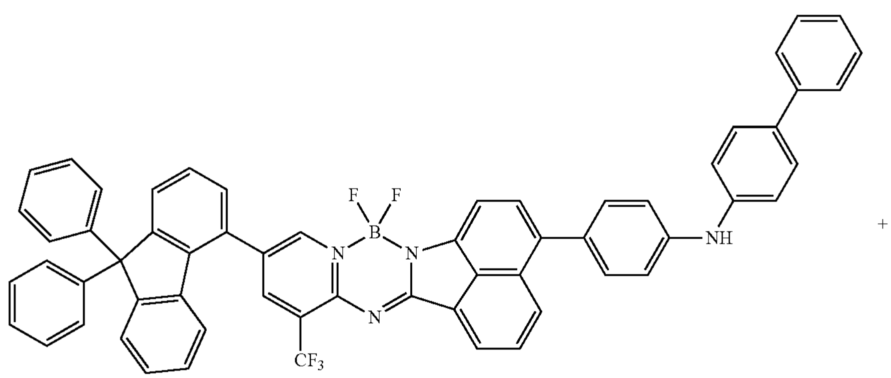

35a

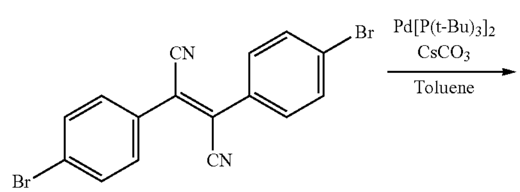

1d

-continued
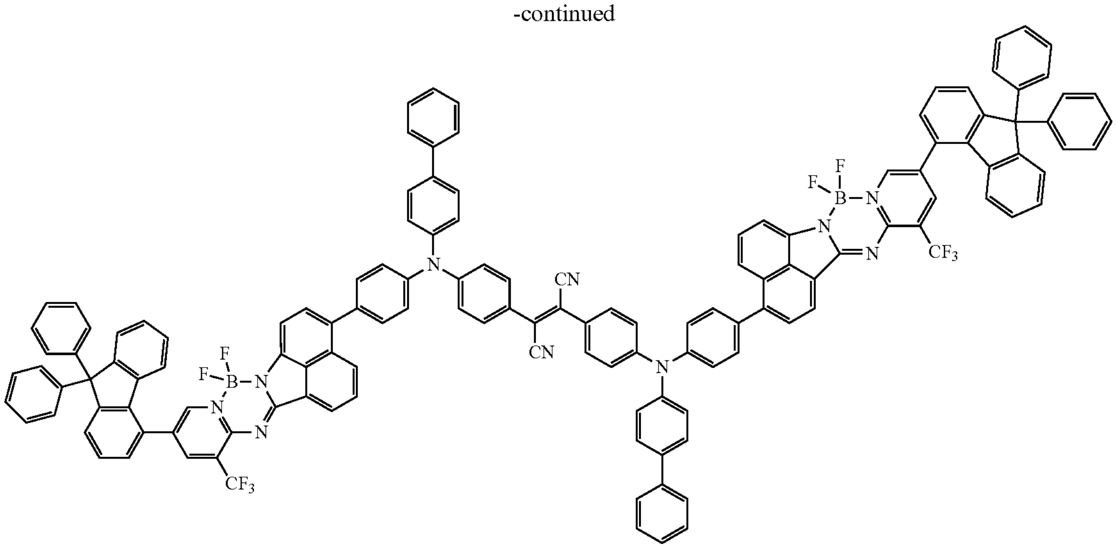
35
The synthesis was proceeded in the same manner as the synthesis of Compound 1 except that 2 g of Compound 35a was used instead of Compound 1c. Herein, Compound 35 was obtained in 1.48 g (66%). HR LC/MS/MS m/z calcd $C_{136}H_{82}B_2F_{10}N_{10}$ (M+): 2067.6784; found: 2067.6783.
Preparation Example 36. Synthesis of Compound 36
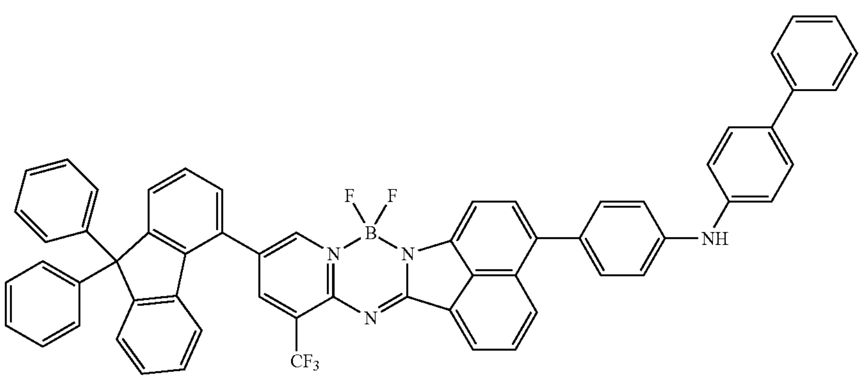
35a
+
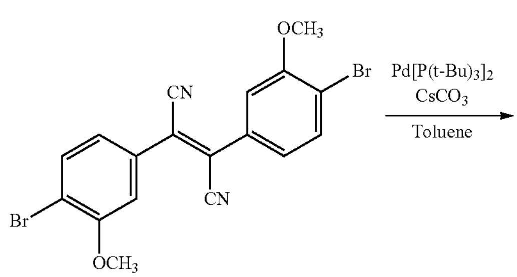
8d -continued
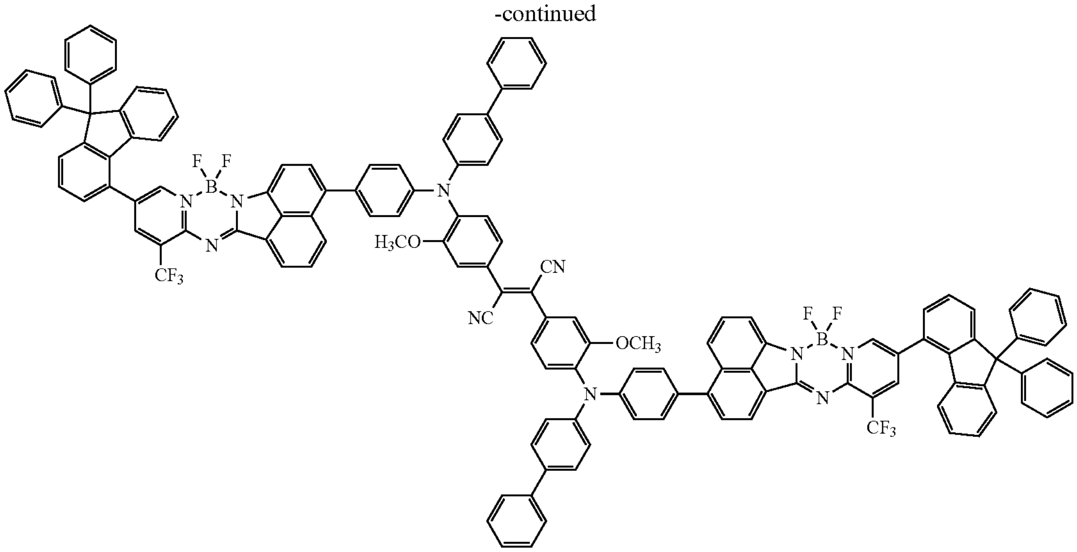
36
The synthesis was proceeded in the same manner as the synthesis of Compound 1 except that 2 g of Compound 35a was used instead of Compound 1c, and Compound 8d was used instead of Compound 1d. Herein, Compound 36 was obtained in 1.20 g (52%). HR LC/MS/MS m/z calcd $C_{138}H_{86}B_2F_{10}N_{10}O_2$ (M+): 2127.6995; found: 2127.6997.
Preparation Example 37. Synthesis of Compound 37
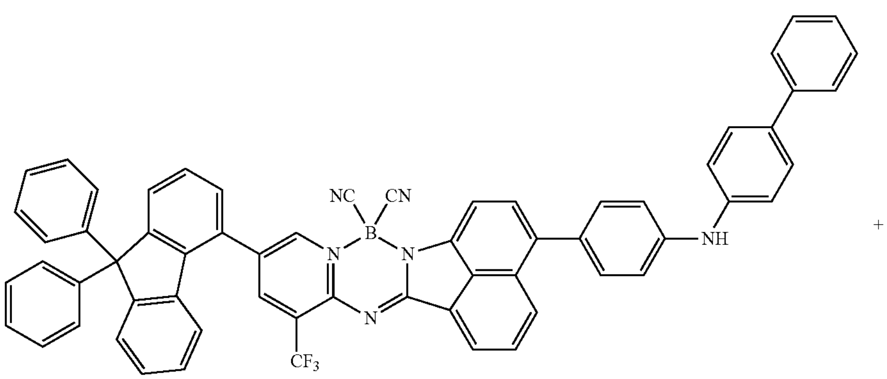
37a
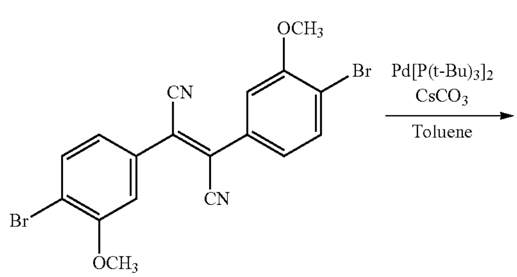
8d -continued
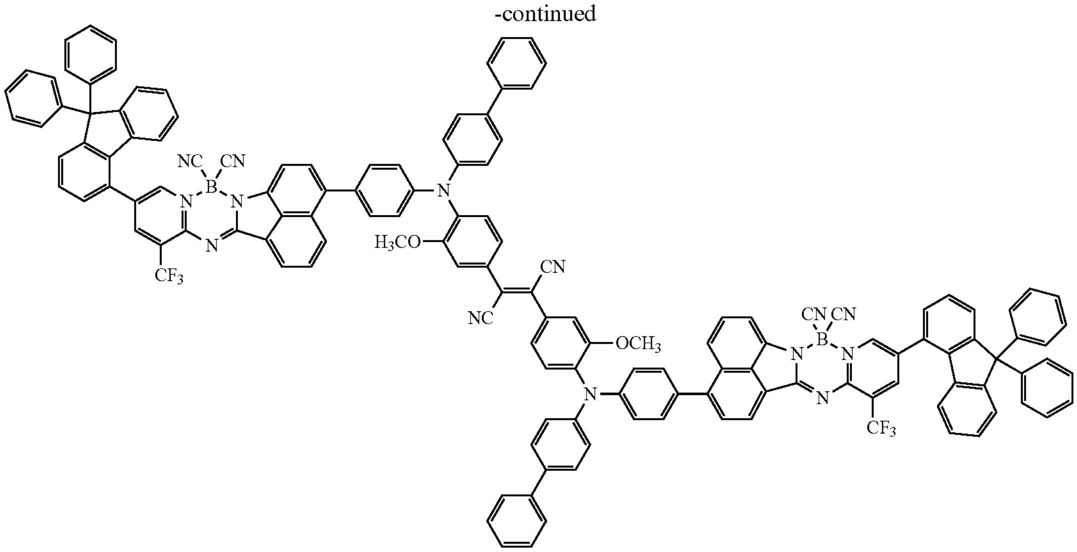
37
The synthesis was proceeded in the same manner as the synthesis of Compound 1 except that 2 g of Compound 37a was used instead of Compound 1c, and Compound 8d was used instead of Compound 1d. Herein, Compound 37 was obtained in 1.75 g (76%). HR LC/MS/MS m/z calcd $C_{142}H_{86}B_2F_6N_{14}O_2$(M+): 2155.7182; found: 2155.7182.
Preparation Example 38. Synthesis of Compound 38
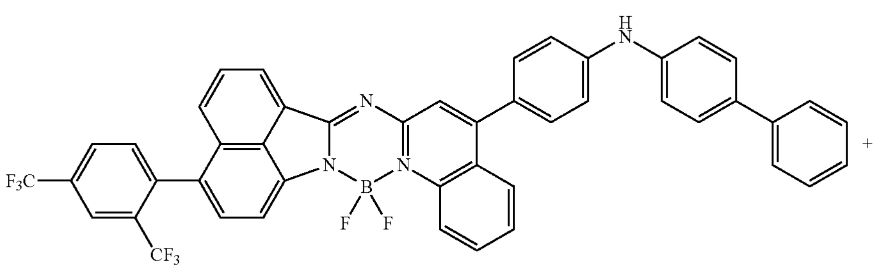
38a
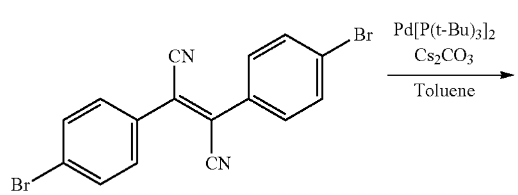
1d -continued
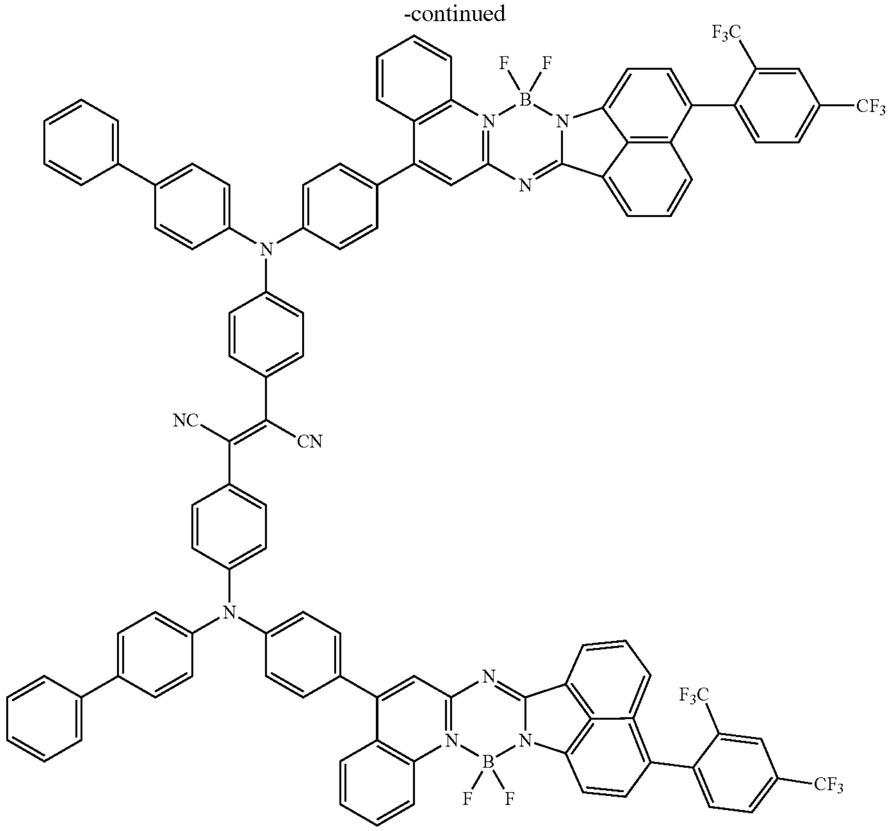
38
The synthesis was proceeded in the same manner as the synthesis of Compound 1 except that 2 g of Compound 38a was used instead of Compound 1c. Herein, Compound 38 was obtained in 1.64 g (72%). HR LC/MS/MS m/z calcd C108H60B2F16N10 (M+): 1823.4970; found: 1823.4969.
Preparation Example 39. Synthesis of Comparative Compound B5
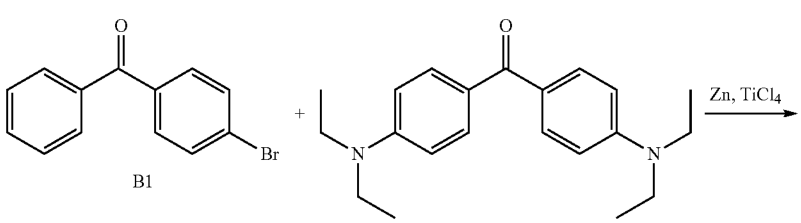

-continued

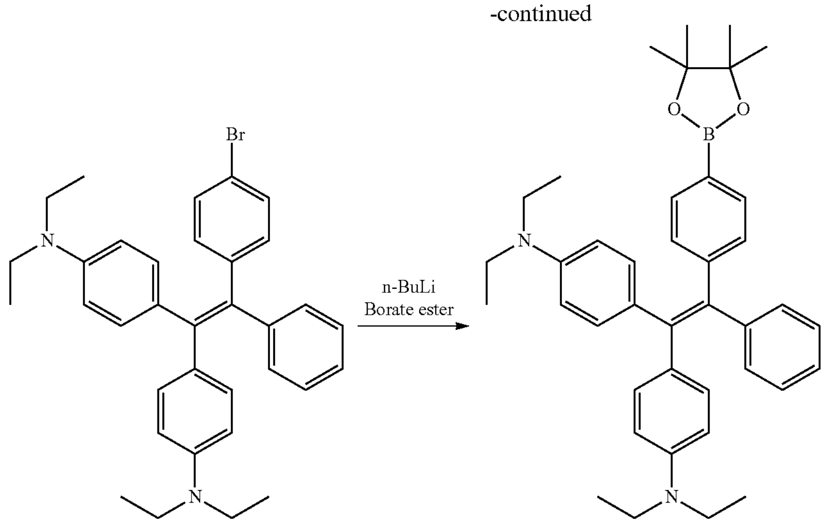

B3 B4

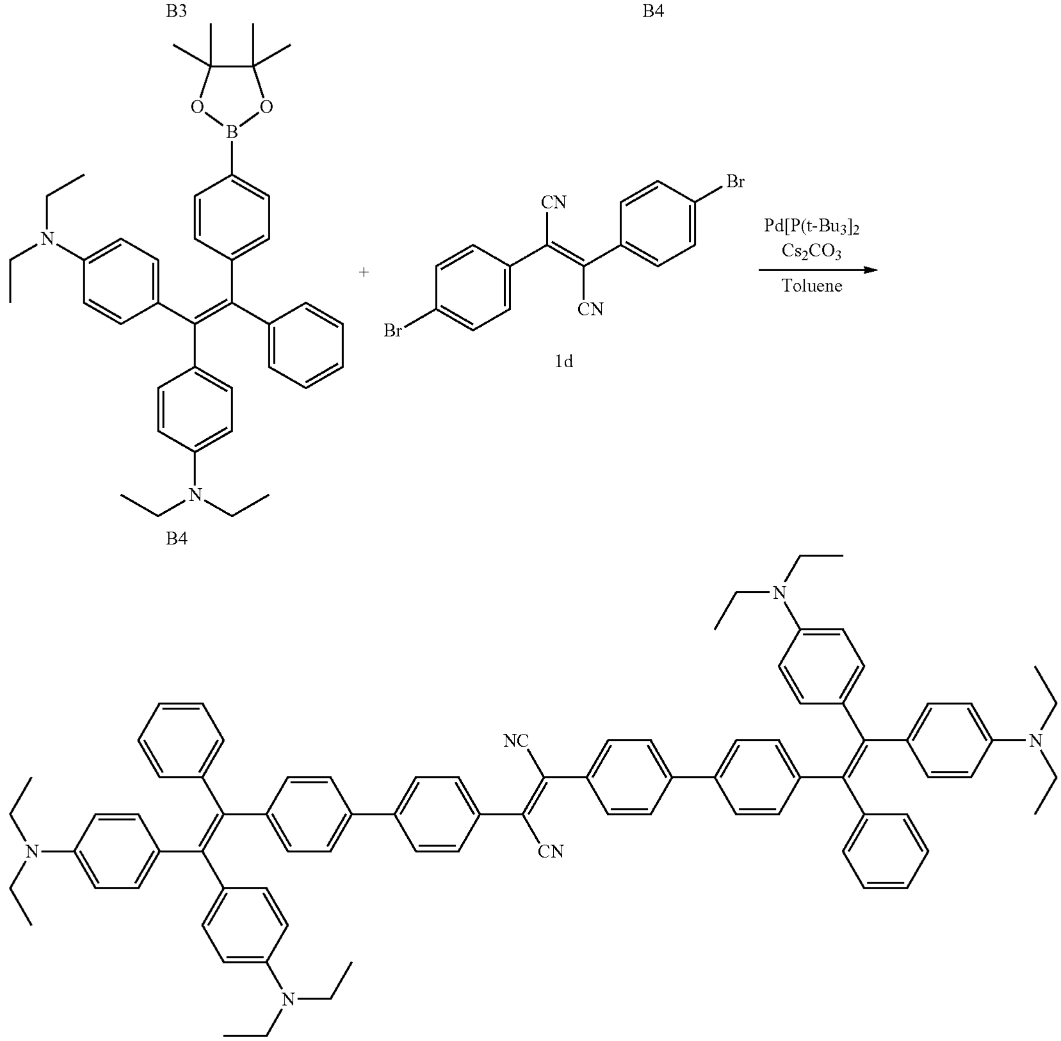

B4 1d

B5

1) Synthesis of Comparative Compound B3

After dissolving Compound B1 (5 g), Compound B2 (1 equivalent) and zinc (4 equivalent) in THF (50 mL), the temperature was lowered to −78° C., and the mixture was stirred under nitrogen. After the temperature was stabilized, $TiCl_4$ (2 equivalent) was slowly added thereto, and after completing a dropwise addition, the temperature was raised to room temperature, and the result was stirred for 30 minutes. After the stirring for 30 minutes, the temperature was raised to 70° C., and the result was stirred while heating to complete the reaction. When the reaction was completed, a 10% potassium carbonate solution was added, and a produced solid compound was filtered. The filtered filtrate was secured and extracted using chloroform and water. After removing water from the extracted organic layer using anhydrous magnesium sulfate, the water-removed organic layer was concentrated through vacuum distillation, and then a product was obtained using chloroform and ethanol. Through this, Compound B3 was obtained in 7.95 g (75%). HR LC/MS/MS m/z calcd for $C_{34}H_{37}BrN_2$ (M+): 552.2140; found: 552.2139.

2) Synthesis of Comparative Compound B4

After diluting synthesized Compound B3 (5 g) in THF (100 mL), the reaction temperature was stabilized to −78° C., and the reaction material was stirred under nitrogen. To the stabilized solution, a 1.6 M n-BuLi solution (1.2 equivalent) was slowly added dropwise using a syringe. After maintaining stirring for 30 minutes, boronate ester (2 equivalent) was added thereto, and the reaction temperature was raised to room temperature to proceed a reaction. After the reaction was completed, the result was extracted using chloroform and water. After removing water from the extracted organic layer using anhydrous magnesium sulfate, the water-removed organic layer was concentrated through vacuum distillation, and then a product was obtained using chloroform and ethanol. Through this, Compound B4 was obtained in 2.88 g (63%). HR LC/MS/MS m/z calcd for $C_{40}H_{49}BN_2O_2$ (M+): 600.3887; found: 600.3888.

3) Synthesis of Comparative Compound B5

The synthesis was proceeded in the same manner as the synthesis of Compound 1 except that 2 g of Compound B4 was used. Herein, Compound B5 was obtained in 1.52 g (78%). HR LC/MS/MS m/z calcd $C_{84}H_{82}N_6$(M+): 1174.6601; found: 1174.6600.

Example 1

A solution was prepared by dissolving 1.5 parts by weight of Compound 1 prepared in Preparation Example 1 (maximum absorption wavelength 423 nm, 450 nm, maximum light emission wavelength 621 nm in toluene solution), 33.9 parts by weight of an acryl-based binder, 59.3 parts by weight of a multifunctional monomer (pentaerythritol triacrylate, Nippon Kayaku Co., Ltd.), 2.3 parts by weight of an adhesive aid and surfactant (KBM 503, Shin-Etsu) and 3.0 parts by weight of a photoinitiator (Tinuvin® 477, BASF Corporation) in a propylene glycol monomethyl ether acetate (PGEMA) solvent so that the solid content becomes 21% by weight. After sufficiently stirring the mixed solution, a thin film was coated on a glass substrate, and the result was dried to prepare a color conversion film. A luminance spectrum of the prepared color conversion film was measured using a spectroradiometer (SR series of TOPCON Technohouse Corporation). Specifically, the prepared color conversion film was laminated on one surface of, in a backlight unit including an LED blue backlight (maximum light emission wavelength 450 nm) and a light guide plate, the light guide plate, a prism sheet and a DBEF film were laminated on the color conversion film, and an initial value was set so that brightness of the blue LED light becomes 600 nit based on the film.

Example 2

An experiment was performed in the same manner as in Example 1 except that Compound 2 (maximum absorption wavelength 427 nm, 454 nm, maximum light emission wavelength 630 nm in toluene solution) was used instead of Compound 1.

Example 3

An experiment was performed in the same manner as in Example 1 except that Compound 3 (maximum absorption wavelength 428 nm, 454 nm, maximum light emission wavelength 635 nm in toluene solution) was used instead of Compound 1.

Example 4

An experiment was performed in the same manner as in Example 1 except that Compound 8 (maximum absorption wavelength 472 nm, 496 nm, maximum light emission wavelength 652 nm in toluene solution) was used instead of Compound 1.

Example 5

An experiment was performed in the same manner as in Example 1 except that Compound 9 (maximum absorption wavelength 492 nm, 506 nm, maximum light emission wavelength 655 nm in toluene solution) was used instead of Compound 1.

Example 6

An experiment was performed in the same manner as in Example 1 except that Compound 12 (maximum absorption wavelength 468 nm, 495 nm, maximum light emission wavelength 652 nm in toluene solution) was used instead of Compound 1.

Example 7

An experiment was performed in the same manner as in Example 1 except that Compound 13 (maximum absorption wavelength 473 nm, 500 nm, maximum light emission wavelength 655 nm in toluene solution) was used instead of Compound 1.

Example 8

An experiment was performed in the same manner as in Example 1 except that Compound 21 (maximum absorption wavelength 463 nm, 490 nm, maximum light emission wavelength 640 nm in toluene solution) was used instead of Compound 1.

Example 9

An experiment was performed in the same manner as in Example 1 except that Compound 22 (maximum absorption wavelength 467 nm, 495 nm, maximum light emission wavelength 650 nm in toluene solution) was used instead of Compound 1.

Example 10

An experiment was performed in the same manner as in Example 1 except that Compound 23 (maximum absorption wavelength 468 nm, 495 nm, maximum light emission wavelength 652 nm in toluene solution) was used instead of Compound 1.

Example 11

An experiment was performed in the same manner as in Example 1 except that Compound 24 (maximum absorption wavelength 488 nm, 511 nm, maximum light emission wavelength 667 nm in toluene solution) was used instead of Compound 1.

Example 12

An experiment was performed in the same manner as in Example 1 except that Compound 25 (maximum absorption wavelength 470 nm, 500 nm, maximum light emission wavelength 650 nm in toluene solution) was used instead of Compound 1.

Example 13

An experiment was performed in the same manner as in Example 1 except that Compound 26 (maximum absorption wavelength 475 nm, 504 nm, maximum light emission wavelength 655 nm in toluene solution) was used instead of Compound 1.

Example 14

An experiment was performed in the same manner as in Example 1 except that Compound 27 (maximum absorption wavelength 475 nm, 505 nm, maximum light emission wavelength 652 nm in toluene solution) was used instead of Compound 1.

Example 15

An experiment was performed in the same manner as in Example 1 except that Compound 29 (maximum absorption wavelength 492 nm, 524 nm, maximum light emission wavelength 672 nm in toluene solution) was used instead of Compound 1.

Example 16

An experiment was performed in the same manner as in Example 1 except that Compound 30 (maximum absorption wavelength 460 nm, 488 nm, maximum light emission wavelength 645 nm in toluene solution) was used instead of Compound 1.

Example 17

An experiment was performed in the same manner as in Example 1 except that Compound 31 (maximum absorption wavelength 467 nm, 498 nm, maximum light emission wavelength 647 nm in toluene solution) was used instead of Compound 1.

Example 18

An experiment was performed in the same manner as in Example 1 except that Compound 32 (maximum absorption wavelength 468 nm, 500 nm, maximum light emission wavelength 643 nm in toluene solution) was used instead of Compound 1.

Example 19

An experiment was performed in the same manner as in Example 1 except that Compound 35 (maximum absorption wavelength 482 nm, 510 nm, maximum light emission wavelength 658 nm in toluene solution) was used instead of Compound 1.

Example 20

An experiment was performed in the same manner as in Example 1 except that Compound 36 (maximum absorption wavelength 485 nm, 513 nm, maximum light emission wavelength 650 nm in toluene solution) was used instead of Compound 1.

Example 21

An experiment was performed in the same manner as in Example 1 except that Compound 38 (maximum absorption wavelength 483 nm, 514 nm, maximum light emission wavelength 665 nm in toluene solution) was used instead of Compound 1.

Comparative Example 1

An experiment was performed in the same manner as in Example except that Comparative Compound B5 (maximum absorption wavelength 494 nm, maximum light emission wavelength 687 nm in toluene solution) was used instead of Compound 1.

Each of the compounds used in Examples 1 to 21 and Comparative Example 1 was prepared to have a $10^{-5}$ M concentration in a toluene solvent, and solution properties were measured. Specifically, the maximum absorption wavelength ($\lambda_{uv,\ MAX}$) of the prepared solution was measured using UV-visible spectrometer (Mega-200) of Scinco Co., Ltd., and absorbance (abs intensity @450 nm) was identified in an absorption region of 450 nm. The maximum light emission wavelength ($\lambda_{PL,\ MAX}$) was measured using a fluorescence spectrometer (FS-2) of Scinco Co., Ltd.

In addition, for each of the thin films prepared in Examples to 21 and Comparative Example 1, a maximum light emission wavelength ($\lambda_{PL,\ MAX}$) was measured using a fluorescence spectrometer (FS-2) of Scinco Co., Ltd., and quantum efficiency of the thin film was measured using Quantaurus-QY (C11347-11) of Hamamatsu Photonics K.K.

TABLE 1

| | | Solution | | | Thin Film | |
|---|---|---|---|---|---|---|
| Example | Preparation Example | $\lambda_{uv,\ MAX}$ (nm) | $\lambda_{PL,\ MAX}$ (nm) | Abs Intensity (@ 450 (nm) | $\lambda_{PL,\ MAX}$ (nm) | Quantum Efficiency, PLQY (%) |
| 1 | 1 | 423, 450 | 621 | 0.85 | 626 | 13.1 |
| 2 | 2 | 427, 454 | 630 | 0.82 | 635 | 17.7 |
| 3 | 3 | 428, 454 | 635 | 0.79 | 640 | 20.5 |
| 4 | 8 | 472, 496 | 652 | 0.61 | 656 | 27.8 |
| 5 | 9 | 492, 506 | 655 | 0.55 | 660 | 25.7 |
| 6 | 12 | 468, 495 | 652 | 0.68 | 657 | 37.0 |
| 7 | 13 | 473, 500 | 655 | 0.63 | 660 | 58.0 |
| 8 | 21 | 463, 490 | 640 | 0.72 | 645 | 29.3 |
| 9 | 22 | 467, 495 | 650 | 0.68 | 651 | 35.7 |
| 10 | 23 | 468, 495 | 652 | 0.65 | 655 | 55.8 |
| 11 | 24 | 488, 511 | 667 | 0.57 | 678 | 42.3 |
| 12 | 25 | 470, 500 | 650 | 0.63 | 652 | 48.5 |
| 13 | 26 | 475, 504 | 655 | 0.61 | 660 | 52.3 |
| 14 | 27 | 475, 505 | 652 | 0.62 | 654 | 57.6 |
| 15 | 29 | 492, 524 | 672 | 0.57 | 675 | 56.1 |
| 16 | 30 | 460, 488 | 645 | 0.72 | 647 | 38.9 |
| 17 | 31 | 467, 498 | 647 | 0.69 | 653 | 57.6 |
| 18 | 32 | 468, 500 | 643 | 0.69 | 648 | 62.1 |
| 19 | 35 | 482, 510 | 658 | 0.60 | 663 | 63.5 |
| 20 | 36 | 485, 513 | 650 | 0.58 | 652 | 20.1 |
| 21 | 38 | 483, 514 | 665 | 0.62 | 670 | 28.9 |

TABLE 1-continued

| Example | Preparation Example | Solution $\lambda_{uv}$, MAX (nm) | Solution $\lambda_{PL}$, MAX (nm) | Solution Abs Intensity (@ 450 (nm) | Thin Film $\lambda_{PL}$, MAX (nm) | Thin Film Quantum Efficiency, PLQY (%) |
|---|---|---|---|---|---|---|
| Comparative Example 1 | Comparative Compound B5 | 494, 687 | 687 | 0.15 | 688 | 0.3 |

The invention claimed is:

1. A compound represented by the following Chemical Formula 1:

[Chemical Formula 1]

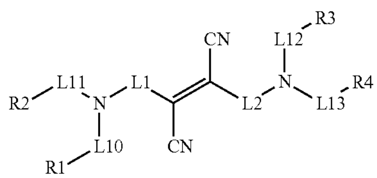

wherein, in Chemical Formula 1,

L1 and L2 are the same as or different from each other, and each independently a substituted or unsubstituted arylene group;

L10 to L13 are the same as or different from each other, and each independently a direct bond; a substituted or unsubstituted arylene group; or a substituted or unsubstituted divalent heterocyclic group;

R1 to R4 are the same as or different from each other, and each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted fluoroalkyl group; a substituted or unsubstituted alkylthio group; a substituted or unsubstituted alkoxy group; a substituted or unsubstituted allyloxy group; a substituted or unsubstituted alkylthioxy group; a substituted or unsubstituted arylthioxy group; a substituted or unsubstituted alkylsulfoxy group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; a substituted or unsubstituted heteroaryl group; or a substituted or unsubstituted cyclic hydrocarbon group; and at least one of R1 to R4 is represented by the following Chemical Formula 2,

[Chemical Formula 2]

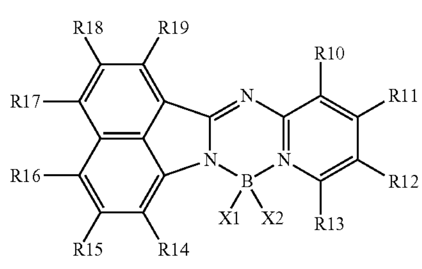

in Chemical Formula 2, one of R10 to R19 bonds to one of L10-L13 of Chemical Formula 1;

the remaining groups of R10-R19 not bonding to Chemical Formula 1 are the same as or different from each other, and each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted fluoroalkyl group; a substituted or unsubstituted alkylthio group; a substituted or unsubstituted alkoxy group; a substituted or unsubstituted allyloxy group; a substituted or unsubstituted alkylthioxy group; a substituted or unsubstituted arylthioxy group; a substituted or unsubstituted alkylsulfoxy group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; a substituted or unsubstituted heteroaryl group; or a substituted or unsubstituted cyclic hydrocarbon group, or bond to each other to form a substituted or unsubstituted ring;

X1 and X2 are the same as or different from each other, and each independently a halogen group; a nitrile group; —$CO_2R''''$; a substituted or unsubstituted alkyl group; a substituted or unsubstituted alkynyl group; a substituted or unsubstituted alkoxy group; a substituted or unsubstituted alkenyl group; a substituted or unsubstituted silyl group; a substituted or unsubstituted aryloxy group; a substituted or unsubstituted aryl group; a substituted or unsubstituted heterocyclic group; or a substituted or unsubstituted cyclic hydrocarbon group, or X1 and X2 bond to each other to form a substituted or unsubstituted ring; and R'''' is a substituted or unsubstituted alkyl group; a substituted or unsubstituted fluoroalkyl group; a substituted or unsubstituted alkoxy group; a substituted or unsubstituted alkenyl group; a substituted or unsubstituted alkynyl group; a substituted or unsubstituted silyl group; a substituted or unsubstituted aryl group; a substituted or unsubstituted heterocyclic group; or a substituted or unsubstituted cyclic hydrocarbon group.

2. The compound of claim 1, wherein at least one of R1 and R2 and at least one of R3 and R4 are represented by Chemical Formula 2.

3. The compound of claim 1, wherein L1 and L2 are the same as or different from each other, and each independently a phenylene group unsubstituted or substituted with an alkyl group, an alkoxy group or a halogen group.

4. The compound of claim 1, wherein Chemical Formula 2 is represented by any one of the following Chemical Formulae 2-1 to 2-3:

[Chemical Formula 2-1]

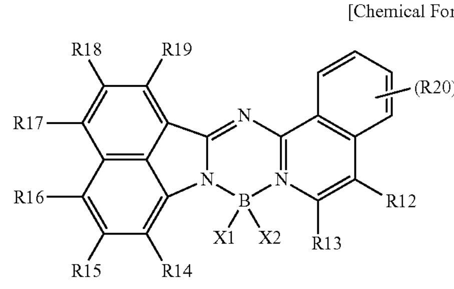

-continued

[Chemical Formula 2-2]

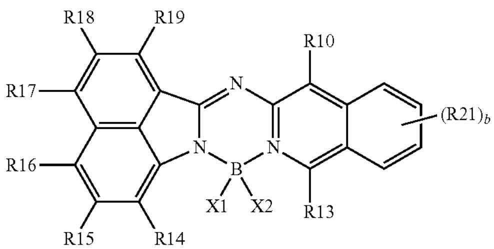

[Chemical Formula 2-3]

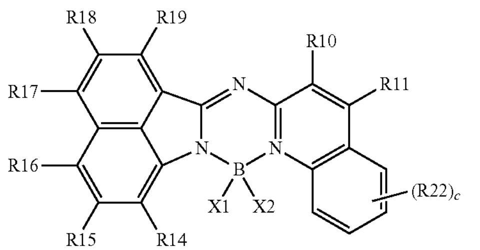

in Chemical Formulae 2-1 to 2-3,

R10 to R19, X1 and X2 have the same definitions as in Chemical Formula 2;

R20 to R22 are the same as or different from each other, and each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted fluoroalkyl group; a substituted or unsubstituted alkylthio group; a substituted or unsubstituted alkoxy group; a substituted or unsubstituted allyloxy group; a substituted or unsubstituted alkylthioxy group; a substituted or unsubstituted arylthioxy group; a substituted or unsubstituted alkylsulfoxy group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; a substituted or unsubstituted heteroaryl group; or a substituted or unsubstituted cyclic hydrocarbon group; and a to c are an integer of 0 to 4, and when a to c are 2 or greater, substituents in the parentheses are the same as or different from each other.

5. The compound of claim 1, wherein the compound of Chemical Formula 1 is any one selected from the following structural formulae:

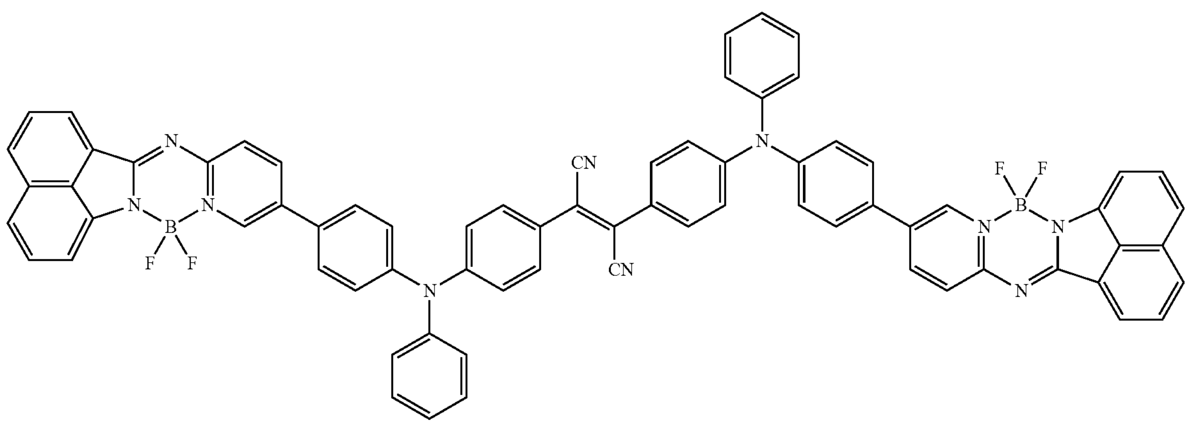

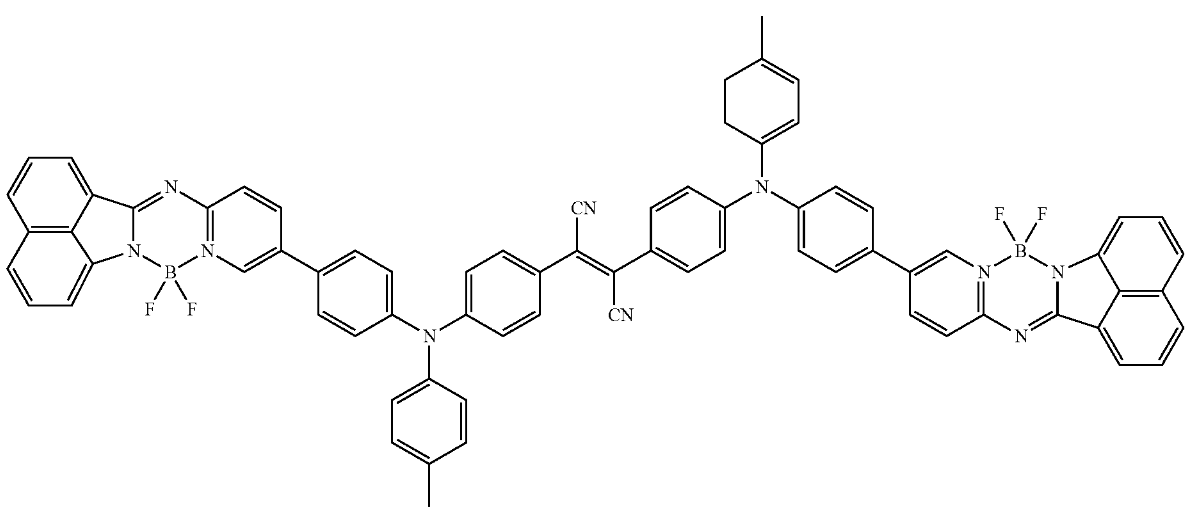

-continued
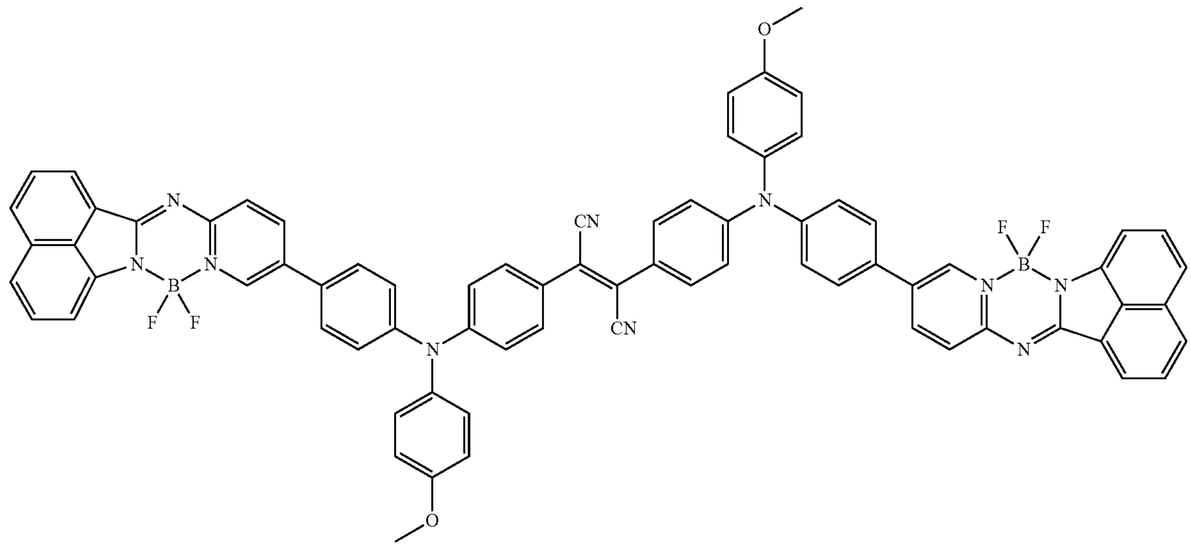
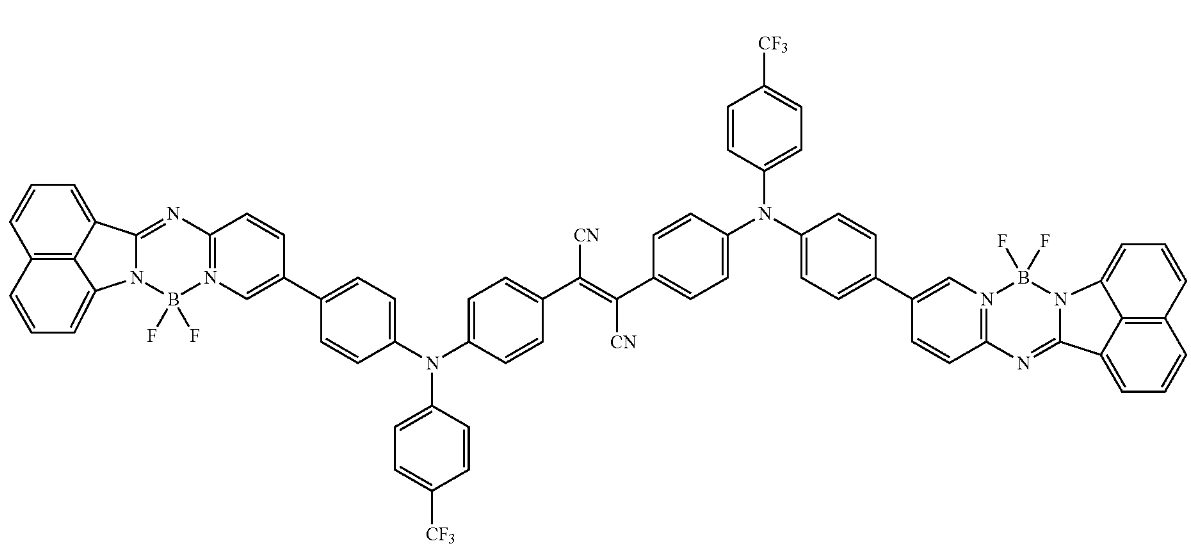

-continued
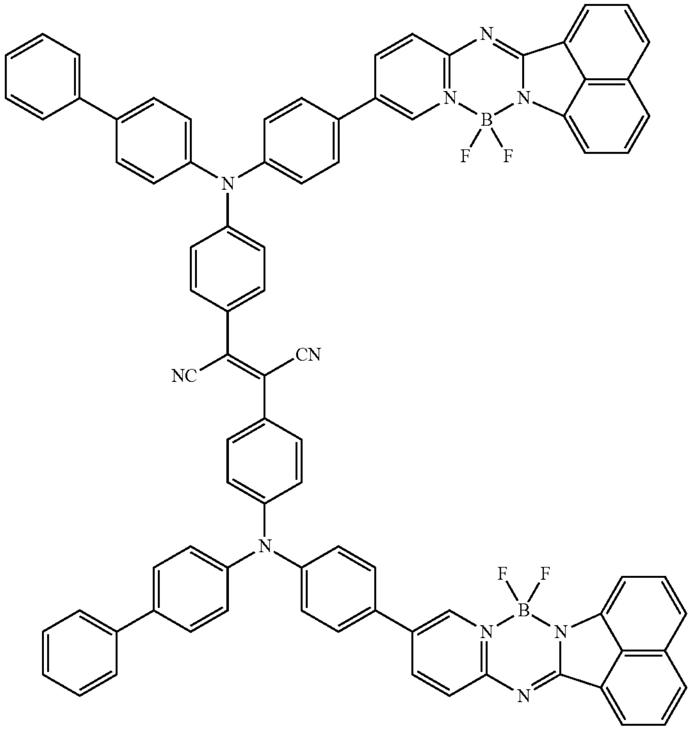
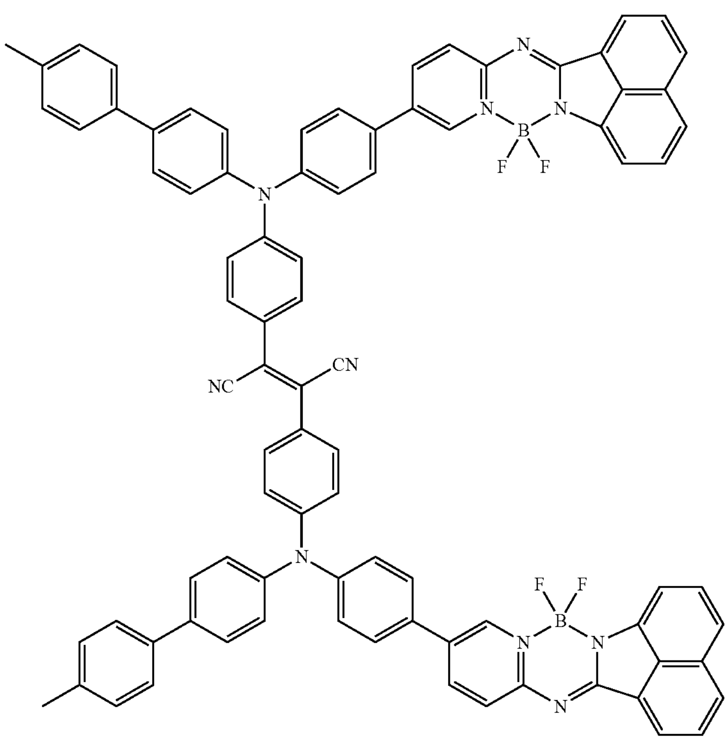

-continued
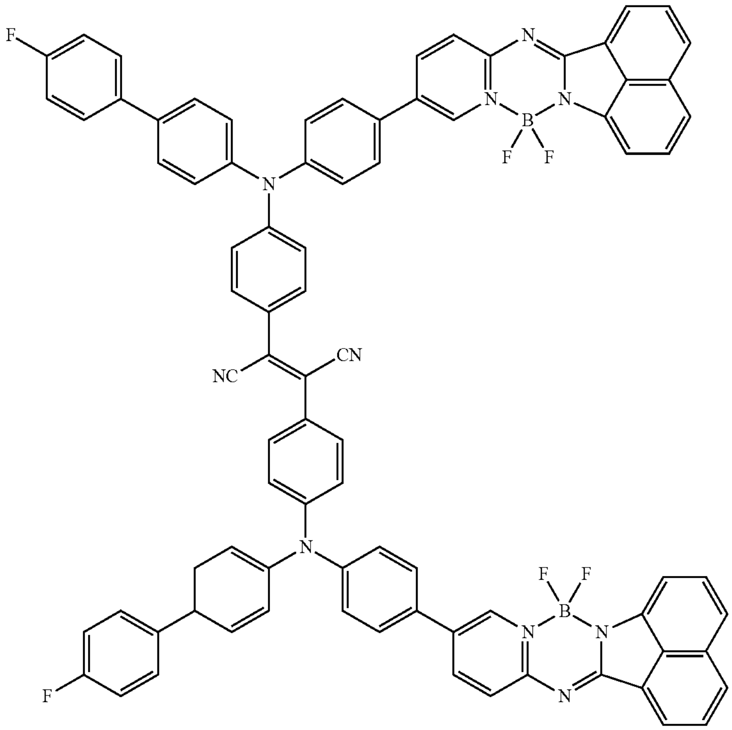
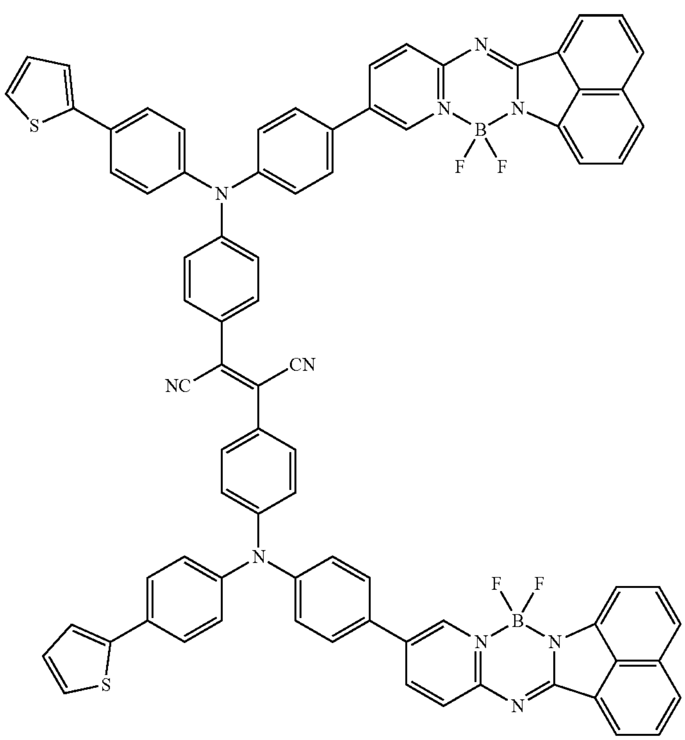

-continued
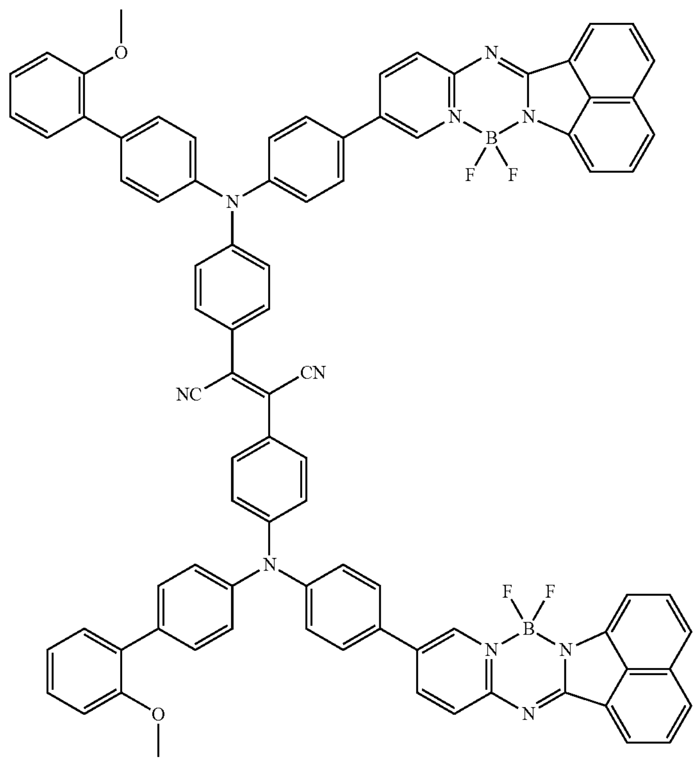
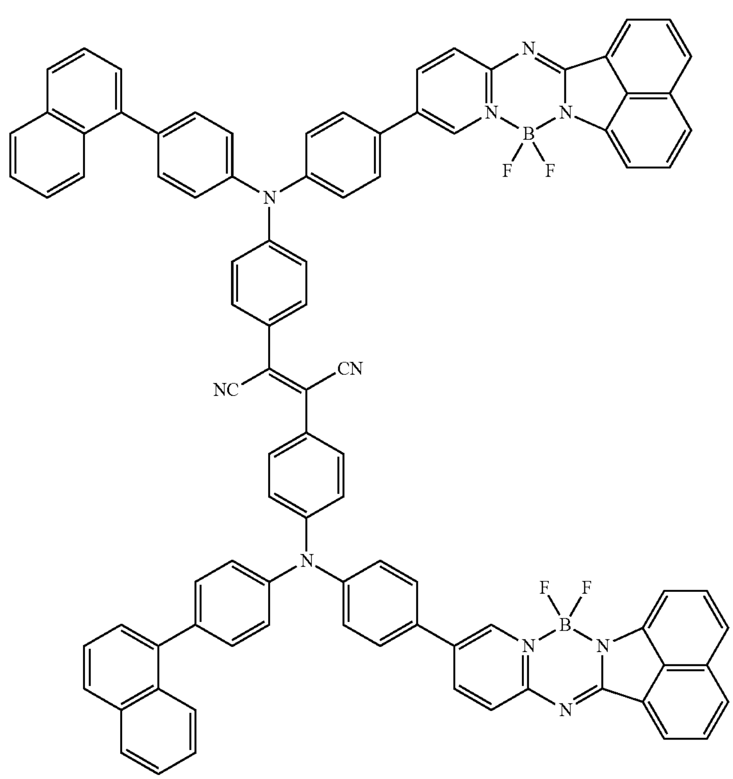

-continued
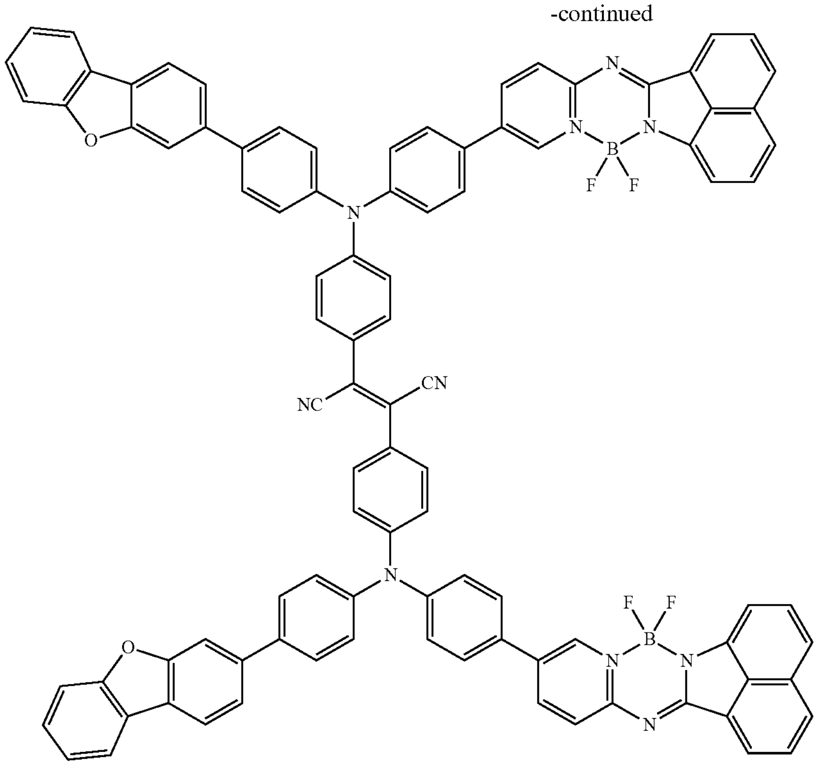
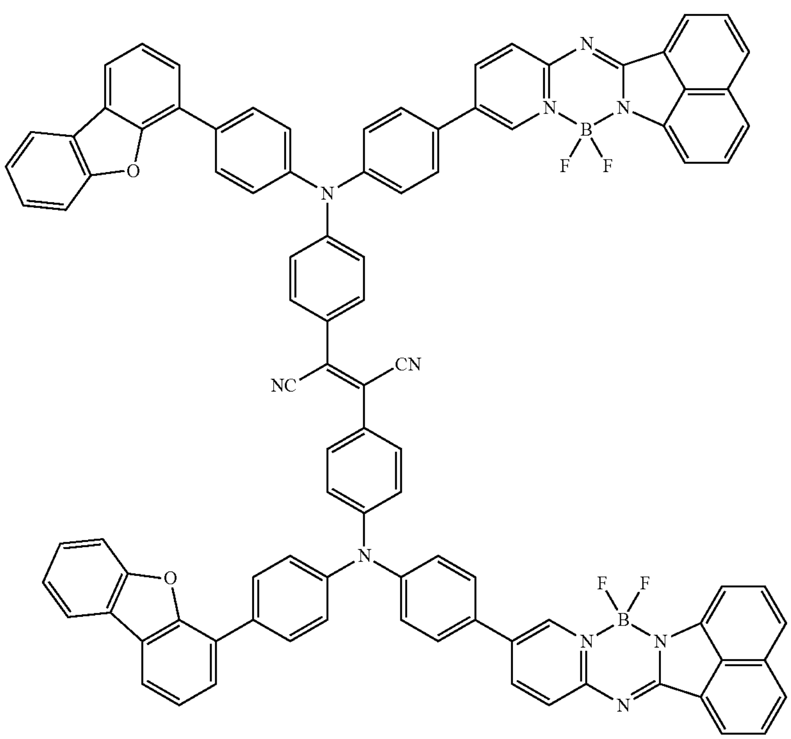

-continued
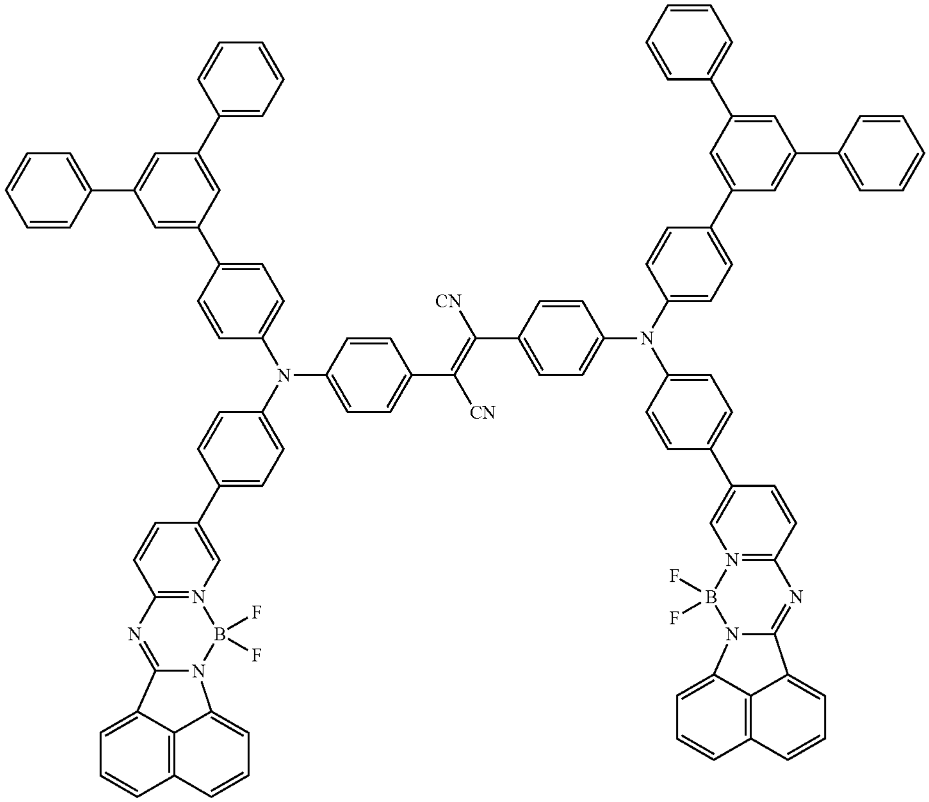
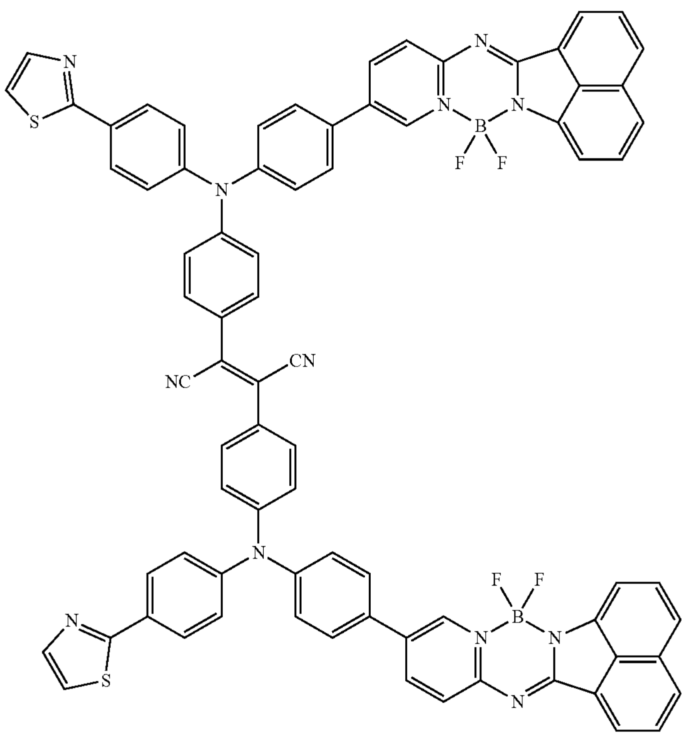

-continued
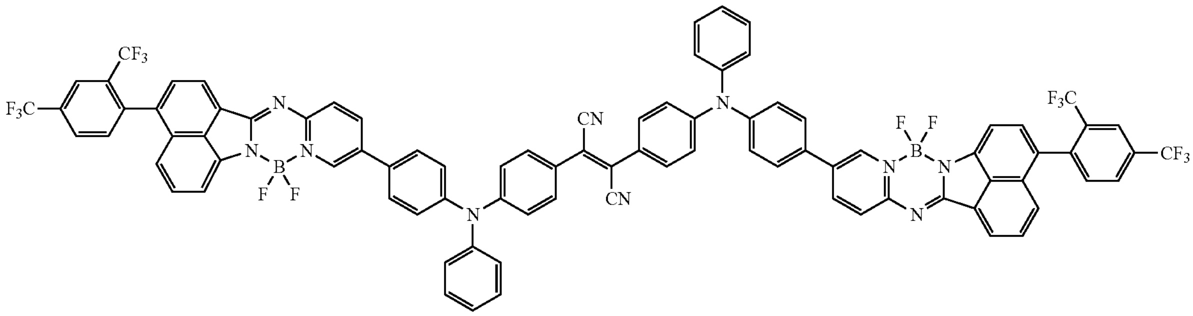
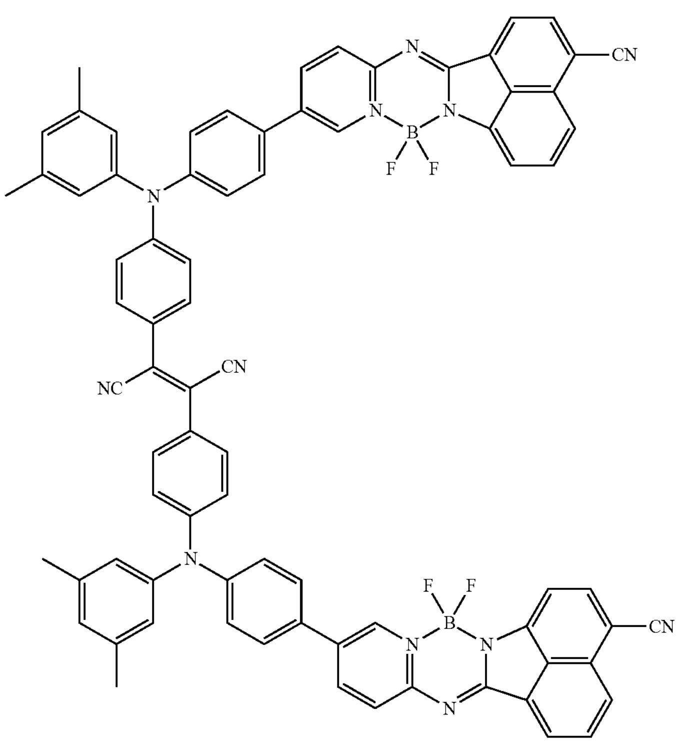

-continued
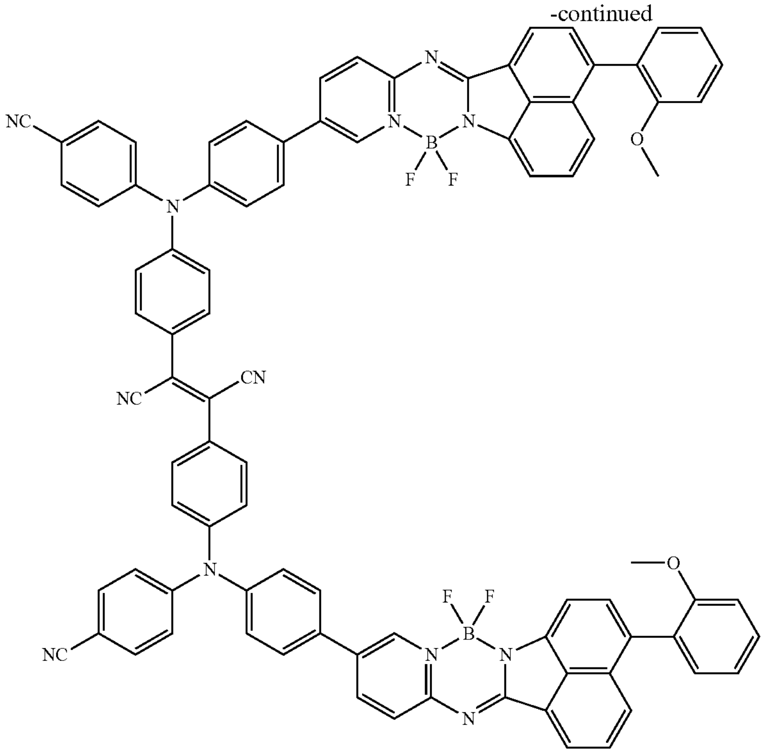
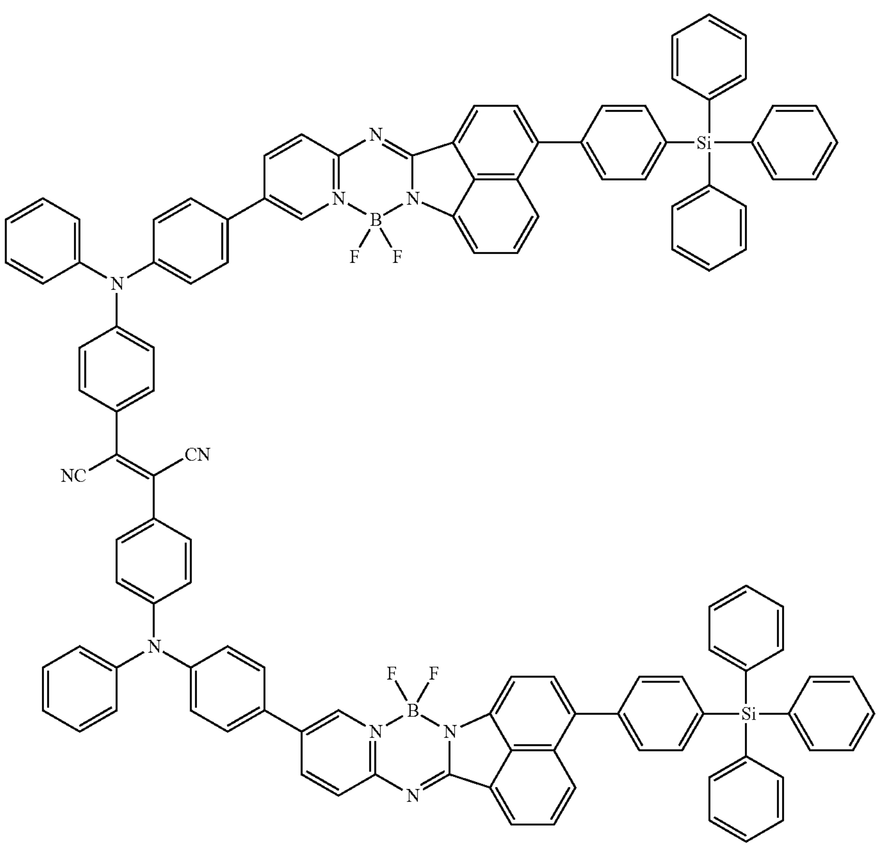

-continued
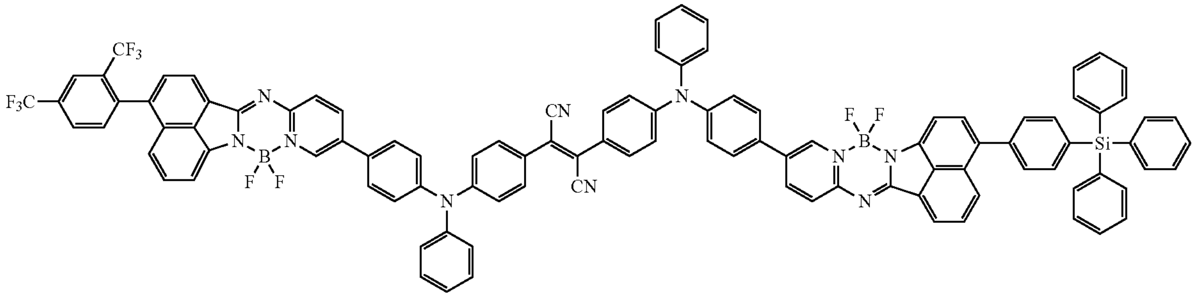
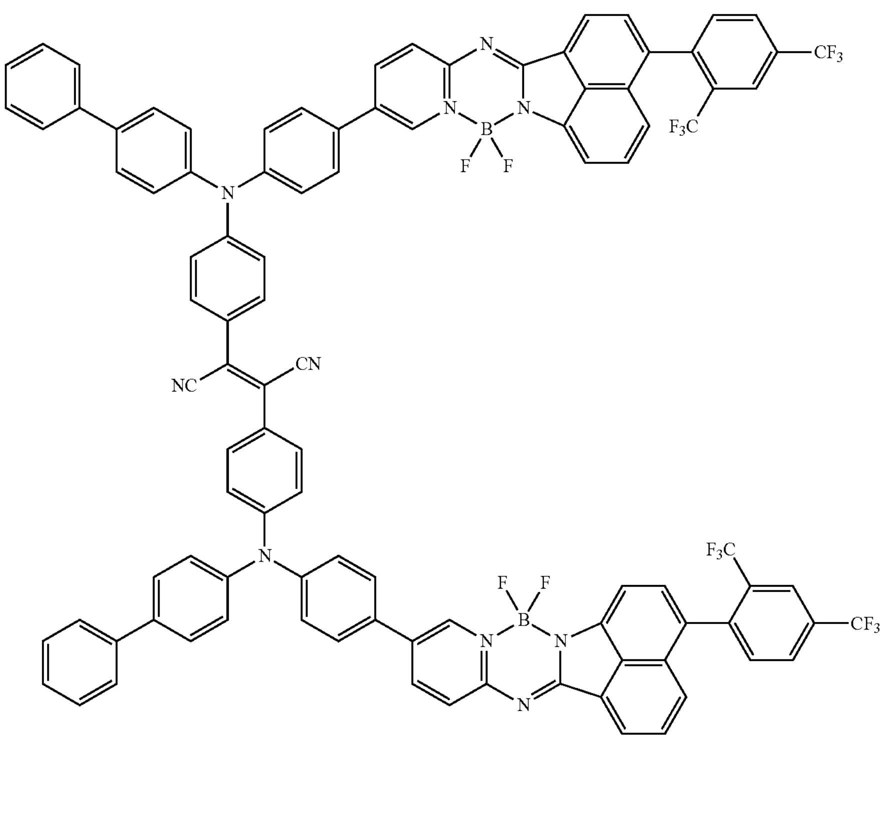

-continued
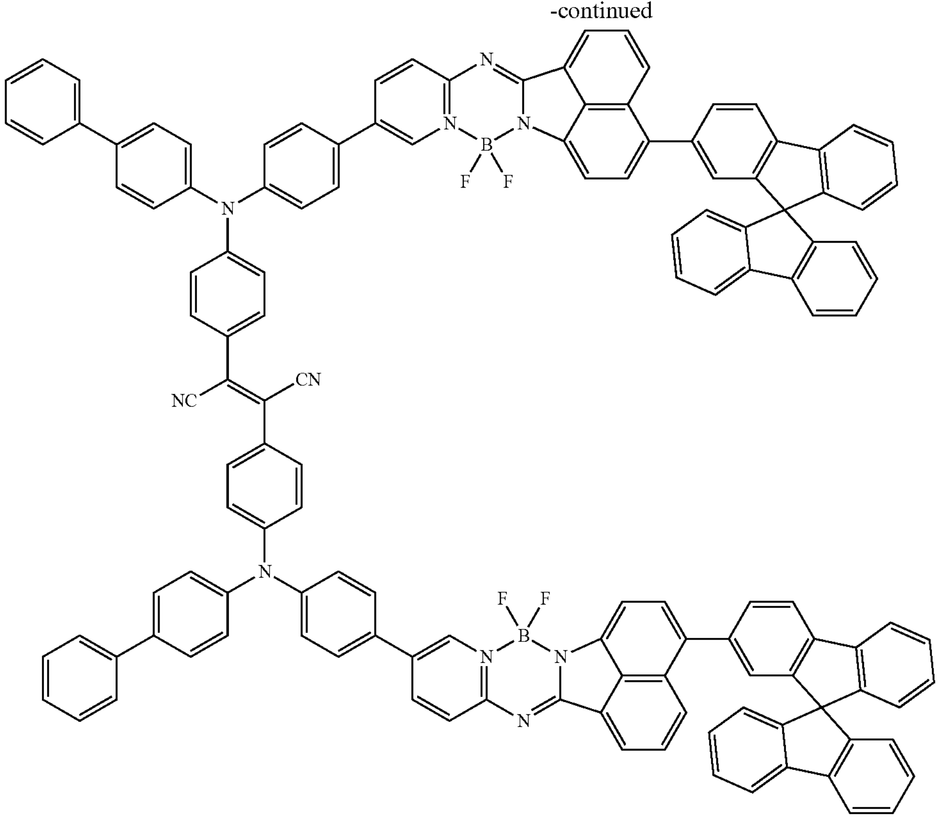
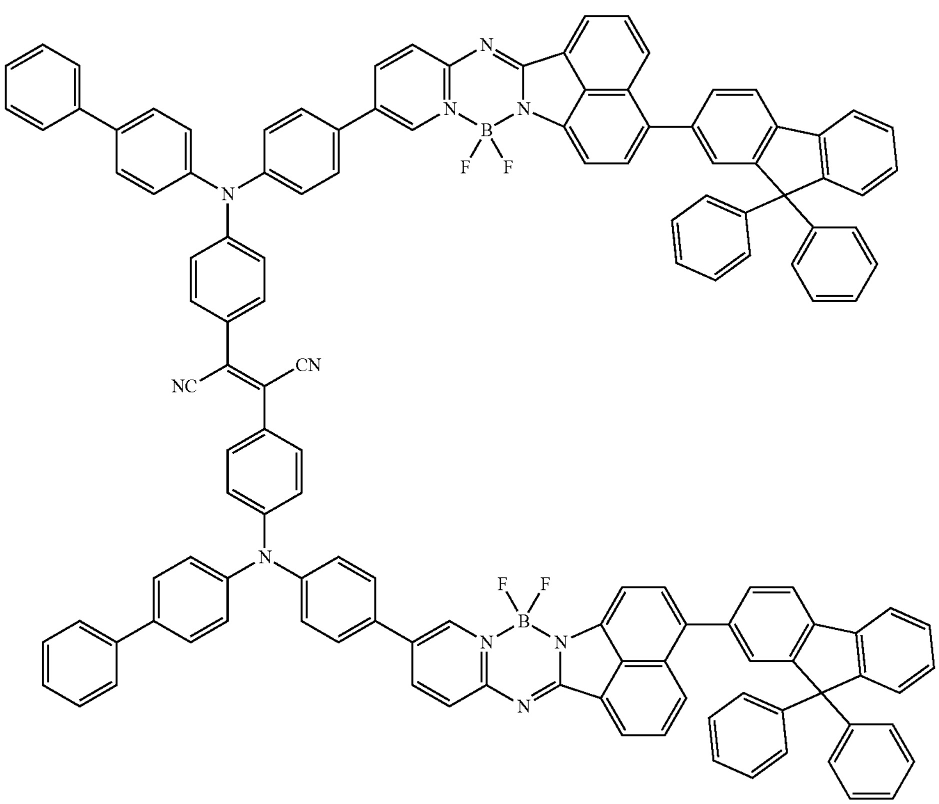

-continued
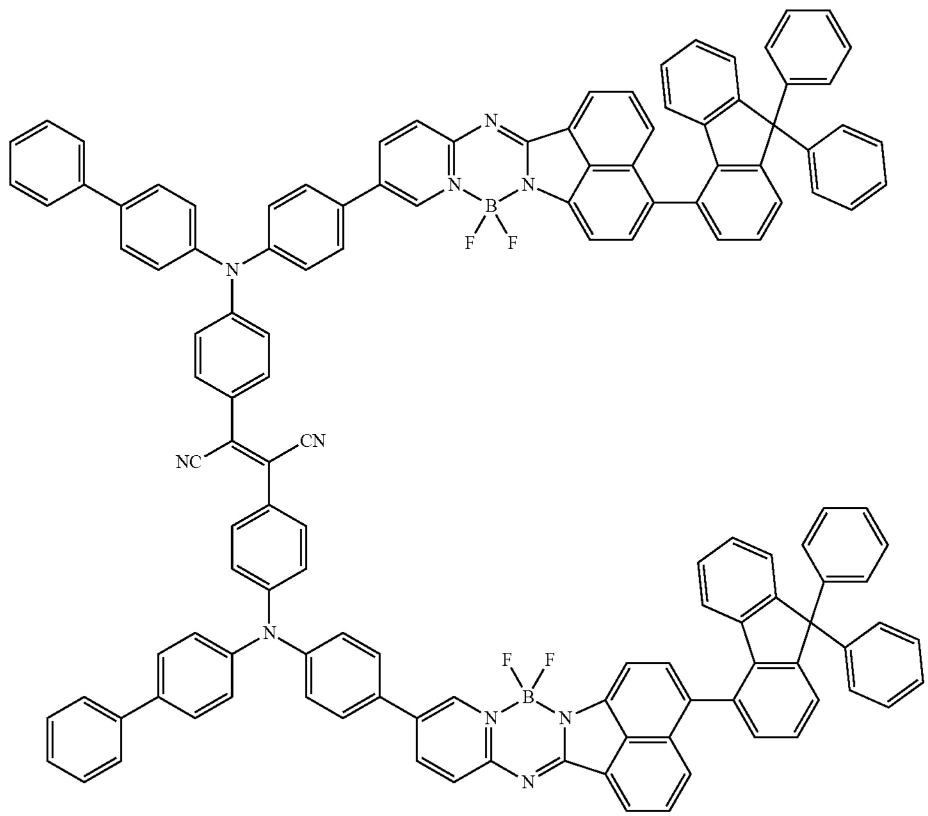
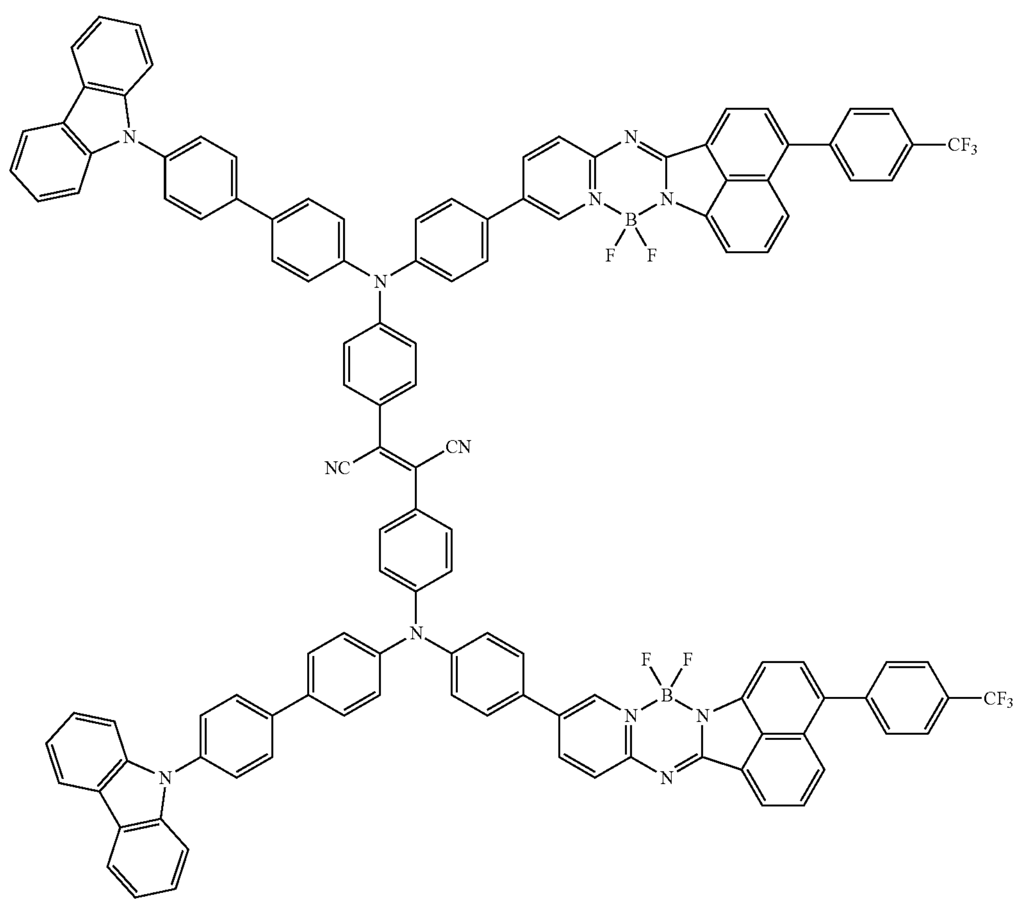

-continued
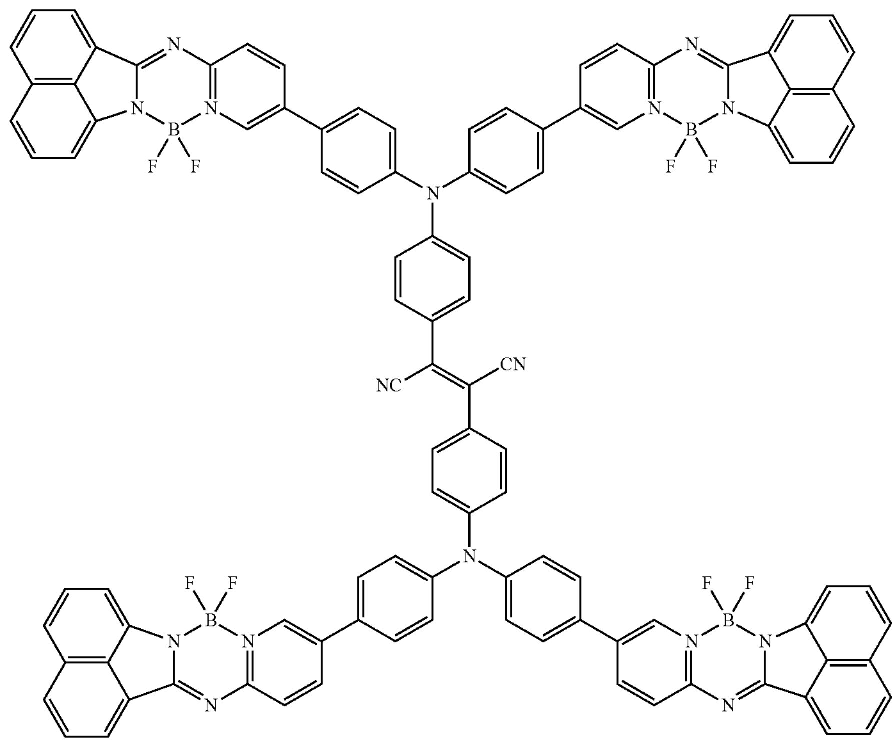
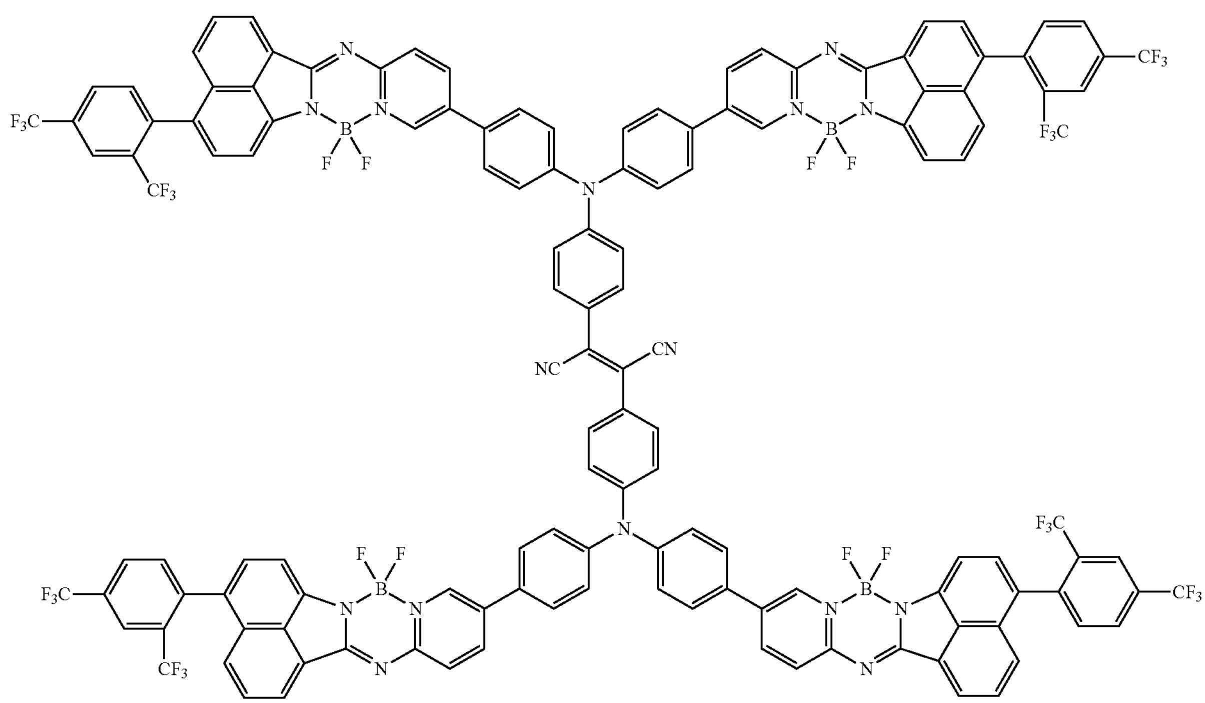

-continued
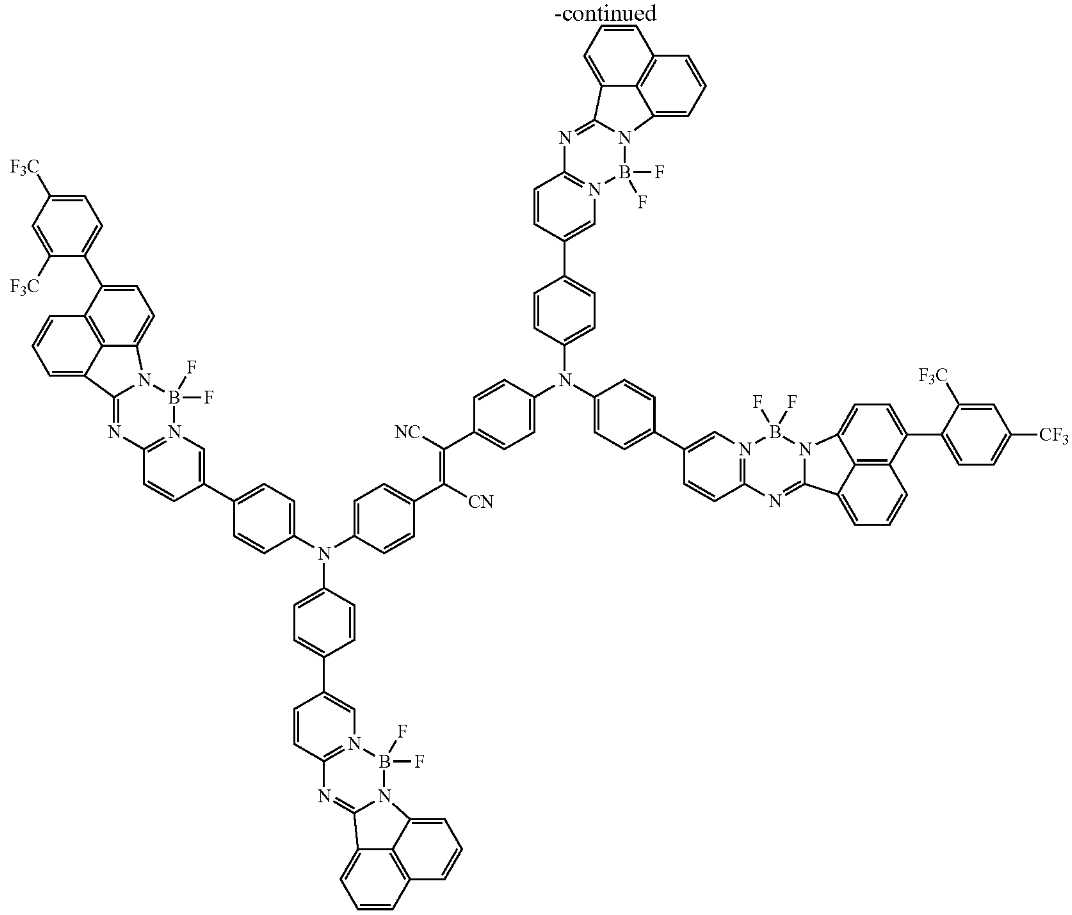
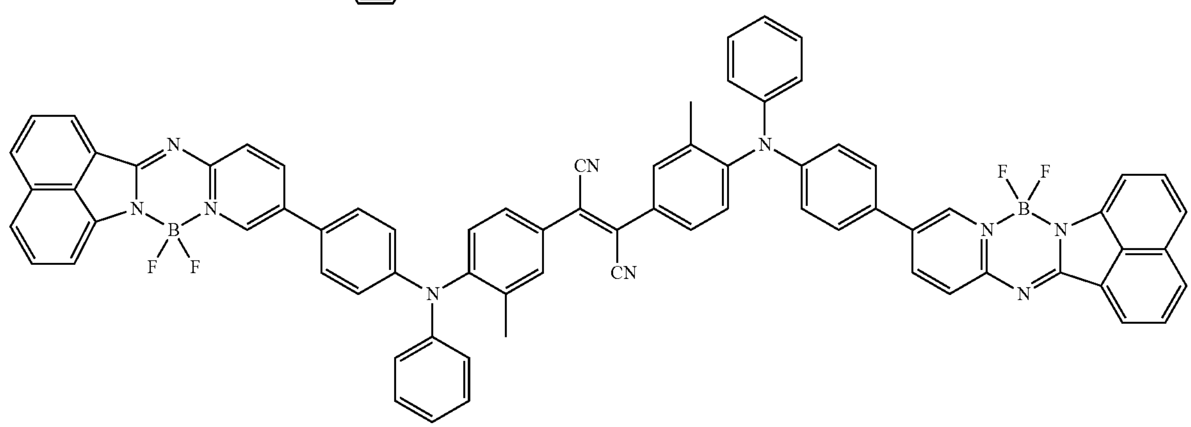
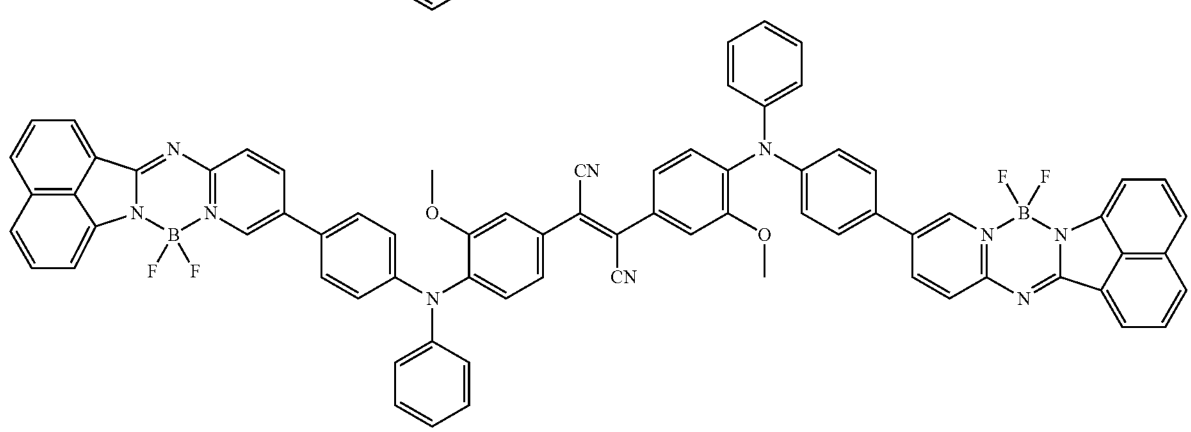

-continued
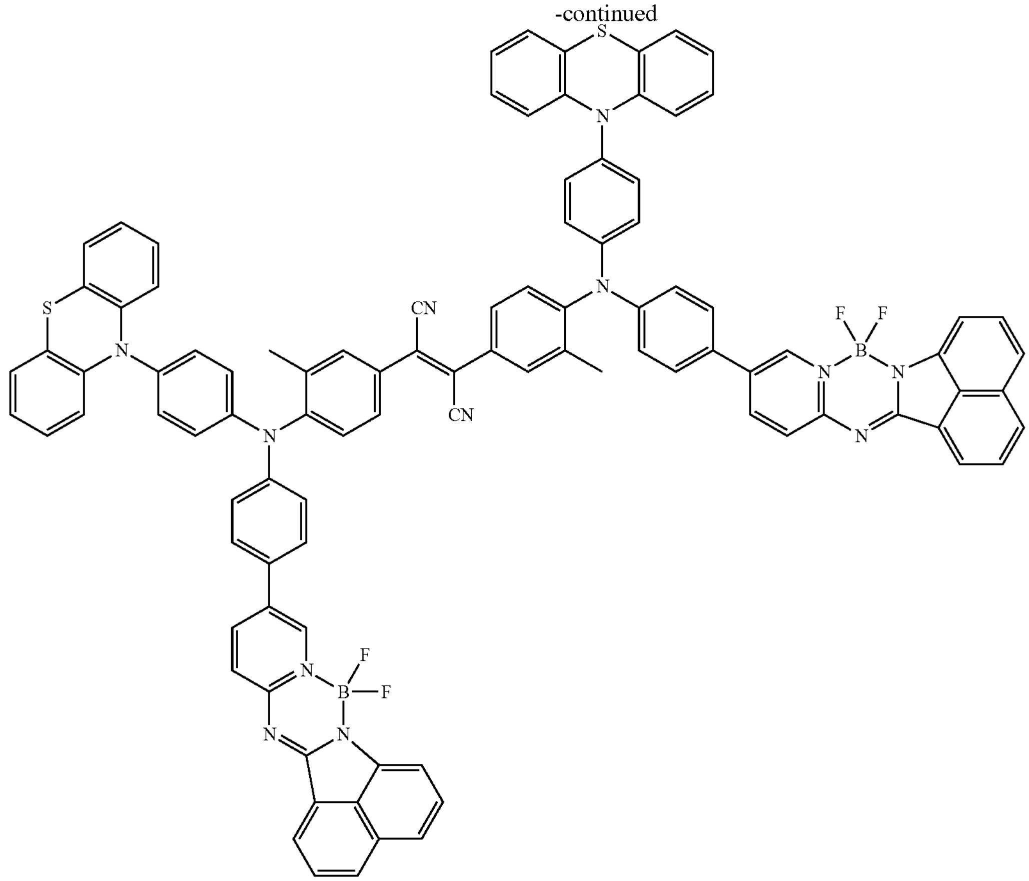
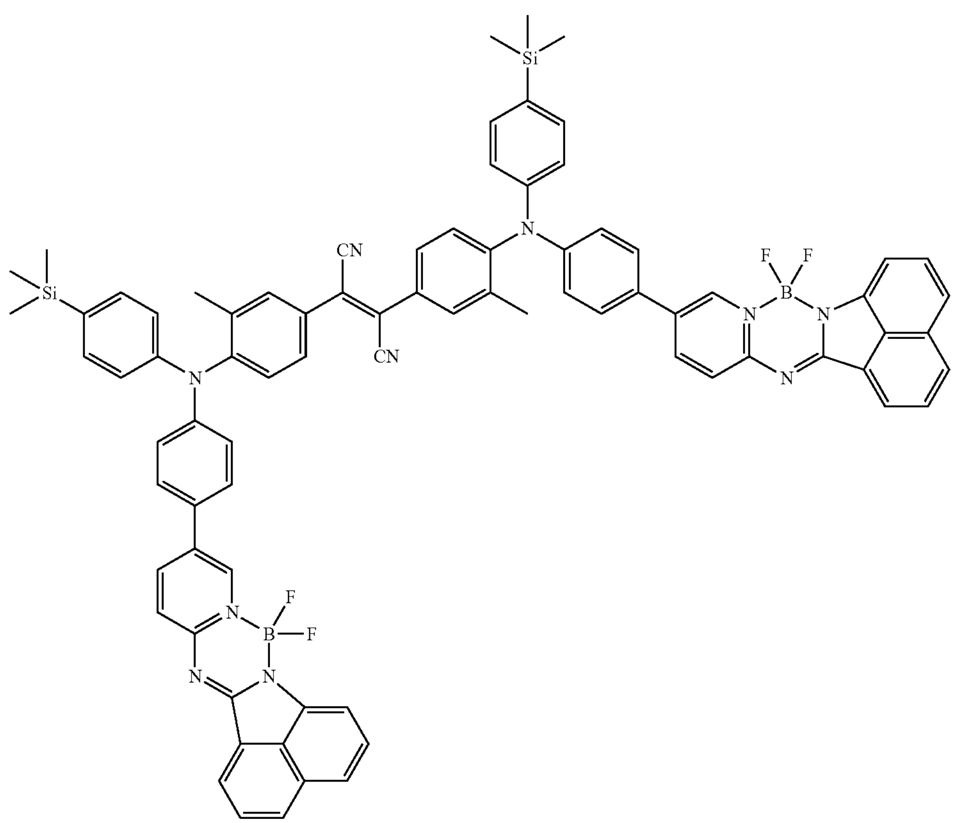

-continued
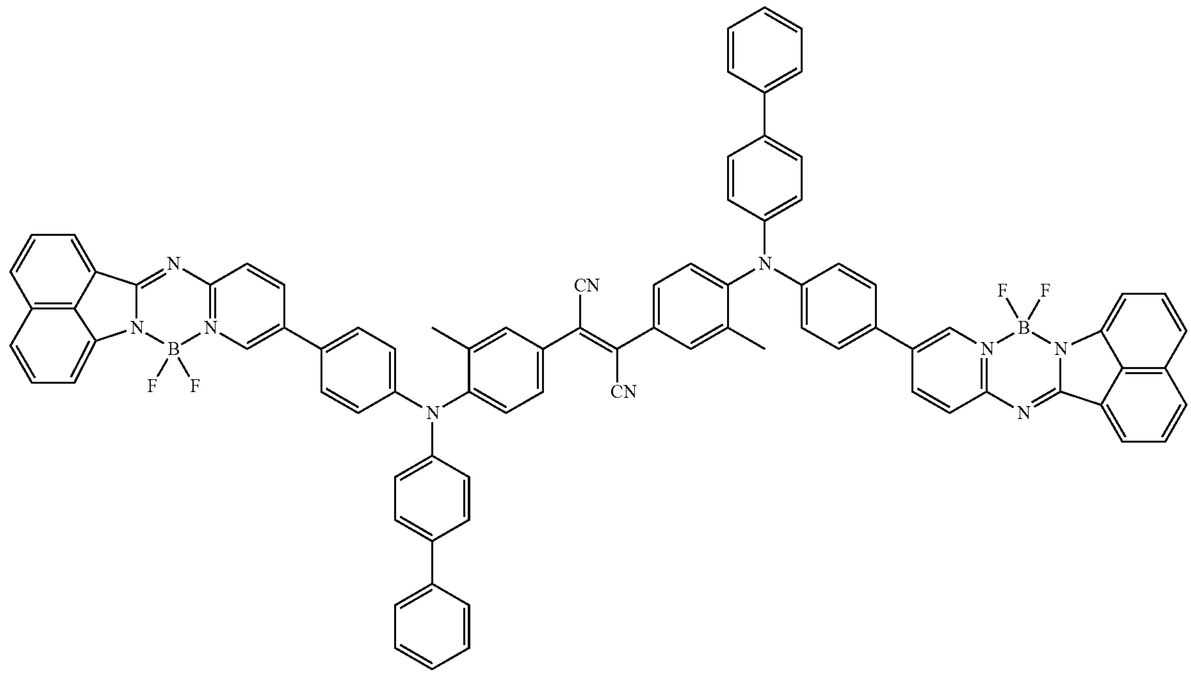
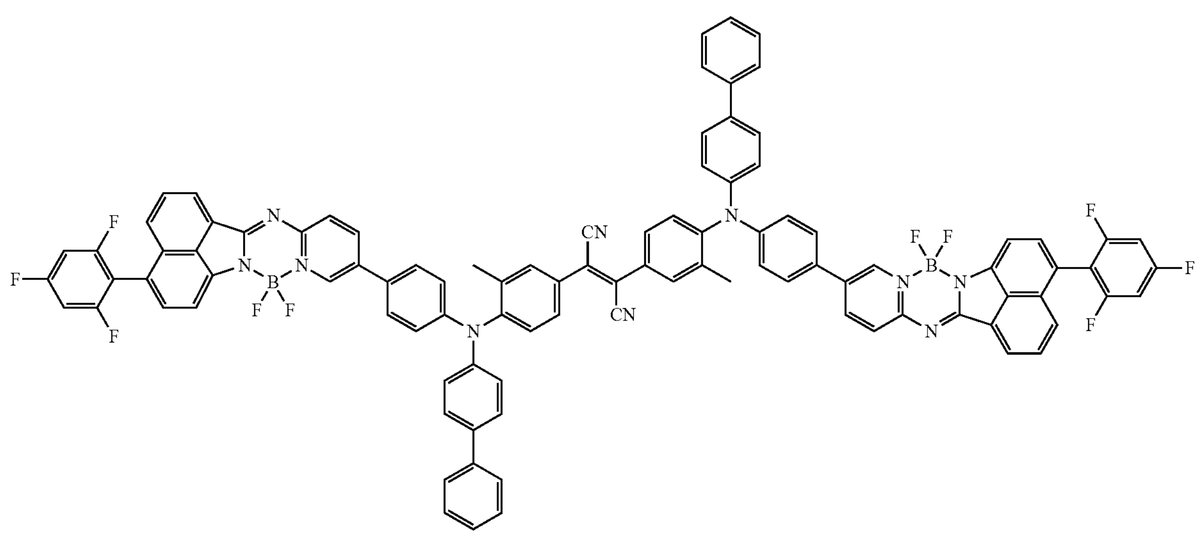

-continued
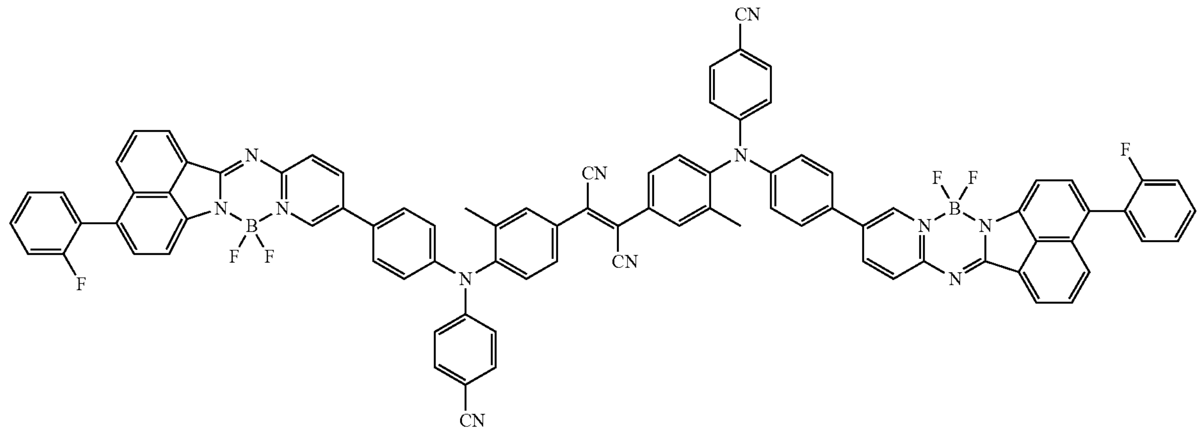
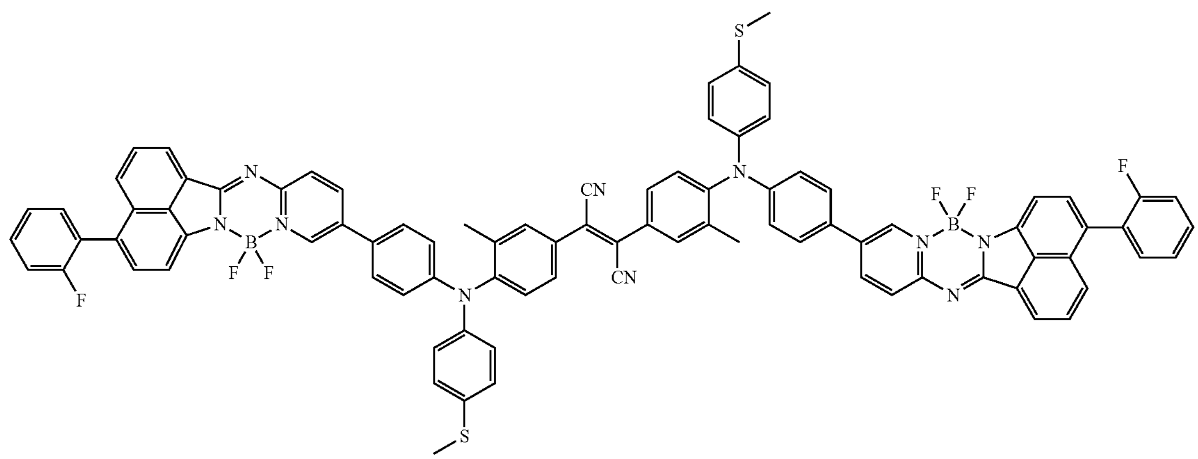
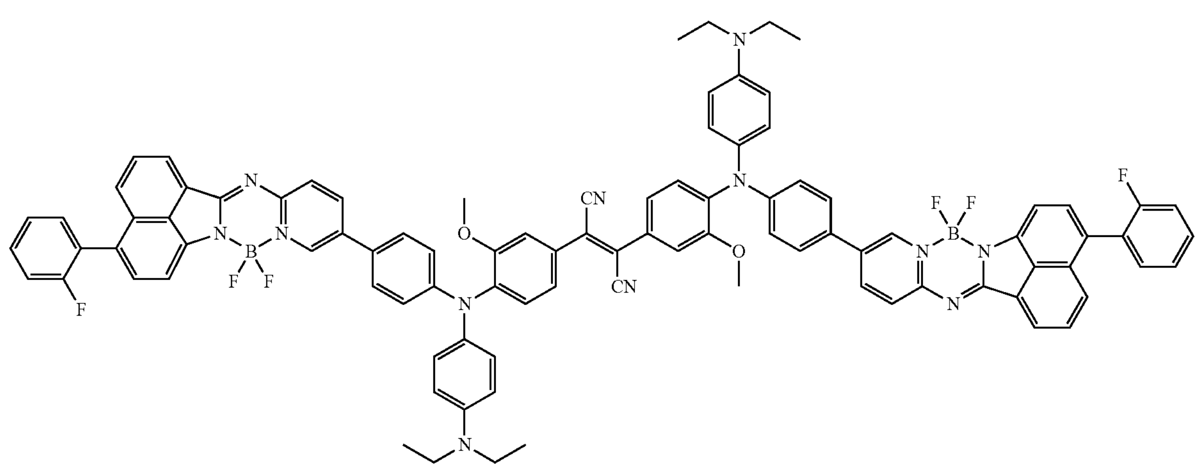

-continued
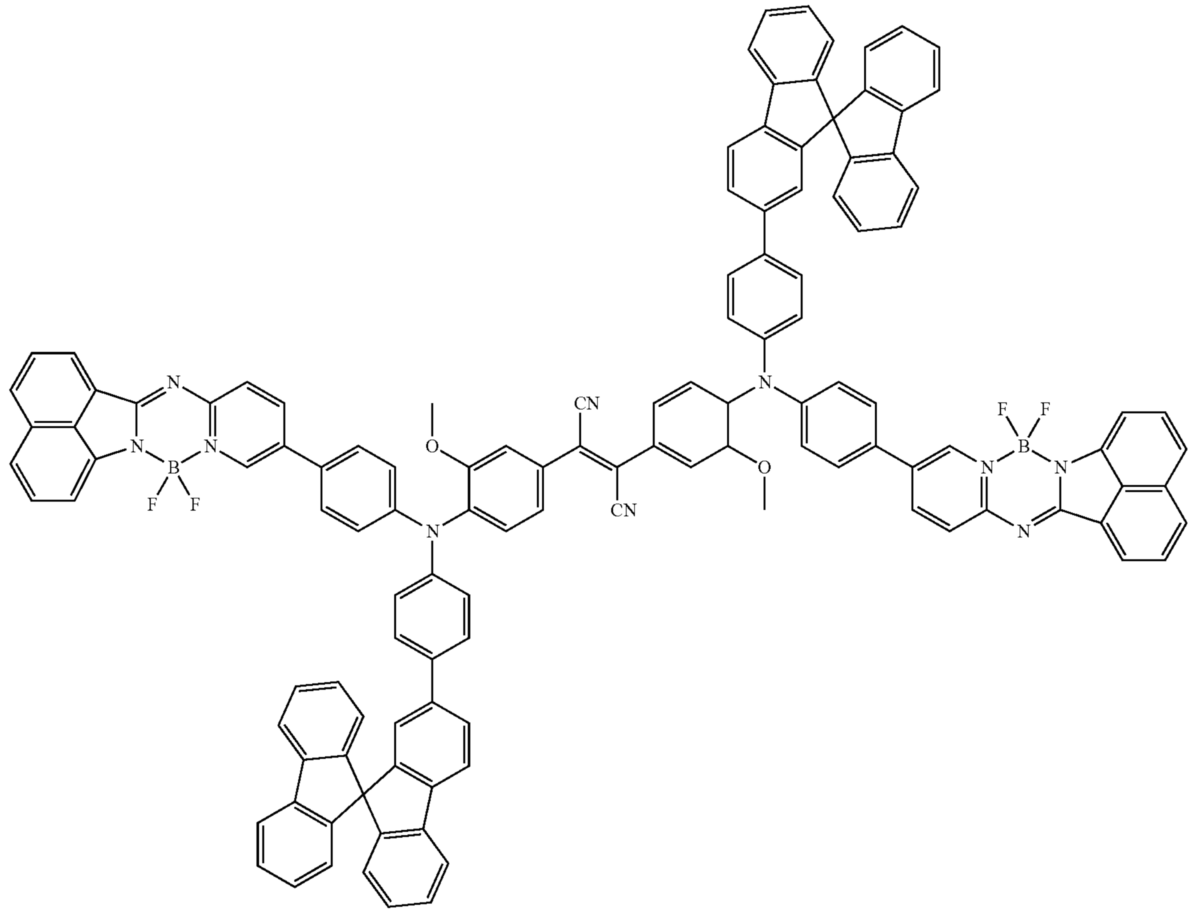
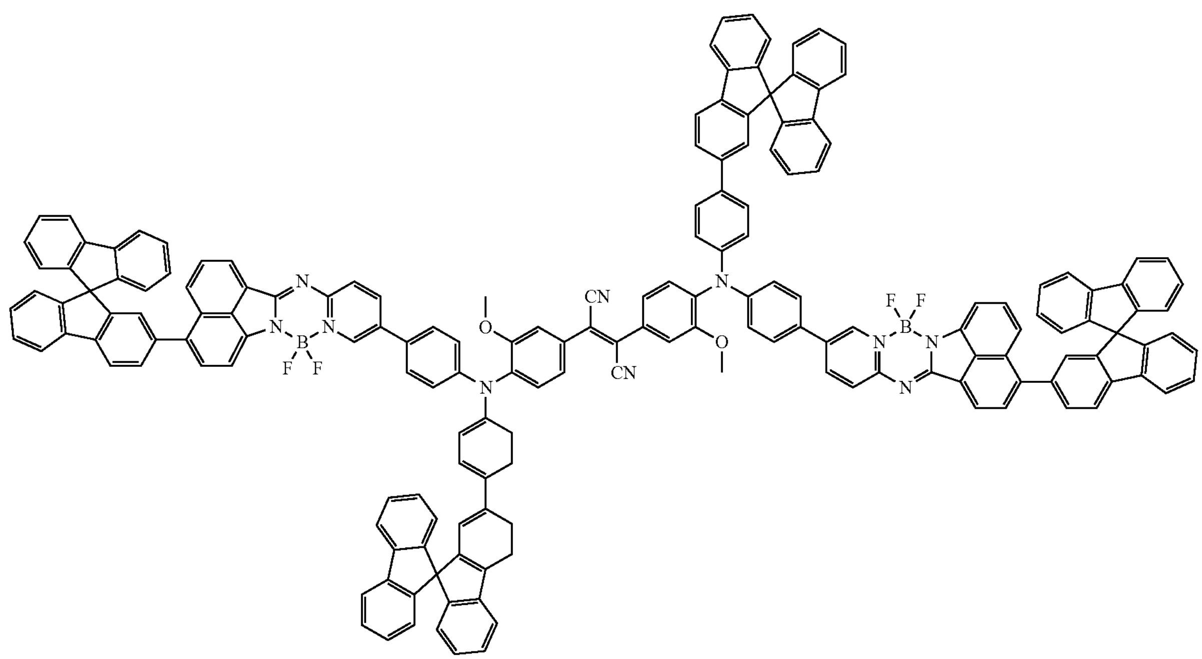

-continued
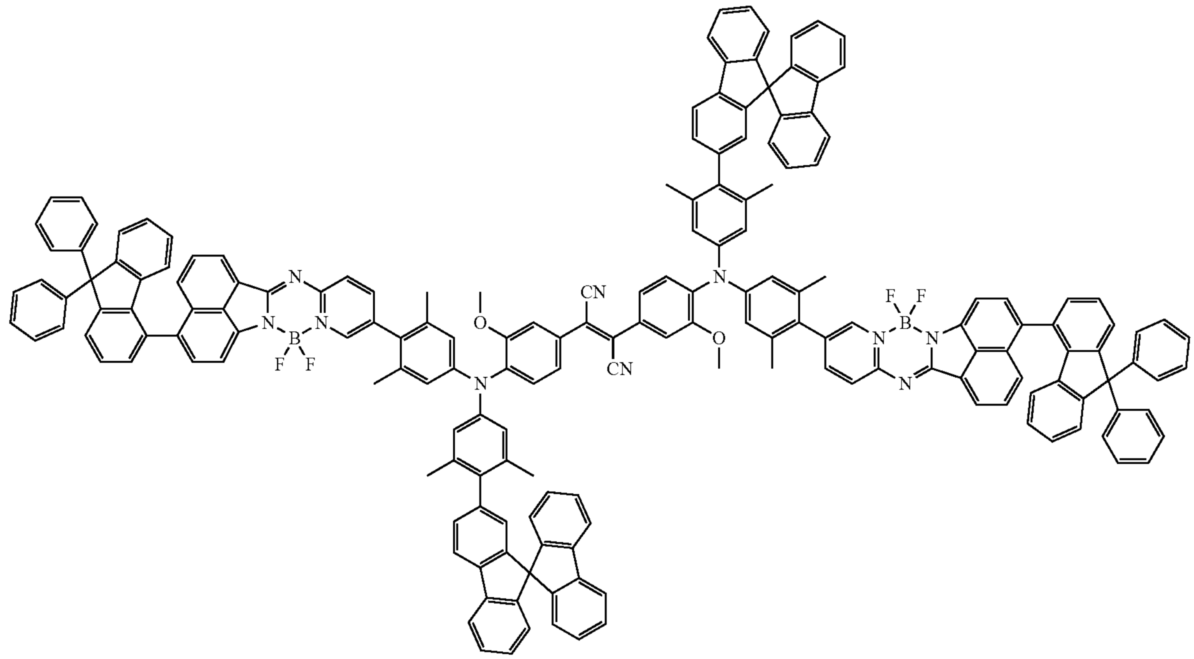
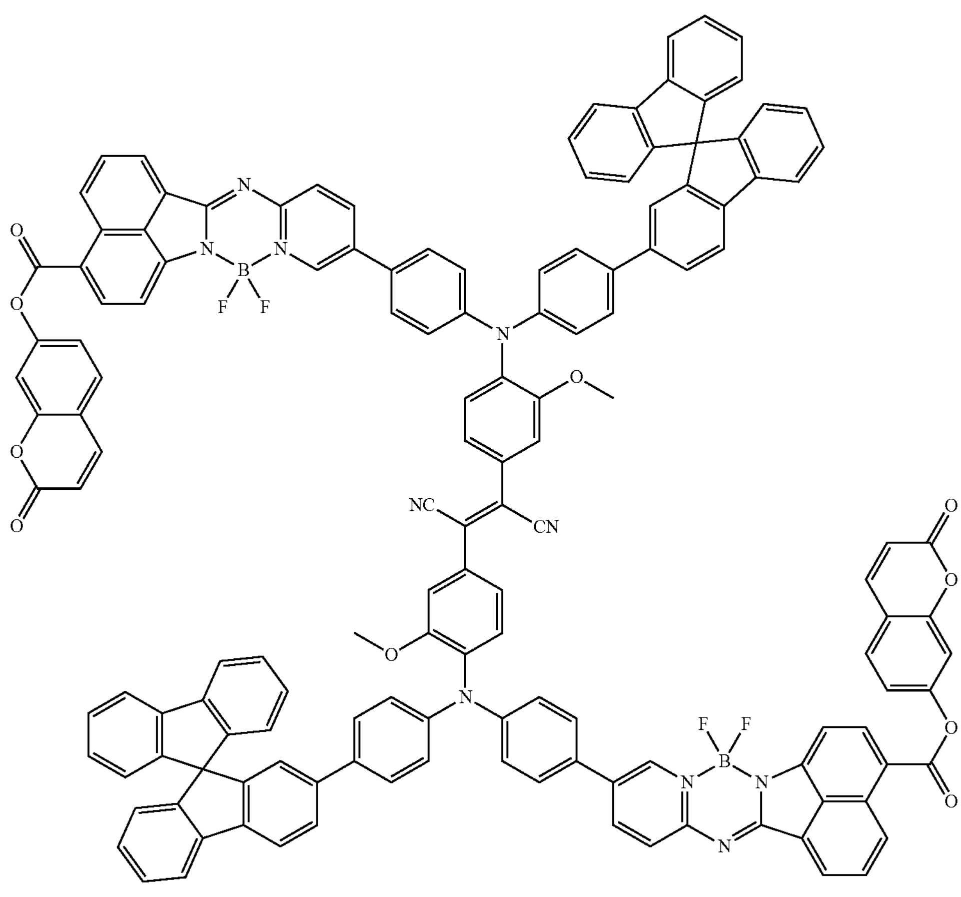

-continued
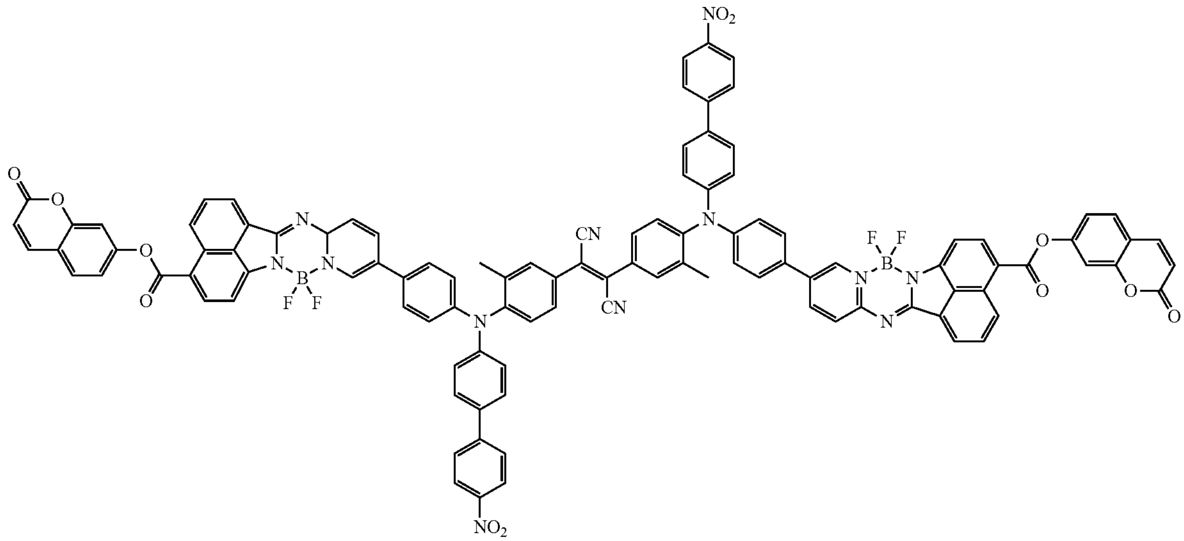
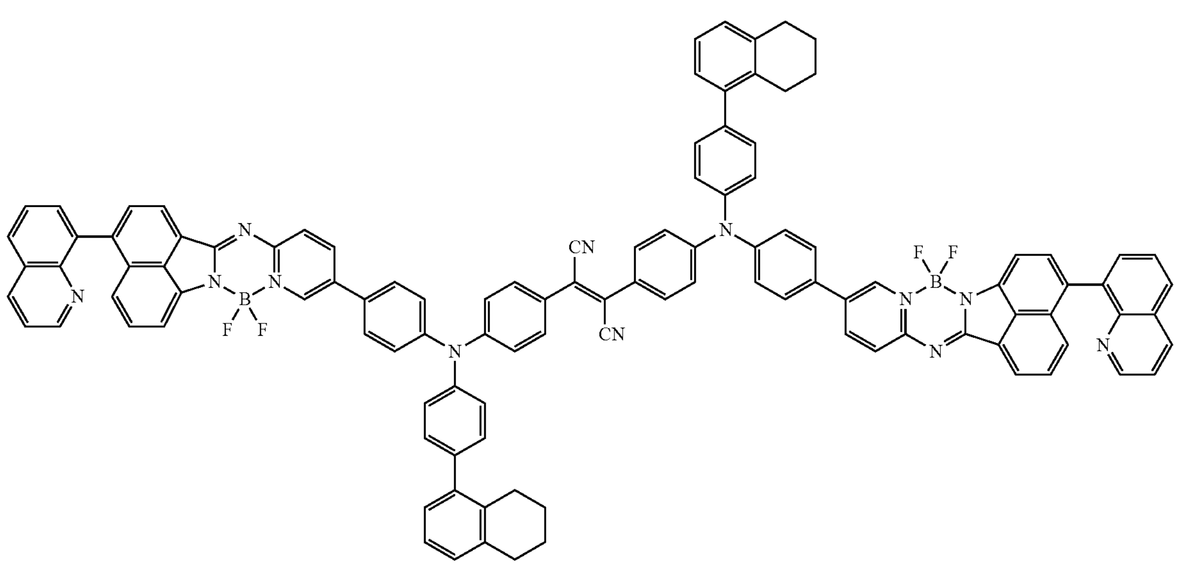

-continued
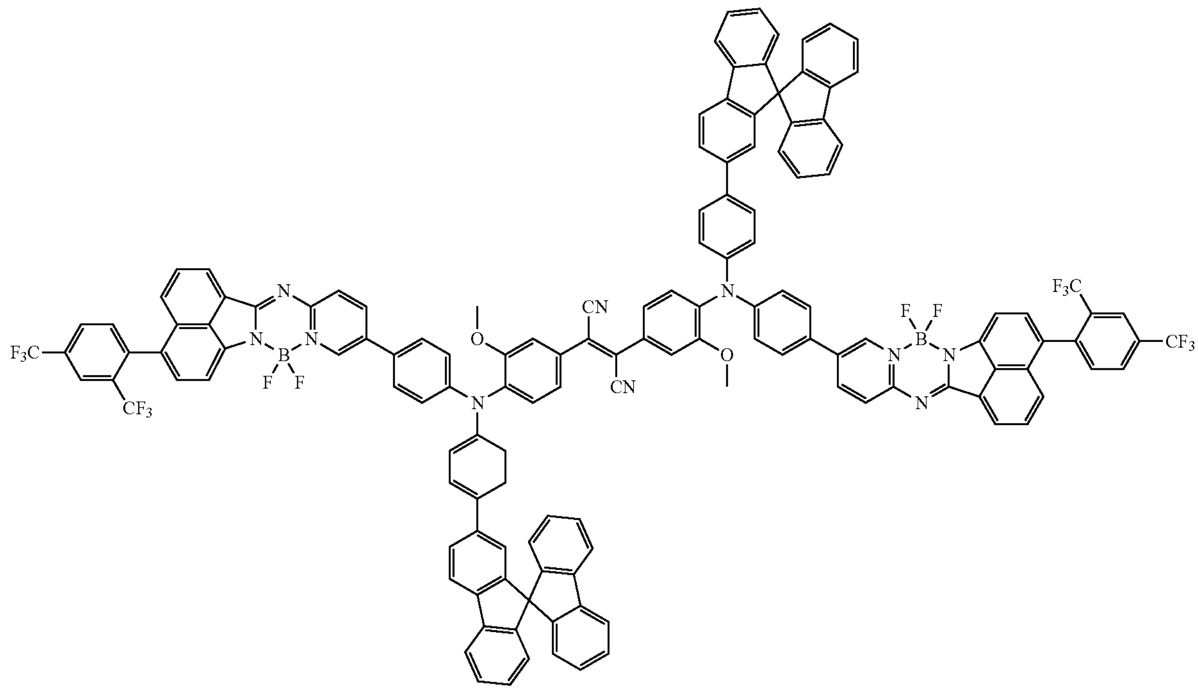
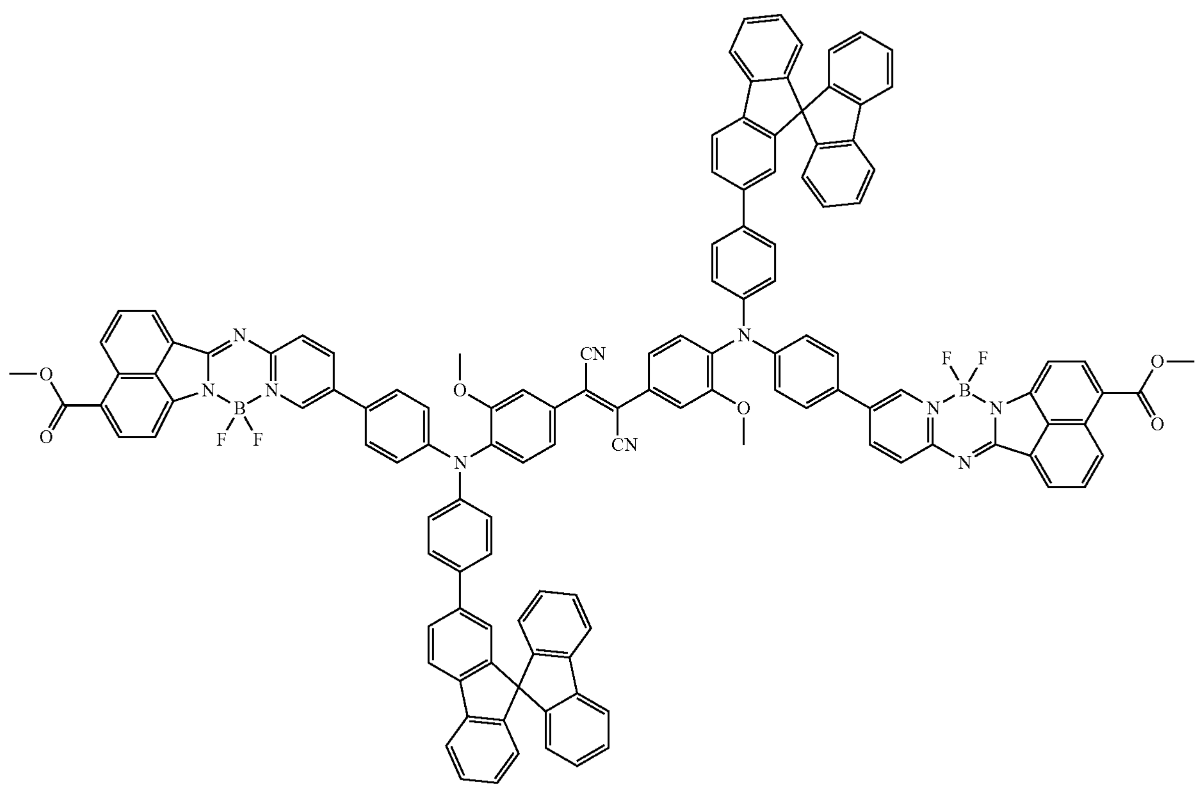

-continued
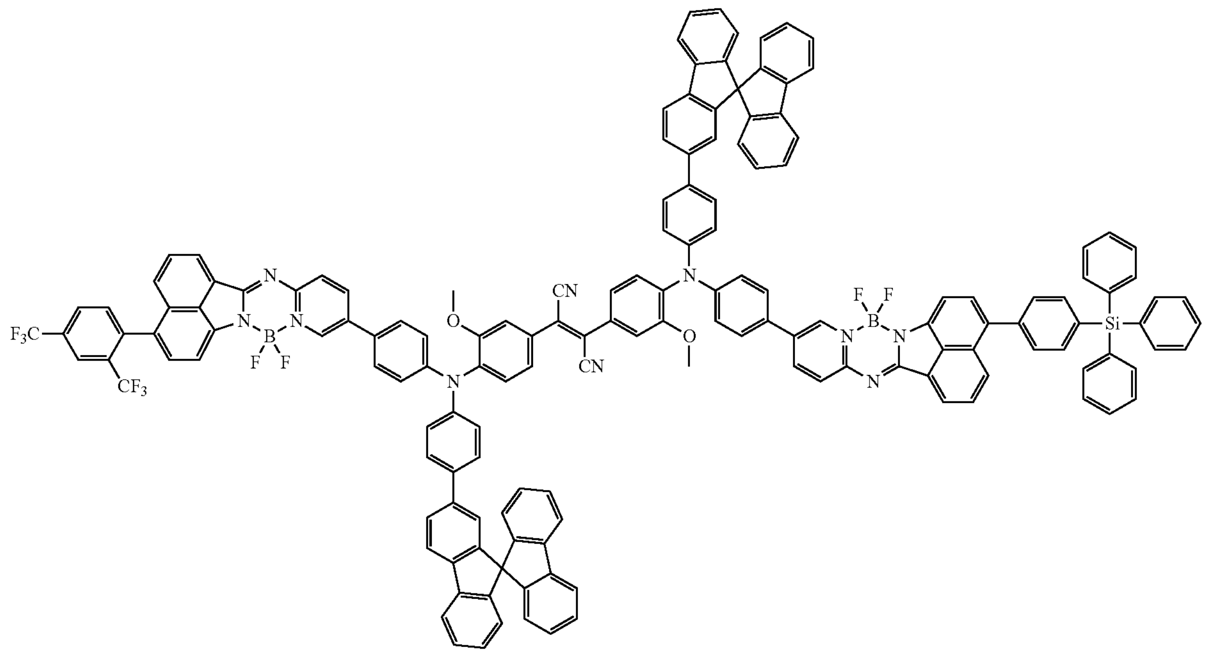
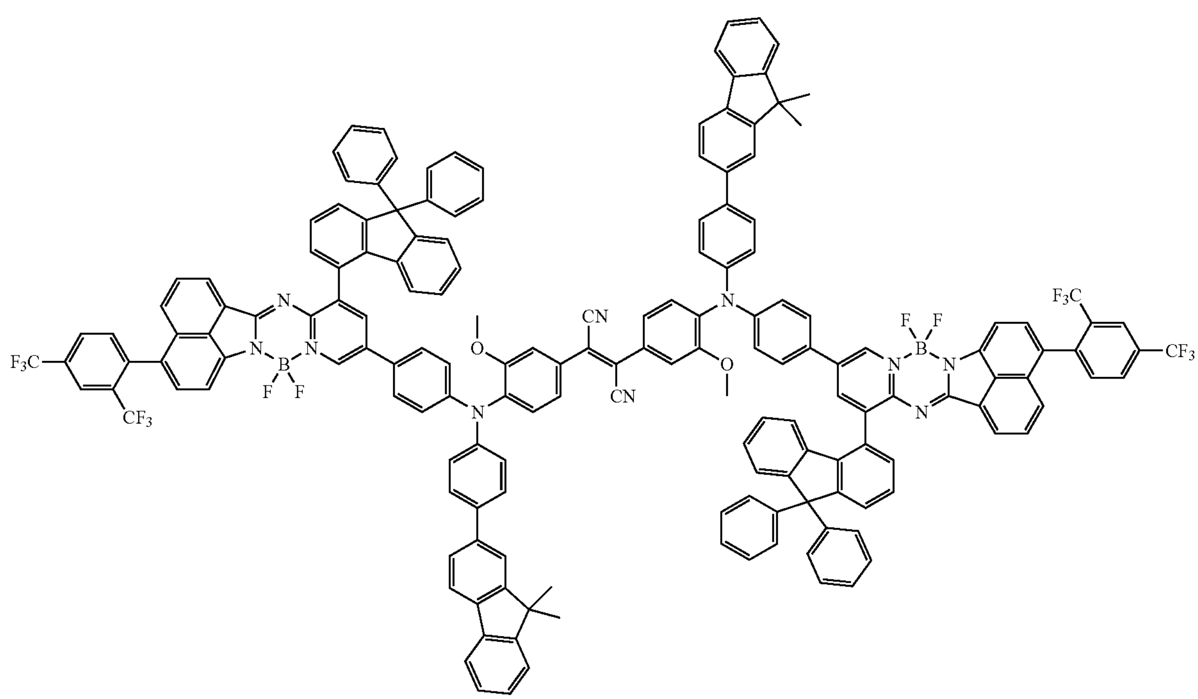

-continued
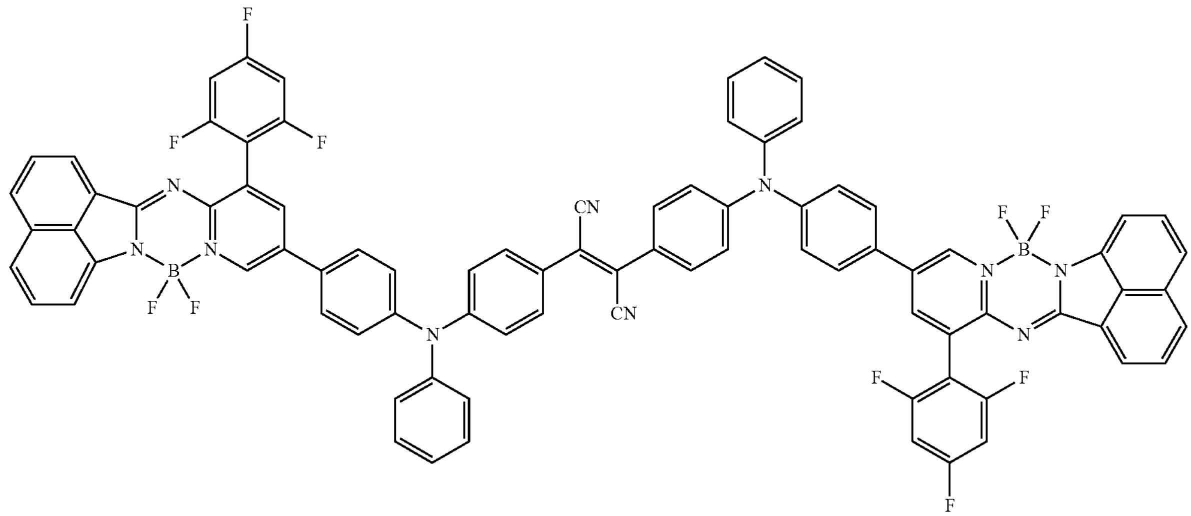
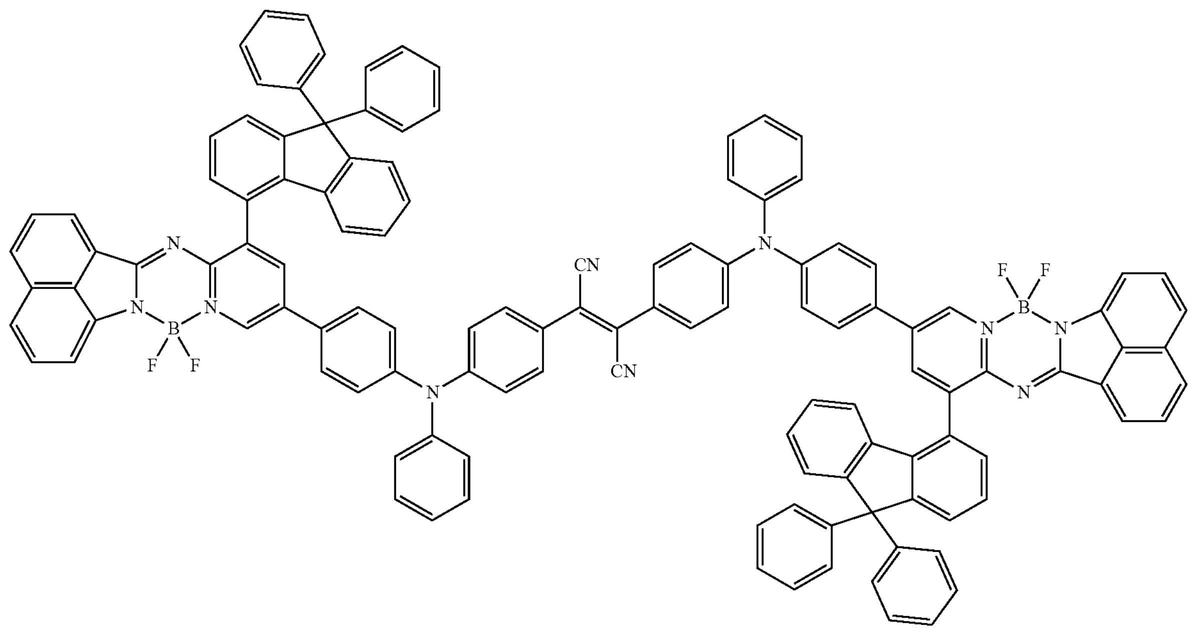
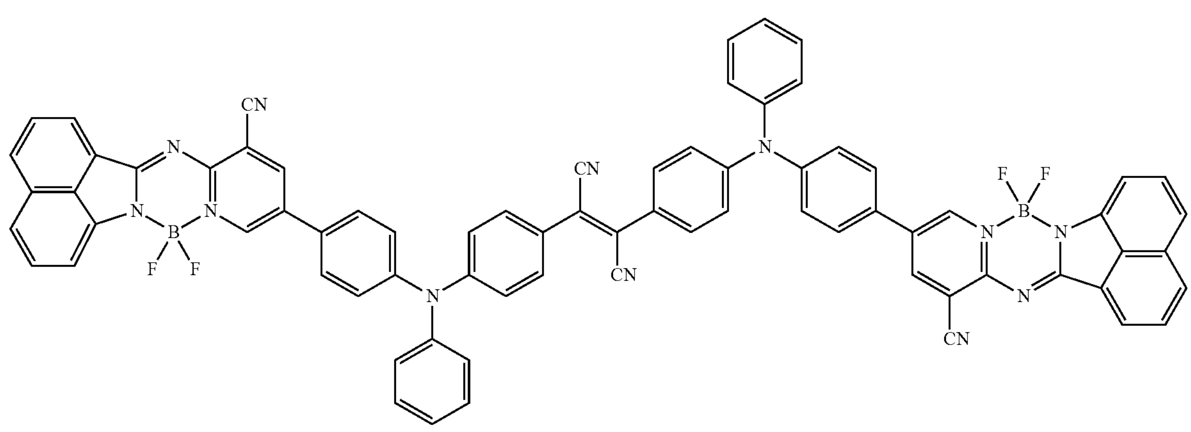

-continued
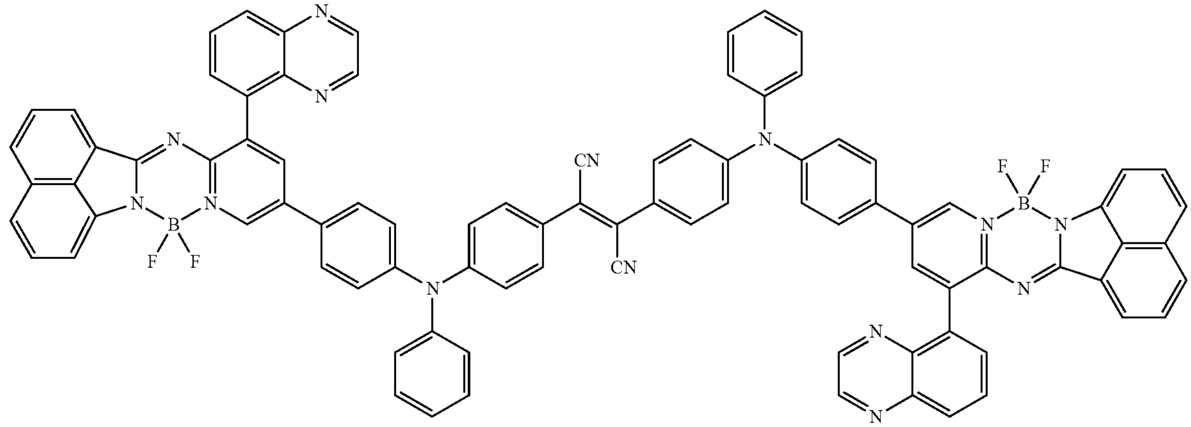
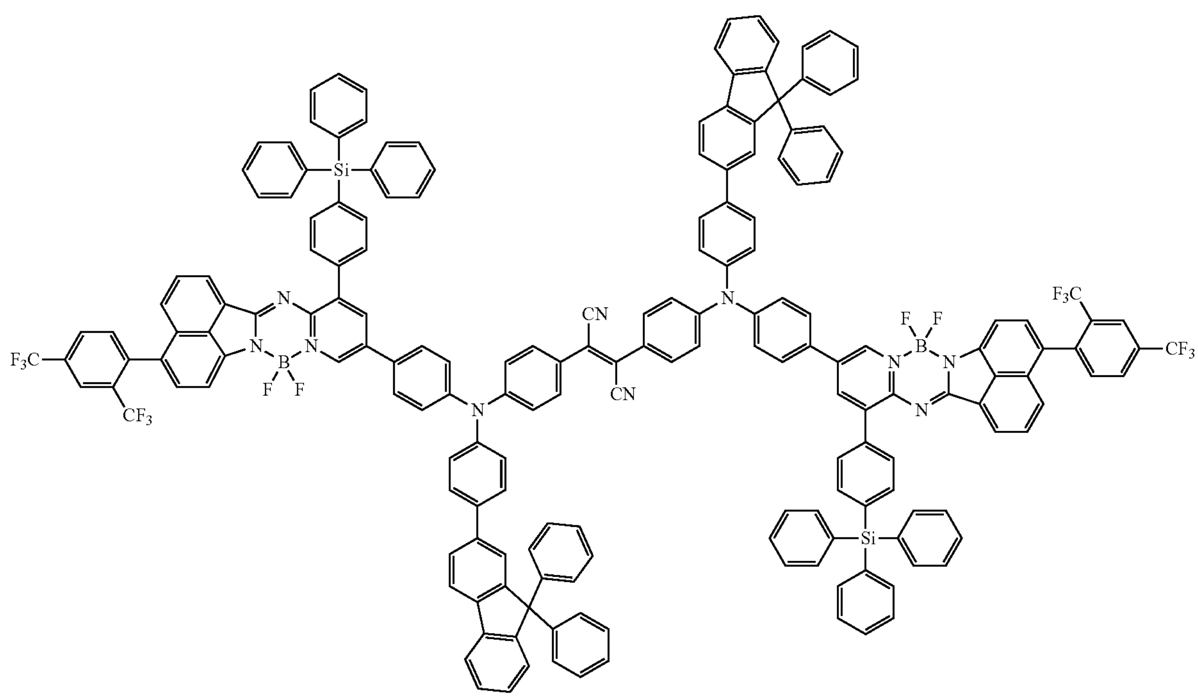

-continued
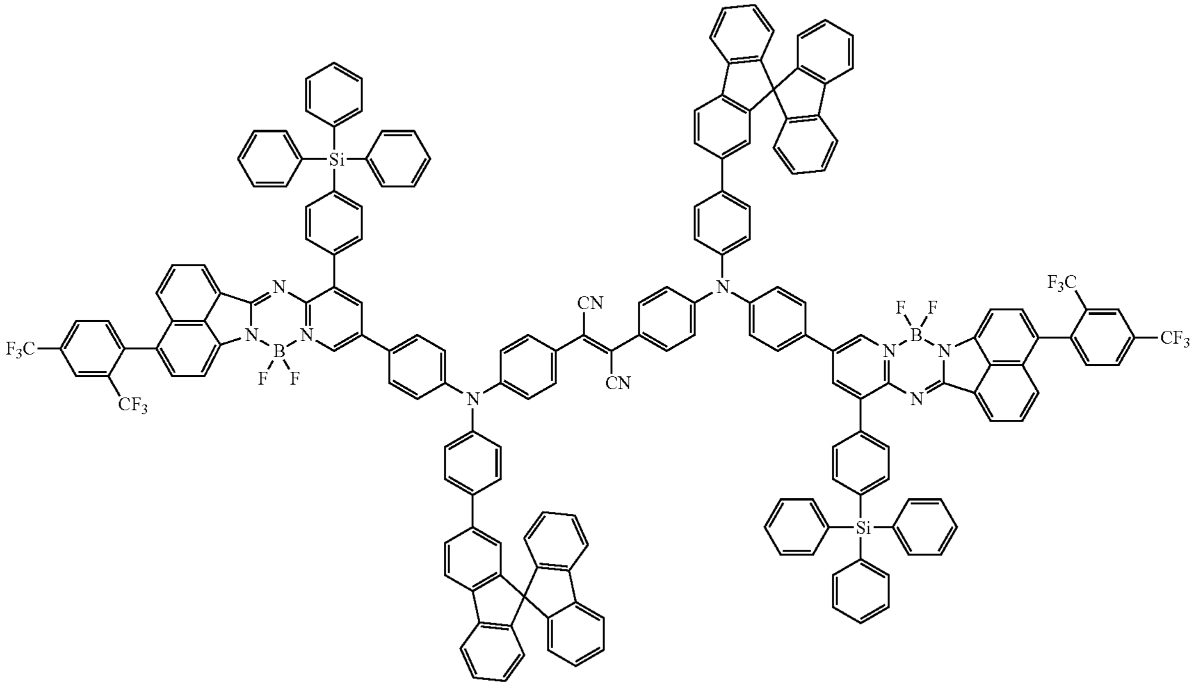
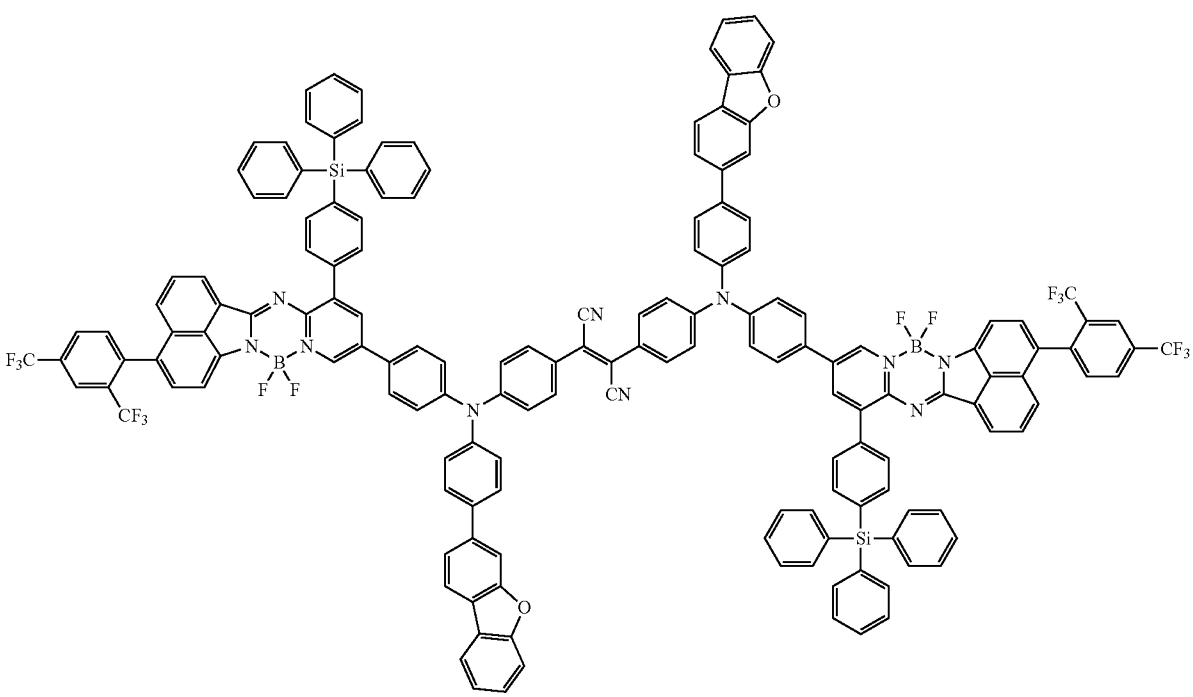

-continued
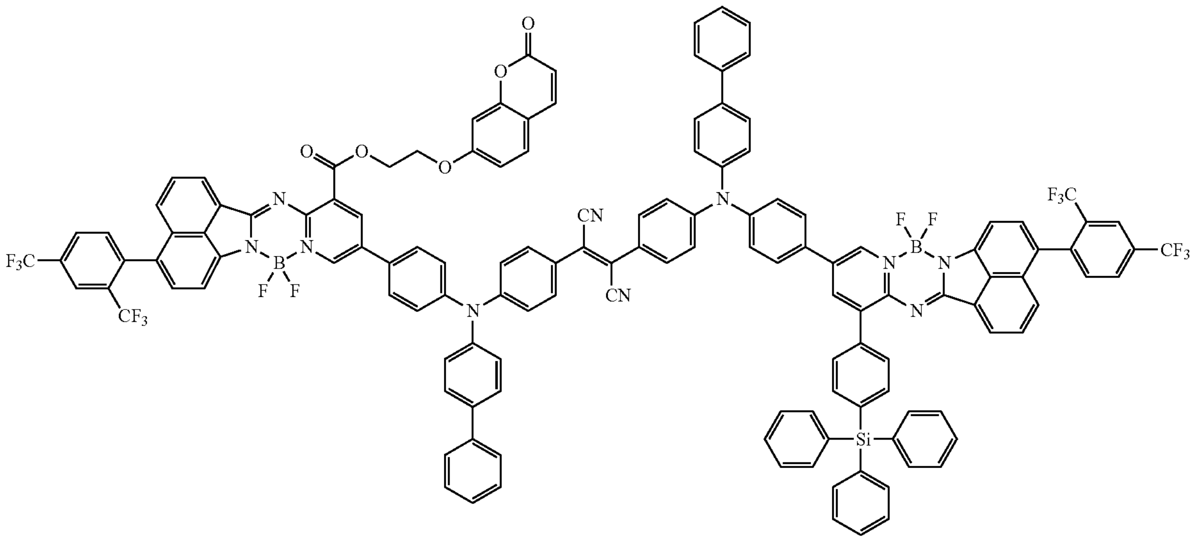
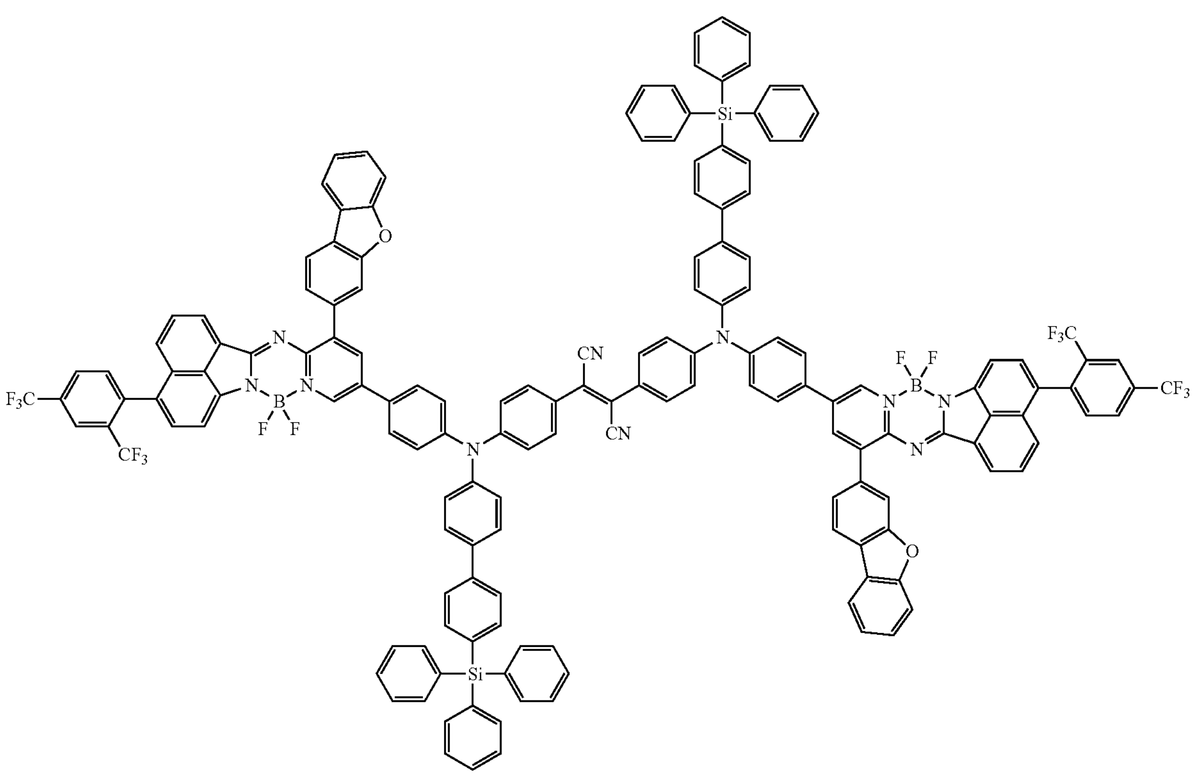

-continued
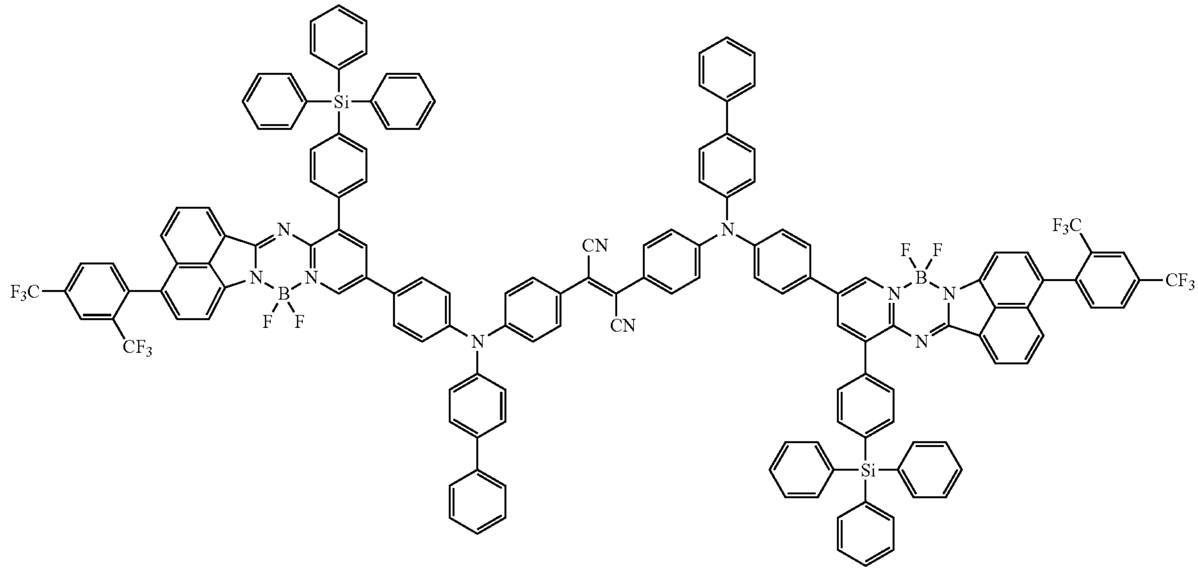
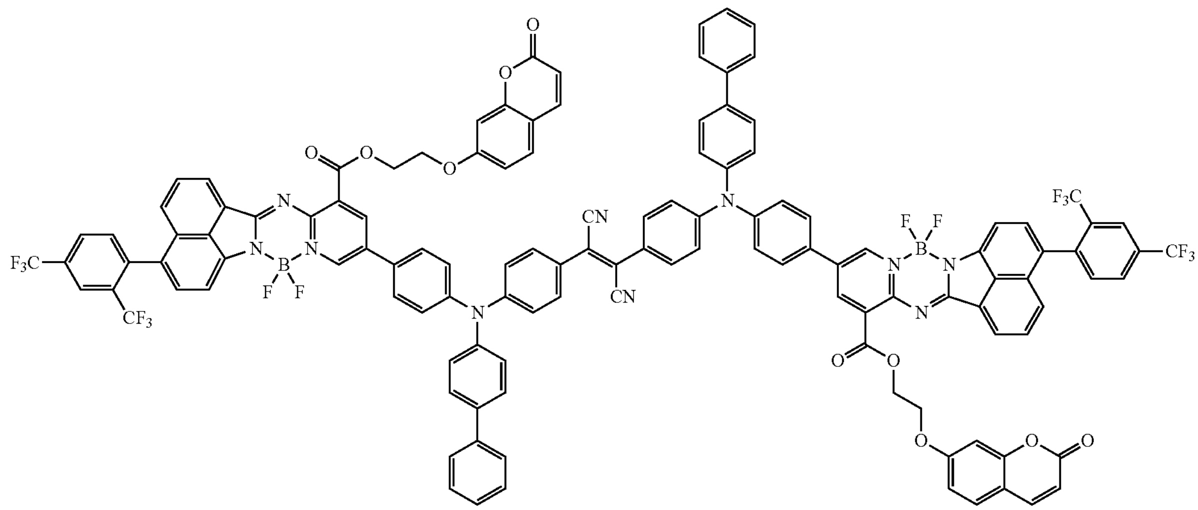
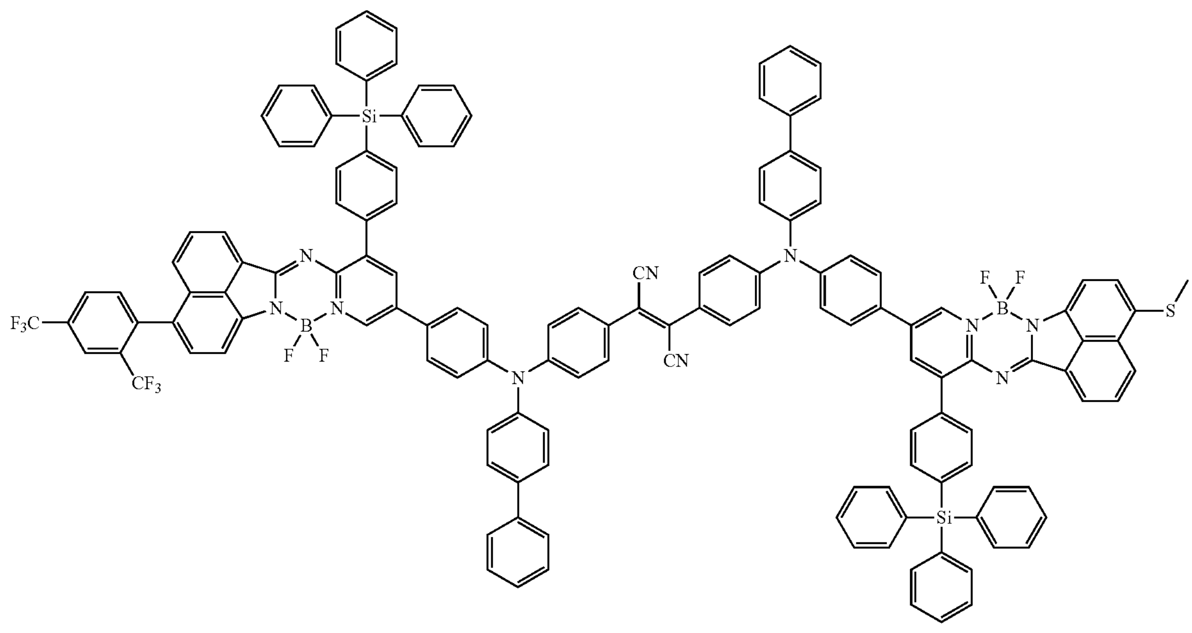

-continued
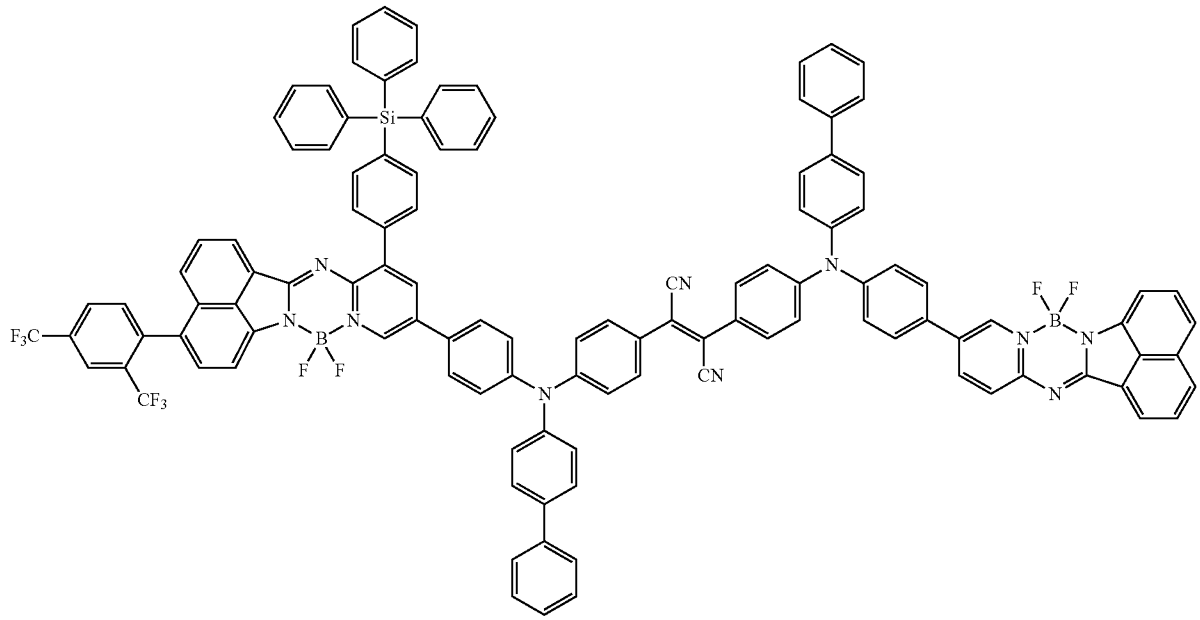
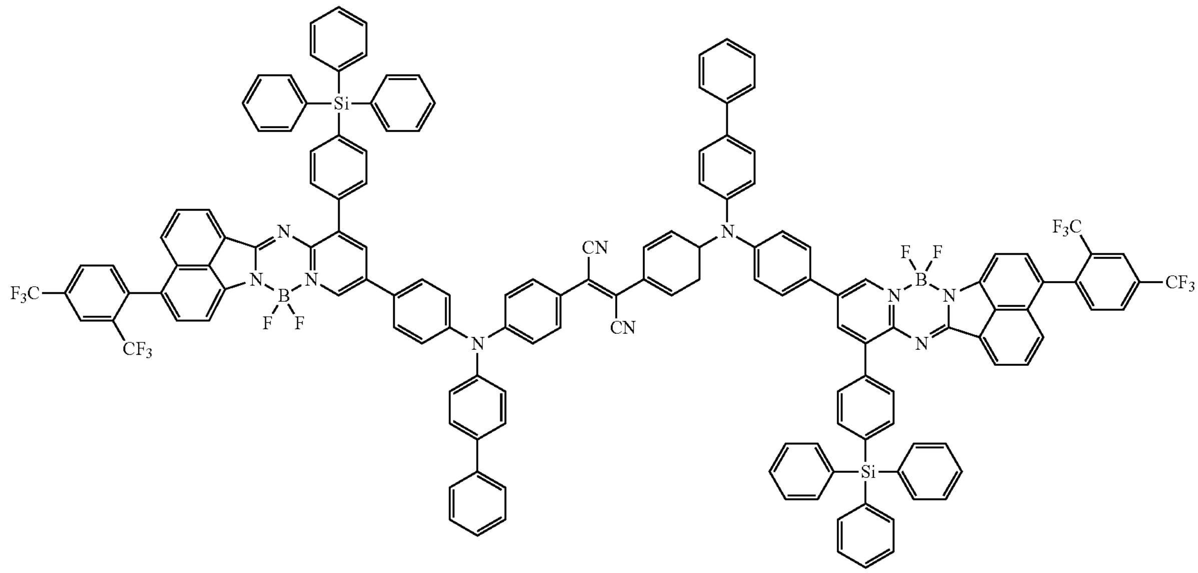
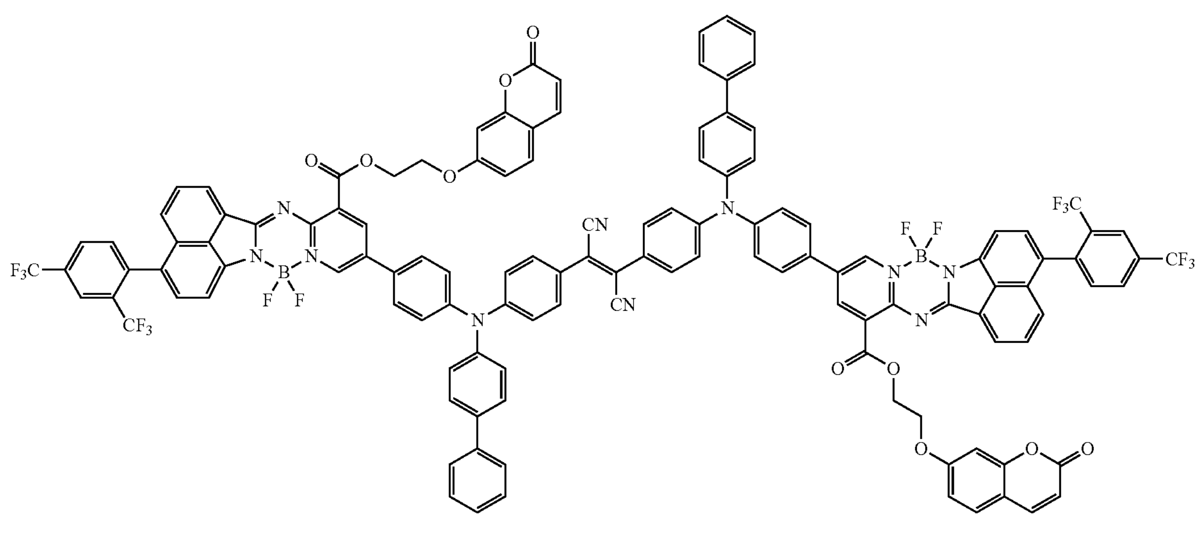

-continued
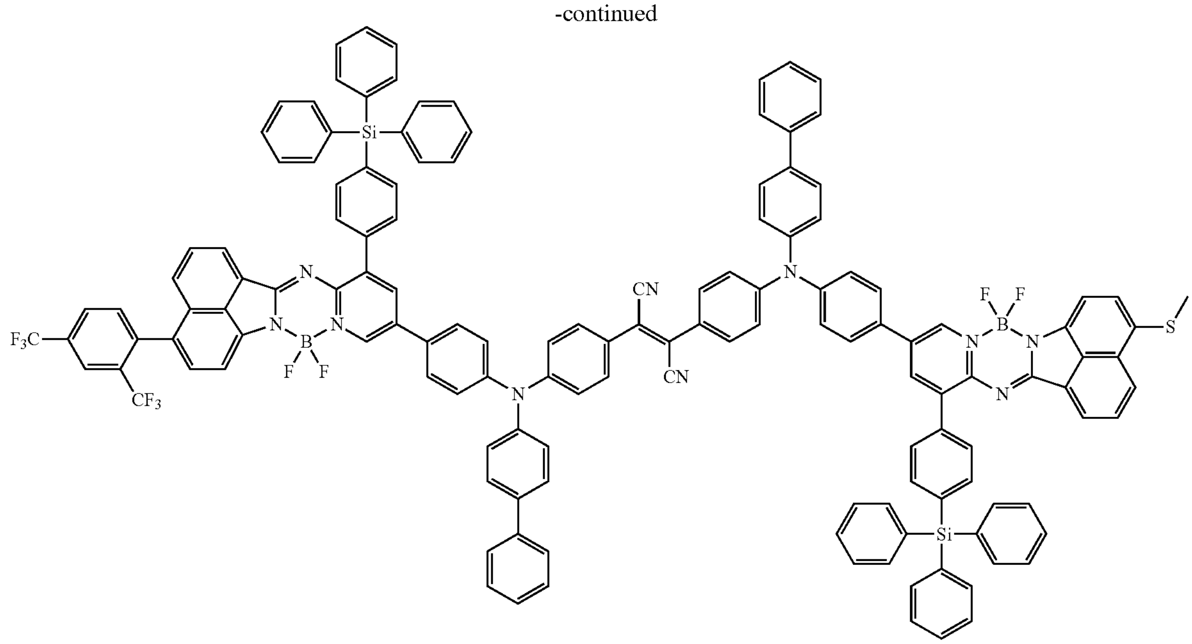
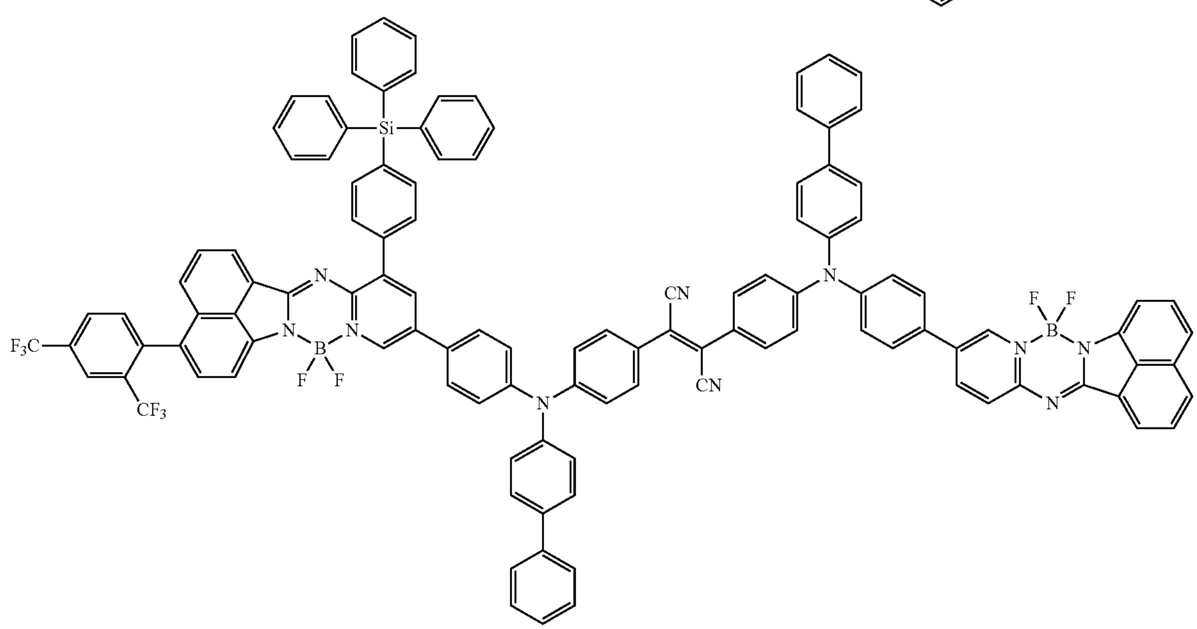
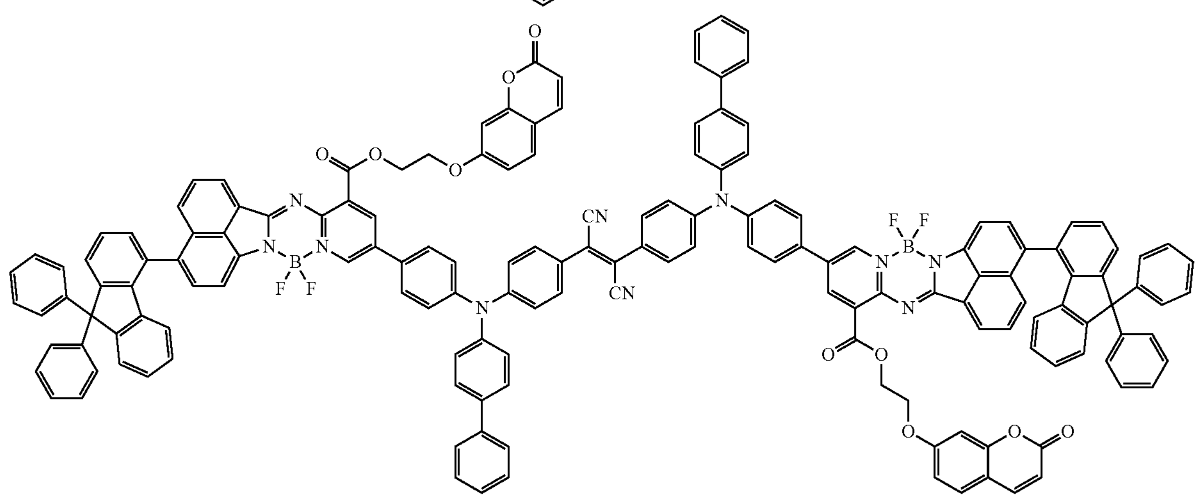

-continued
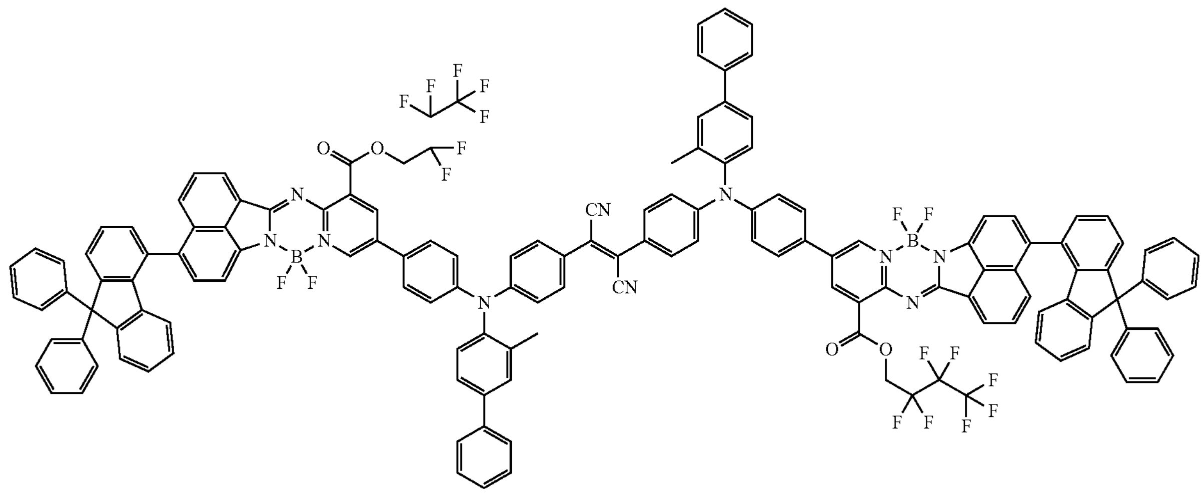
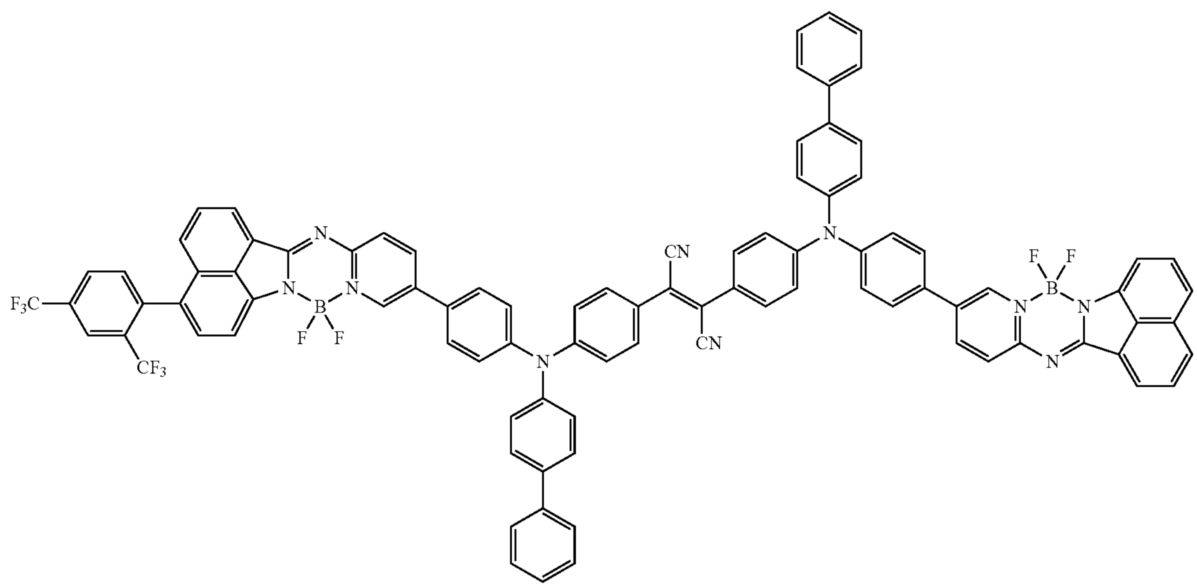
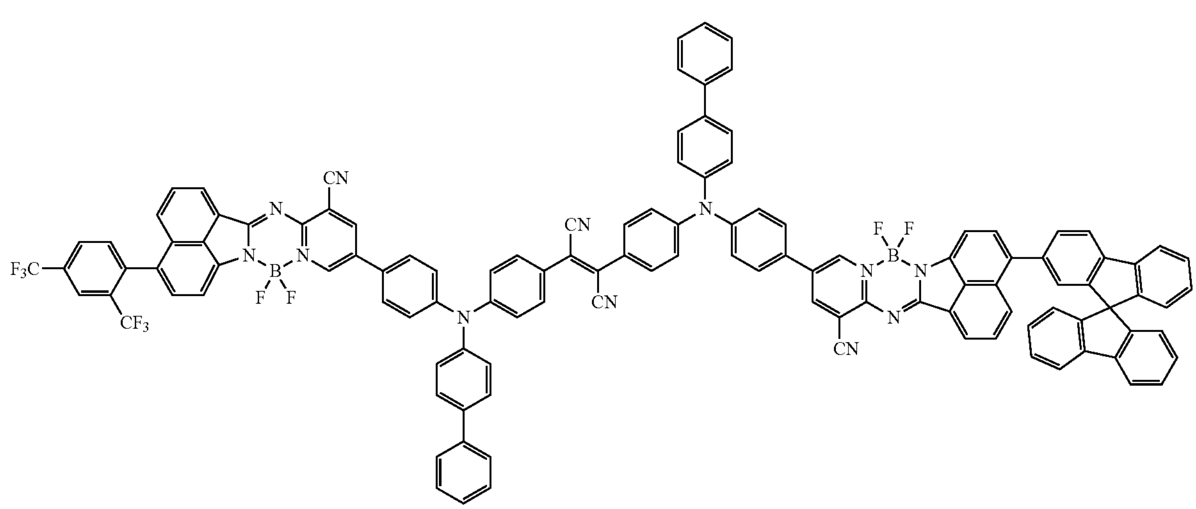

-continued
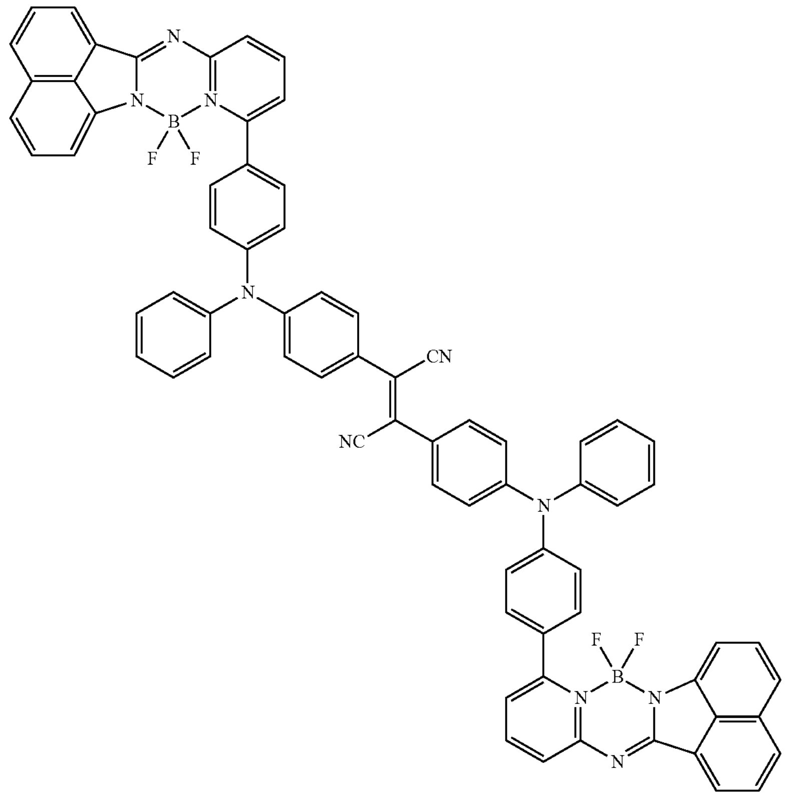
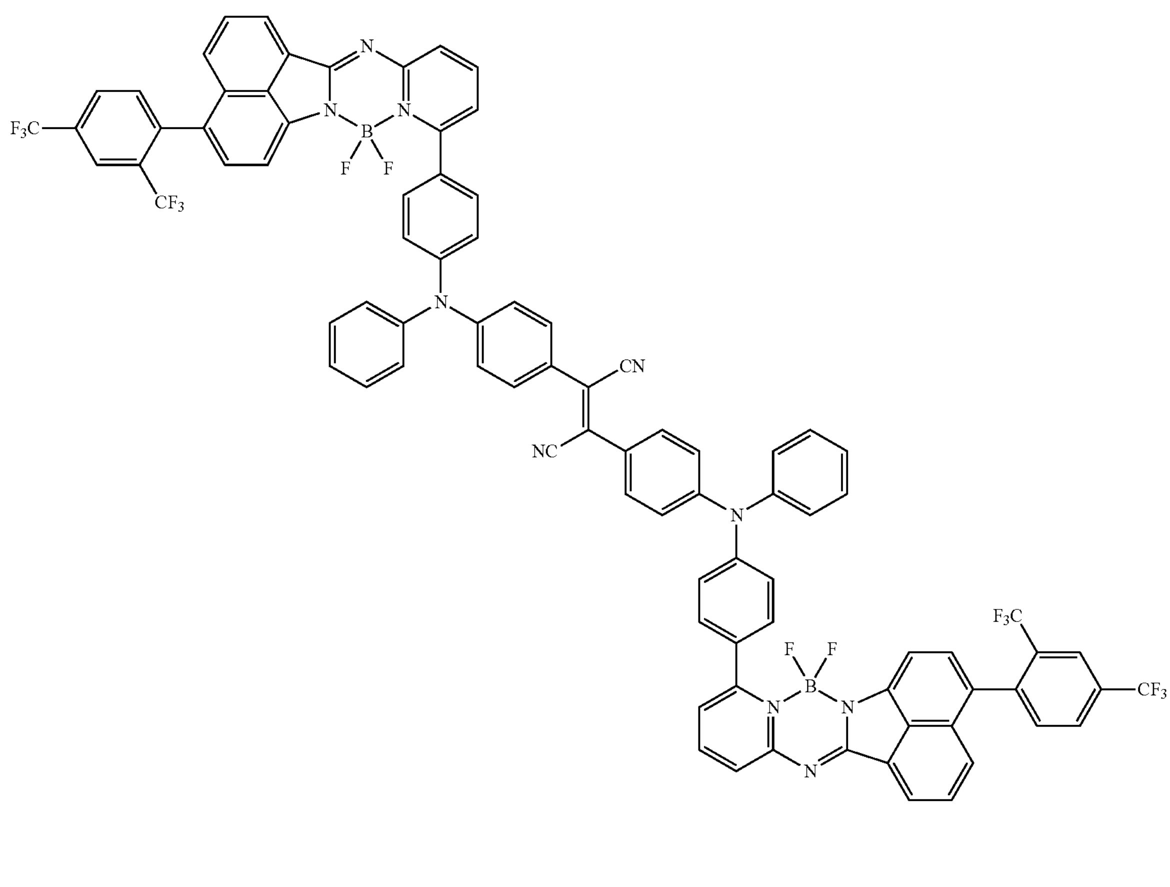

-continued
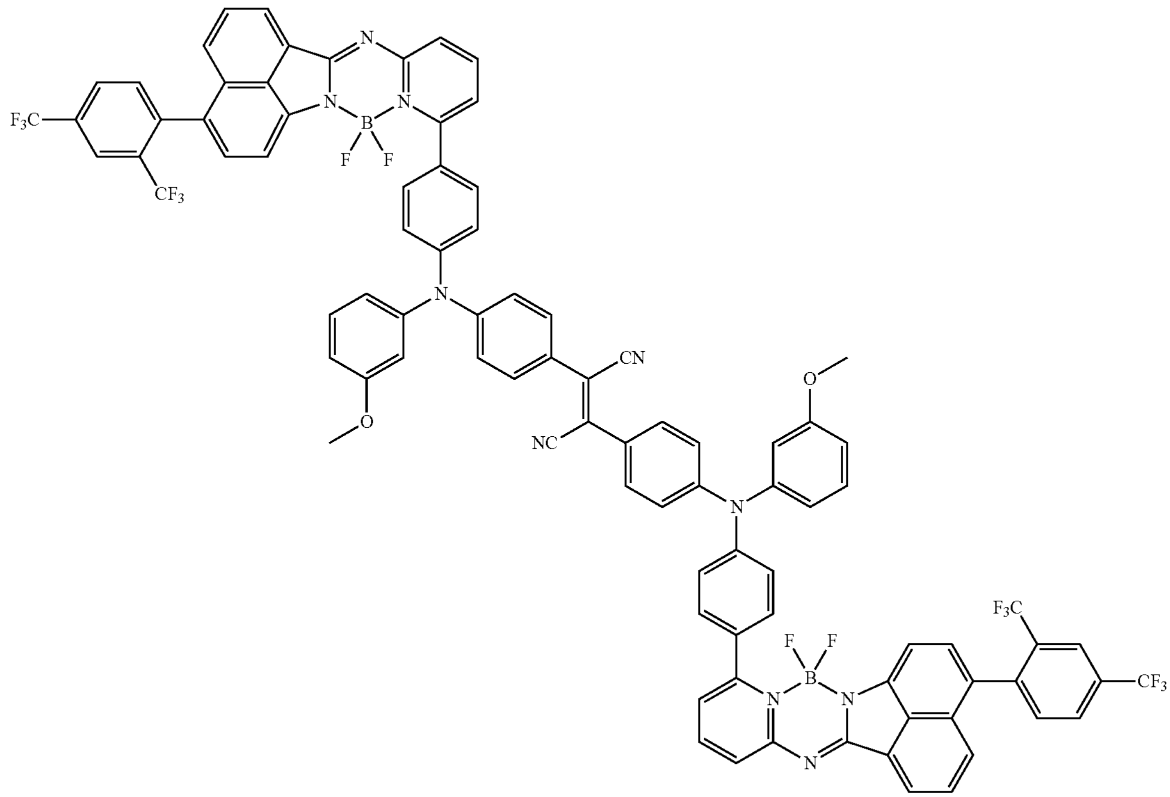
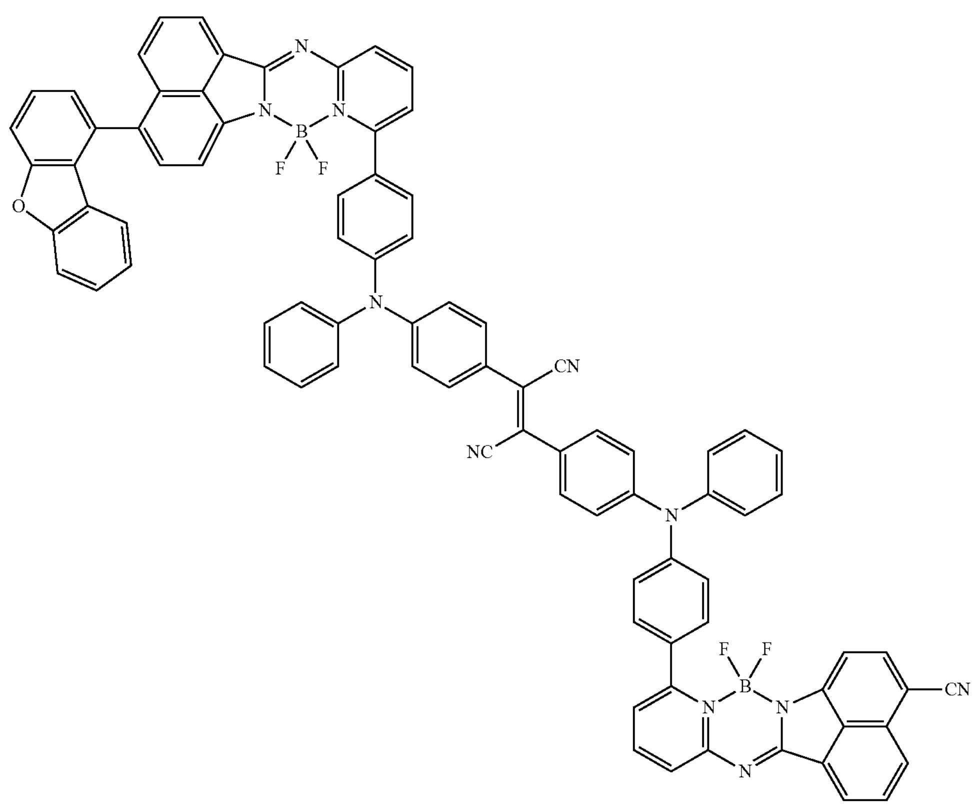

-continued
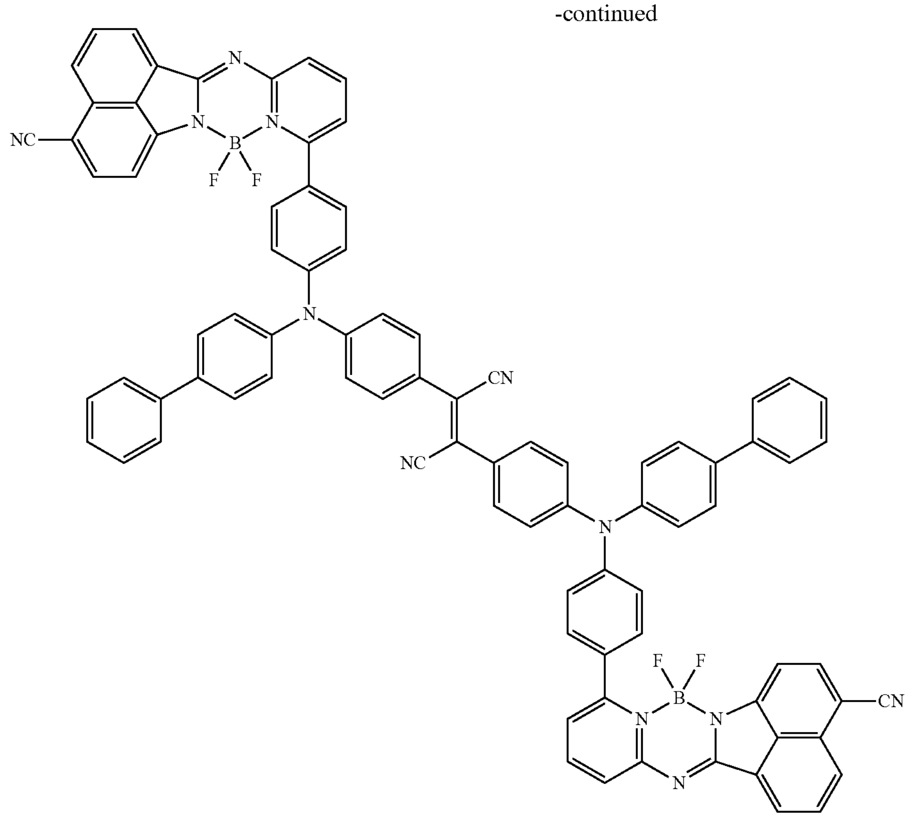
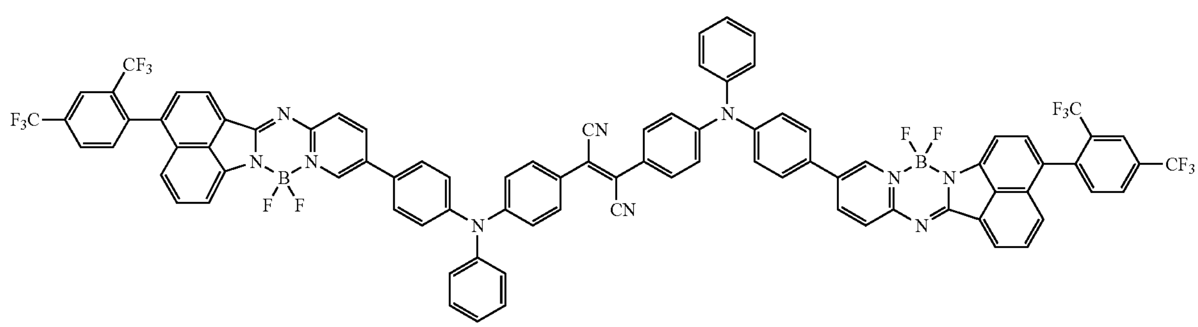
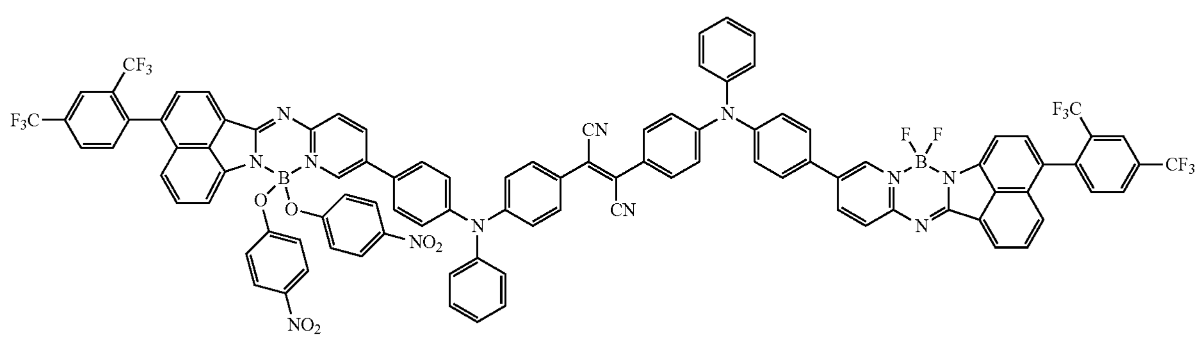

-continued
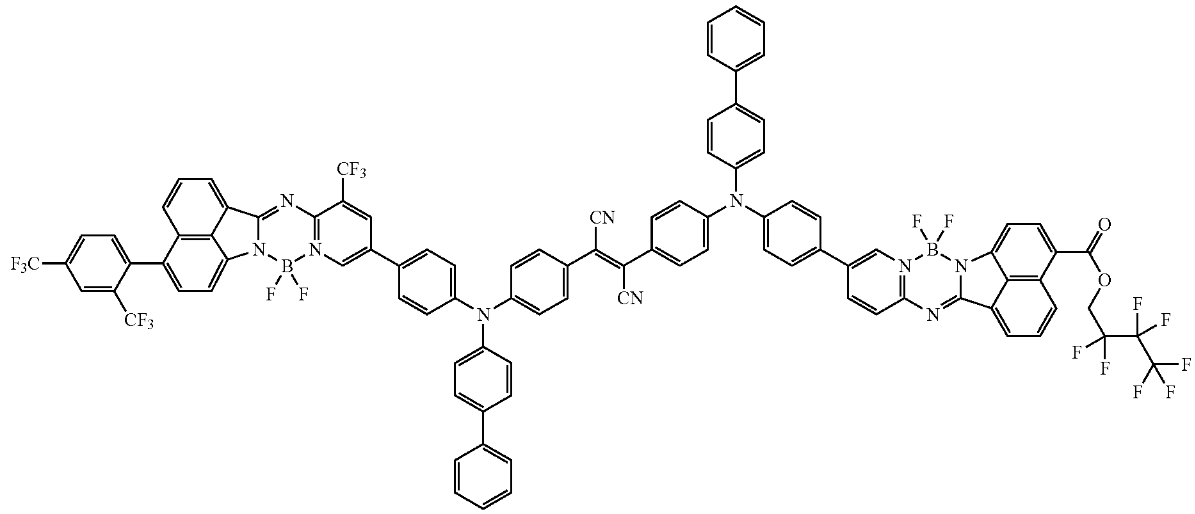
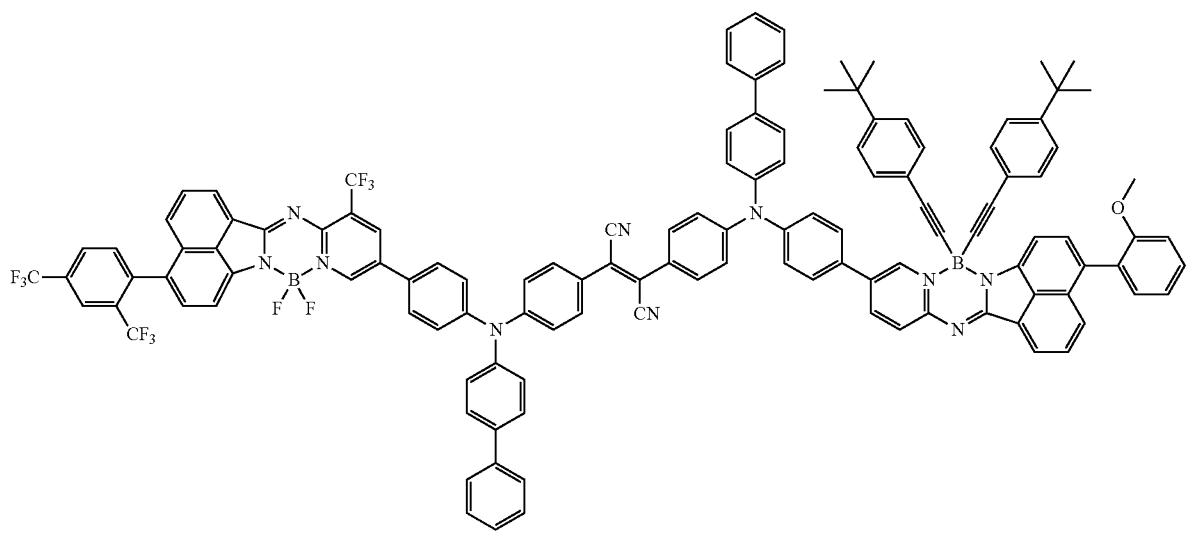
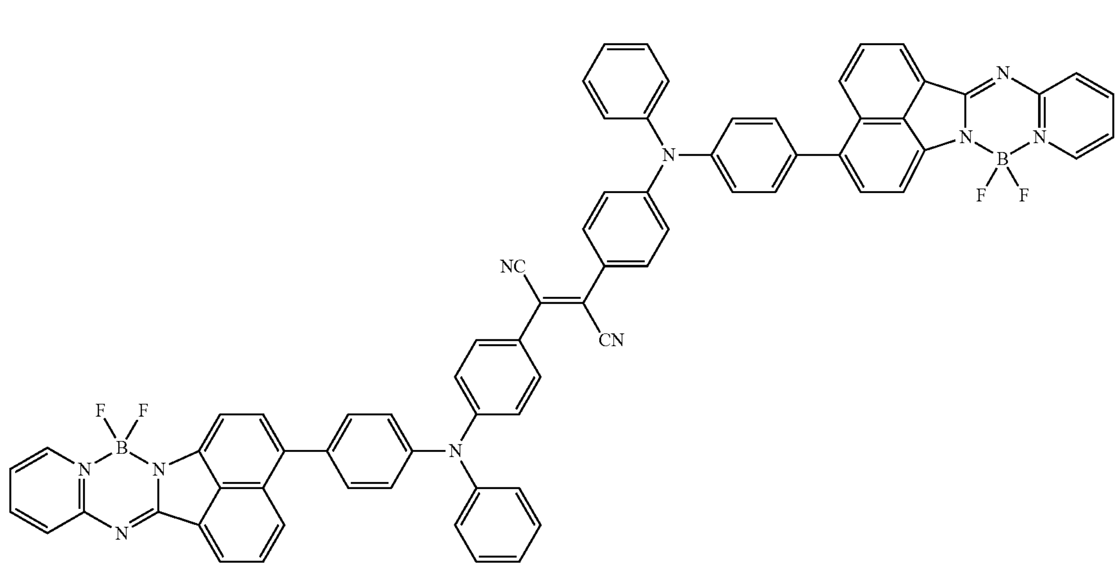

-continued
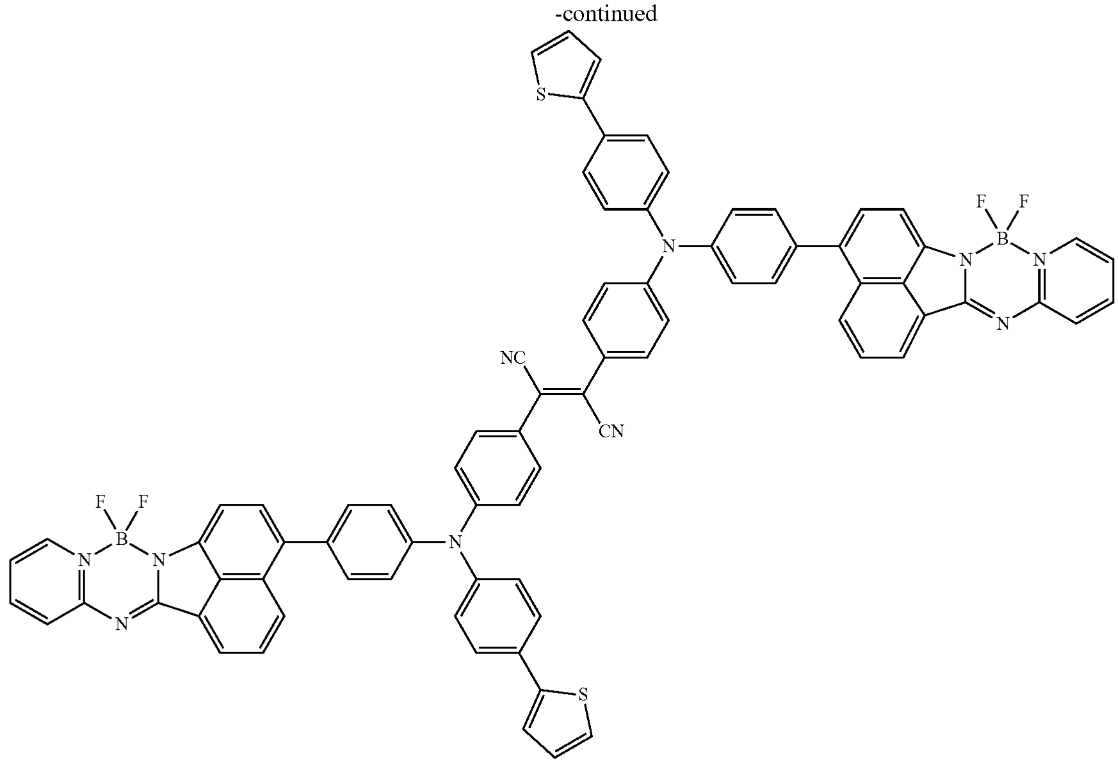
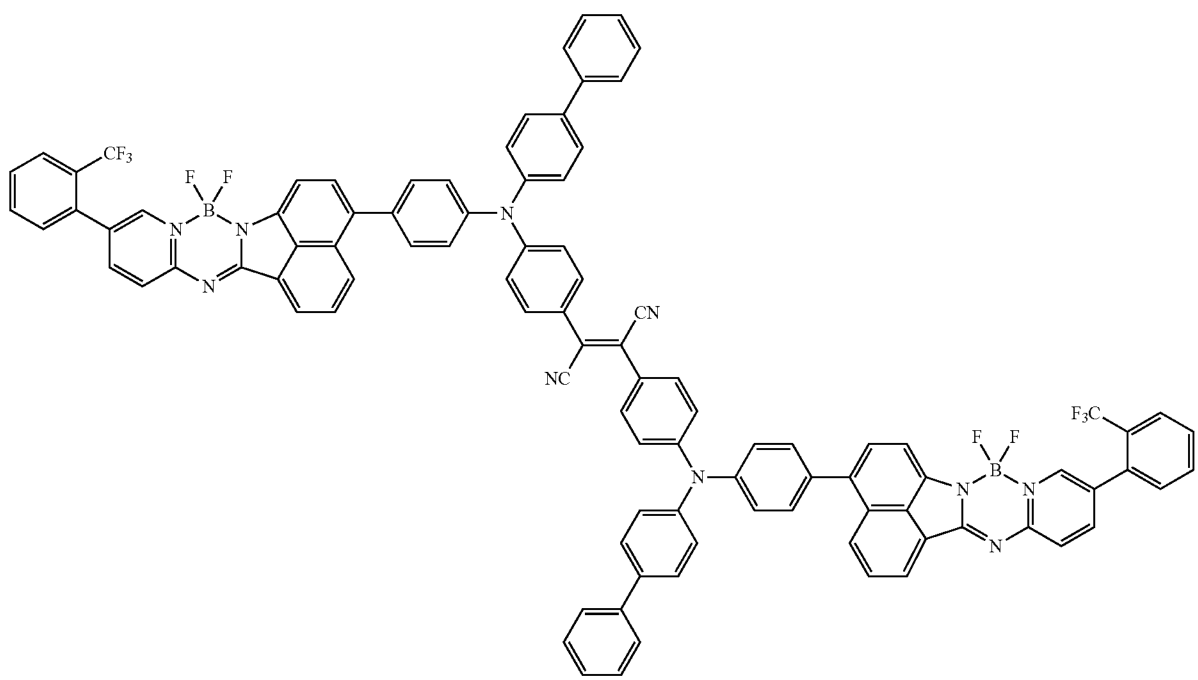

-continued
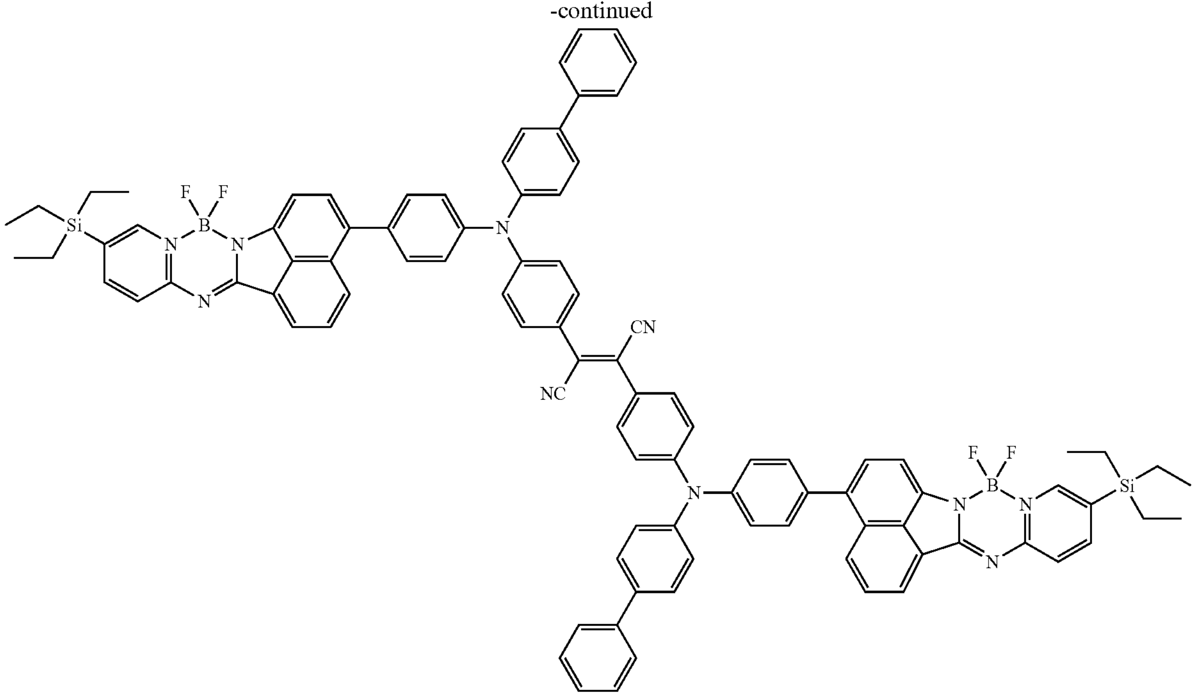
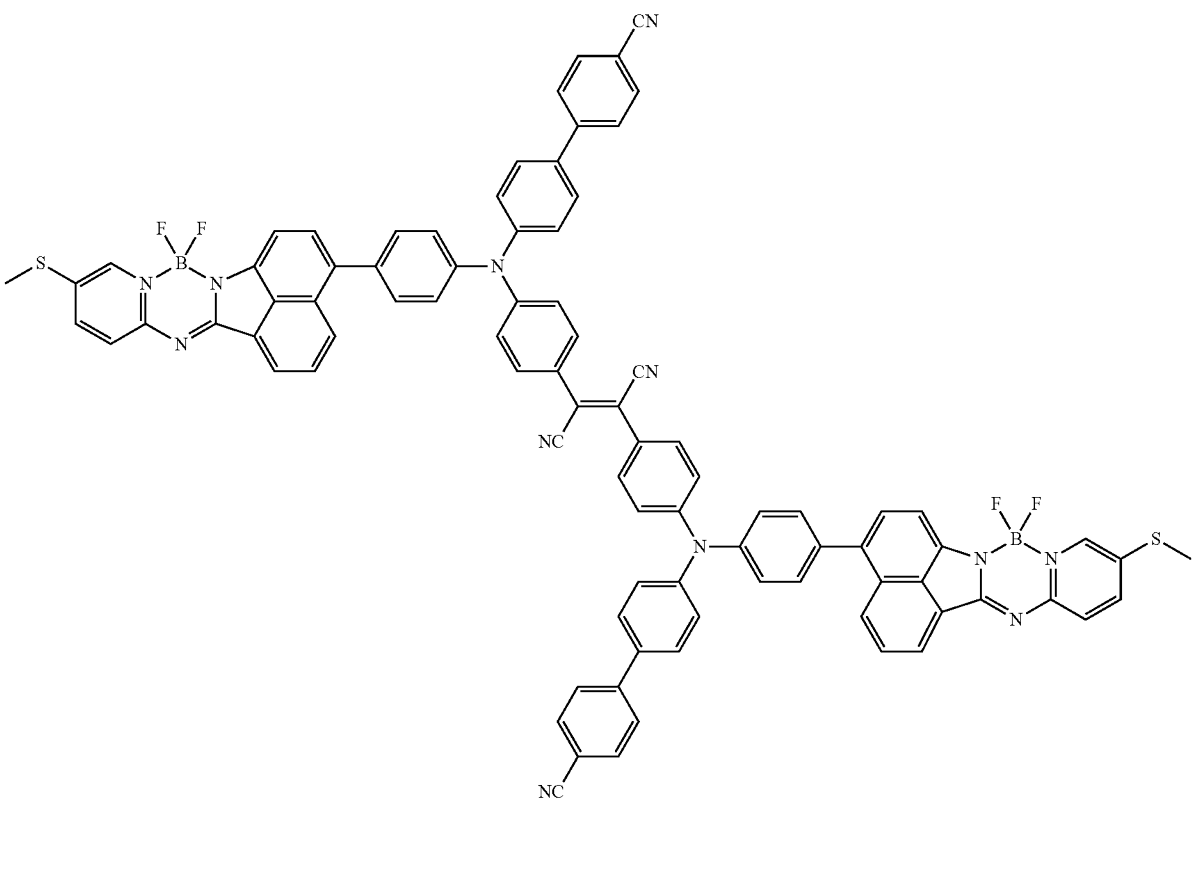

-continued
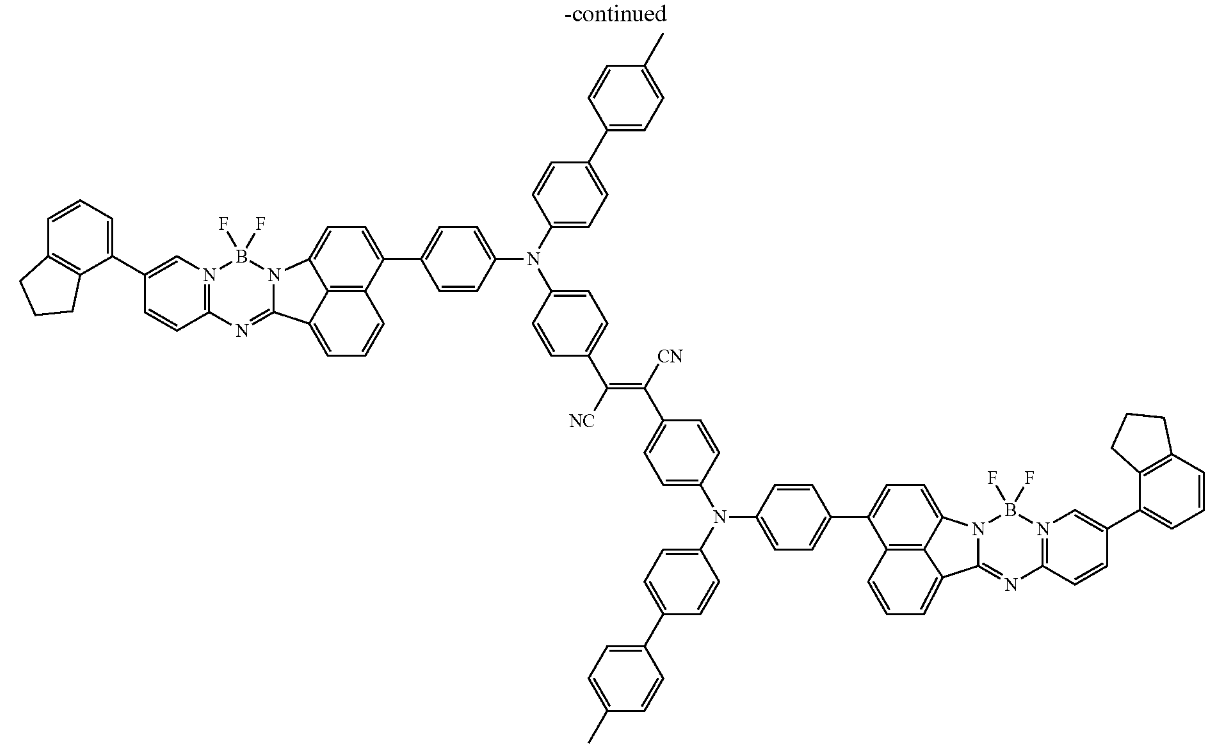
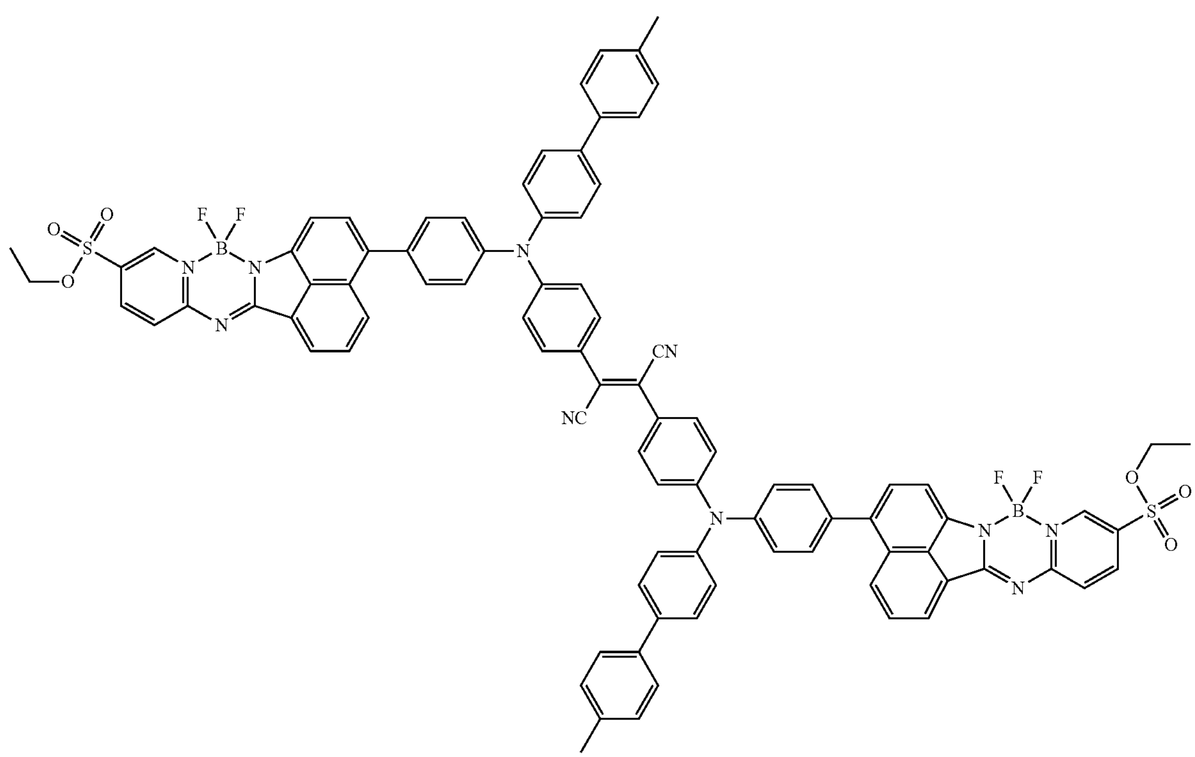

-continued
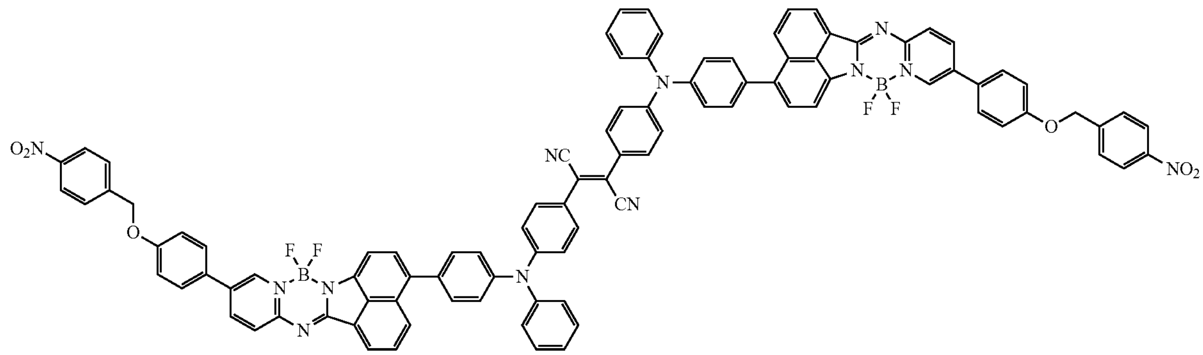
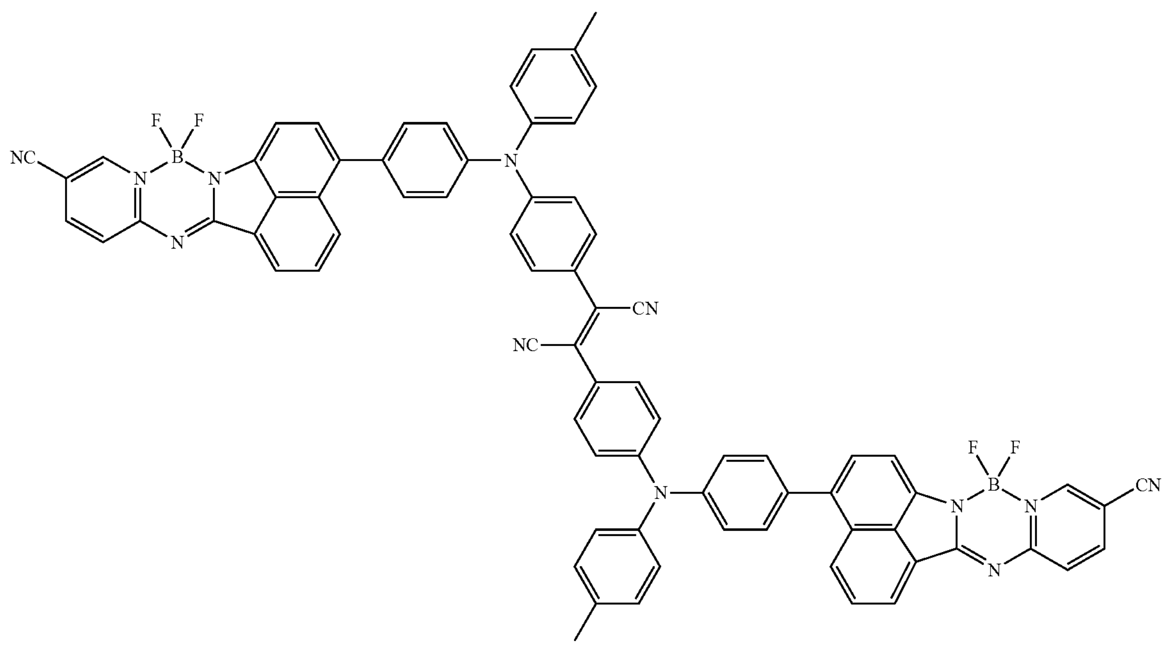
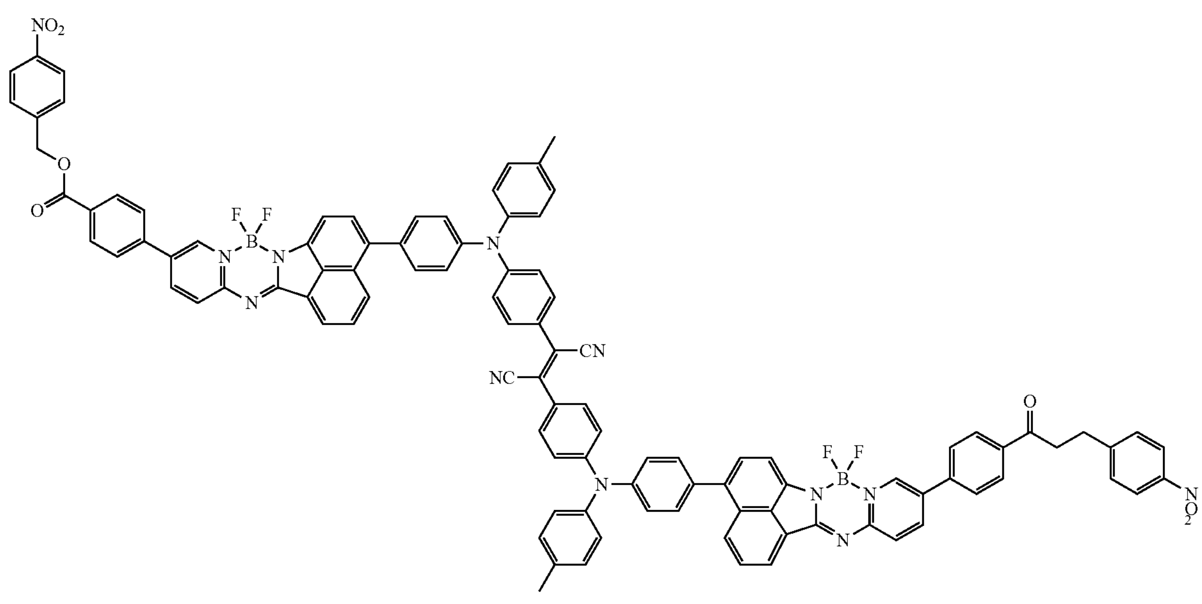

-continued
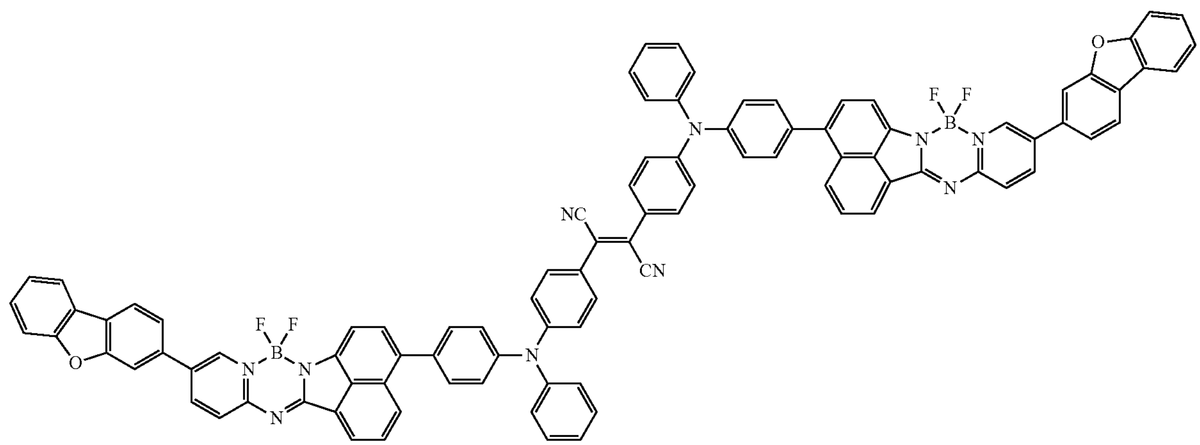
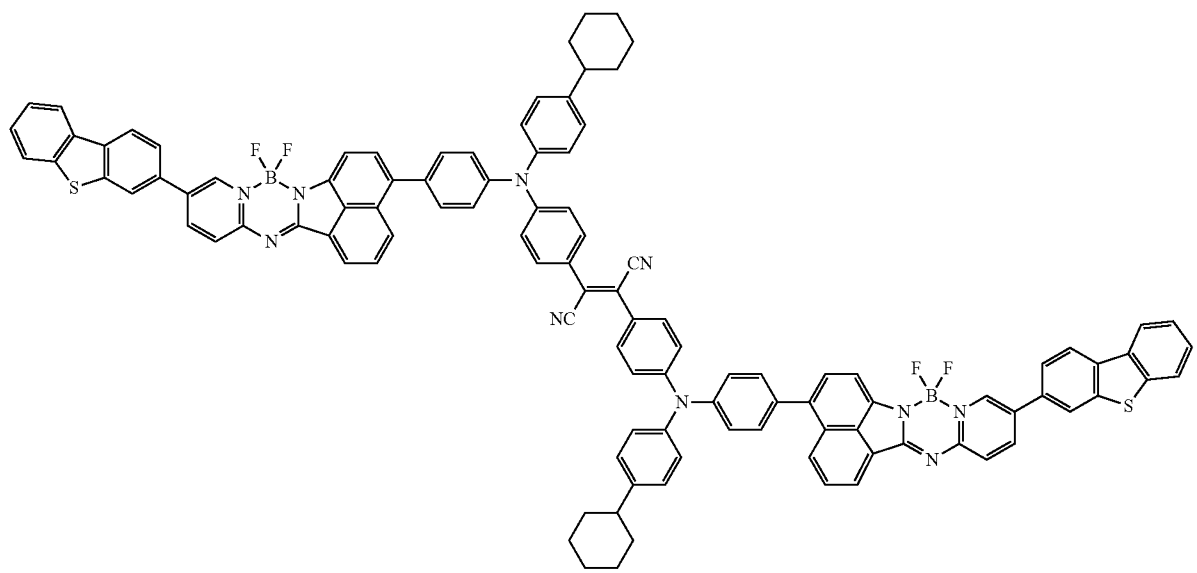
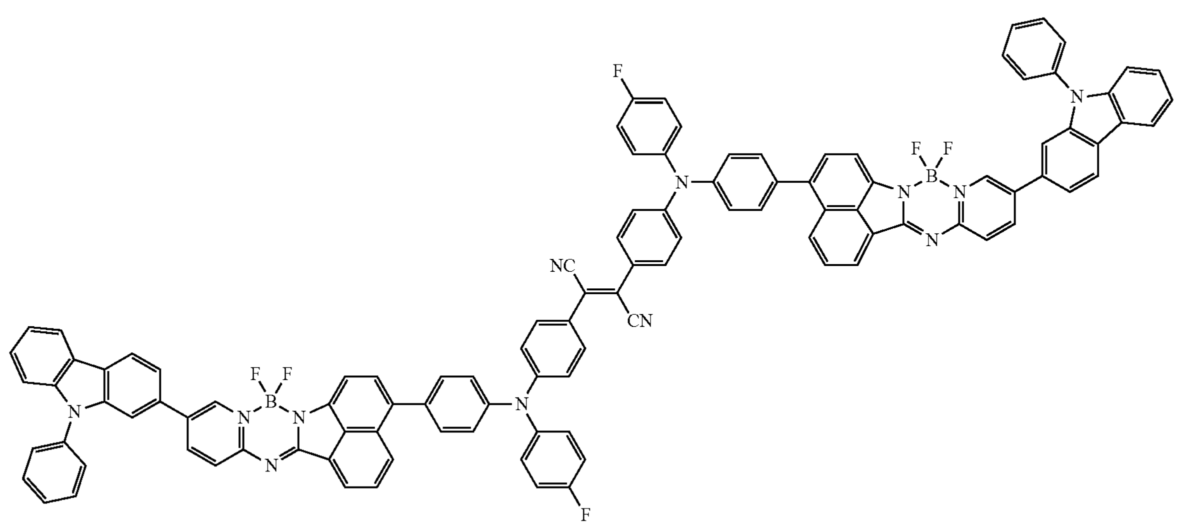

-continued
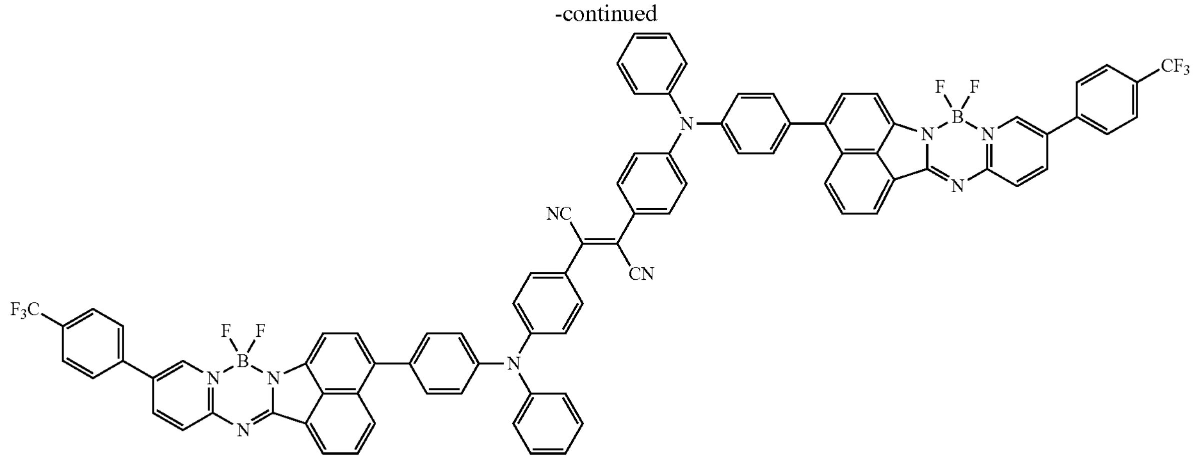
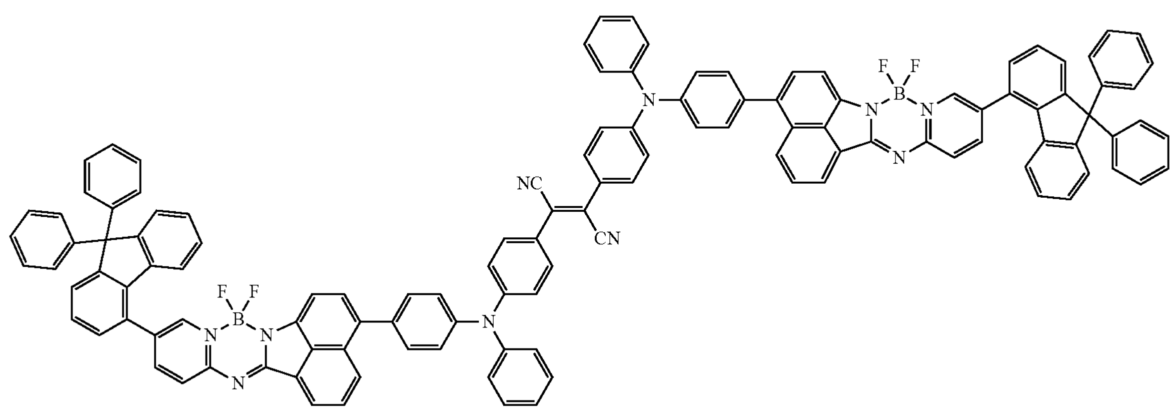
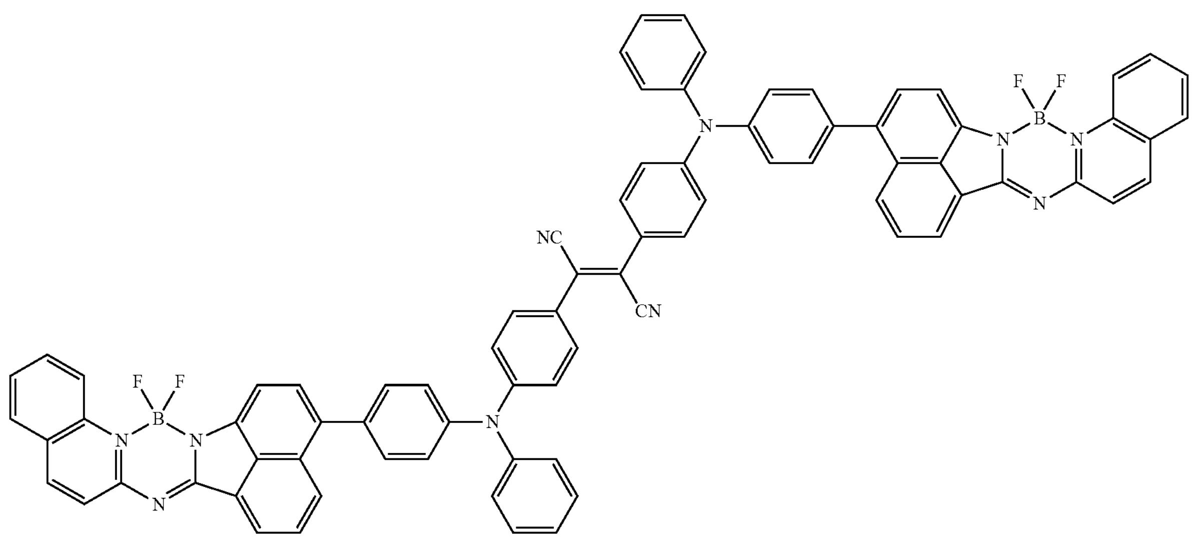

-continued
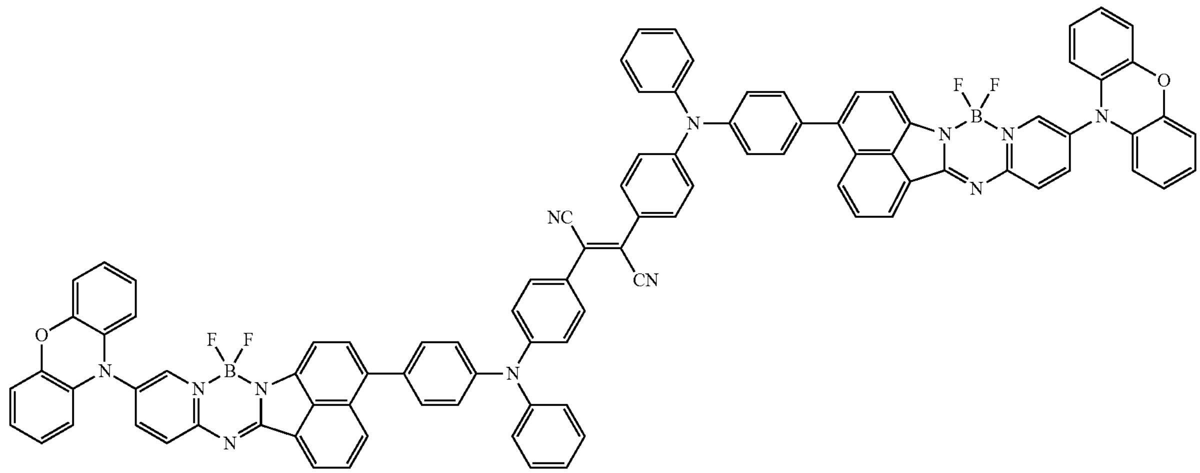
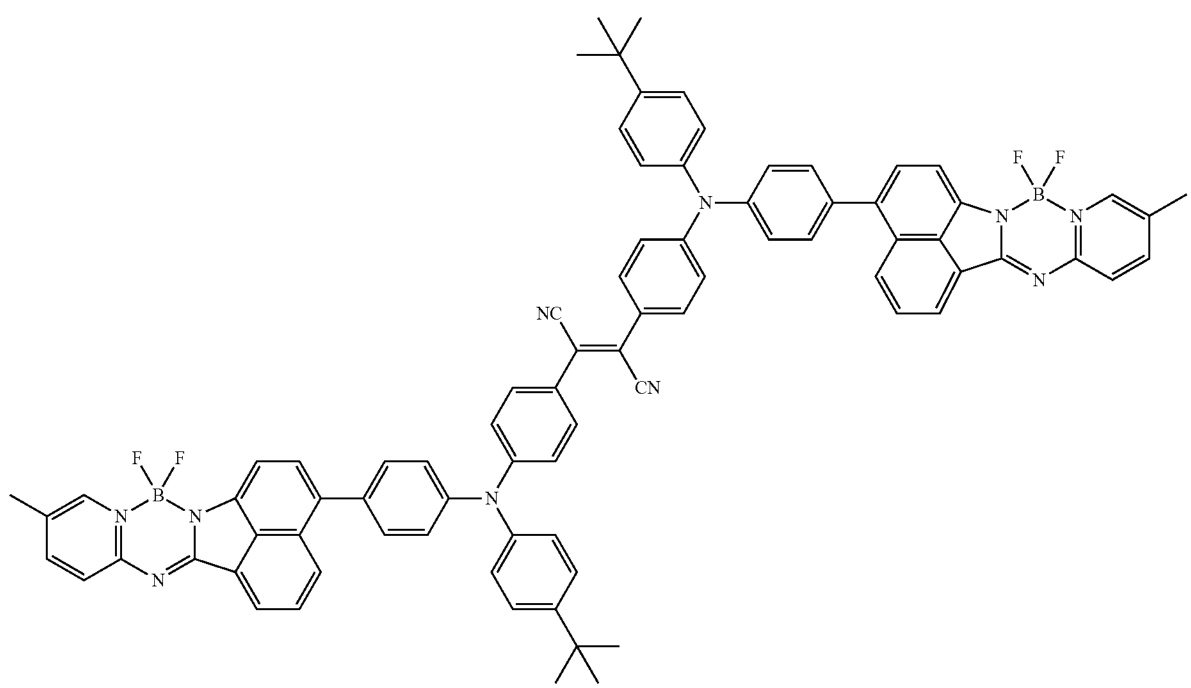

-continued
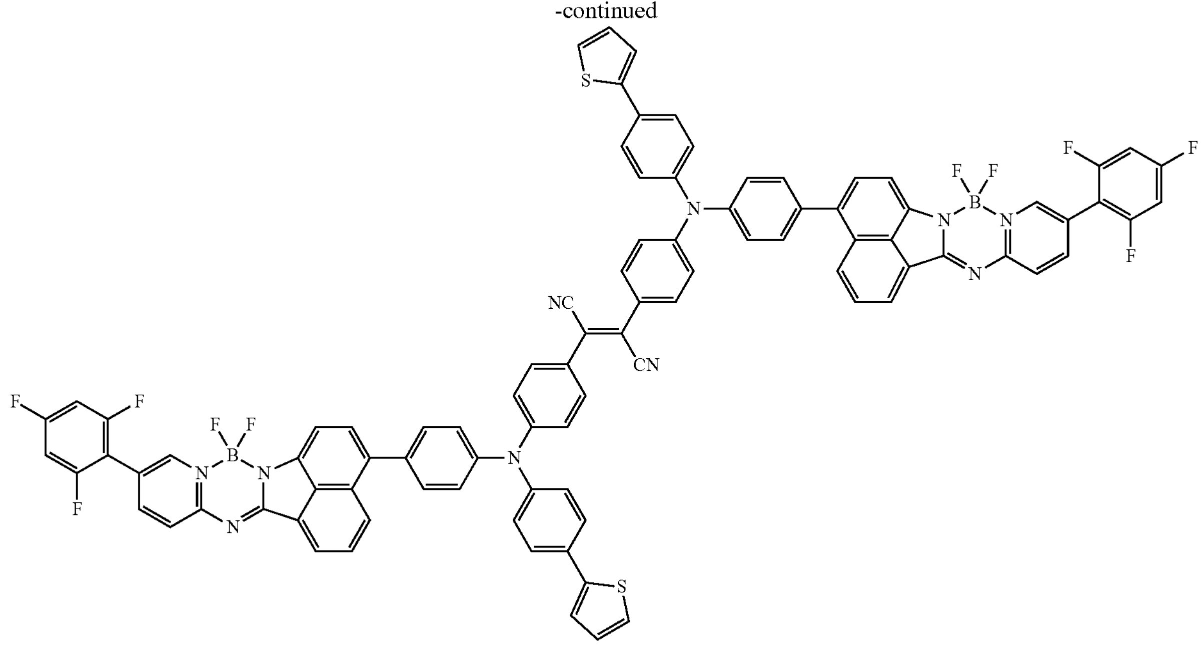
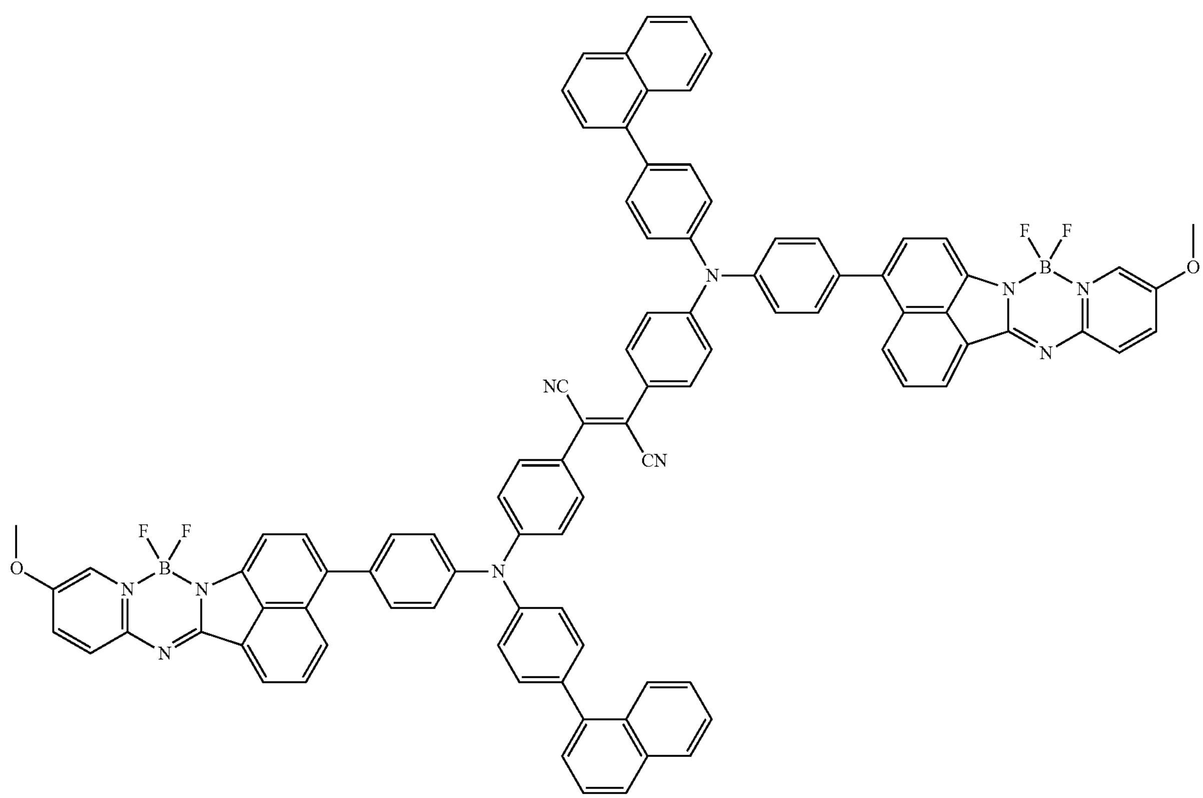

-continued
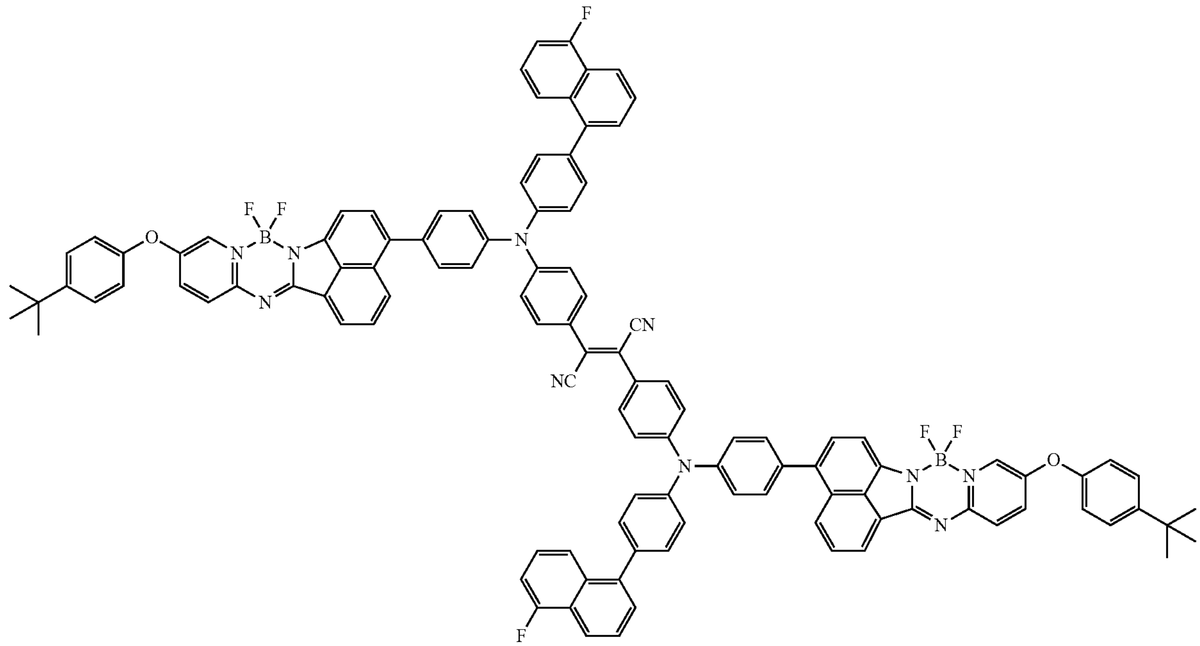
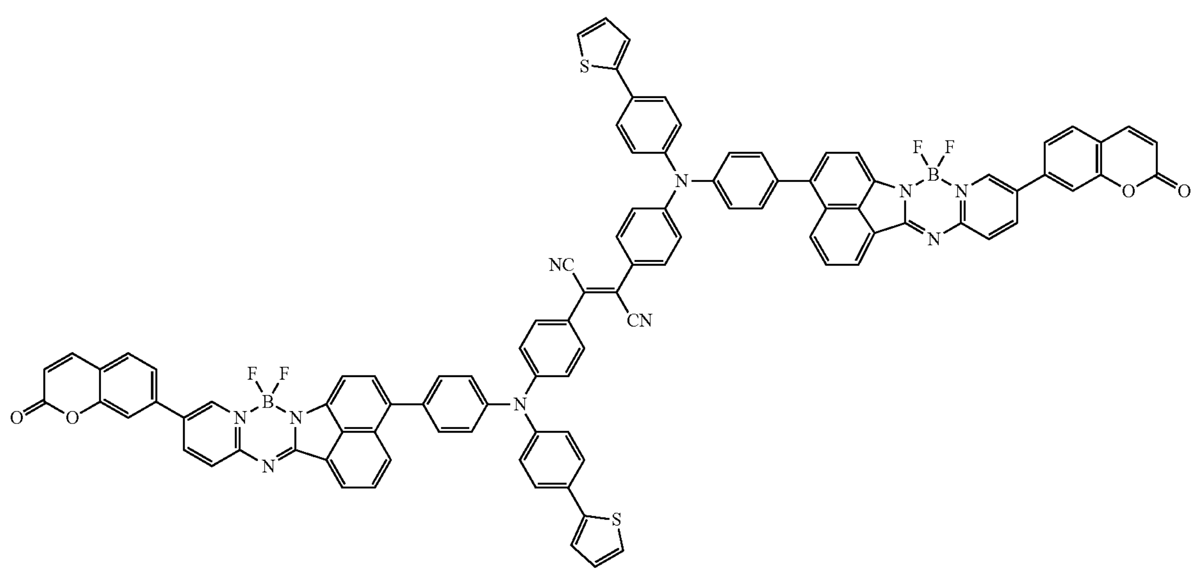

-continued
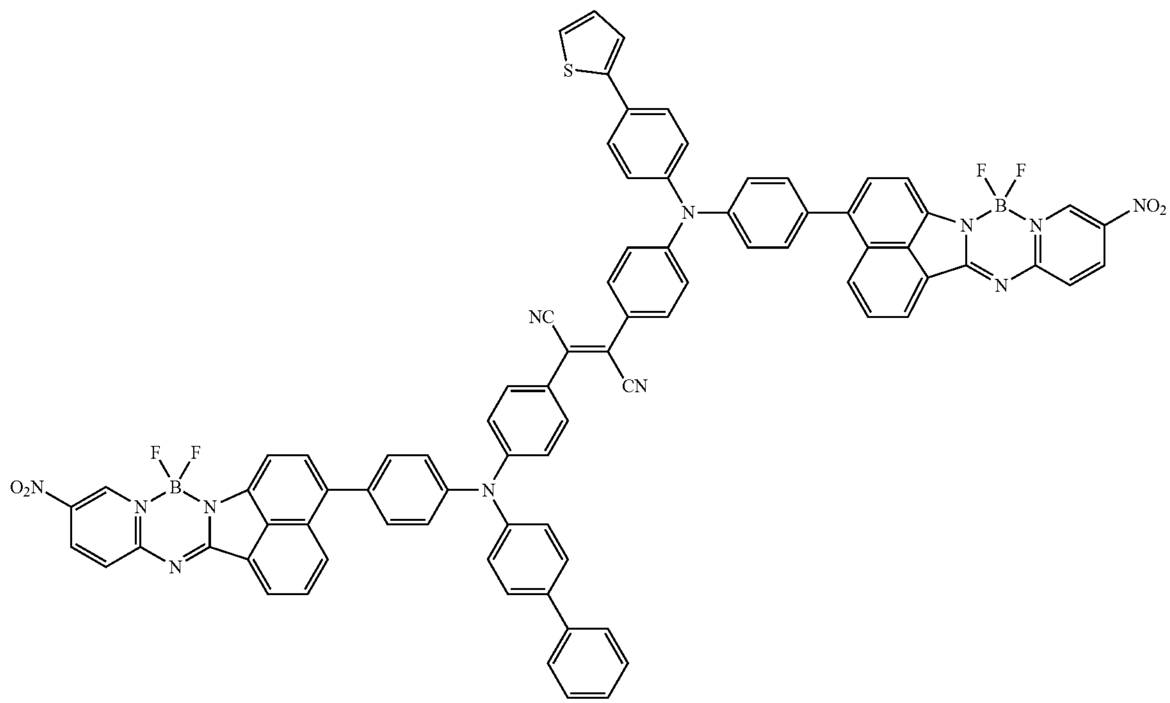
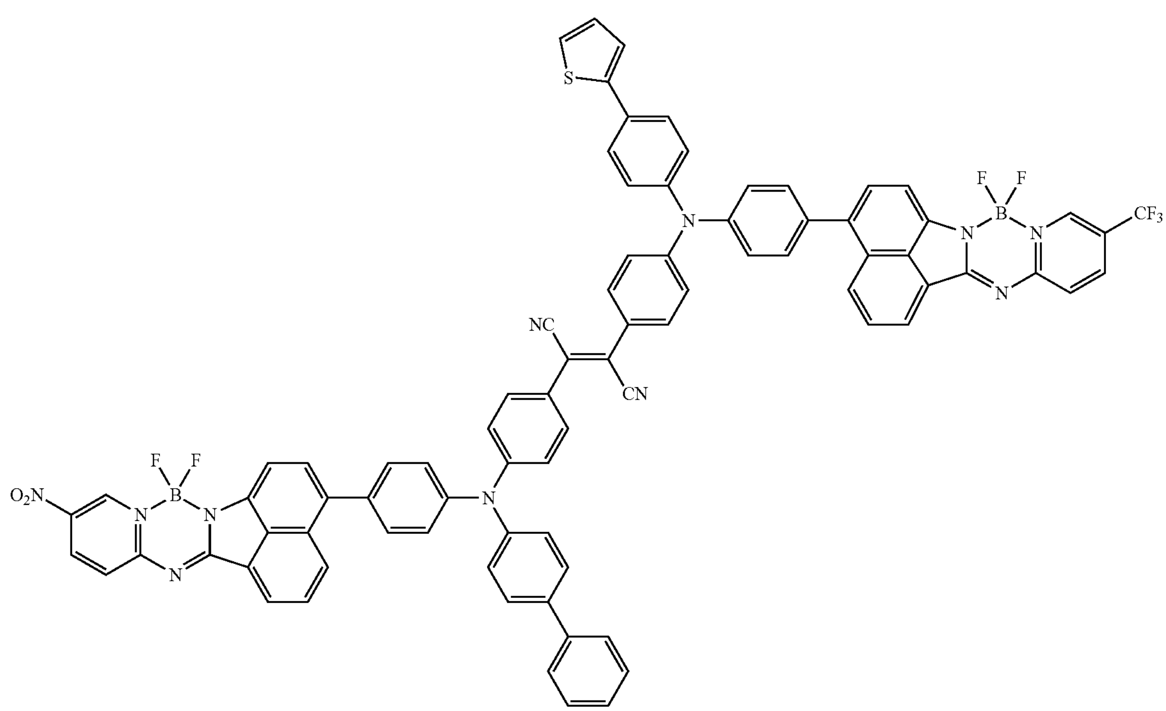

-continued
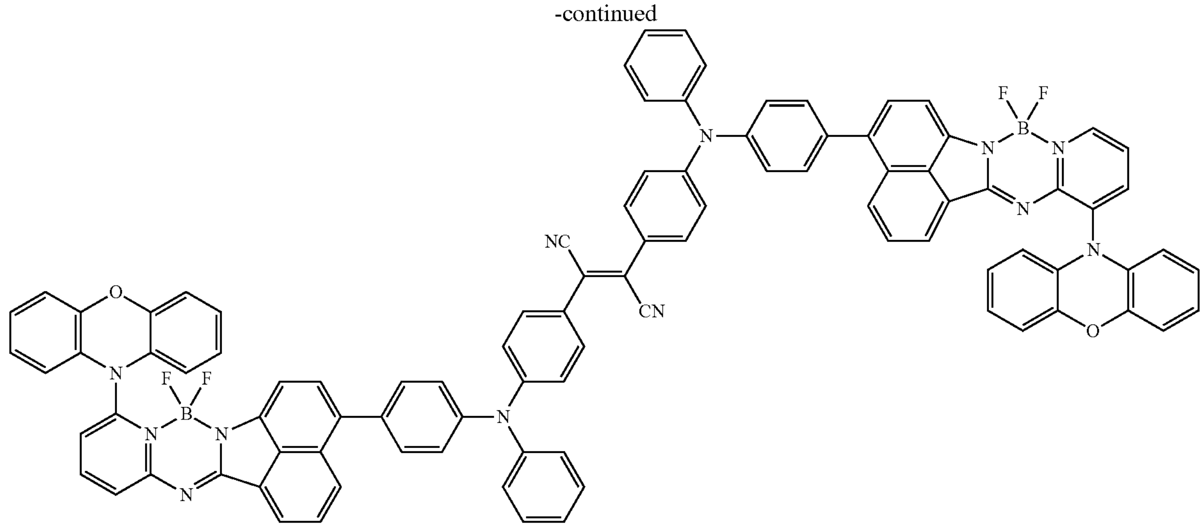
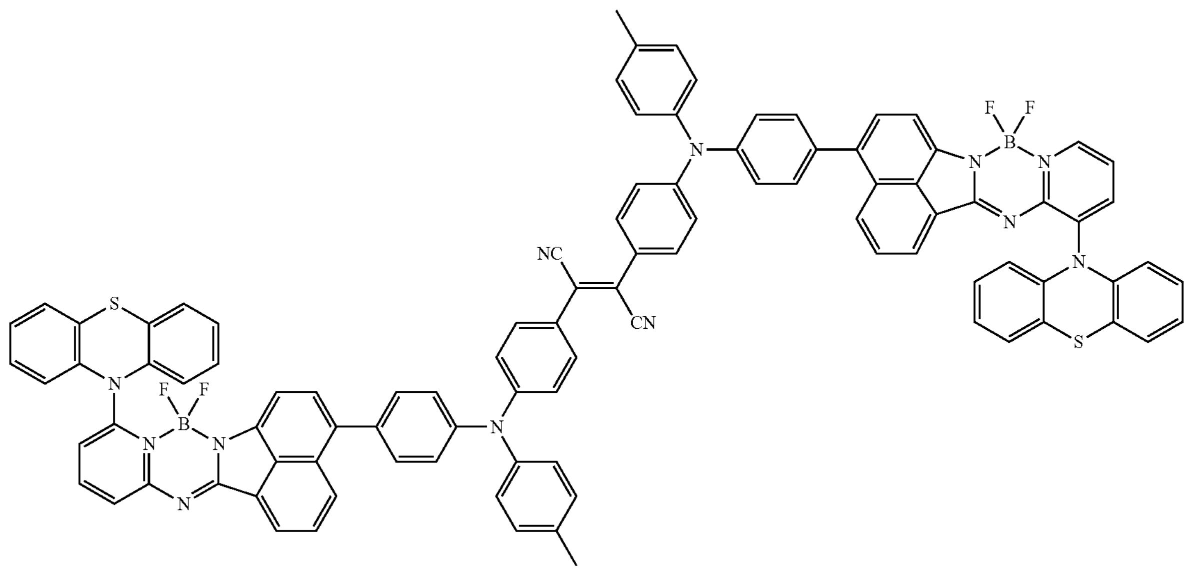
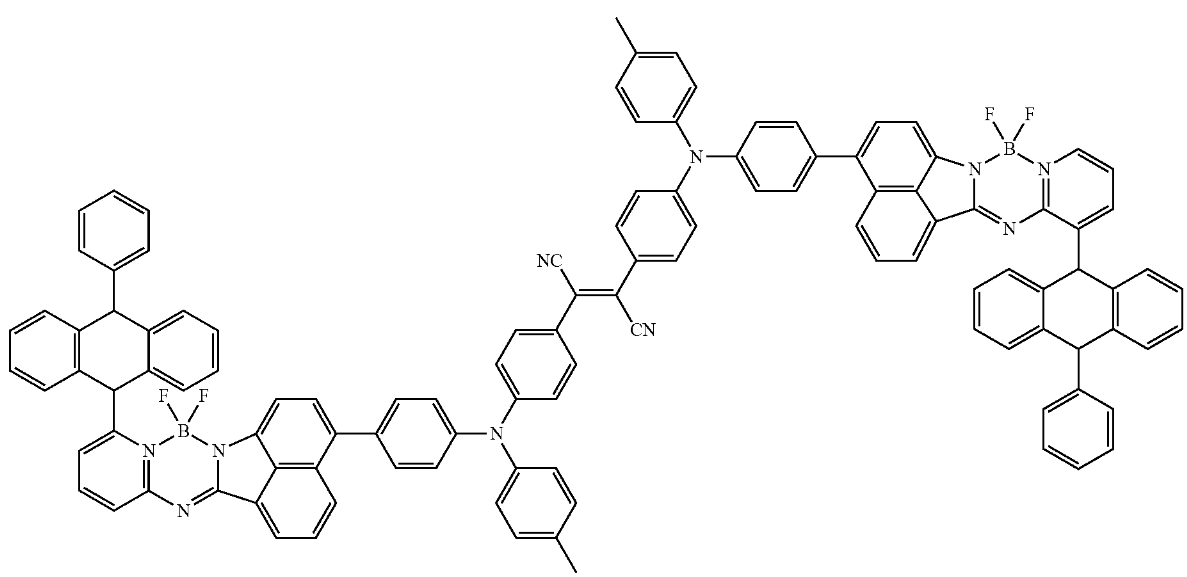

-continued
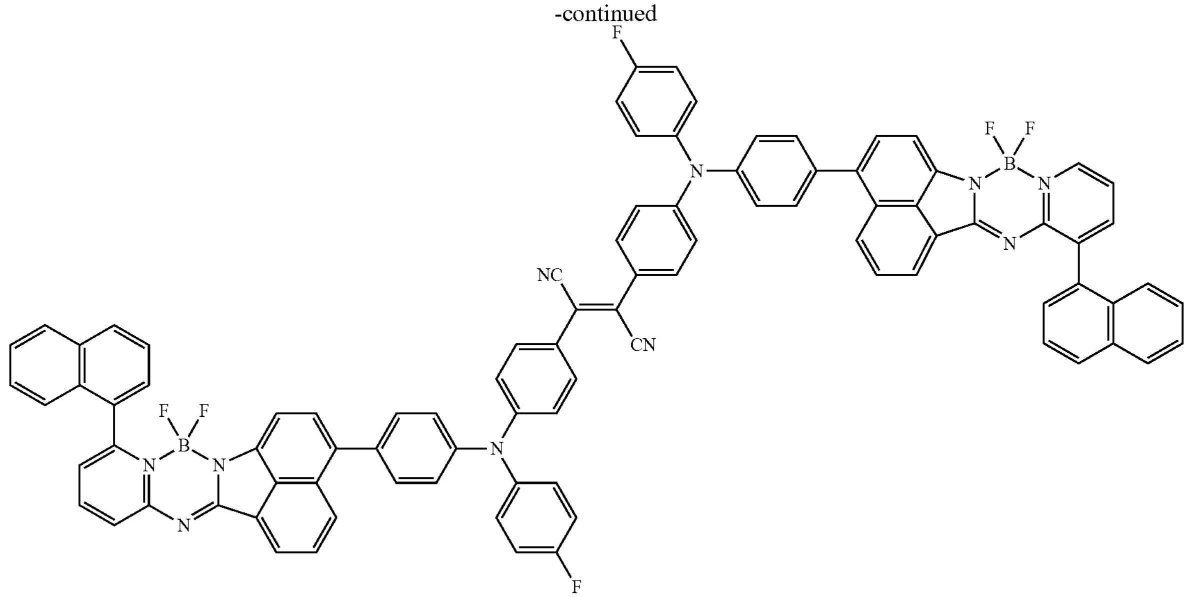
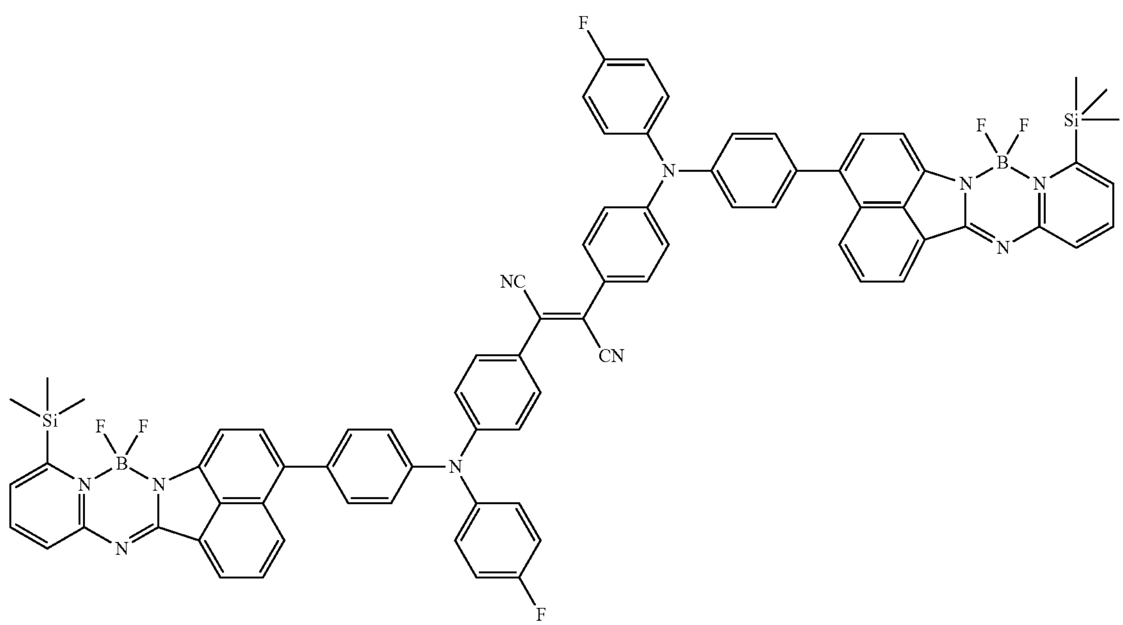

-continued
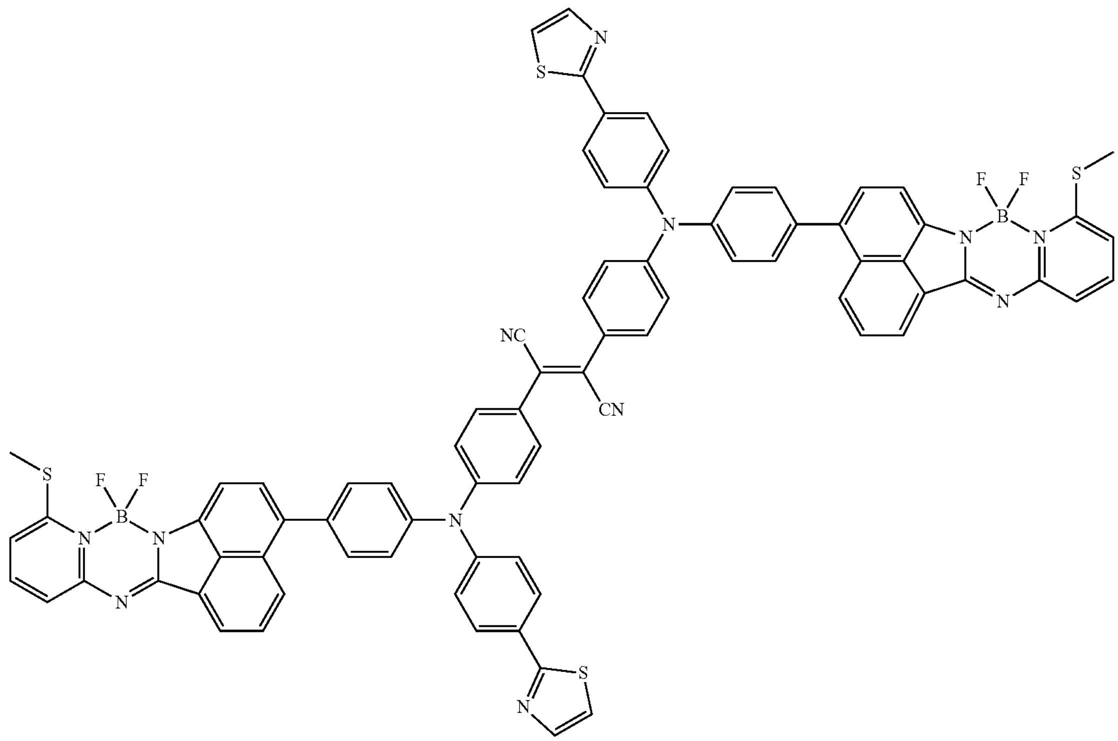
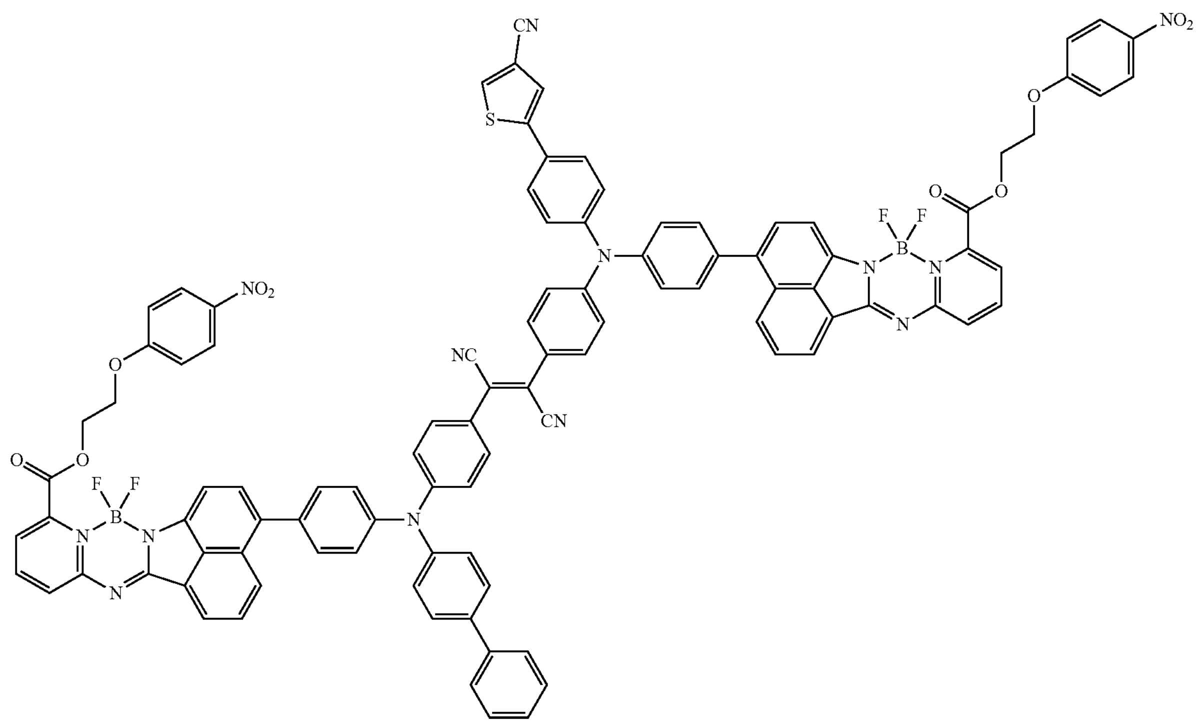

-continued
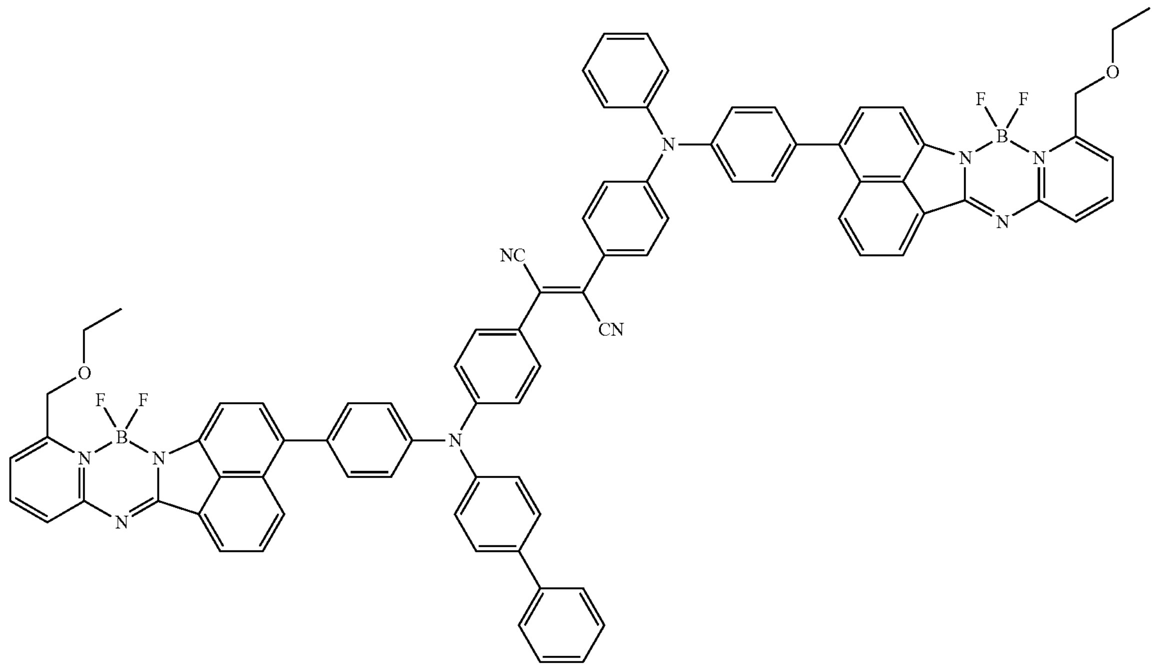
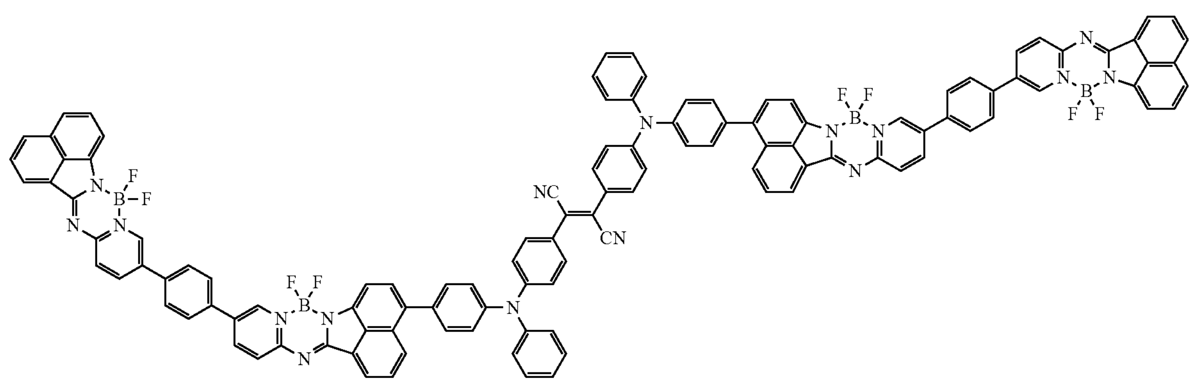
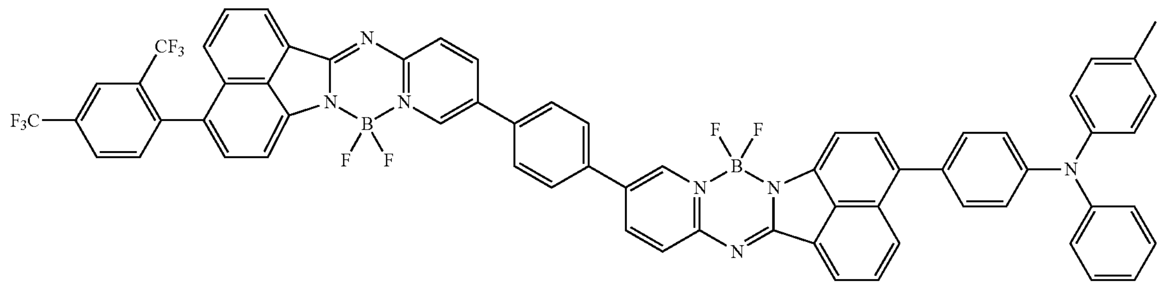

-continued
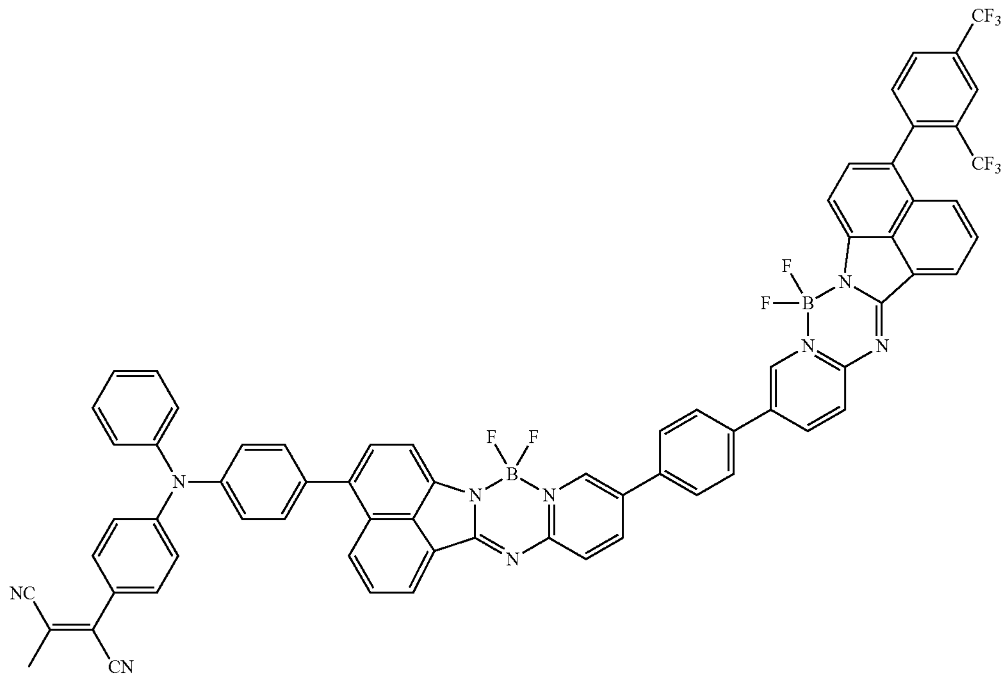
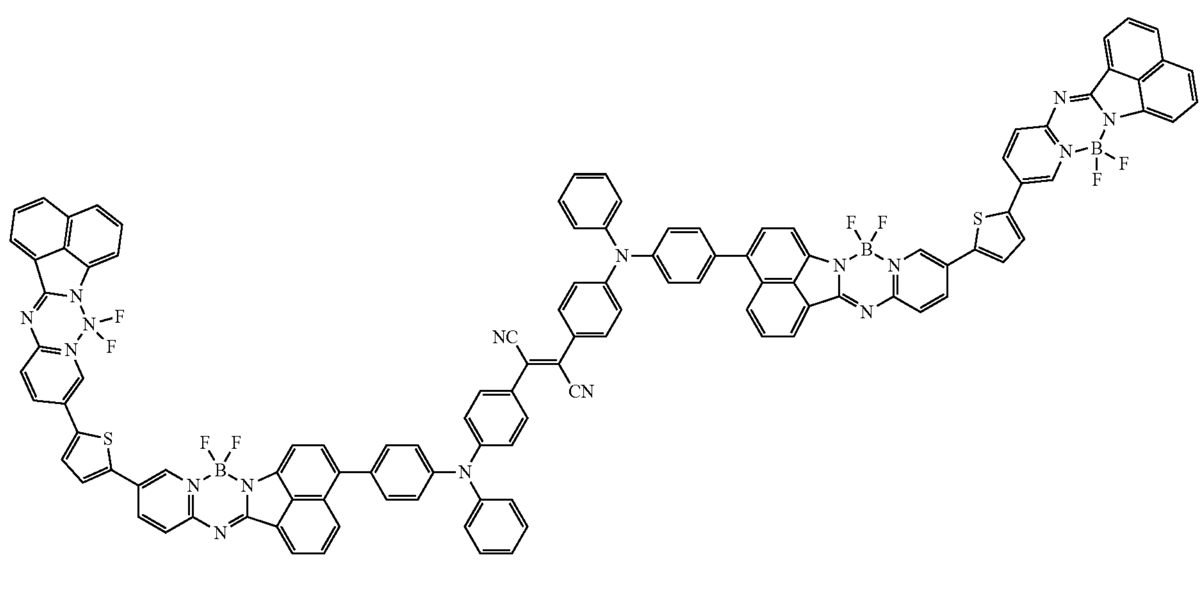

-continued
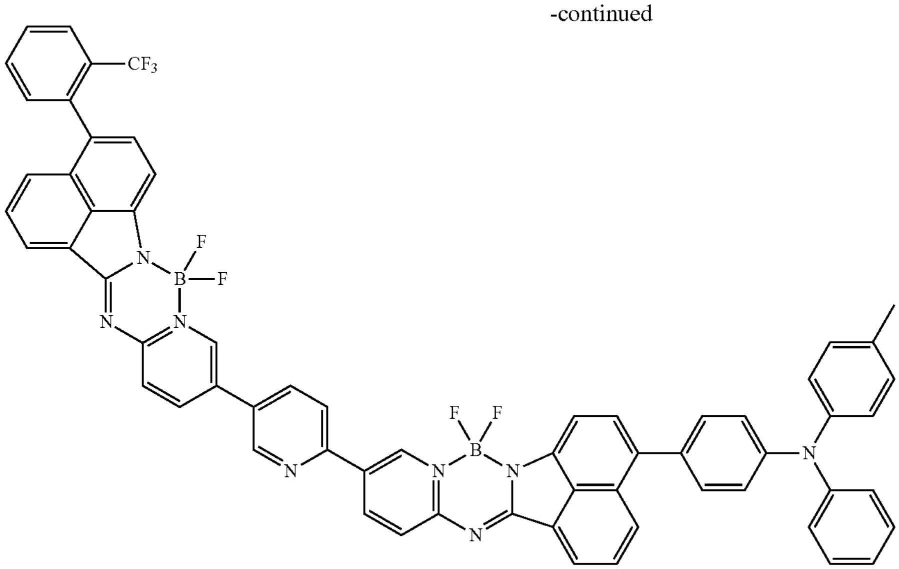
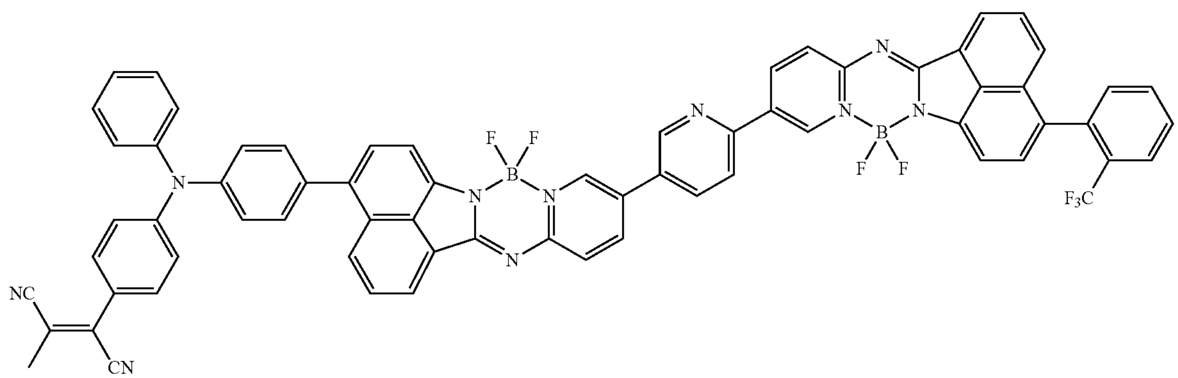
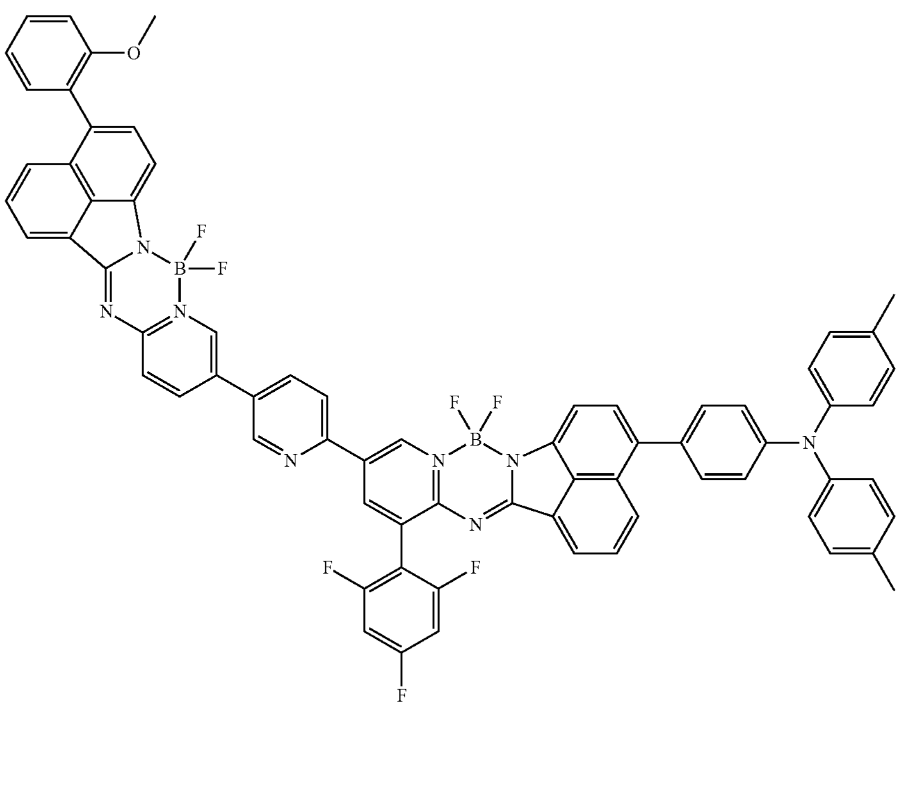

-continued
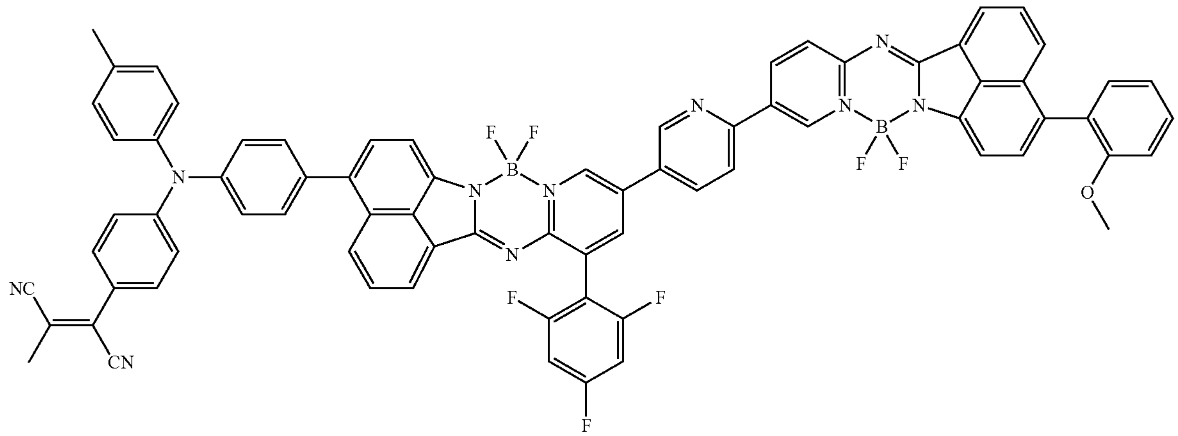
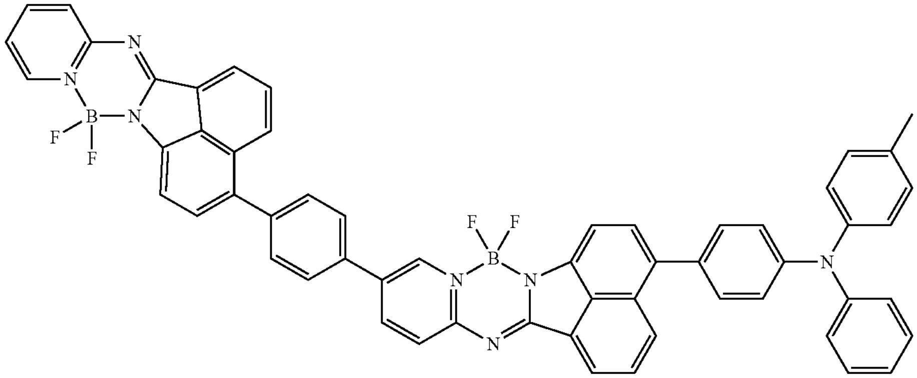
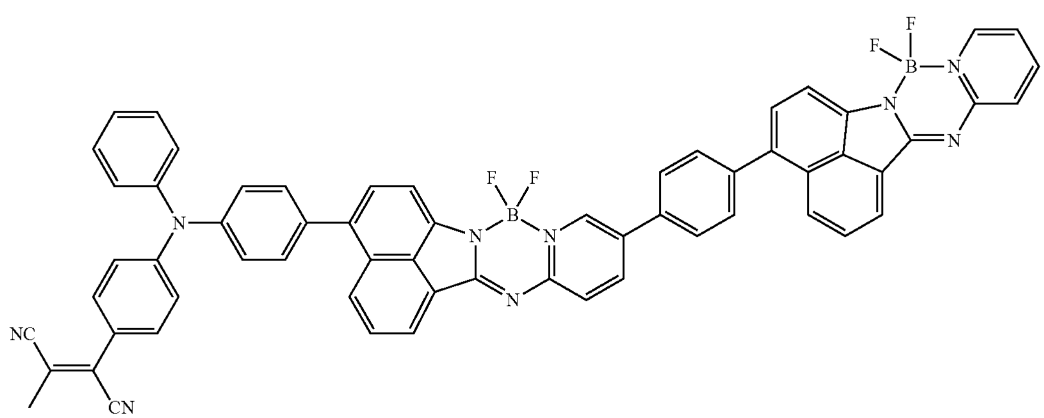

-continued
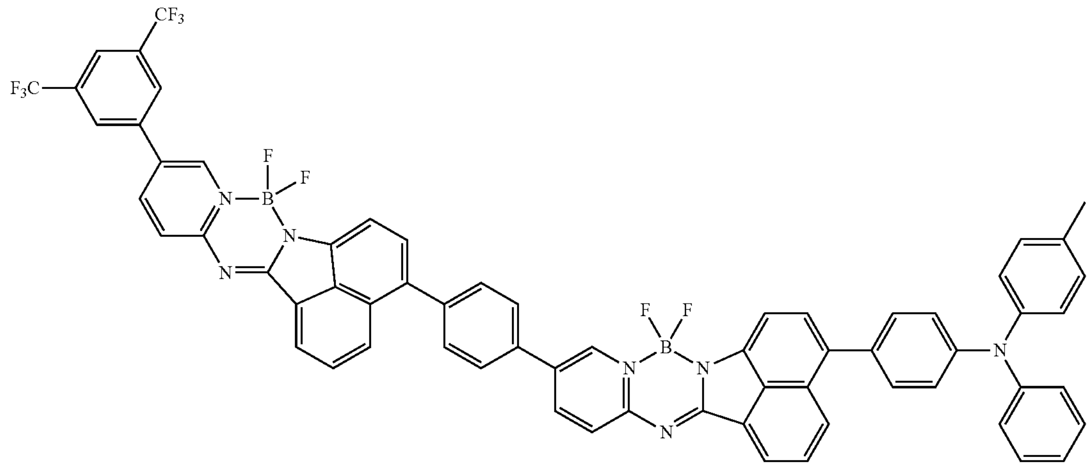
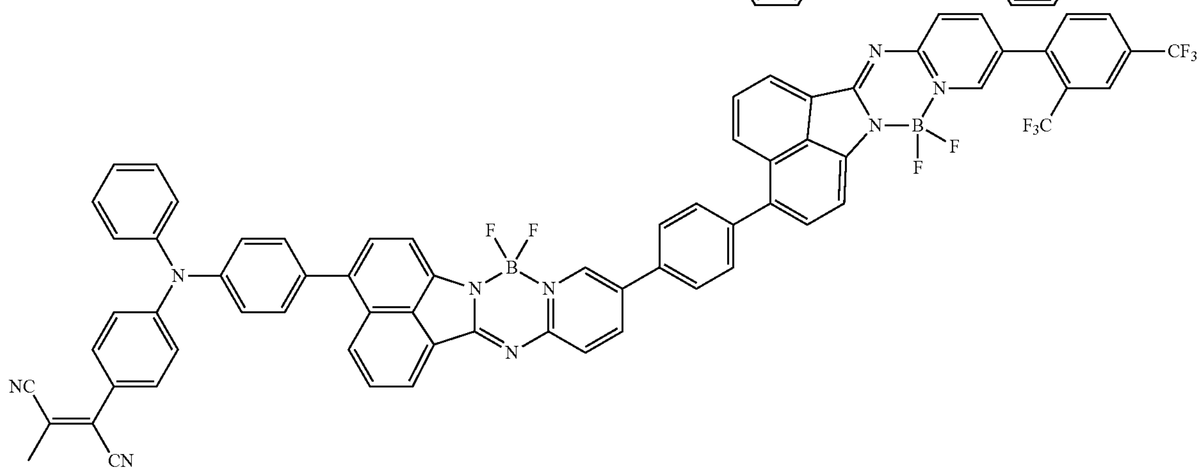
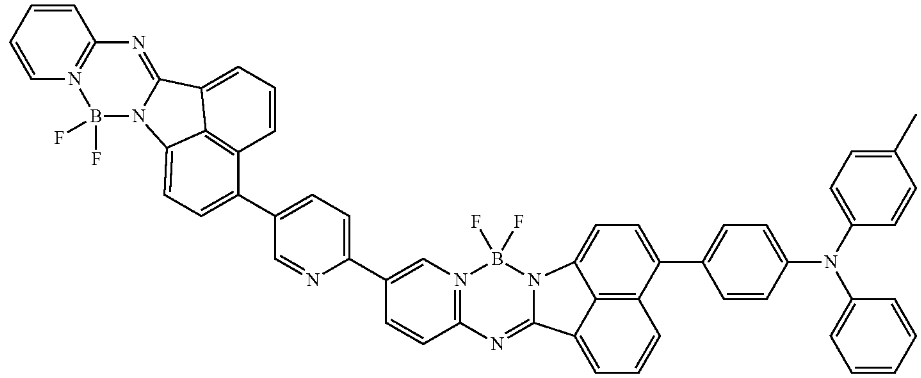
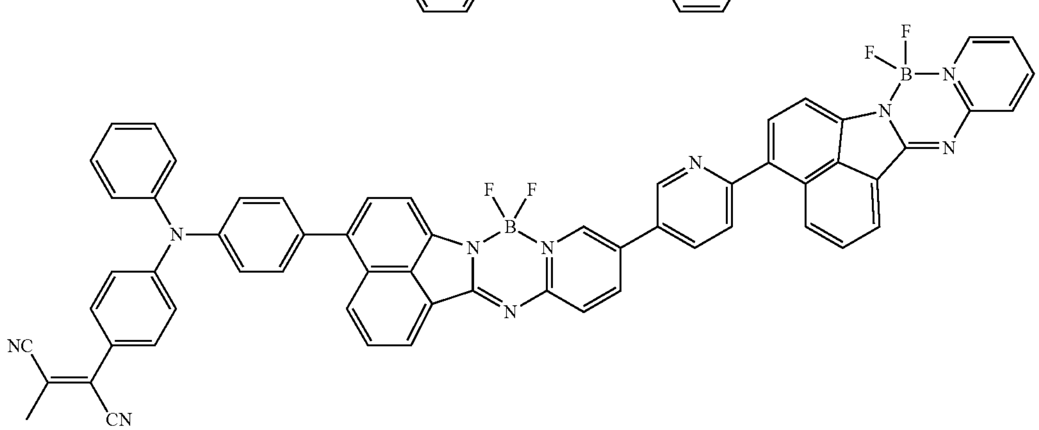

-continued
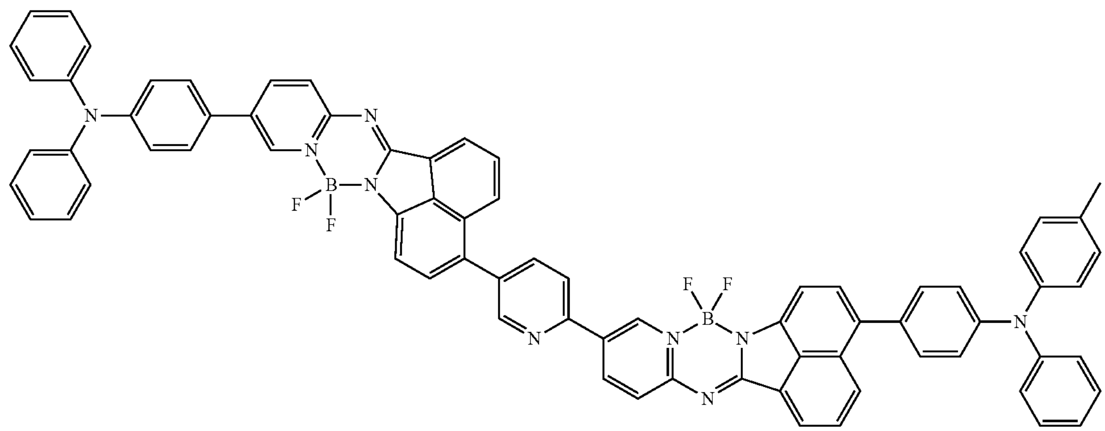
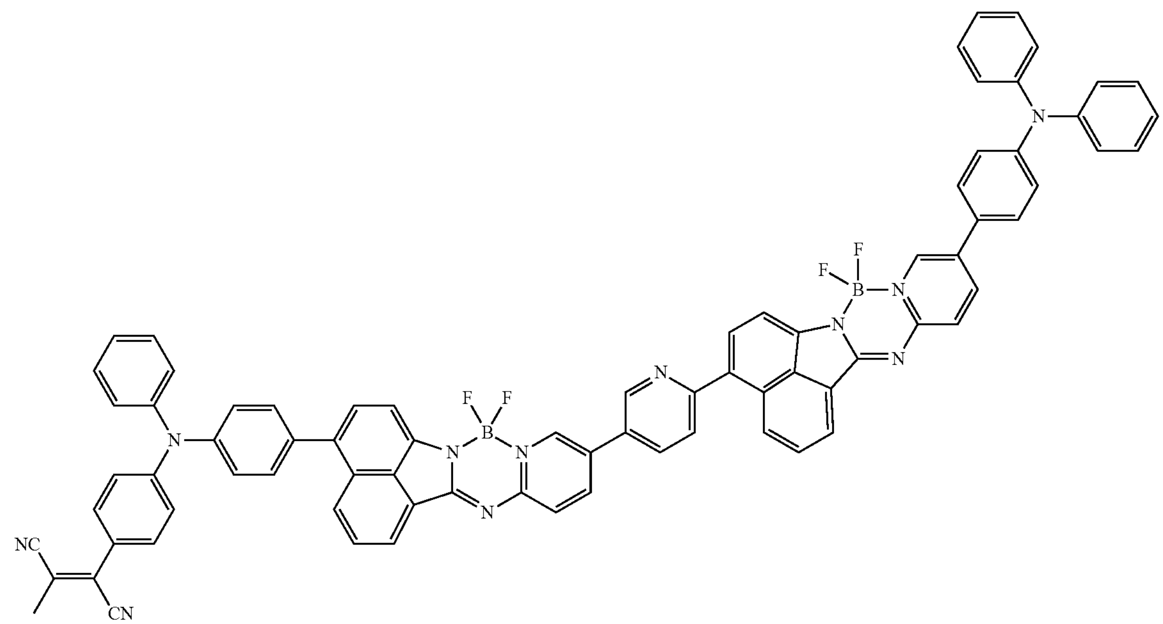
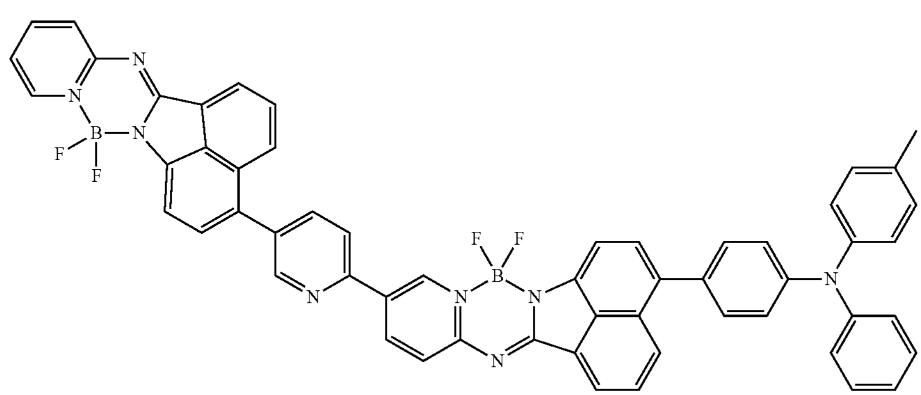

-continued
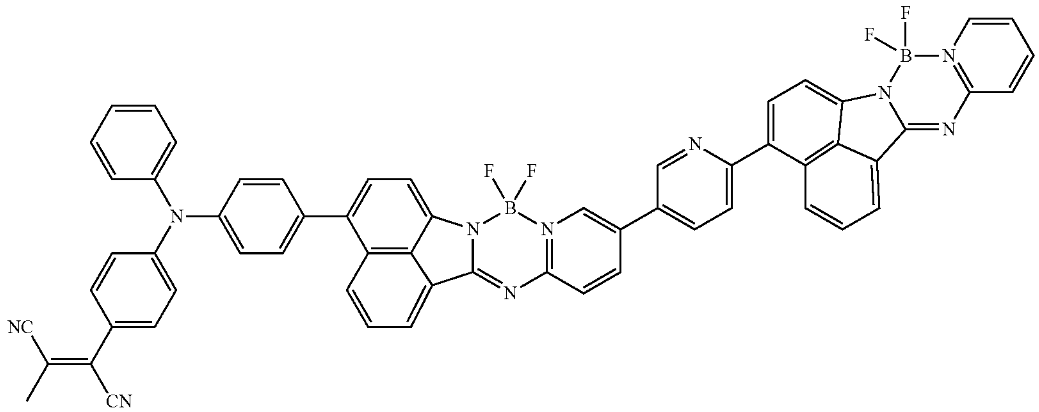
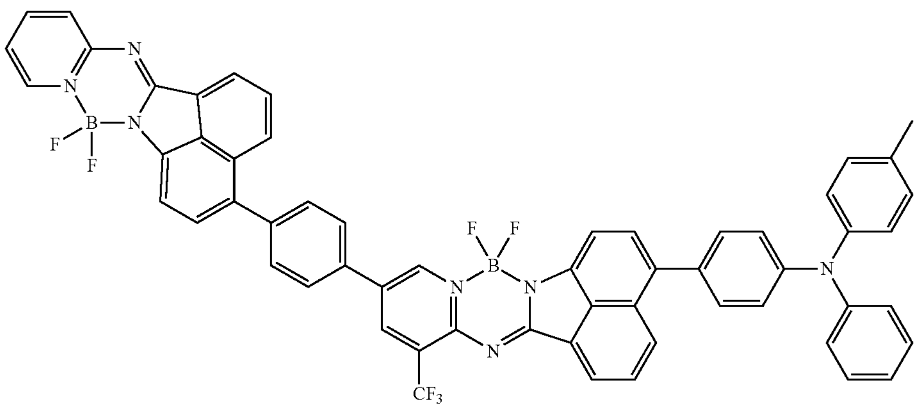
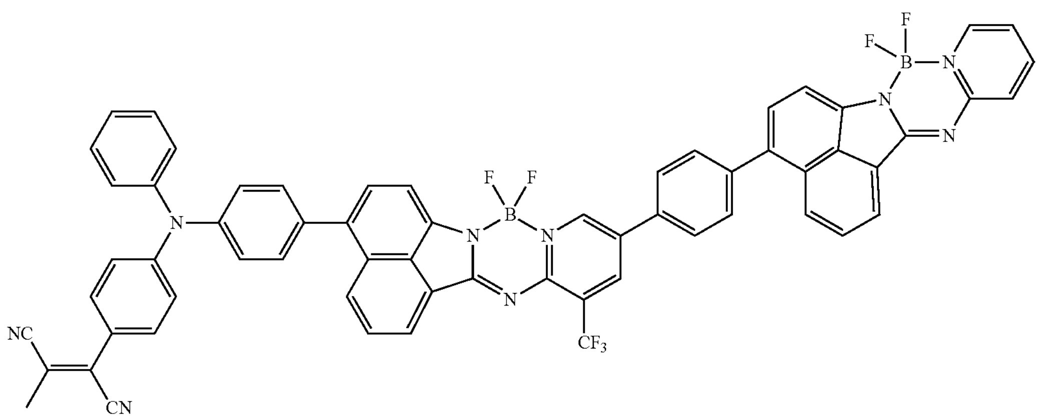
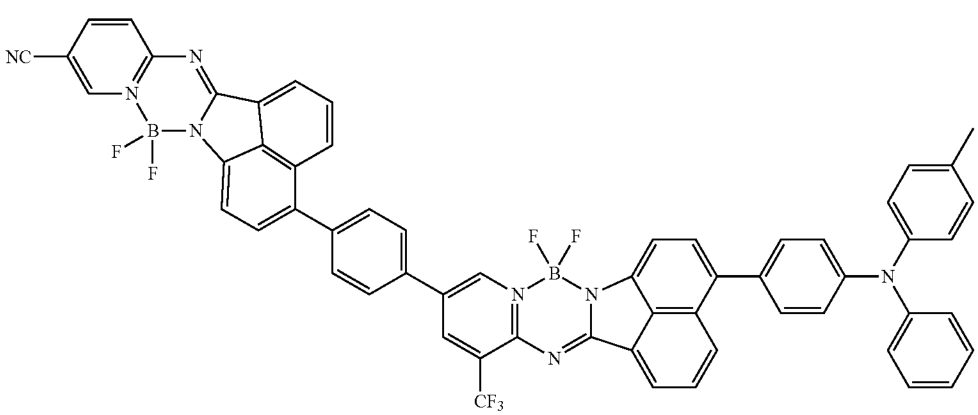

-continued
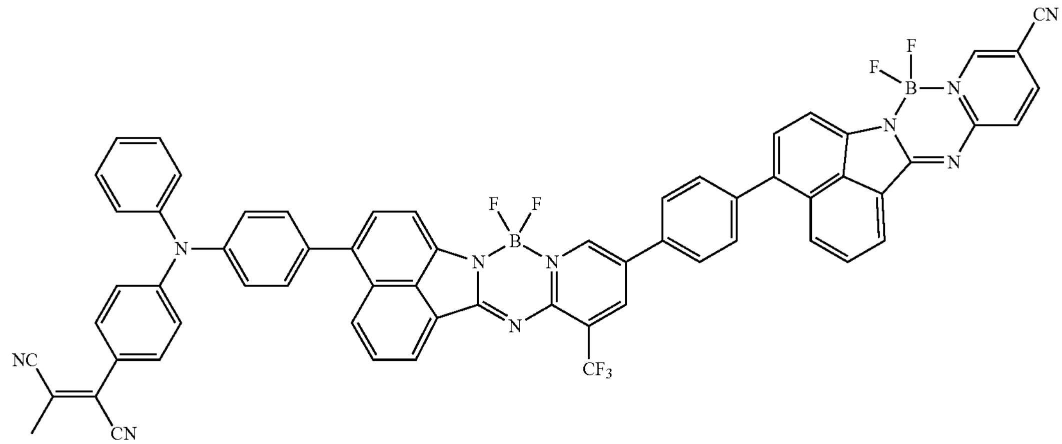
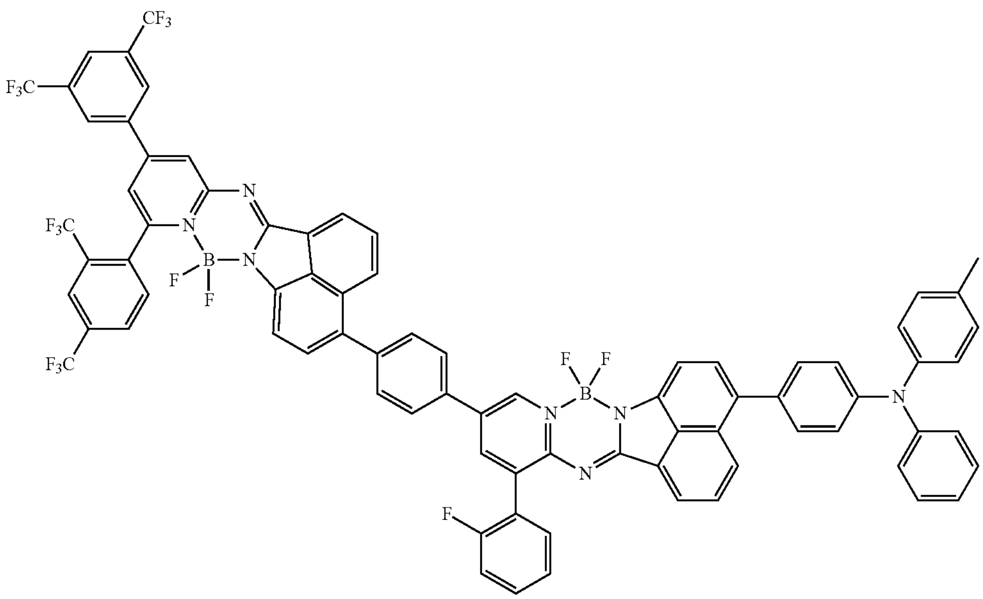
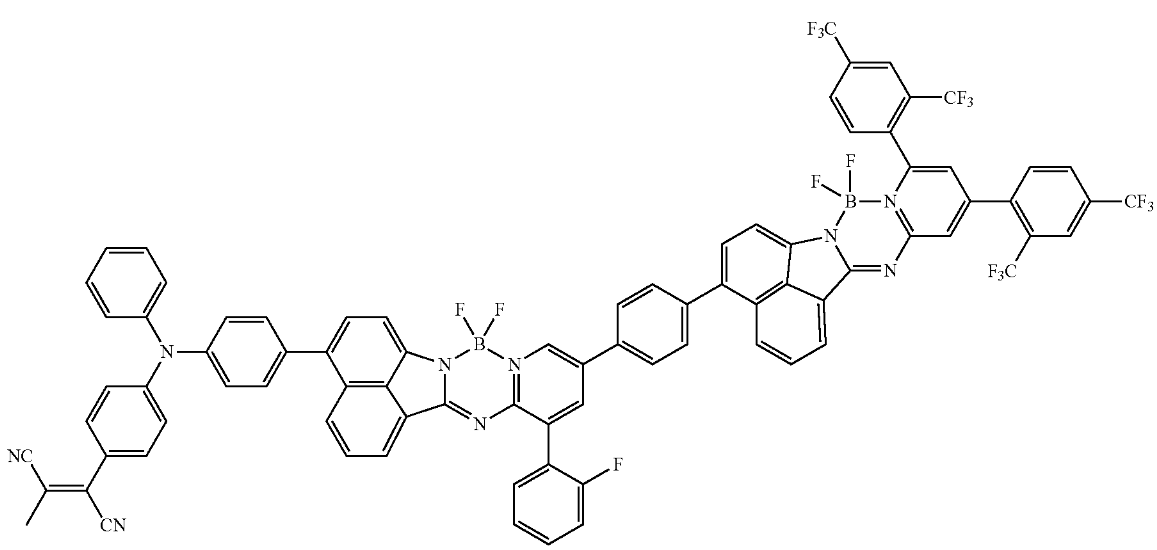

-continued
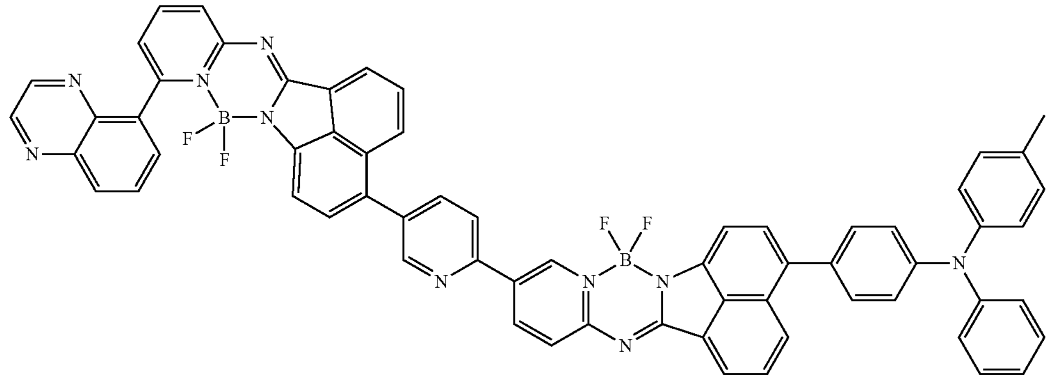
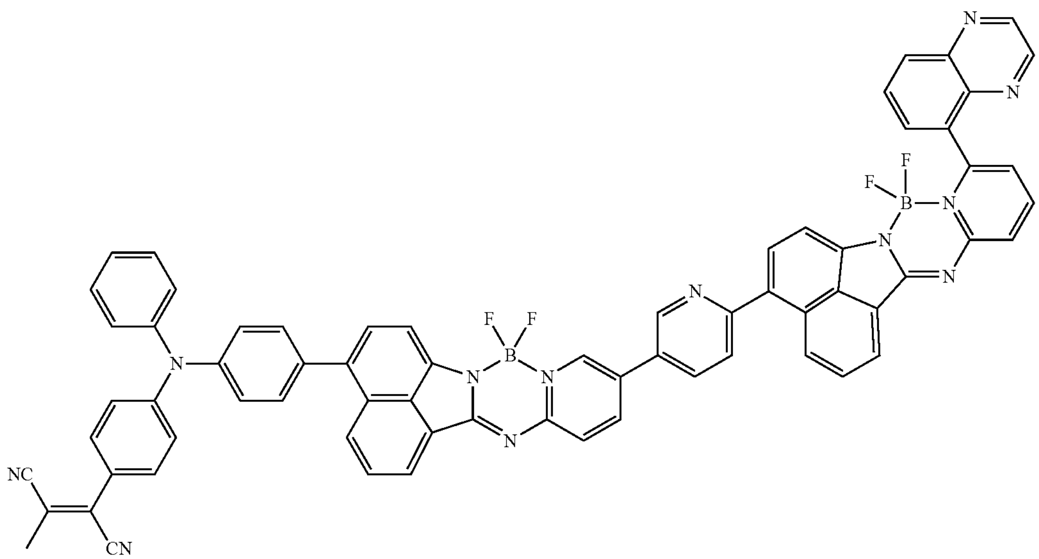
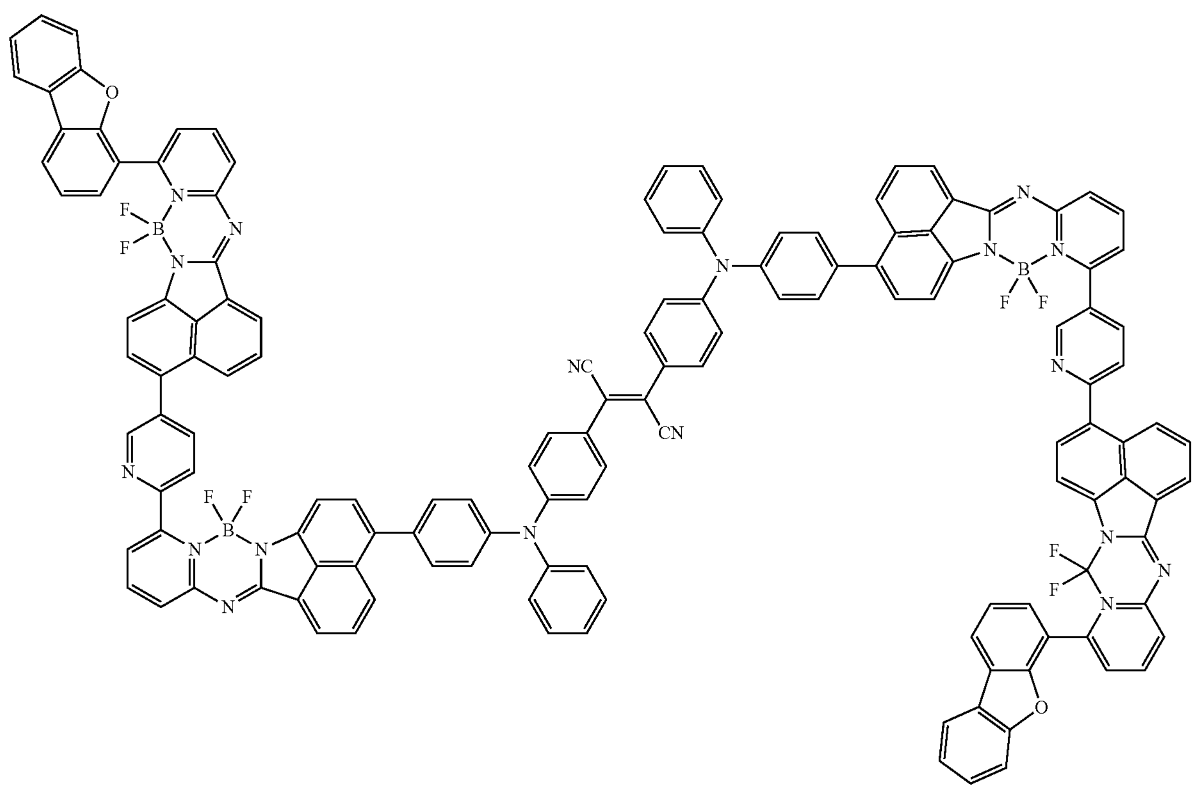

-continued
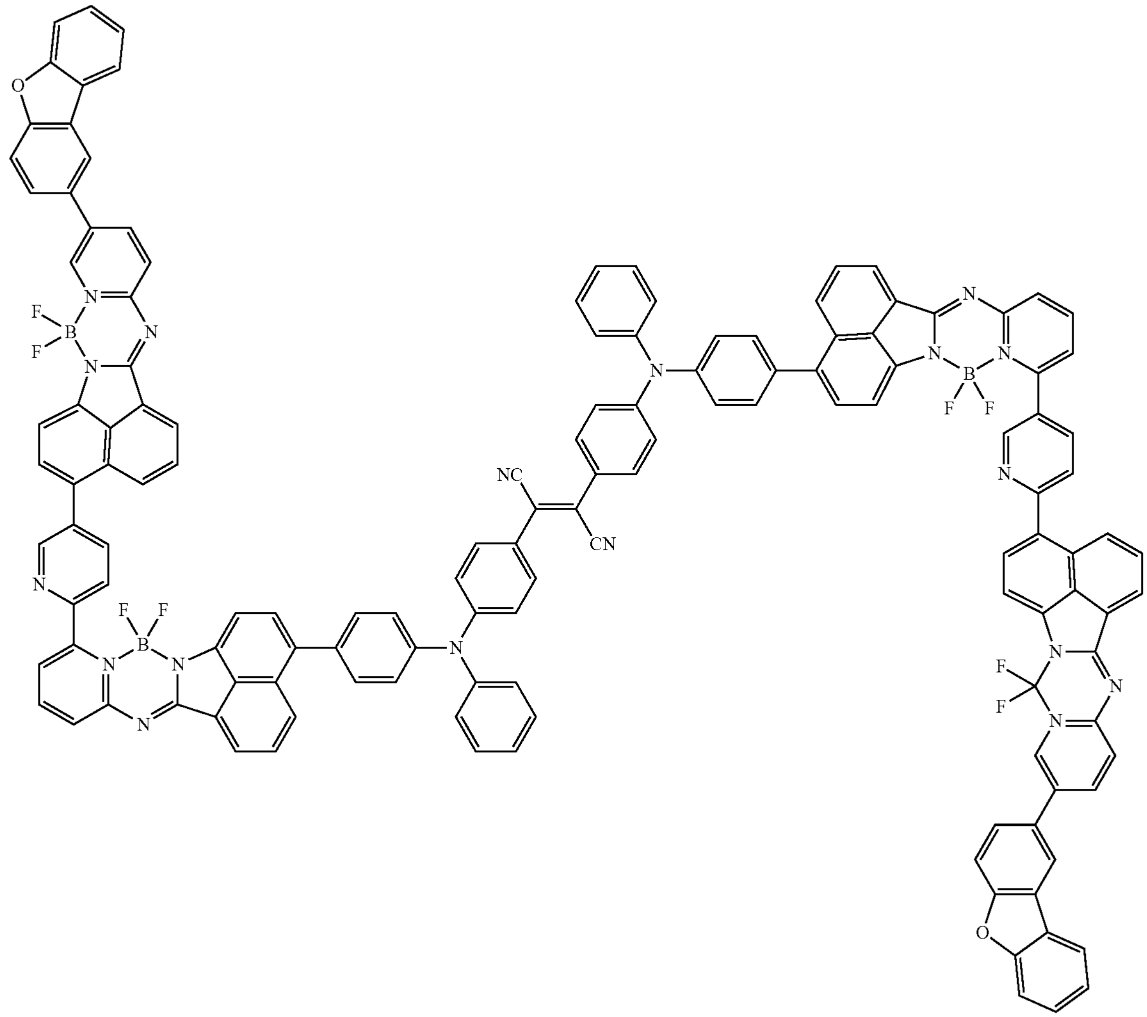
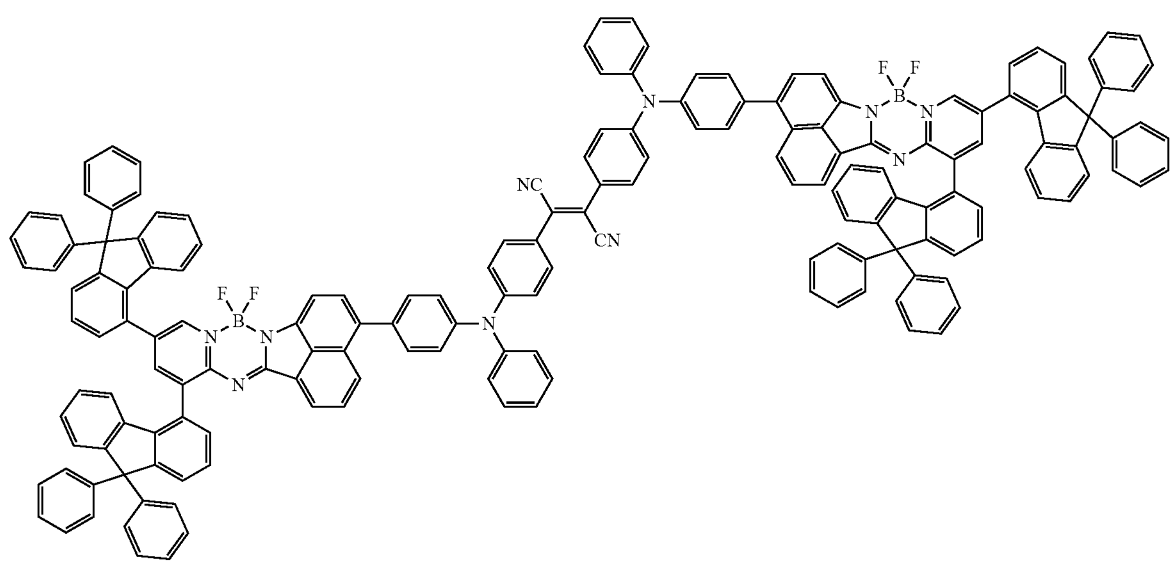

-continued
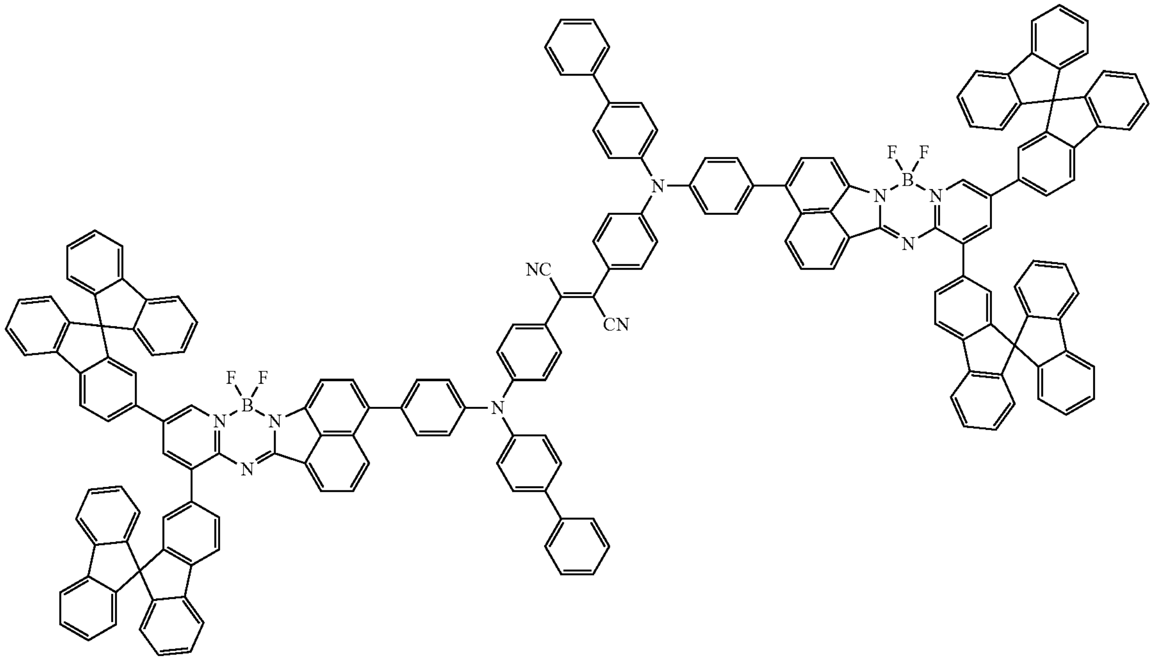
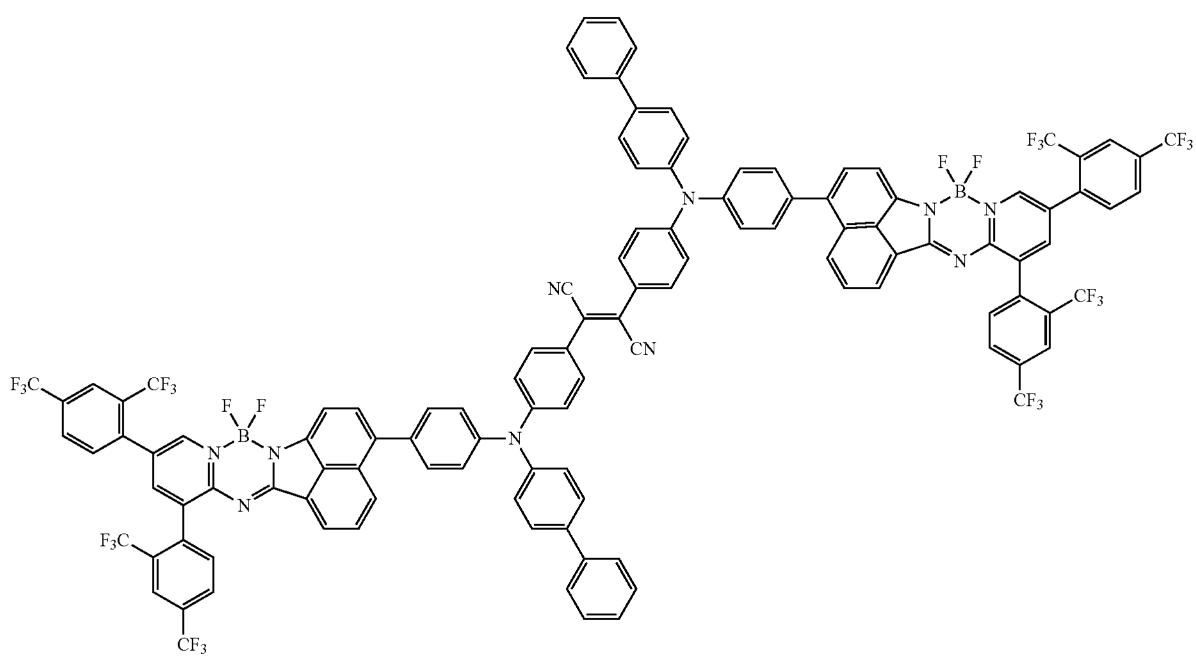

-continued
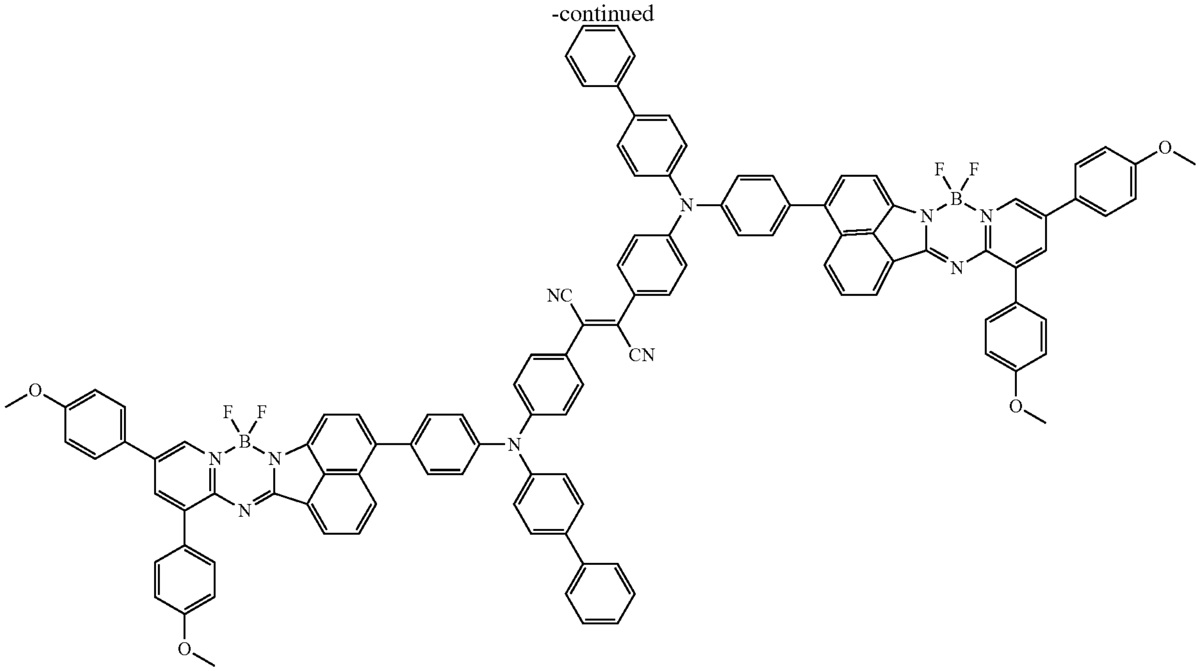
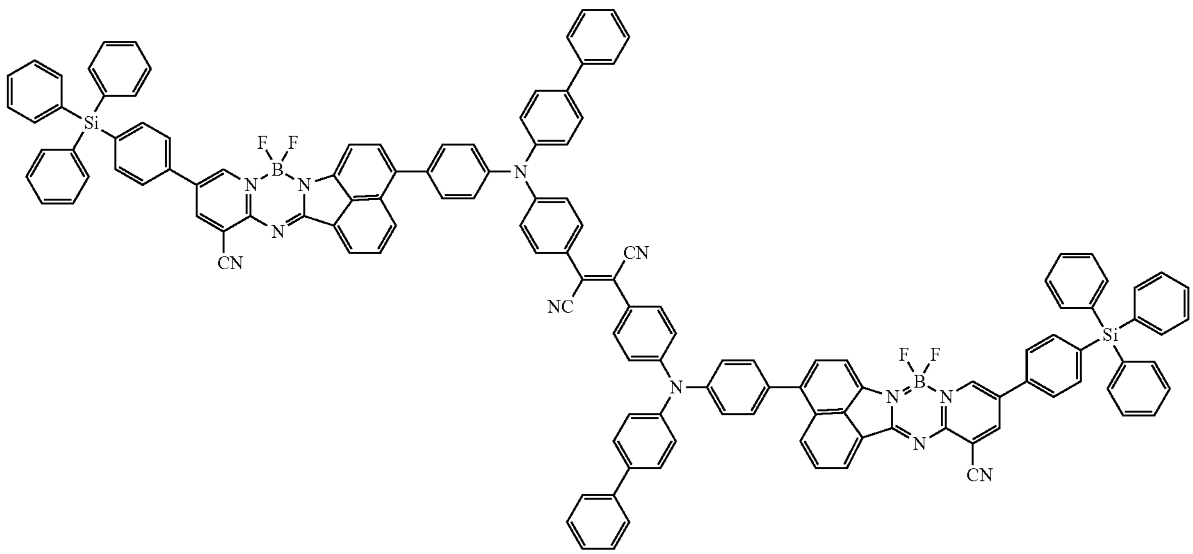
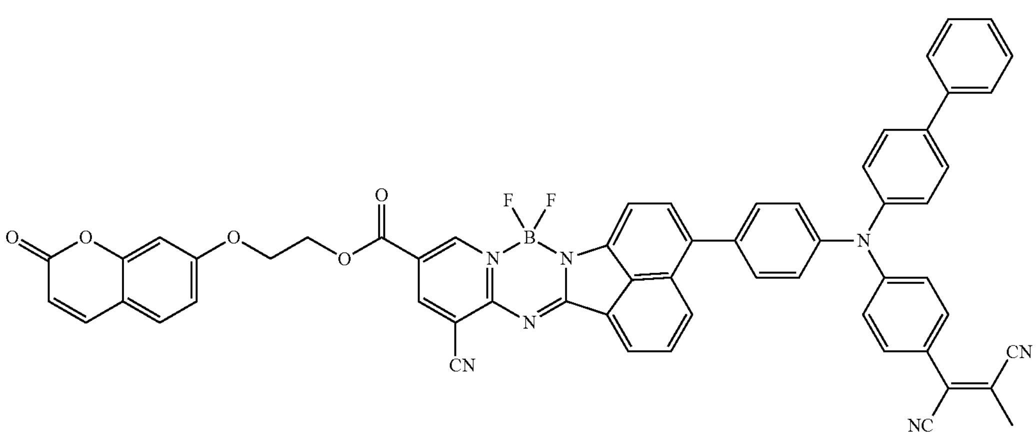

-continued
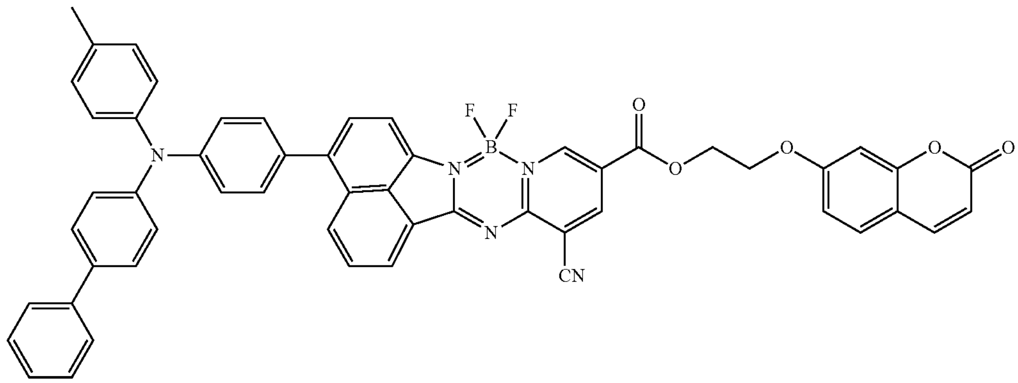
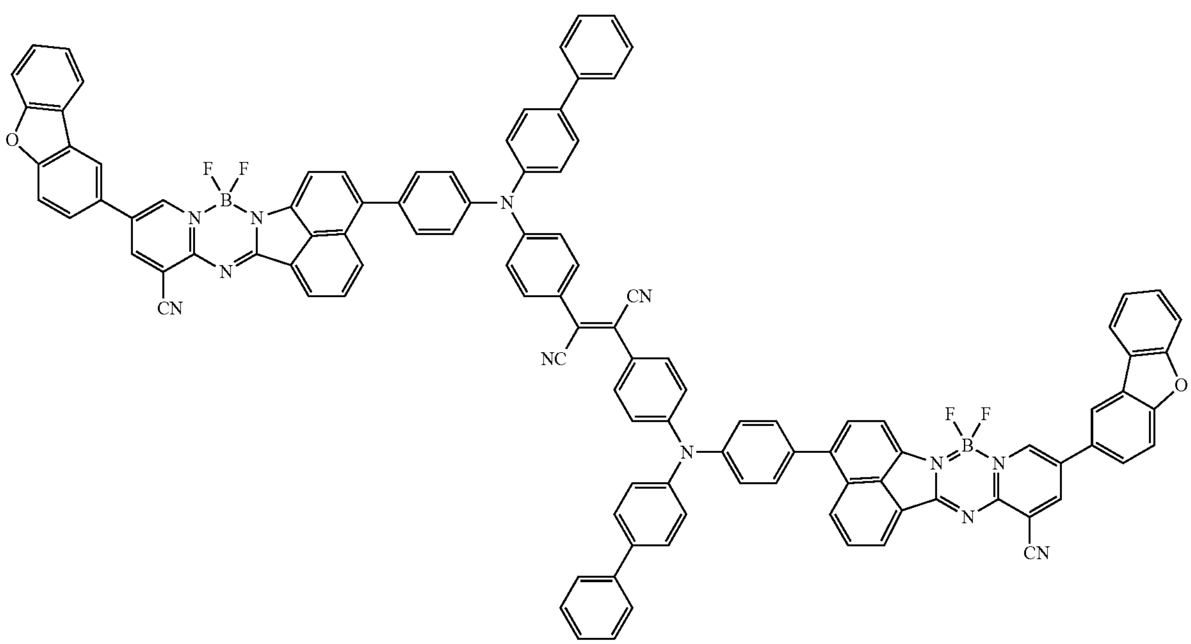

-continued
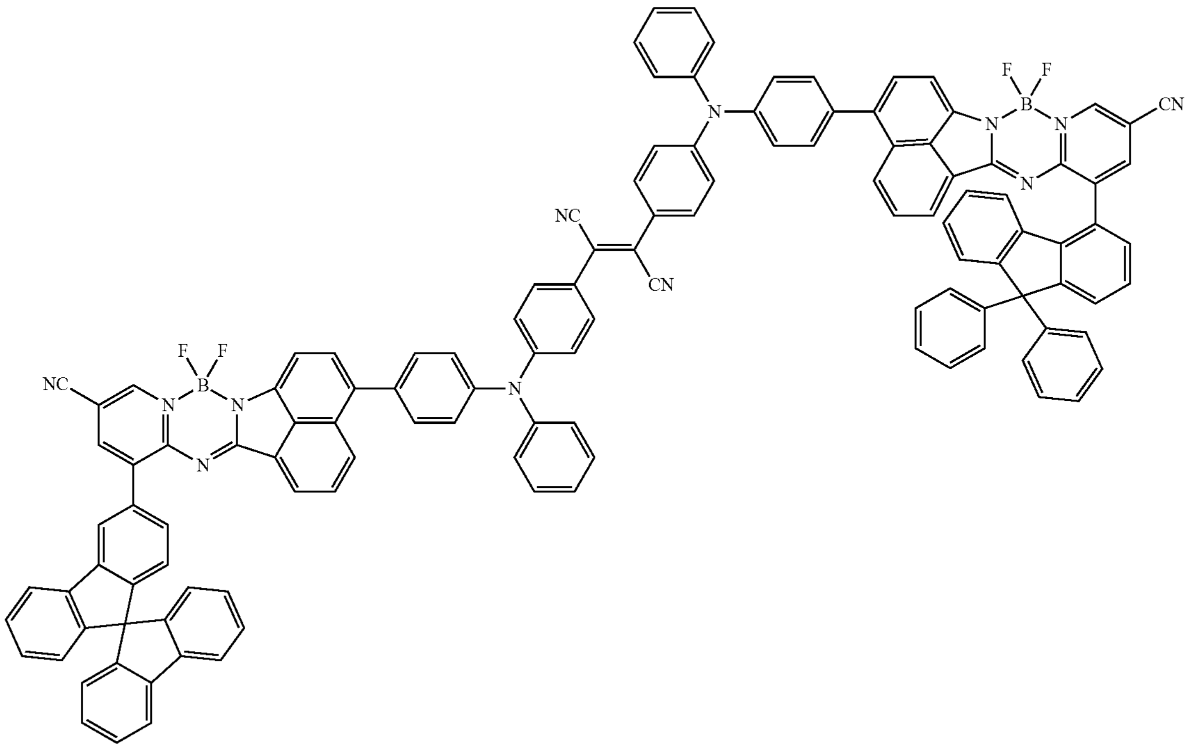
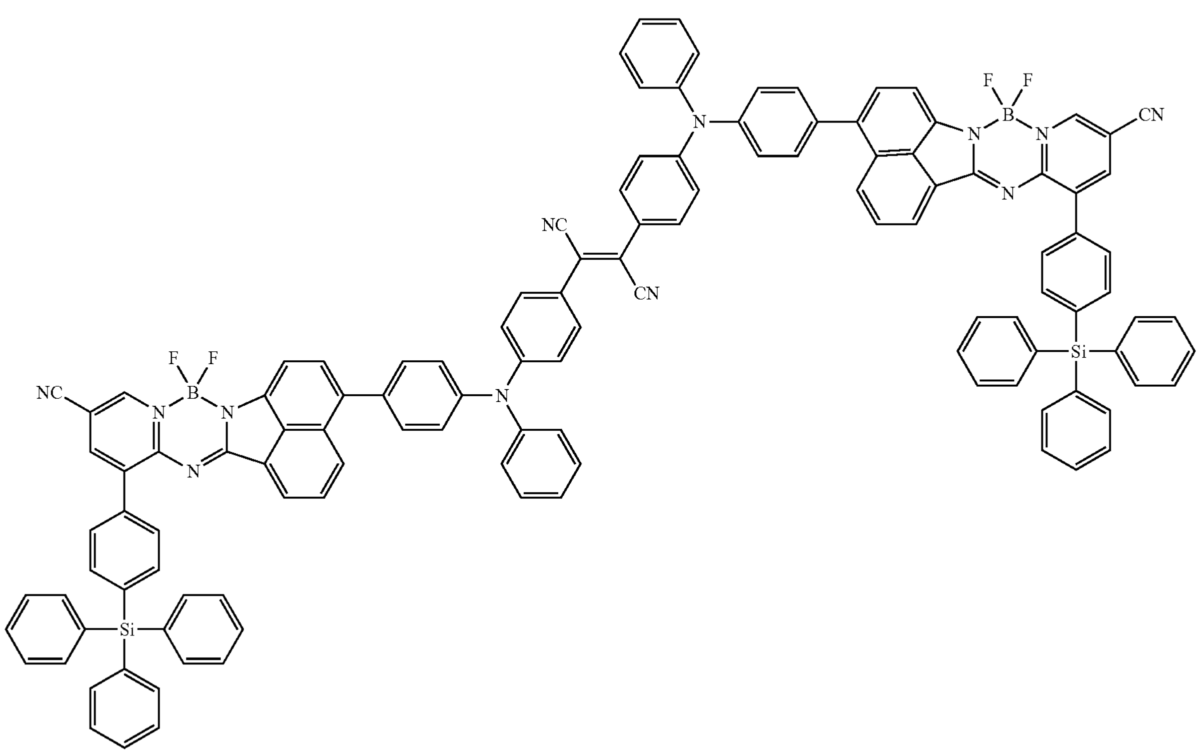

-continued
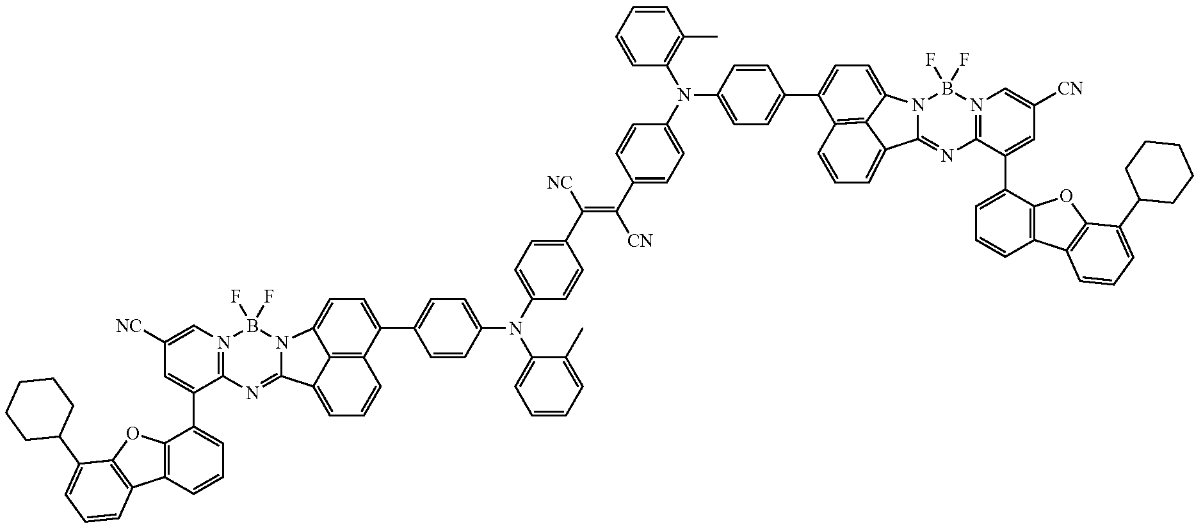
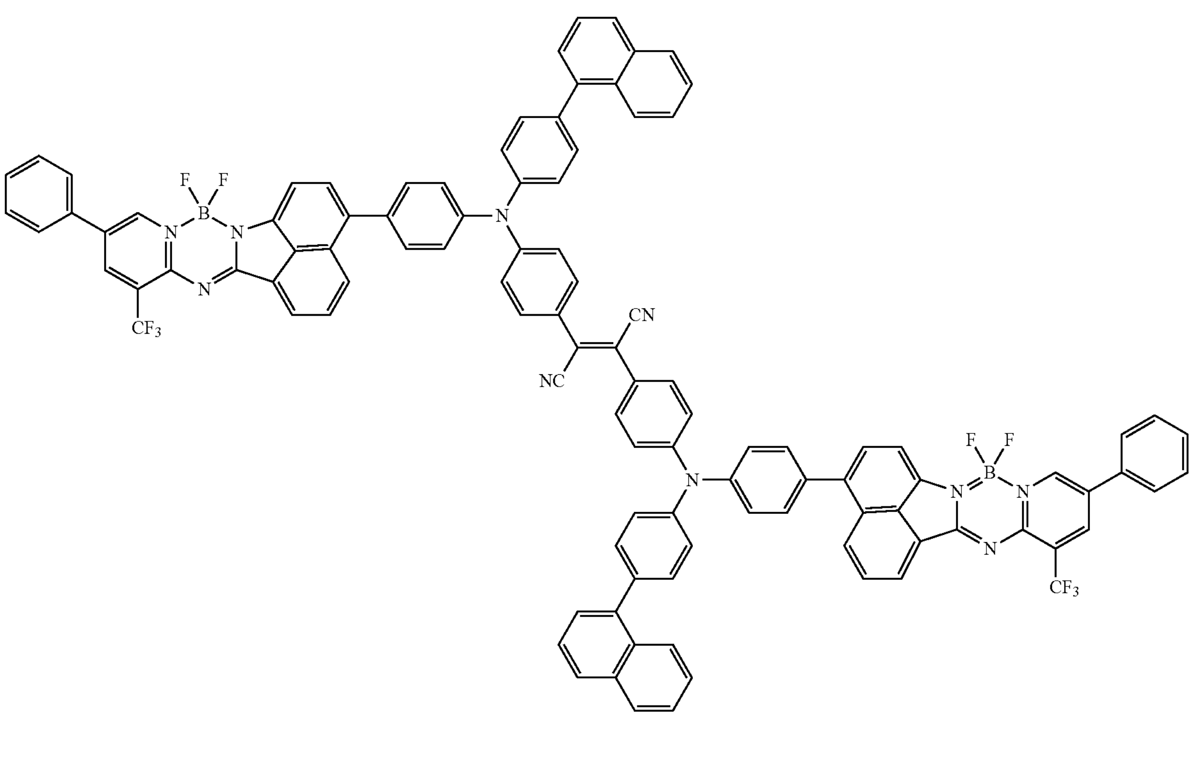

-continued
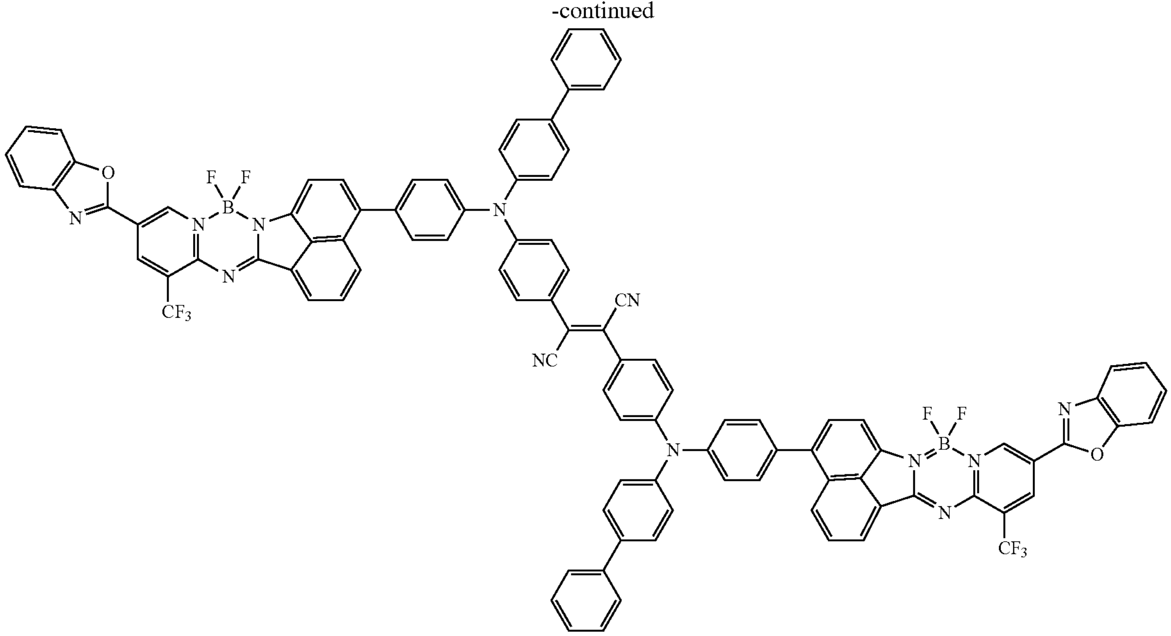
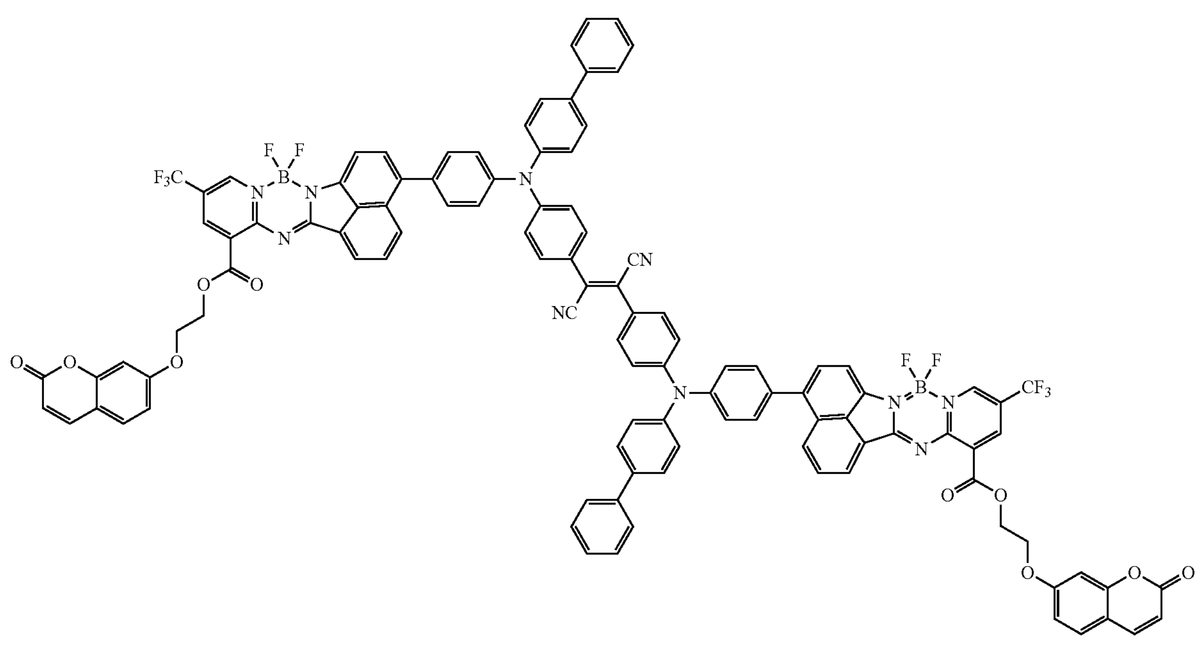

-continued
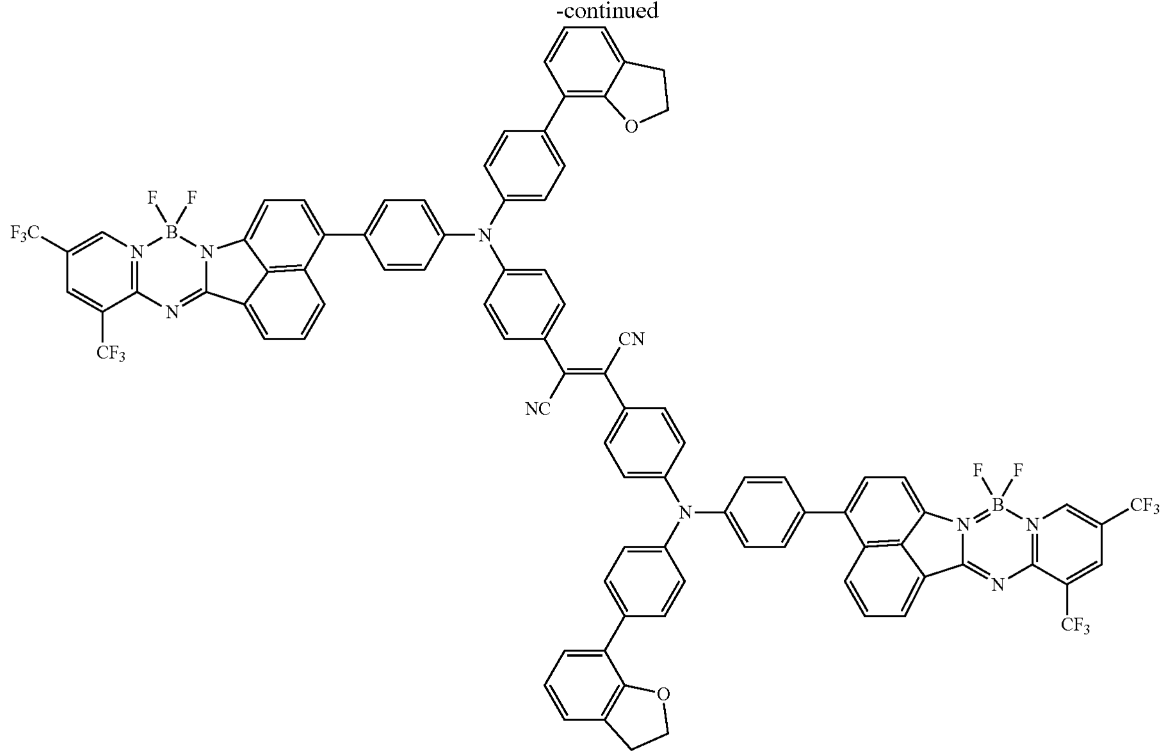
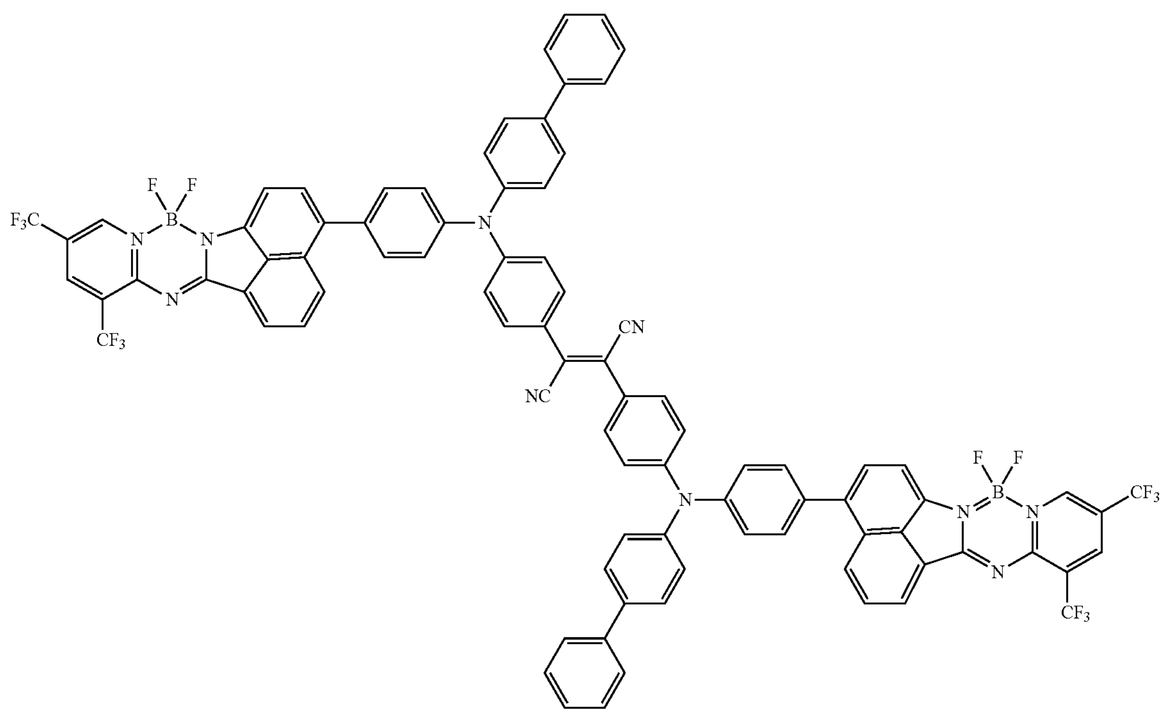

-continued
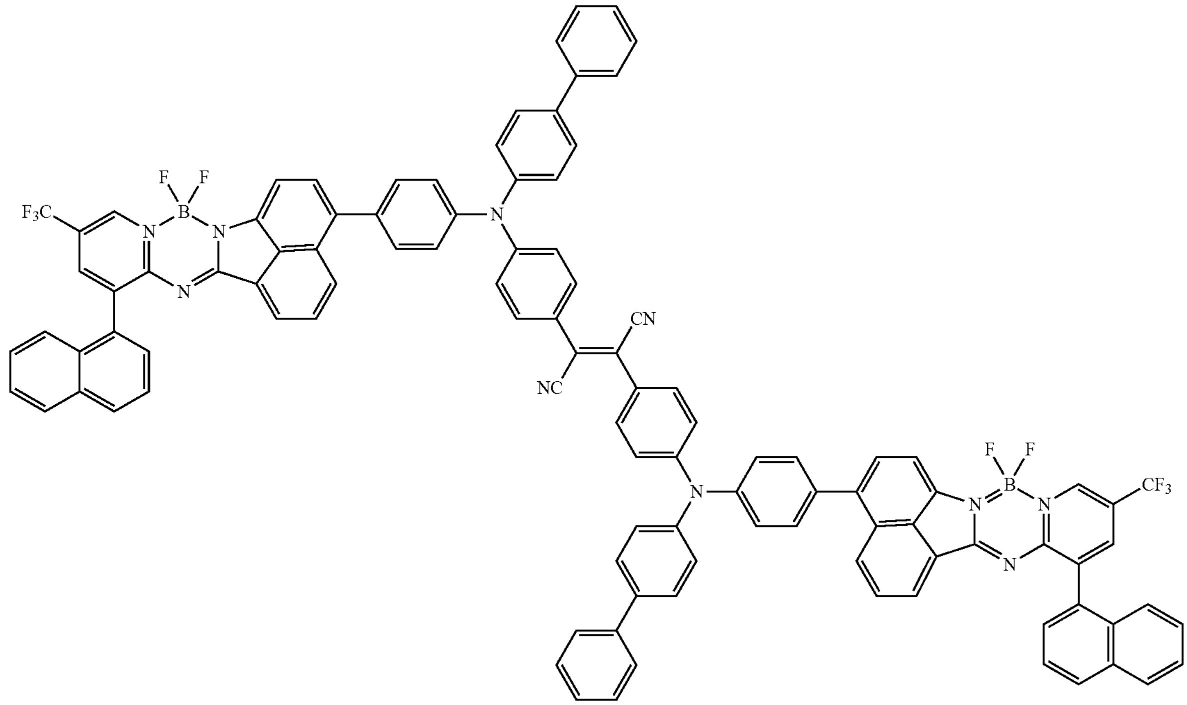
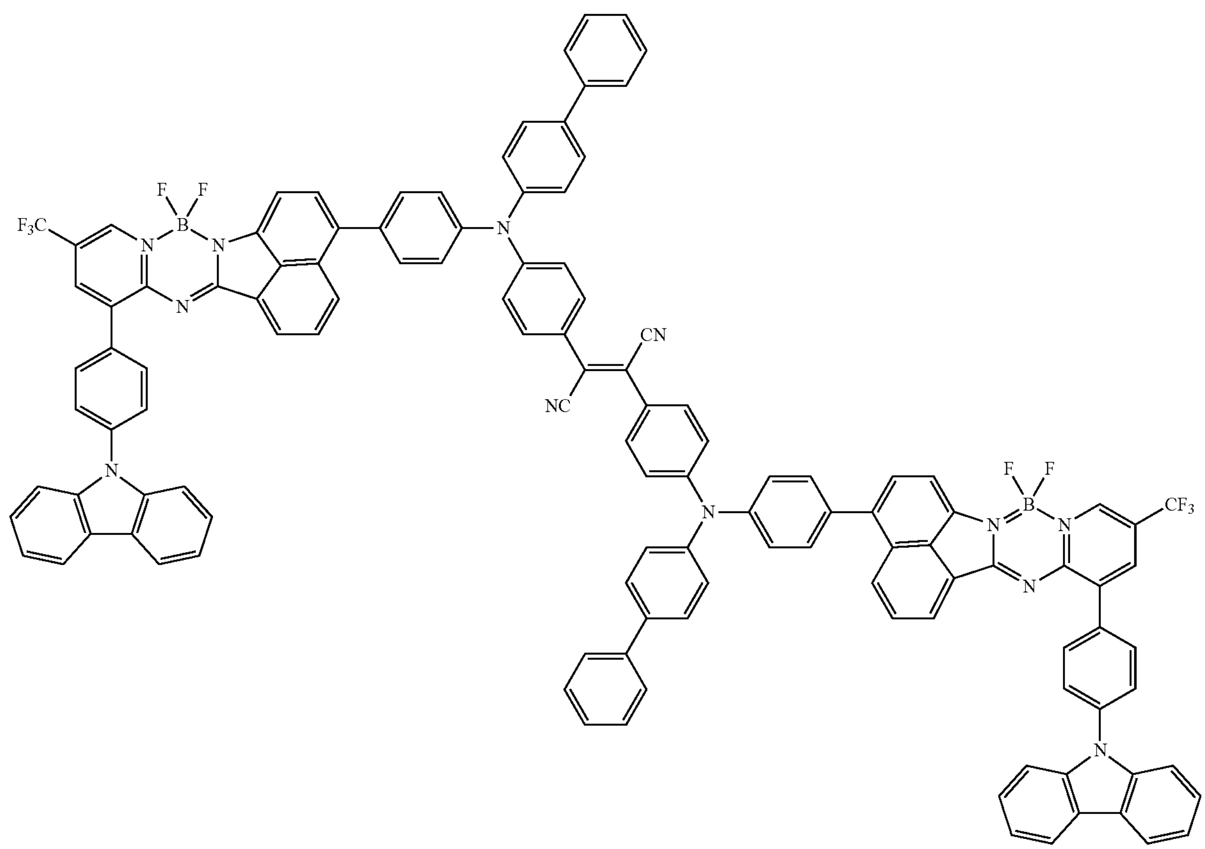

-continued
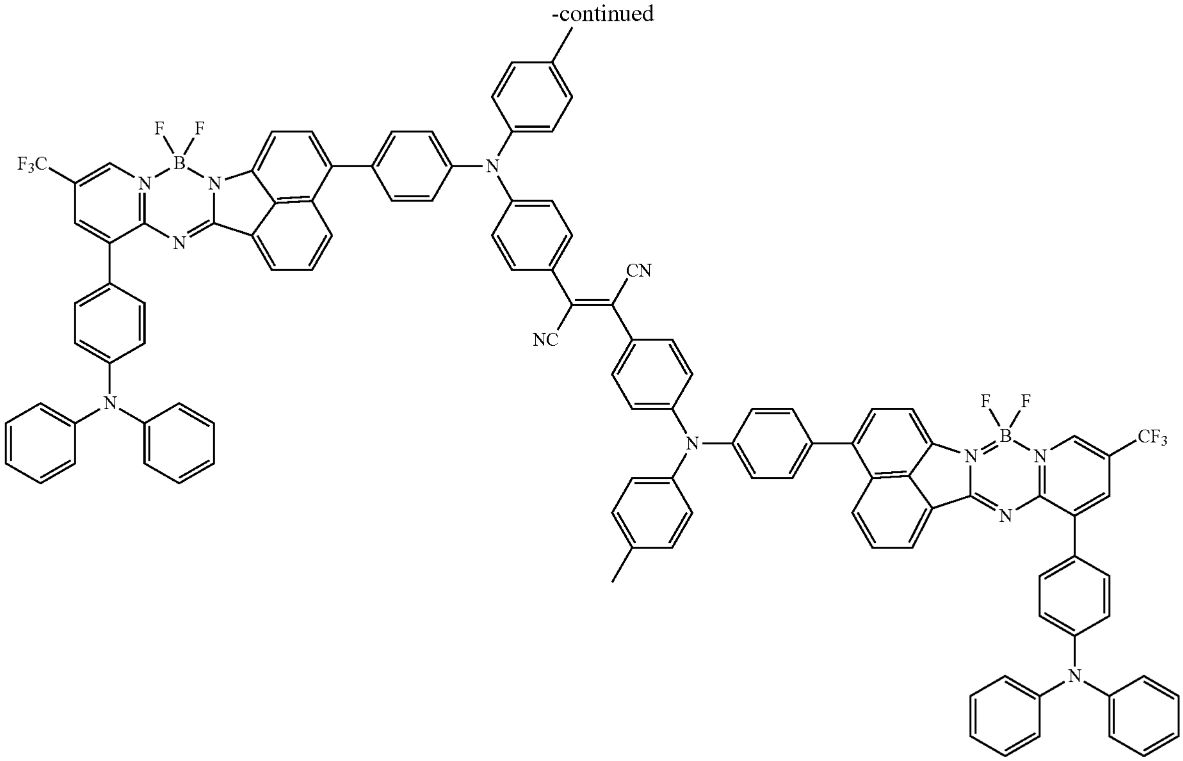
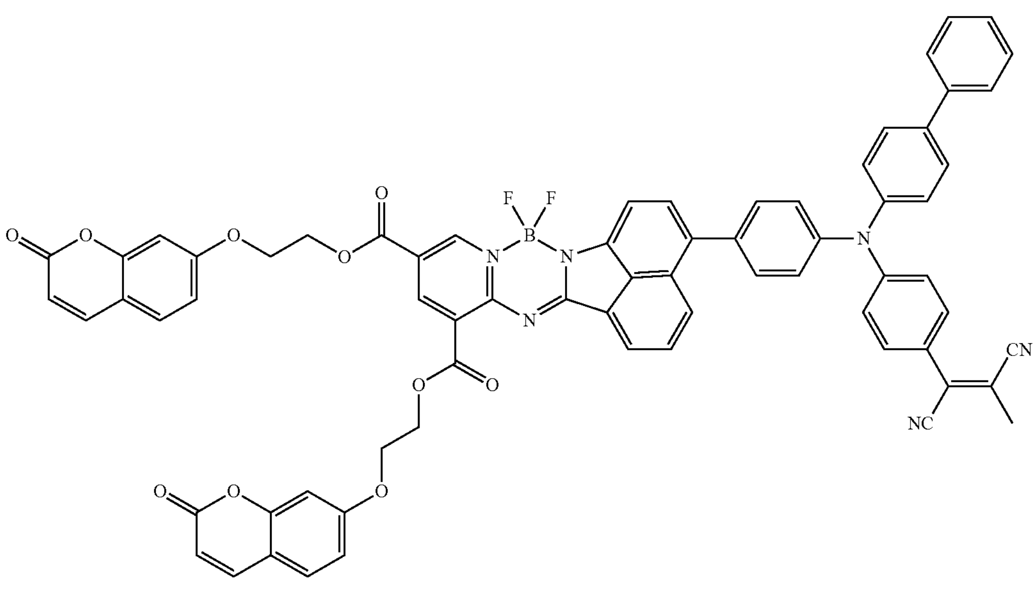

-continued
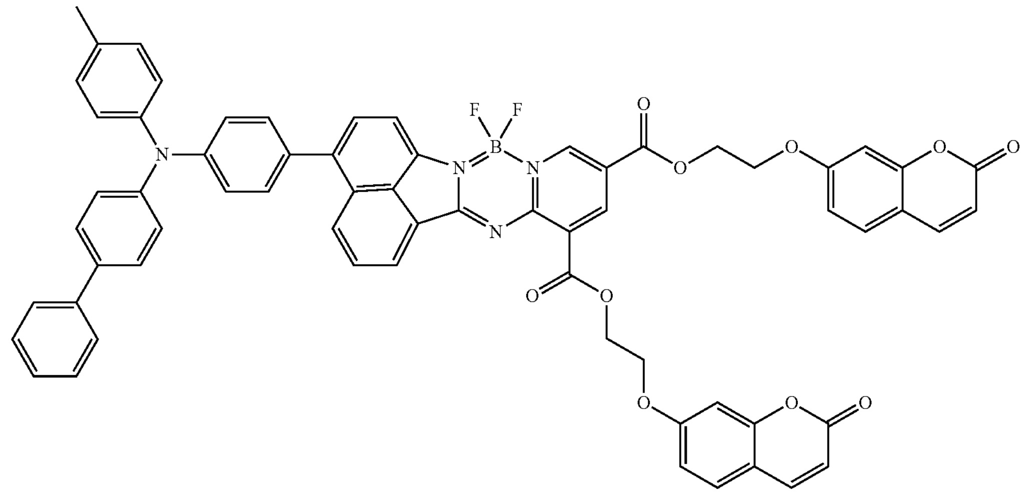
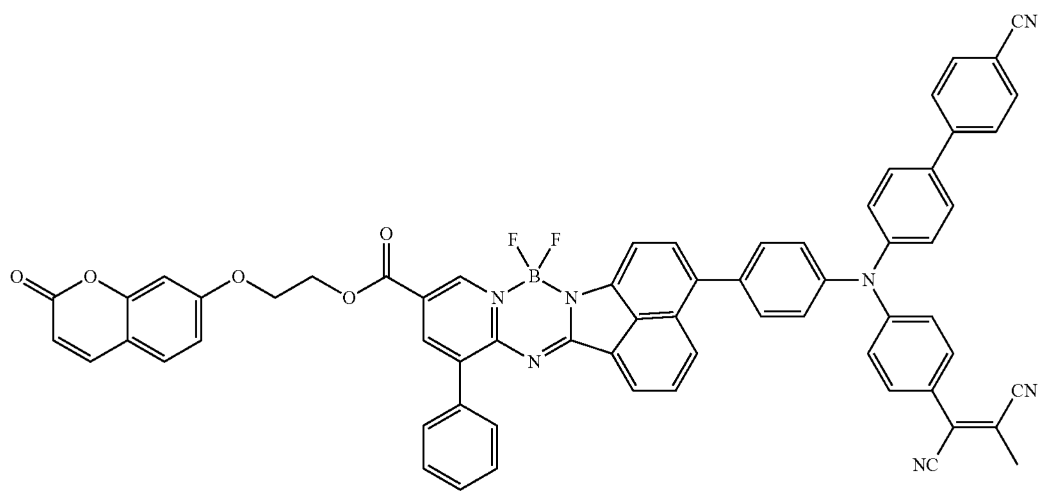
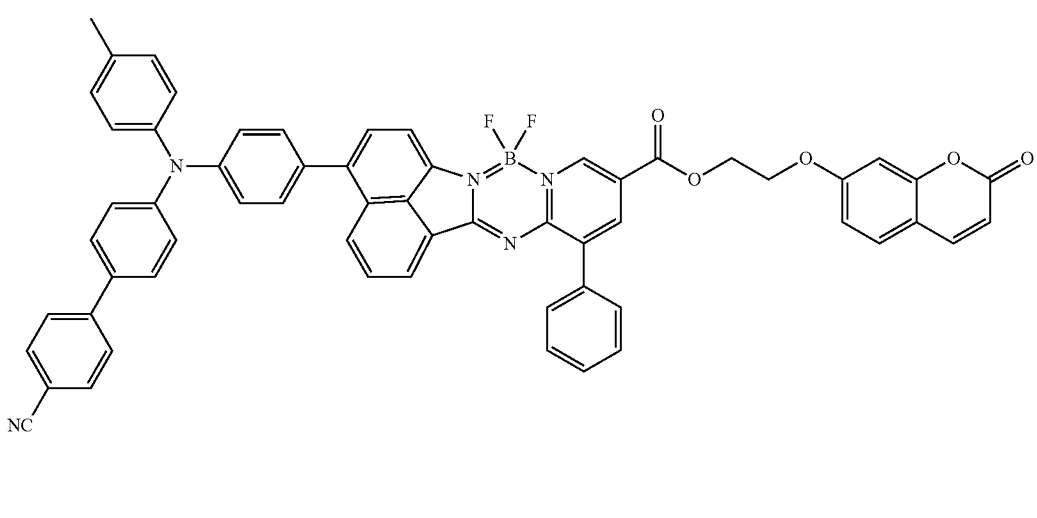

-continued
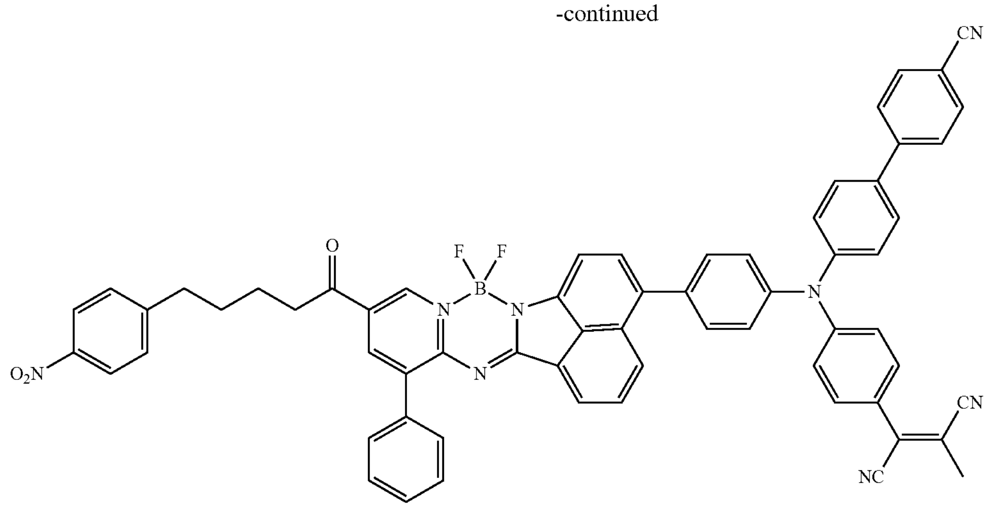
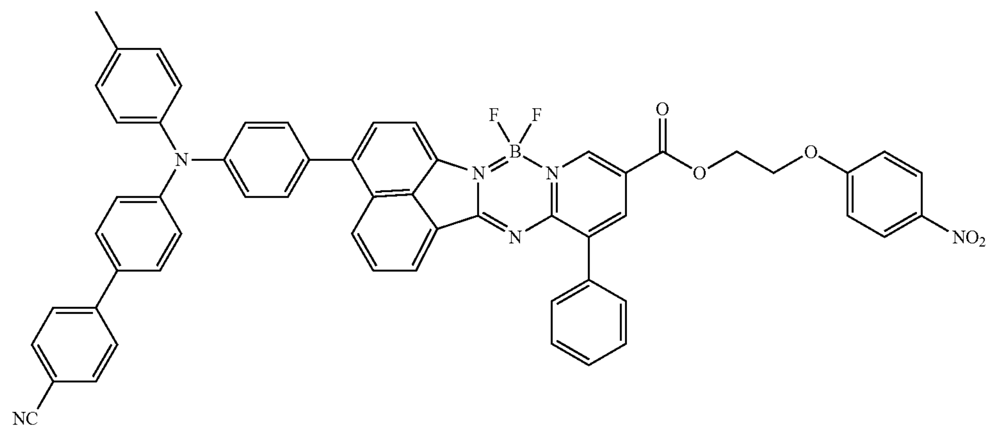
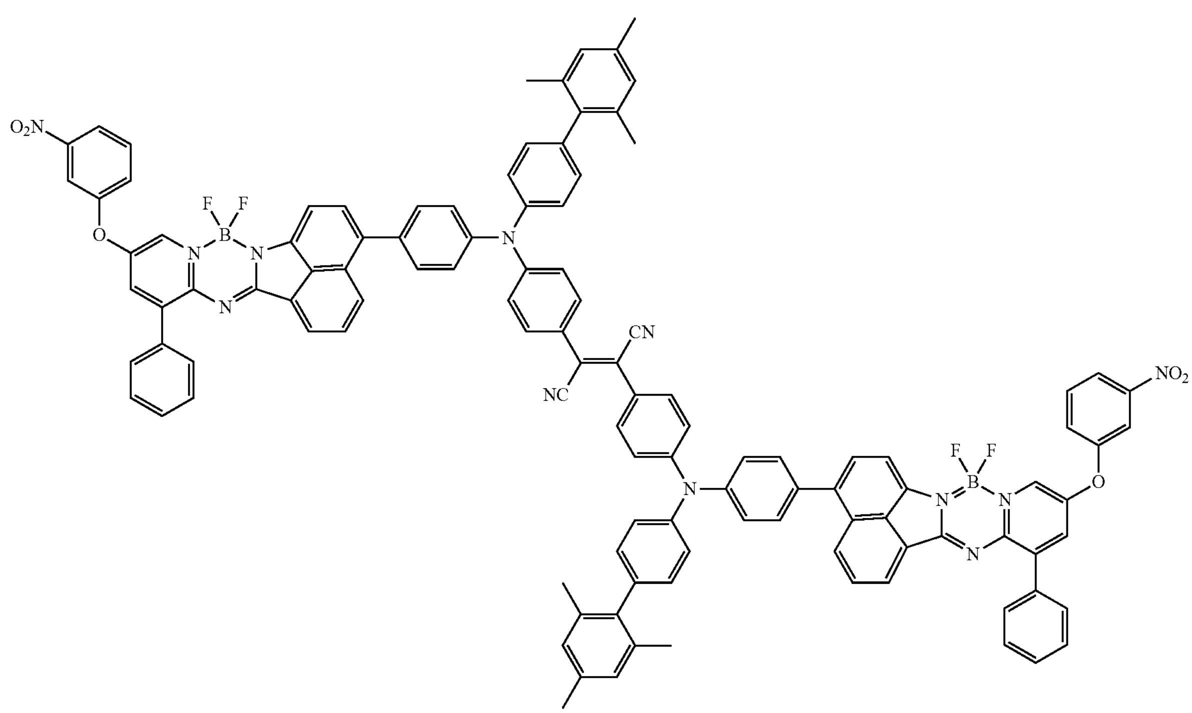

-continued
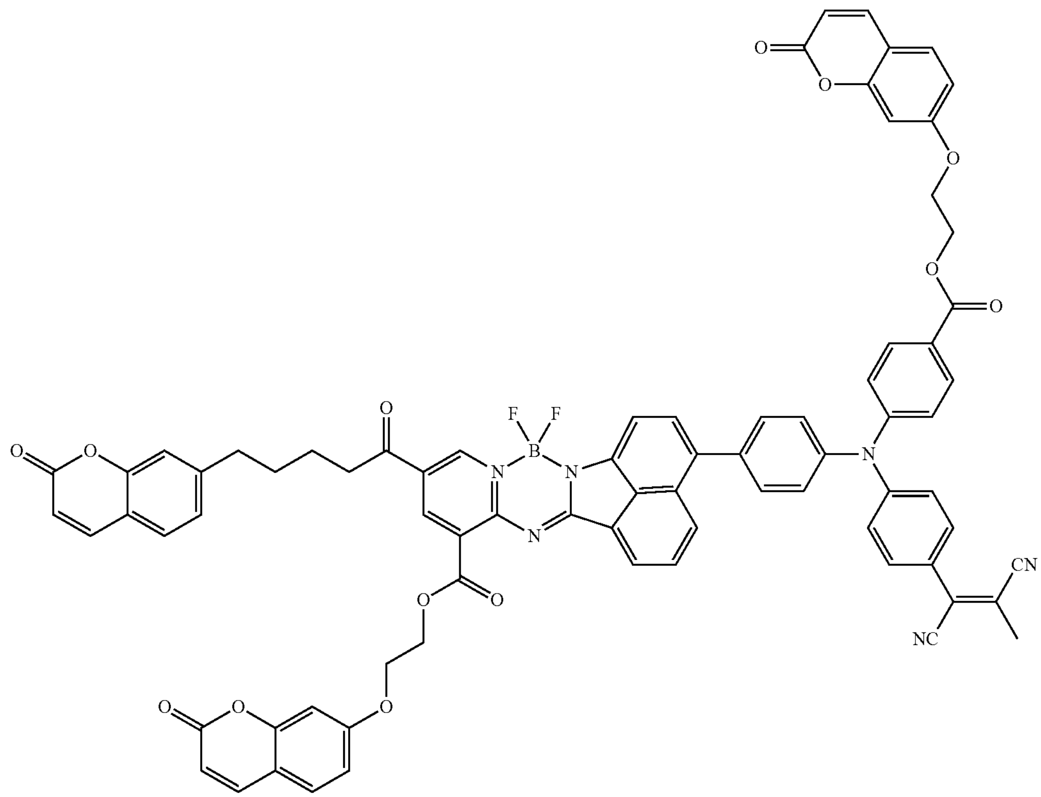
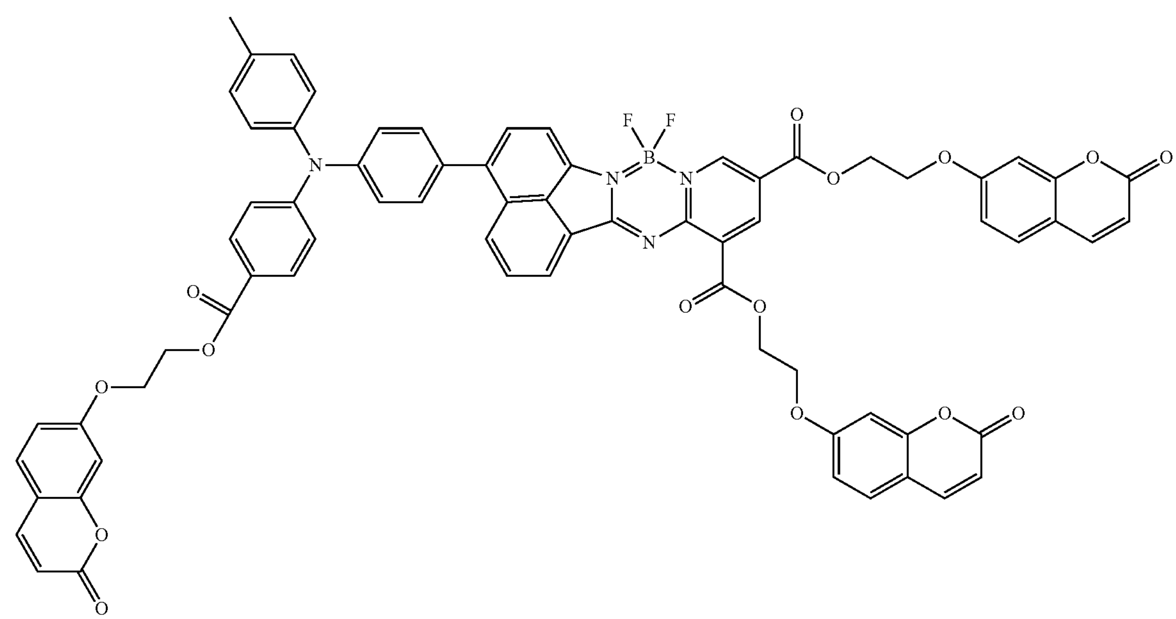

-continued
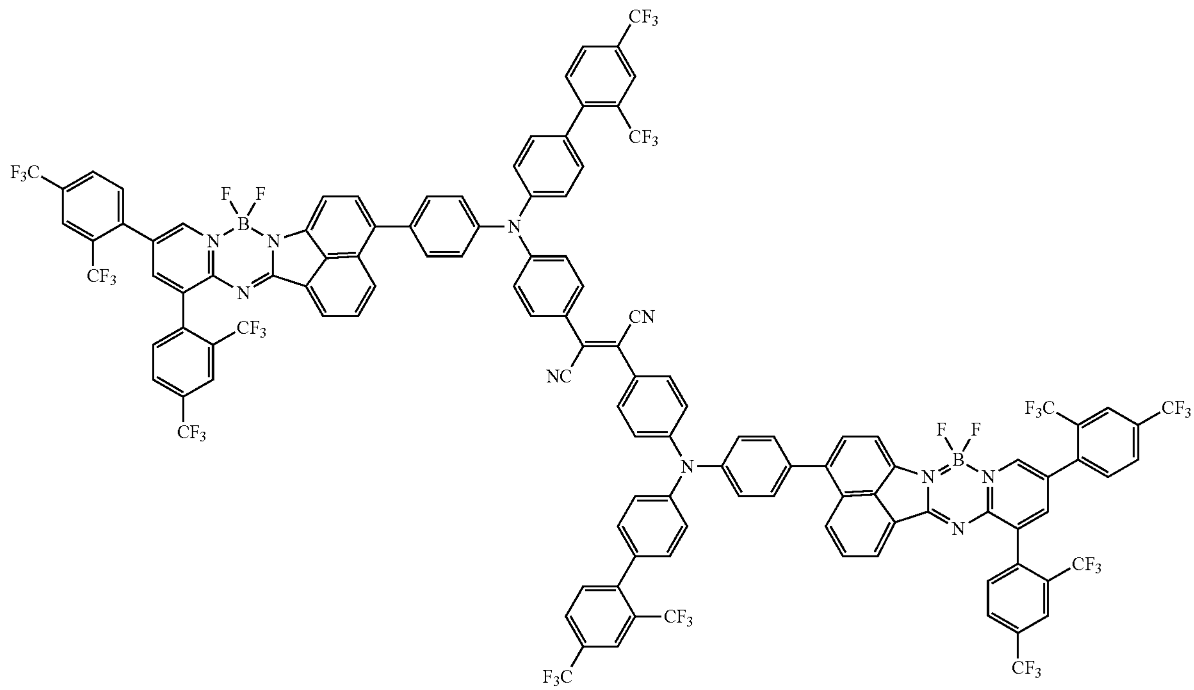
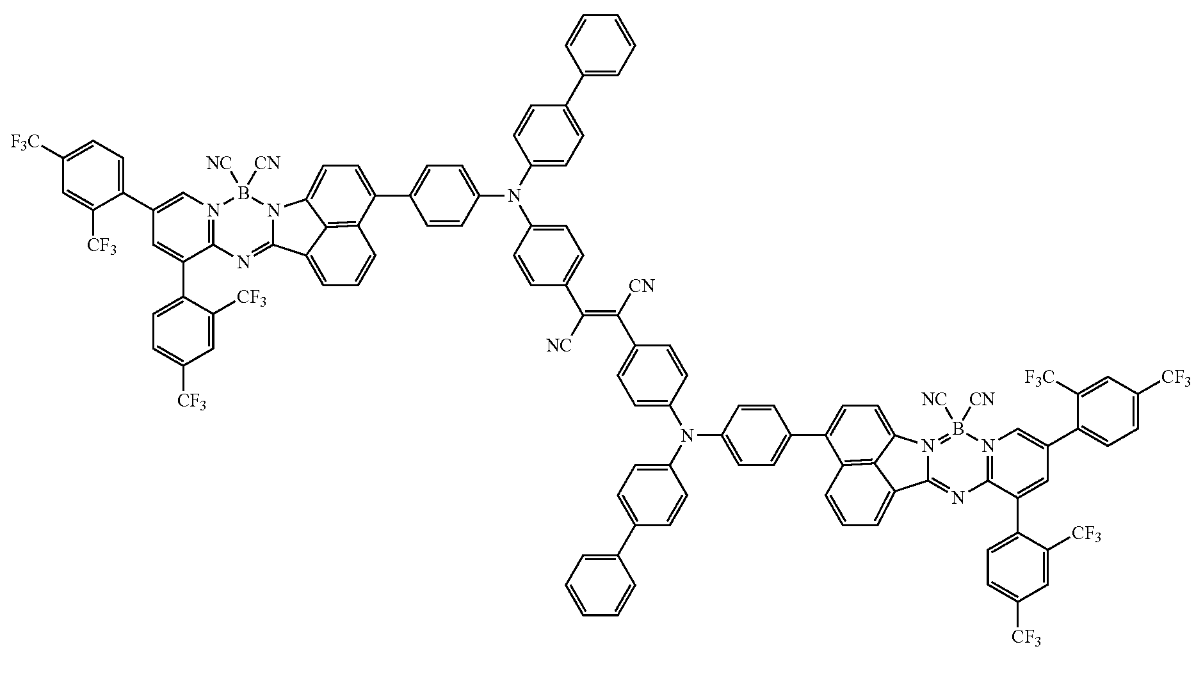

-continued
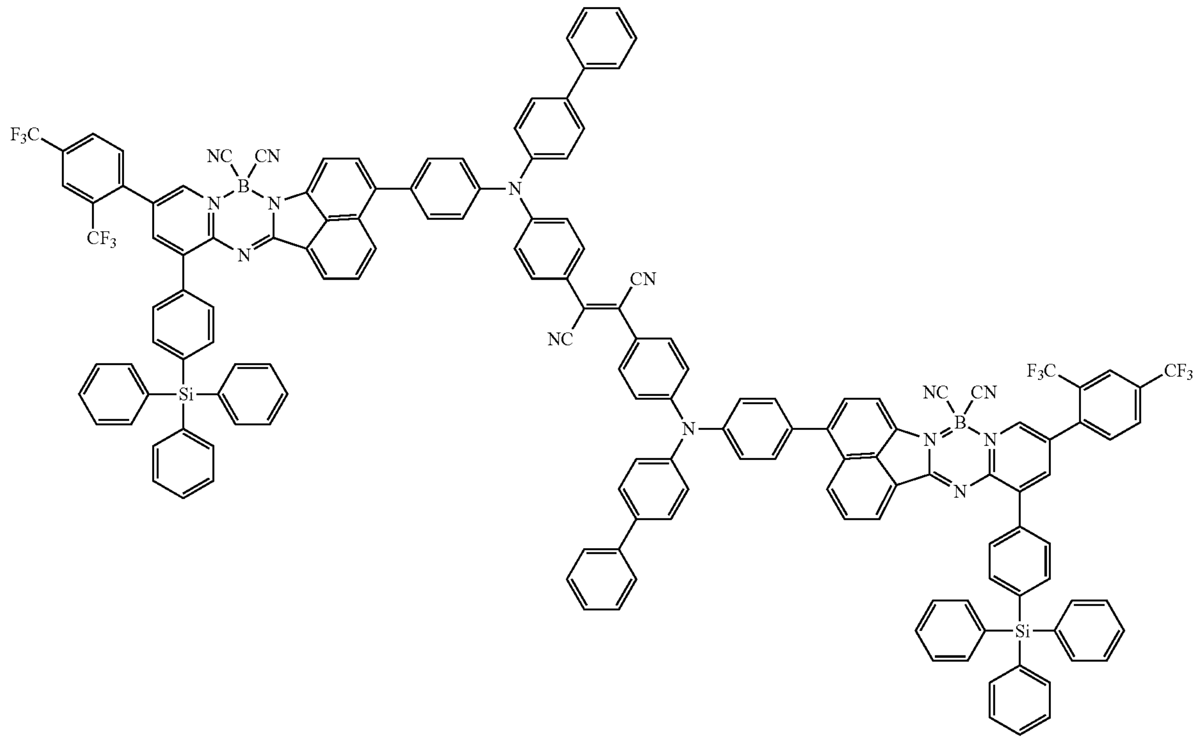
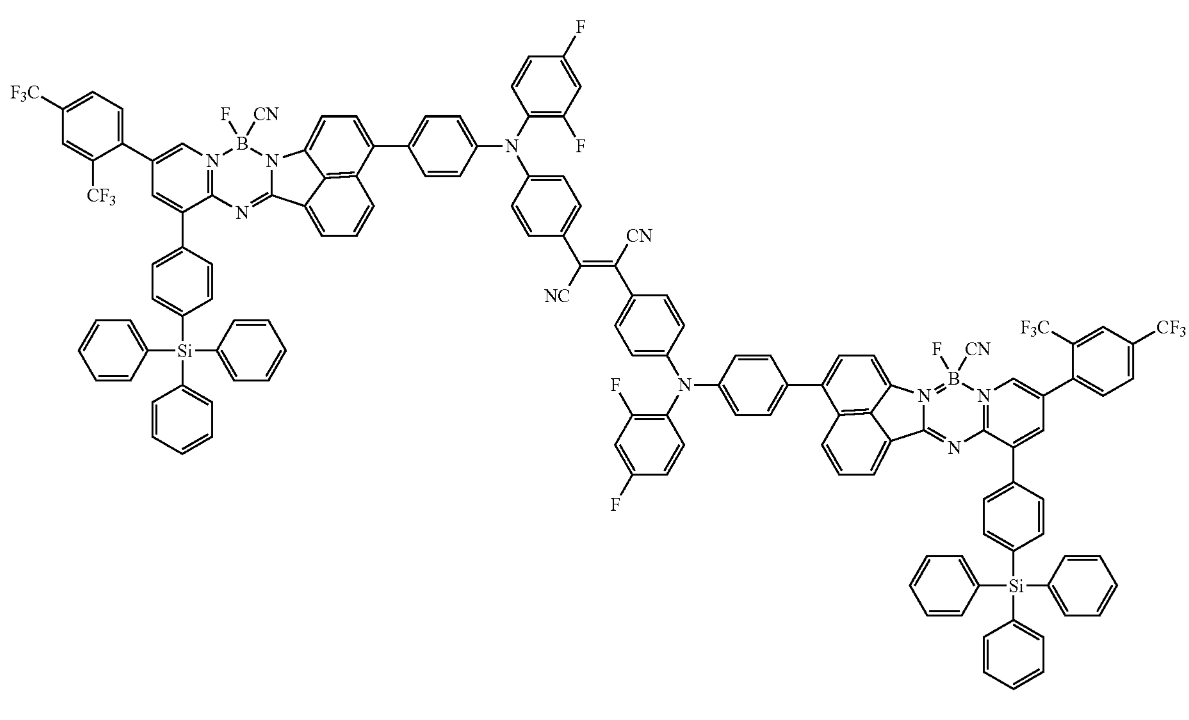

-continued
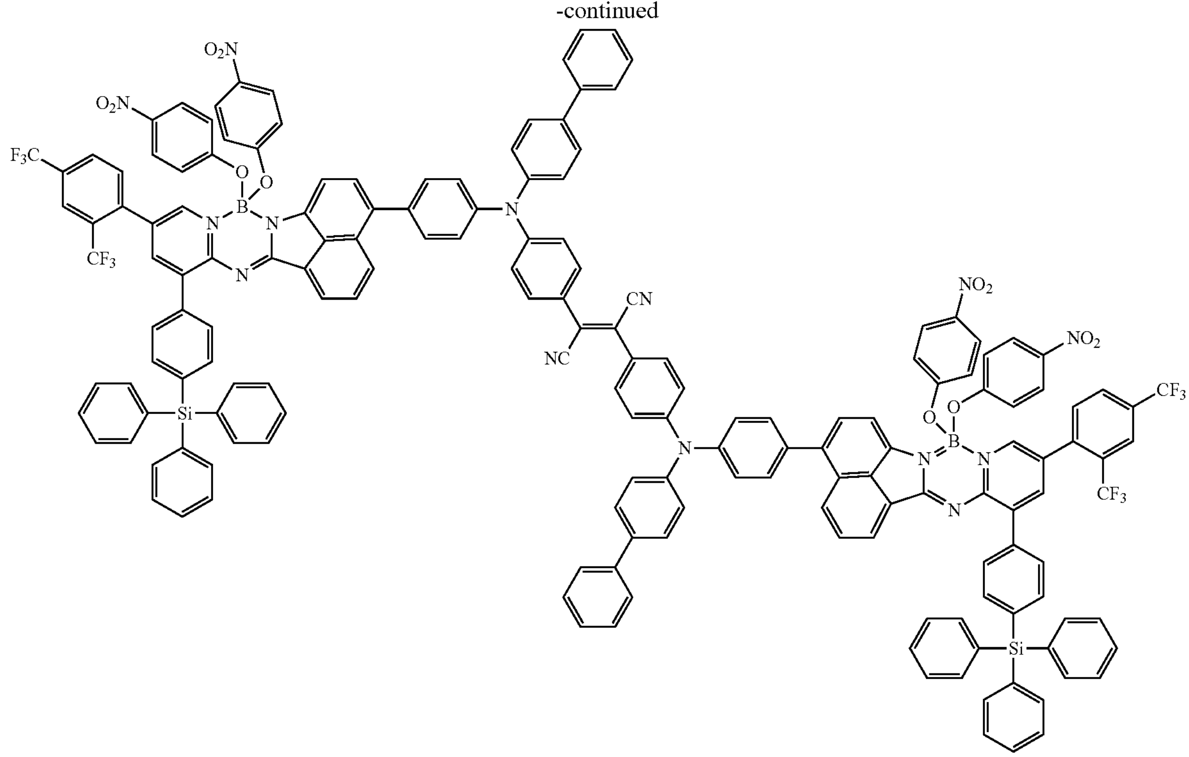
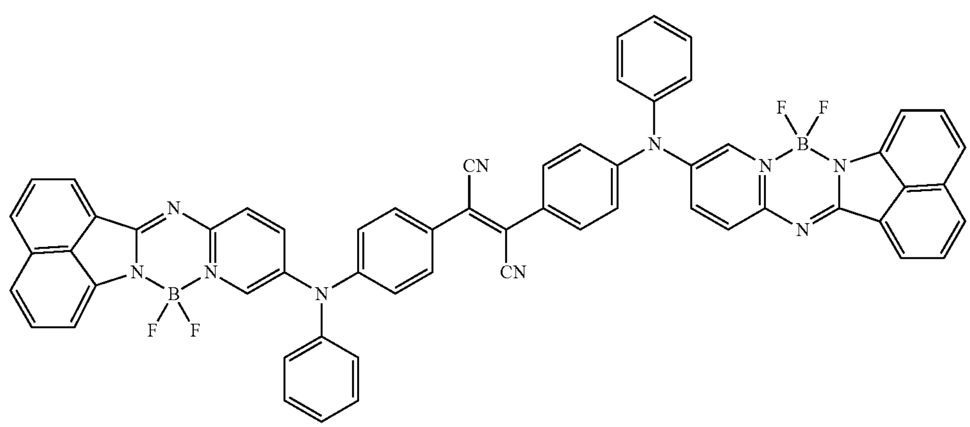
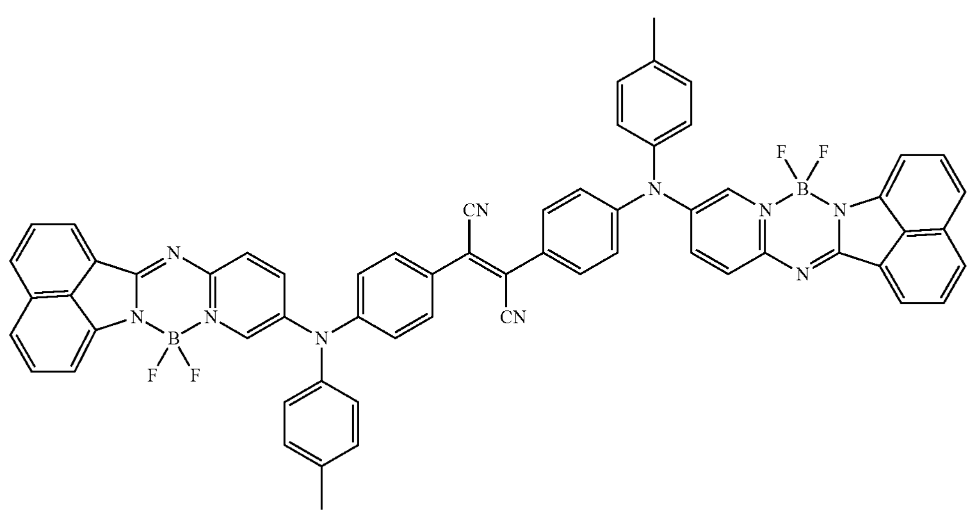

-continued
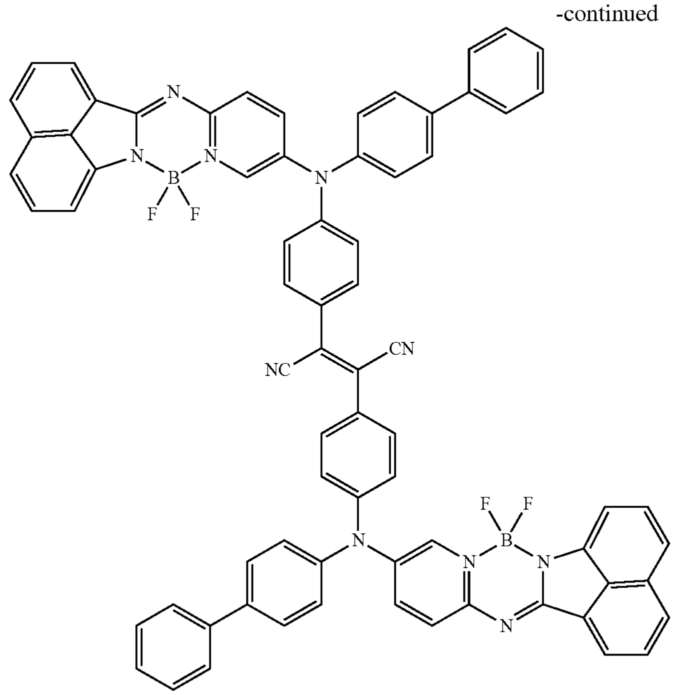
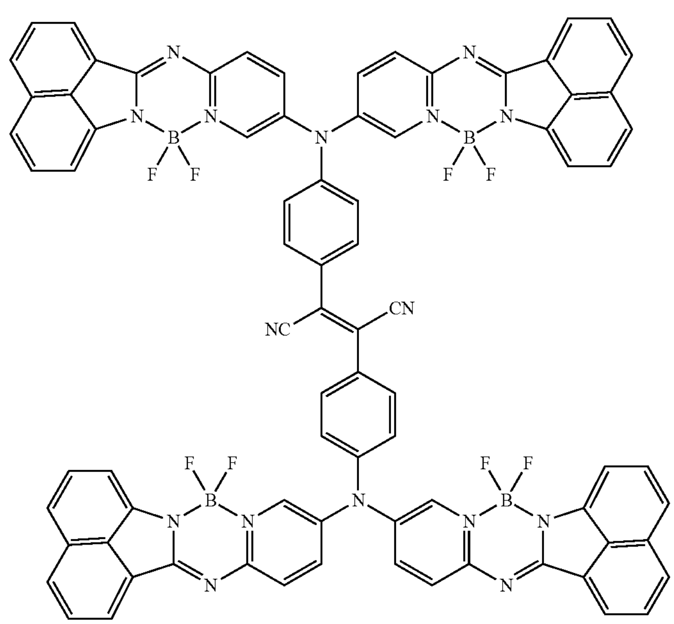

-continued
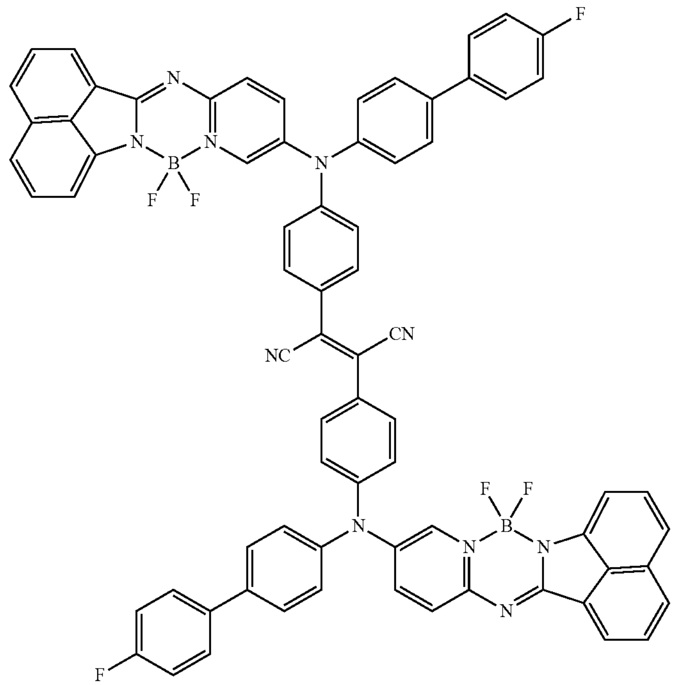
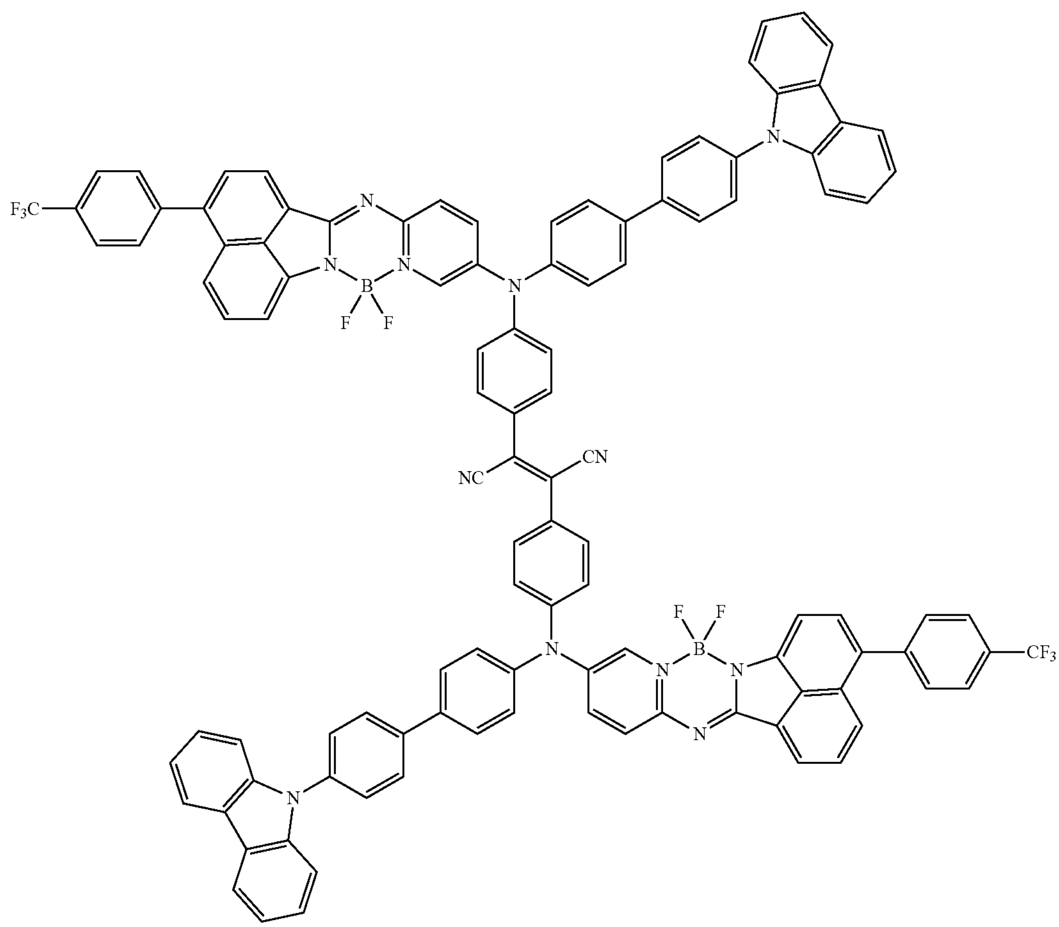

-continued
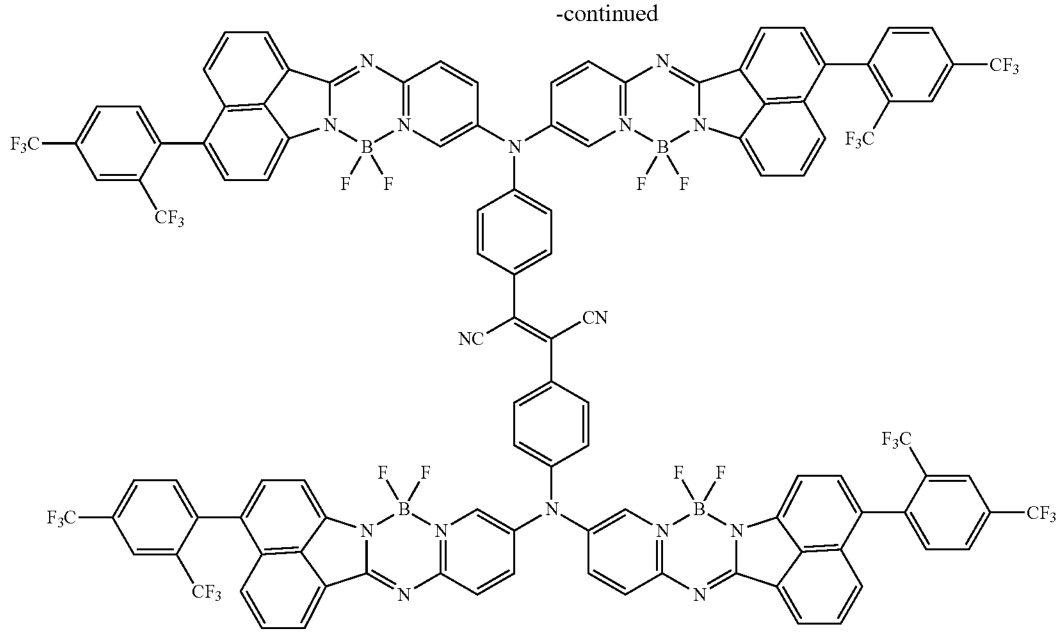
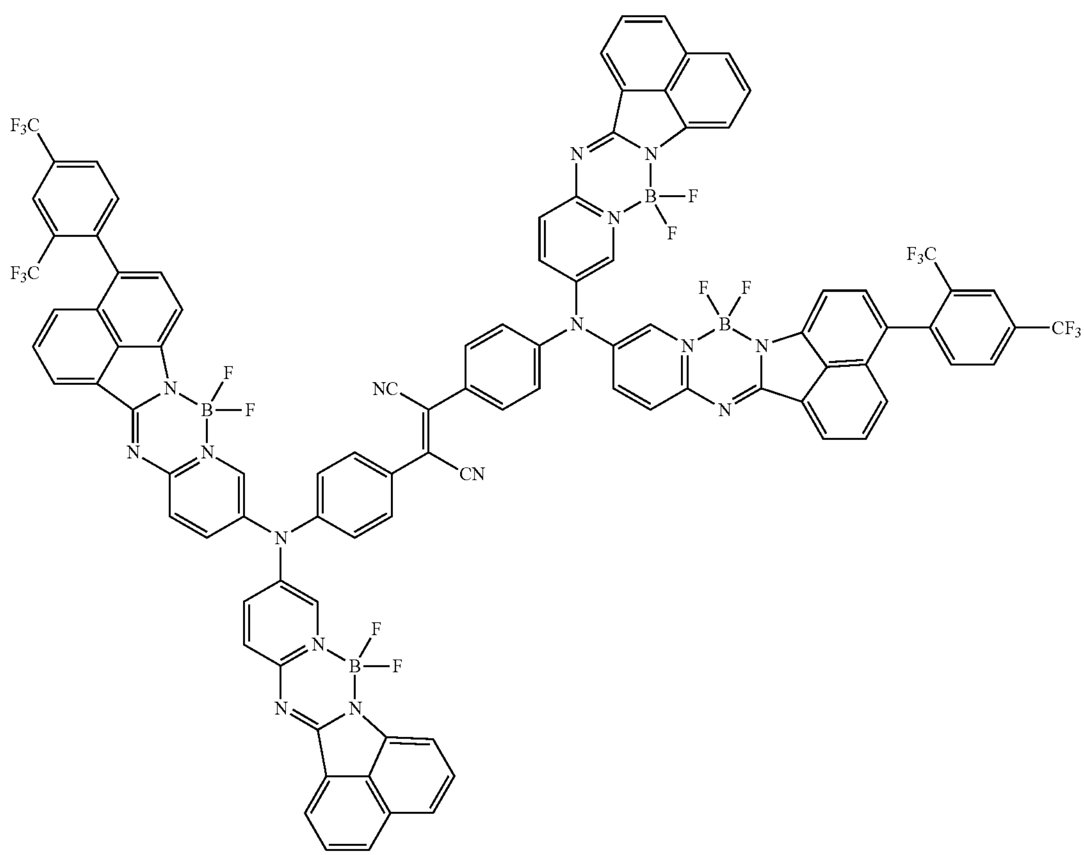

-continued
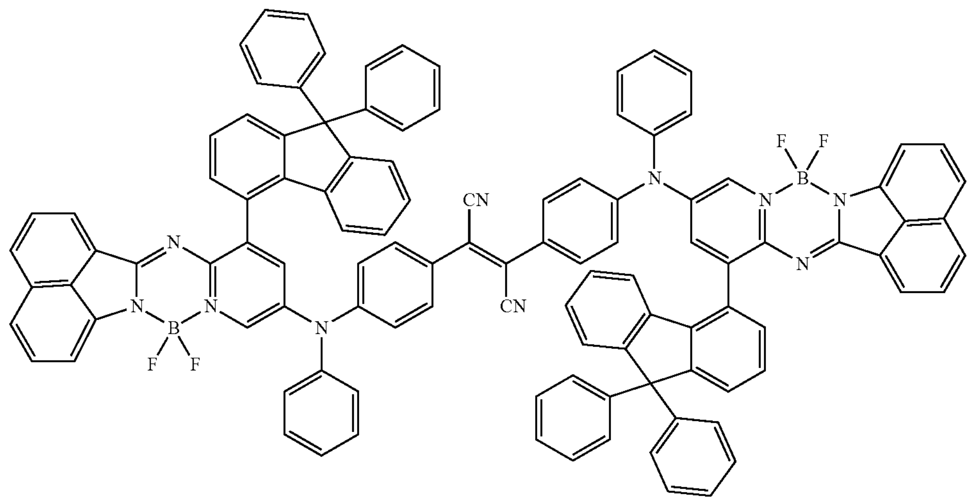
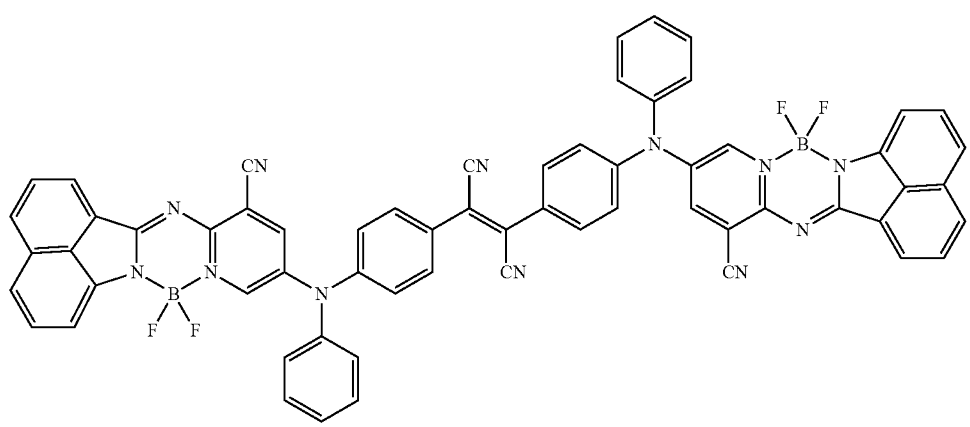
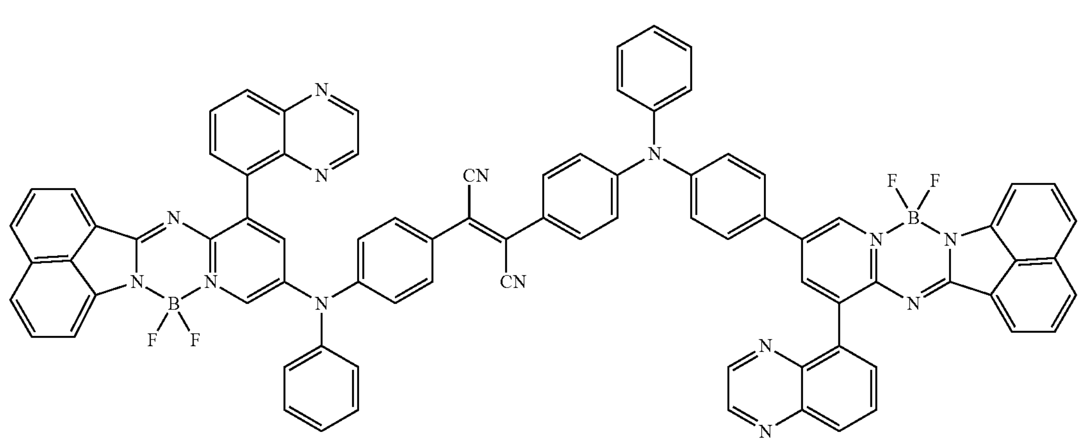

-continued
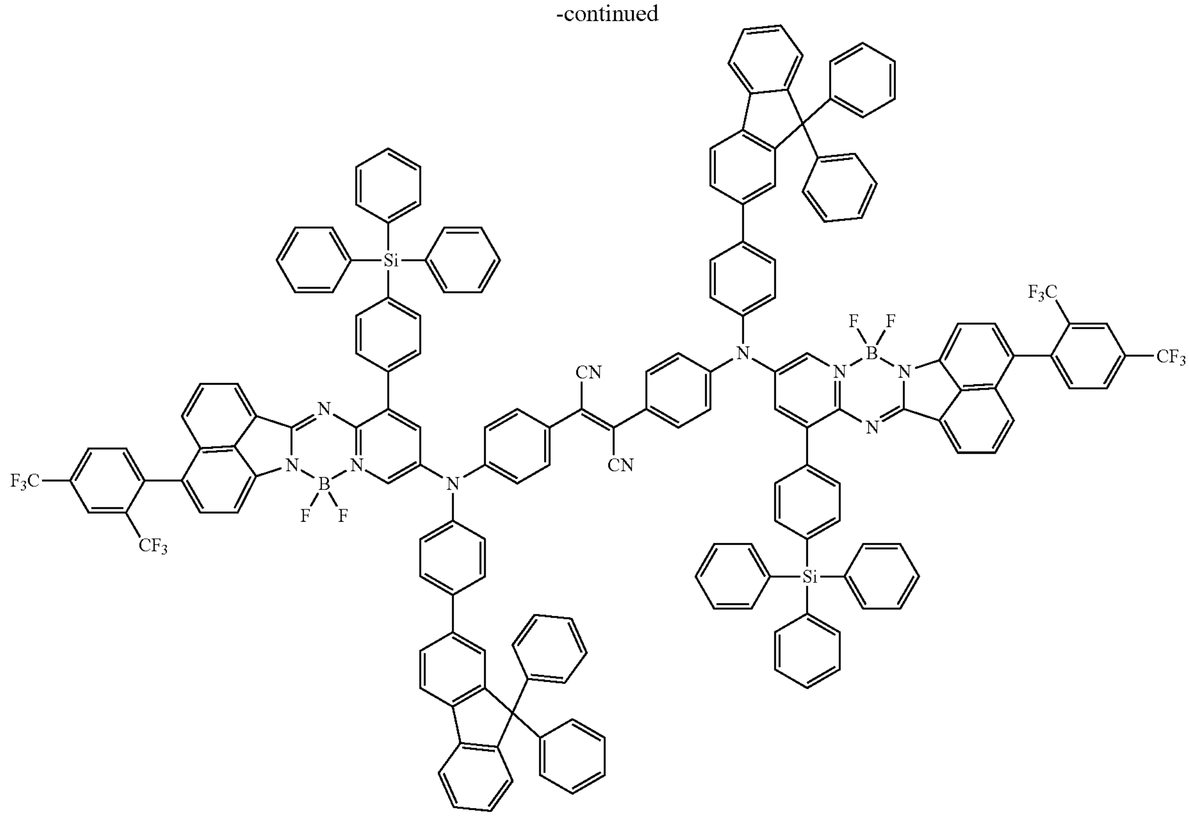
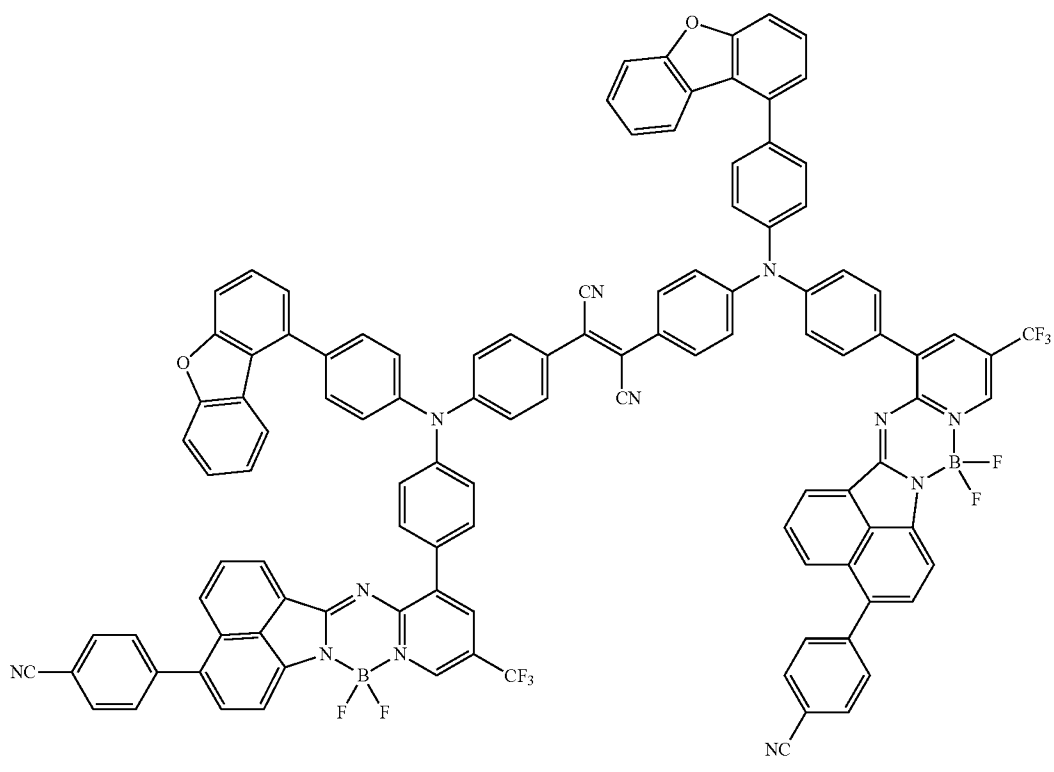

-continued
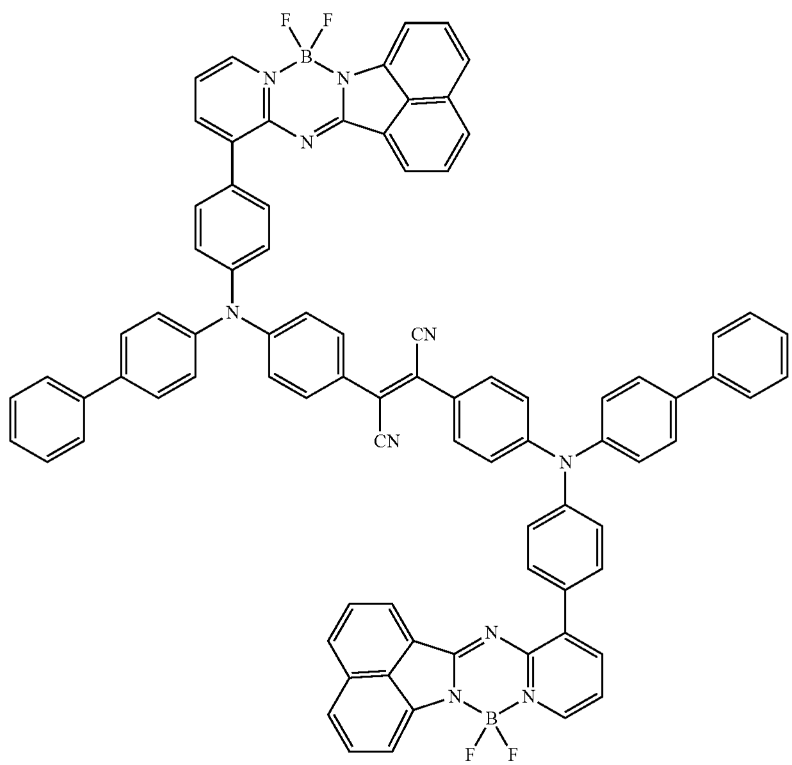
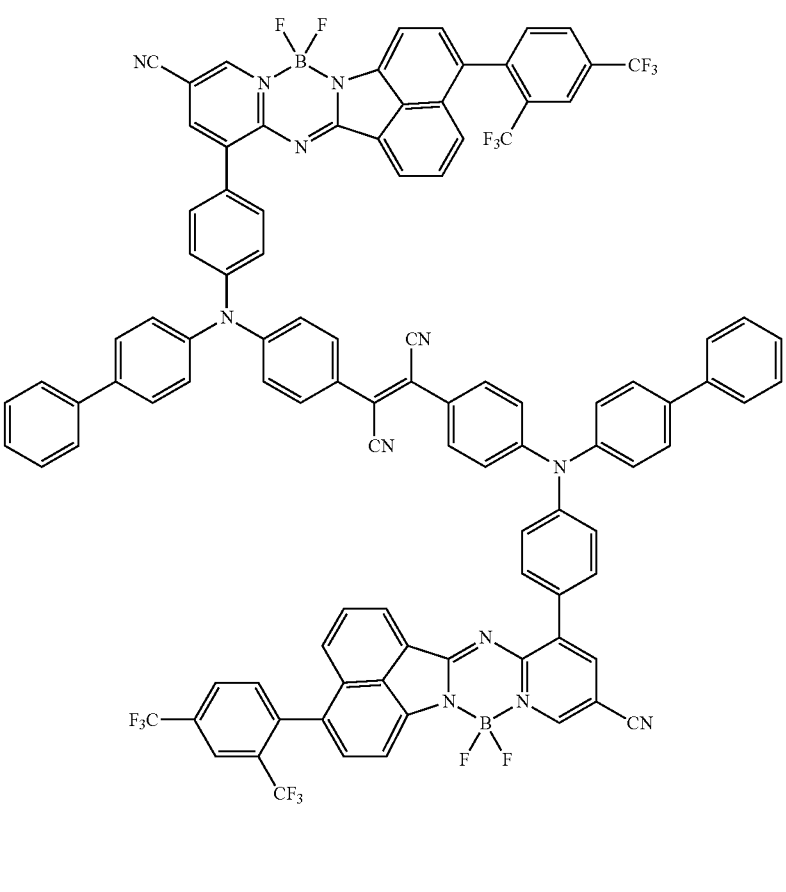

-continued
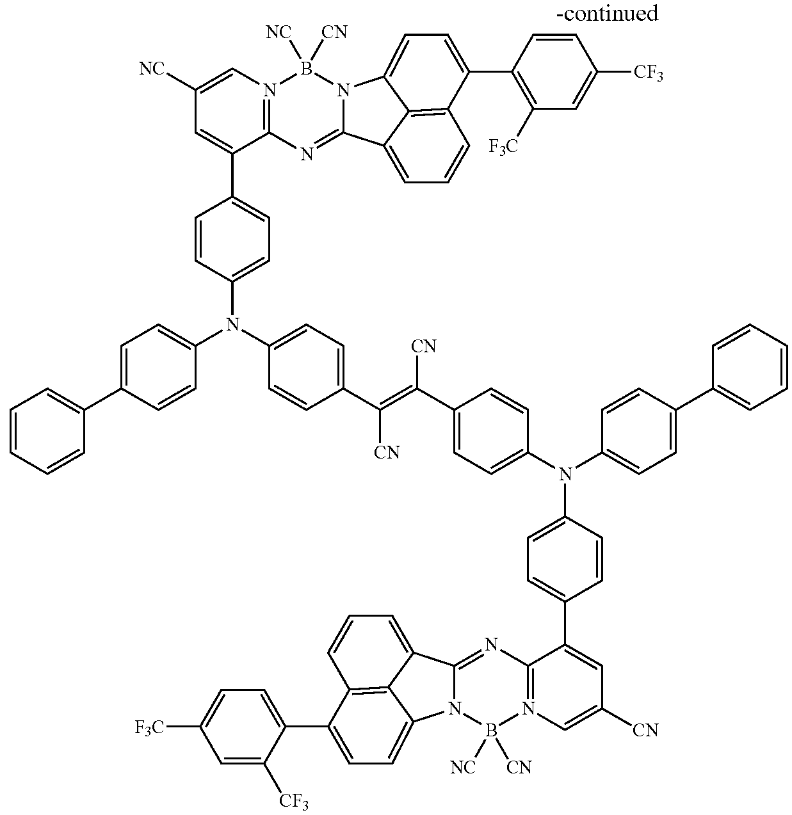
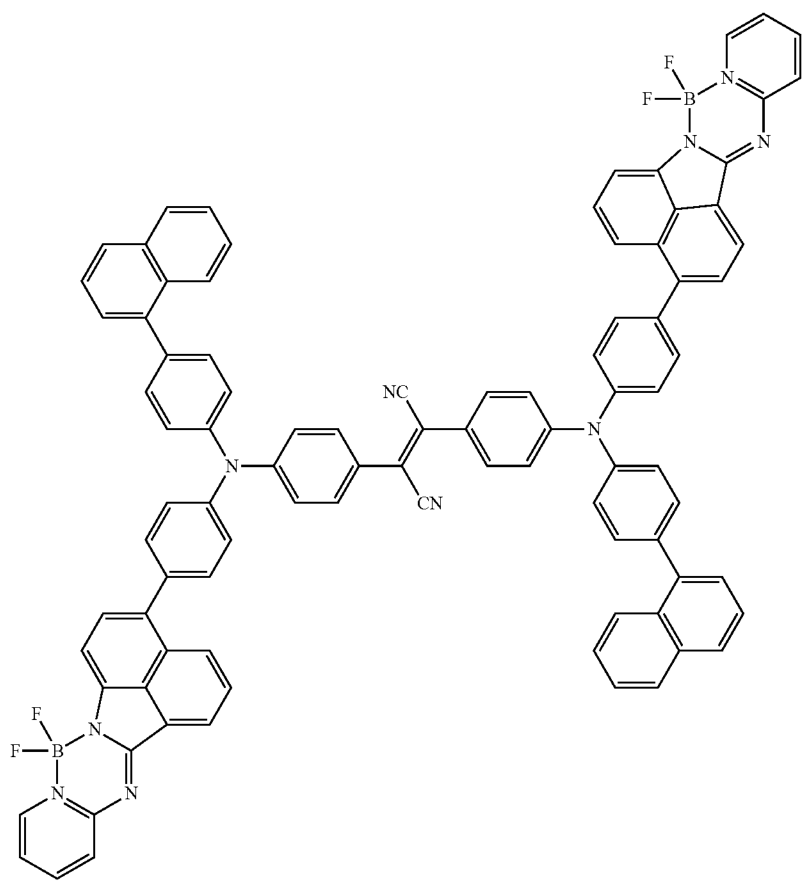

-continued
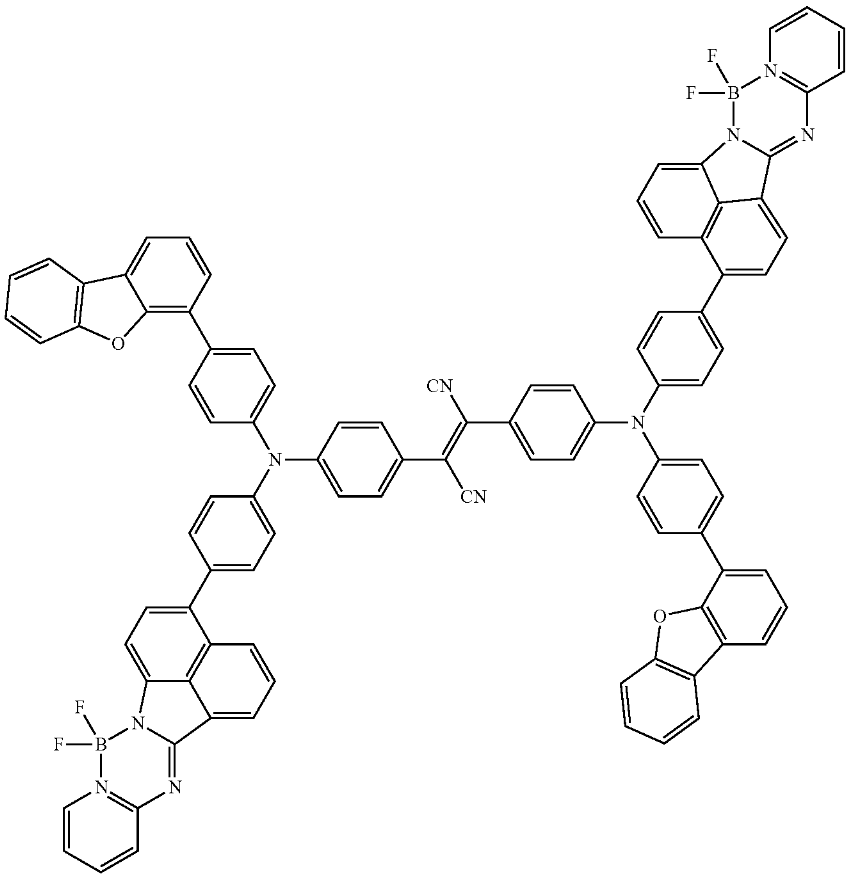

-continued
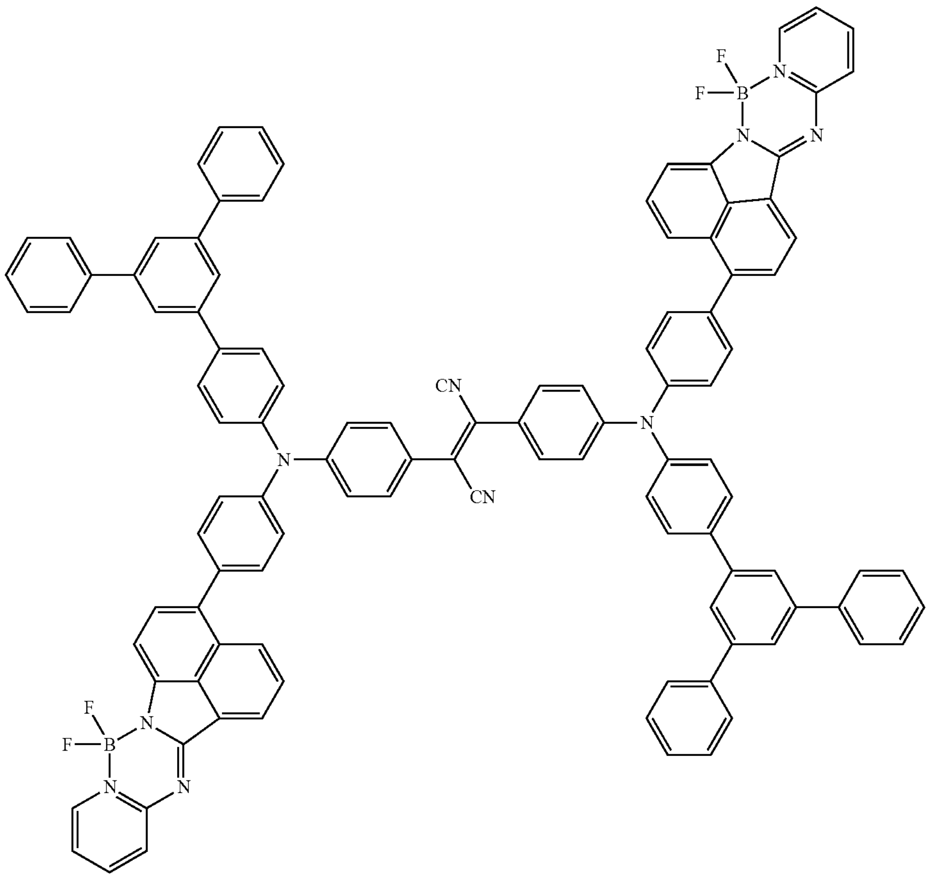
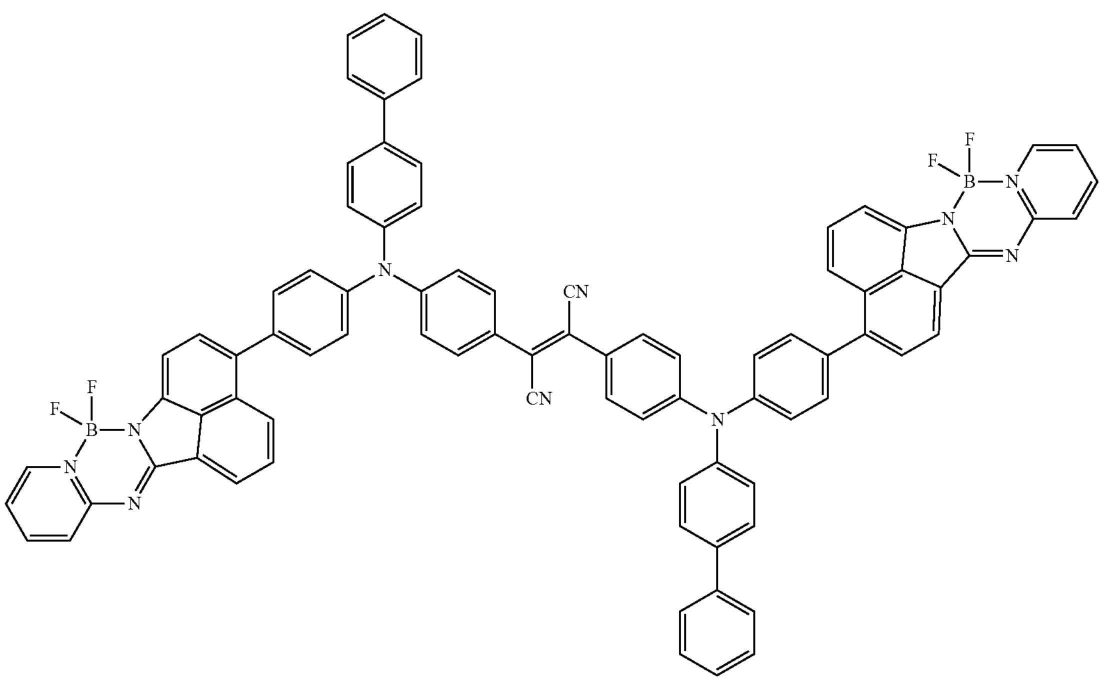

-continued
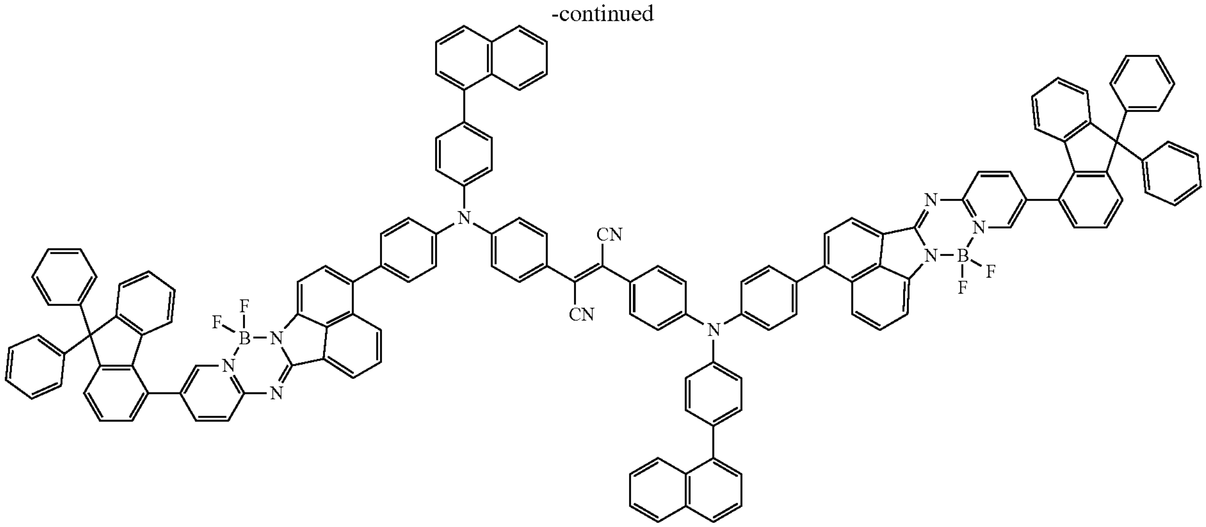
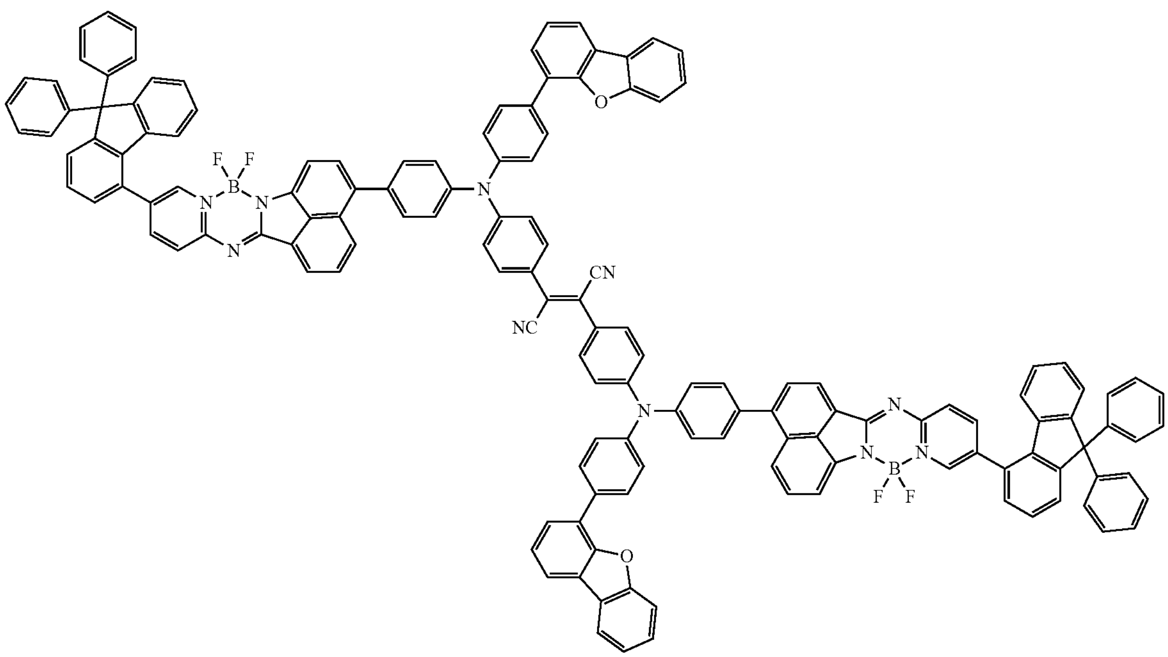

-continued
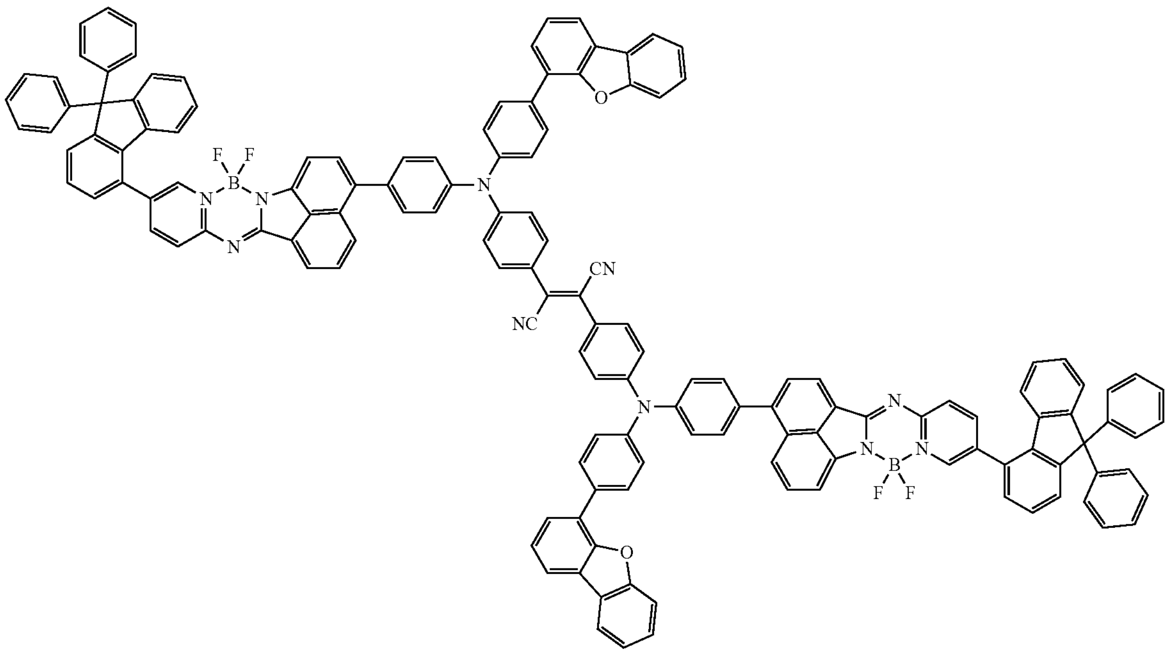
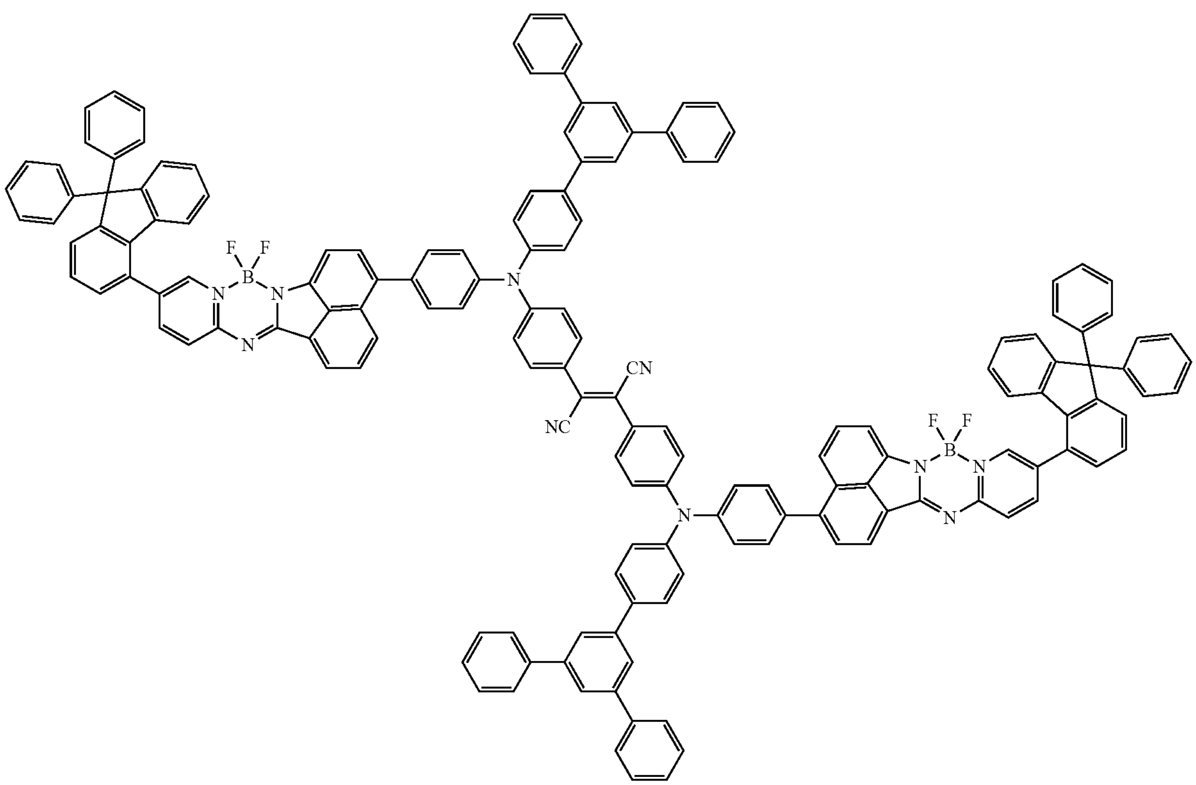

-continued
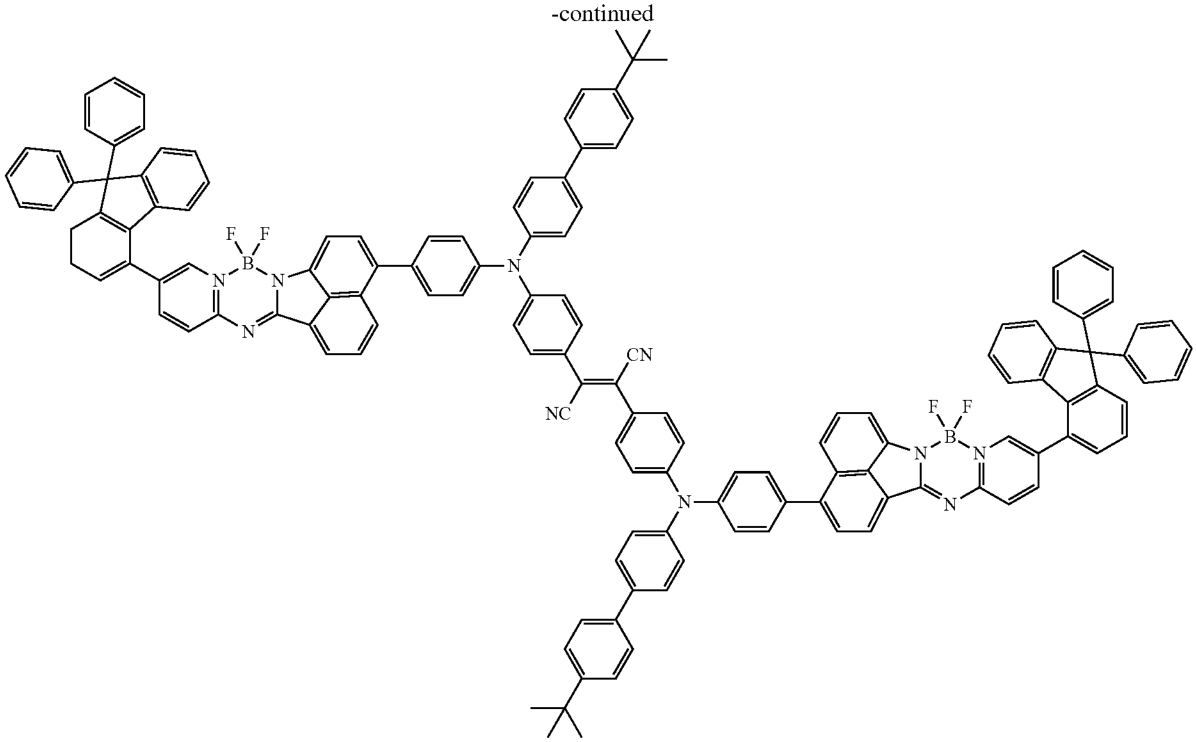
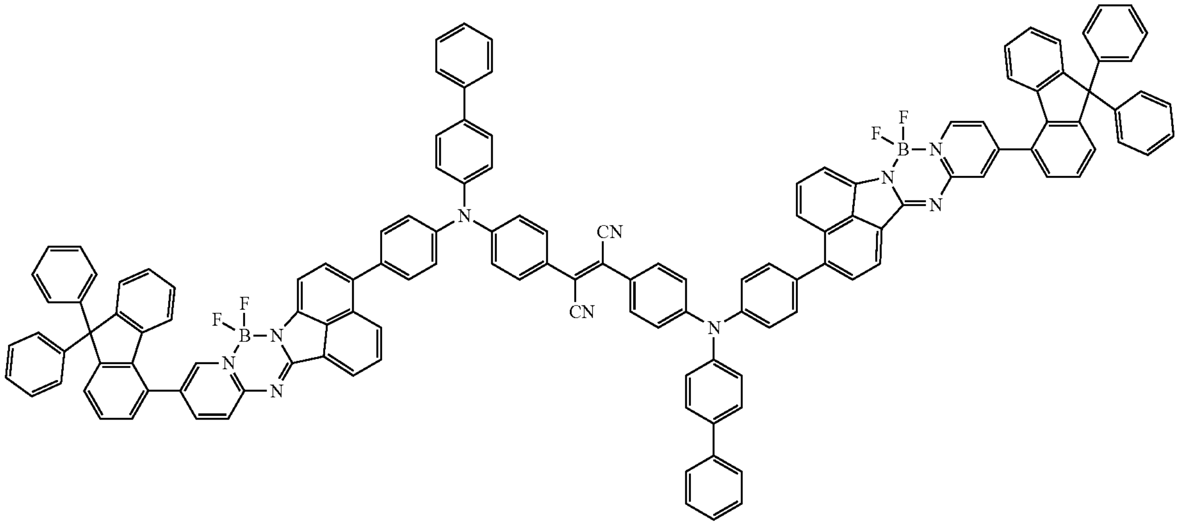

-continued
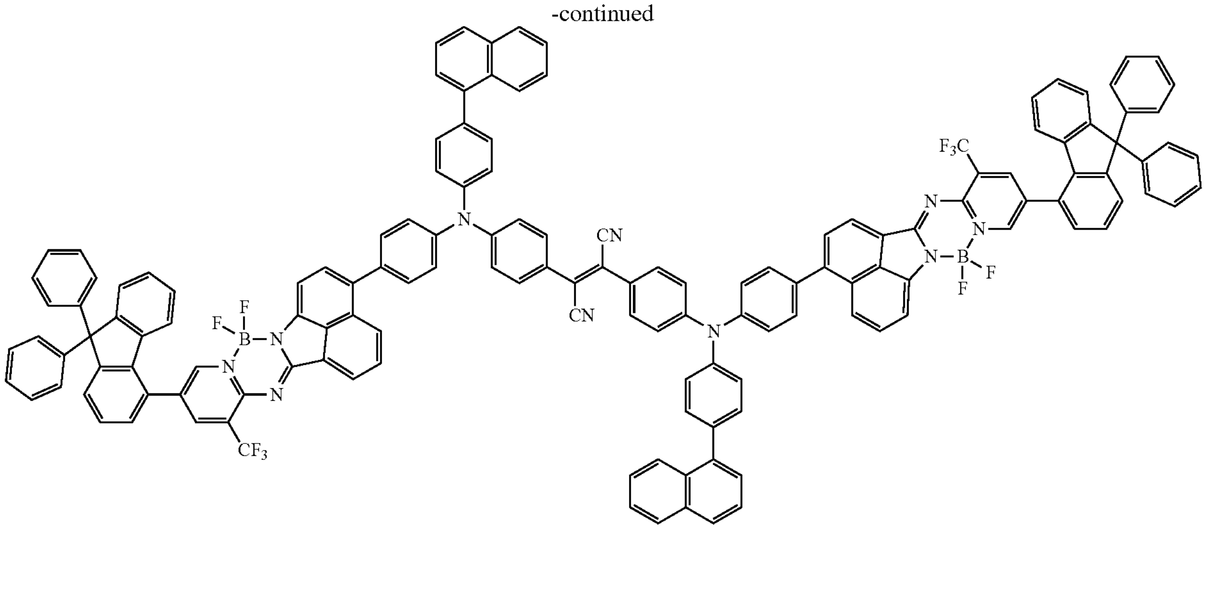
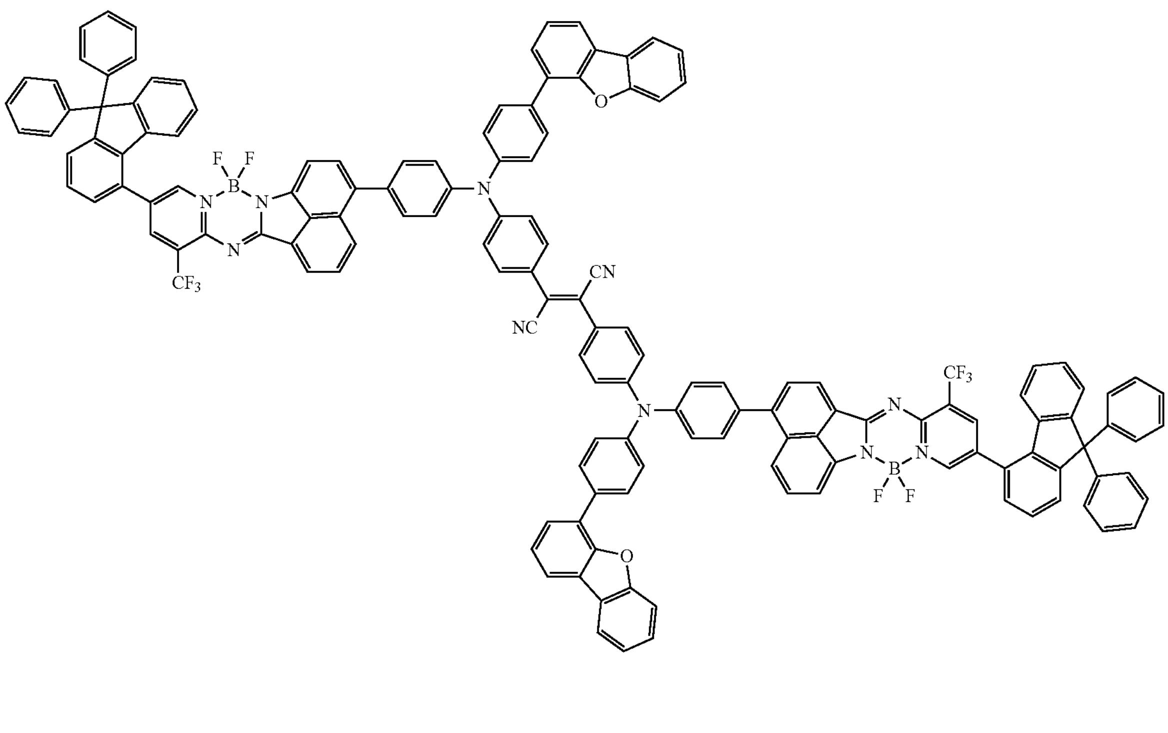

-continued
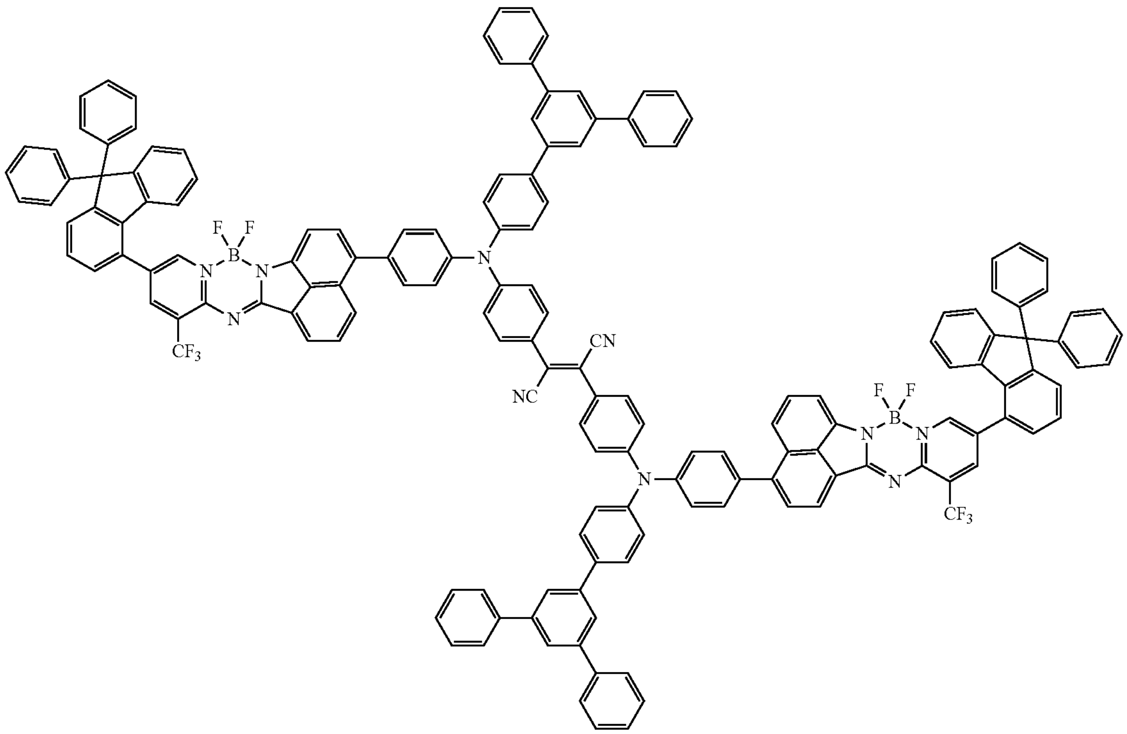
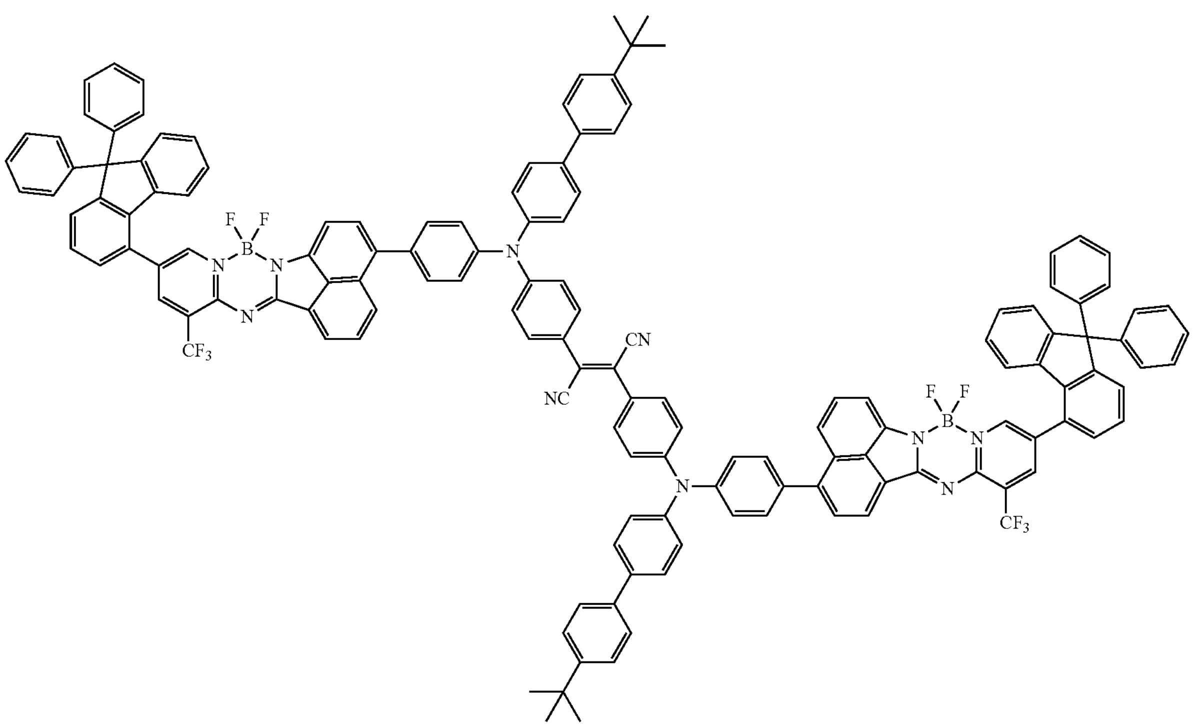

-continued
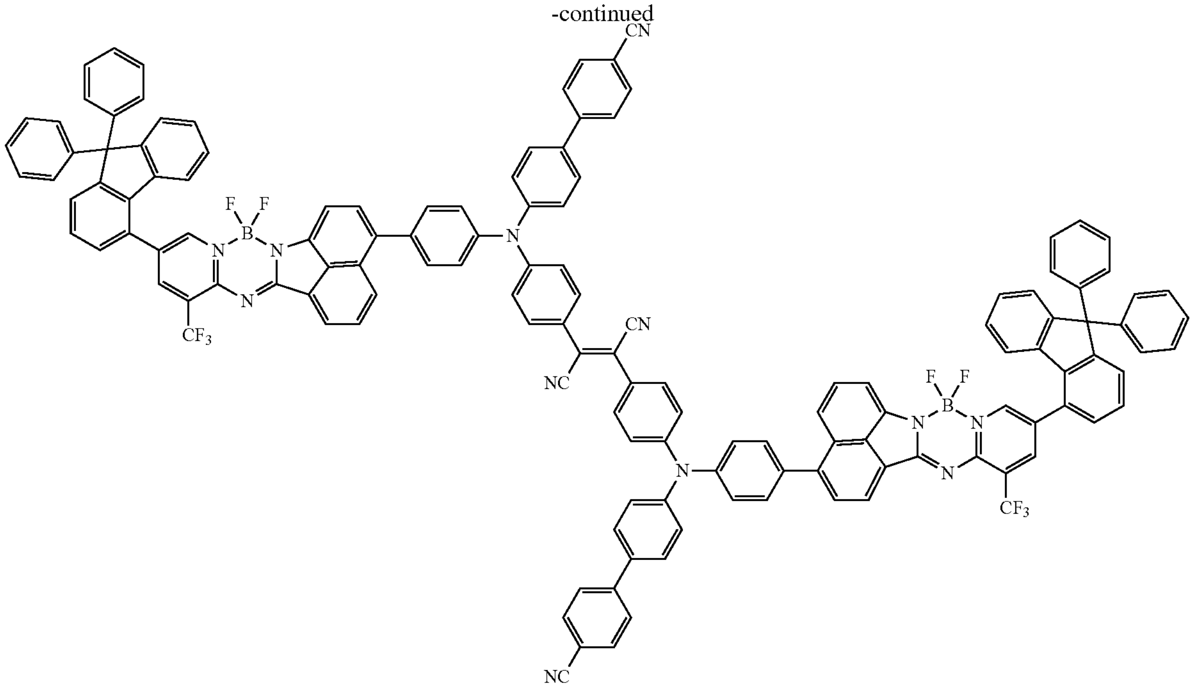
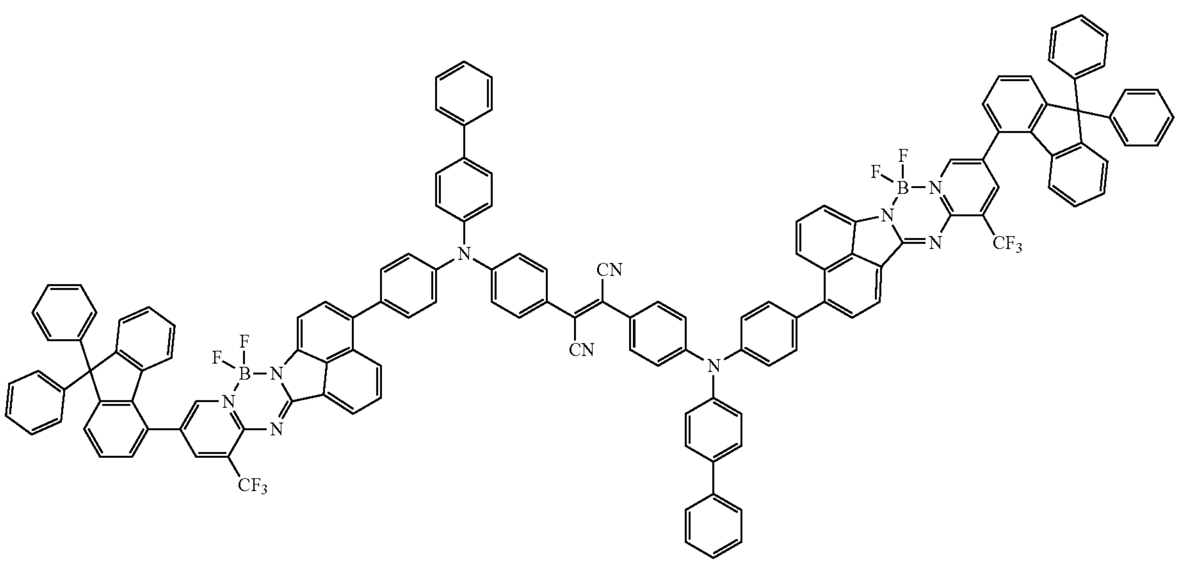

-continued
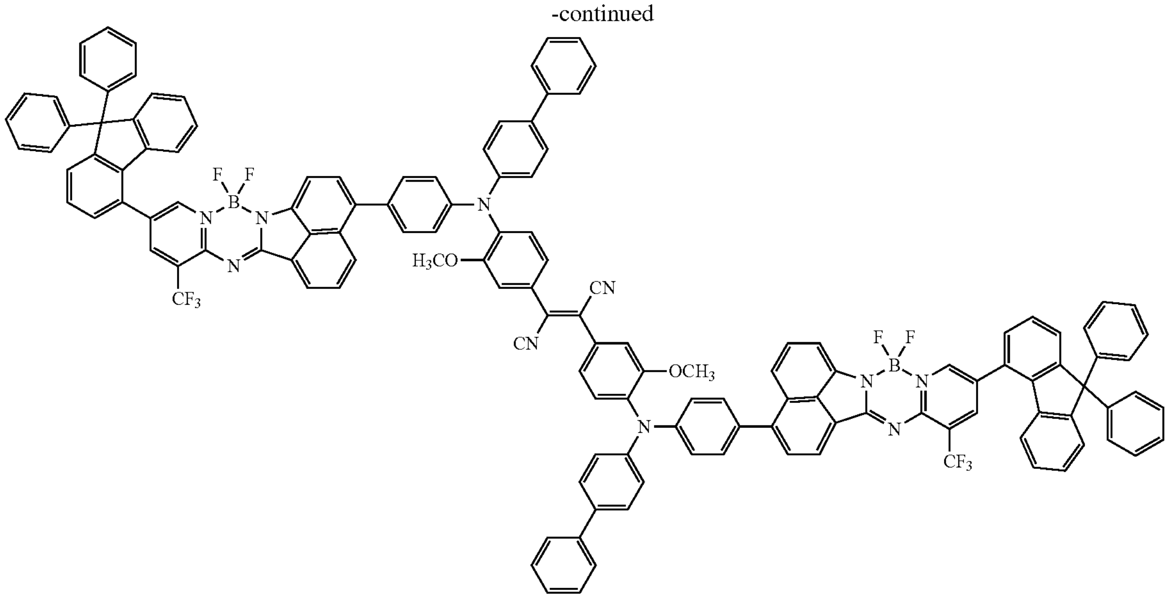
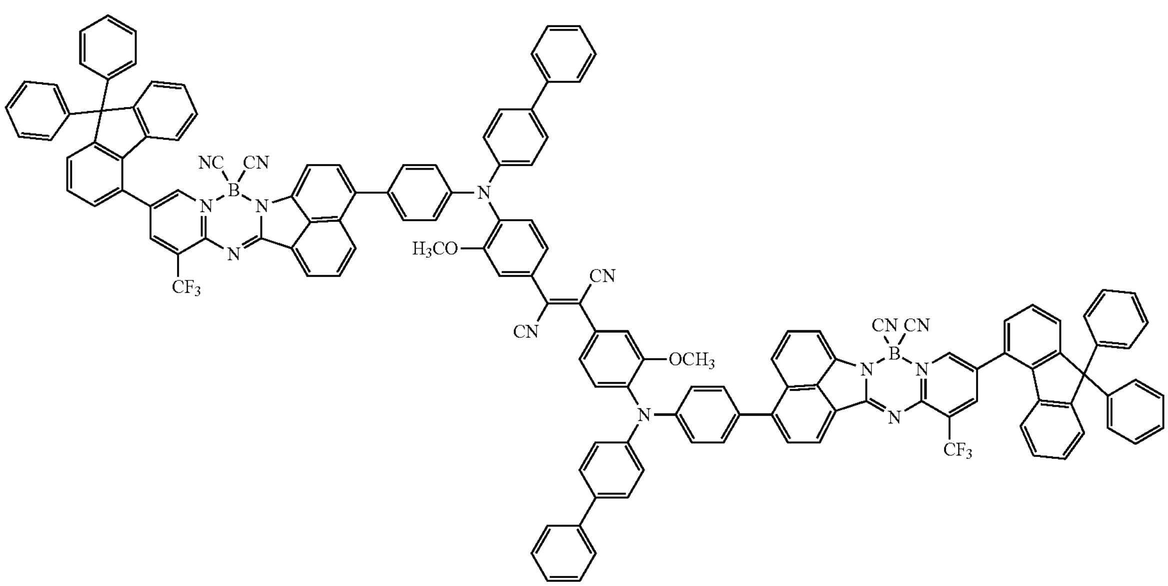

-continued
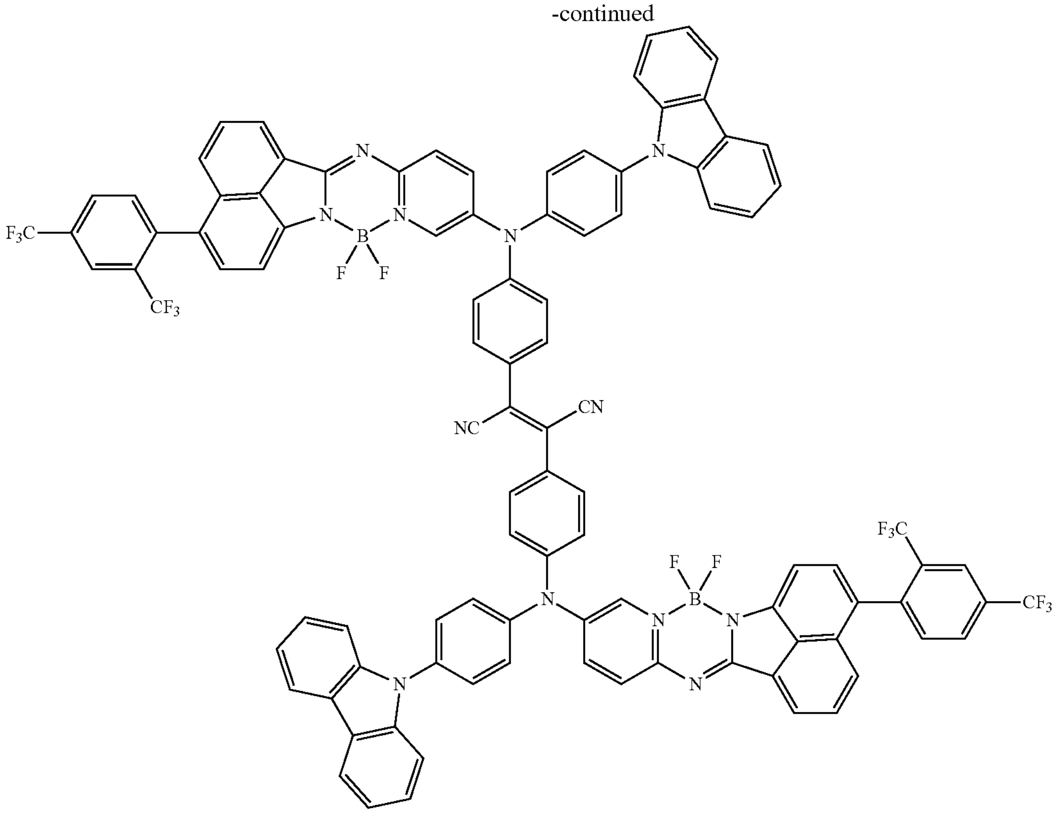
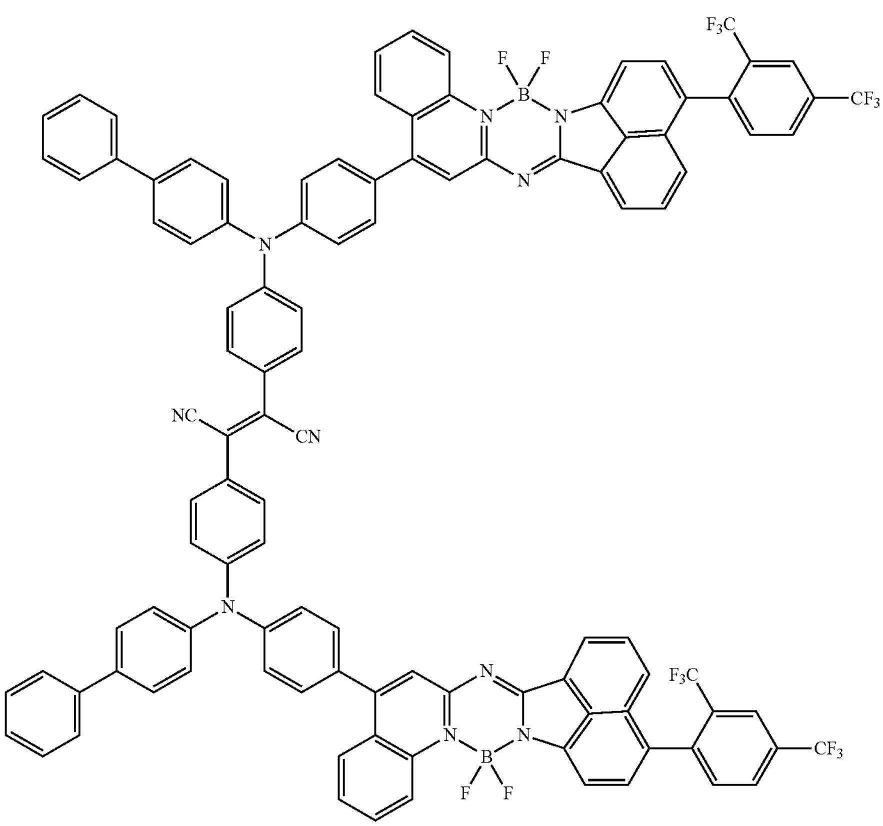

6. A color conversion film comprising:

a resin matrix; and the compound of claim 1 dispersed into the resin matrix.

7. A backlight unit comprising the color conversion film of claim 6.

8. A display apparatus comprising the backlight unit of claim 7.

* * * * *